United States Patent [19]

Martin et al.

[11] 4,257,104

[45] Mar. 17, 1981

[54] APPARATUS FOR SPECTRUM ANALYSIS OF AN ELECTRICAL SIGNAL

[75] Inventors: Larry R. Martin, Sebastopol; Michael S. Marzalek, Cotati, both of Calif.

[73] Assignee: Hewlett-Packard Company, Palo Alto, Calif.

[21] Appl. No.: 932,693

[22] Filed: Aug. 10, 1978

[51] Int. Cl.³ .......... G01R 23/00

[52] U.S. Cl. .......... 364/485; 324/77 B; 340/709; 340/711

[58] Field of Search .......... 364/485, 487, 518, 521; 324/77 B, 77 D; 340/709, 711; 328/138, 141, 155

[56] References Cited

U.S. PATENT DOCUMENTS

| | | | |
|---|---|---|---|
| 3,427,536 | 2/1969 | Wainwright | 324/77 B |
| 3,717,812 | 2/1973 | Hirsch | 324/77 B |
| 3,786,351 | 1/1974 | Priebe, Jr. | 324/77 B |
| 3,881,097 | 4/1975 | Lehmann et al. | 324/77 D |
| 4,040,025 | 8/1977 | Morrill, Jr. et al. | 340/709 |

OTHER PUBLICATIONS

"A 5 MHz Digitally Controlled Spectrum Analyzer", Tekscope (USA); vol. 7, No. 3 (1975); pp. 3-7.

*Primary Examiner*—Errol A. Krass
*Attorney, Agent, or Firm*—David A. Boone

[57] ABSTRACT

An input signal is mixed with sampling signals from oscillators which vary the frequency of the sampling signal from a first frequency to a second frequency. The resulting Intermediate Frequency (IF) signal is processed and digital values are stored in a memory in response thereto. Waveforms are then displayed which correspond to these frequency and amplitude values. Various input and display circuits facilitate the display and interpretation of these waveforms.

13 Claims, 192 Drawing Figures

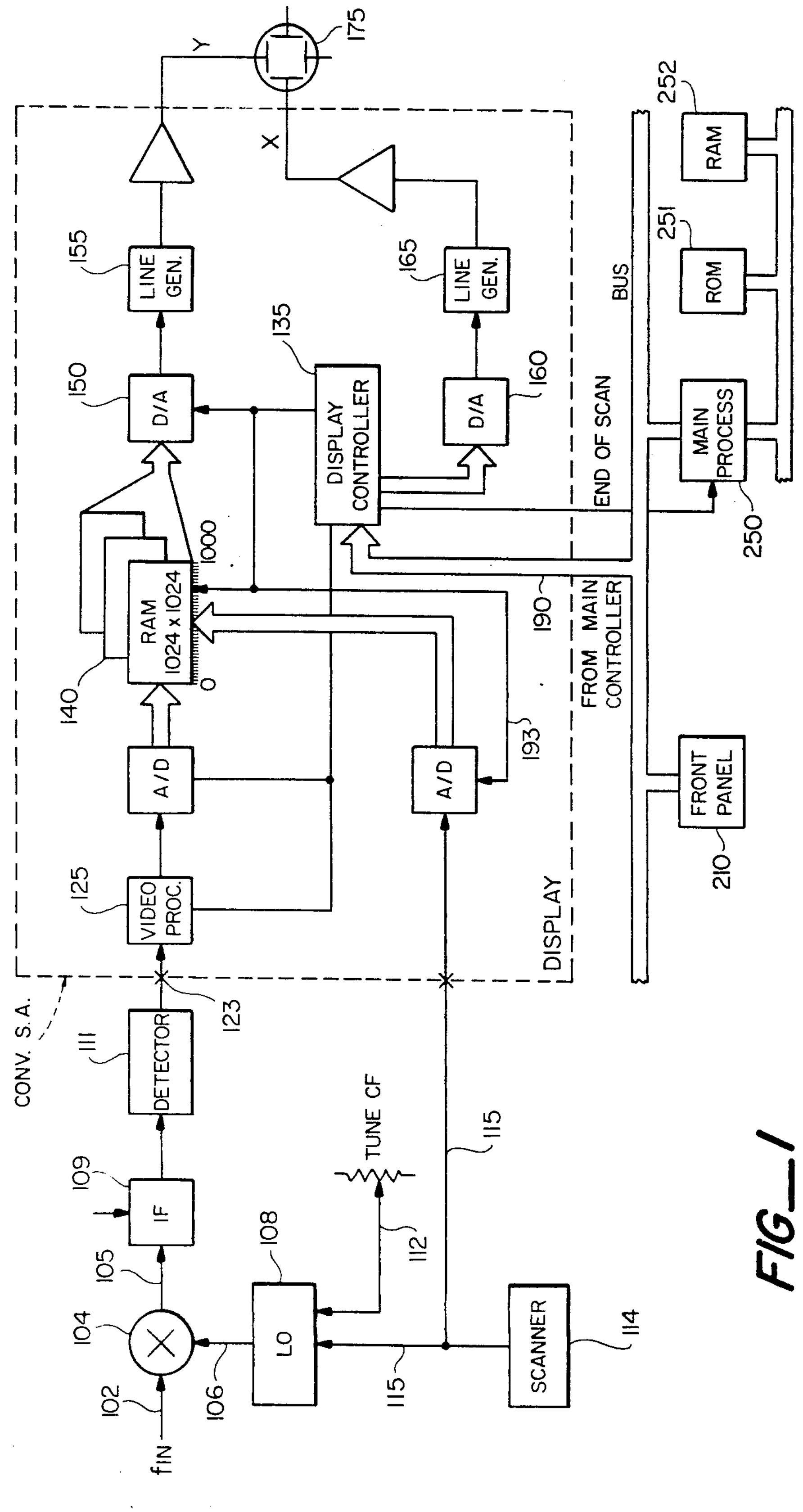
FIG_1

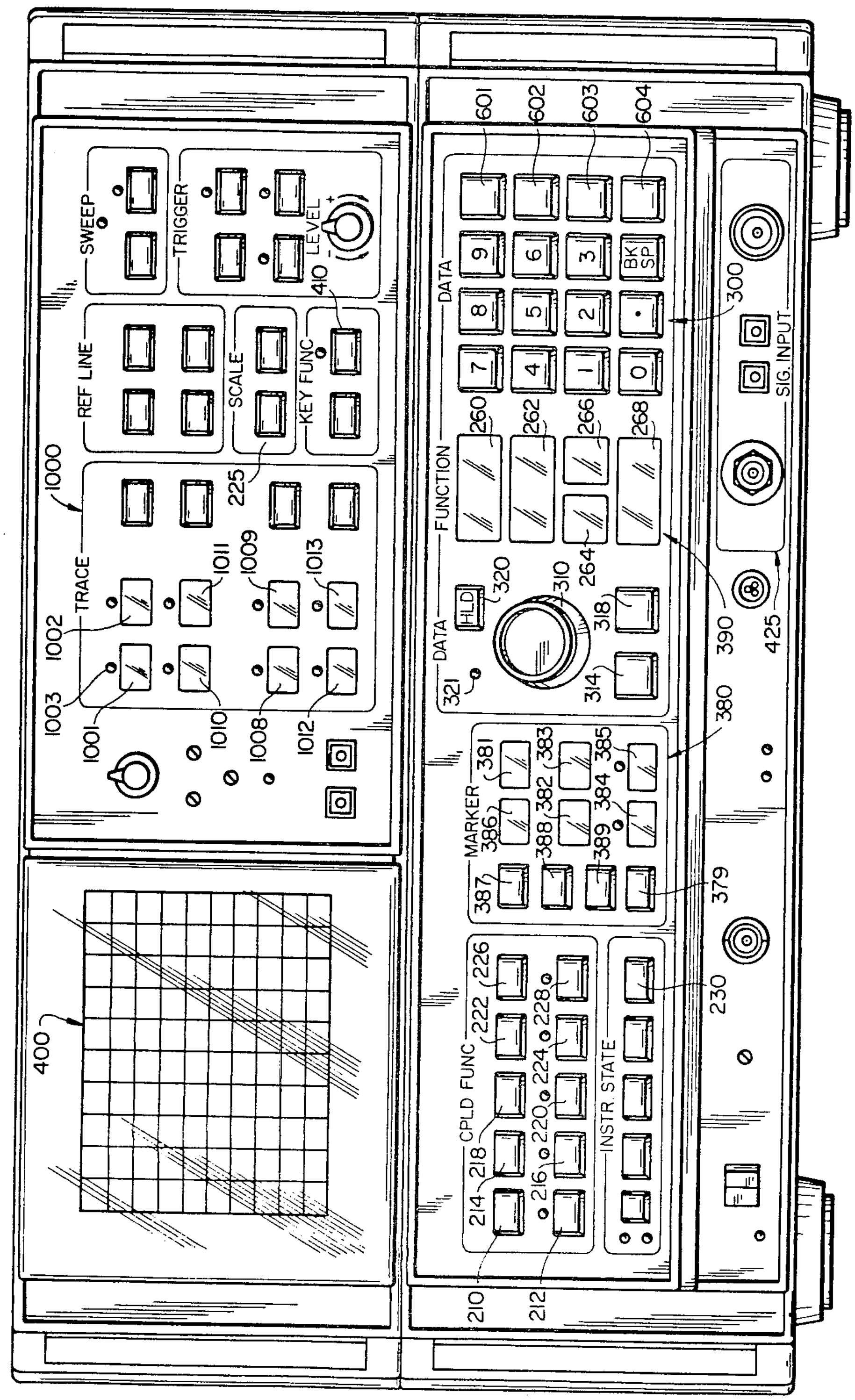
FIG_2

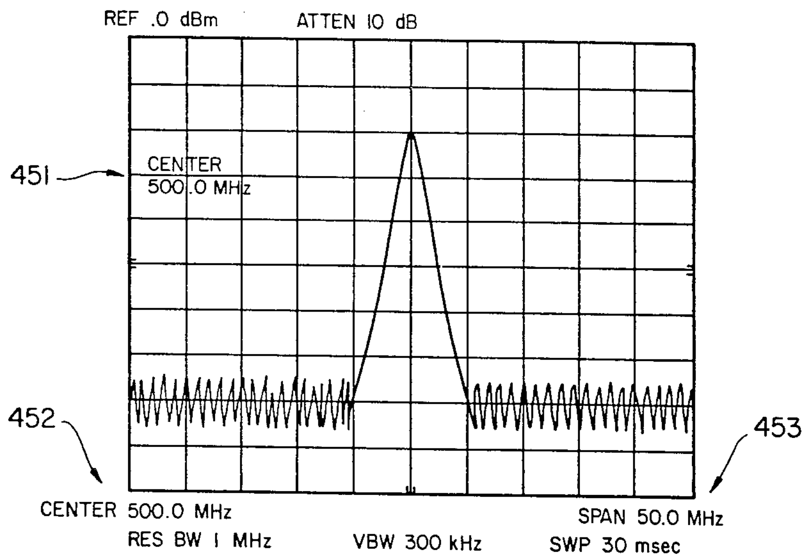
FIG_3
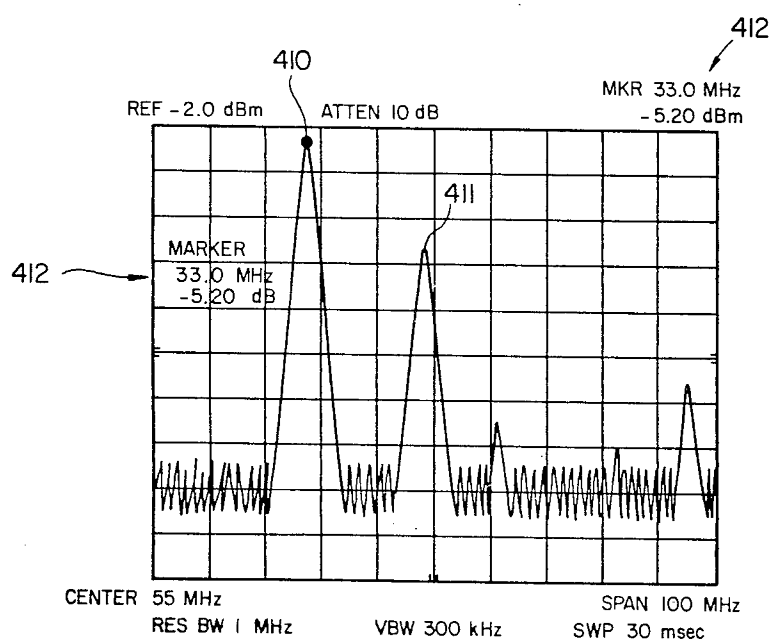
FIG_4

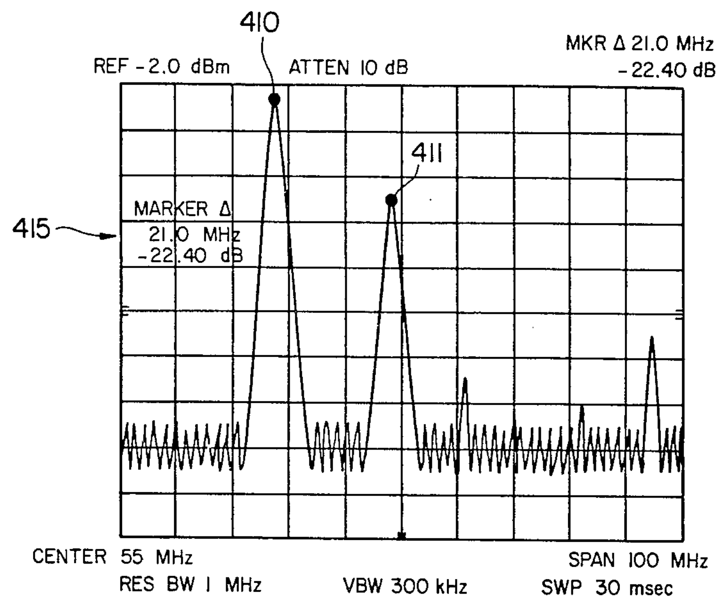
FIG_5
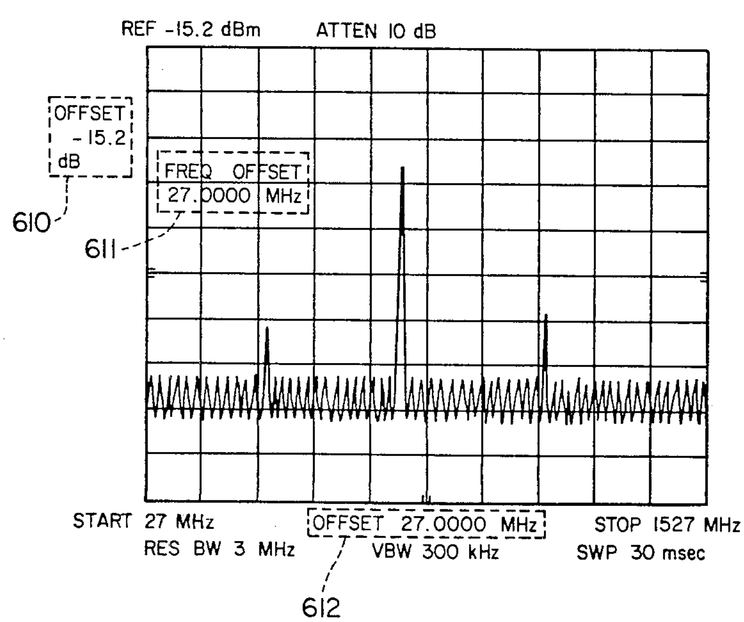
FIG_6

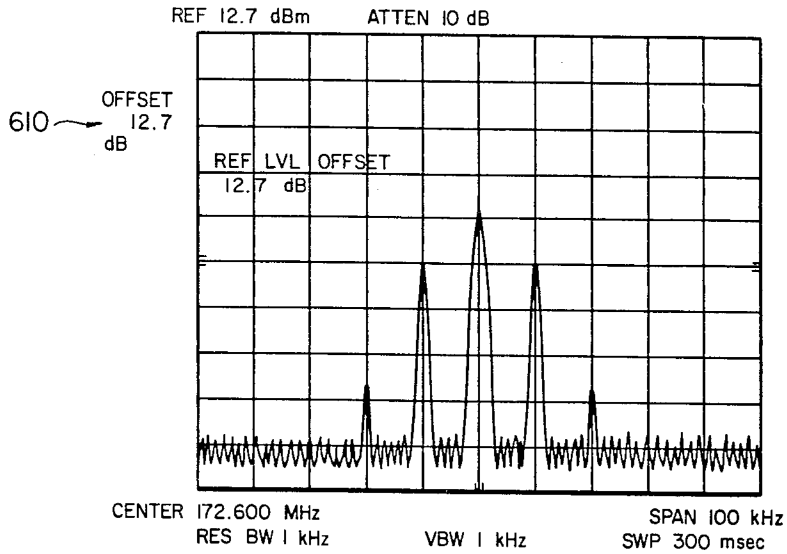
FIG_7
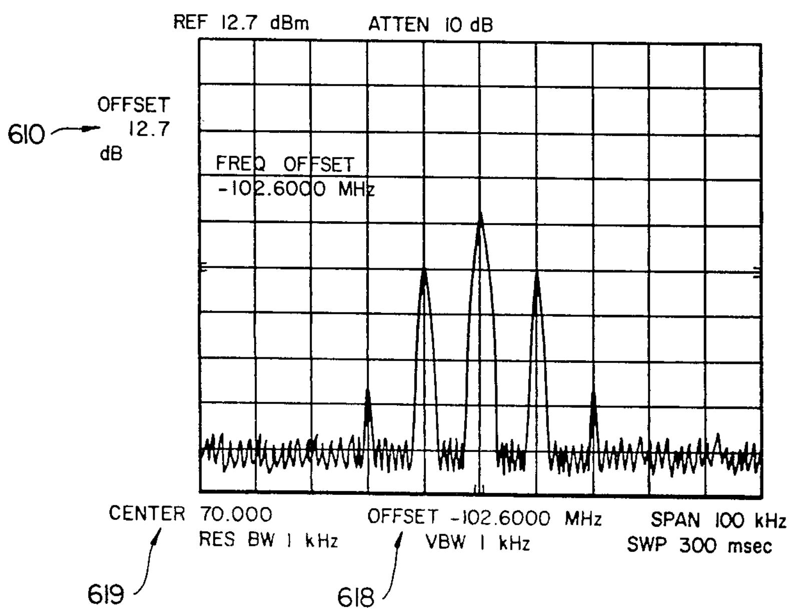
FIG_8

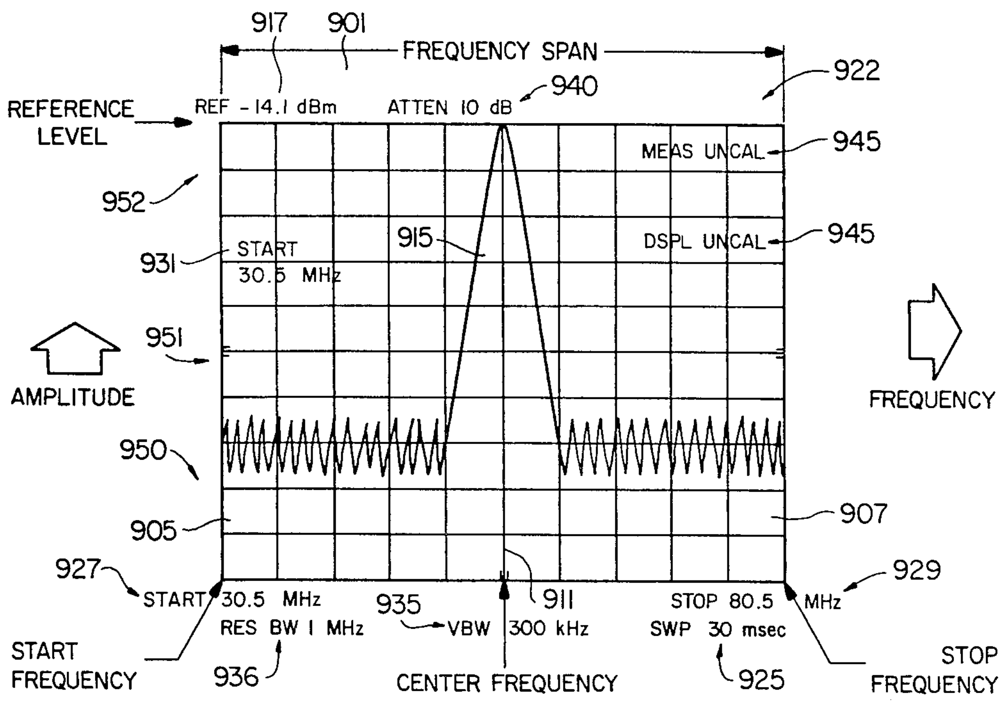
FIG_9
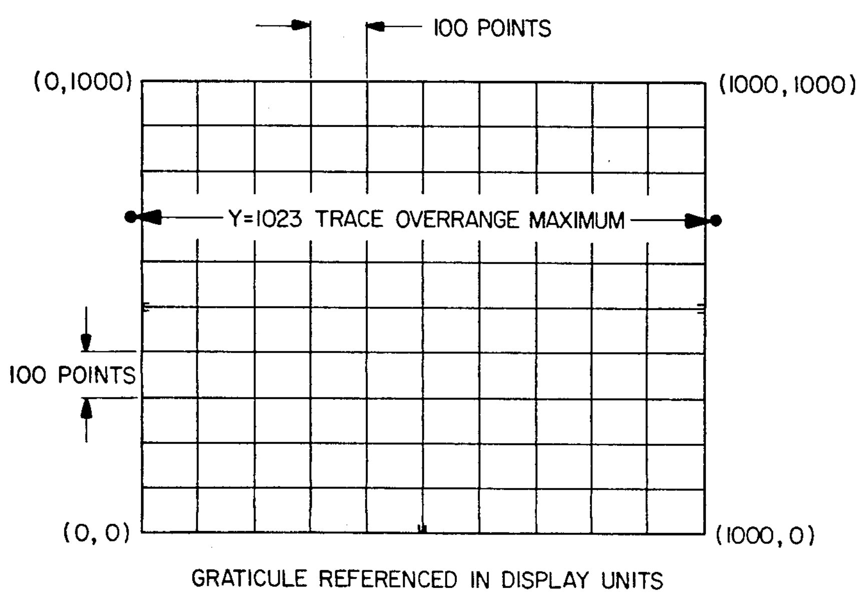
FIG_10

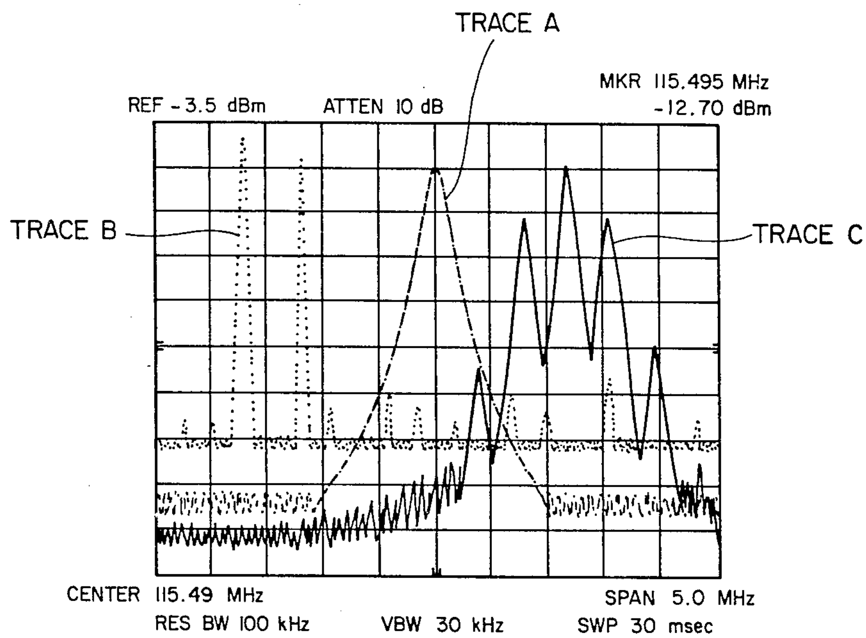
FIG_11
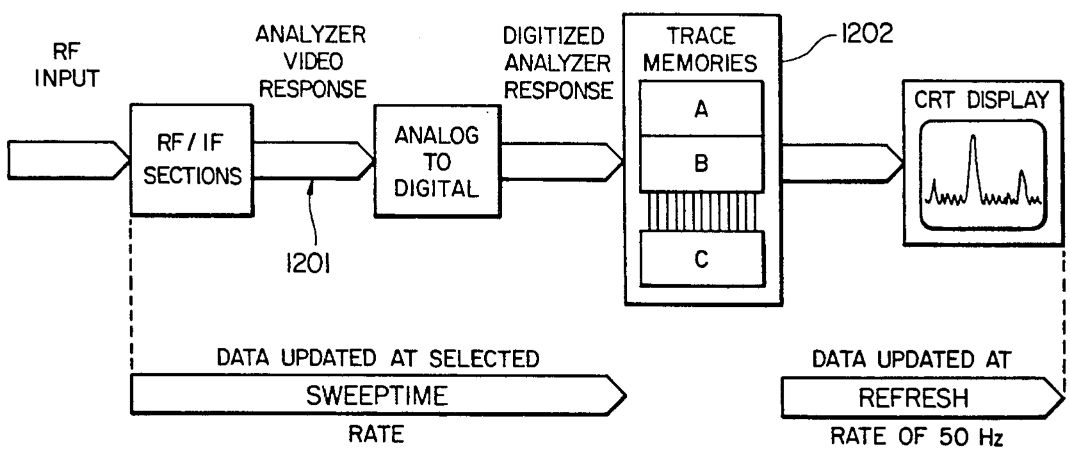
FIG_12

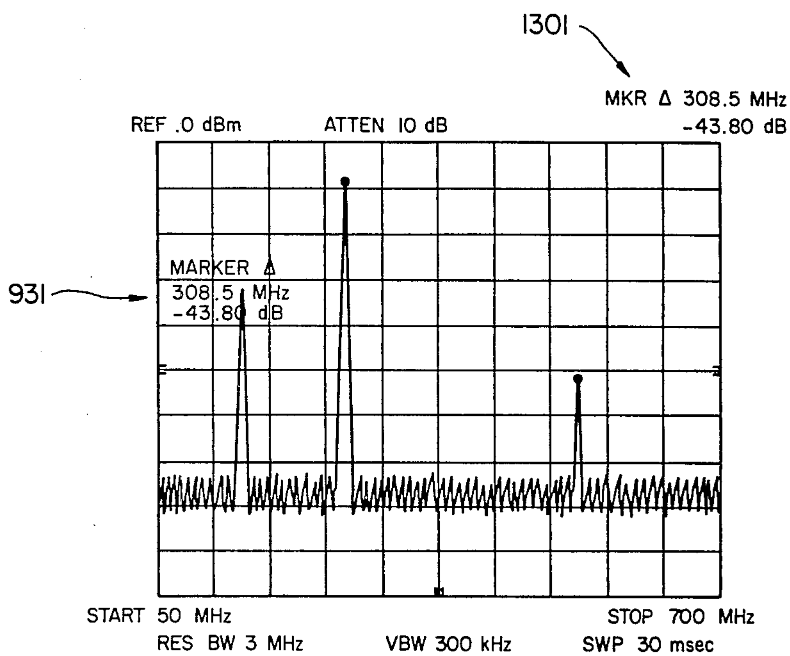
MARKER READOUT LOCATIONS
FIG_13

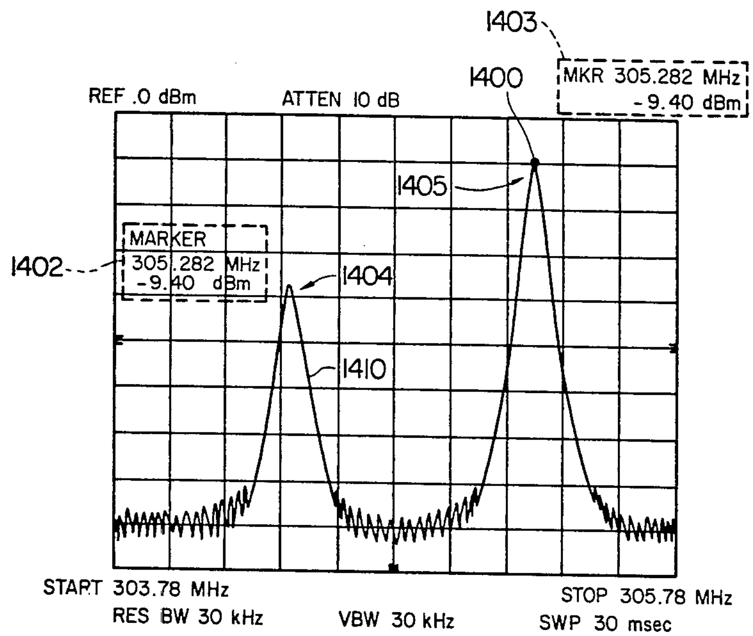
FIG_14A
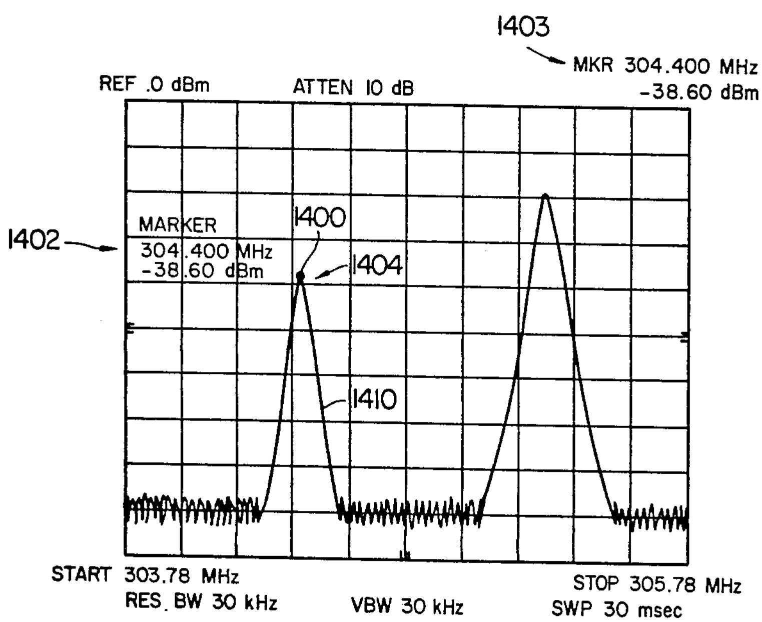
FIG_14B

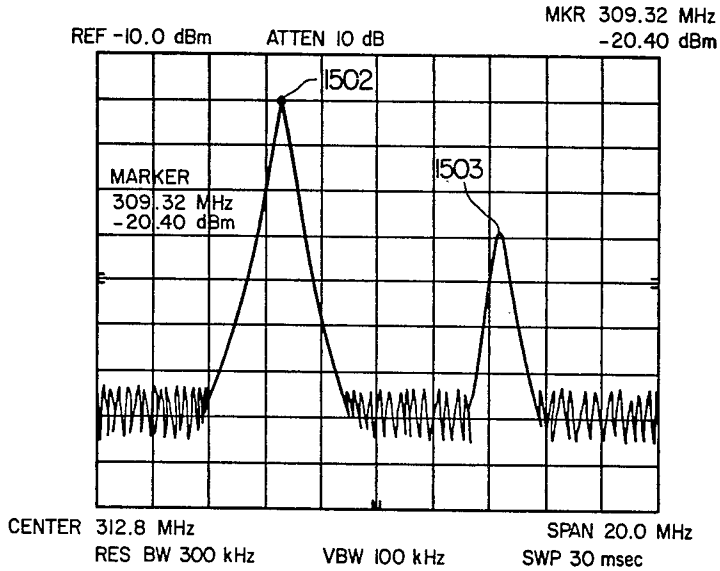
FIG_15A
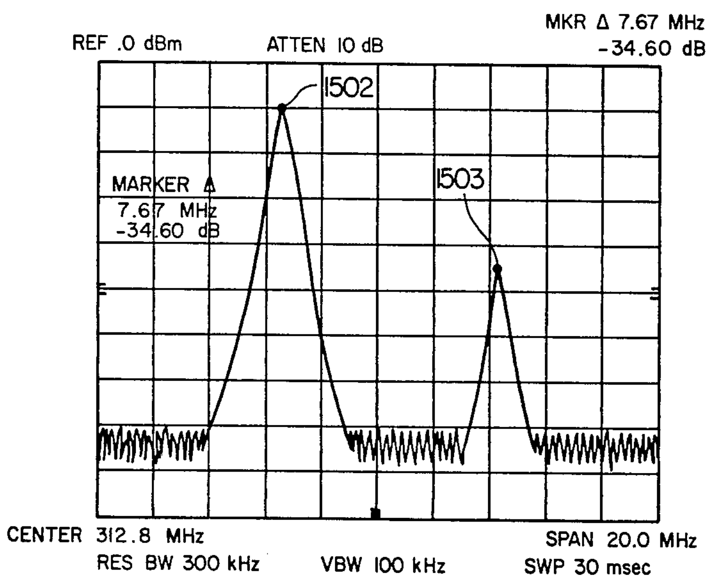
FIG_15B

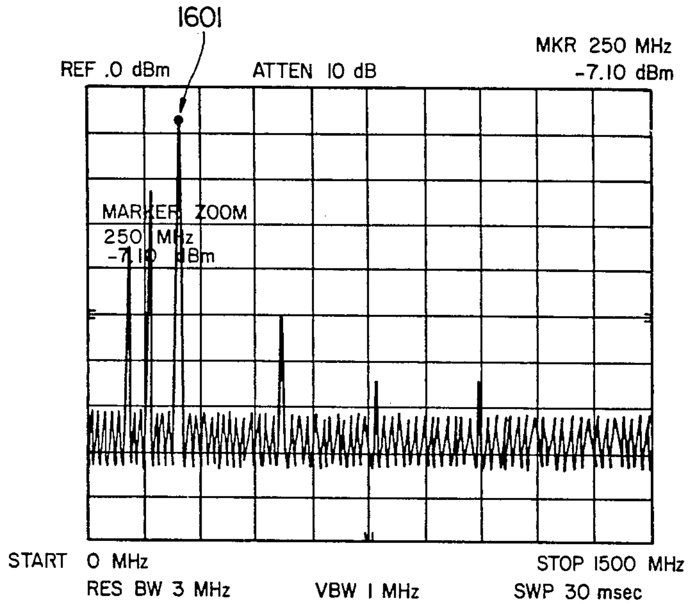
FIG_16A
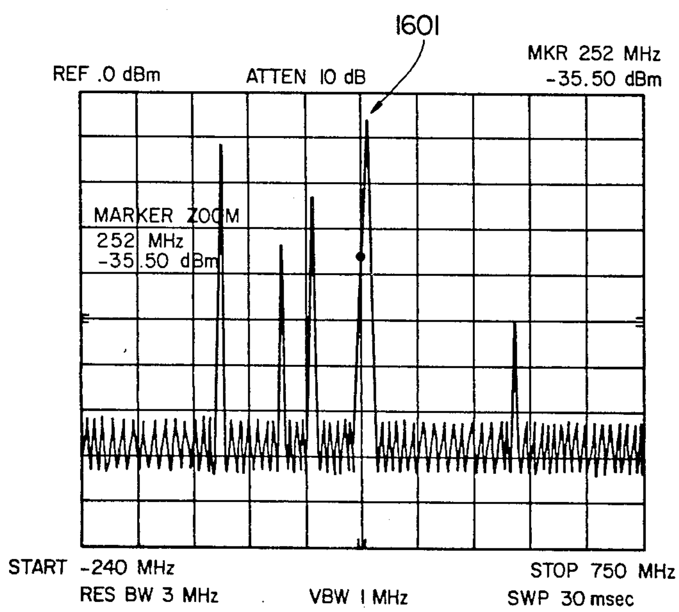
FIG_16B

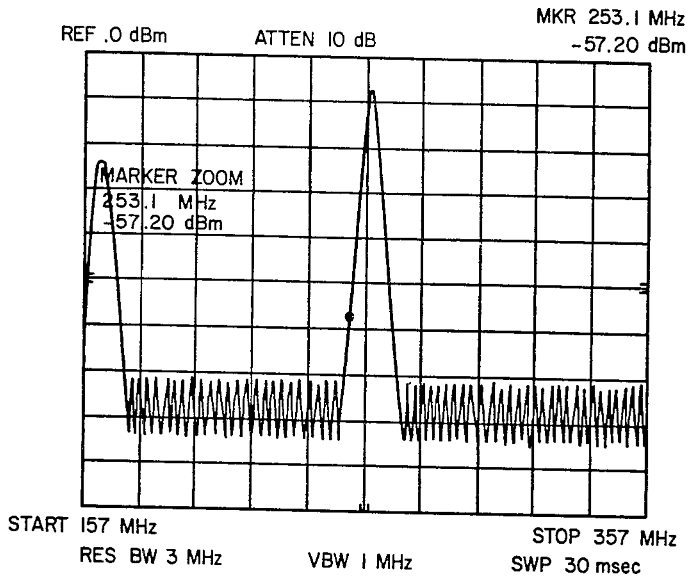
FIG_16C
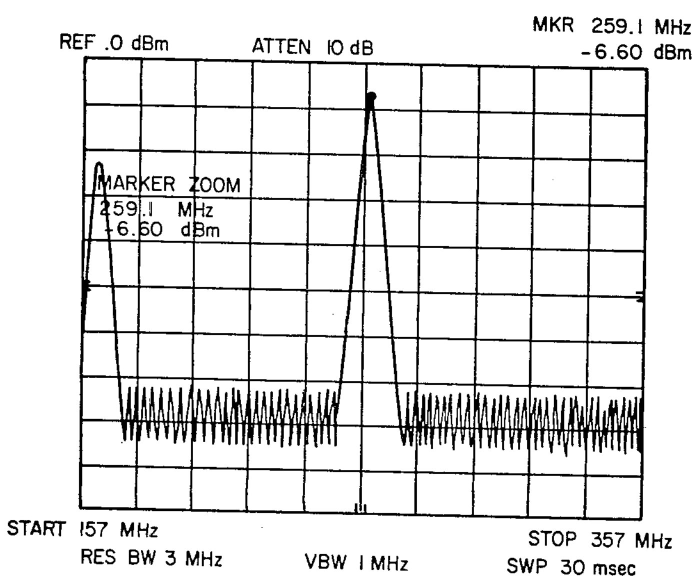
FIG_16D

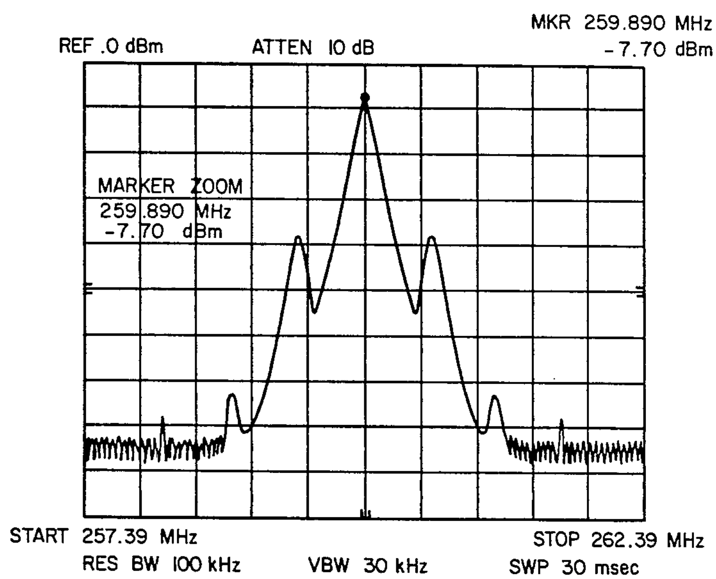
FIG_16E

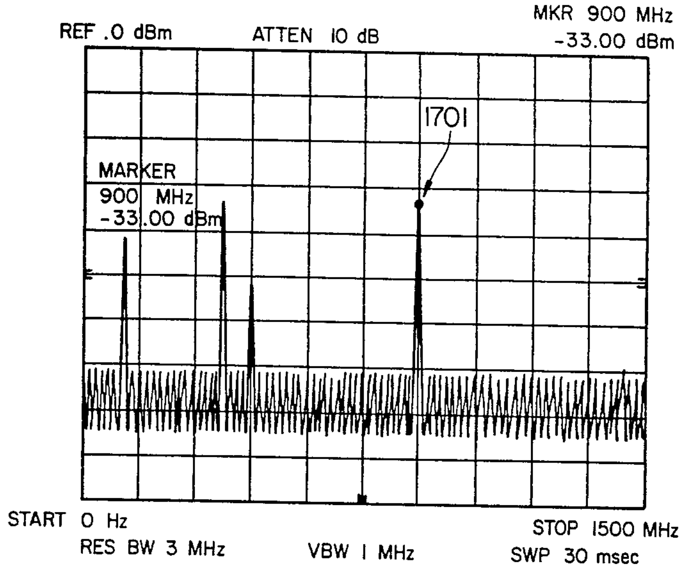
FIG_17A
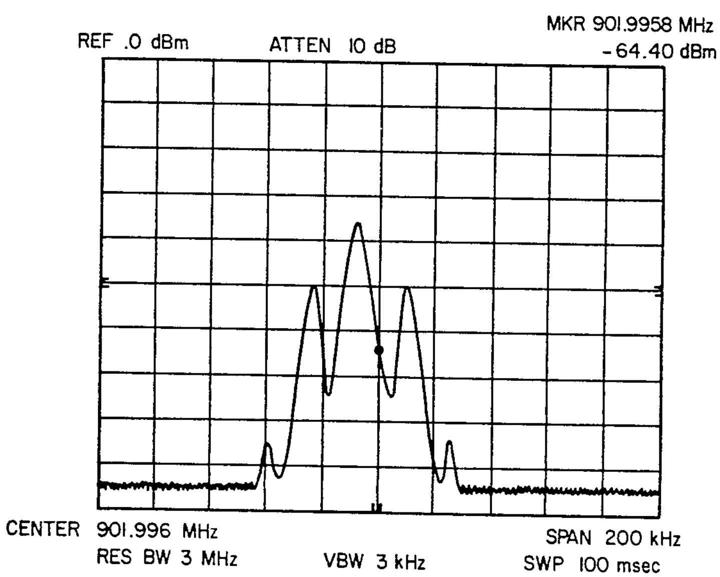
FIG_17B

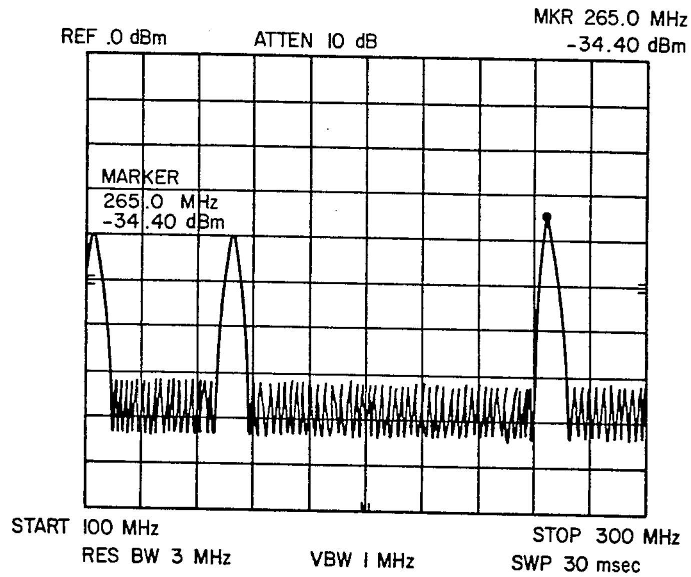
FIG_18A
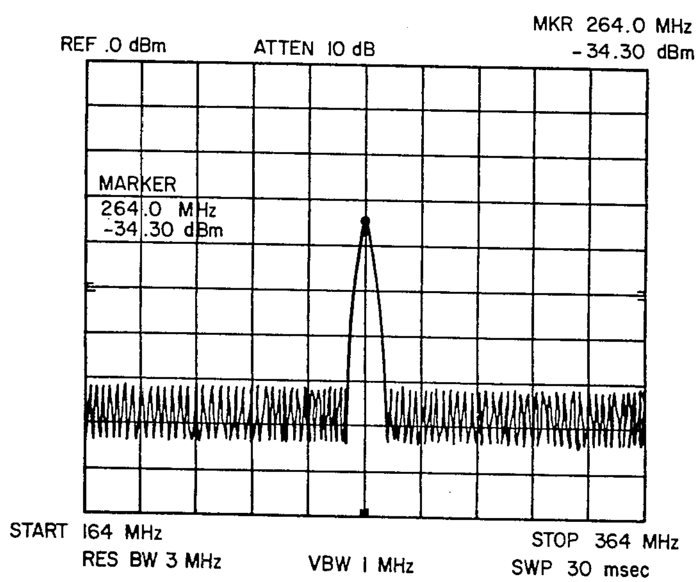
FIG_18B

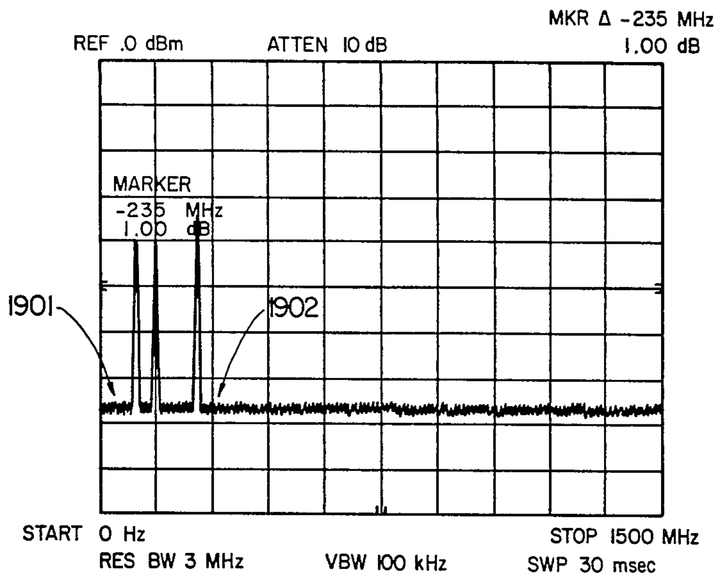
FIG_19A
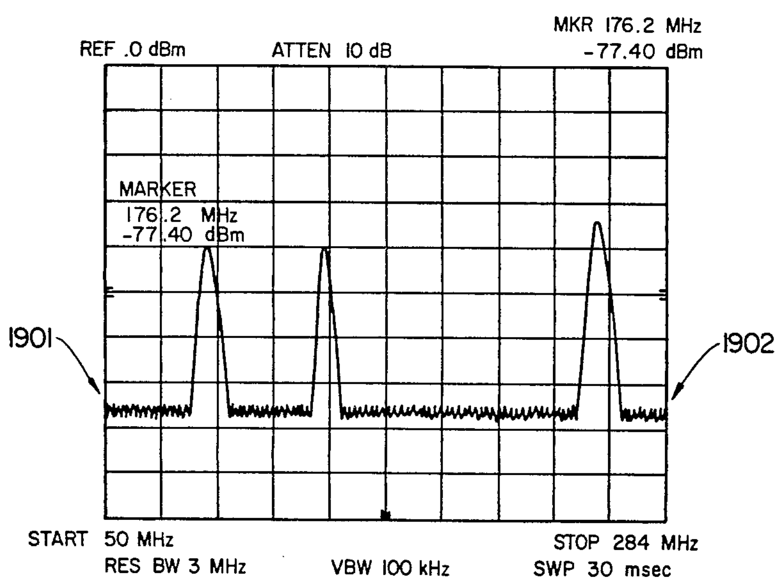
FIG_19B

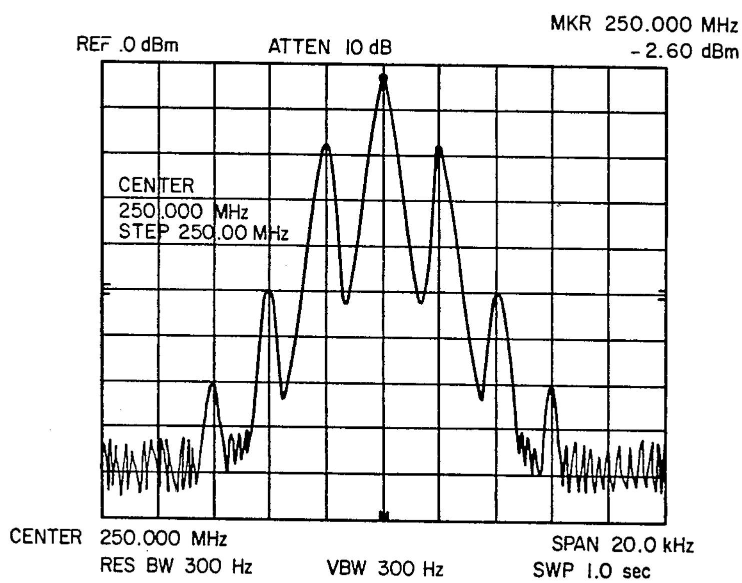
FIG_19C

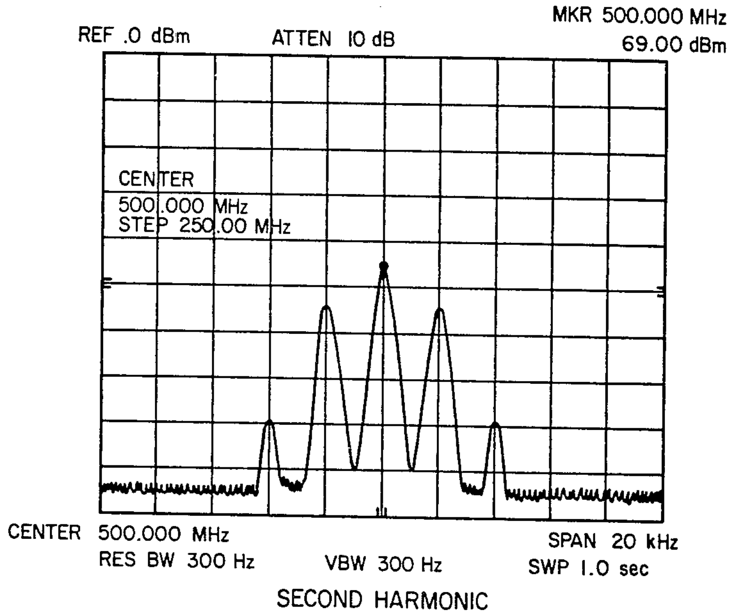
FIG_19D
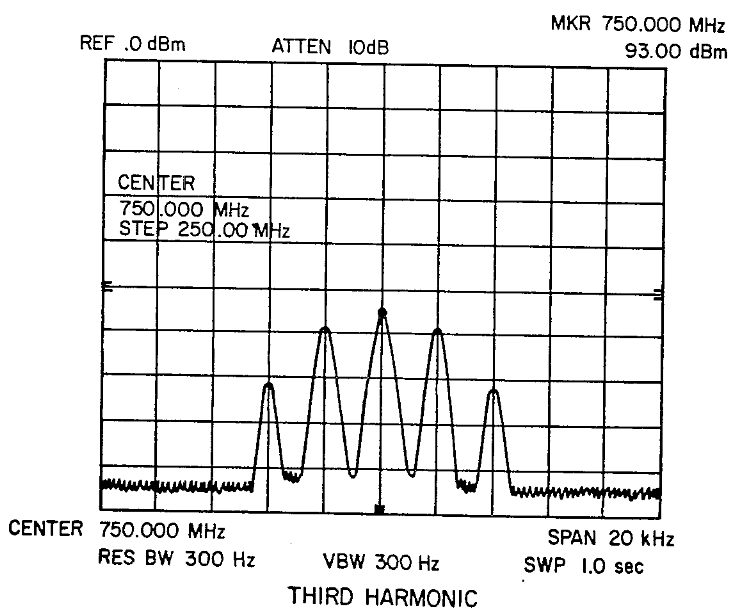
FIG_19E

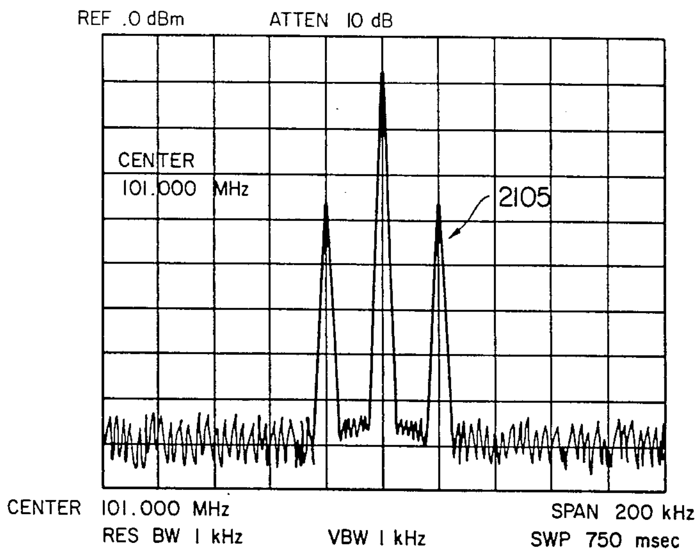
FIG_19F
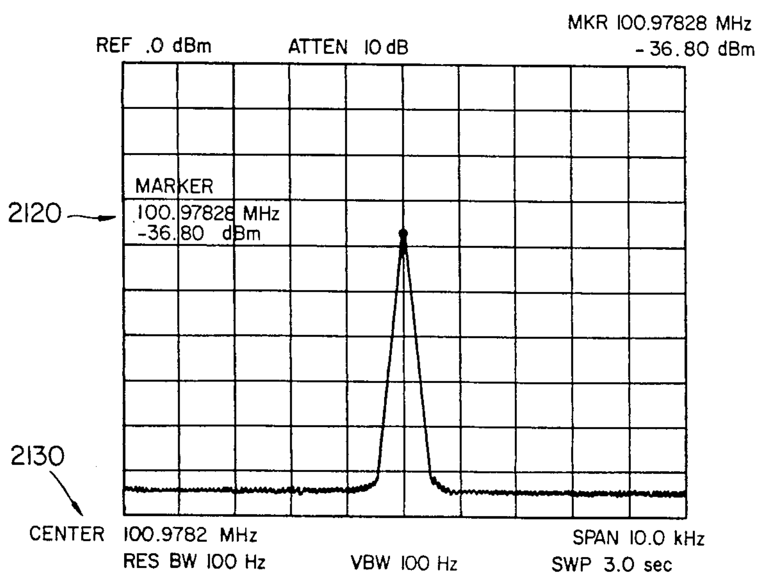
FIG_19G

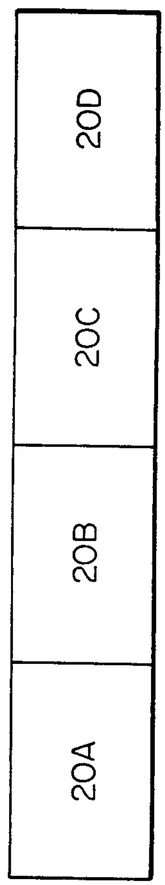
FIG_20

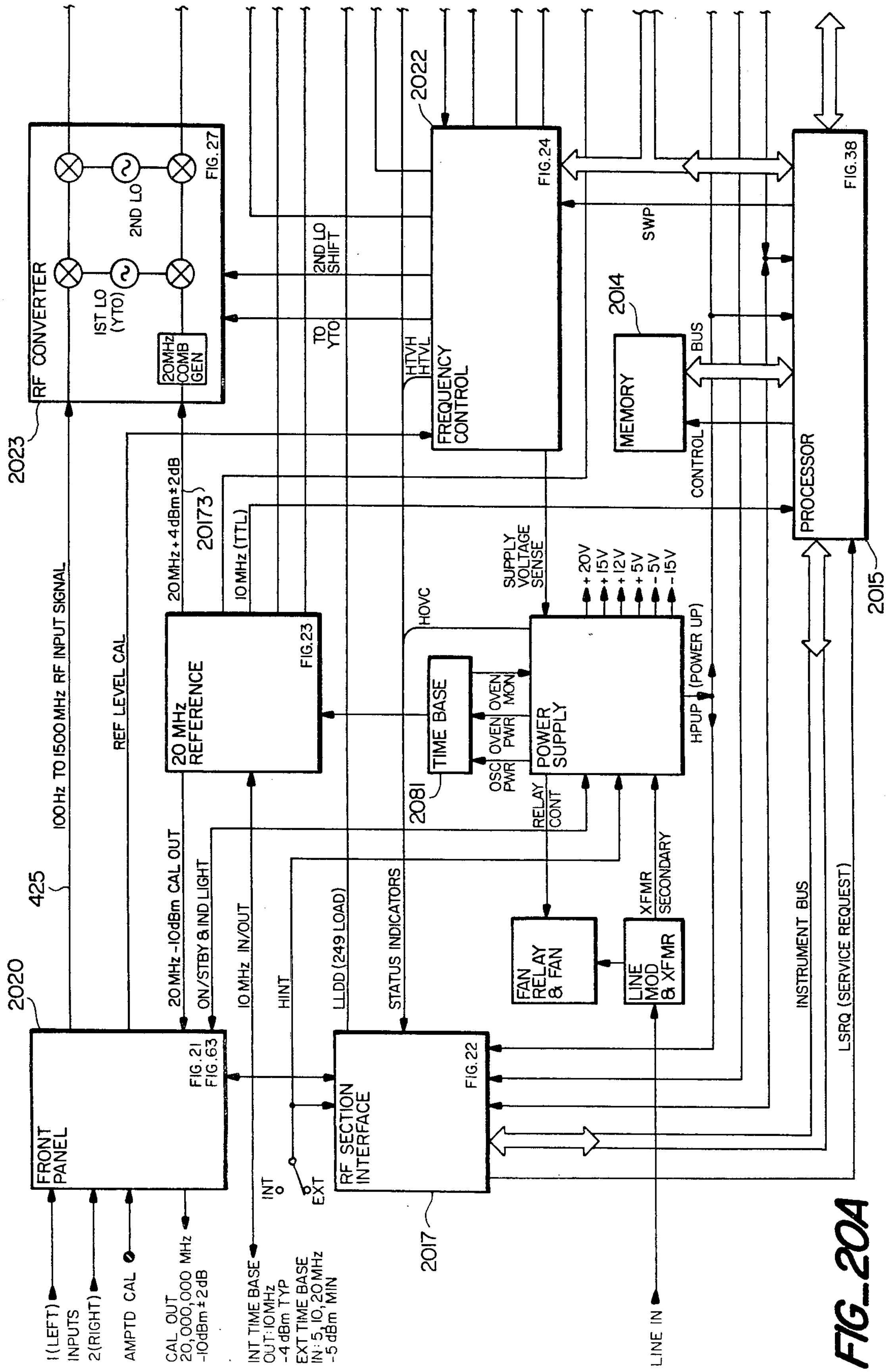
FIG_20A

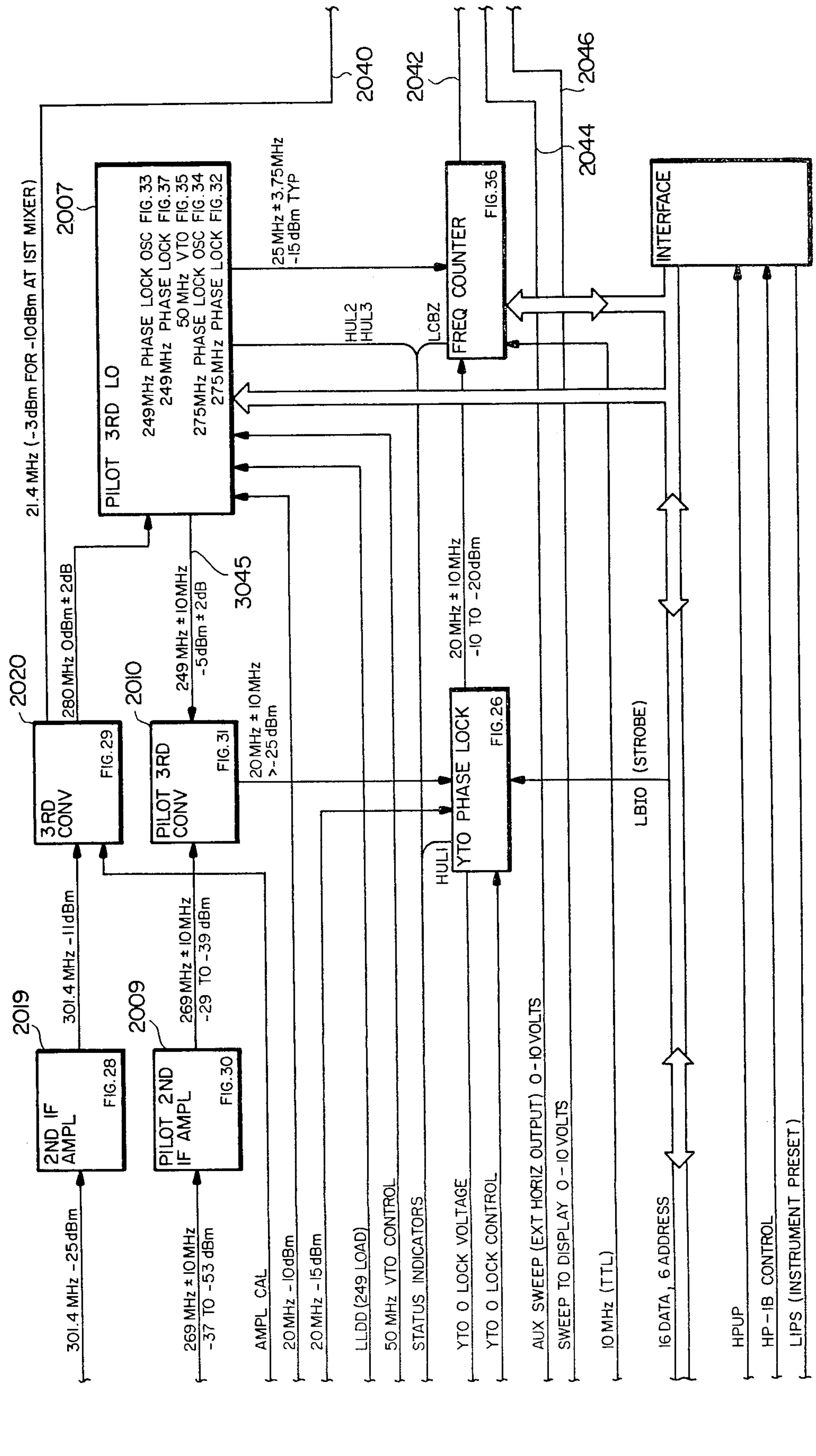
FIG_20B

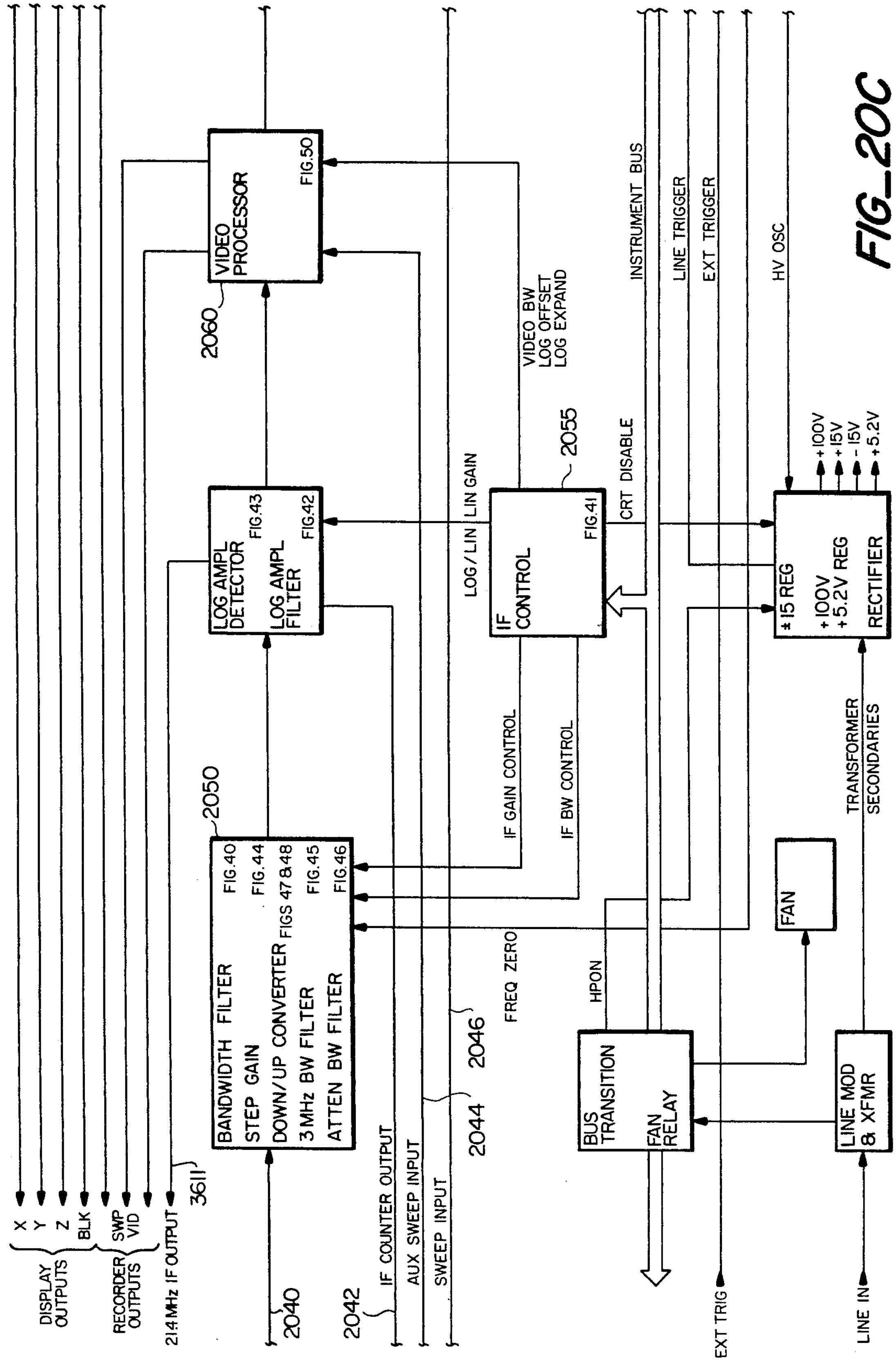
FIG_20C

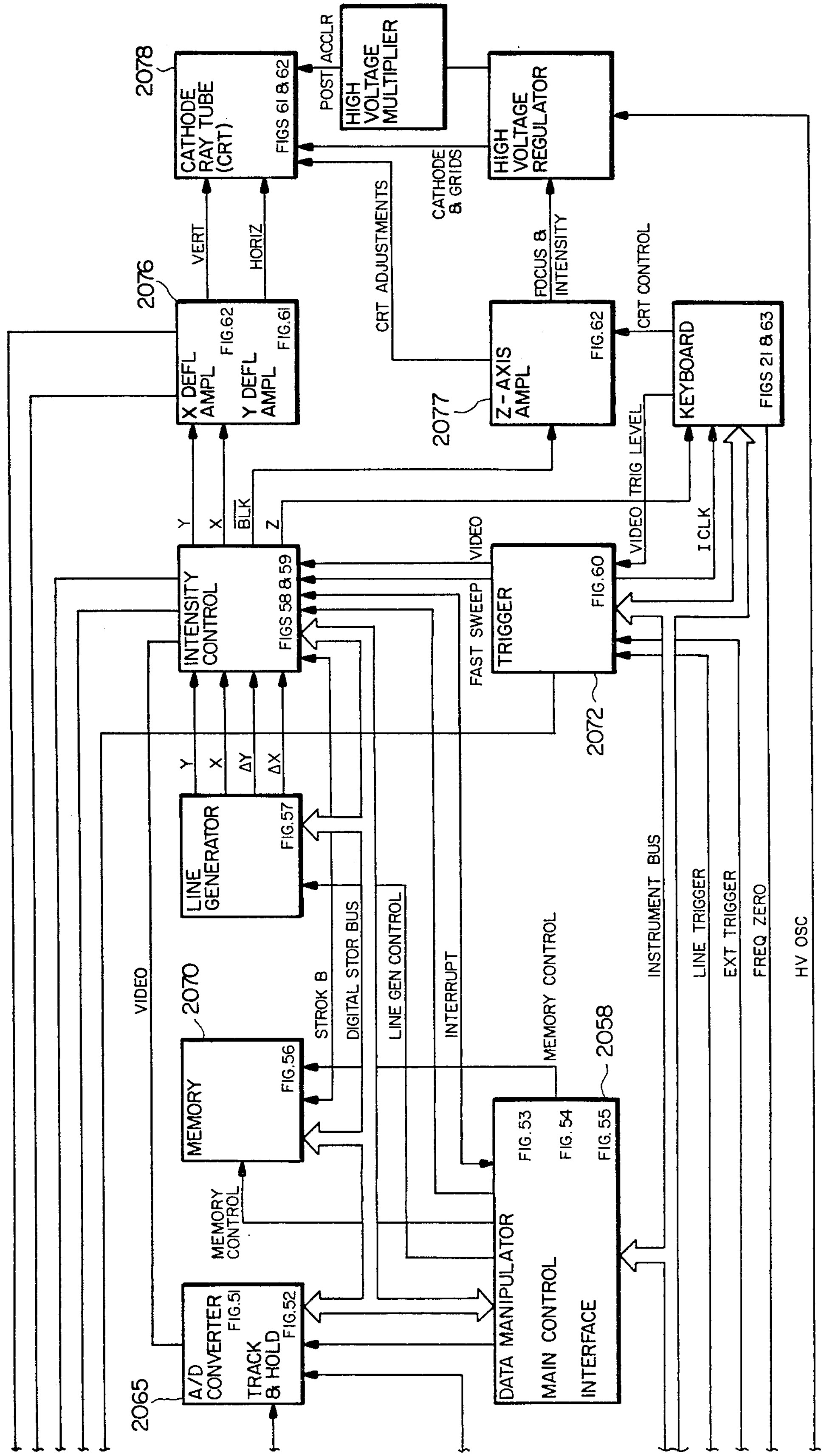
FIG_20D

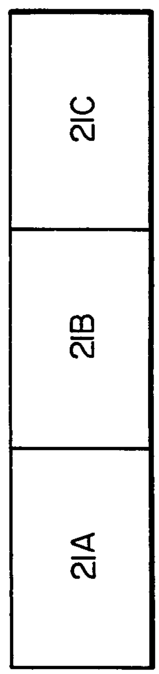
FIG__21

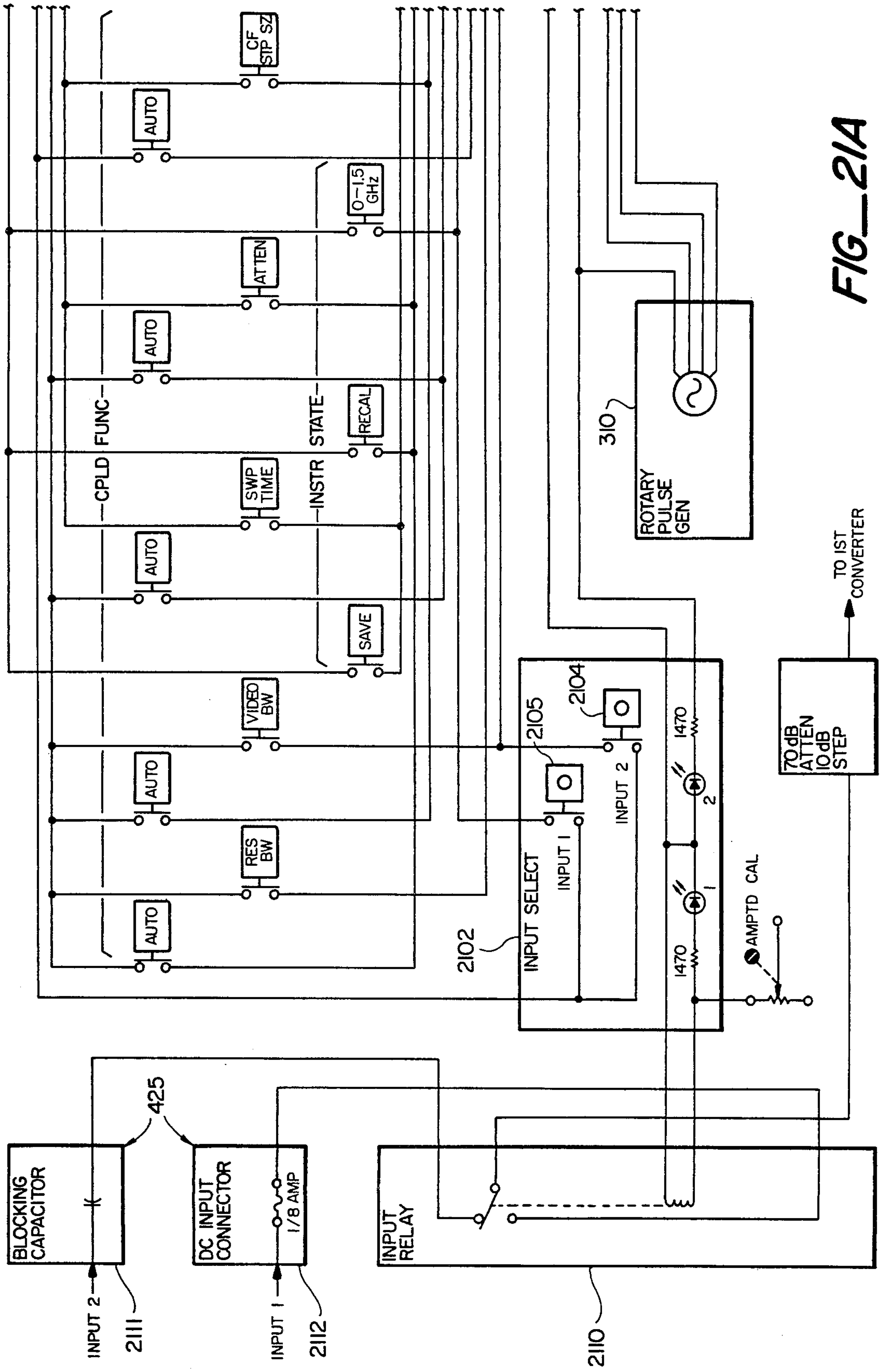
FIG_21A

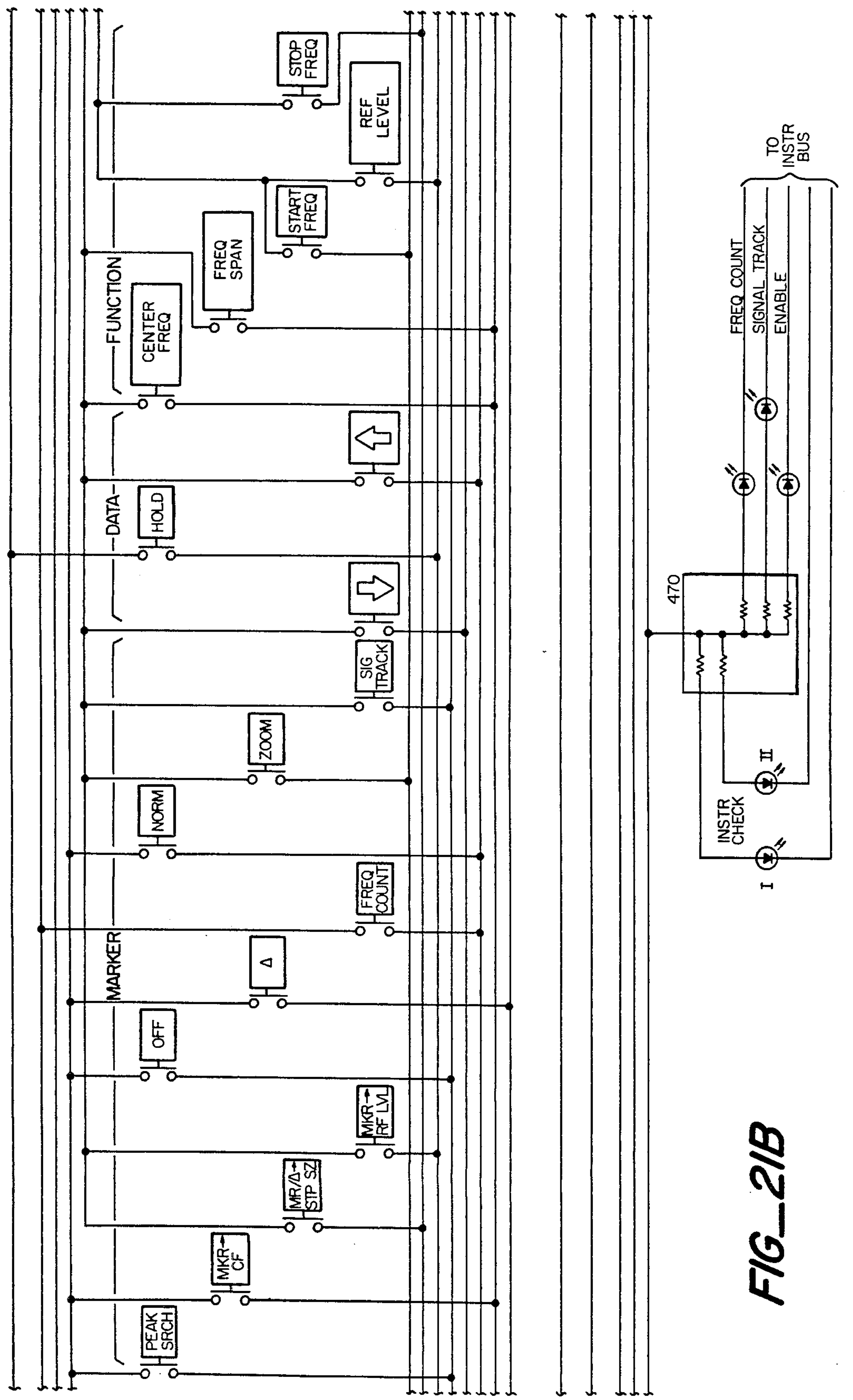
FIG_21B

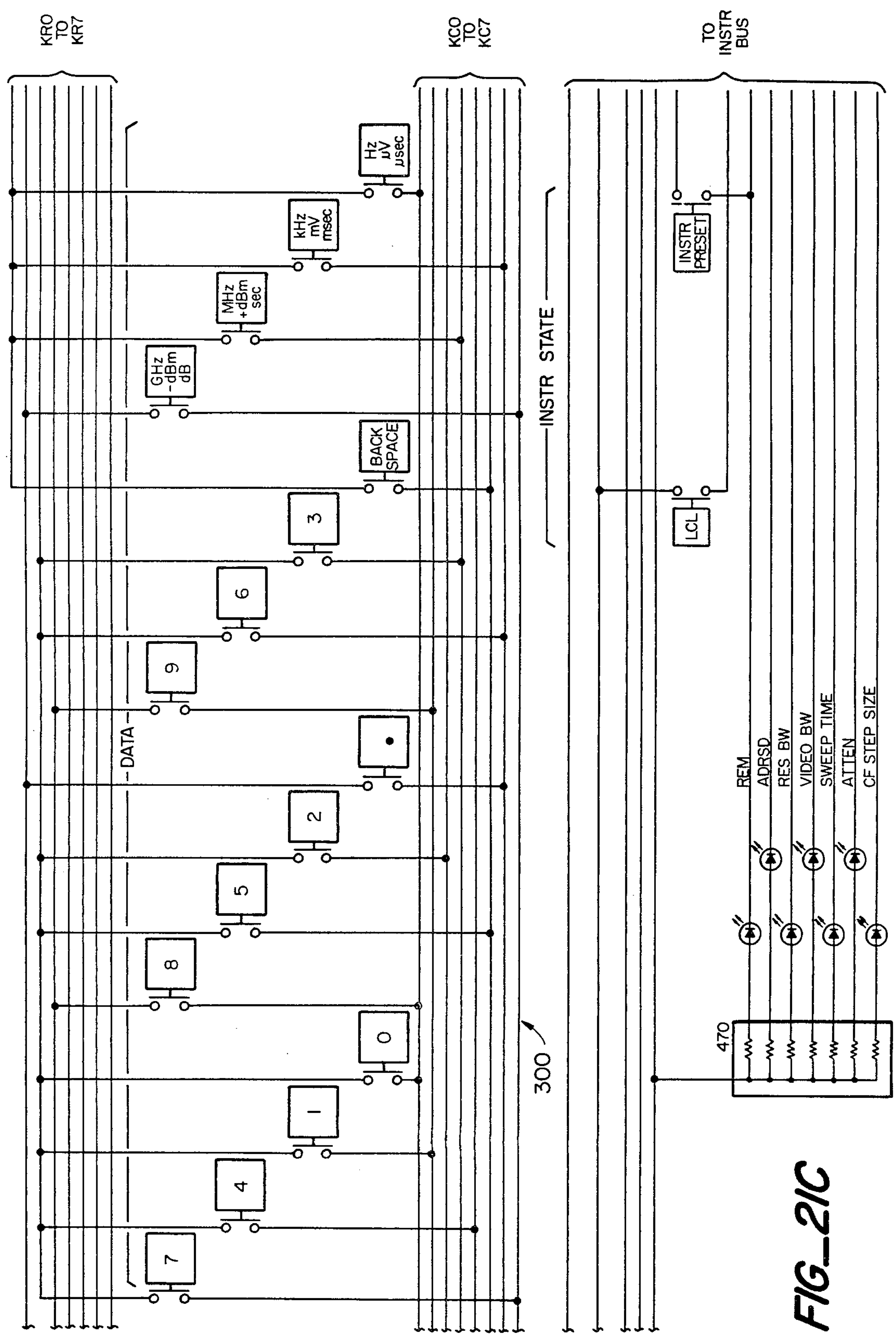
FIG_21C

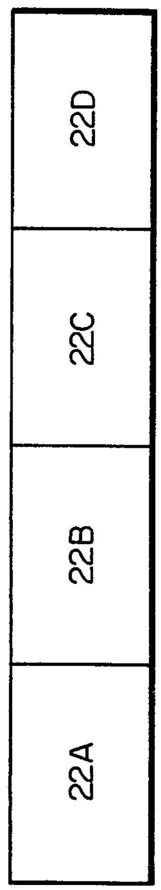
FIG_22

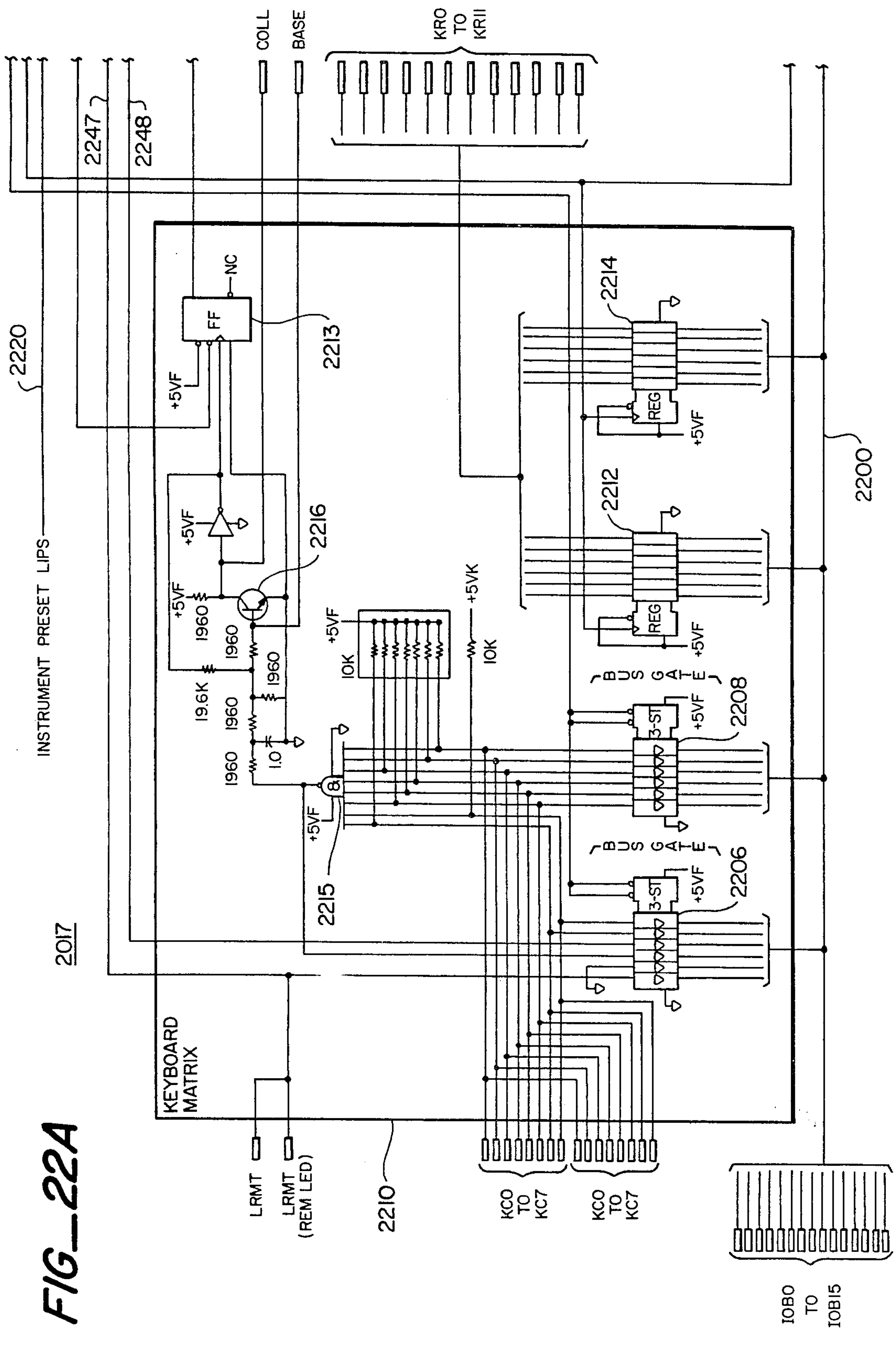
FIG_22A

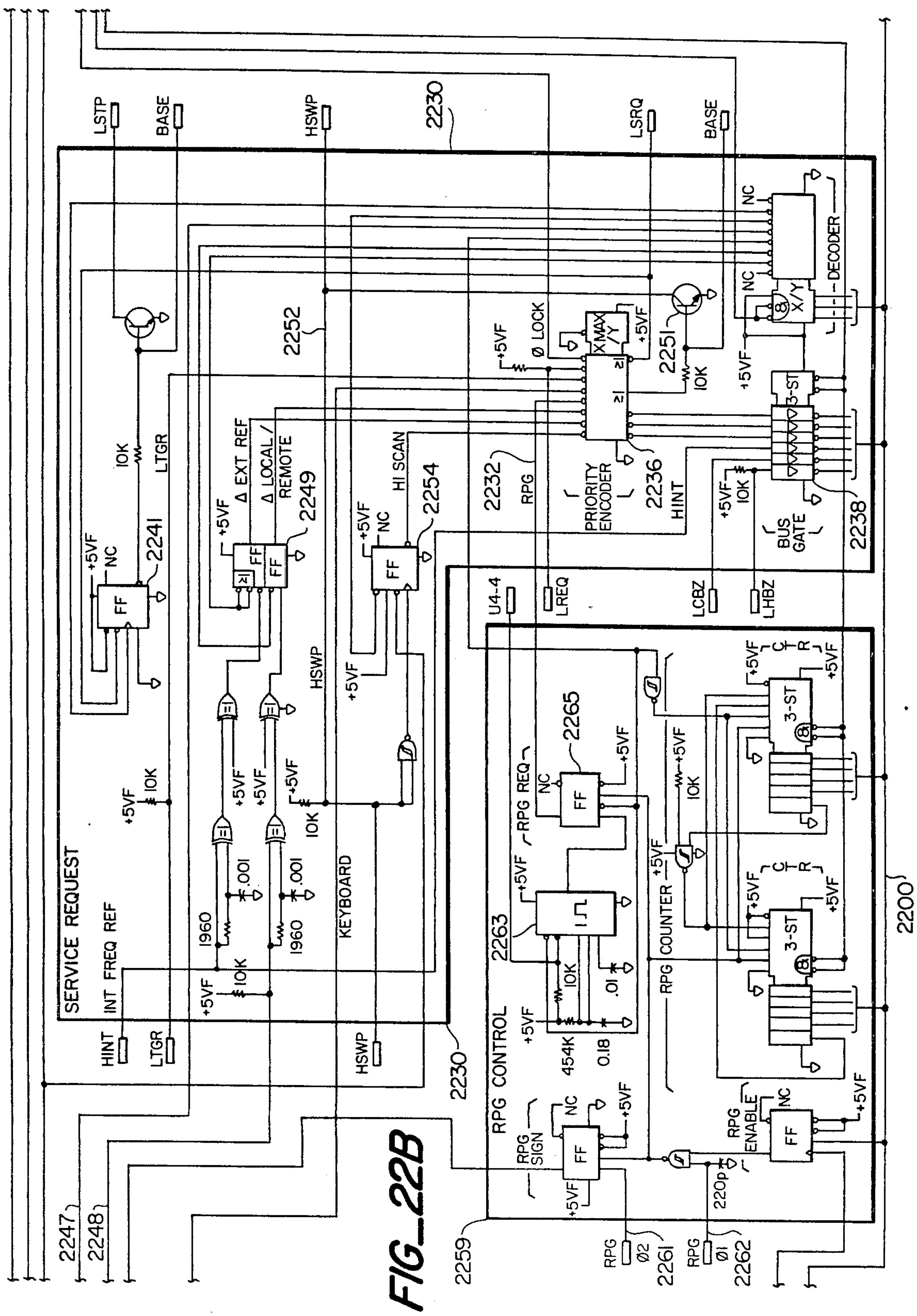
FIG_22B

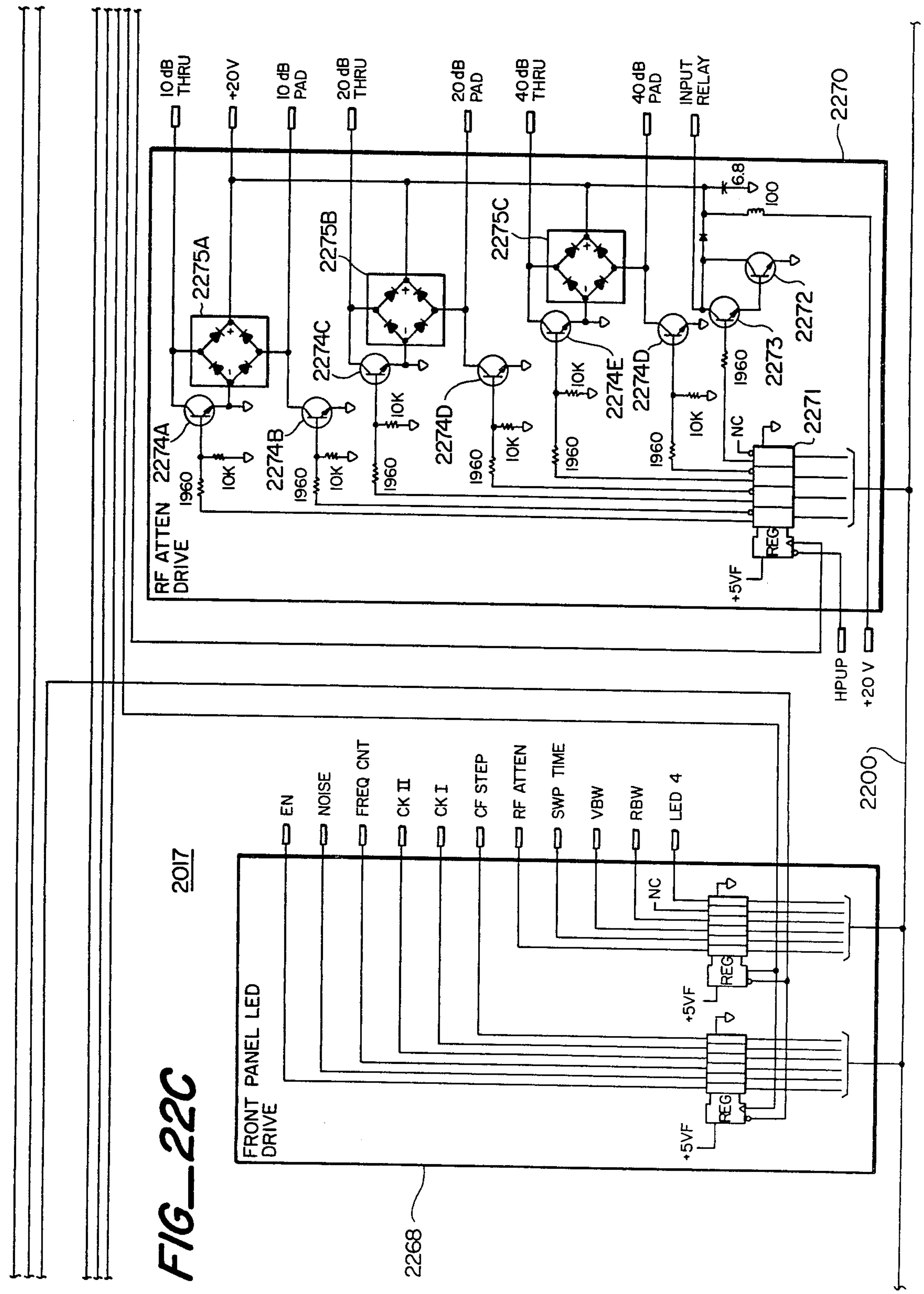
FIG_22C

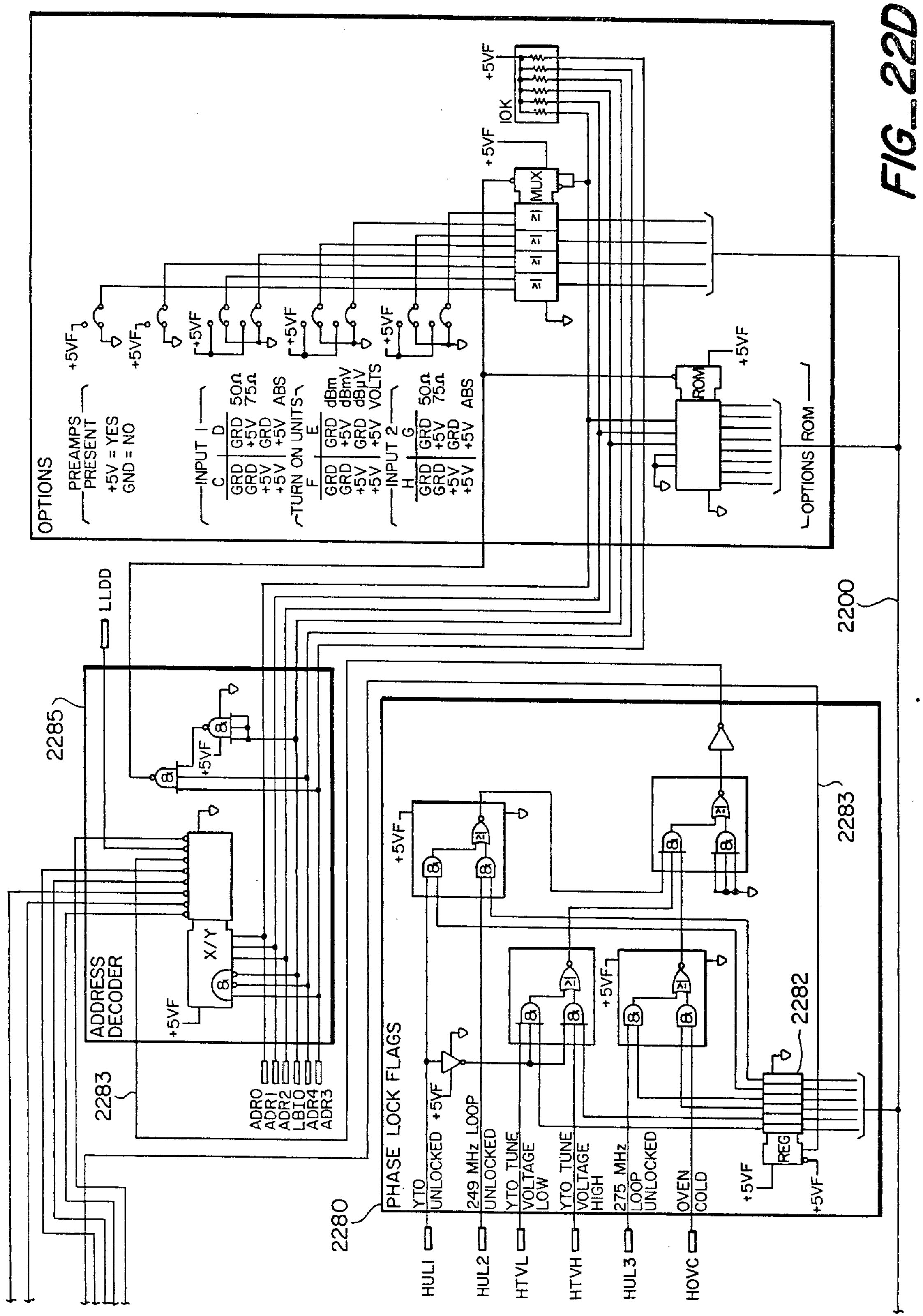
FIG_22D

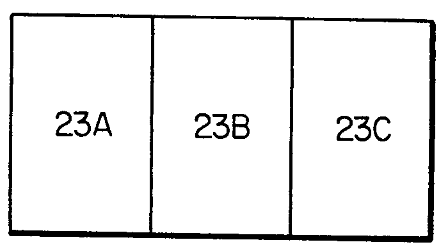
FIG_23

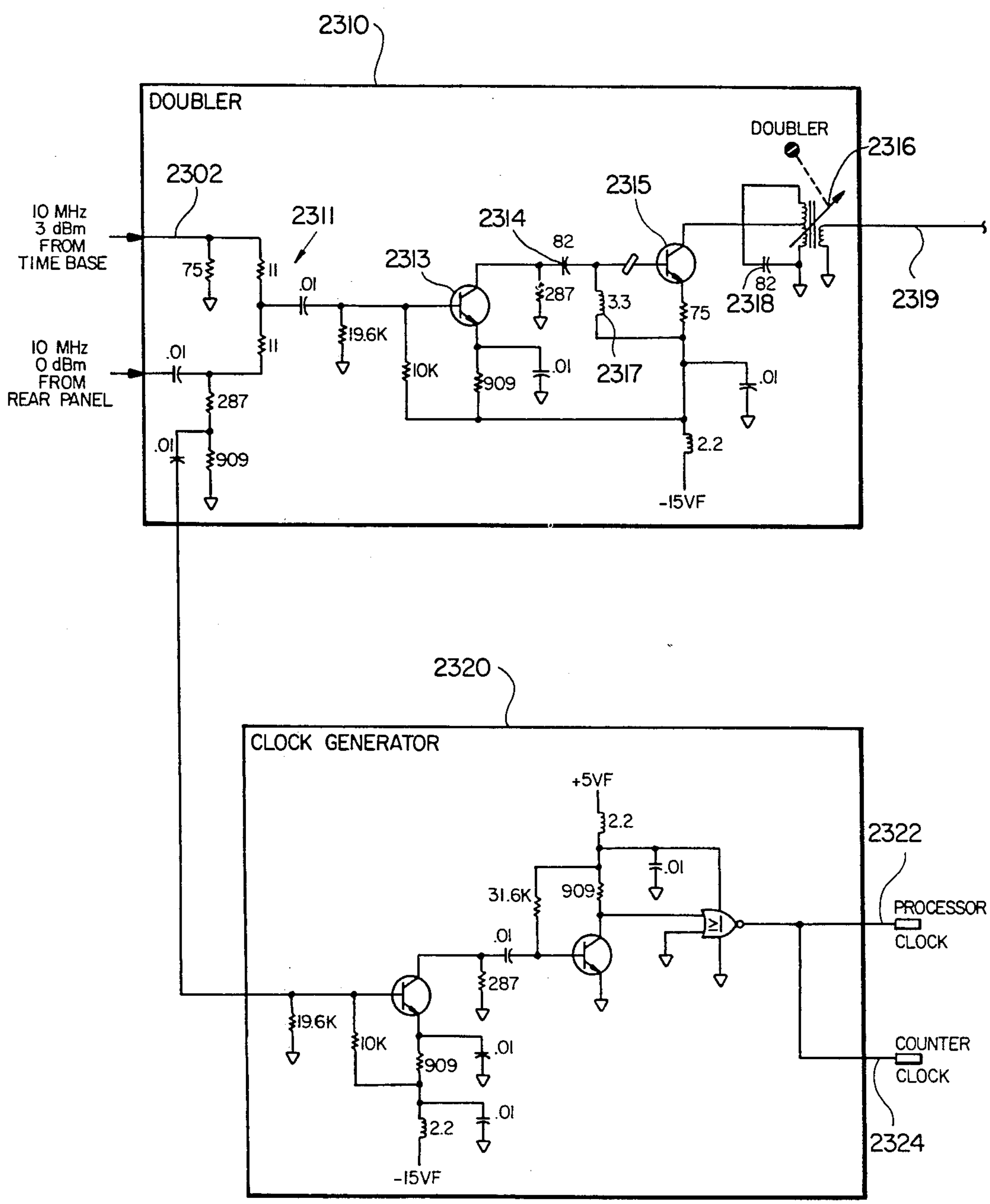
FIG_23A

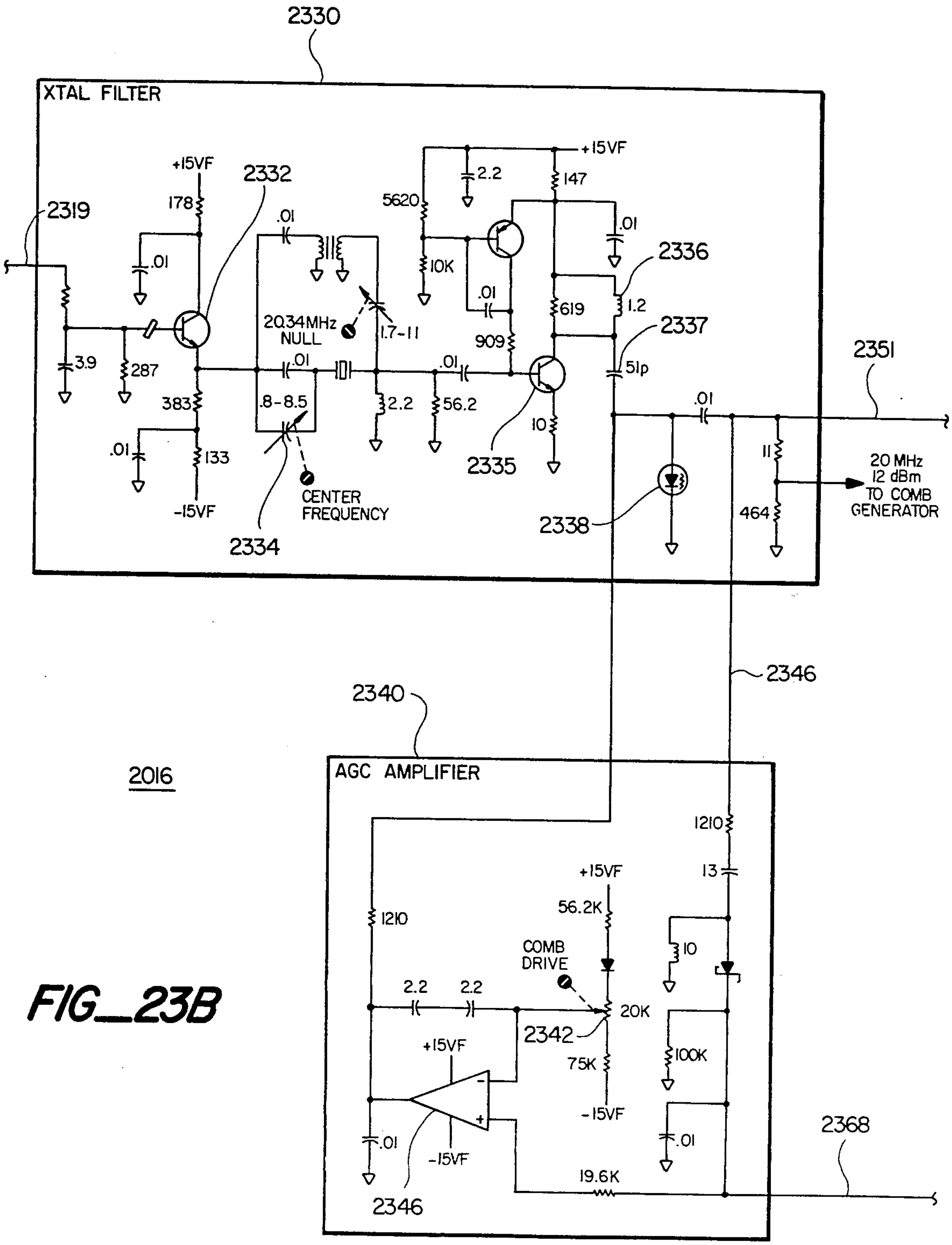
2016
FIG_23B

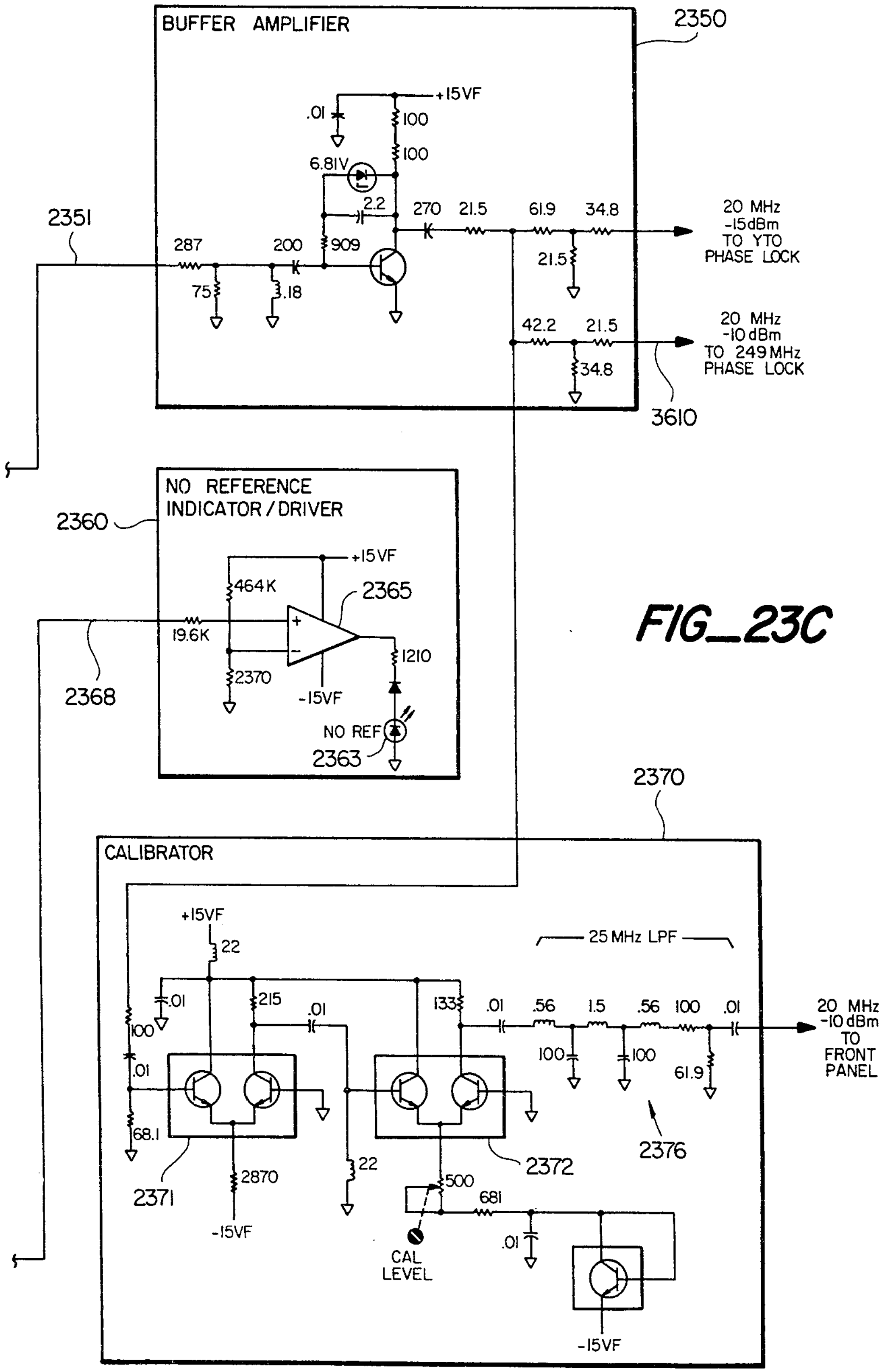
FIG_23C

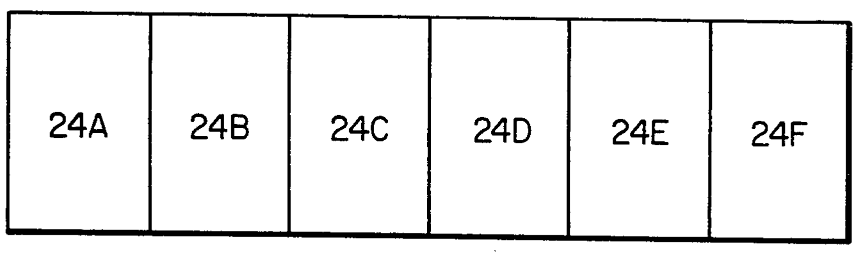
FIG_24

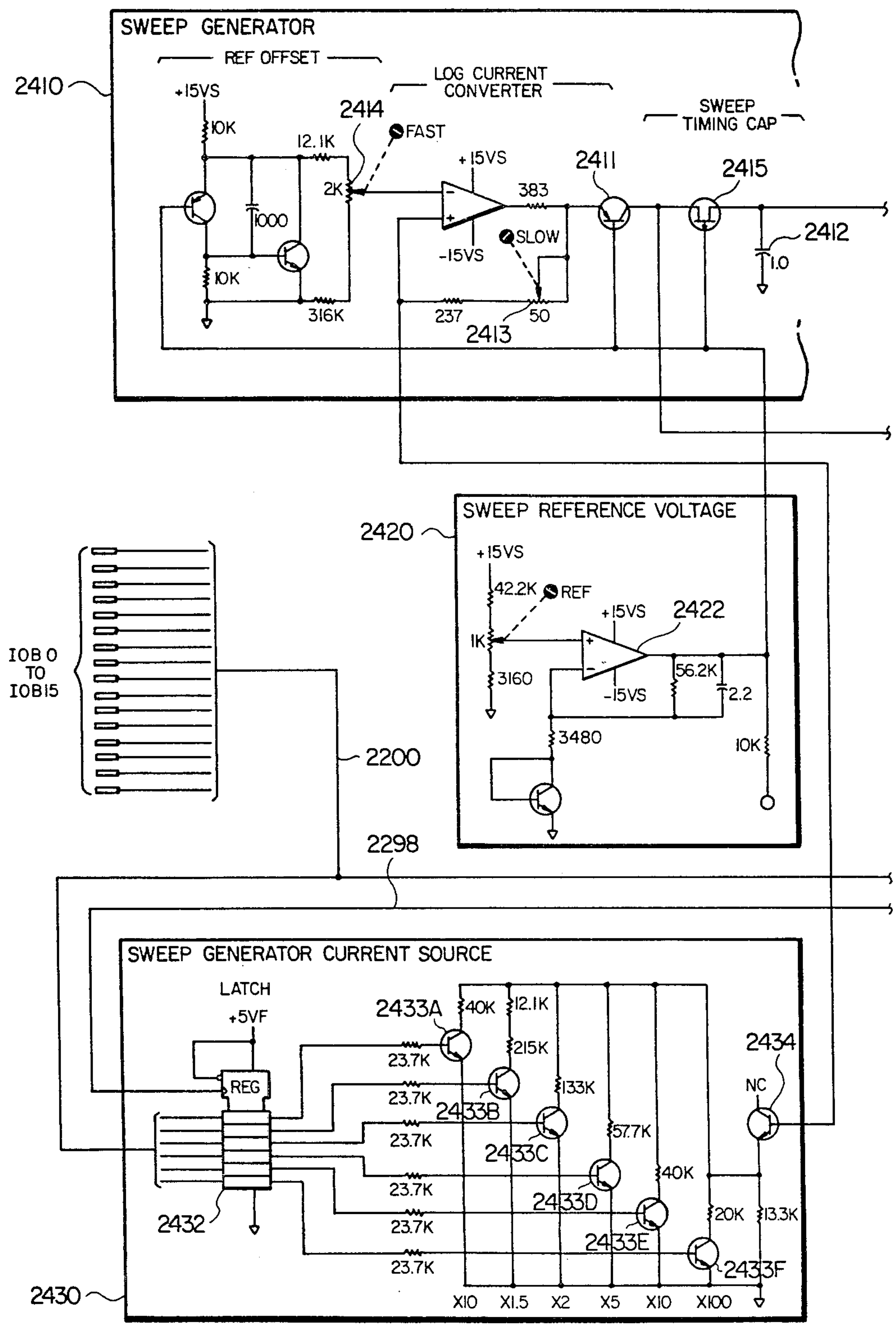
FIG_24A

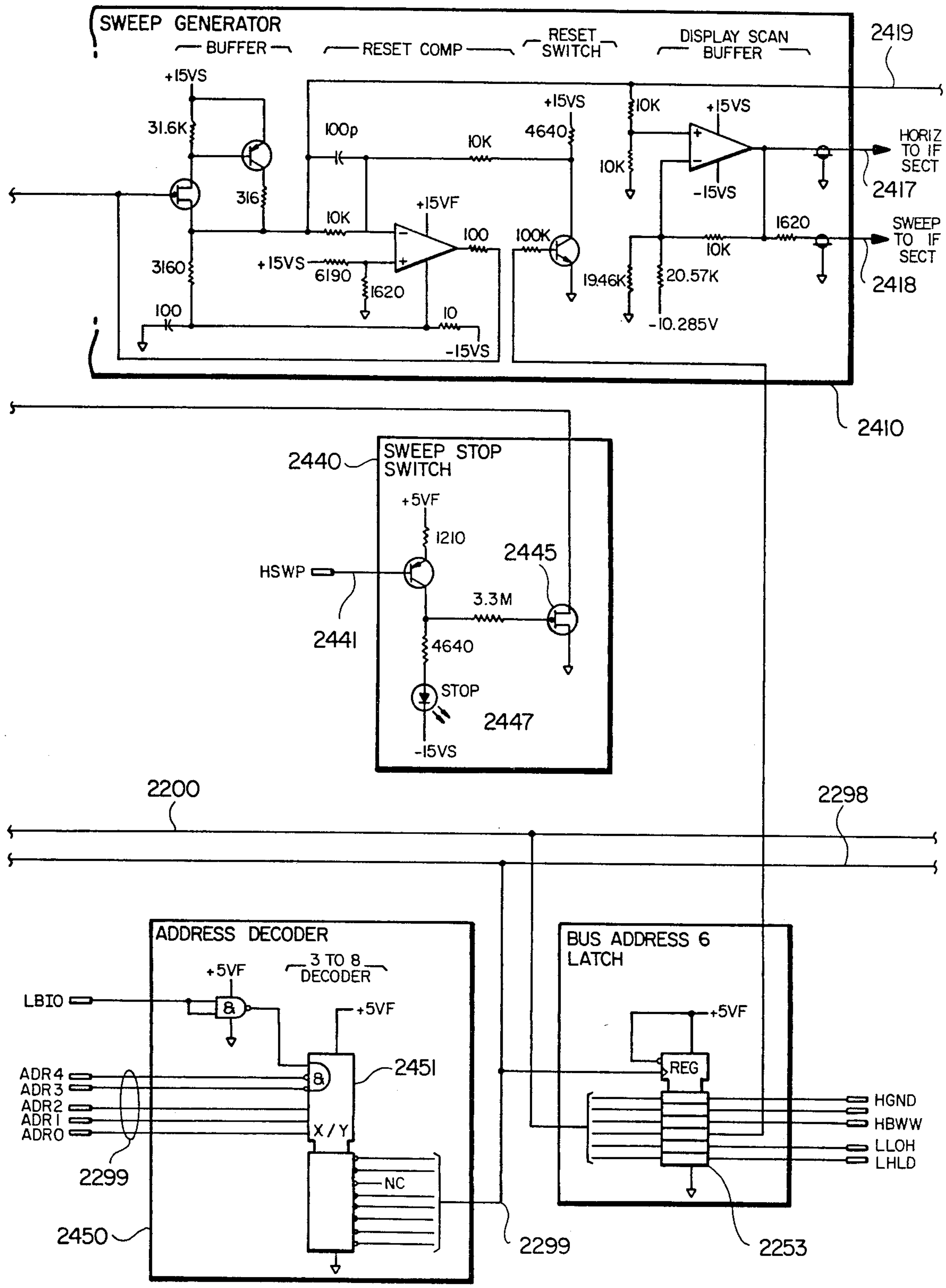
FIG_24B

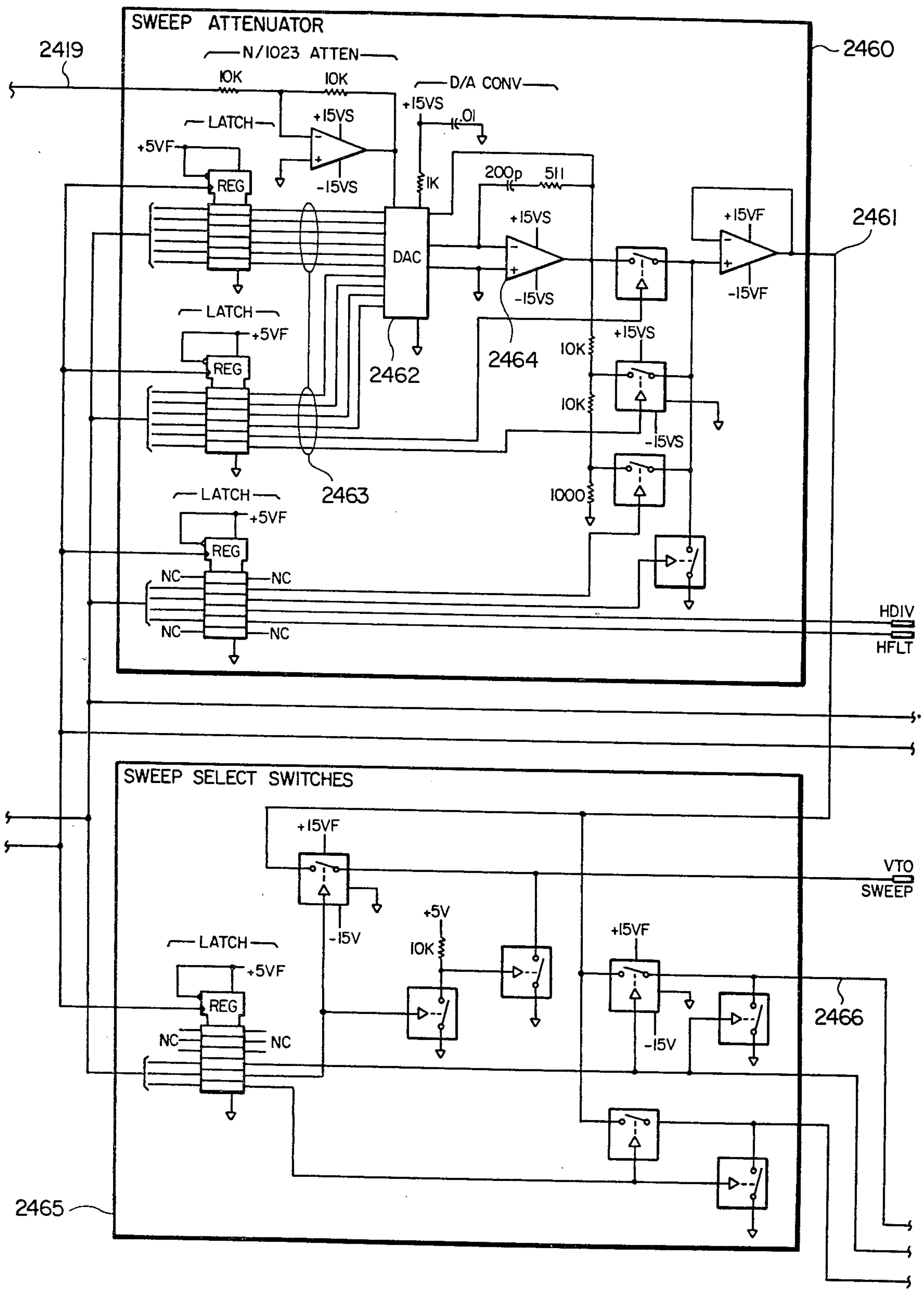
FIG_24C

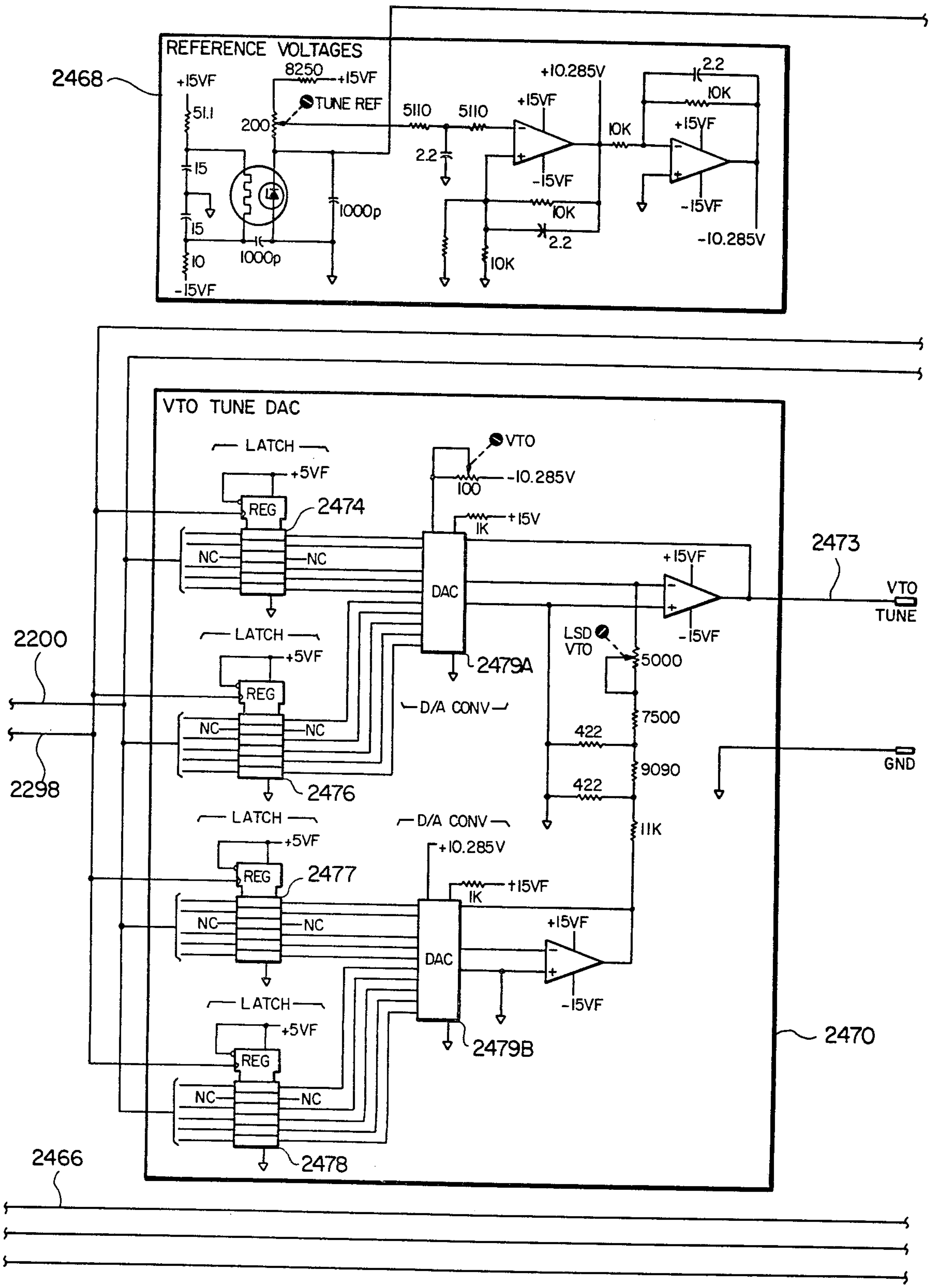
FIG_24D

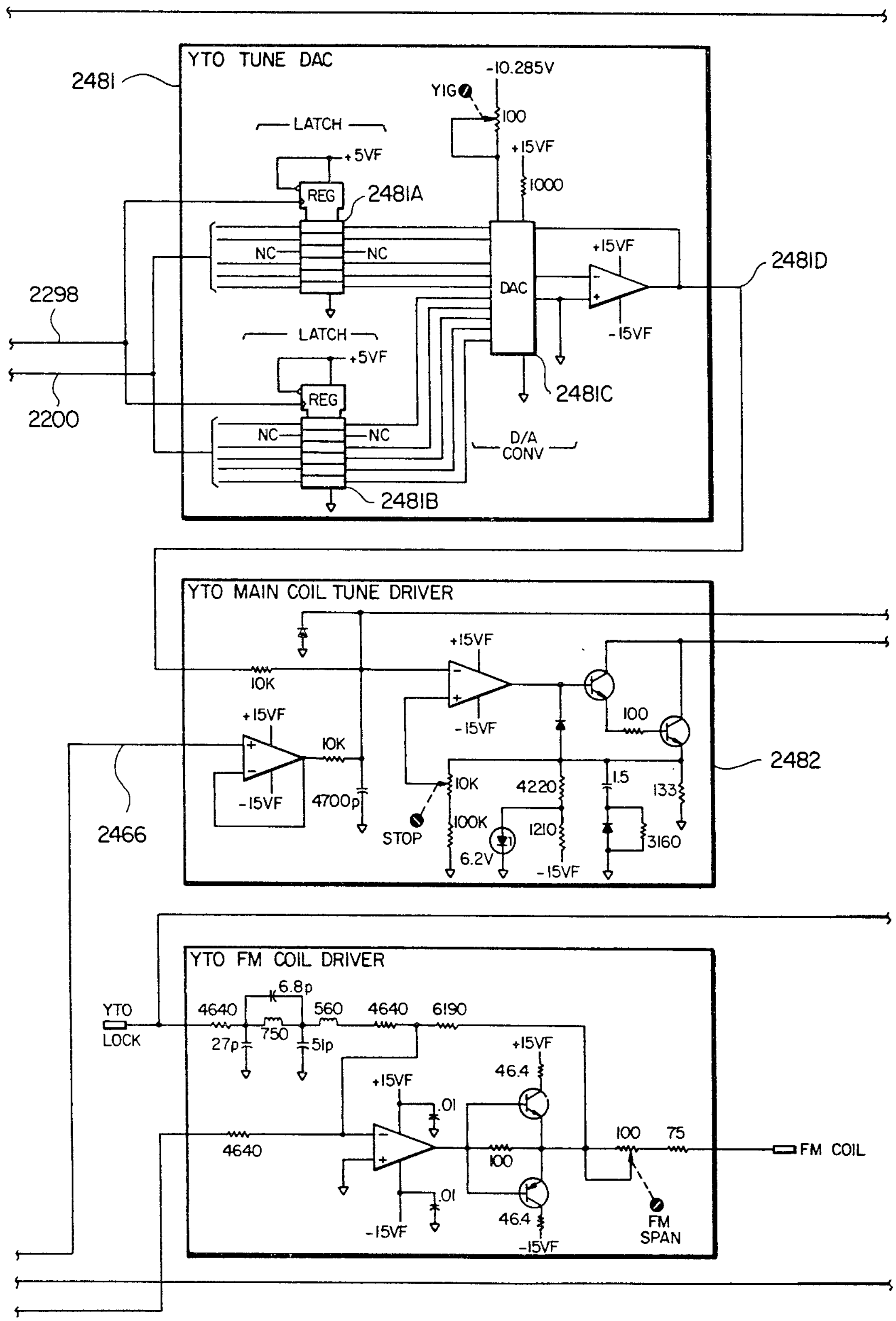
FIG_24E

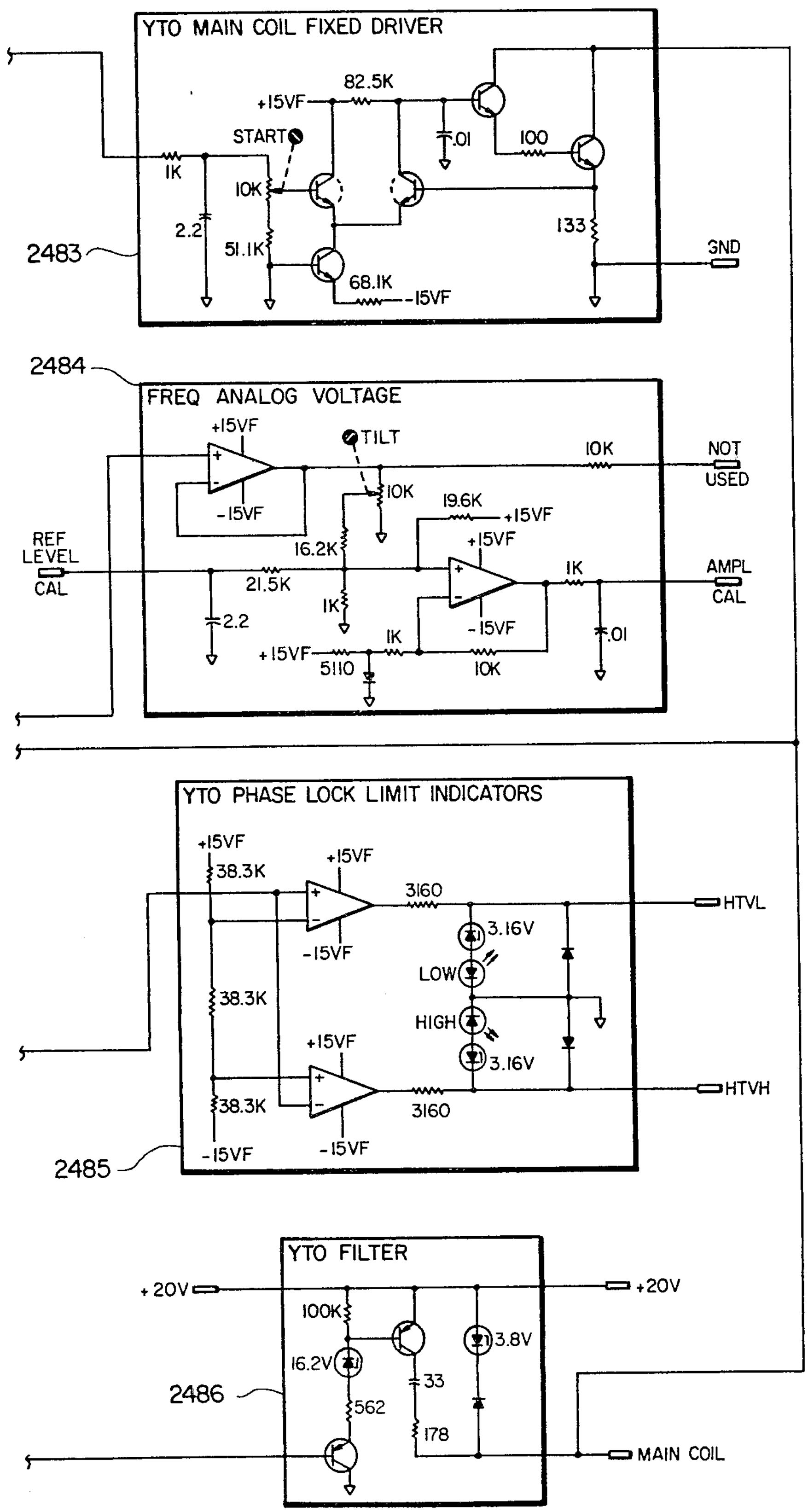
FIG_24F

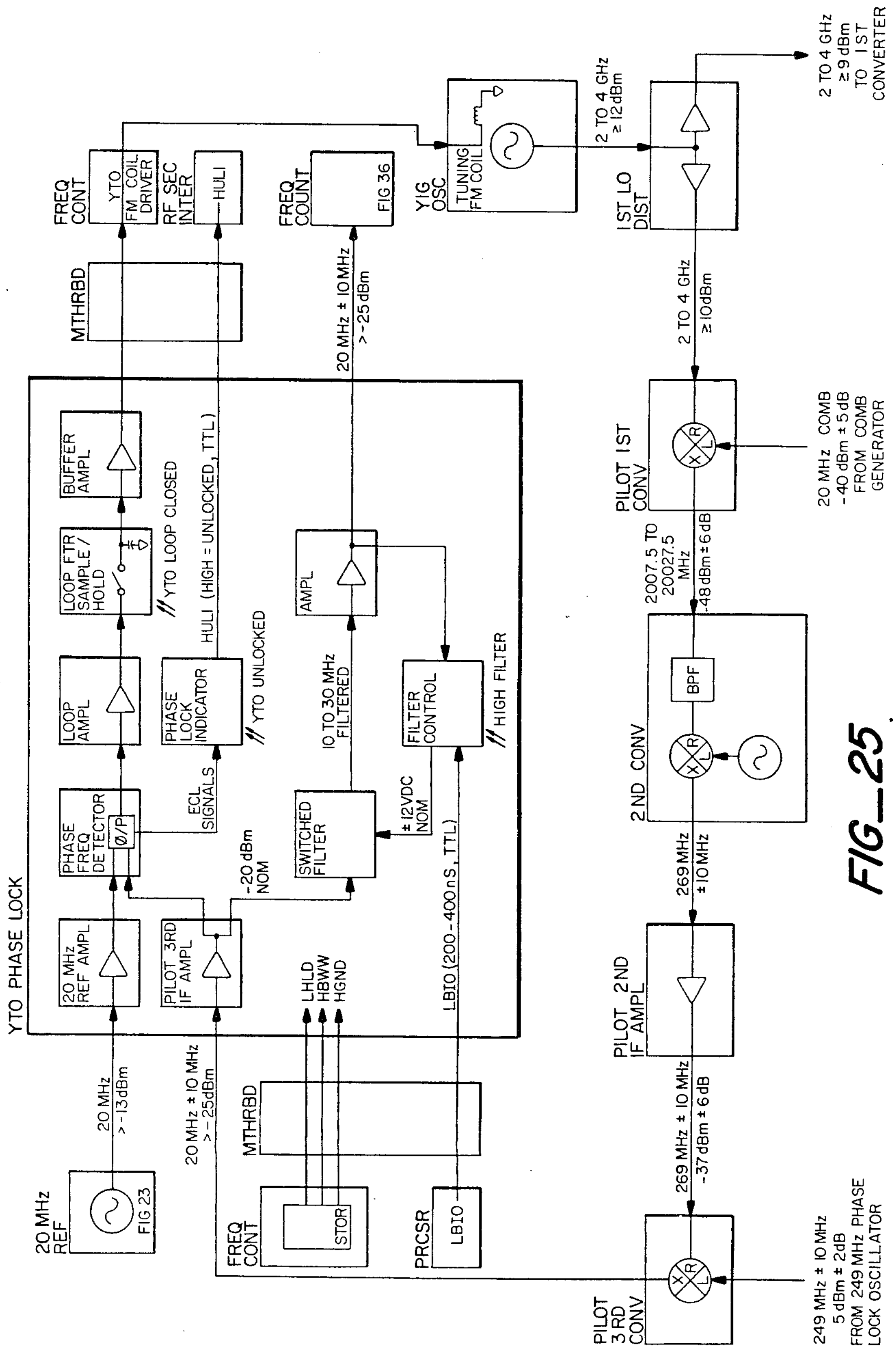
FIG_25

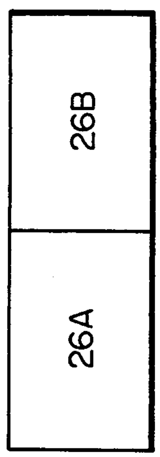
FIG_26

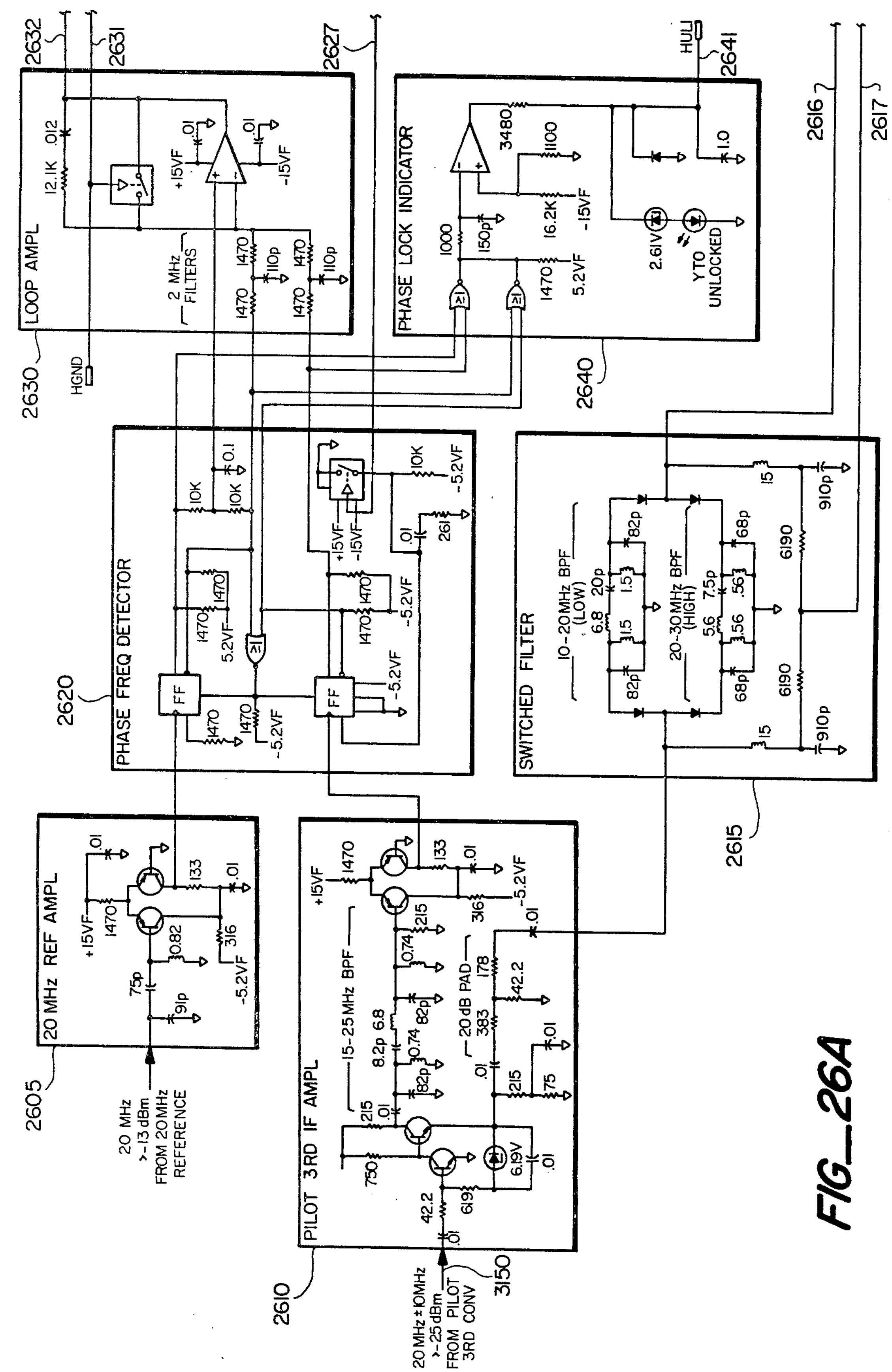
FIG_26A

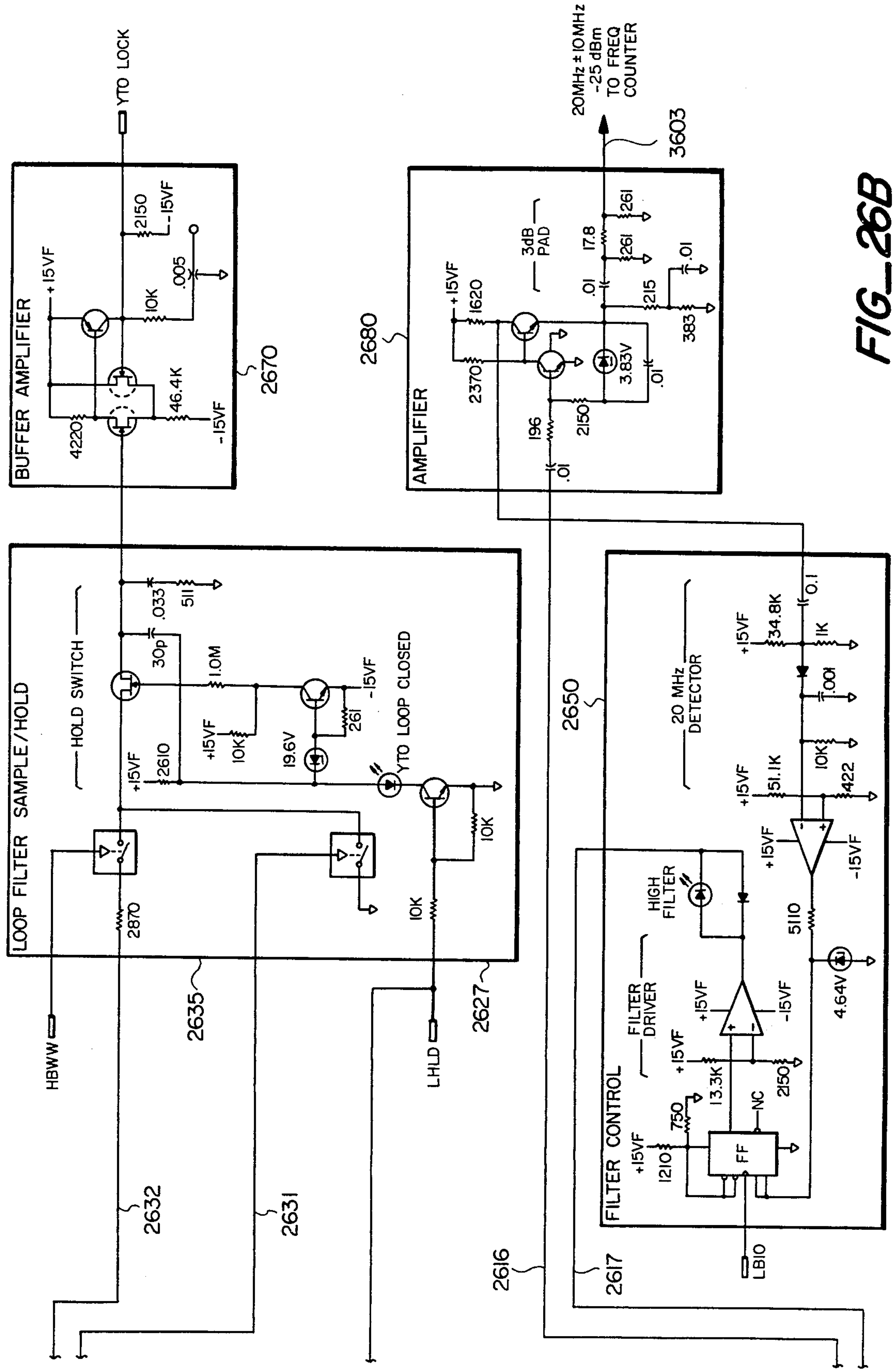
FIG_26B

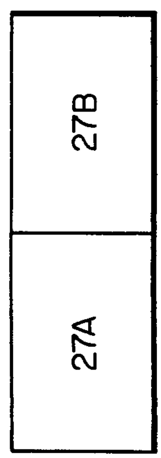
FIG_27

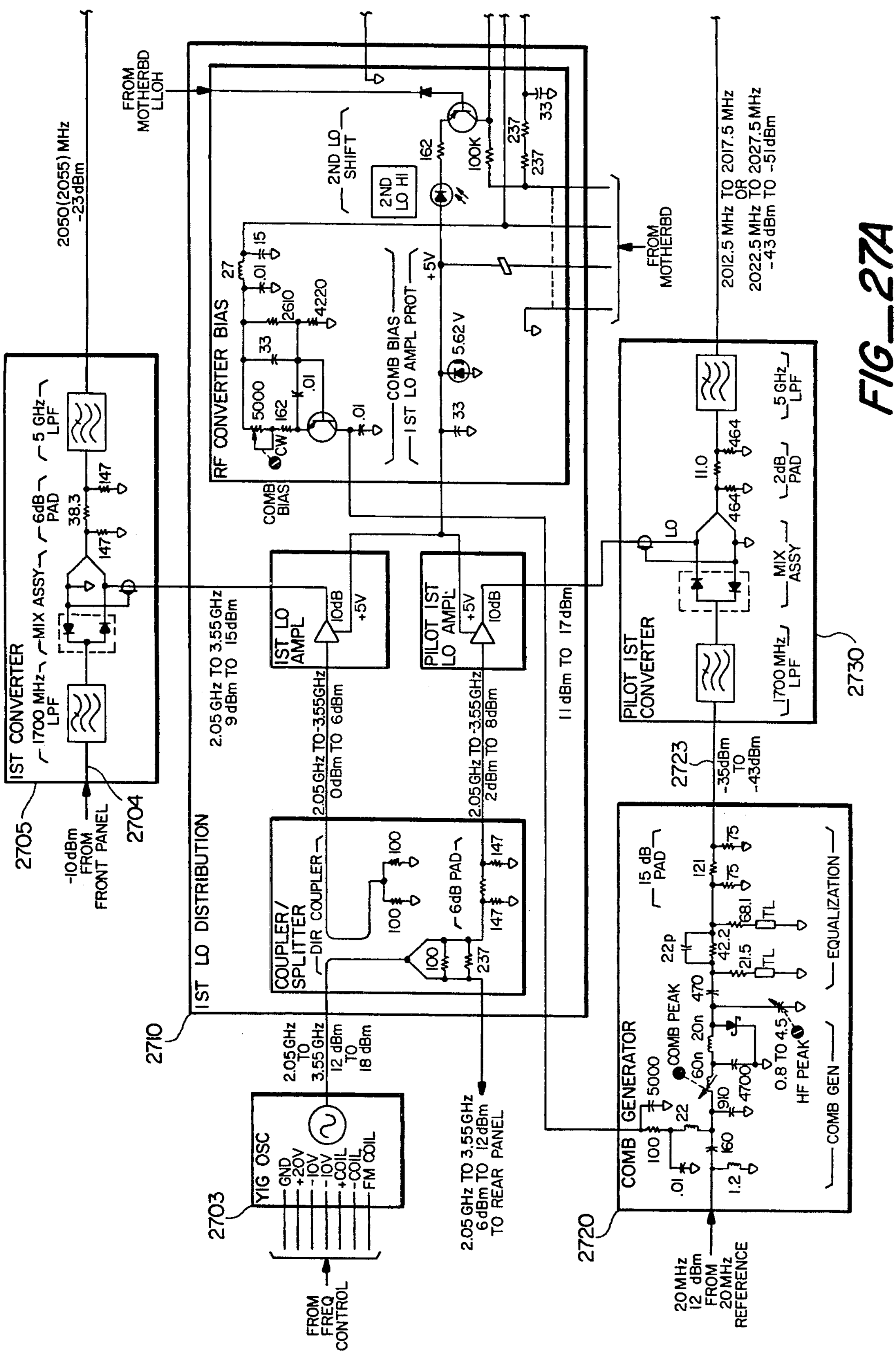
FIG_27A

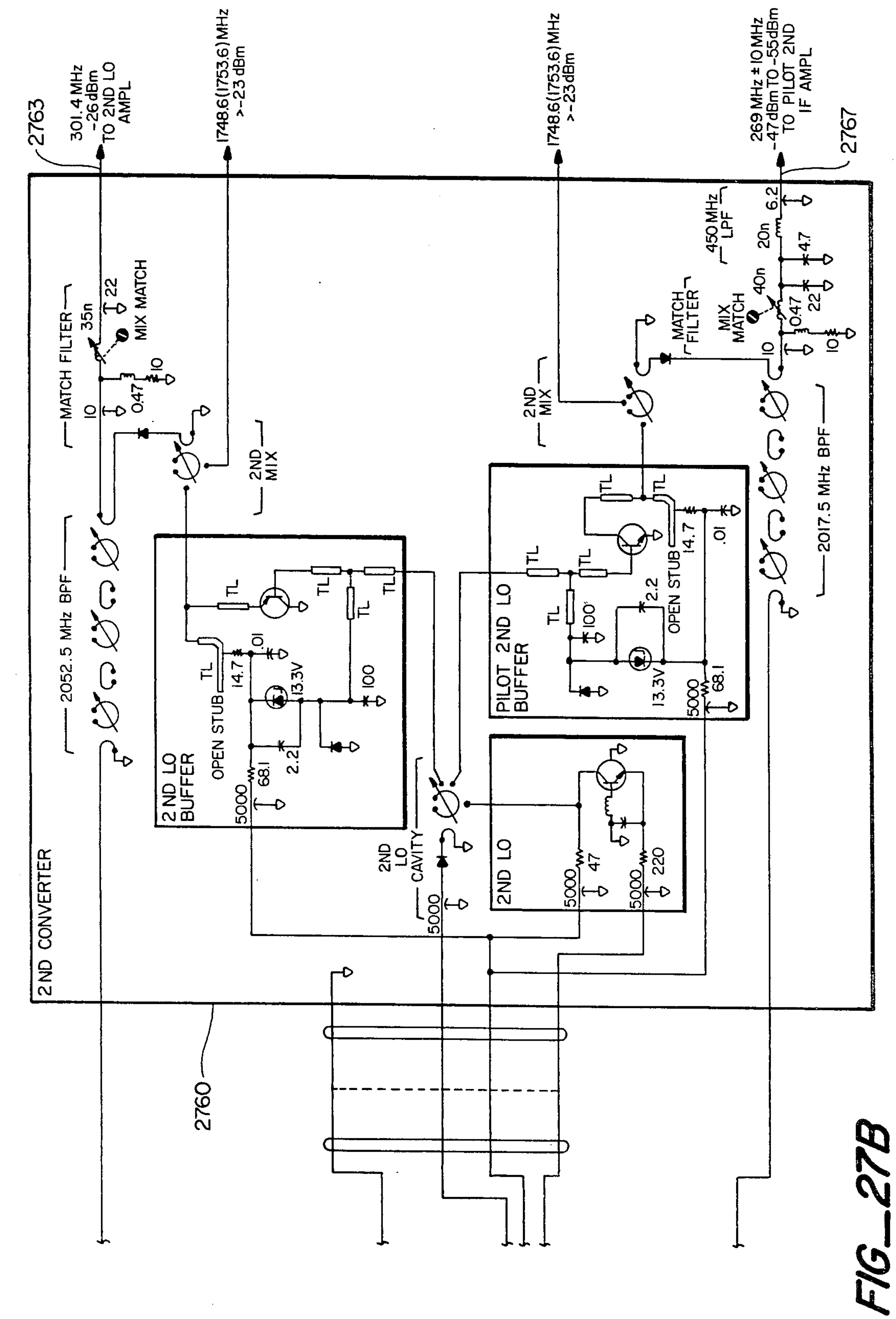
FIG_27B

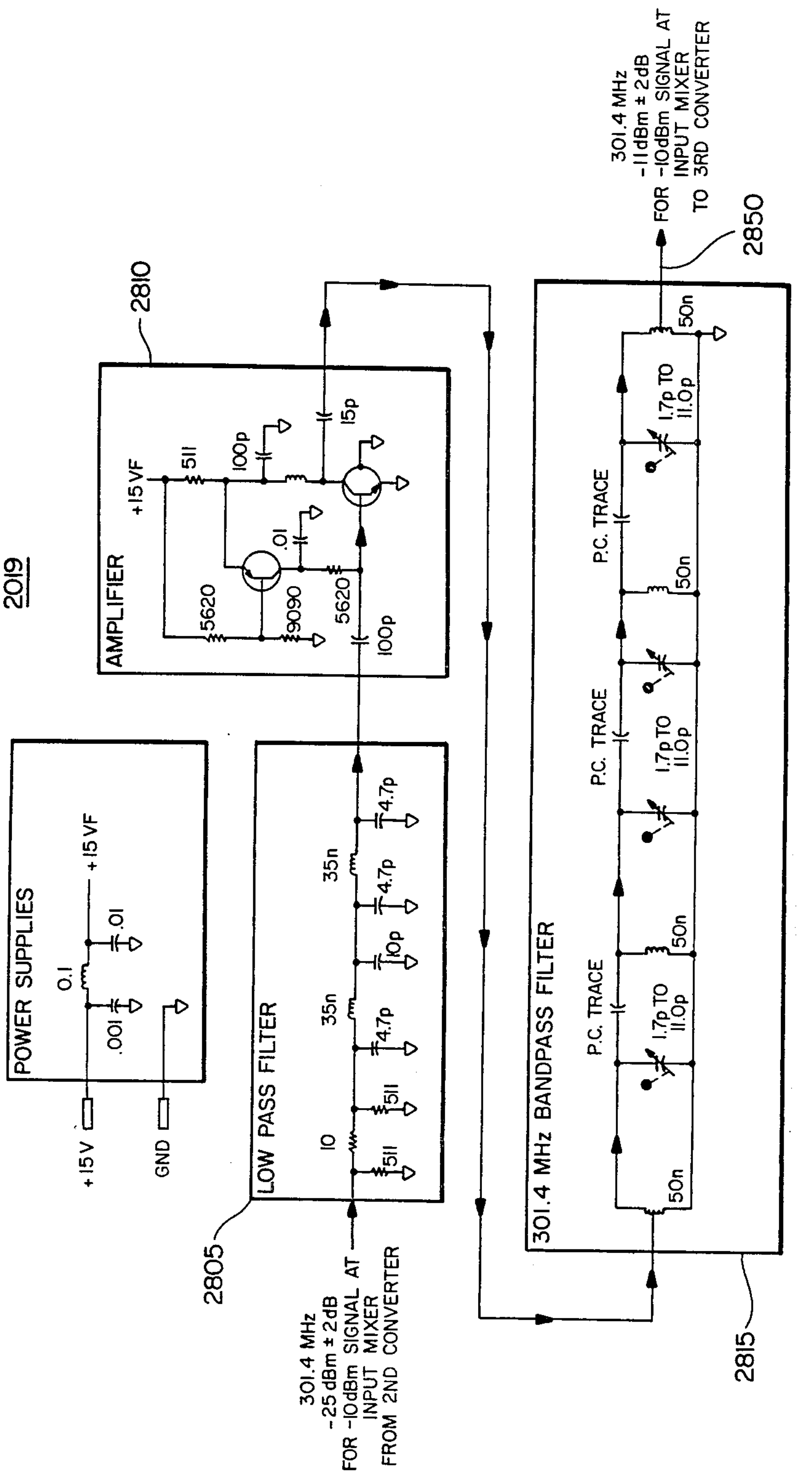
FIG_28

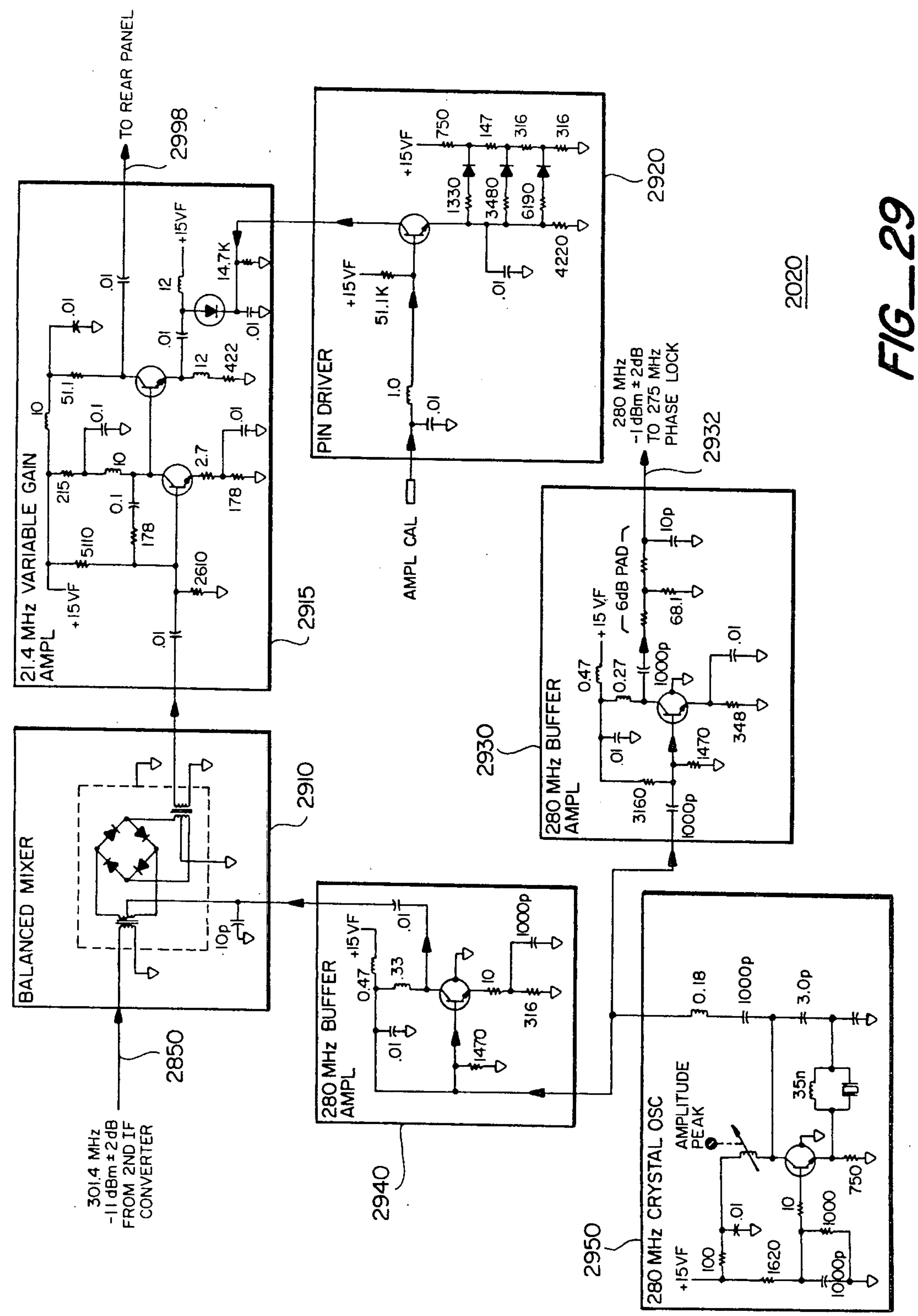
FIG_29

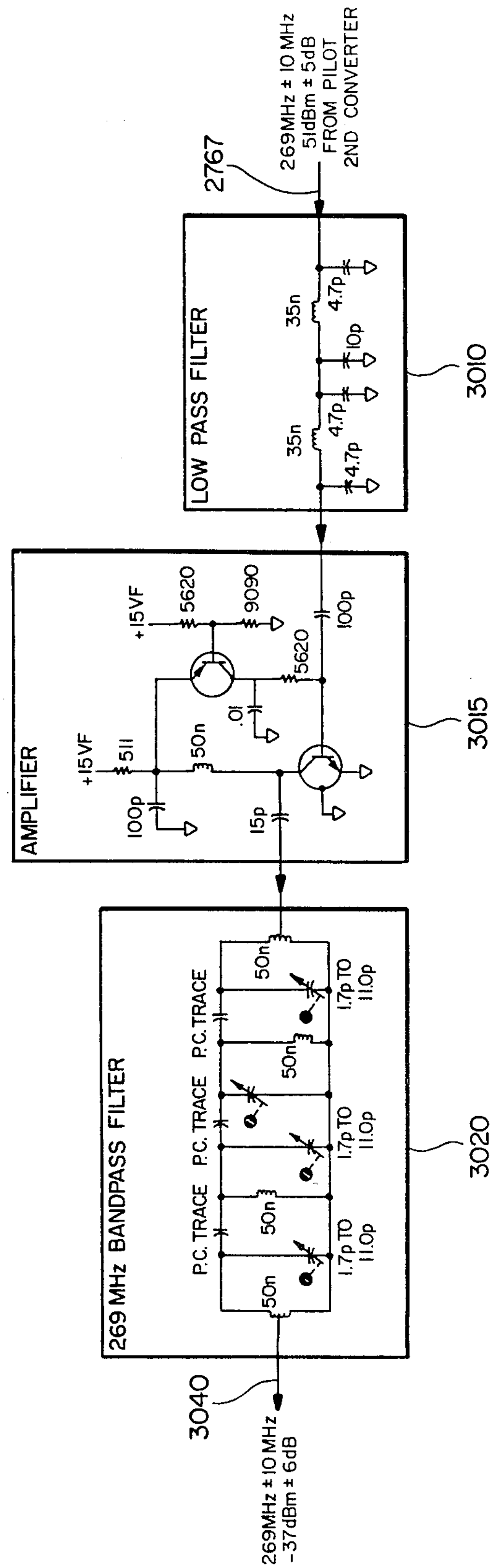
FIG_30

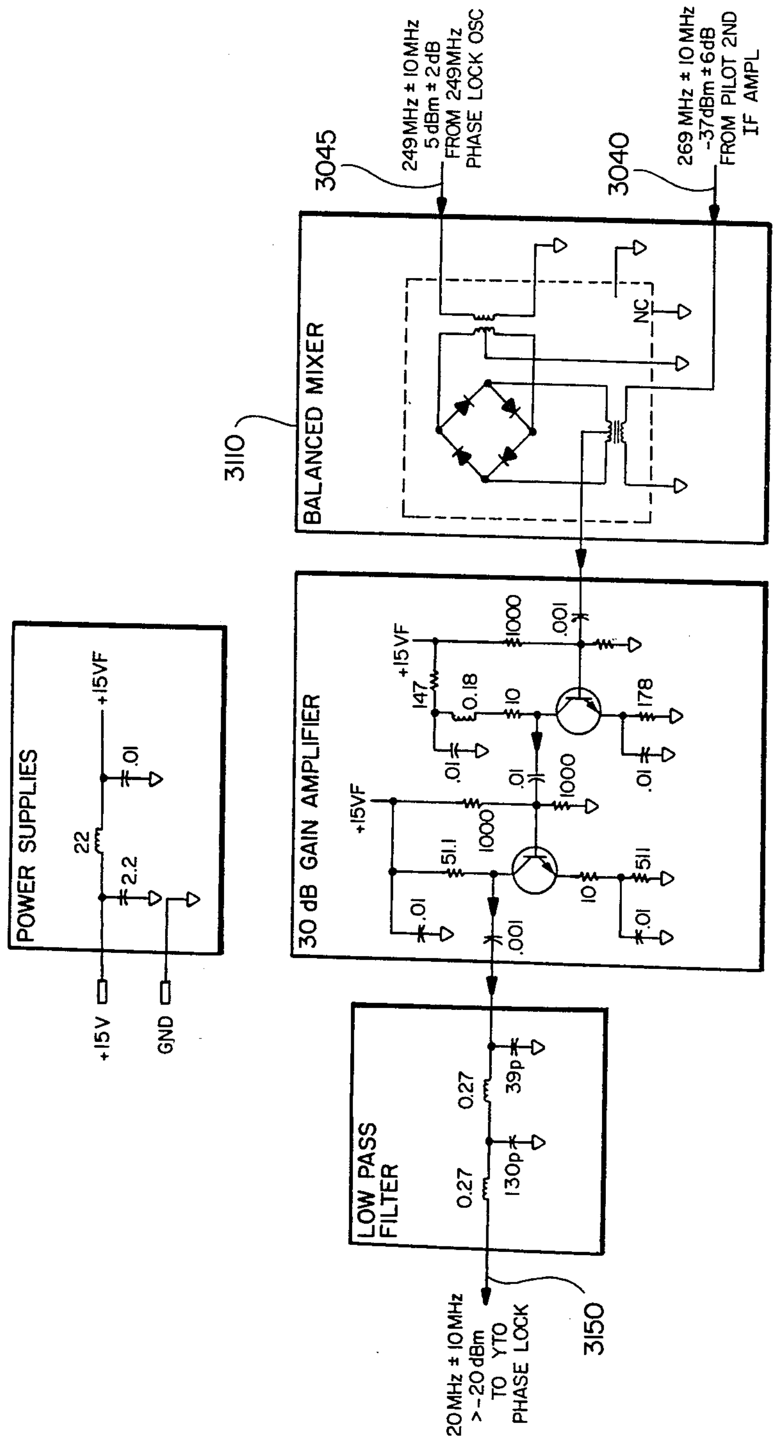
FIG_31

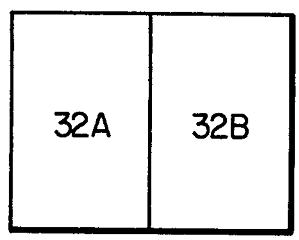
FIG_32

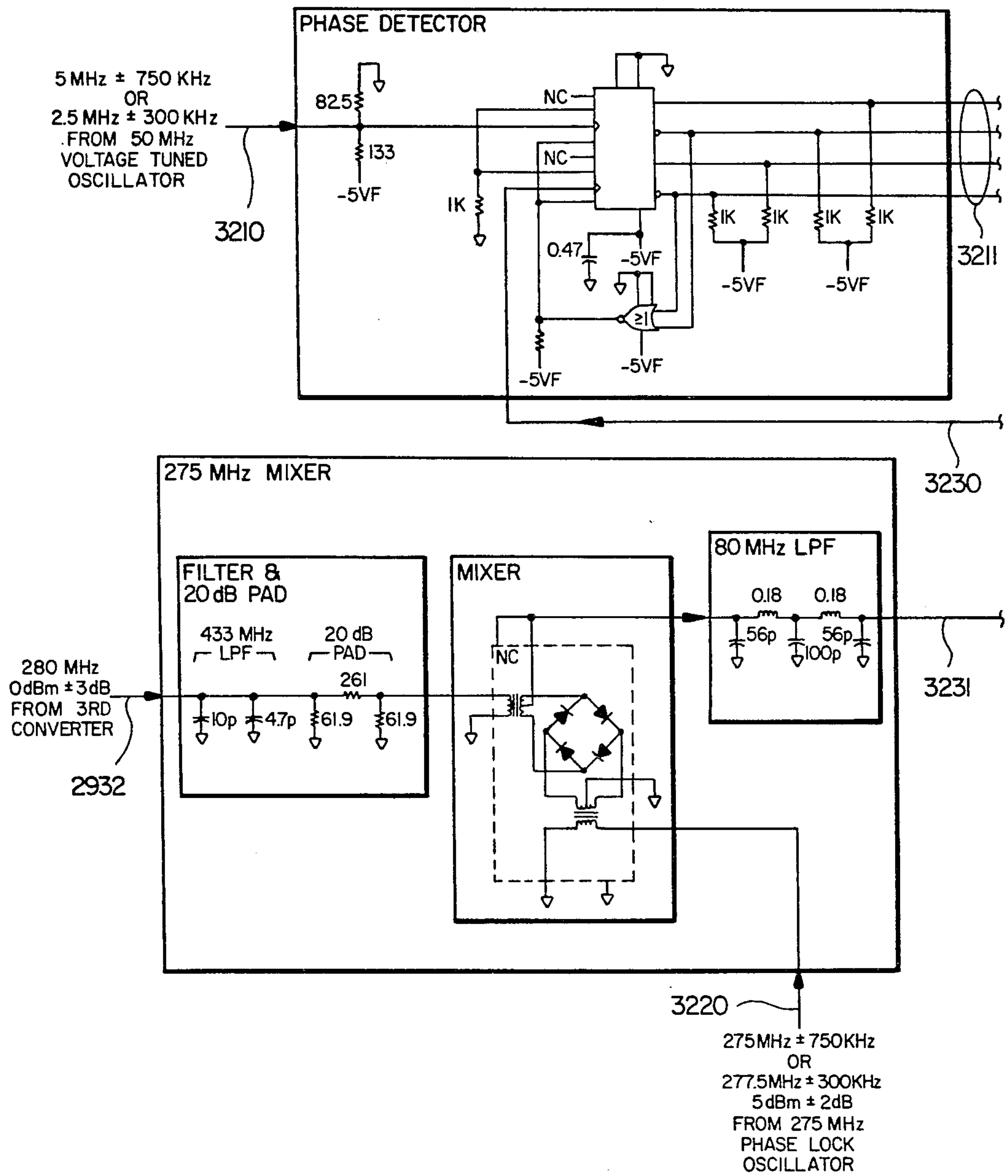
FIG_32A

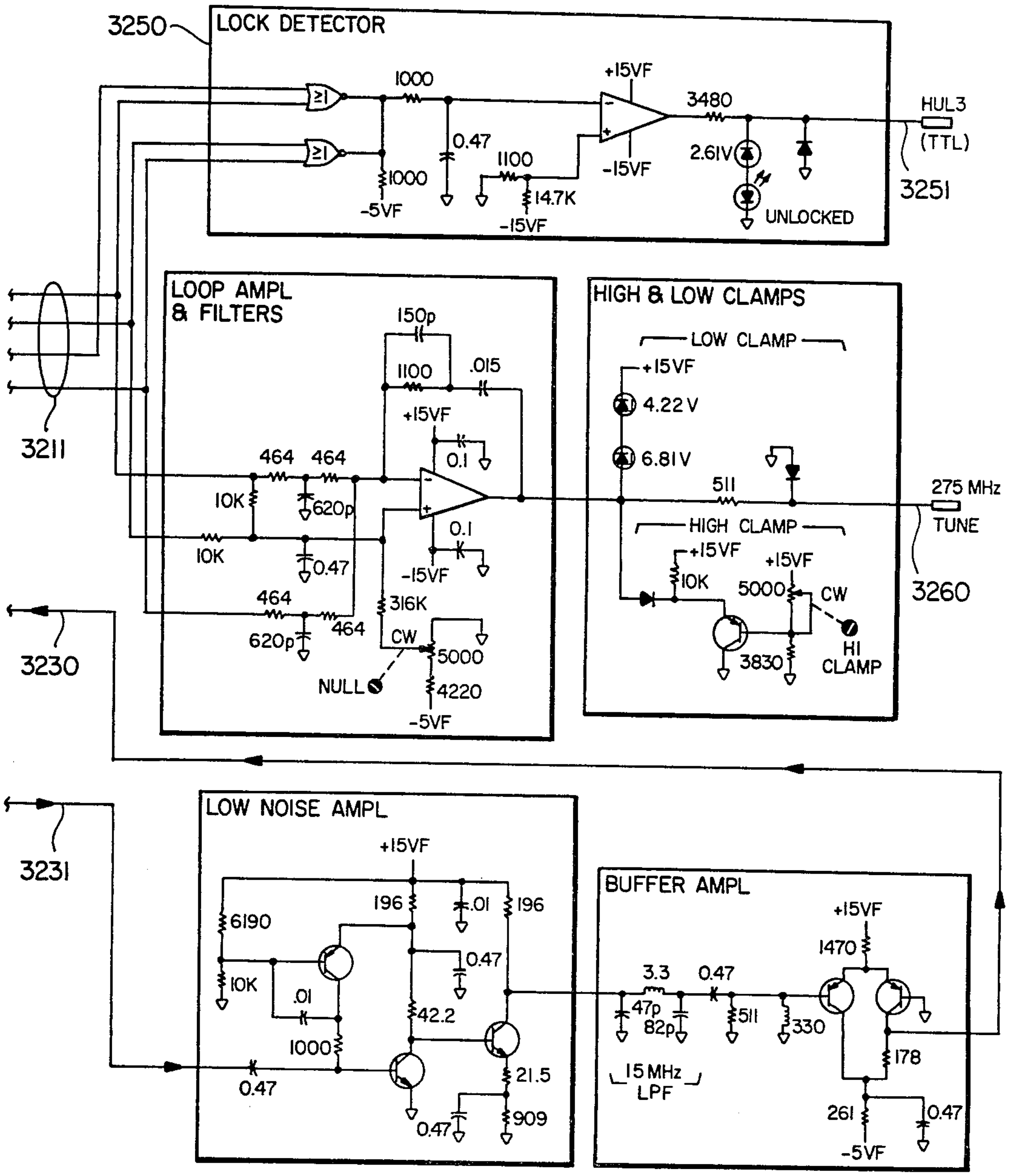
FIG_32B

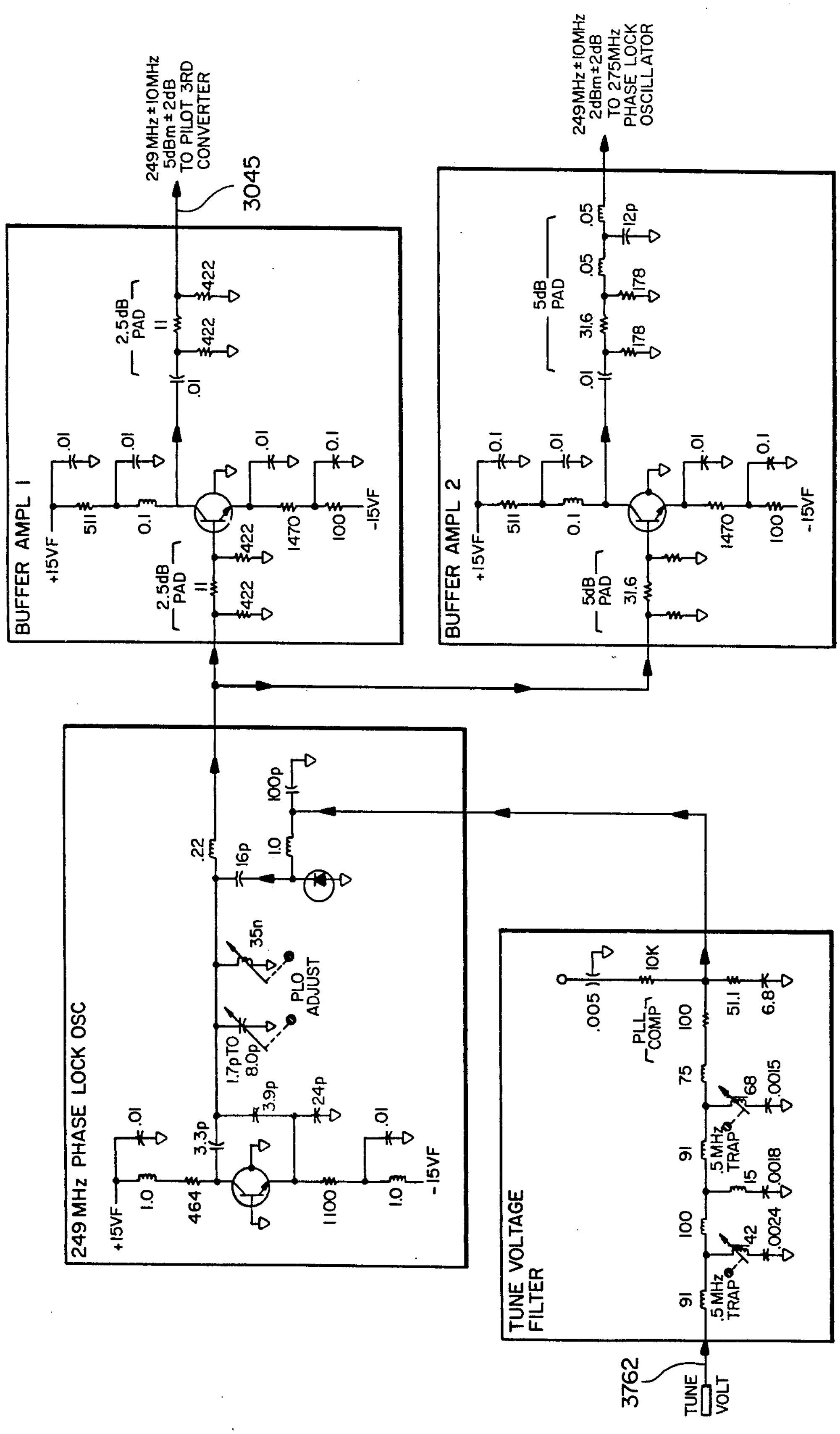
FIG_33

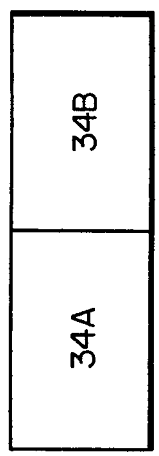
FIG_34

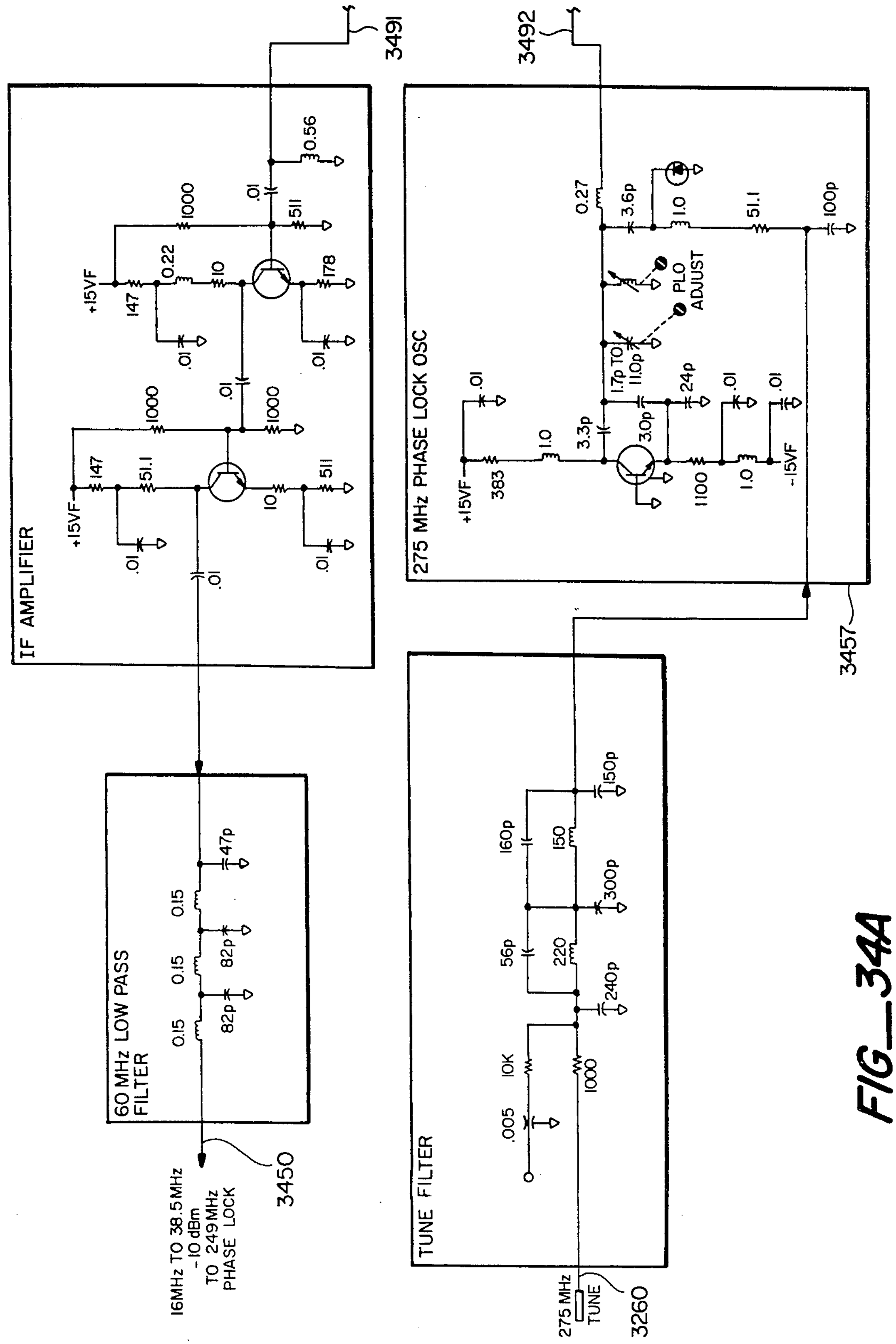
FIG_34A

FIG_34B
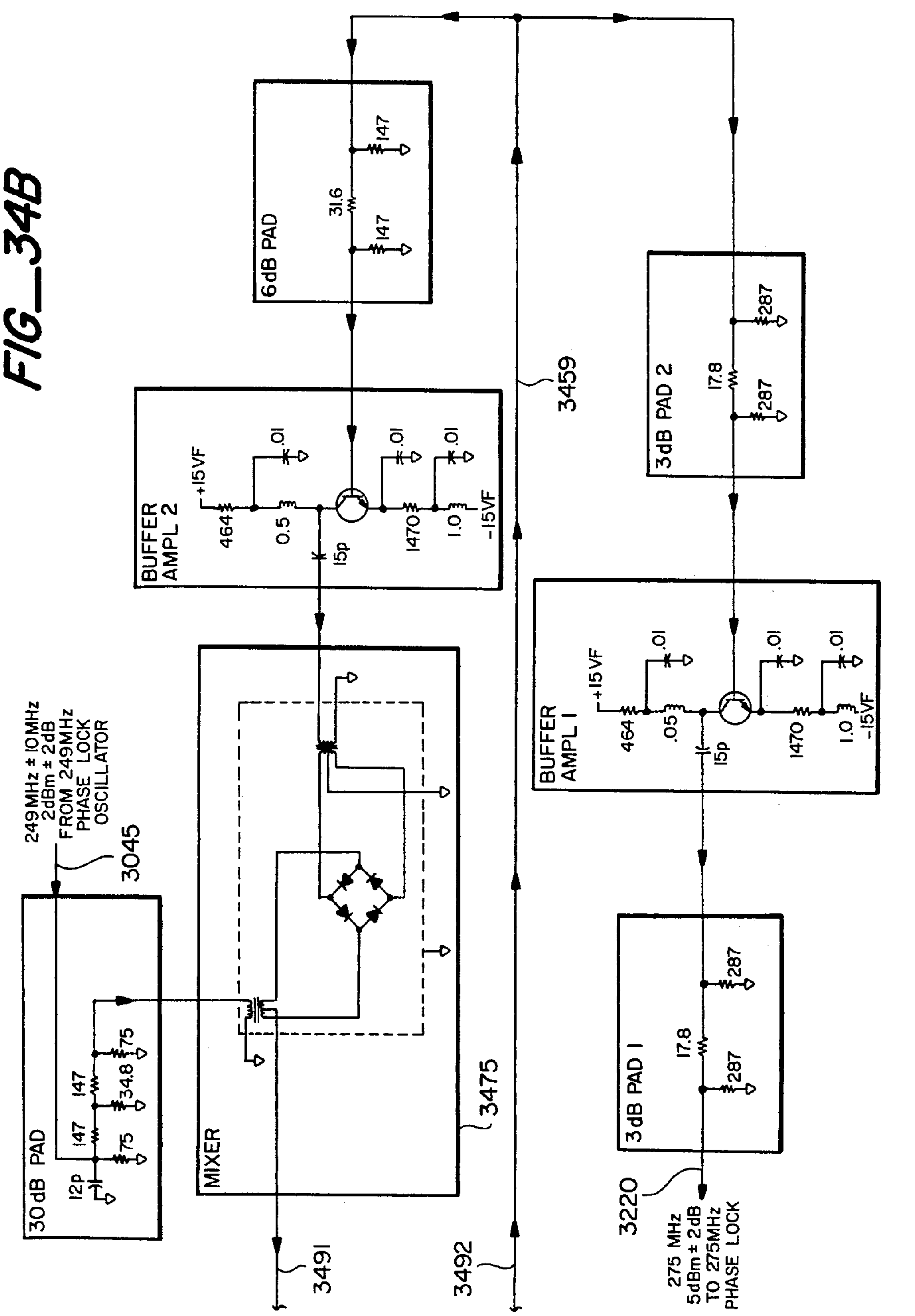

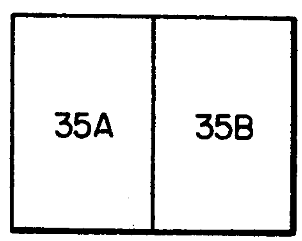
FIG_35

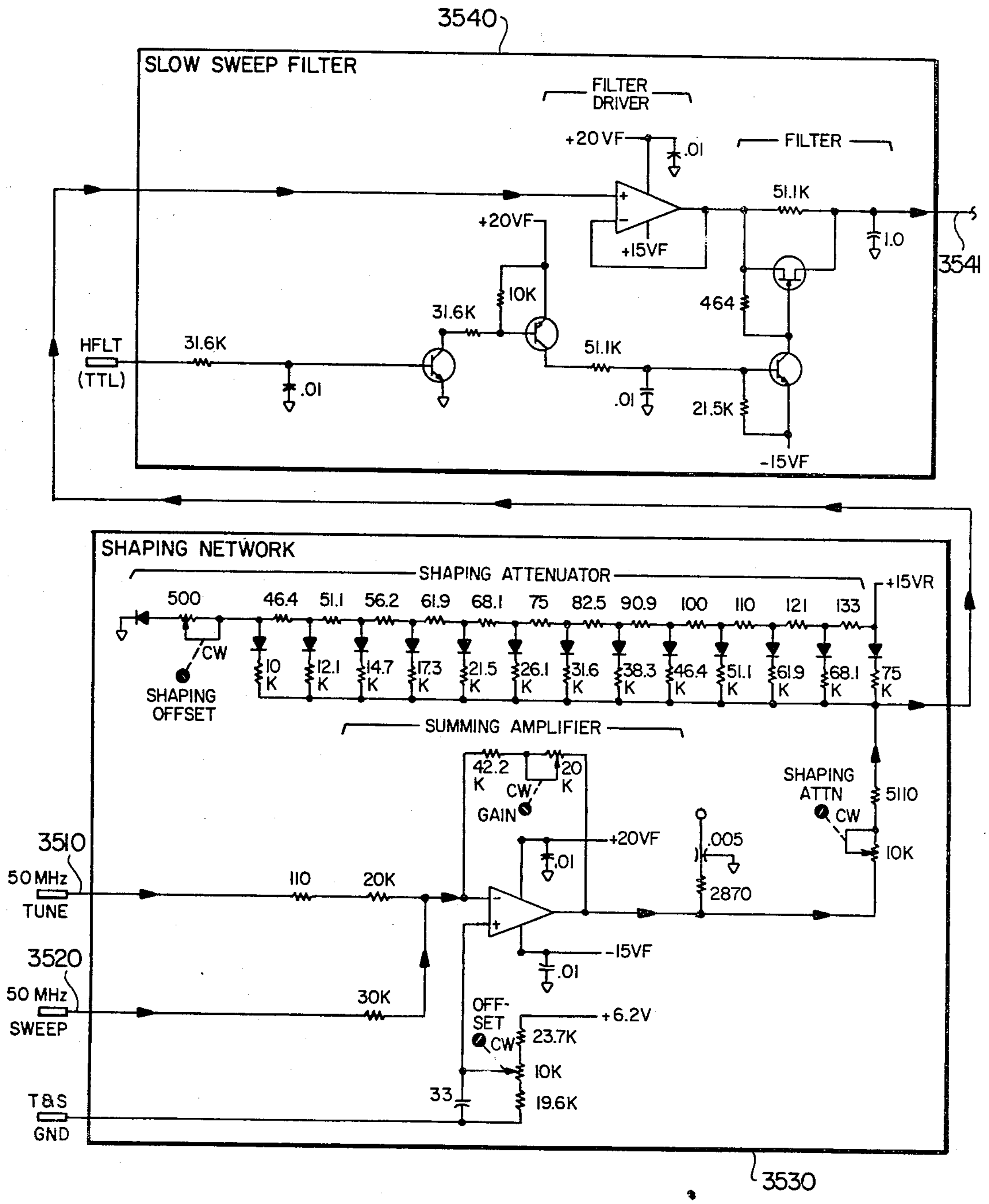
FIG_35A

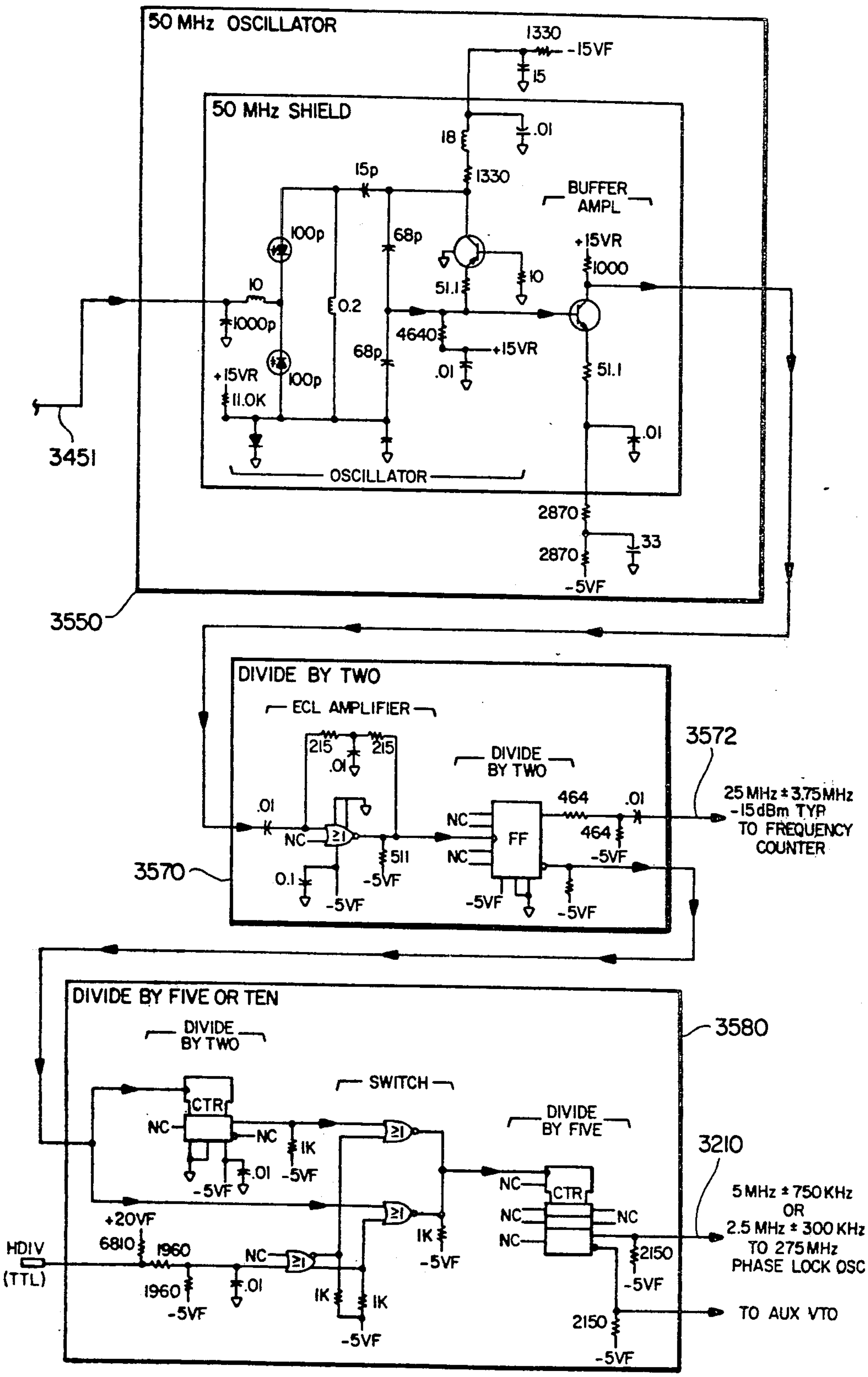
FIG_35B

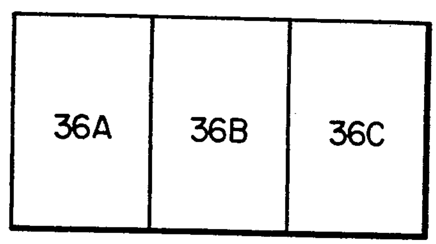
FIG_36

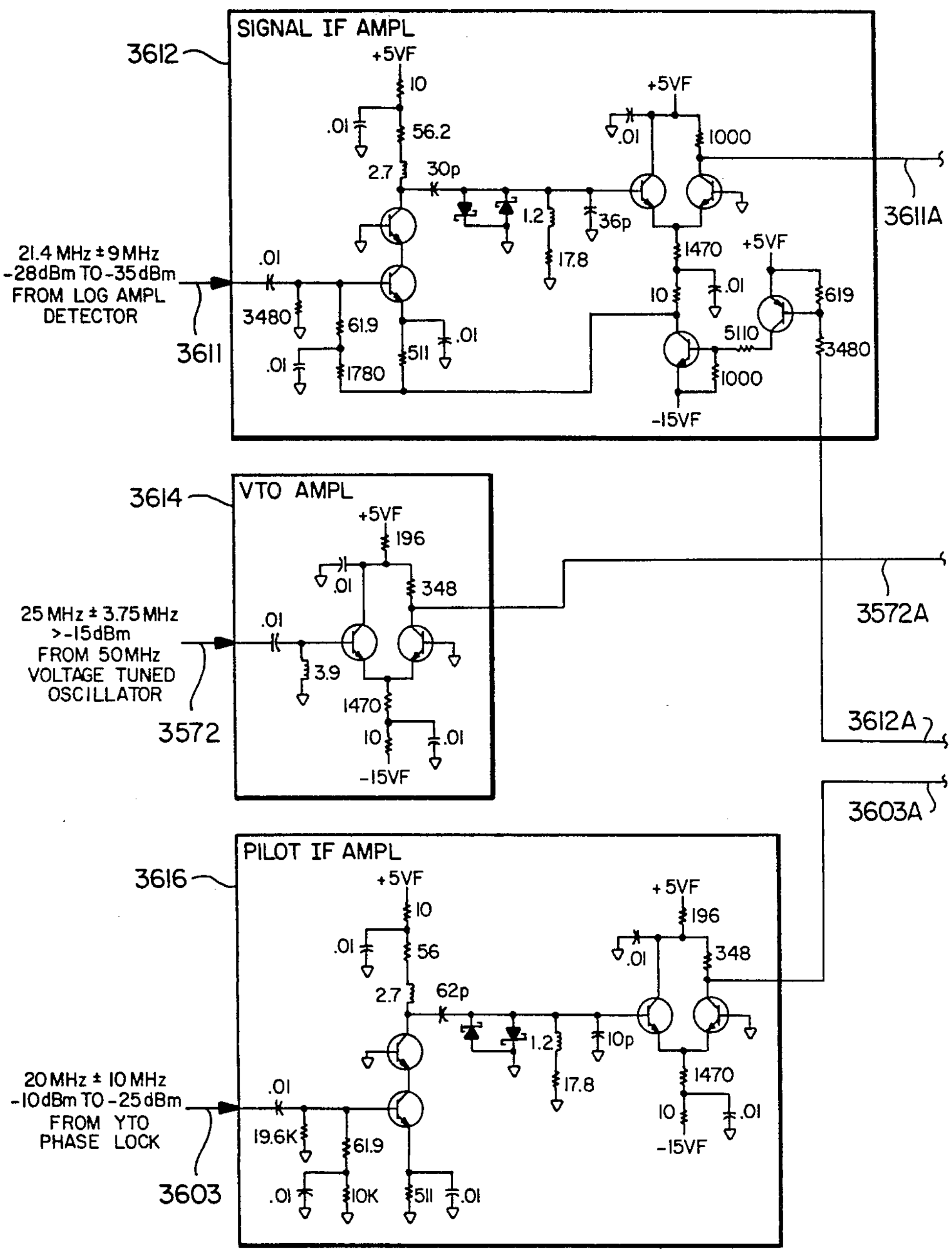
FIG_36A

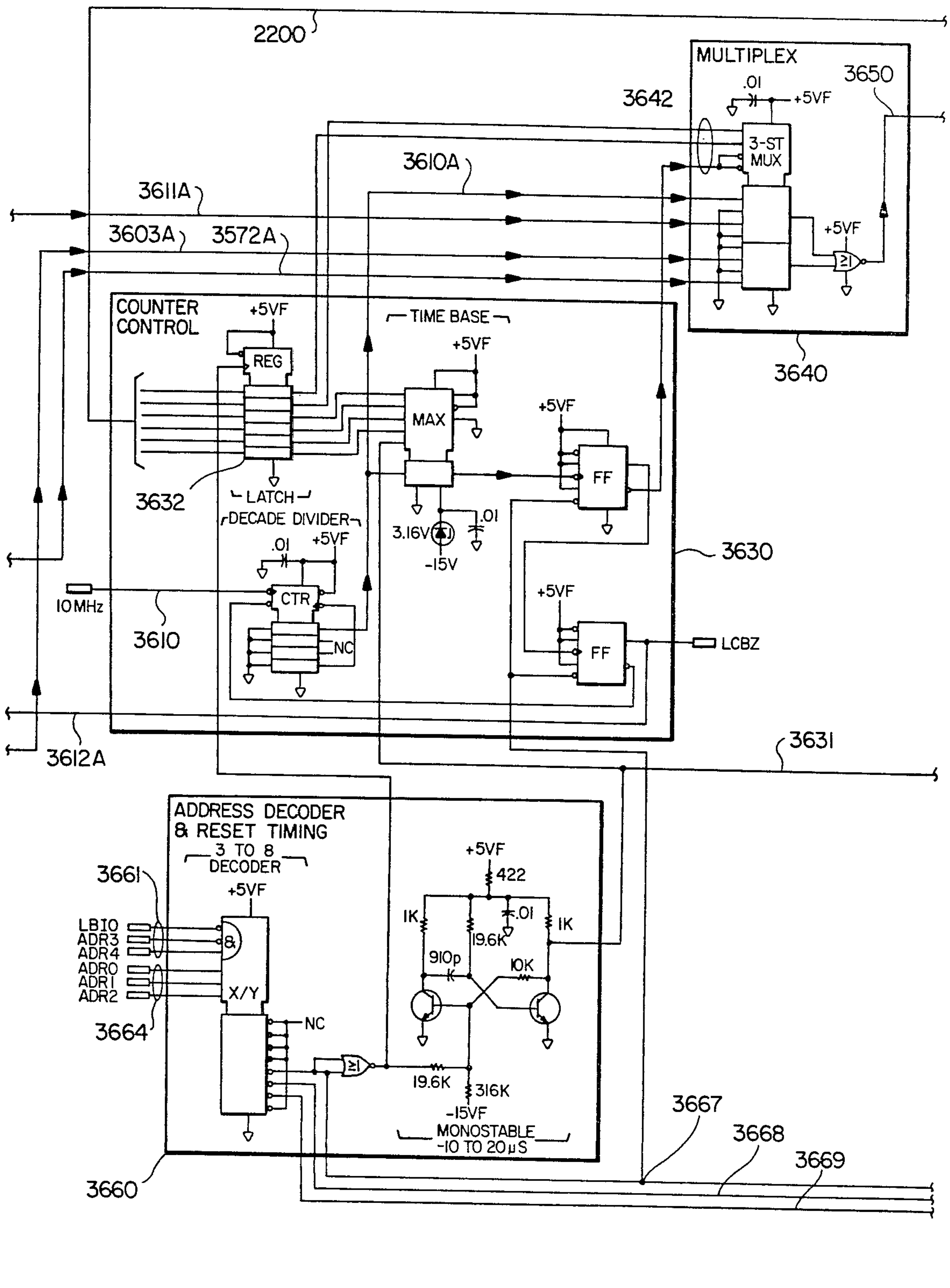
FIG_36B

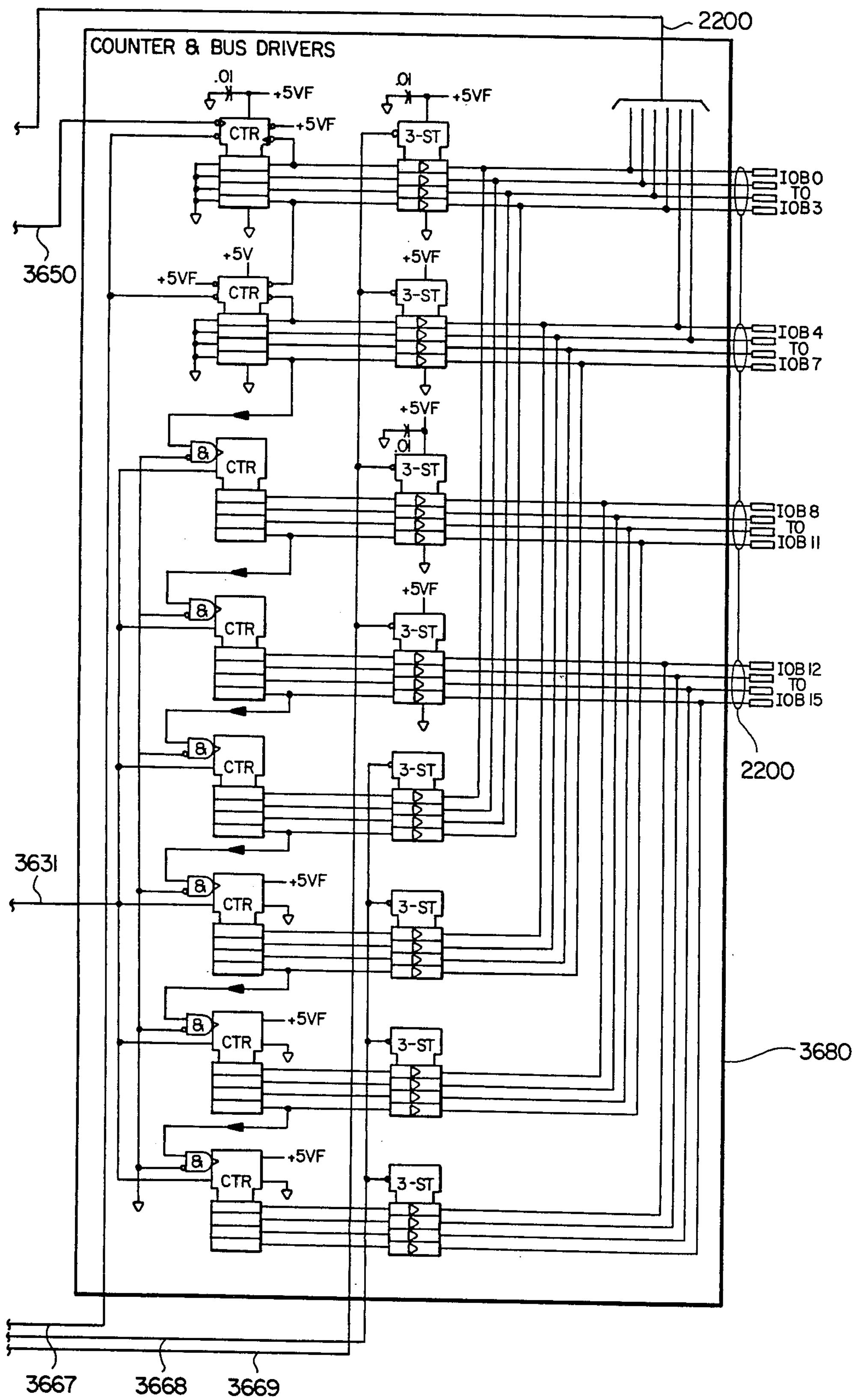
FIG_36C

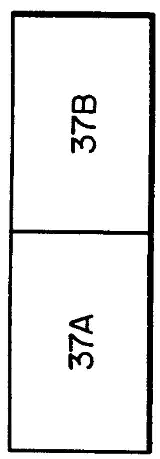
FIG_37

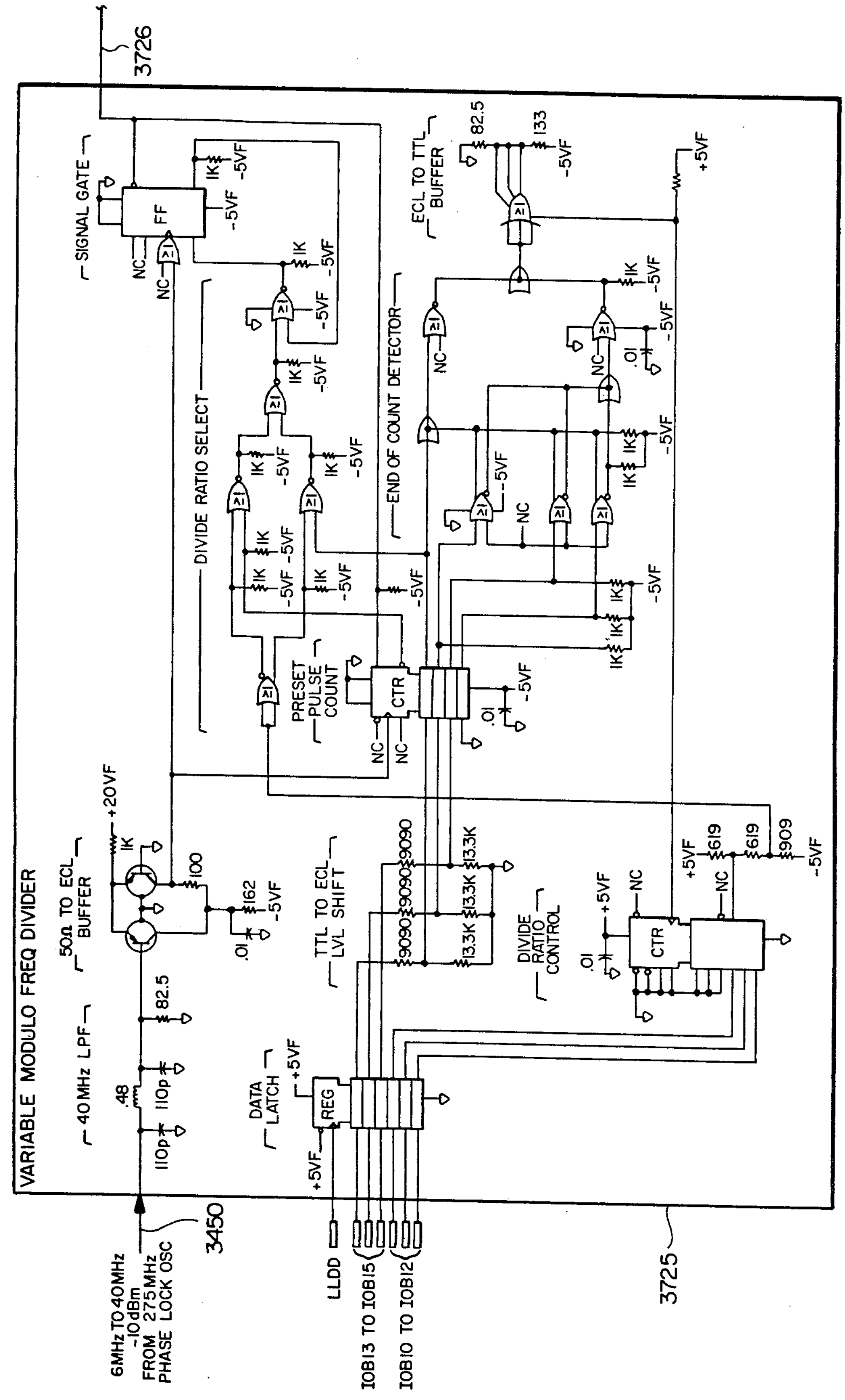
FIG_37A

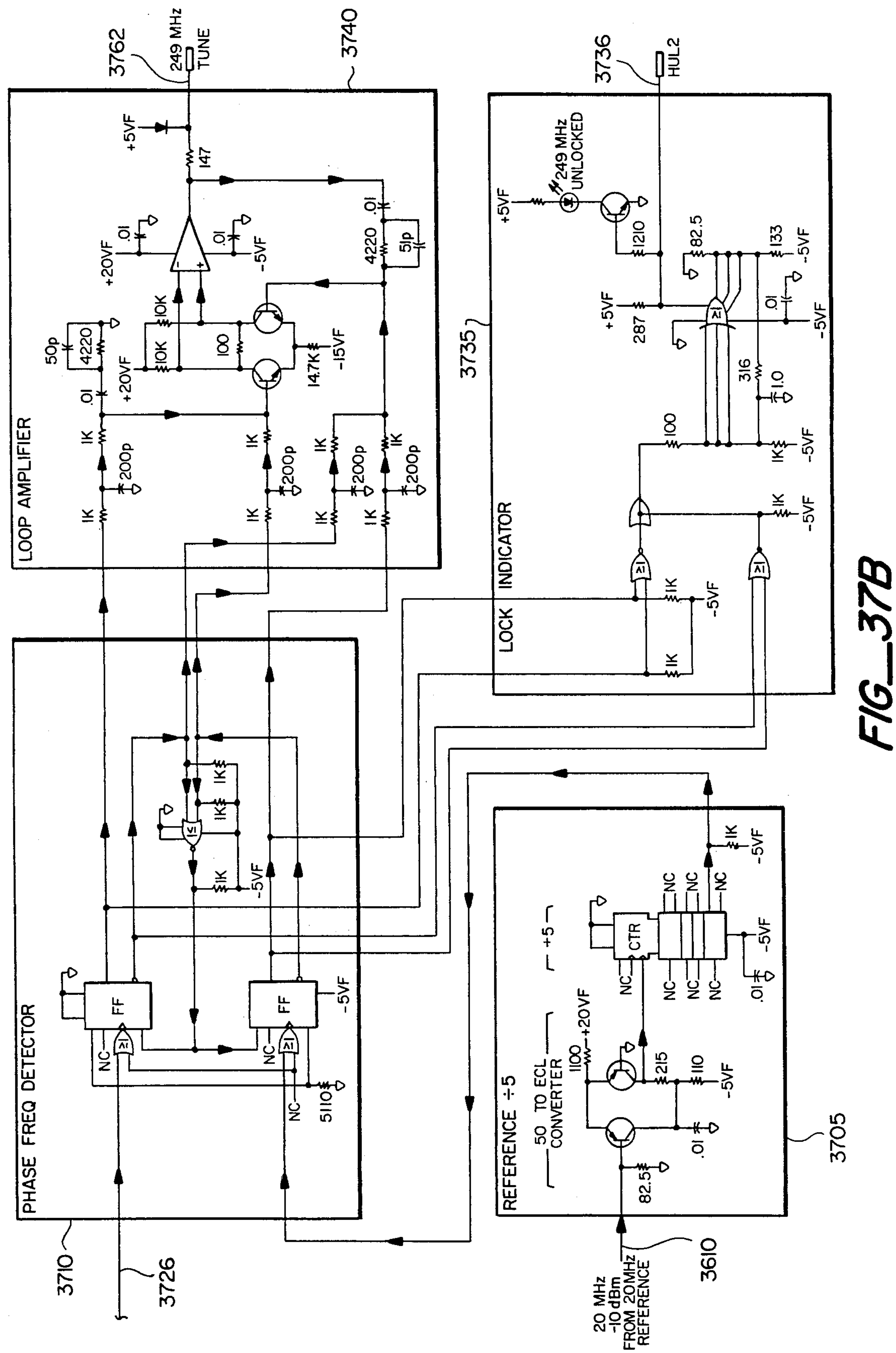
FIG_37B

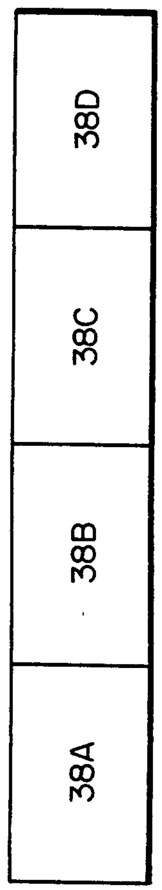
FIG_38

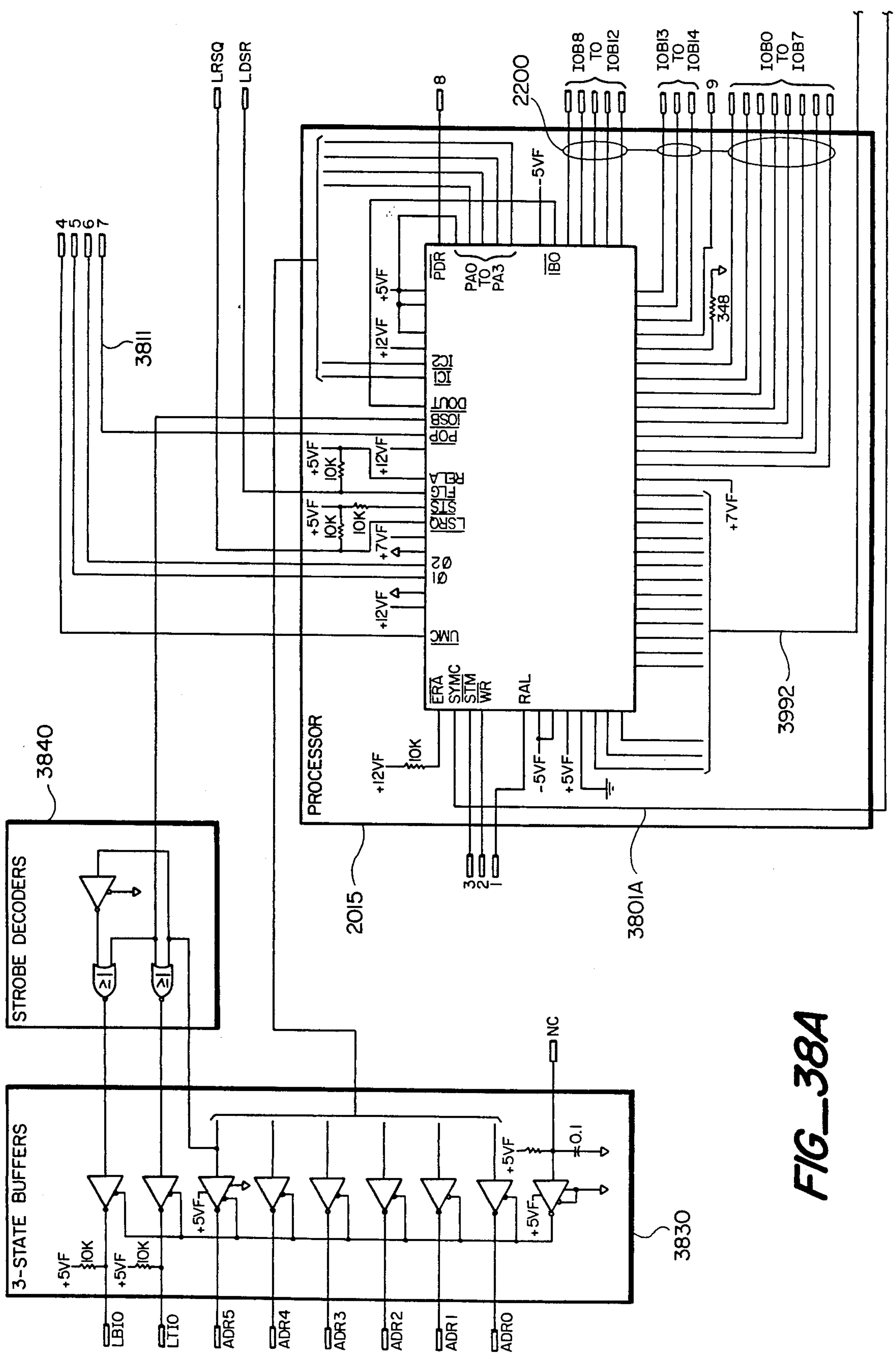
FIG_38A

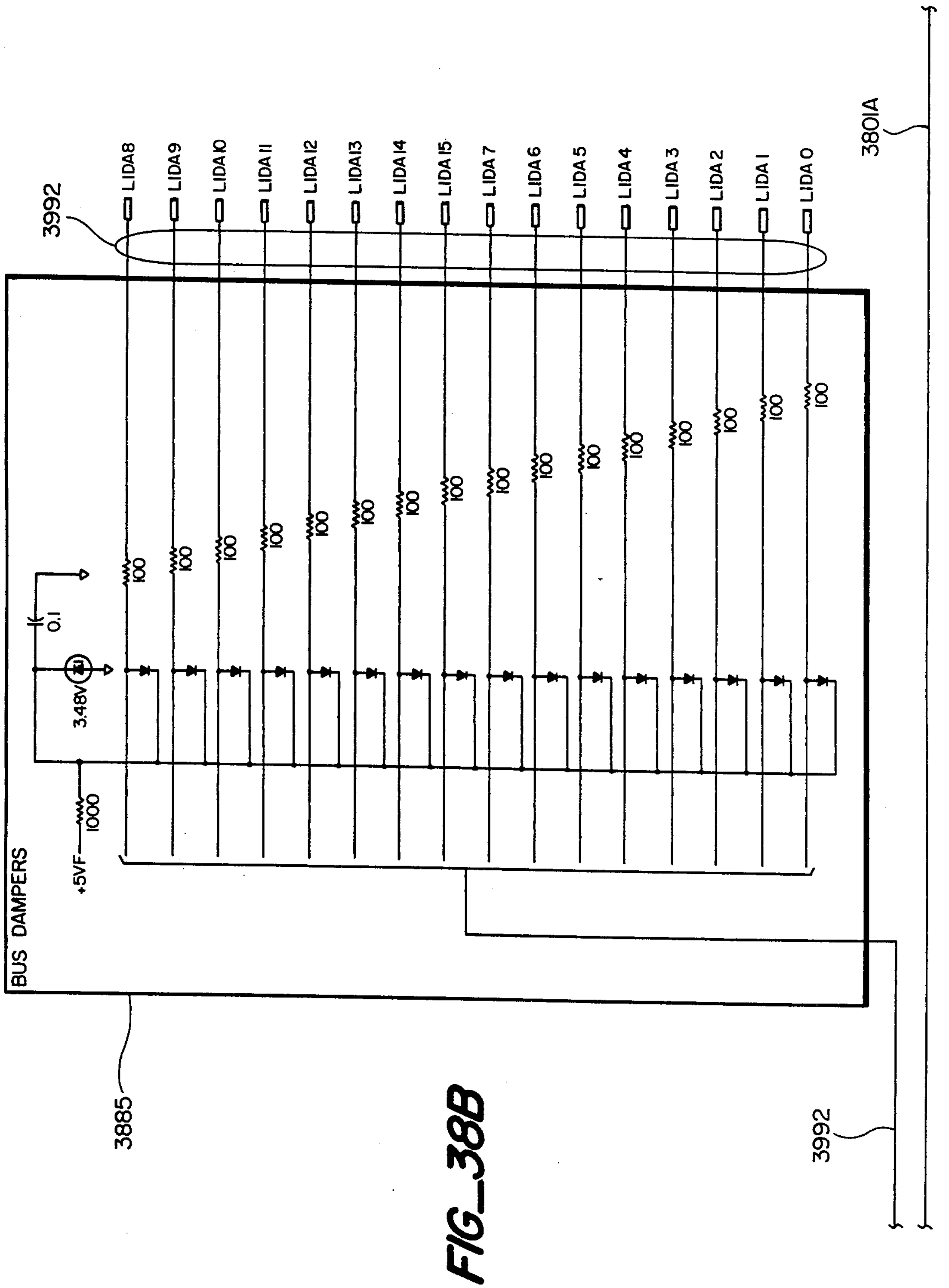
FIG_38B

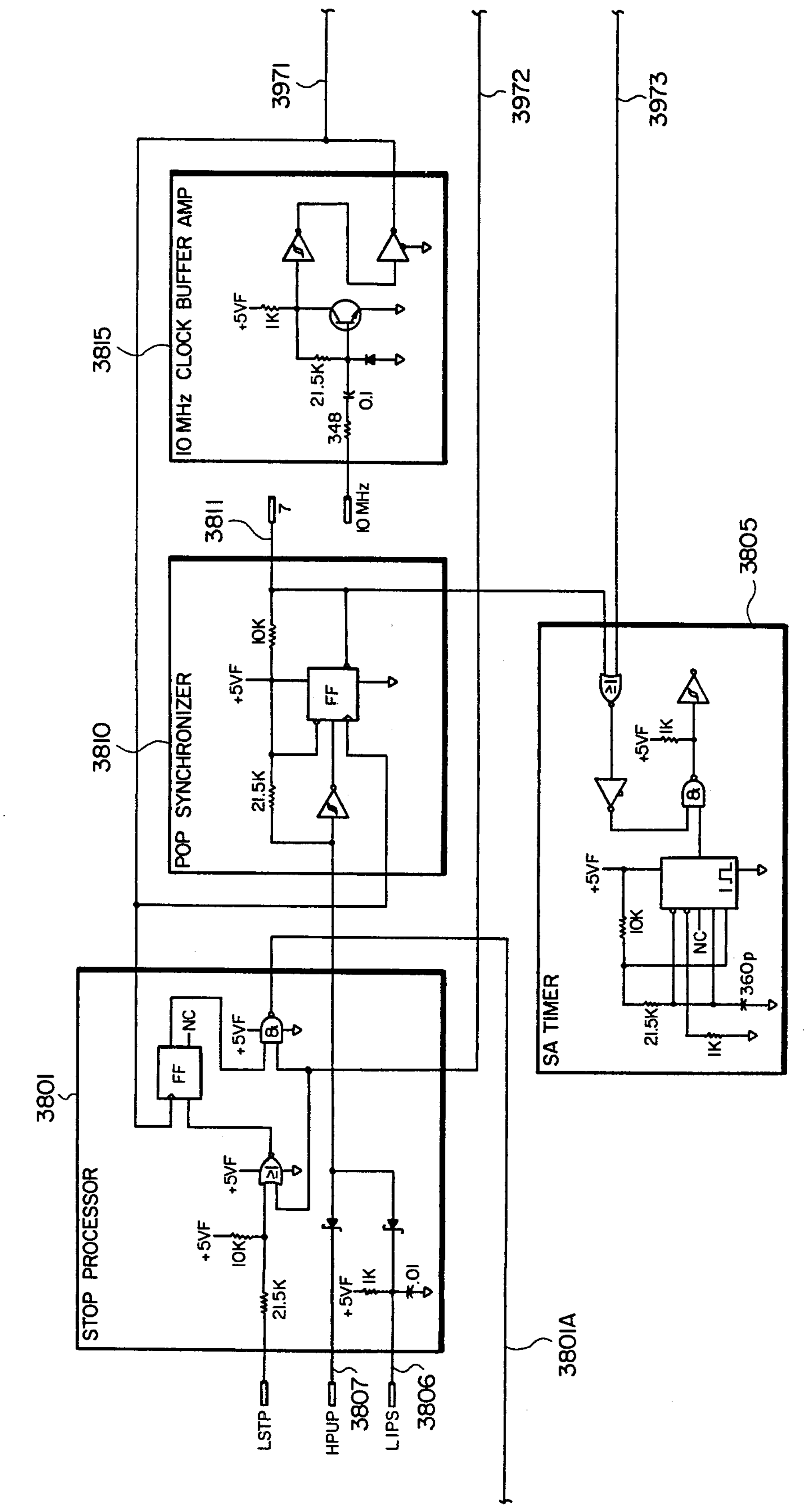
FIG_38C

FIG_38D
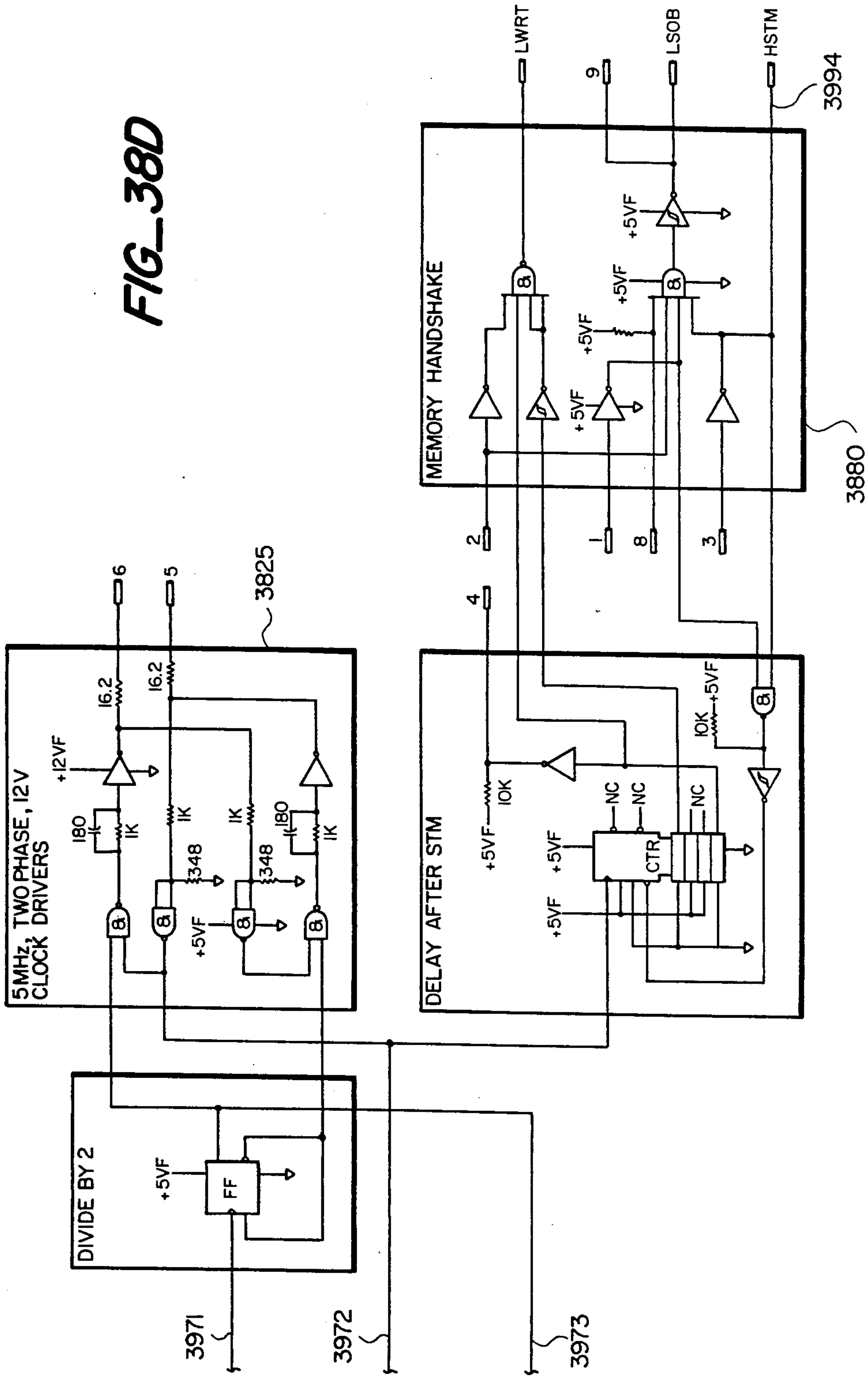

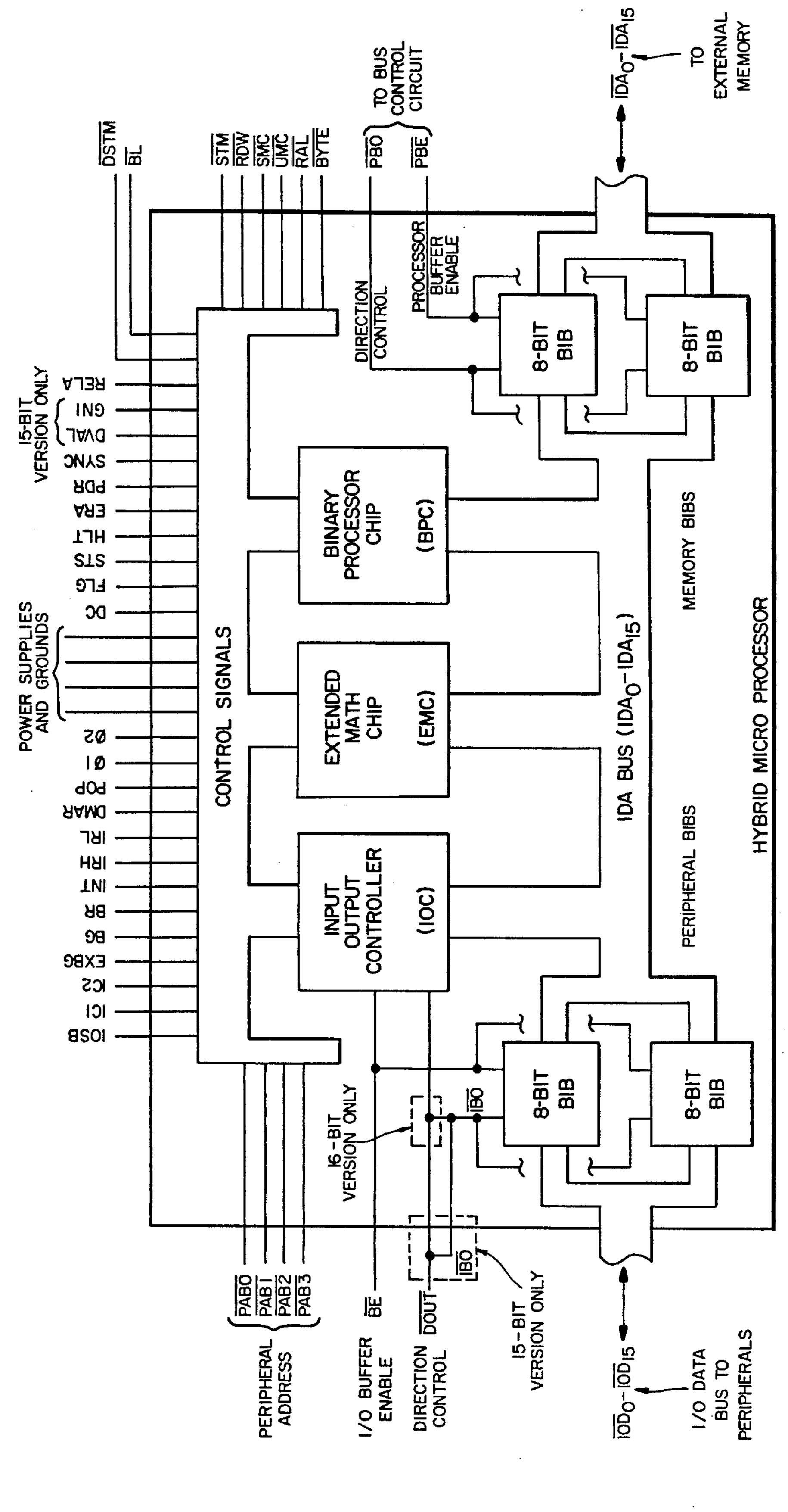
FIG_39

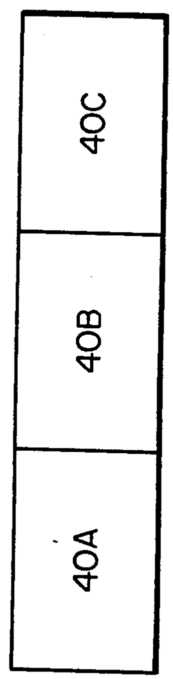
FIG_40

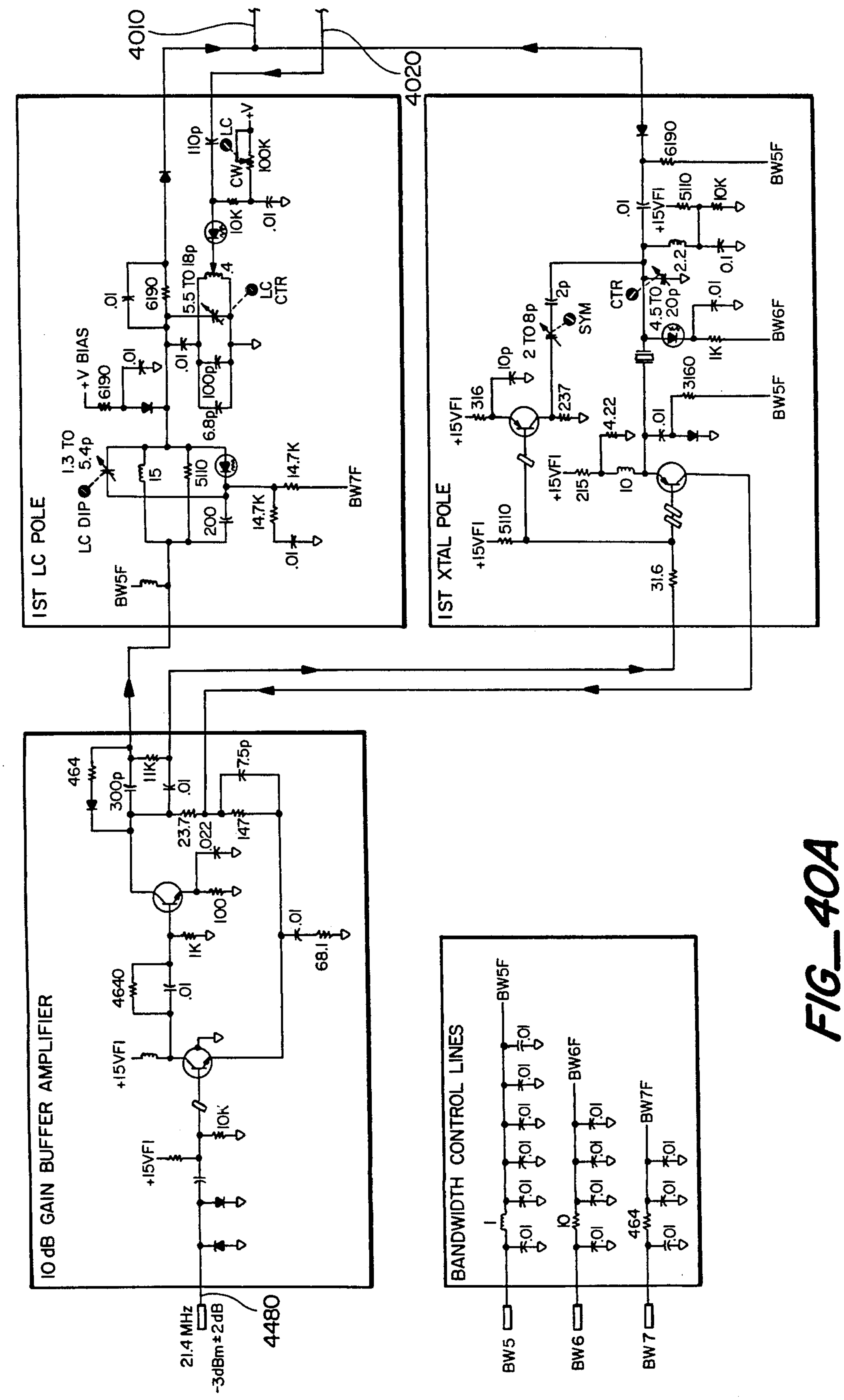
FIG_40A

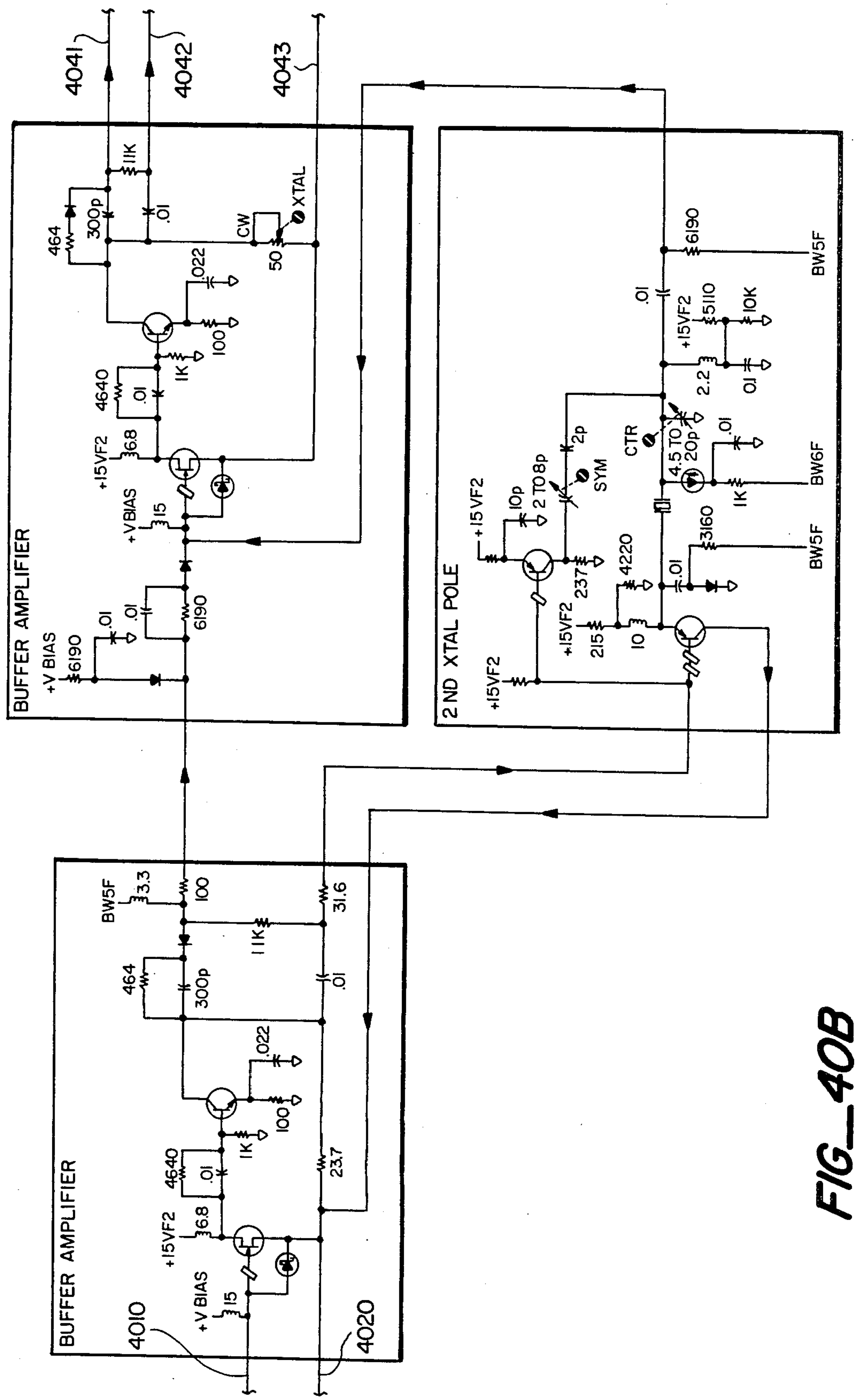
FIG_40B

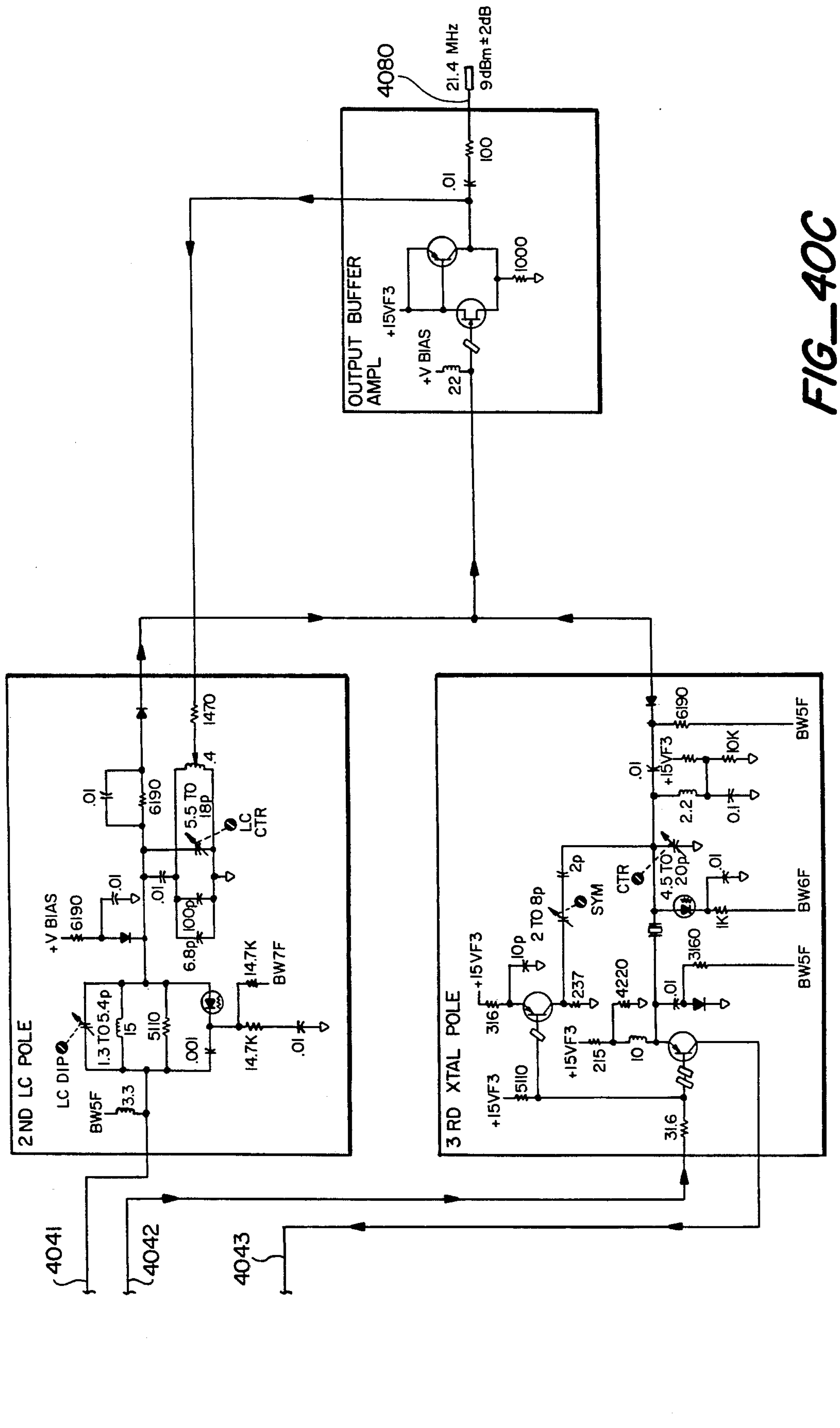
FIG_40C

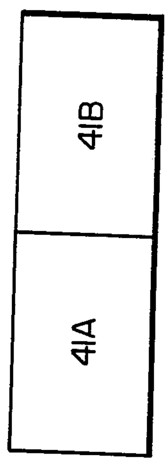
FIG_41

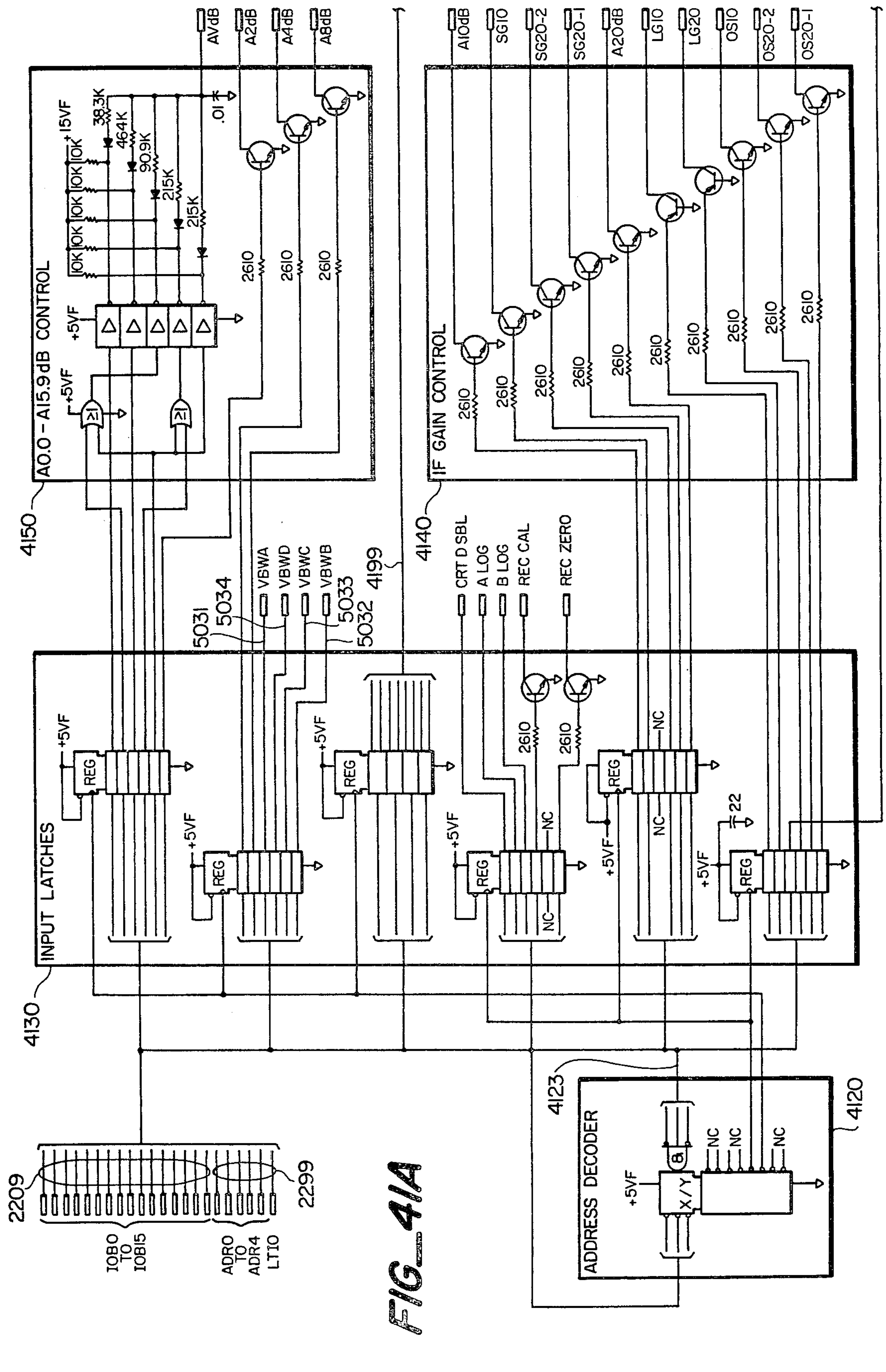
FIG_41A

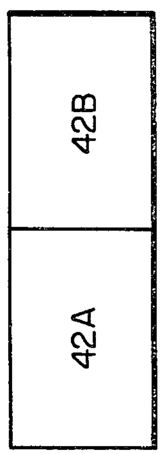
FIG_42

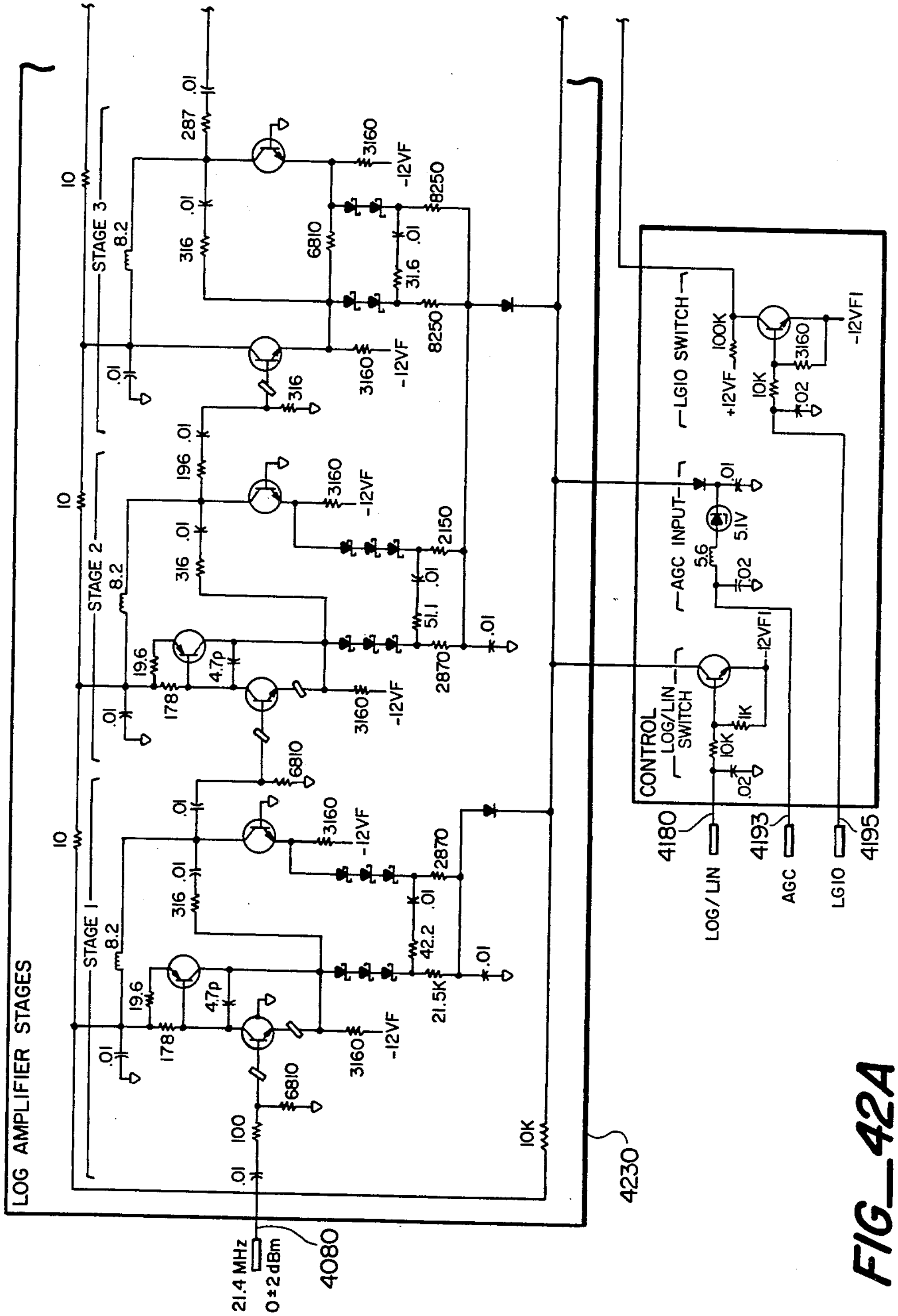
FIG_42A

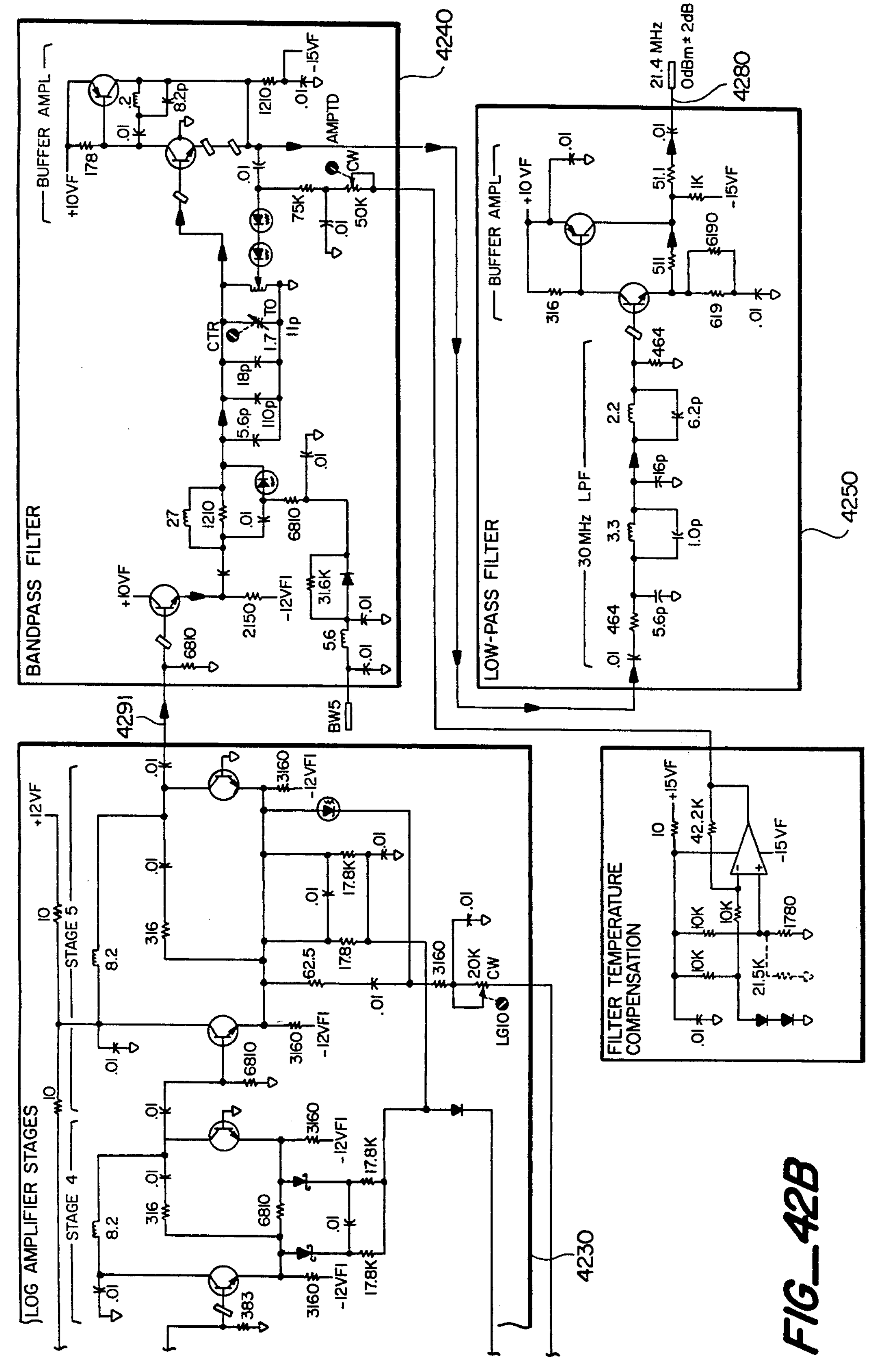
FIG_42B

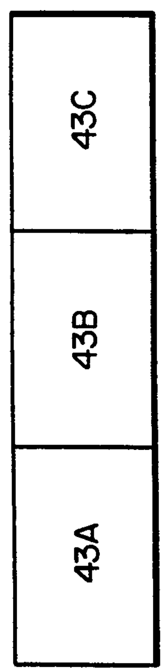
FIG_43

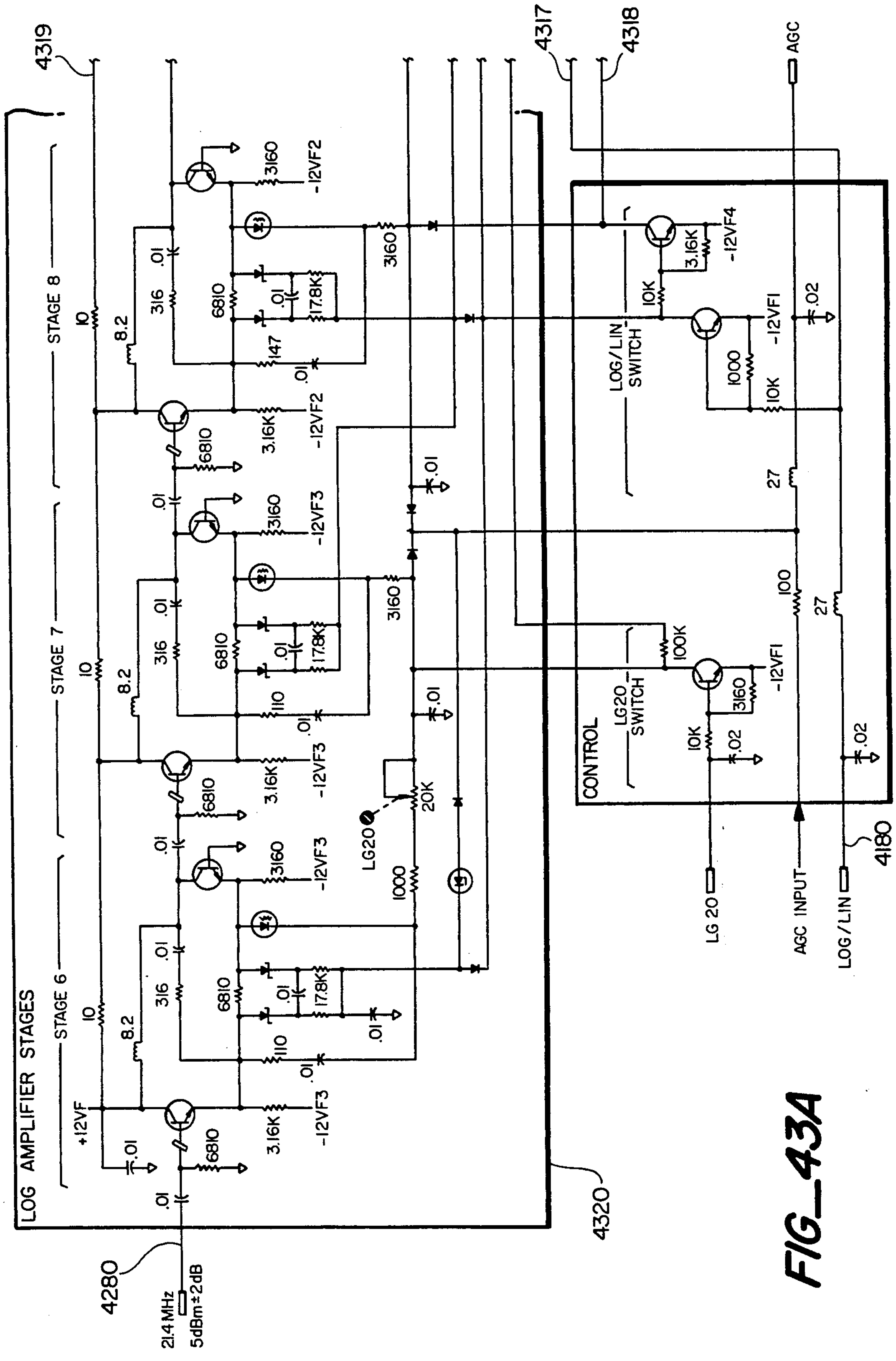
FIG_43A

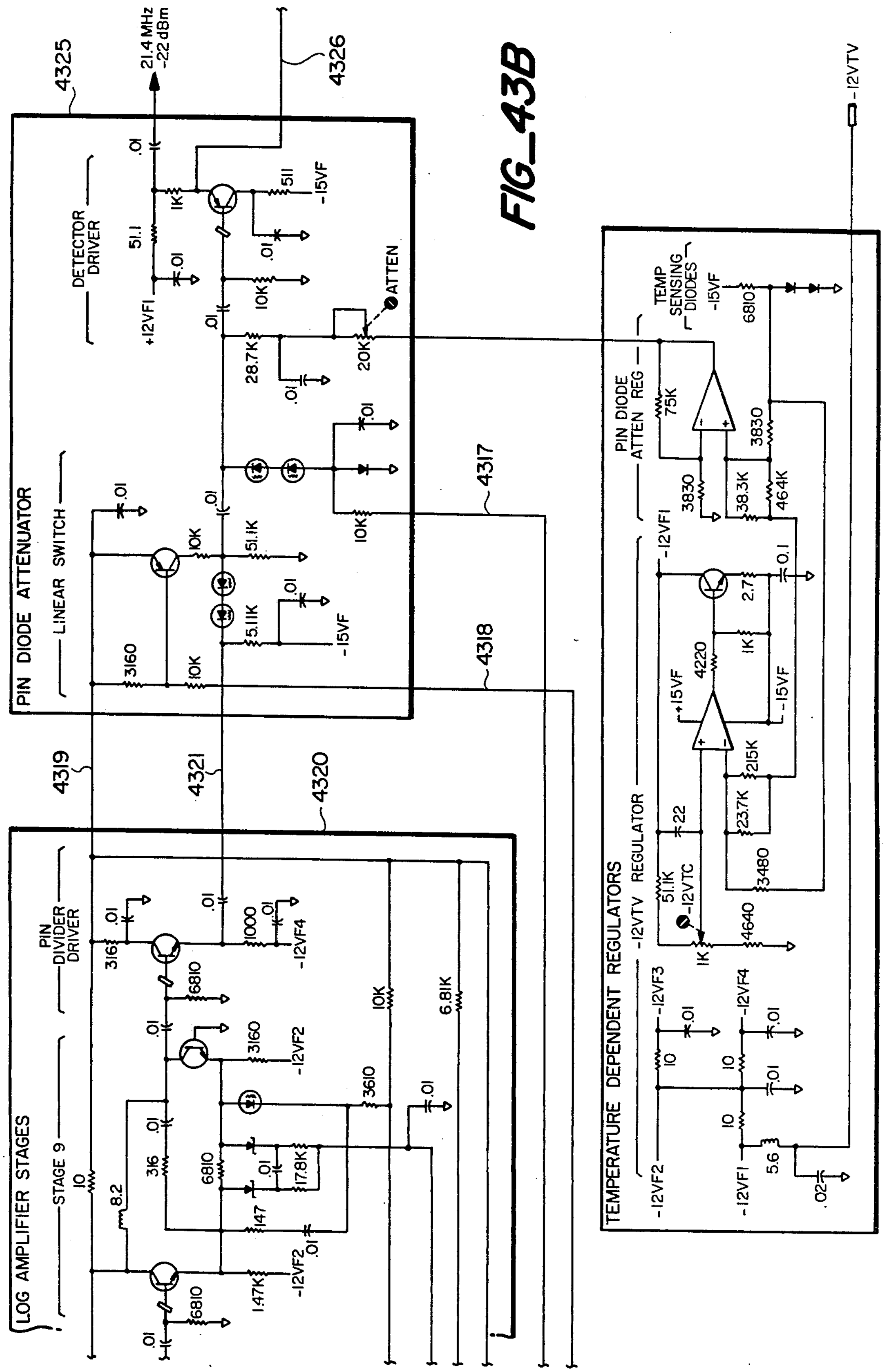
FIG_43B

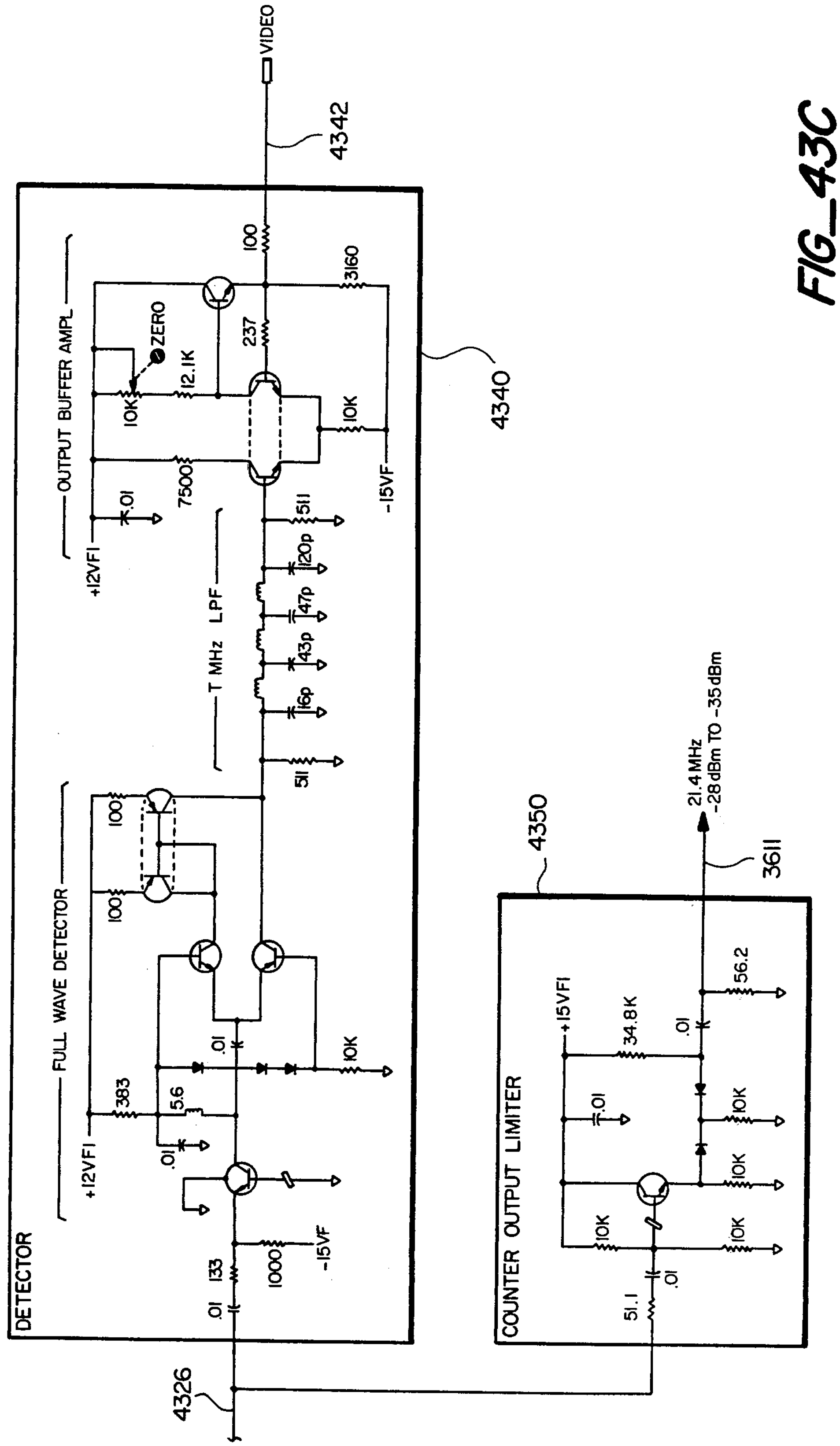
FIG_43C

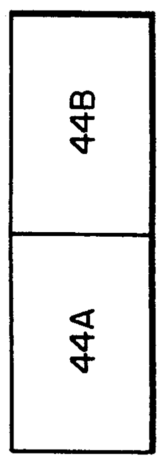
FIG_44

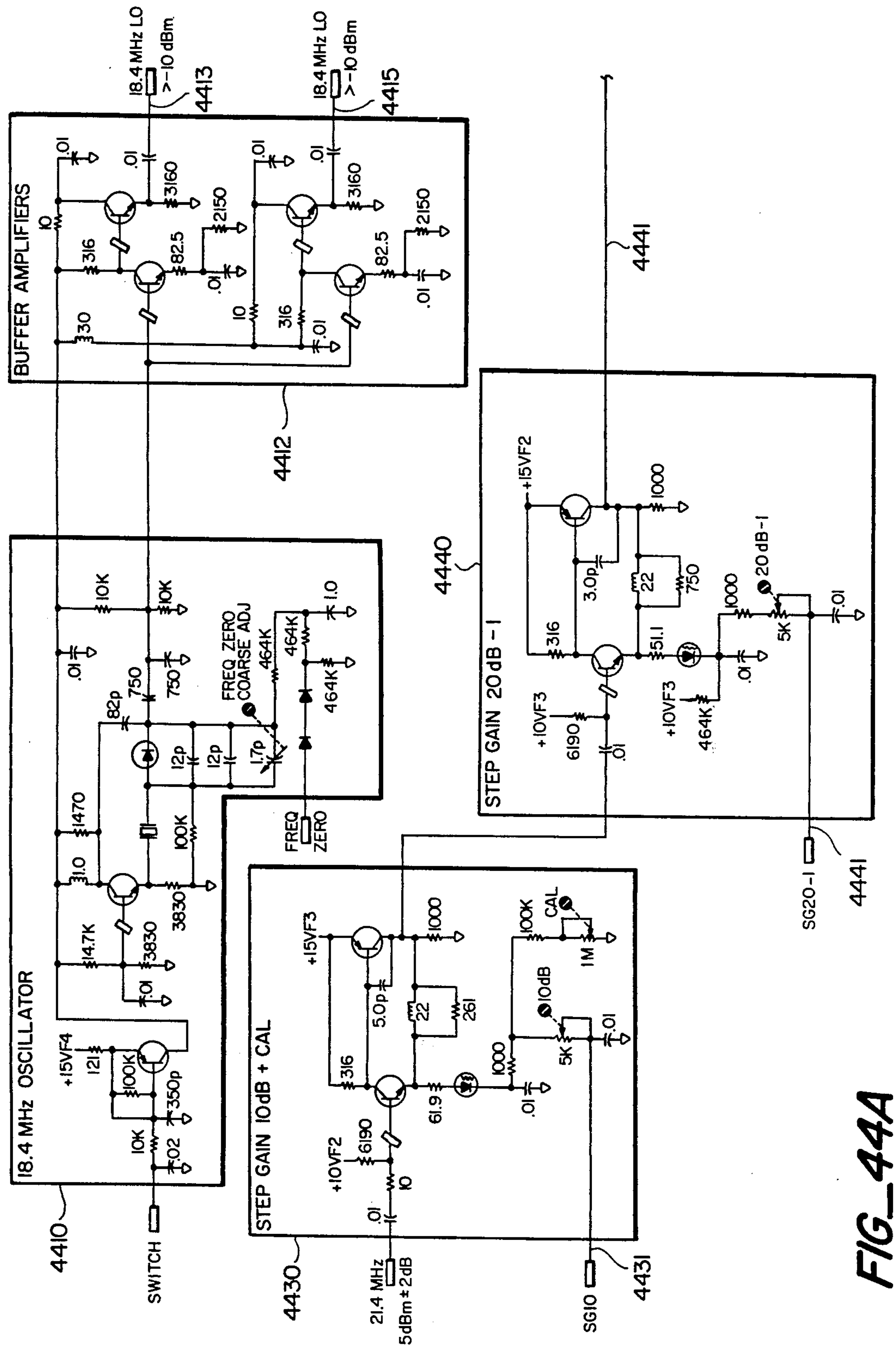
FIG_44A

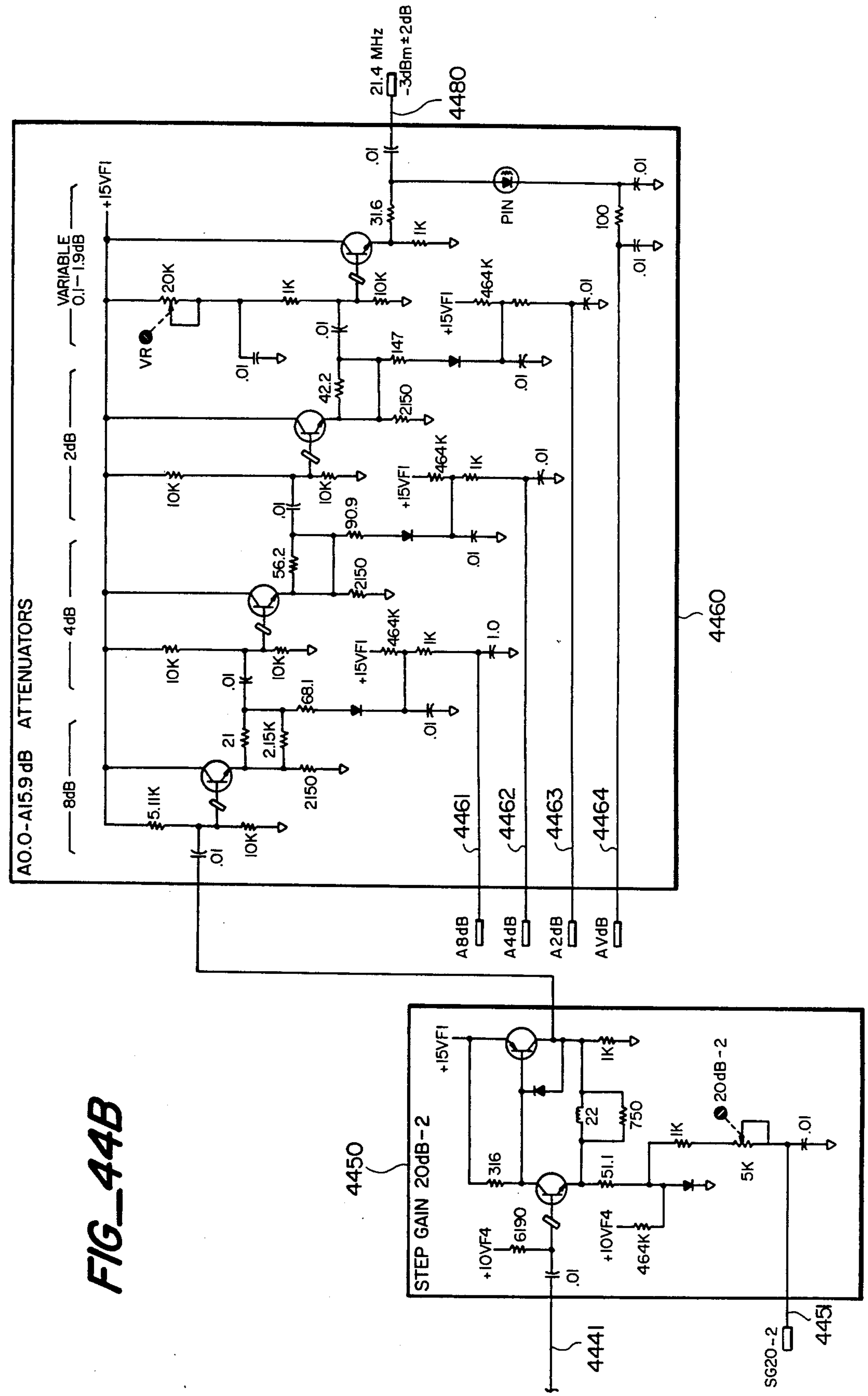
FIG_44B

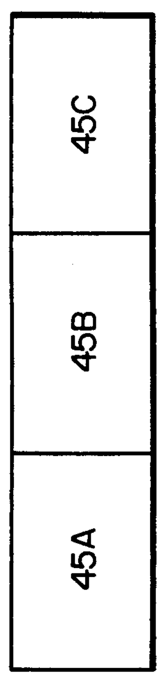
FIG_45

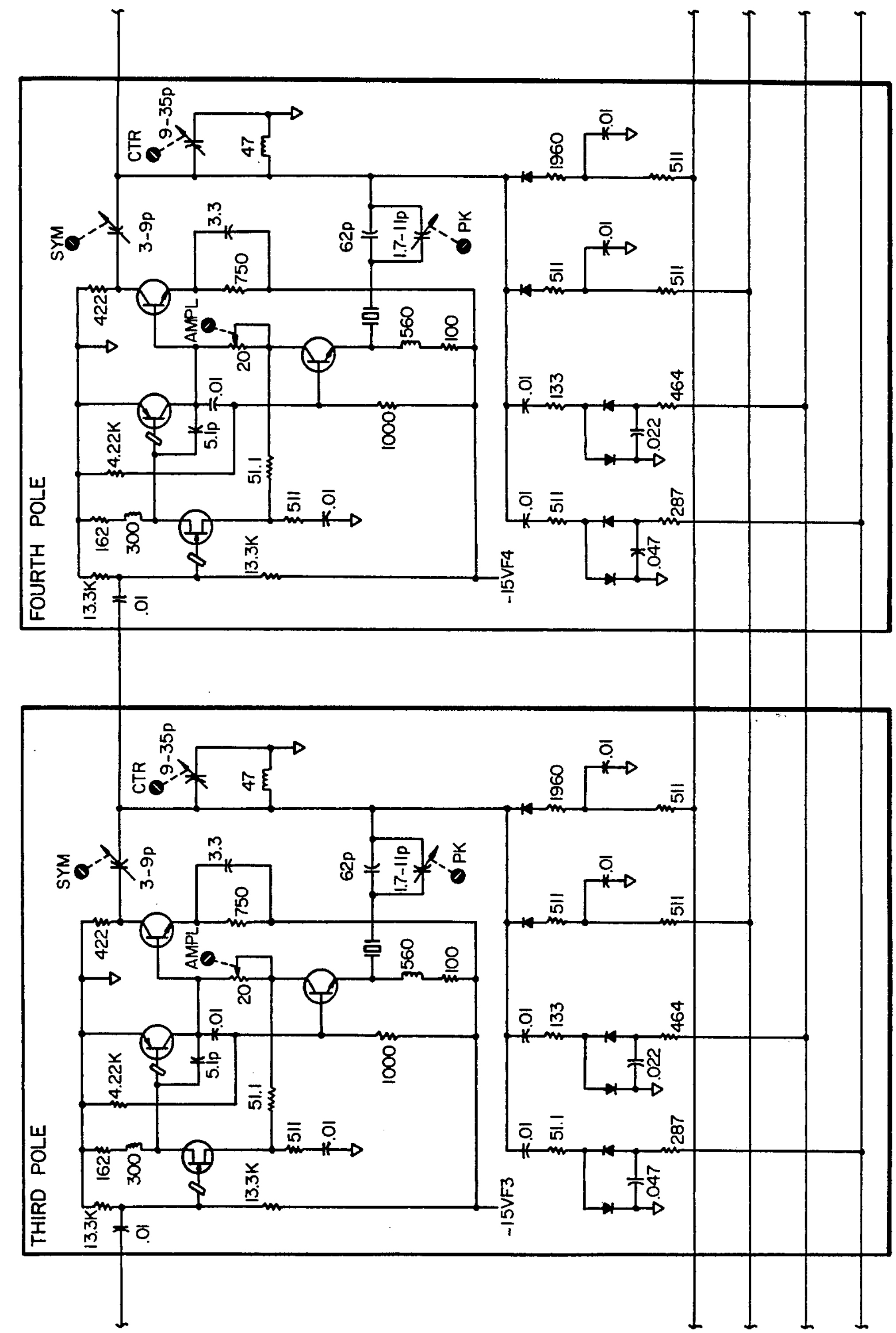
FIG_45B

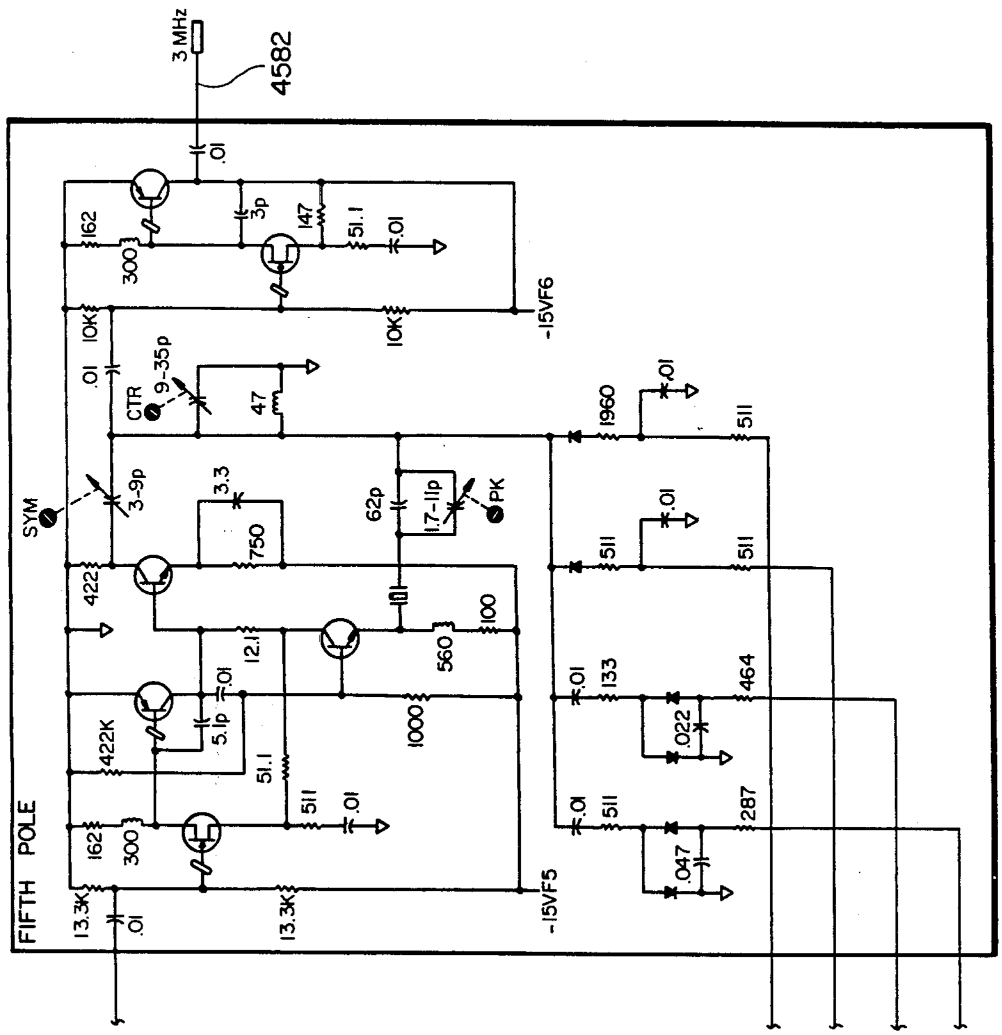
FIG._45C

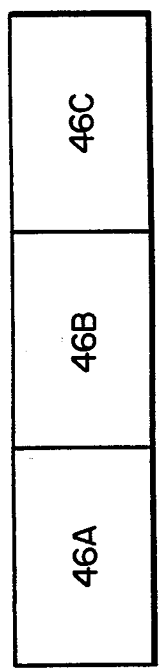
FIG_46

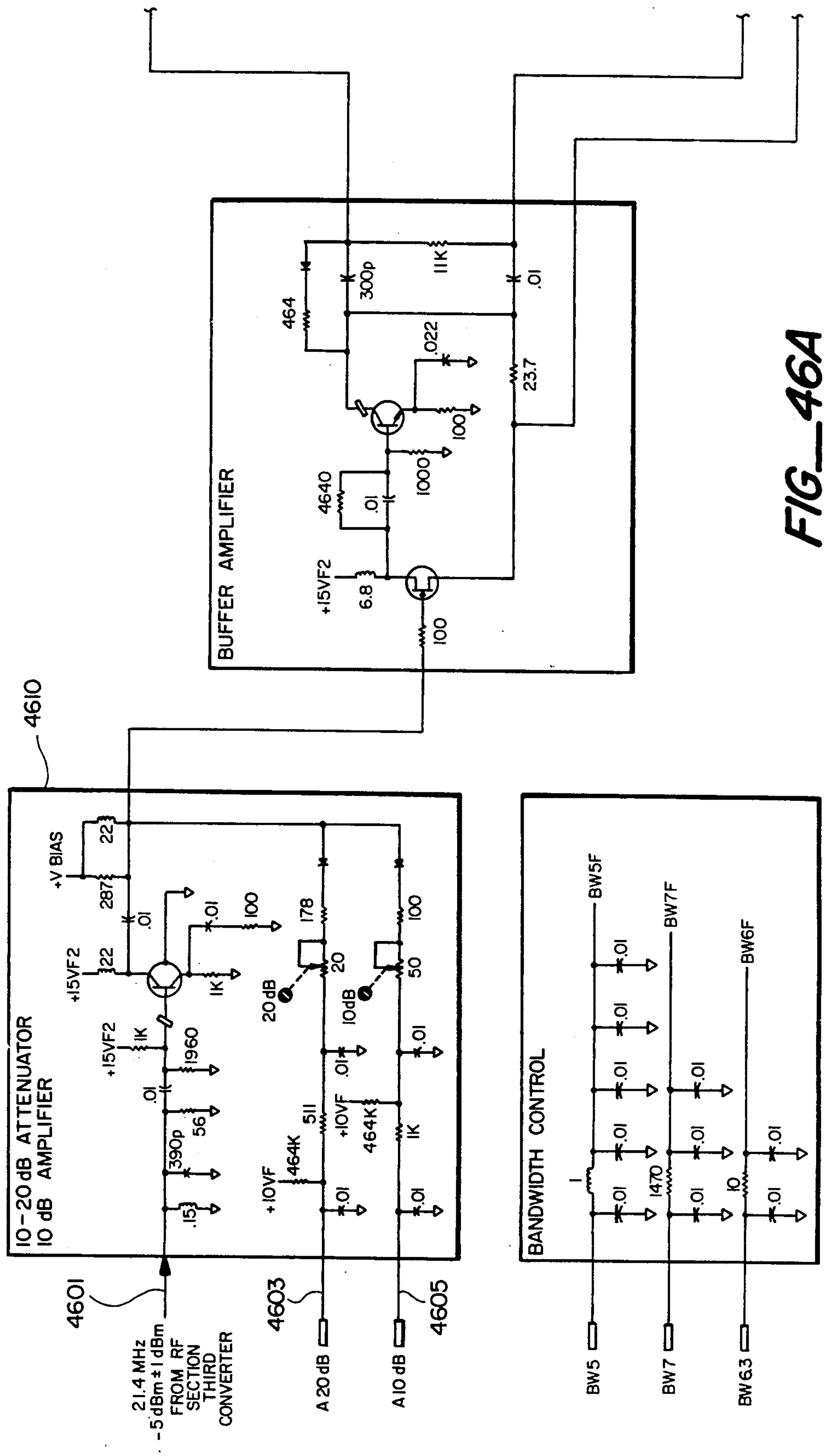
FIG_46A

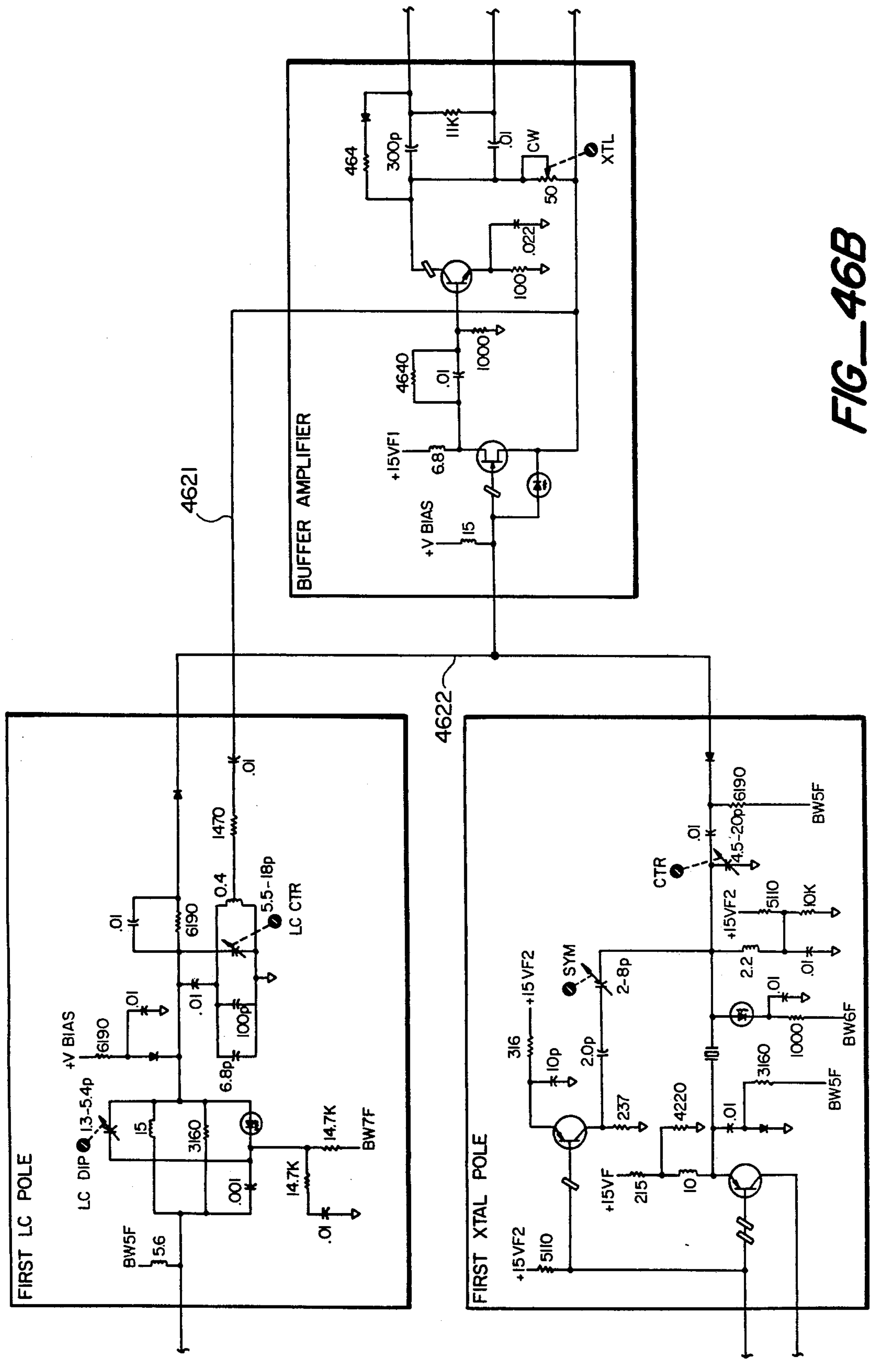
FIG_46B

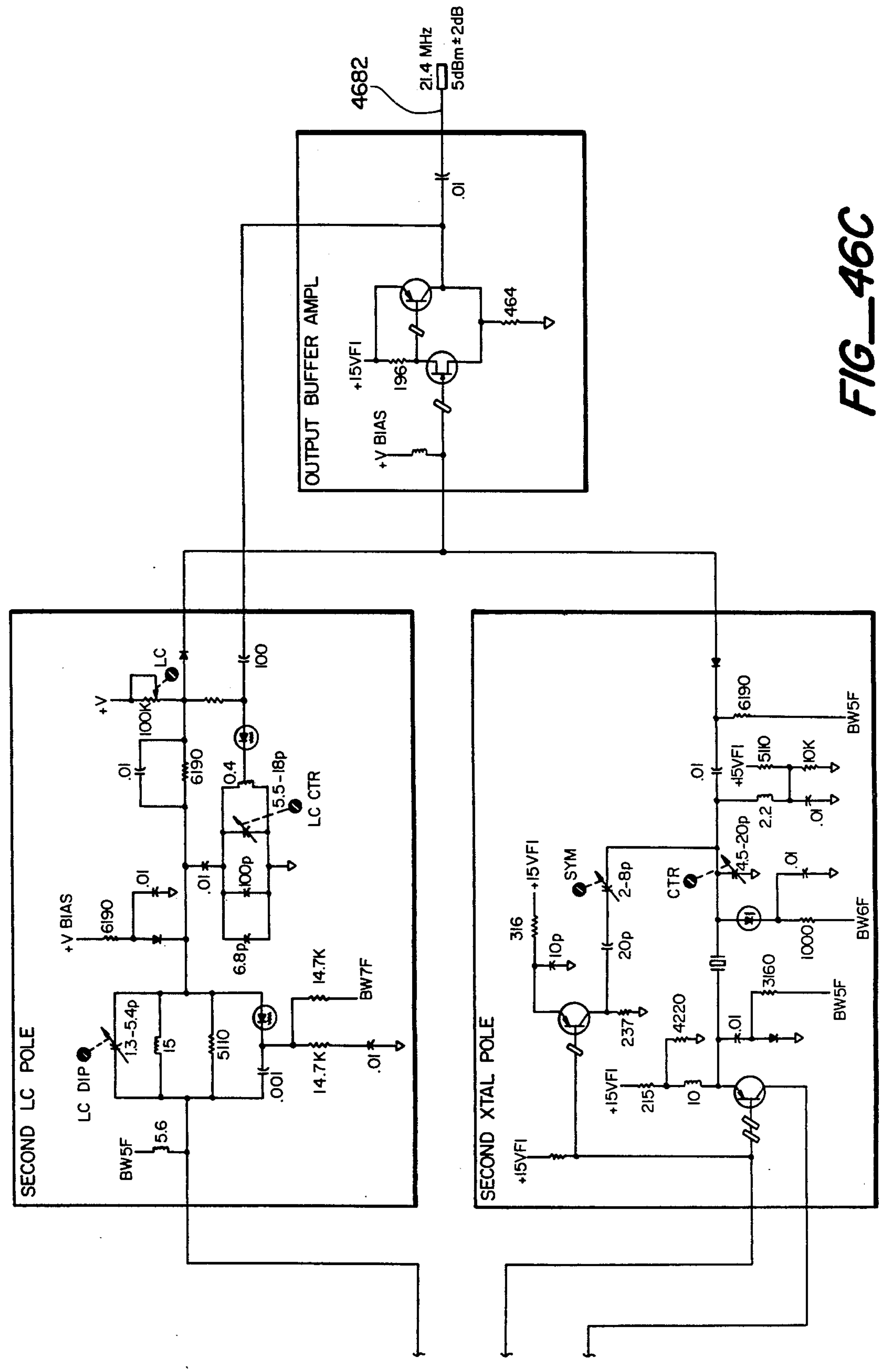
FIG_46C

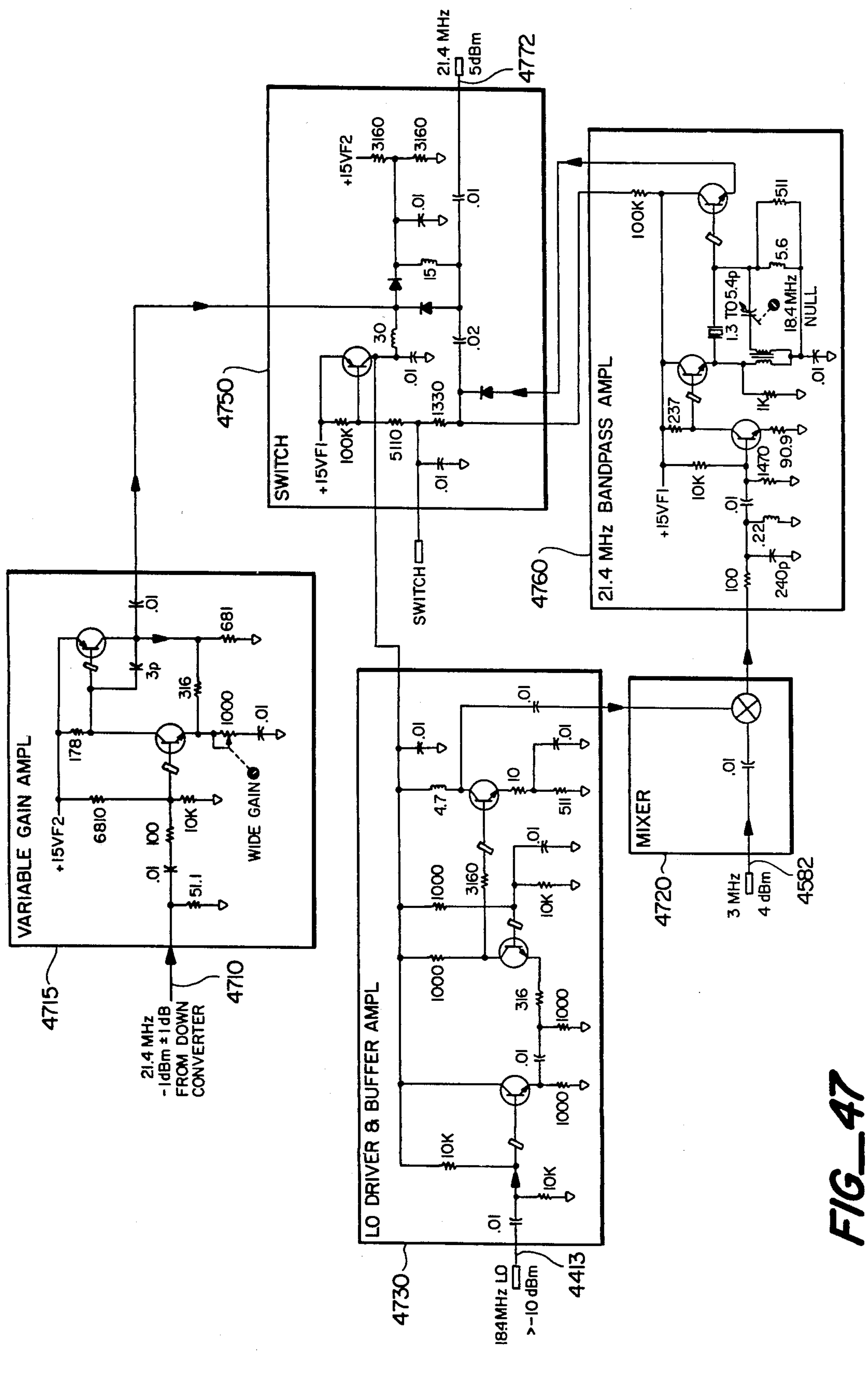
FIG_47

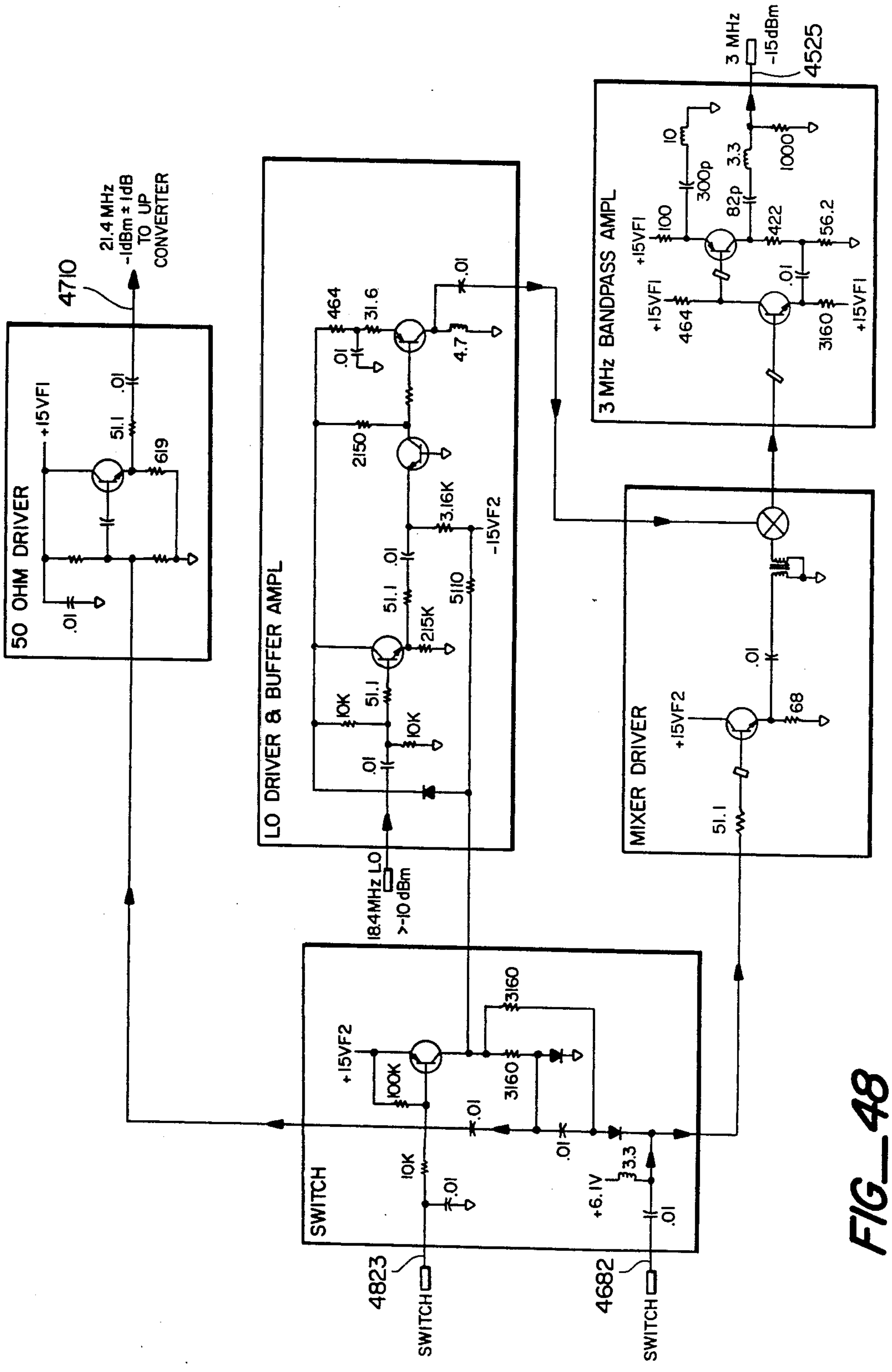
FIG_48

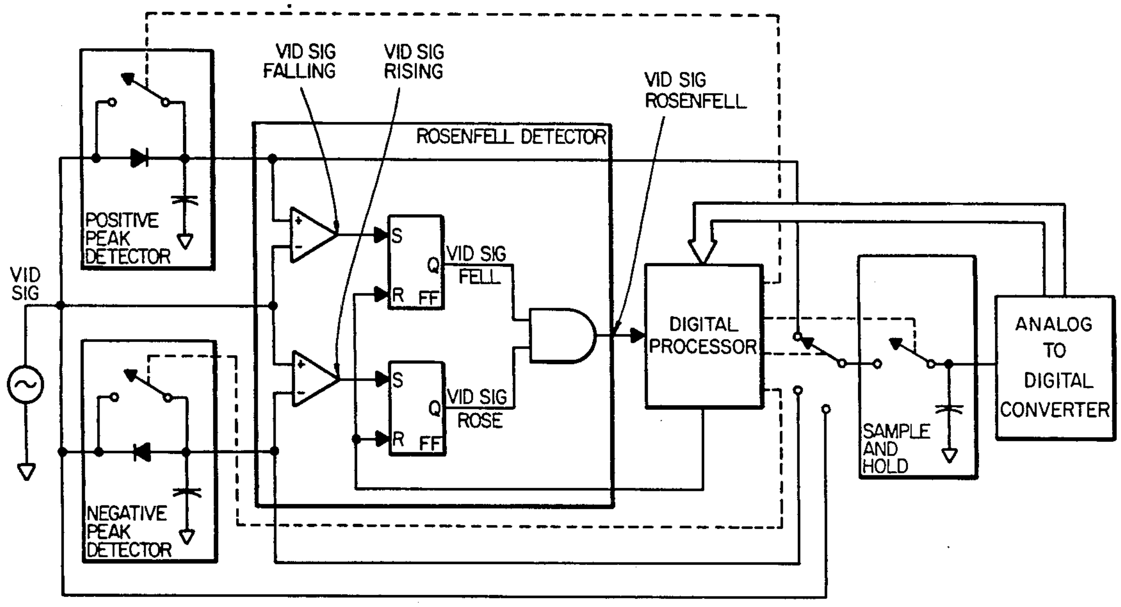
FIG_49A
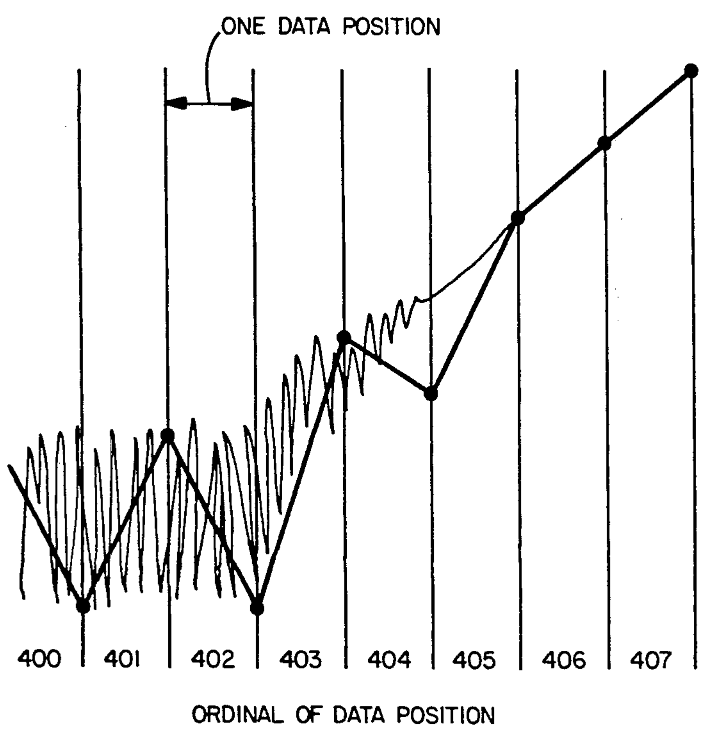
FIG_49B

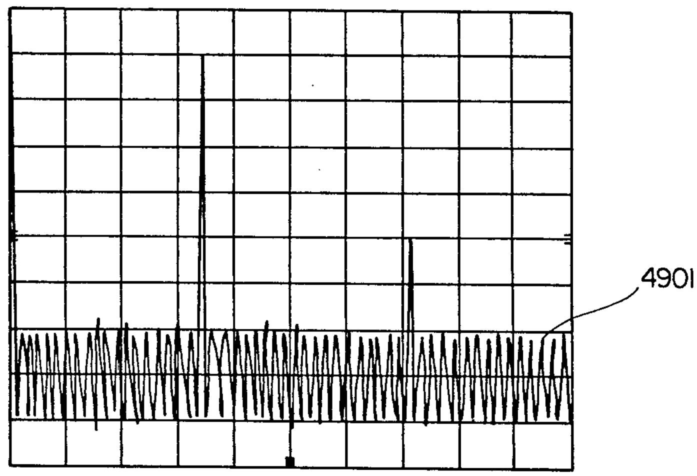
FIG_49C-1
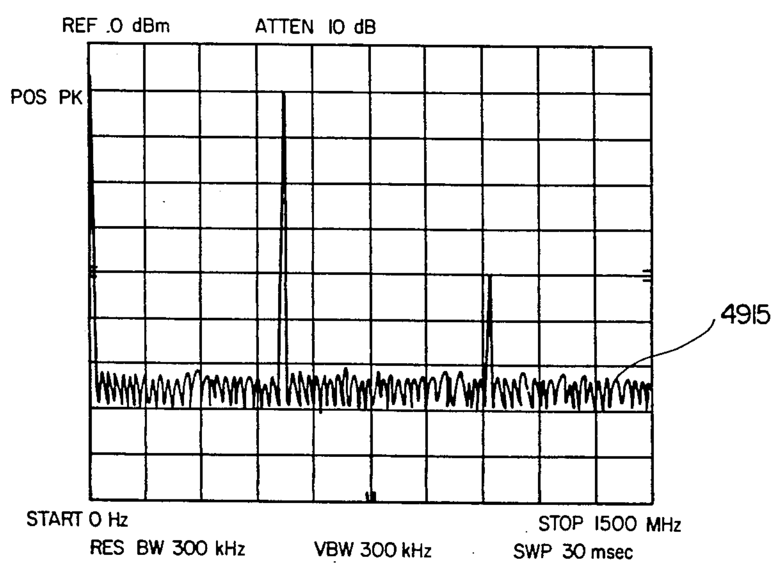
FIG_49C-2

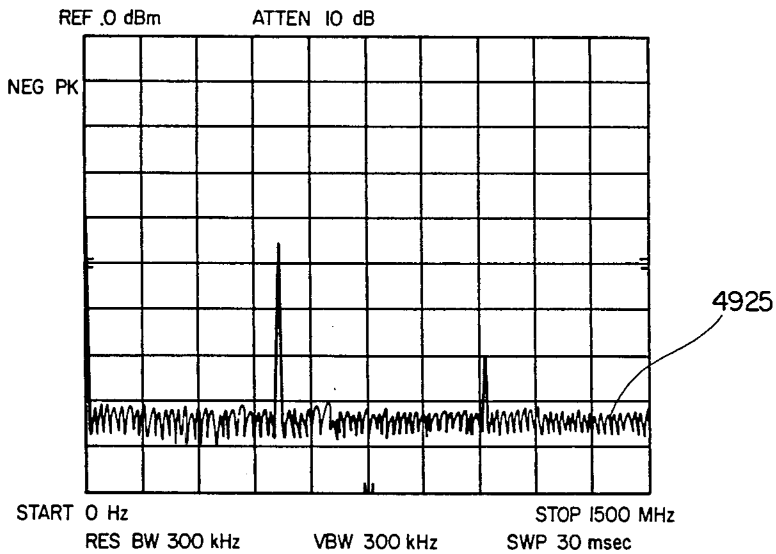
FIG_49C-3
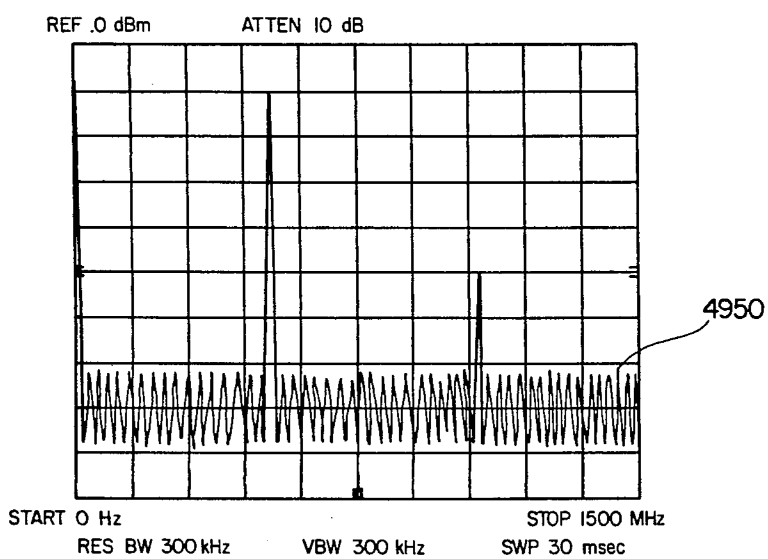
FIG_49C-4

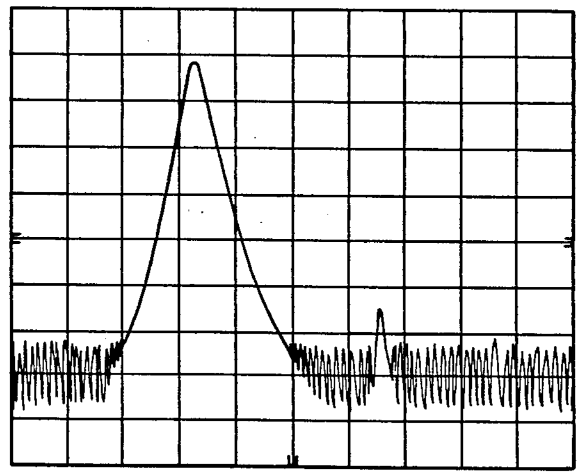
FIG_49D-1
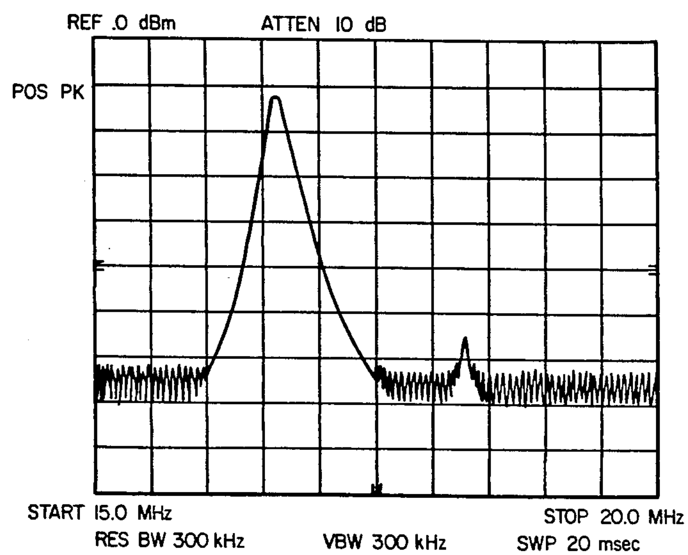
FIG_49D-2

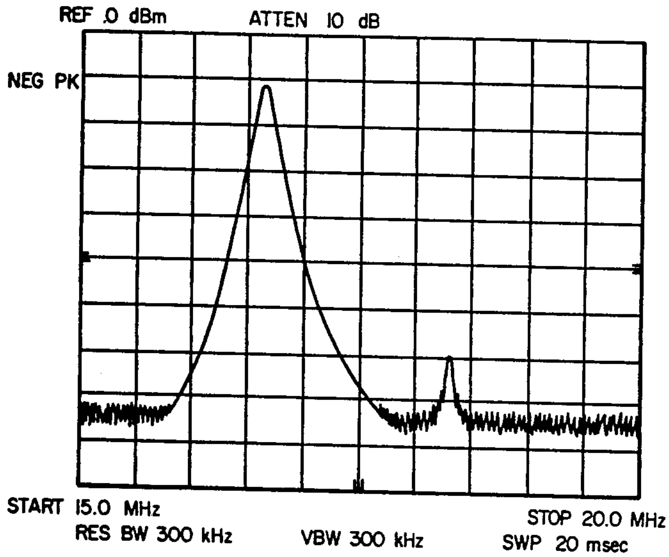
FIG_49D-3
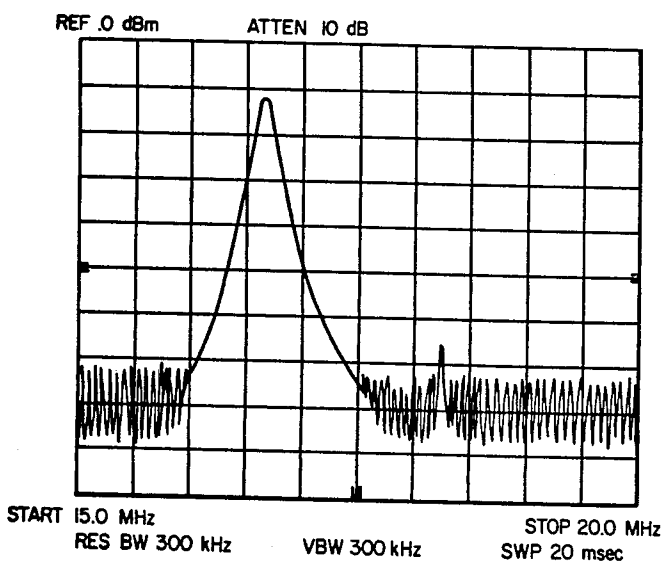
FIG_49D-4

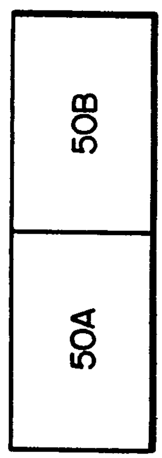
FIG_50

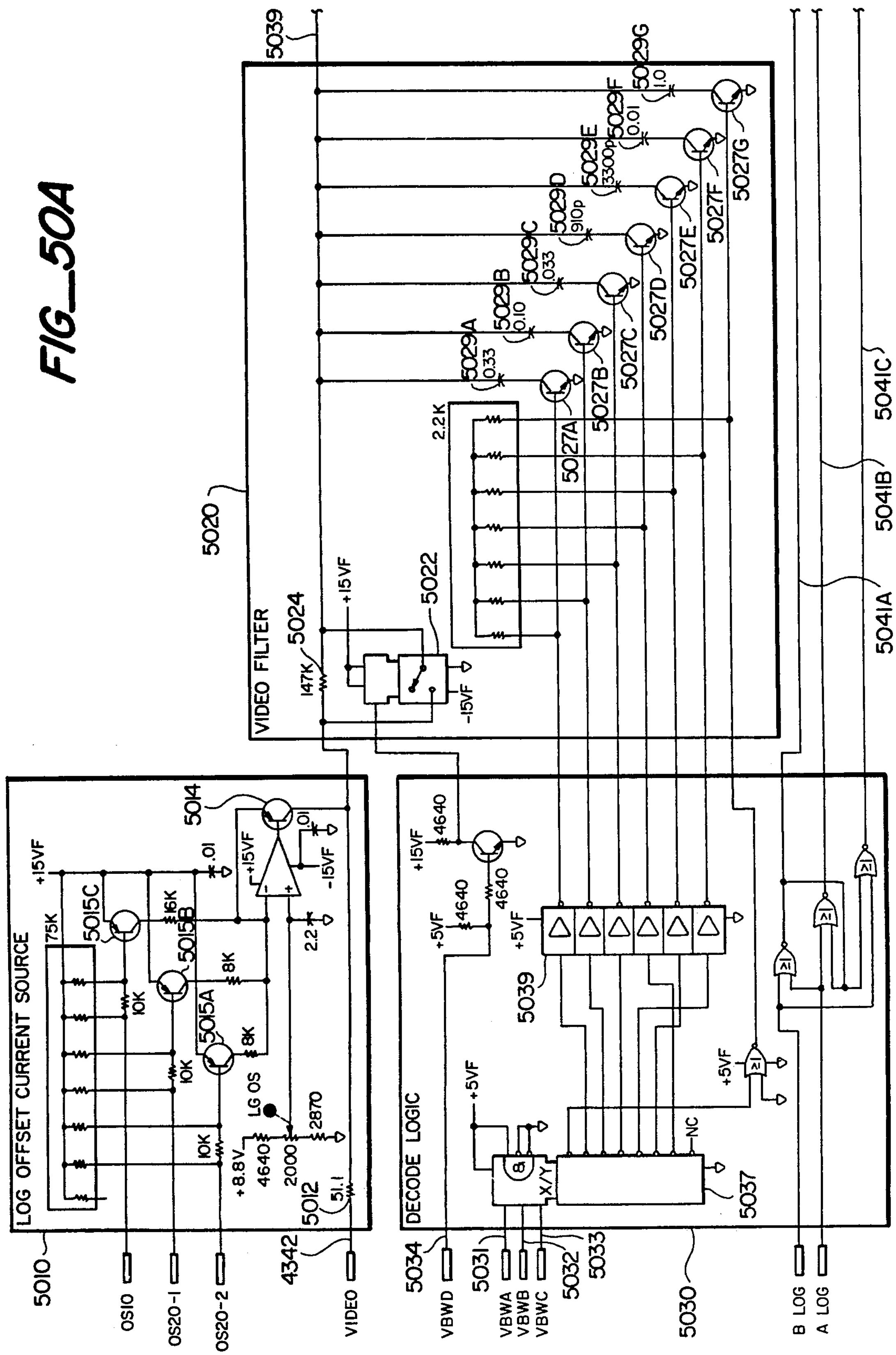
FIG_50A

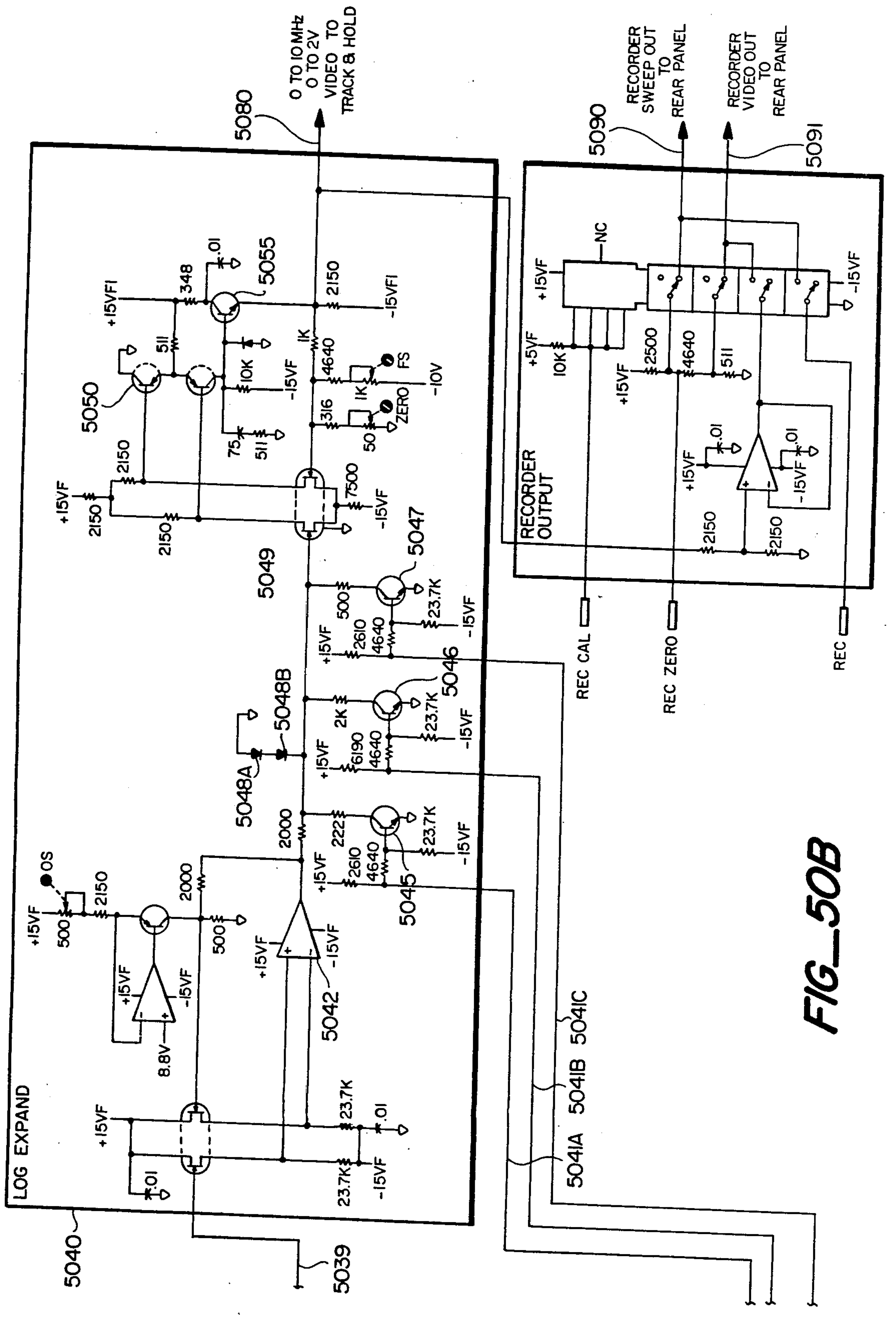
FIG_50B

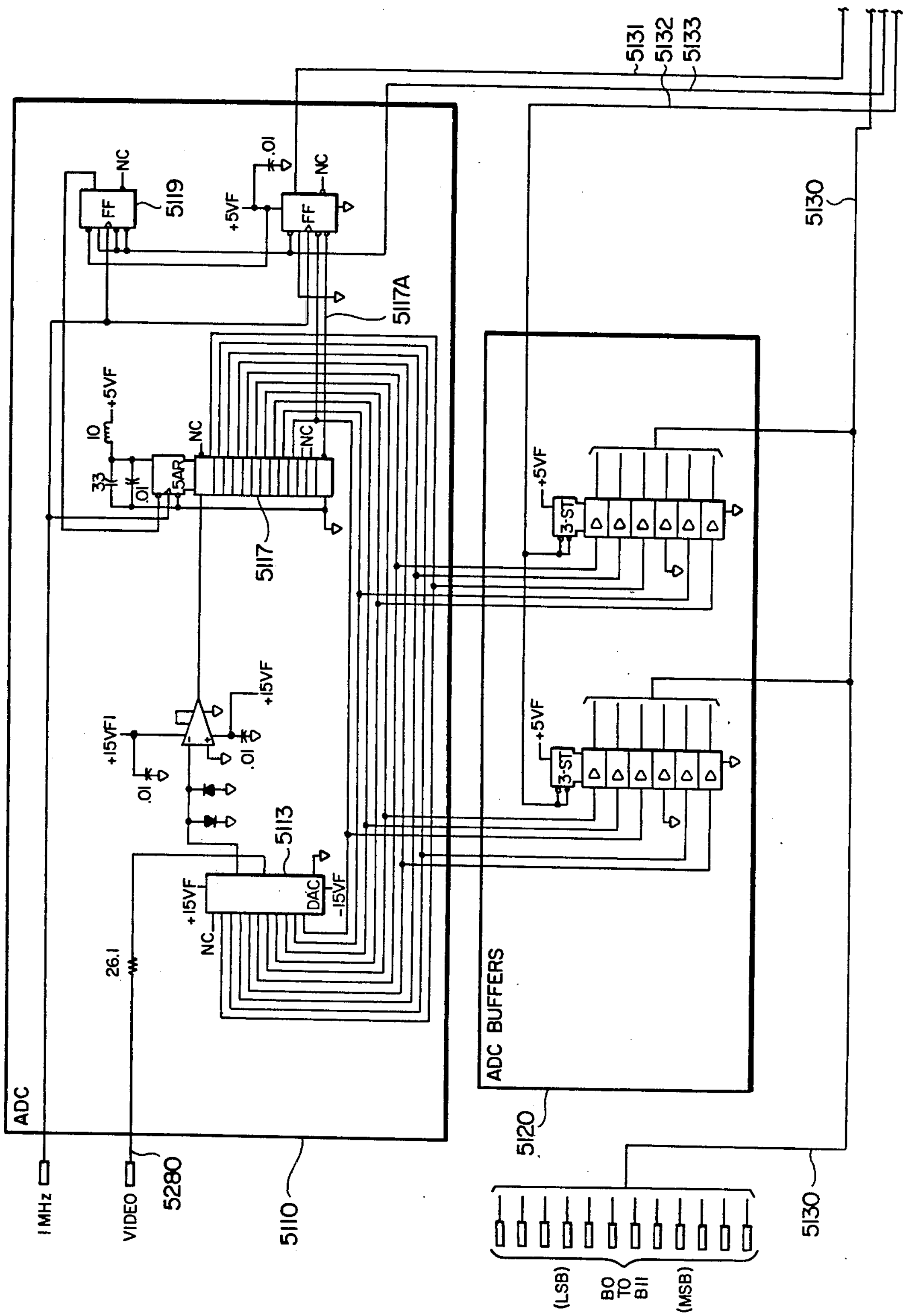
FIG_51A

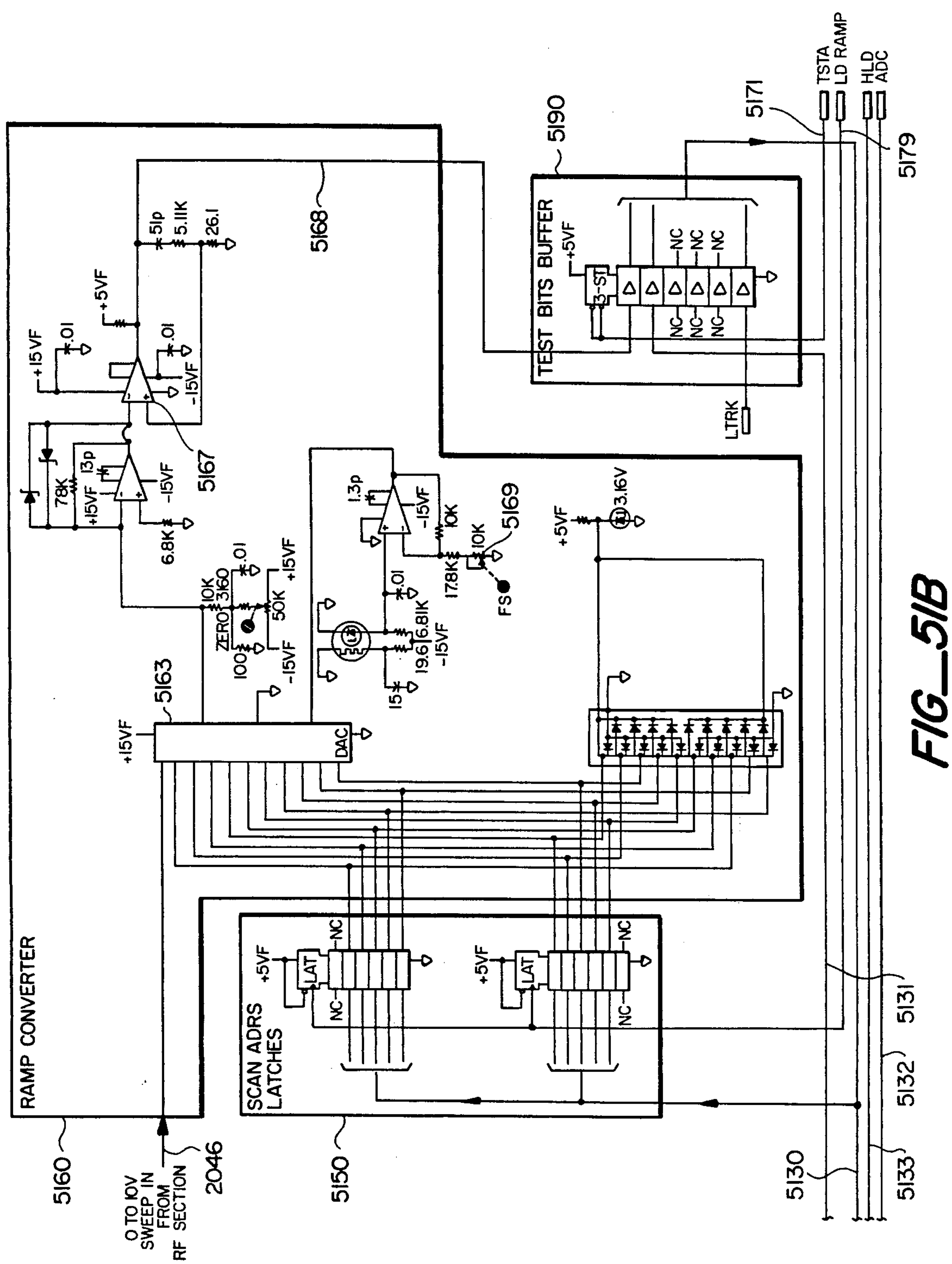
FIG._51B

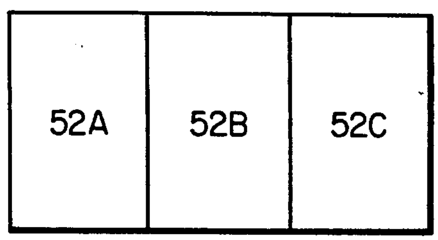
FIG_52

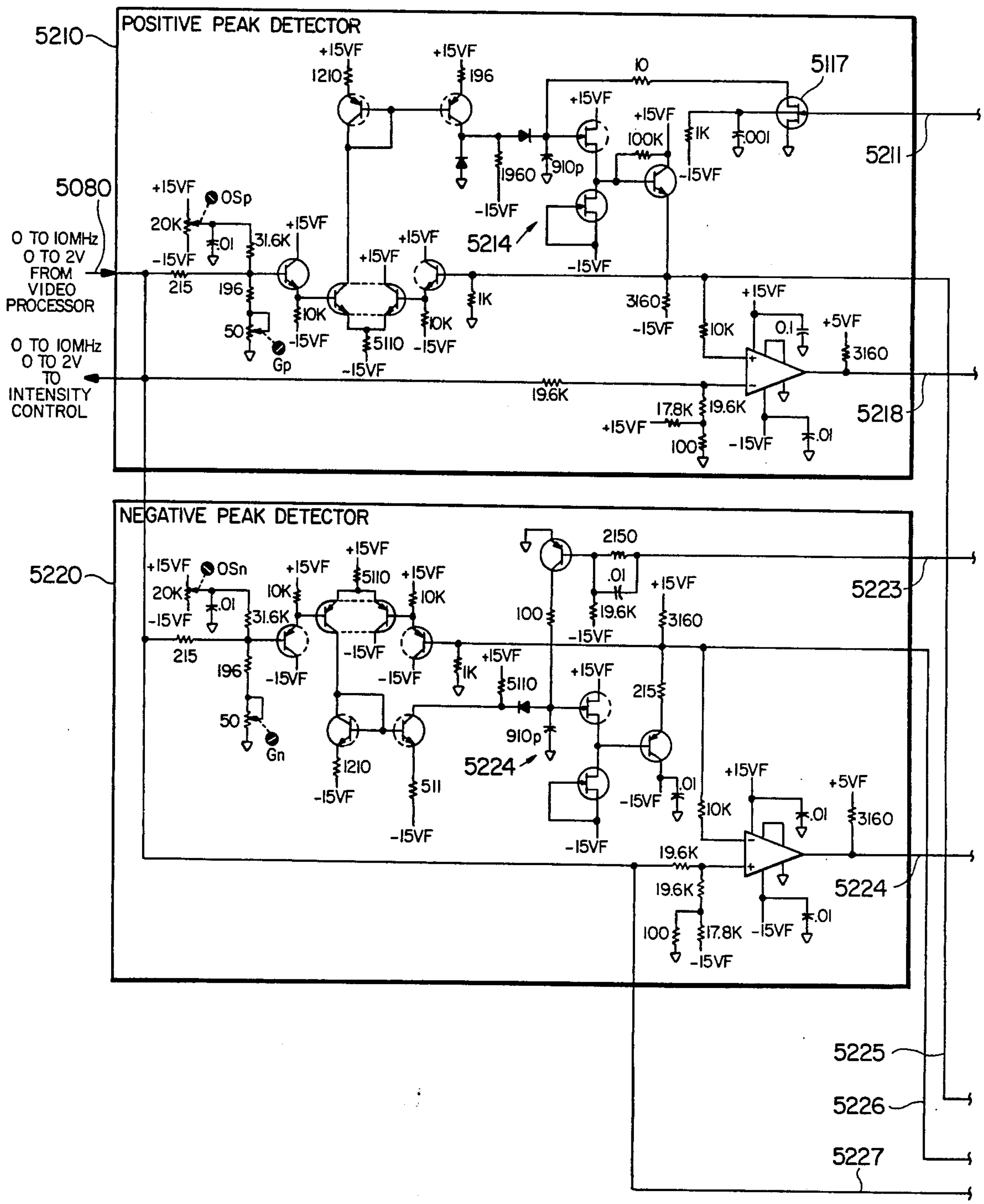
FIG_52A

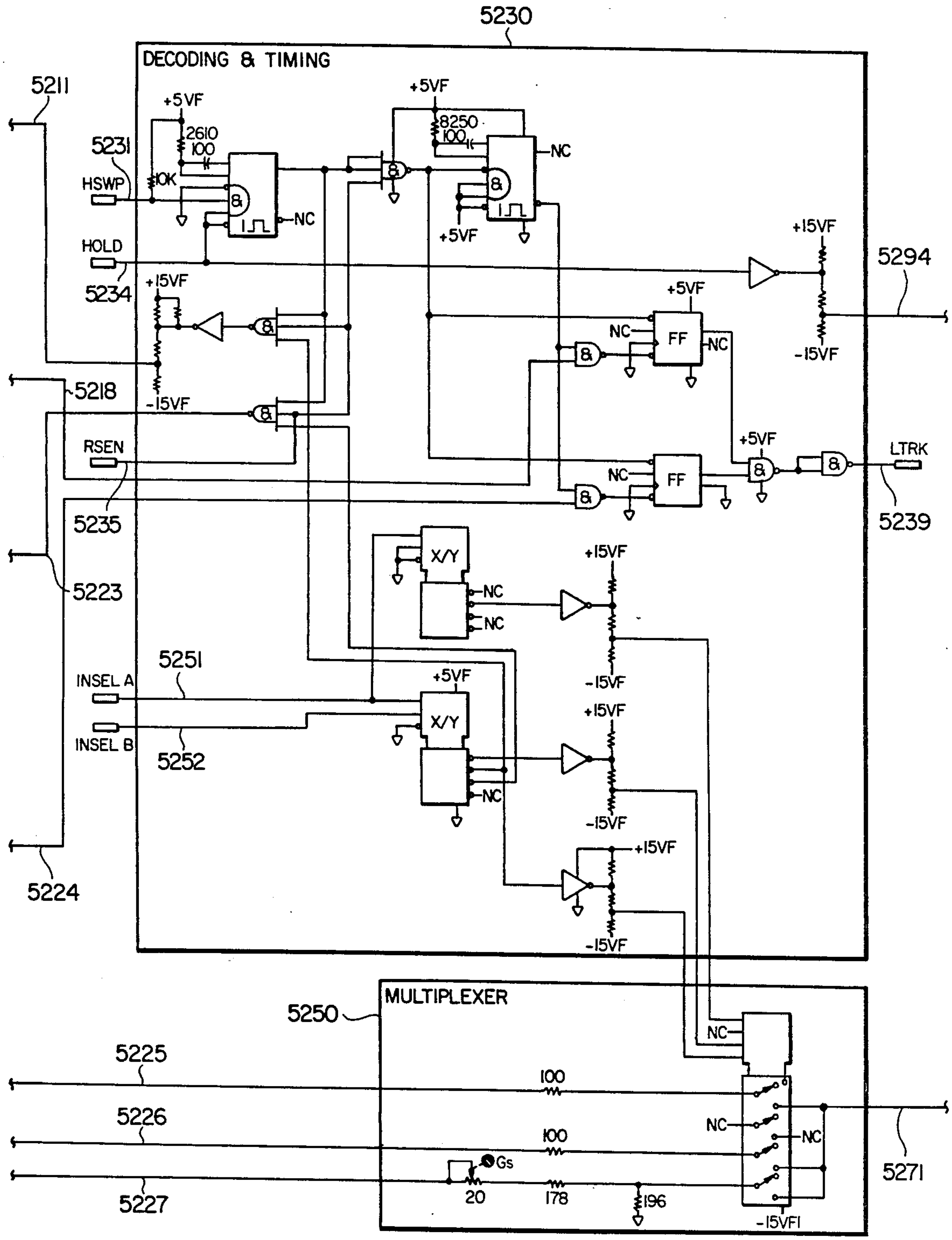
FIG_52B

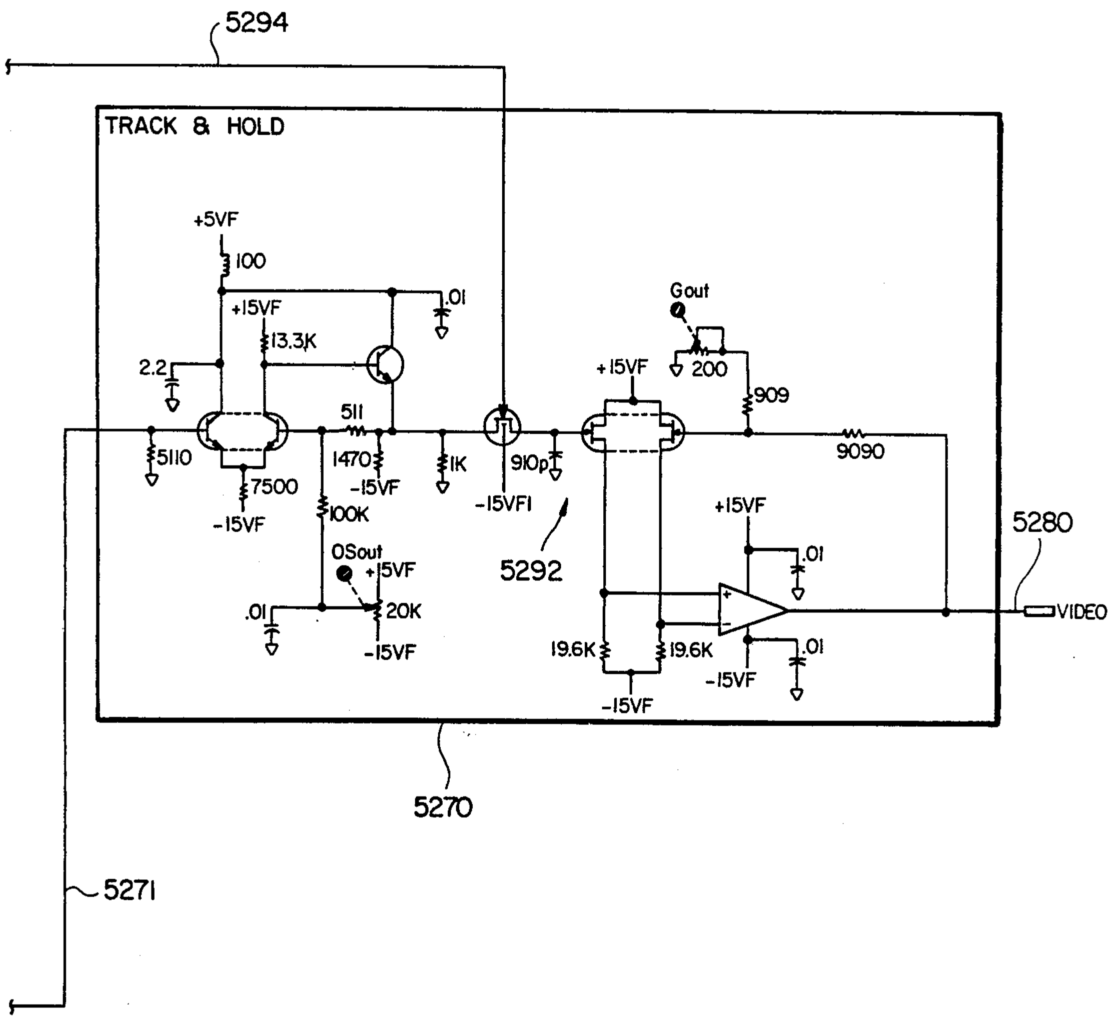
FIG_52C

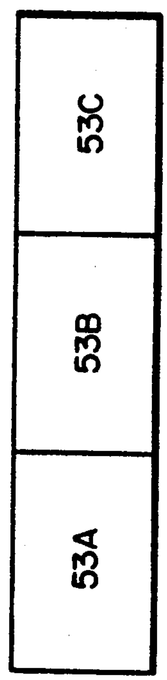
FIG_53

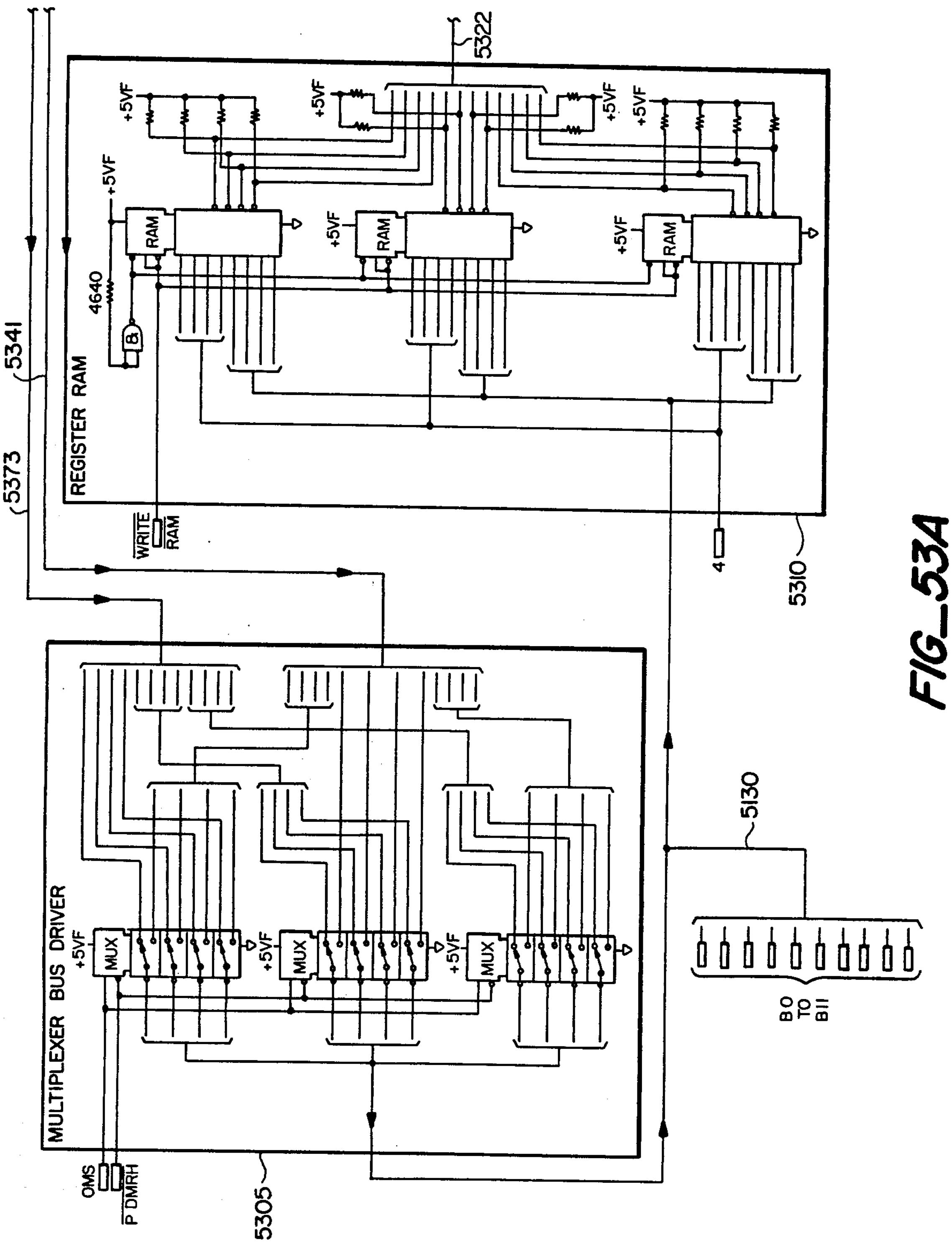
FIG_53A

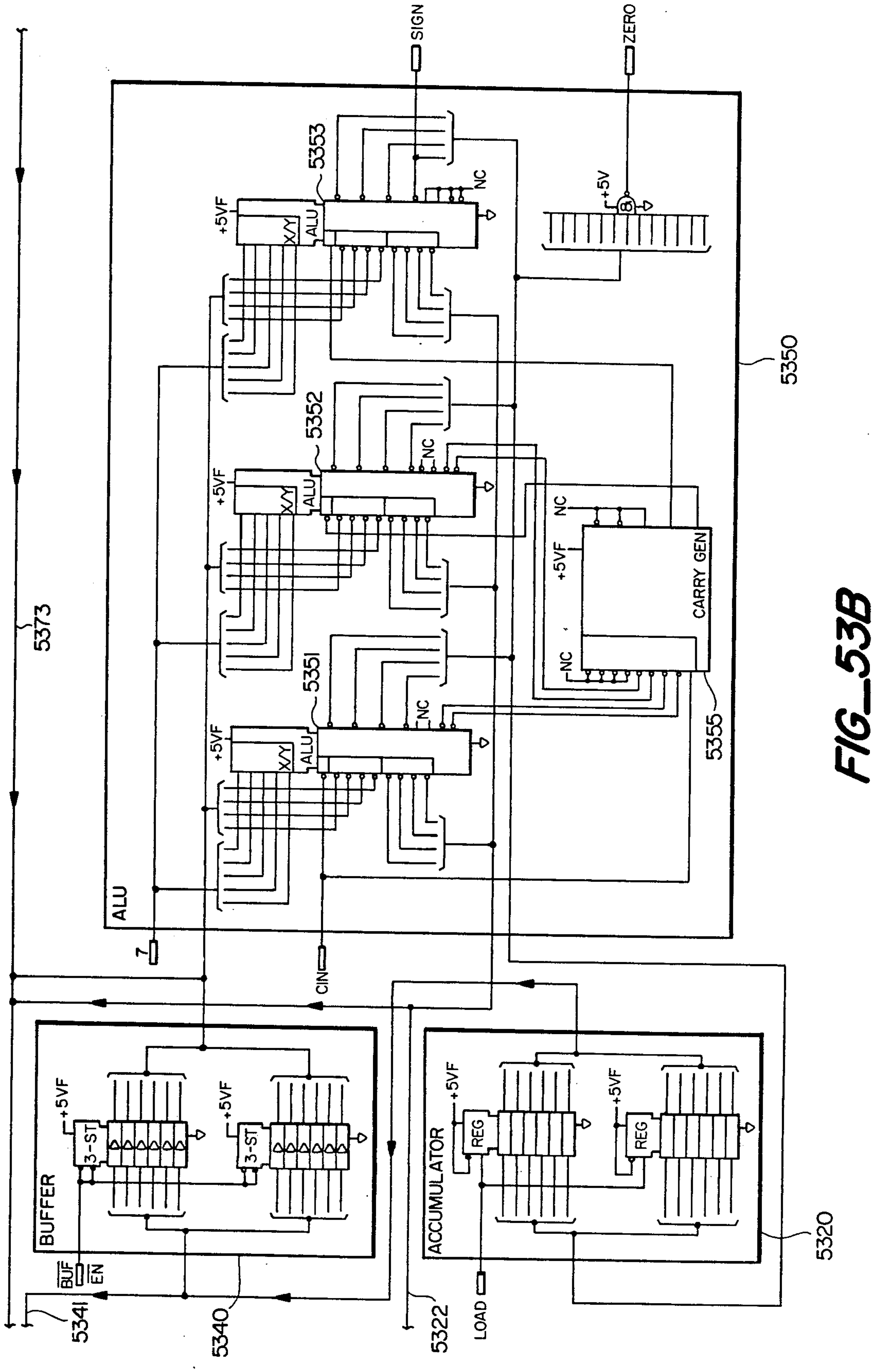
FIG_53B

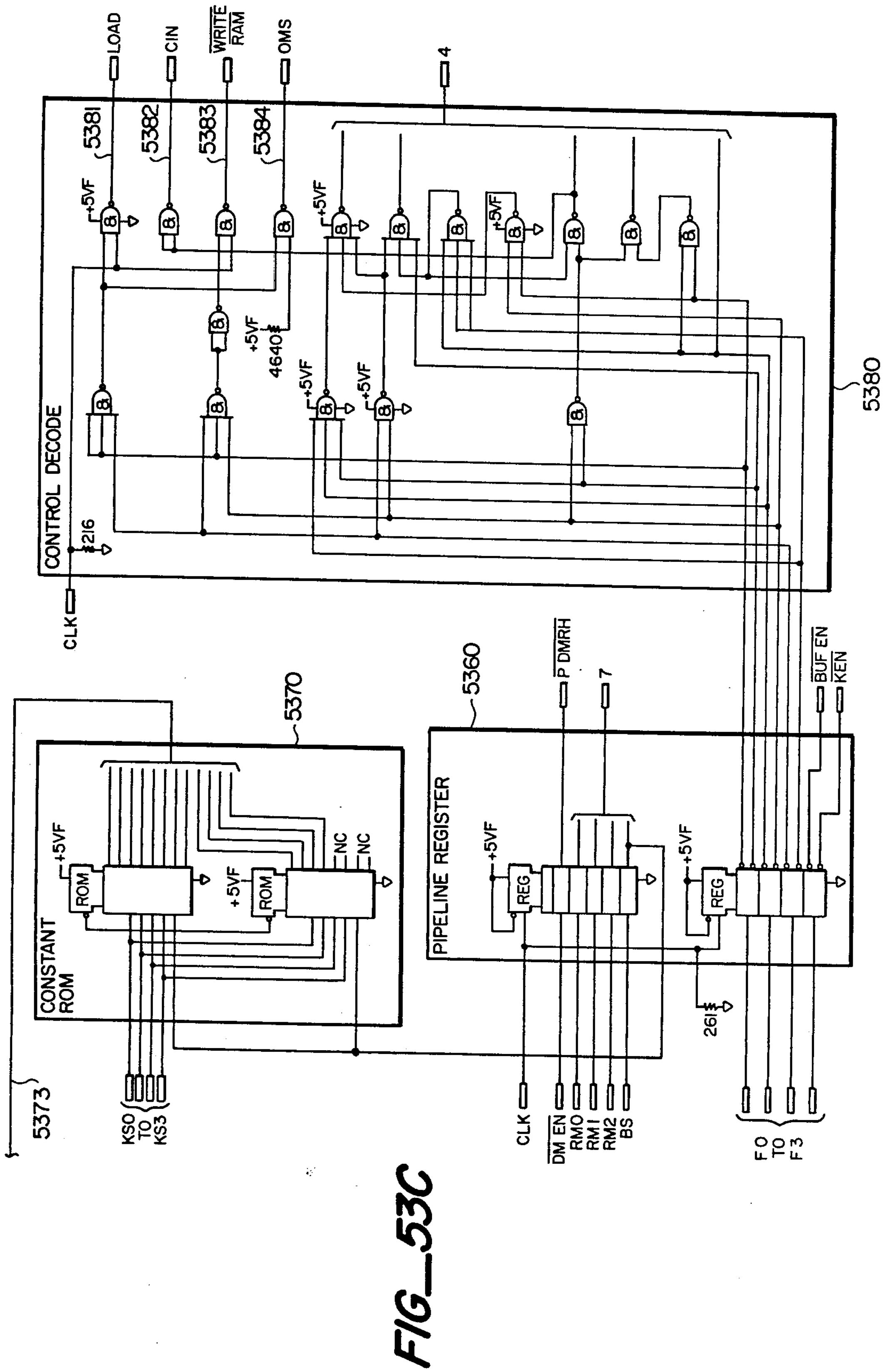
FIG_53C

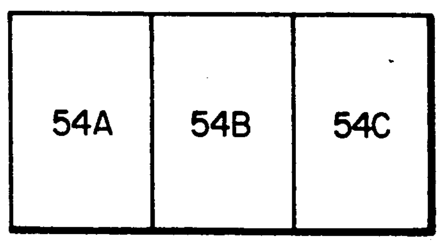
FIG_54

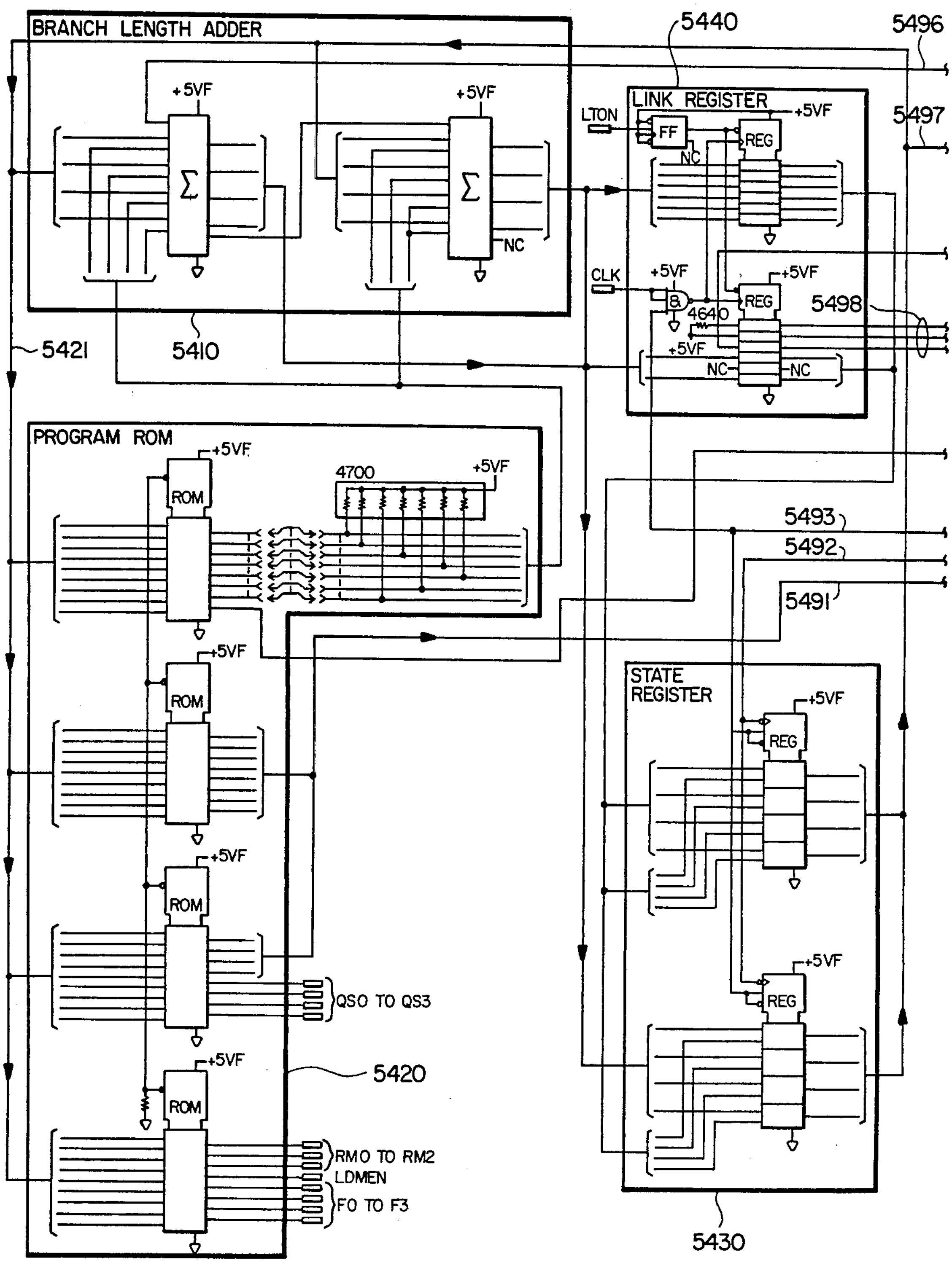
FIG_54A

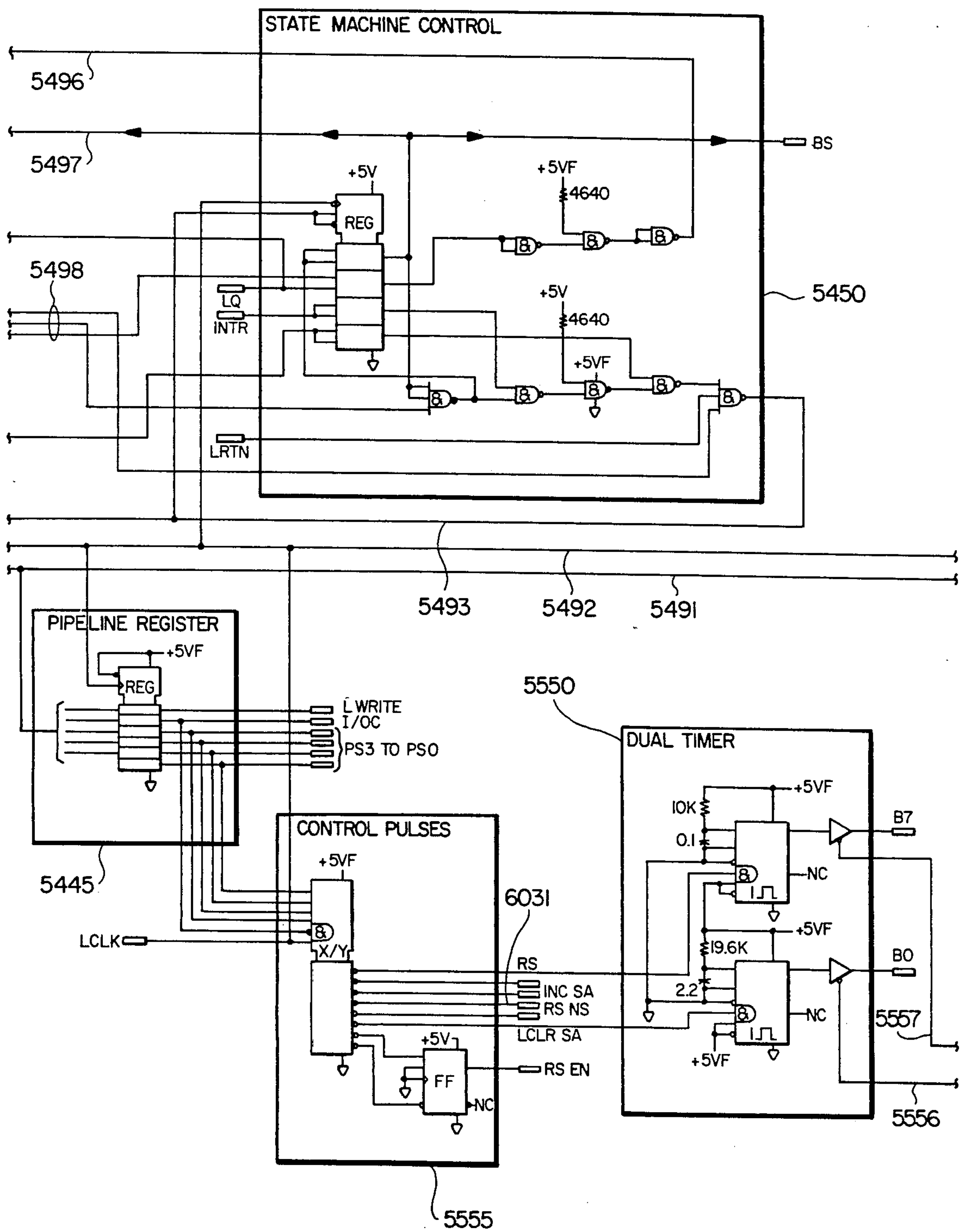
FIG_54B

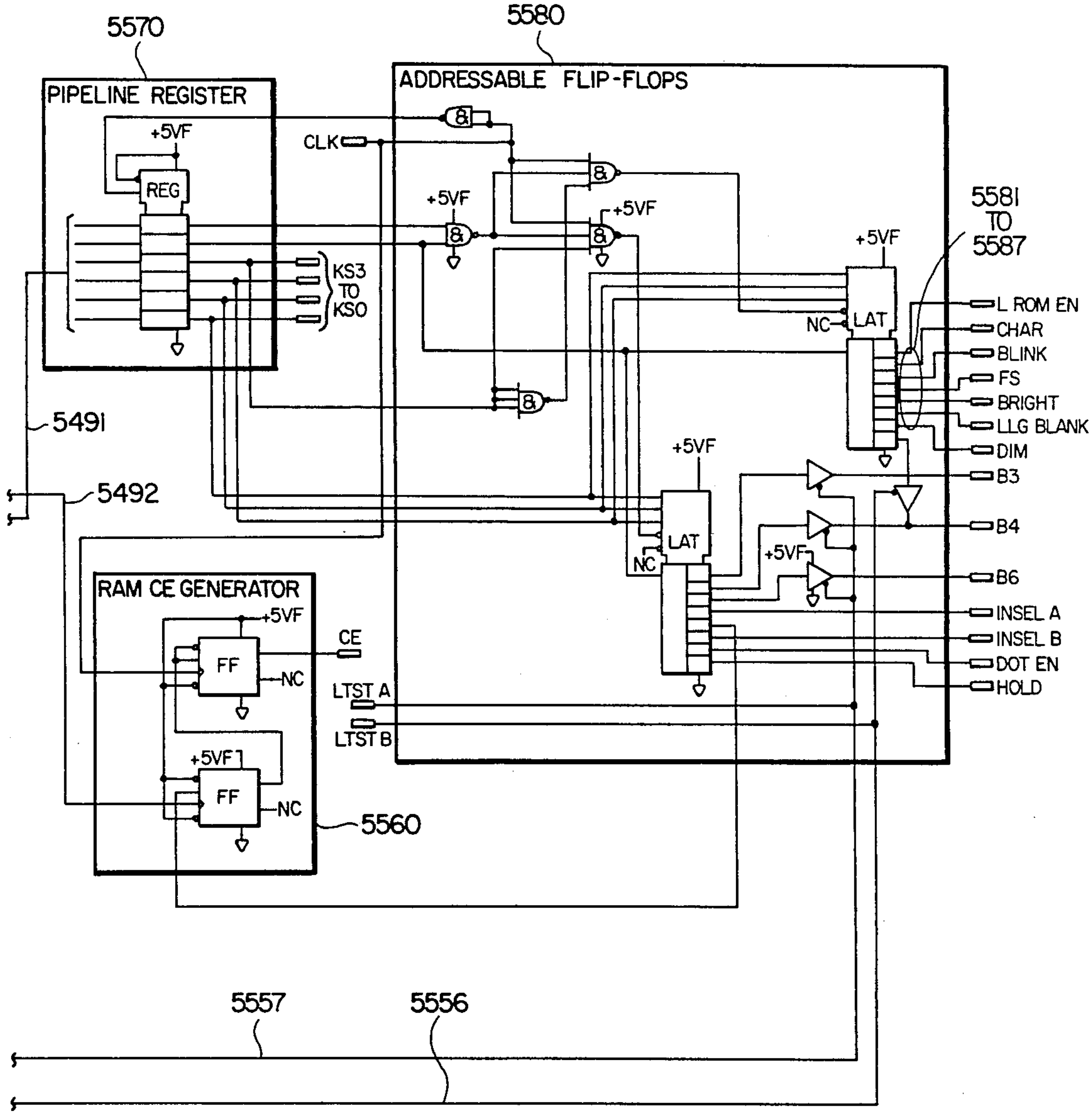
FIG_54C

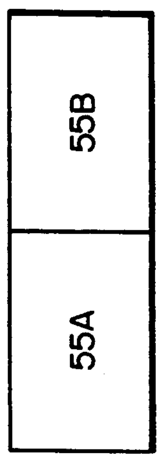
FIG_55

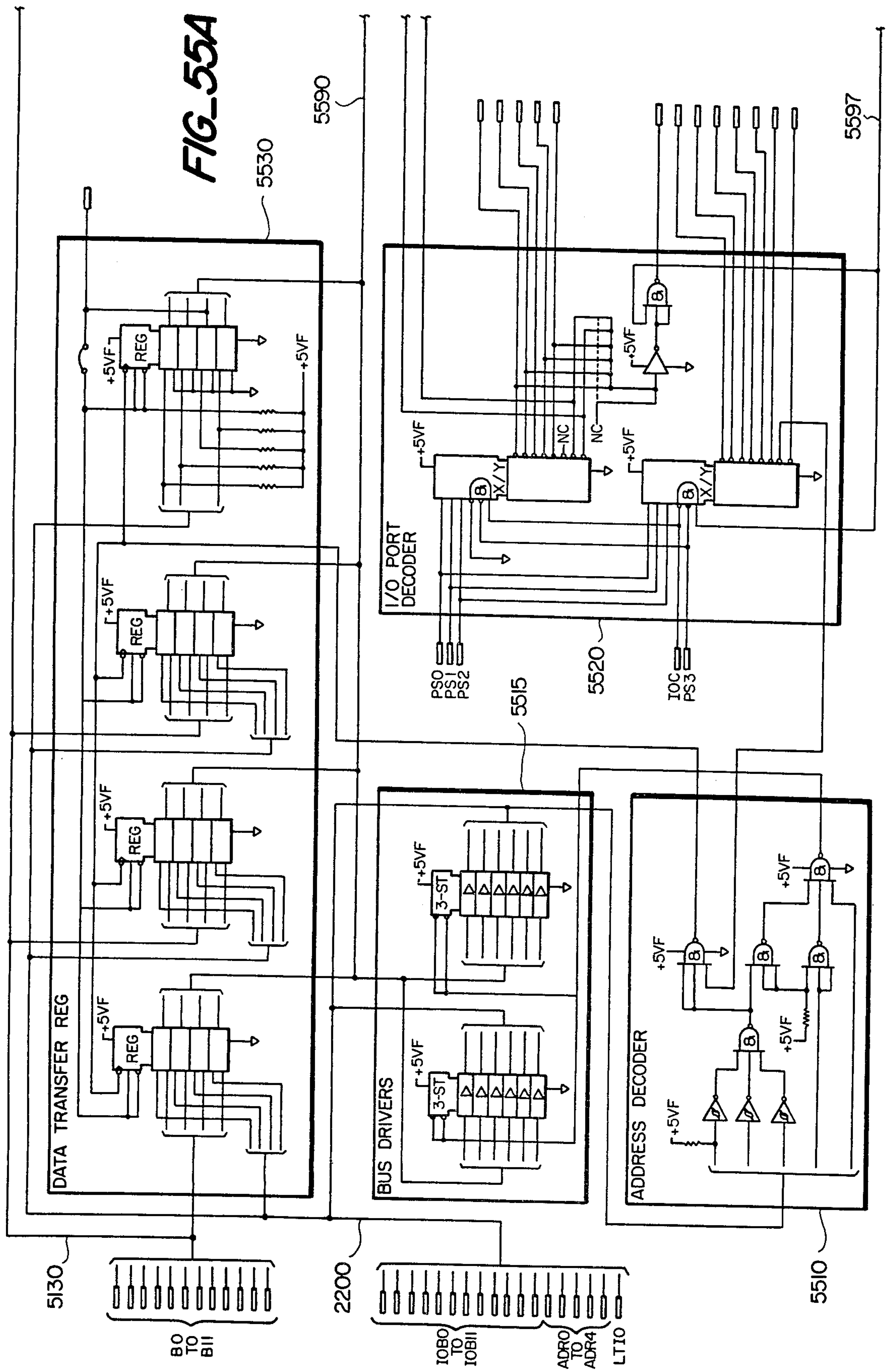
FIG_55A

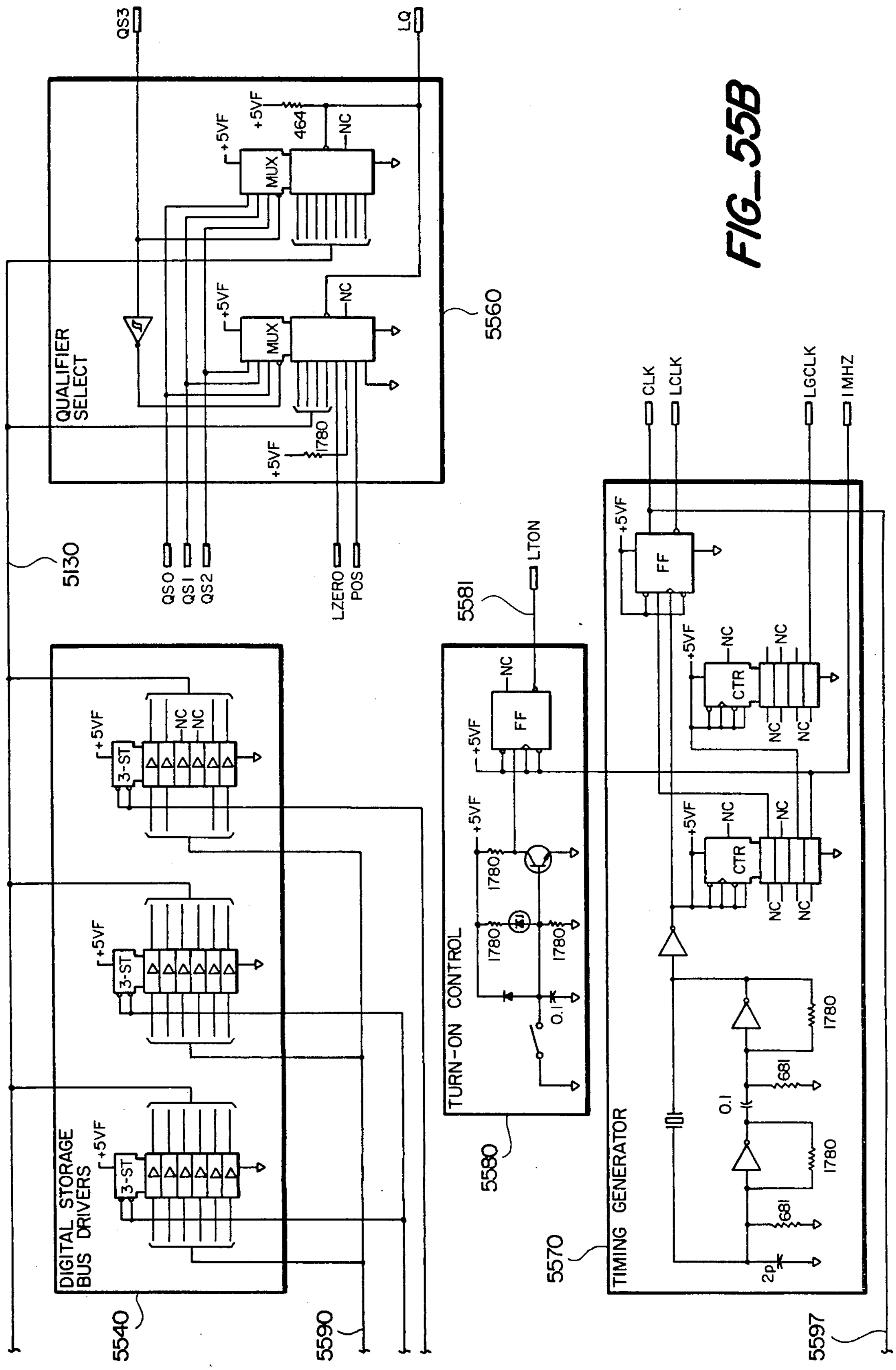
FIG_55B

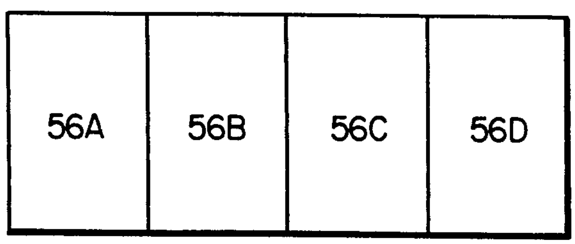
FIG_56

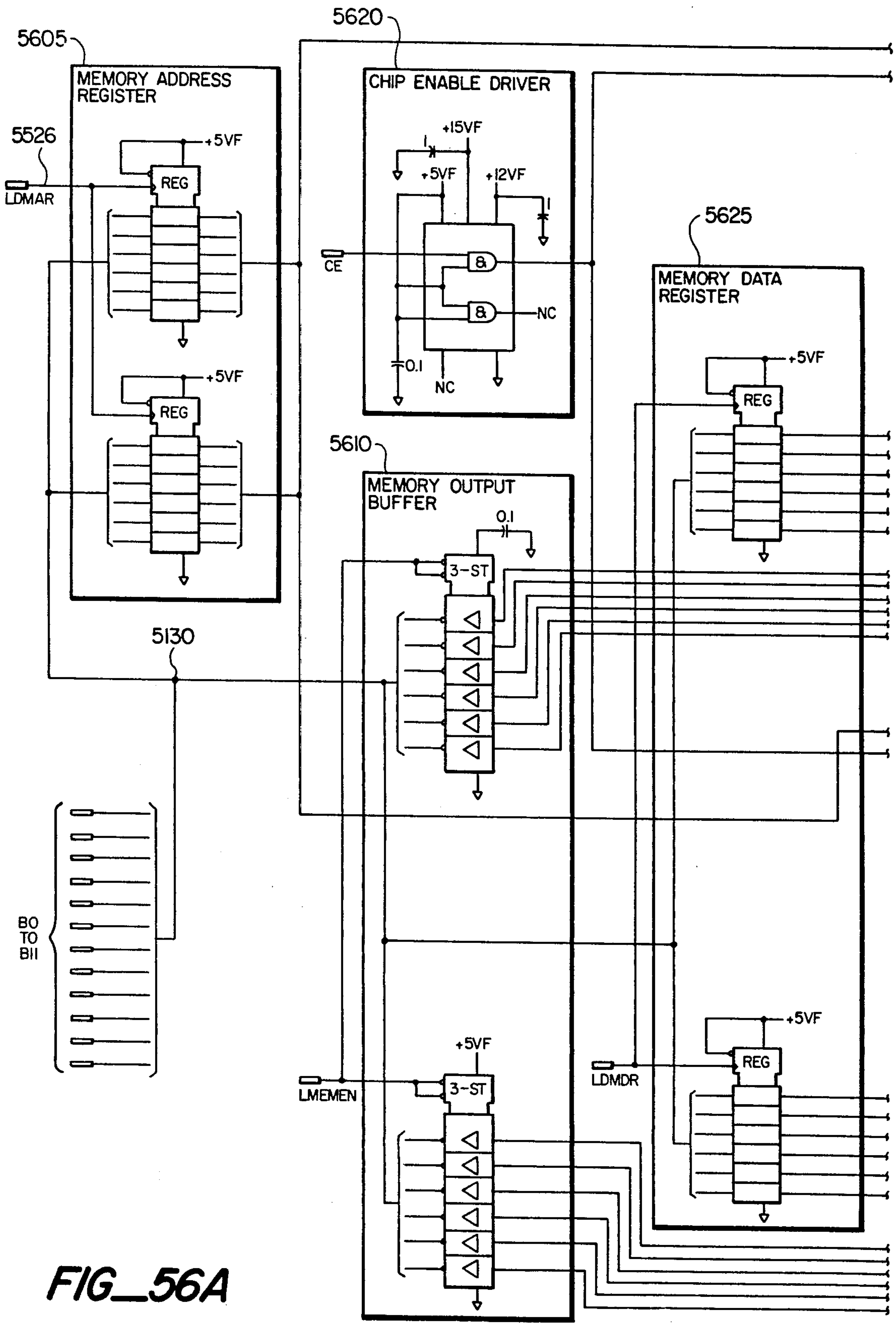
FIG_56A

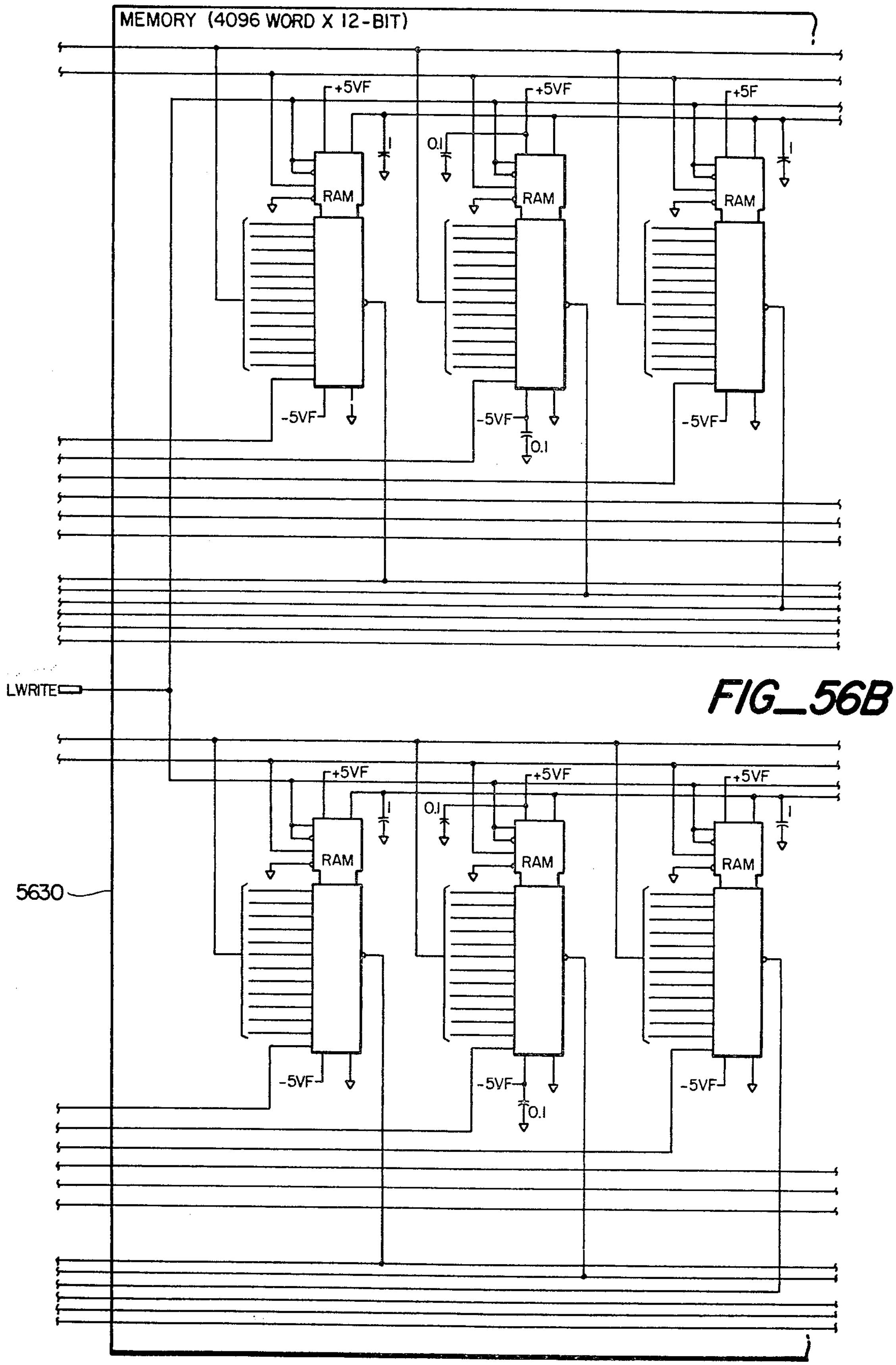
FIG_56B

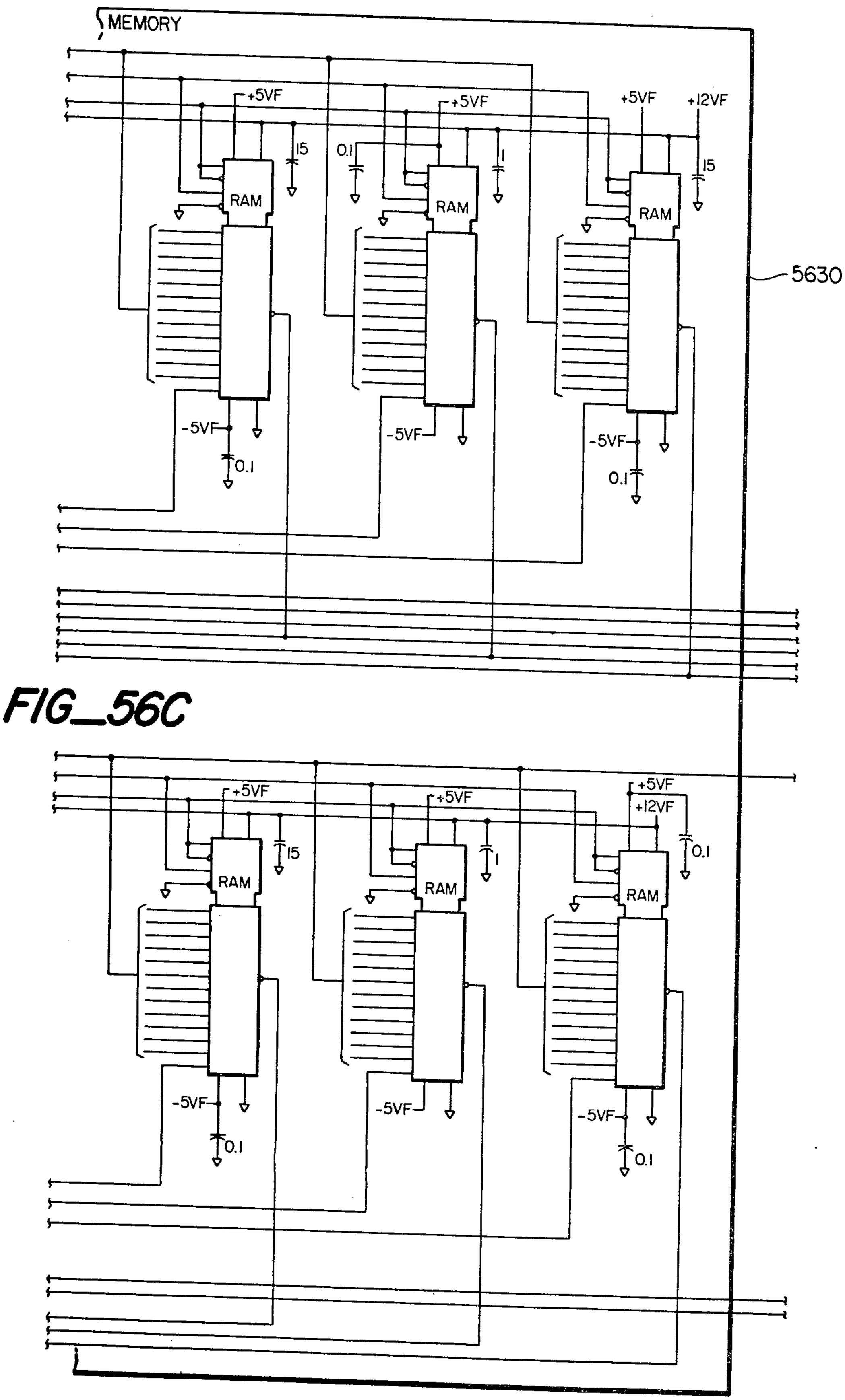
FIG_56C

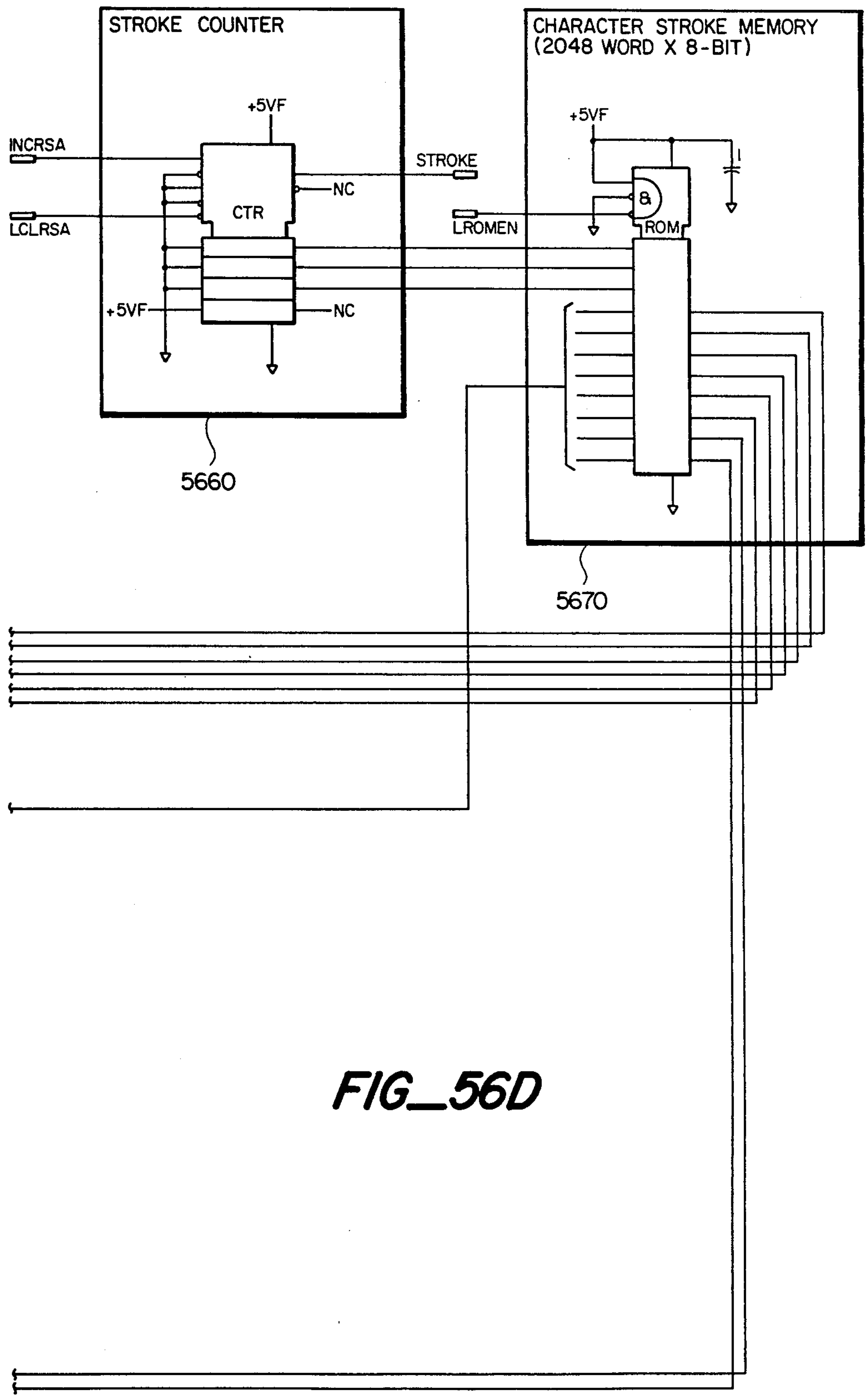
FIG_56D

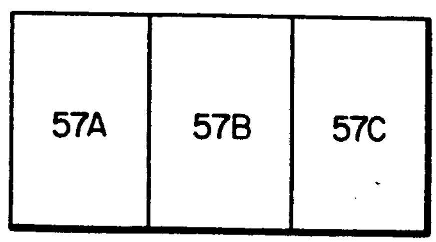
FIG_57

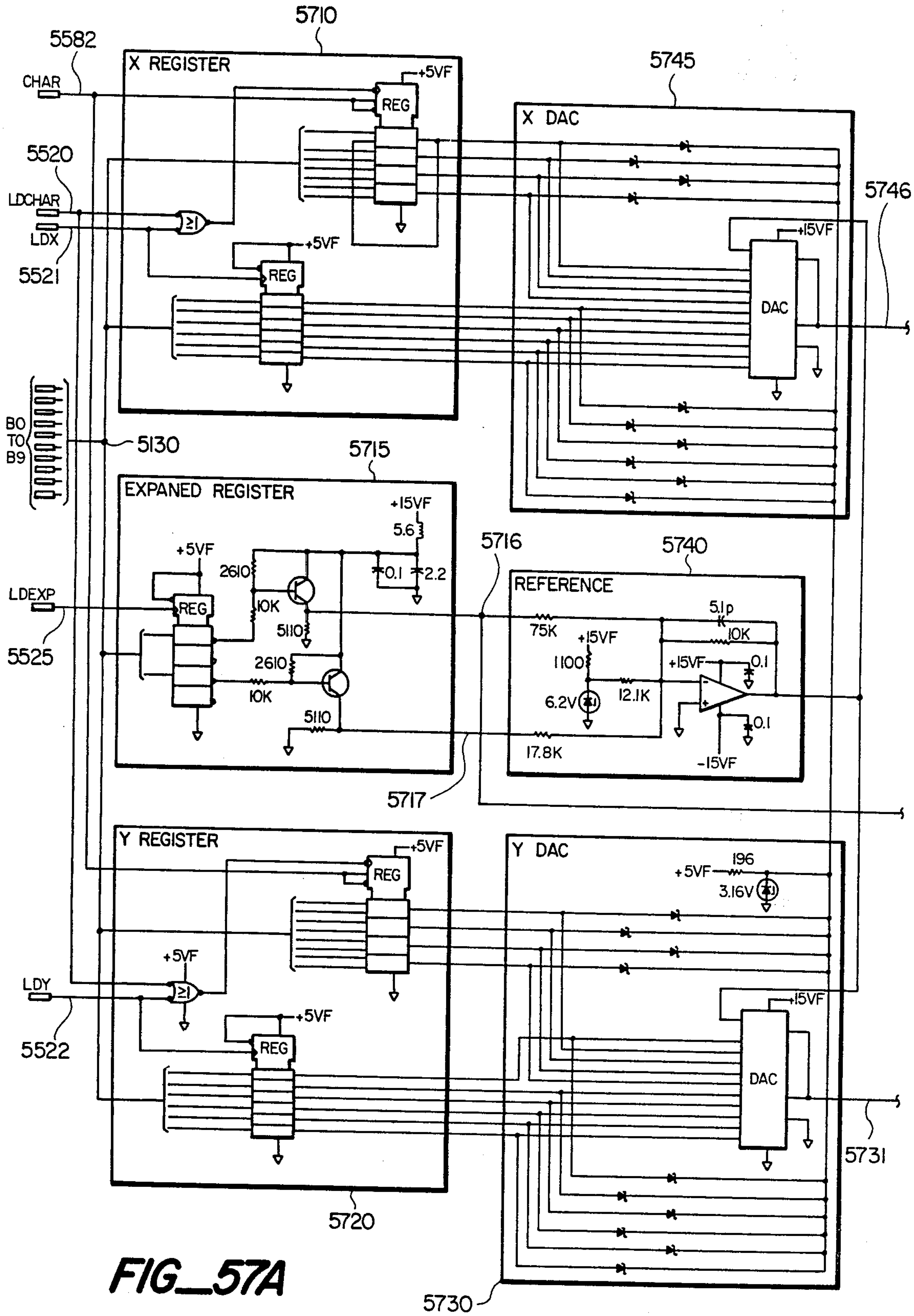
FIG_57A

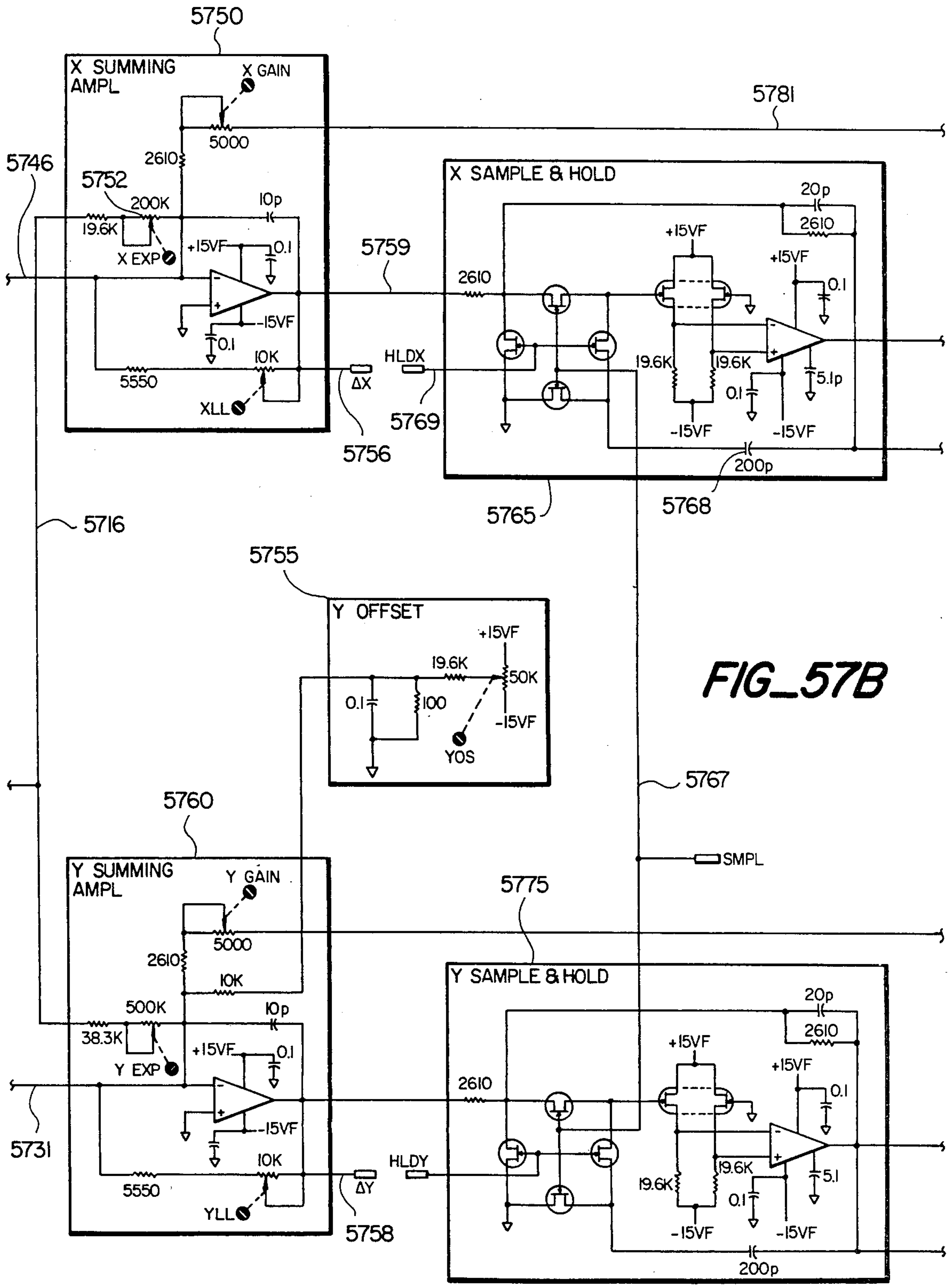
FIG_57B

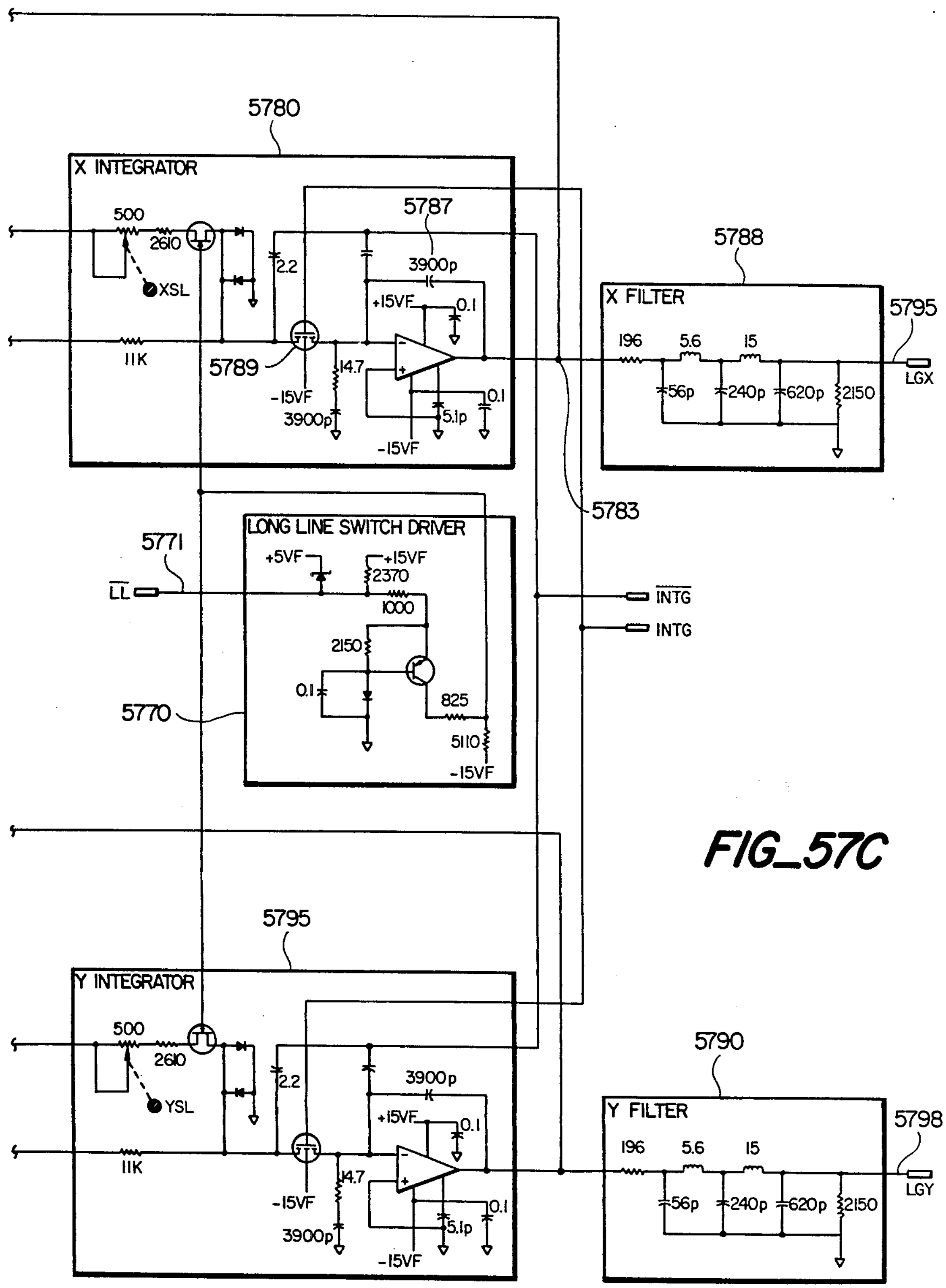
FIG_57C

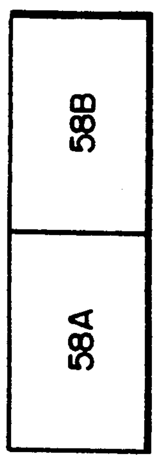
FIG_58

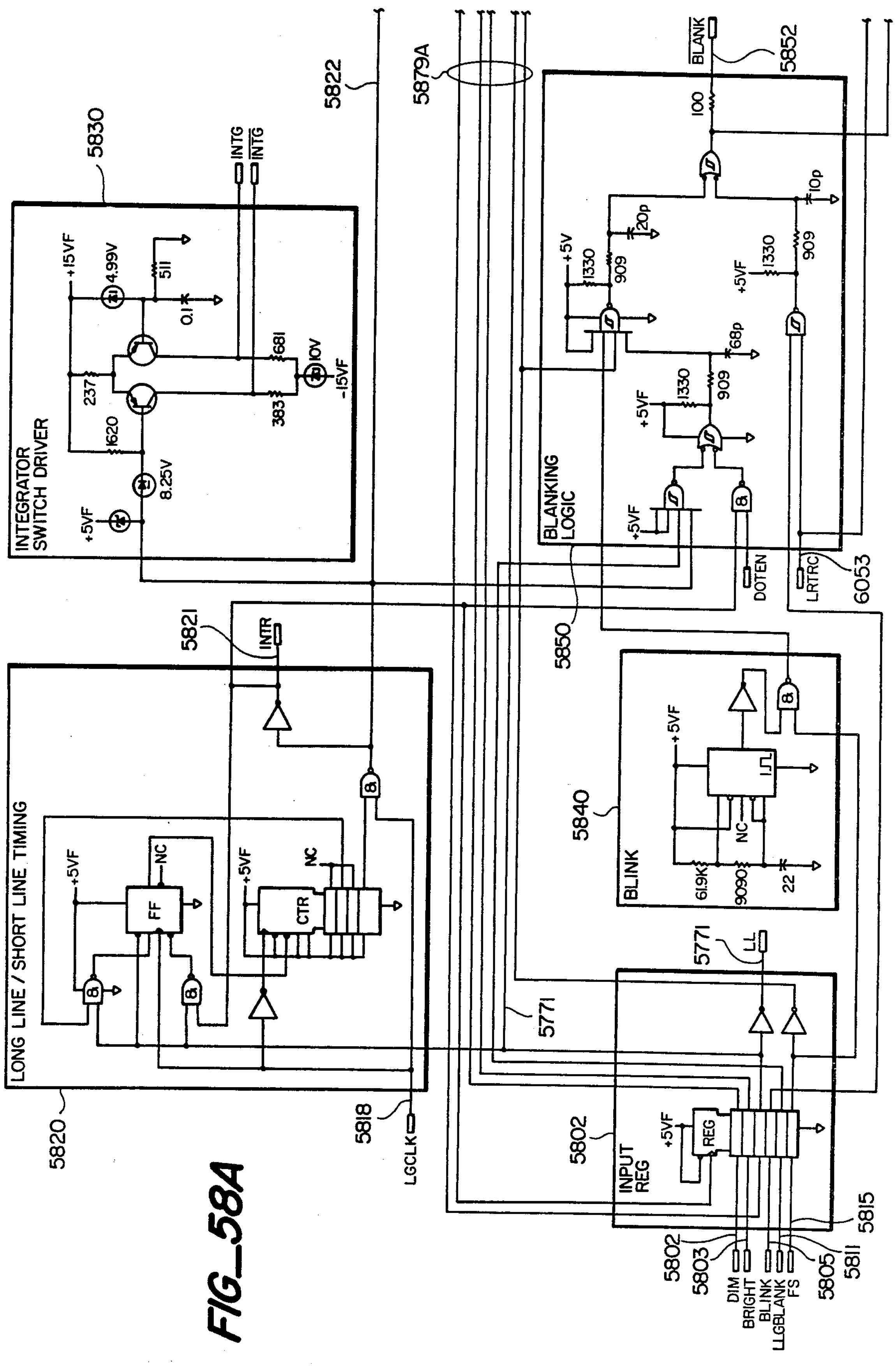
FIG_58A

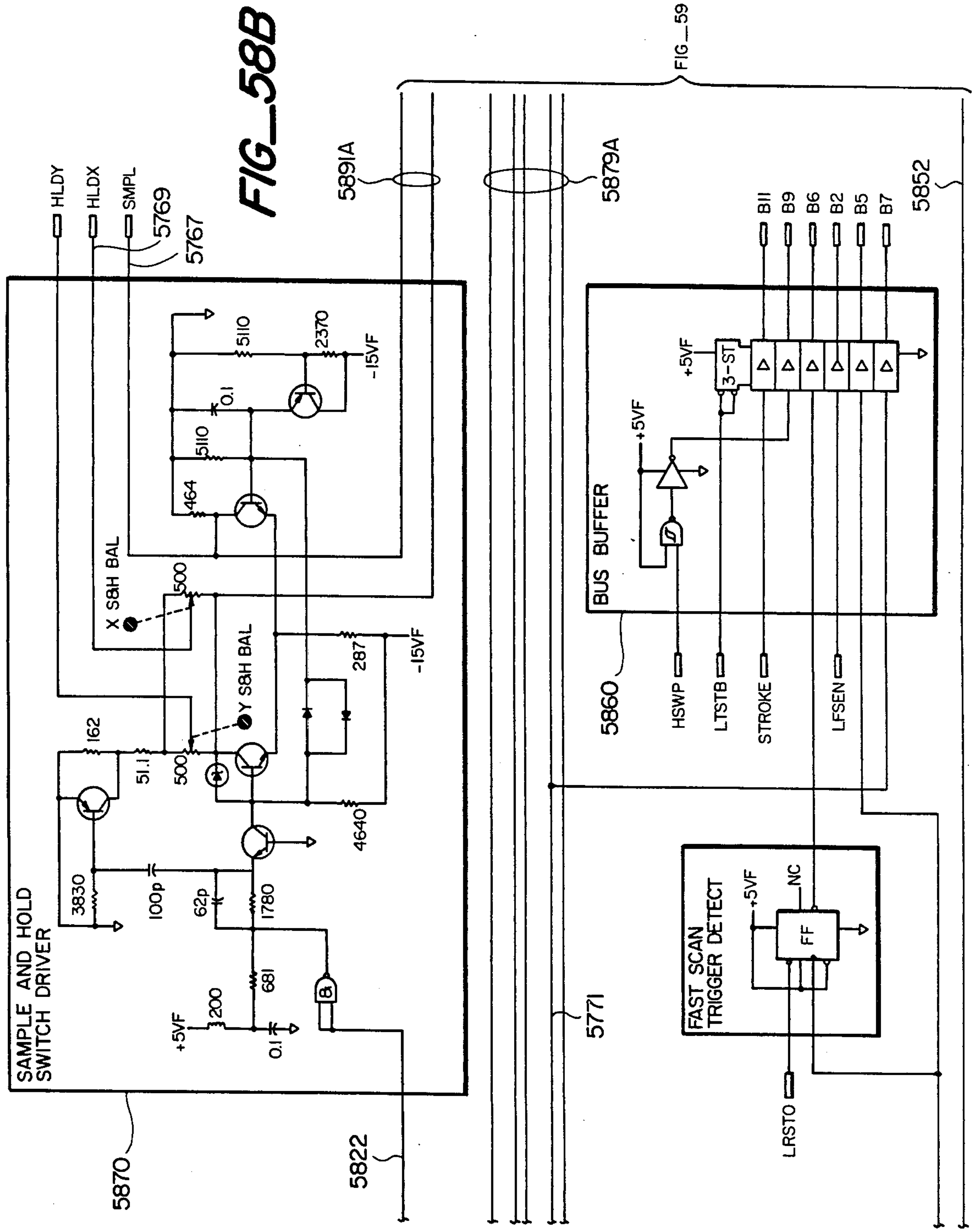
FIG_58B
SAMPLE AND HOLD SWITCH DRIVER
BUS BUFFER
FAST SCAN TRIGGER DETECT
HLDY
HLDX
SMPL
5769
5767
5891A
5879A
5852
5860
5870
5822
5771
FIG_59
X S&H BAL
Y S&H BAL
-15VF
+5VF
3-ST
FF
NC
HSWP
LTSTB
STROKE
LFSEN
LRSTO
B11
B9
B6
B2
B5
B7
5110
2370
0.1
464
500
287
162
51.1
4640
3830
100p
62p
1780
681
200

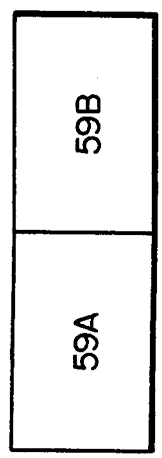
FIG_59

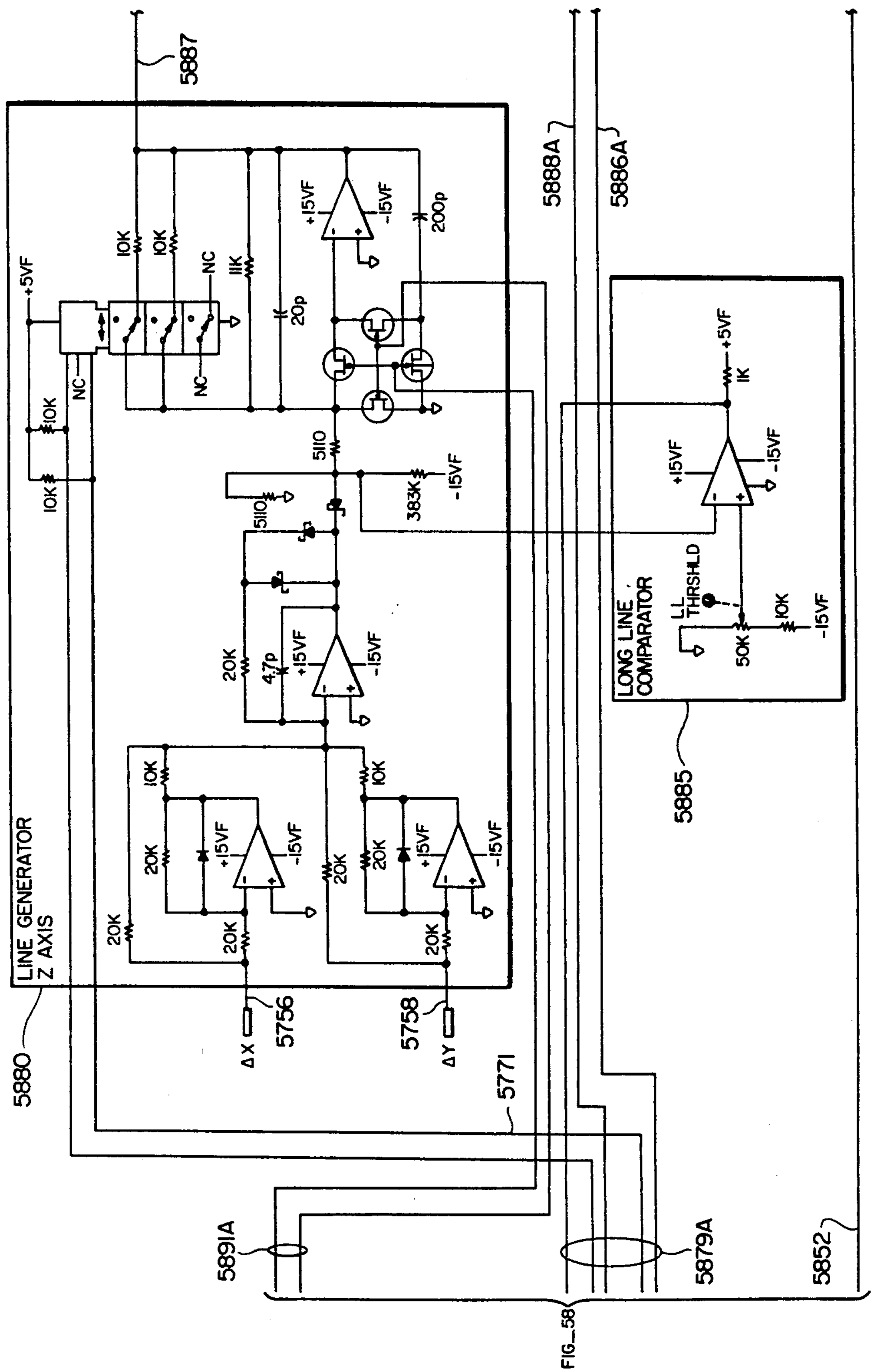
FIG_59A

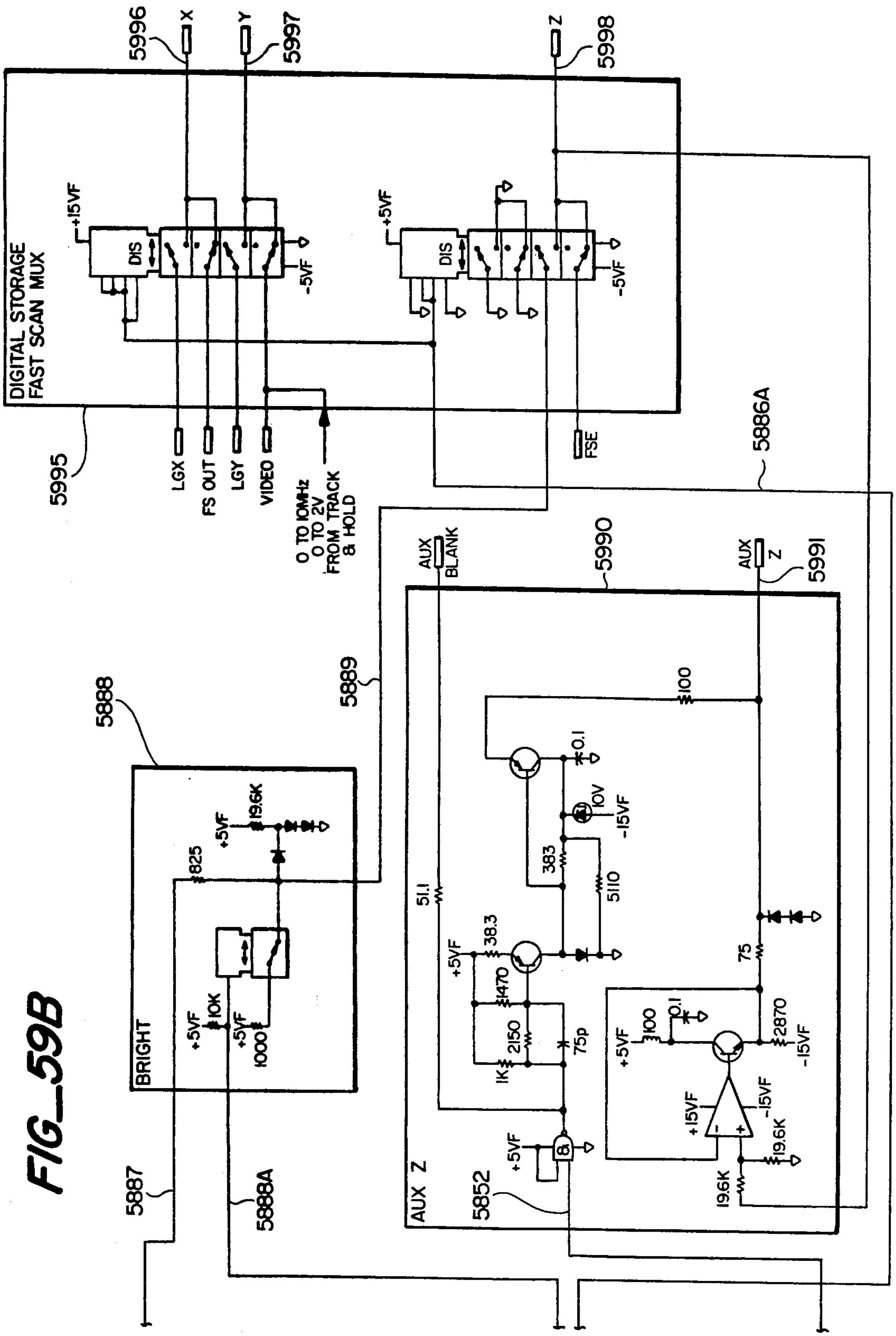
FIG_59B

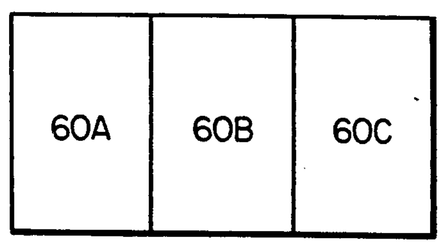
FIG_60

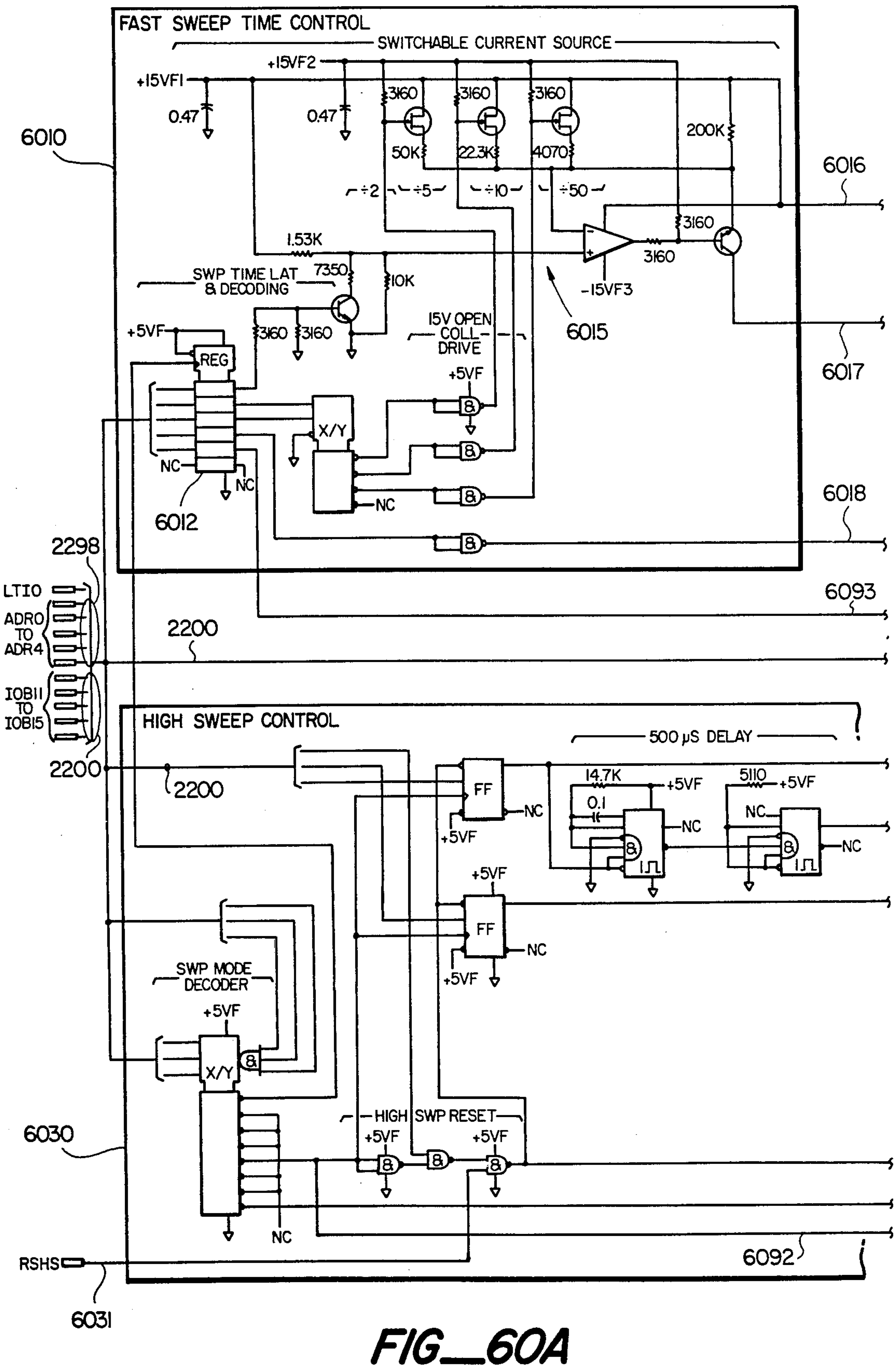
FIG_60A

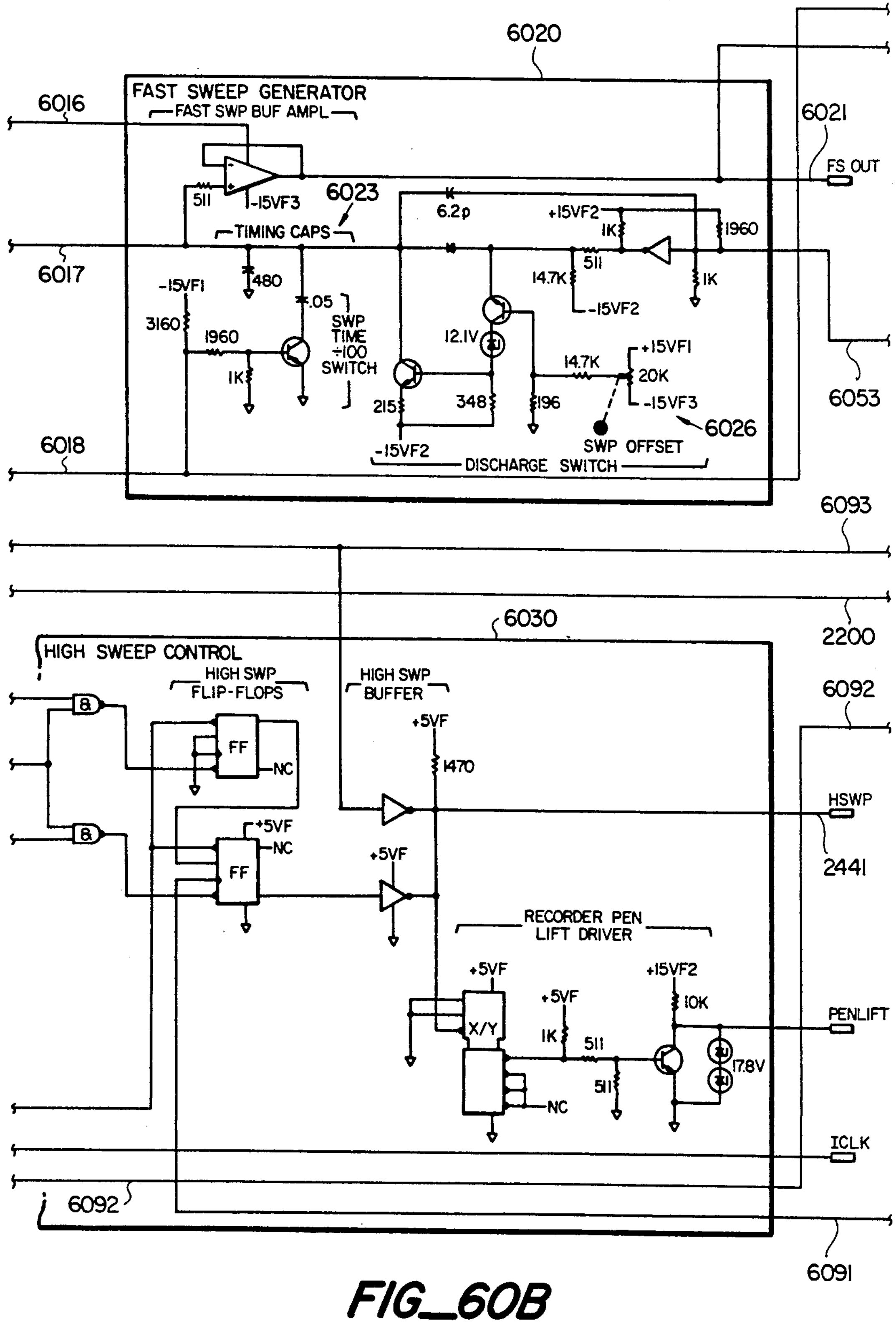
FIG_60B

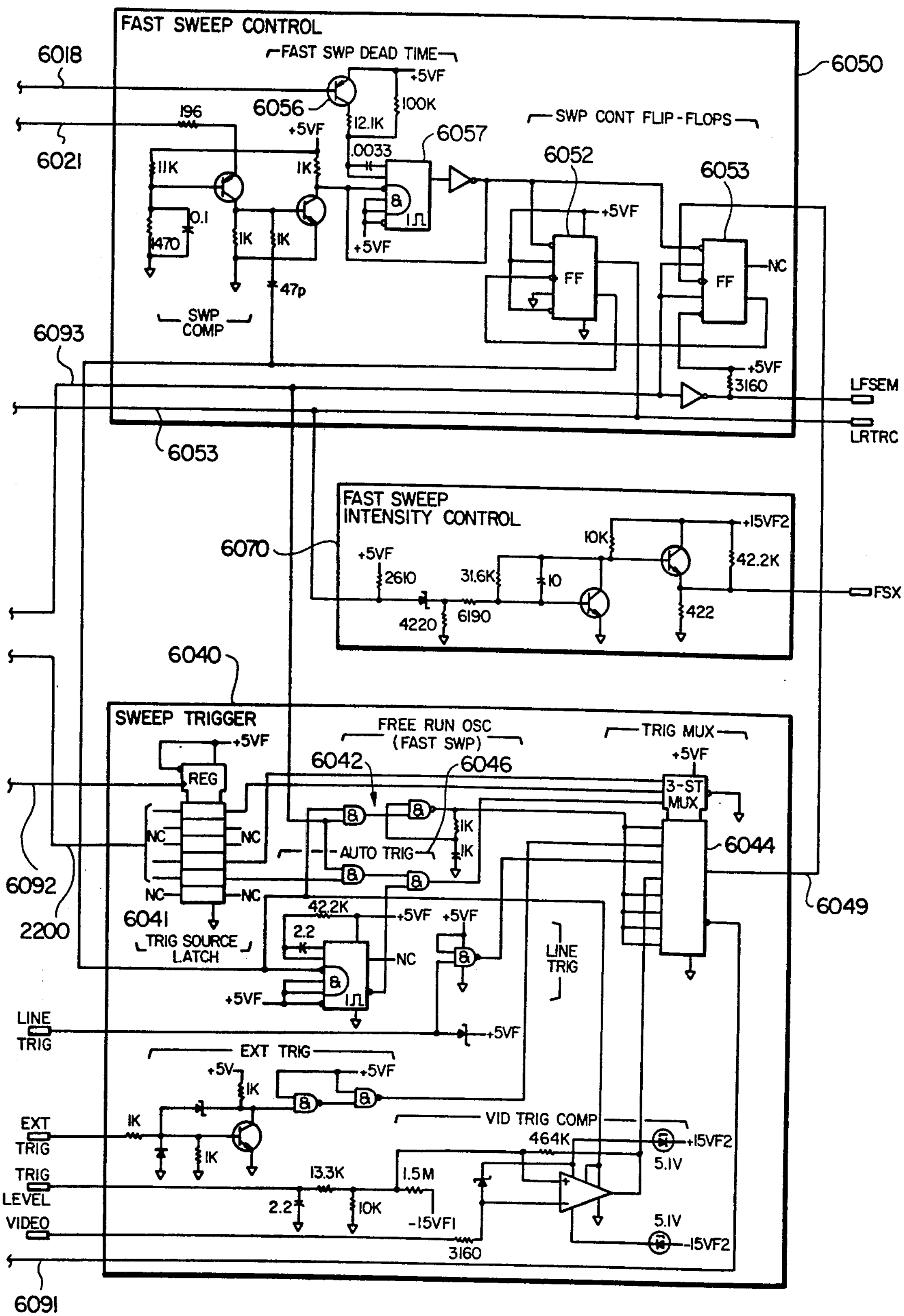
FIG_60C

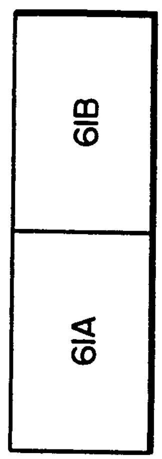
FIG._61

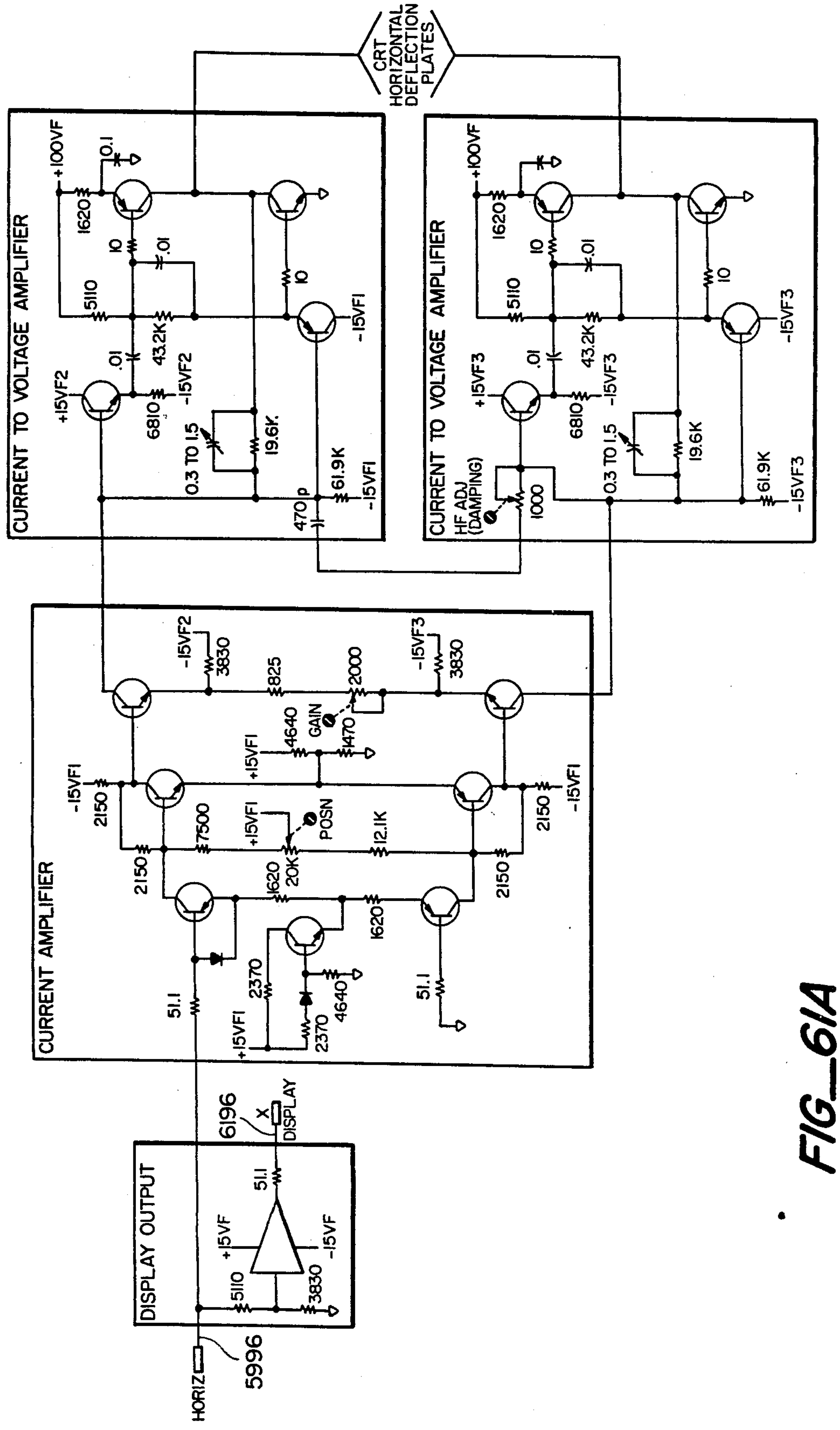
FIG_61A

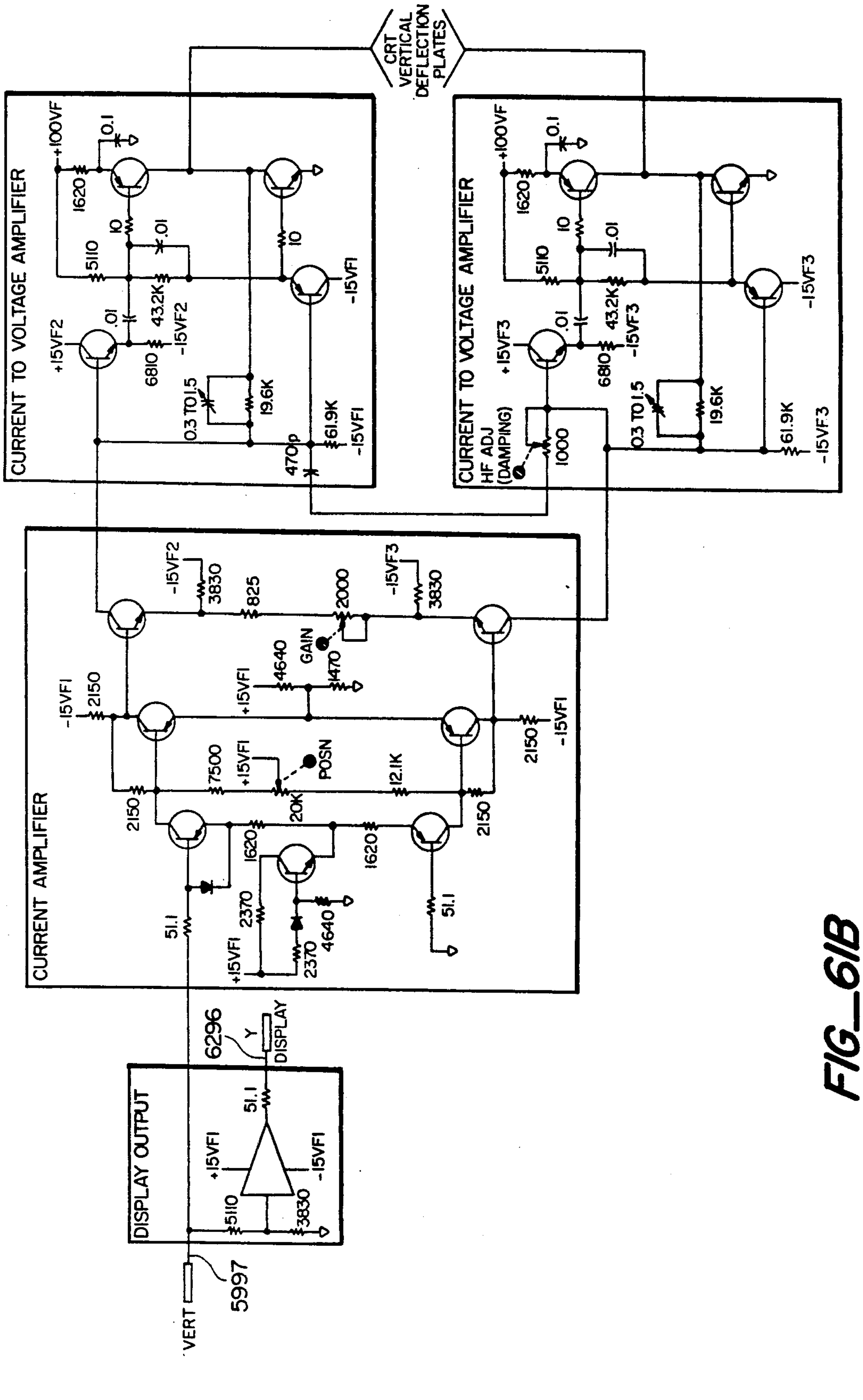
FIG_61B

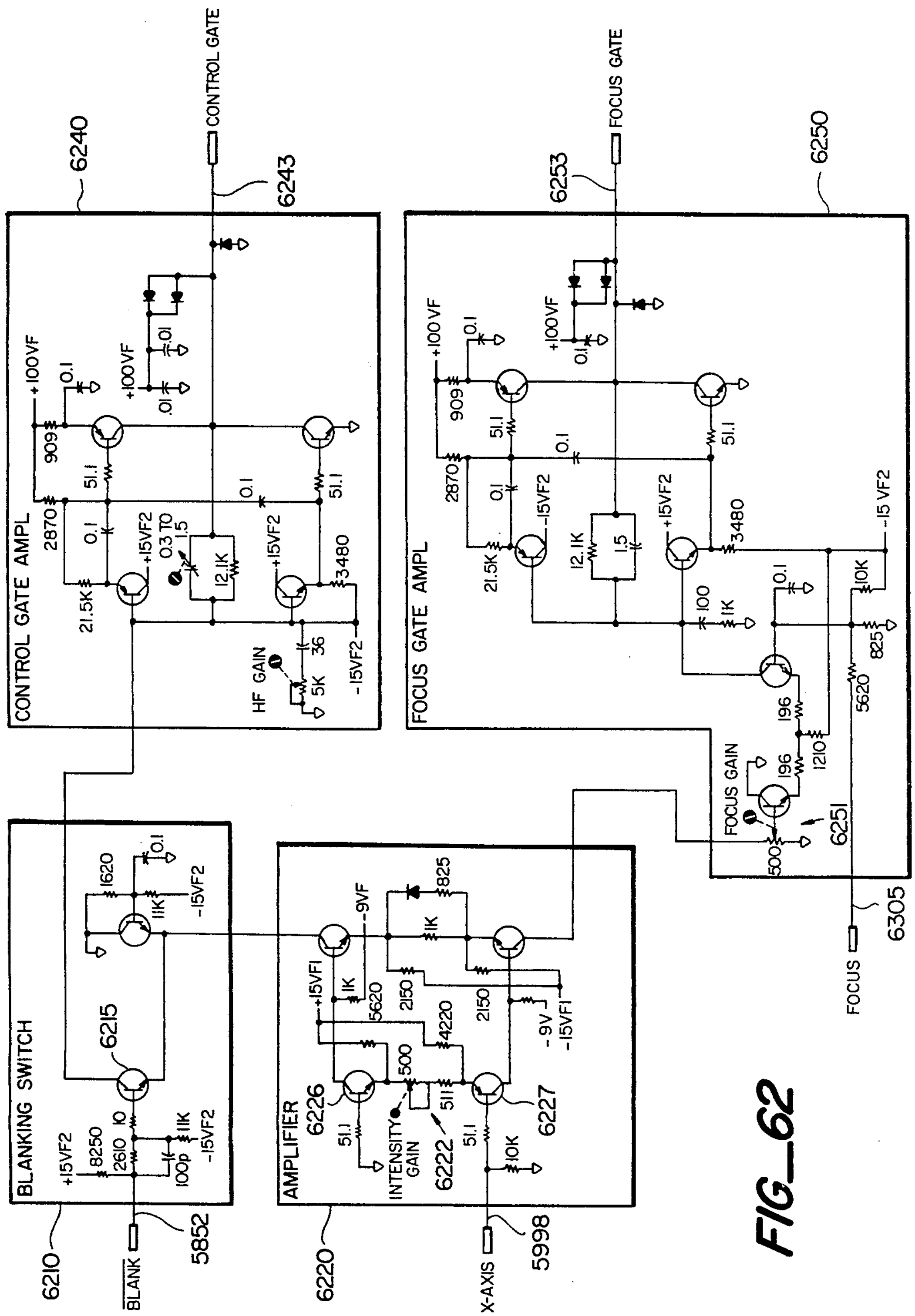
FIG_62

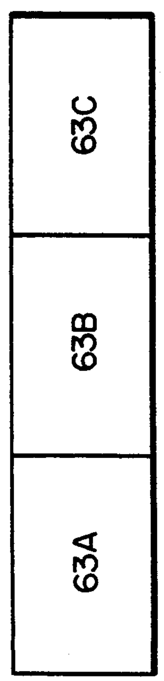
FIG_63

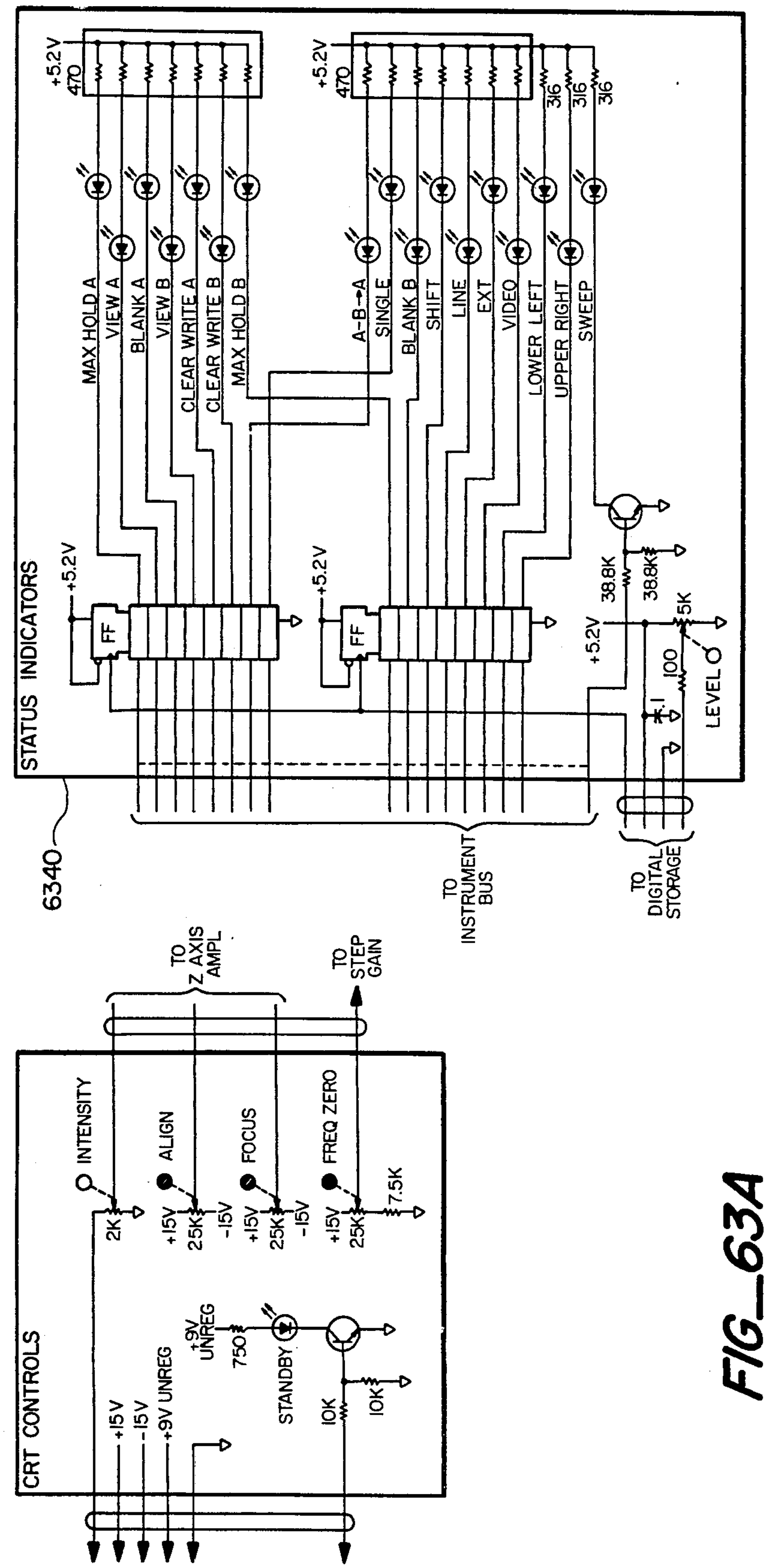
FIG_63A

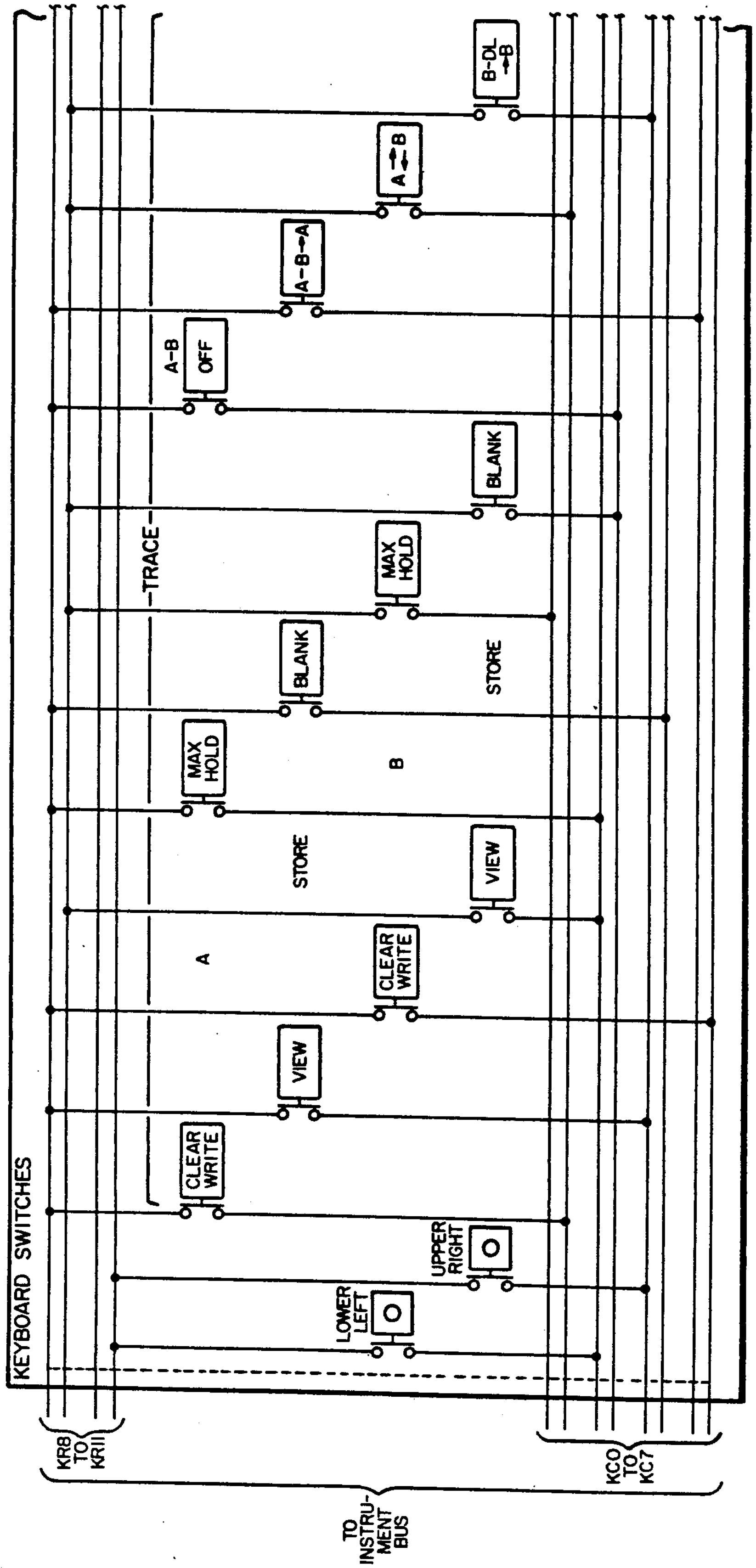
FIG_63B

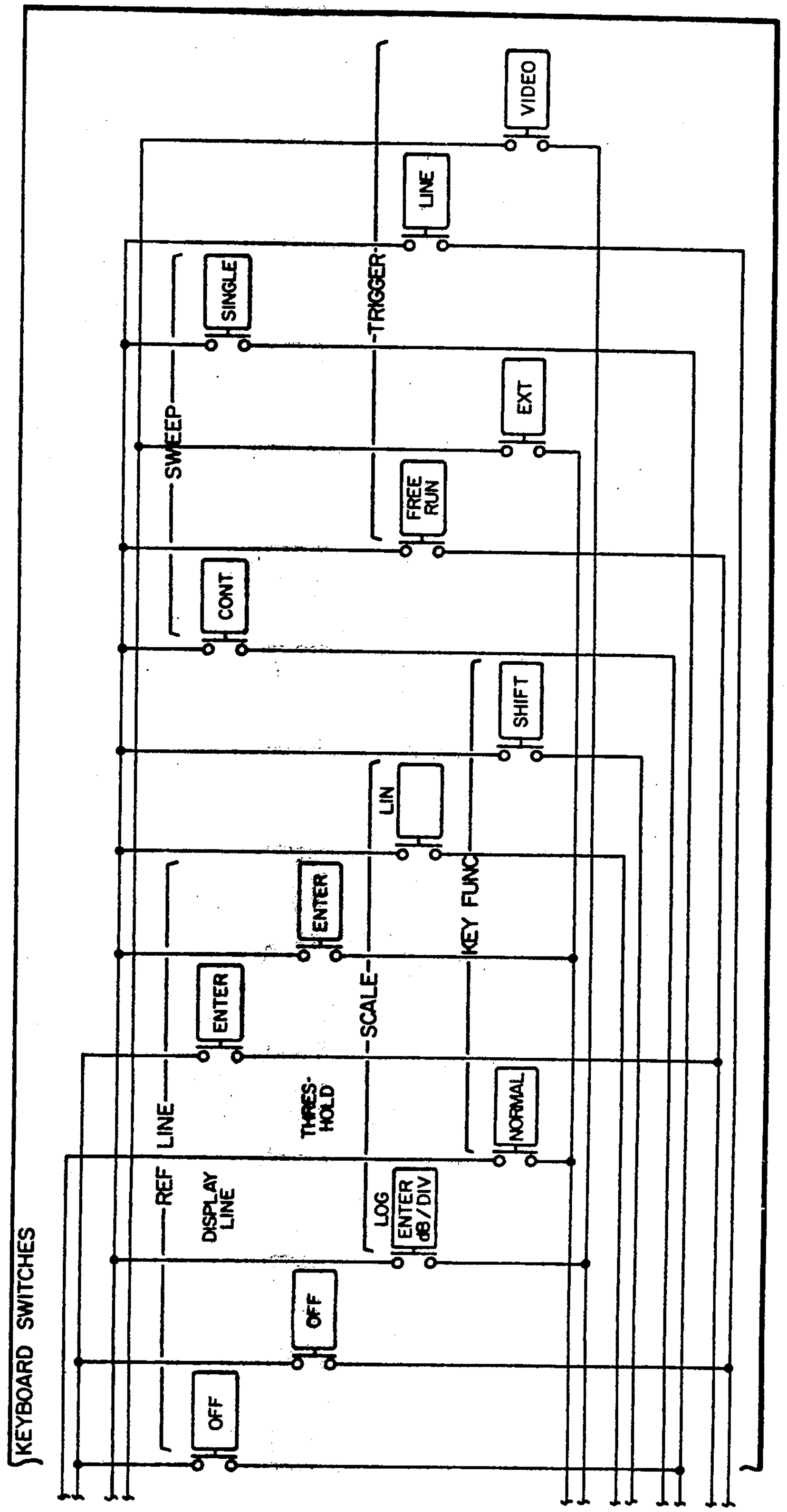
FIG_63C

APPARATUS FOR SPECTRUM ANALYSIS OF AN ELECTRICAL SIGNAL

BACKGROUND AND SUMMARY OF THE INVENTION

Spectrum Analyzers produce a display of amplitude vs. frequency of an input signal over a user settable frequency range. Typically, the user sets a center frequency and the unit scans over a predetermined band around the center frequency. Also, an amplitude reference is selected.

In previous spectrum analyzers, measurements of different relevant points on the displayed output was difficult to obtain accurately. In contrast, the preferred embodiment of the present invention provides a moveable marker which may be positioned on and moved along the displayed waveform. The frequency and amplitude at the present position of the marker is displayed and updated as the marker is moved. This moveable relative marker may also be used to facilitate the calculation of frequency and amplitude difference between any two selected points on the display. The marker is positioned on a first point. In response to a control button, a second marker is also provided at that point. This second marker image is then moved to the second measurement point. The difference in frequency and amplitude between these two relative positions is read out directly on the display screen itself.

The amplitude and frequency values at the marker position may be used to adjust various parameters in the machine. For example, the marker may be moved to a point on the display and that point may then be entered as a new center frequency, or it may become the amplitude reference level, or it may become the time interval for center frequency stepping, or using both markers, the interval between them may become the span-width for the entire display, i.e., the two marked positions become the start and stop frequencies.

In previous spectrum analyzers, it was difficult to select a particular portion of the displayed signal and then expand about that point as the center frequency. In the preferred embodiment, the marker may be positioned at any signal point, and using step-up and step-down keys, the frequency span-width about that point may be reduced or expanded.

To maintain the selected signal in the center of the display in previous spectrum analyzers, it was necessary to continuously tune the center frequency to coincide with the desired signal to be viewed as the center frequency. In the preferred embodiment, at the end of each scan, the marker may be positioned to coincide with the peak of the signal then being displayed. The frequency of this peak signal is then set to the center frequency, i.e., the center frequency is set to the value of the peak signal. This eliminates the need to reposition the marker as the scale is expanded since mirror inaccuracies in positioning the marker are corrected during each expansion of the display. Therefore, as the span is reduced, the signal will remain in the center of the display. Also, if the signal is drifting, this feature will maintain the signal on the screen despite the drift.

Prior spectrum analyzers using rotating controls such as potentiometers and other tuning knobs have typically had fixed sensitivities for changing the control parameter in response to a rotation of the same magnitude, since the sensitivity of these controls was usually designed to accommodate the medium range positions.

Therefore, the controls would be too sensitive to comfortably tune the lower bands and would move too slowly when tuning over larger bands. Prior spectrum analyzers have used multiple knobs or complicated clutch mechanisms with gear drives to overcome this problem. In contrast, the preferred embodiment; the sensitivity of the rotating control is controlled by the span-width selected, hence, regardless of the frequency range being displayed, a single rotation will still move the marker or other parameters being displayed the same distance across the display.

Previous spectrum analyzers used rotary controls having detent positions or continuously variable tuning. Each function on the spectrum analyzer was assigned either a detent rotary switch or a continuously variable switch. This had the disadvantage that this was not the optimum mode of entry for values for the most convenient way to enter values into the machine. In contrast in the preferred embodiment, a triple entry mode for data input is provided. Using this system, the parameter to be acted upon, e.g., the center frequency, frequency span, the start or stop frequency, etc. is selected, then the value is entered via a keyboard, step-up and step-down keys, or a rotary tuning control. This has the advantage that one may select the most convenient way to enter values for the mode he is operating in. The rotary knob is most useful when tuning or searching for a signal or specific frequency. The step-up and step-down keys are most convenient when one is progressing forward or backward through a limited set of even increments over a range. Of course, the keyboard is most useful for entering the desired value when the exact parameter is known.

In prior spectrum analyzers, if the input signal was preceded by a preamp, a down converter, an up converter, etc., it was necessary to calculate the actual frequency and amplitude for the signal of interest. In contrast the preferred embodiment provides enterable offsets whereby the frequency or amplitude levels can be offset a predetermined amount to calibrate them to take into account the presence of the intervening circuit element.

Also, previous spectrum analyzers were limited to entering a center frequency and span values. In contrast, the preferred embodiment enables the user to input a start and stop frequency and the center frequency and span are automatically determined. In addition, one may enter a new start or stop frequency to increase or decrease the span without having to calculate a center frequency for the band of interest.

In a spectrum analyzer with a digital display, i.e., where the display is produced in response to data representing a discrete number of sampled points, there is the problem that there may not be enough sample points to properly describe the analog signal. The real solutions would be to increase the sampling rate and the number of points displayed, but this is costly and not practical. Other solutions are compromises which sacrifice some information in order to preserve that information which is most useful for spectrum analysis. The preferred embodiment ensures the display of the most important parameter, i.e., correct signal amplitude. It is obtained from a peak detector which precedes the A/D converter. The peak detector holds the max. signal which occurs between samples for the A/D. After sampling the peak detector output, the peak detector is re-set to the input signal level. Thus, no signal peak is lost. Also, the preferred embodiment employs both a positive and negative peak detector circuit to allow a better presentation of signal noise, i.e., give an indication of the amplitude and frequency excursions in the noise signal.

BRIEF DESCRIPTION OF THE DRAWINGS

FIG. 1 is a simple block diagram of the preferred embodiment.

FIG. 2 shows the front panel controls of the preferred embodiment.

FIG. 3 illustrates a typical waveform display in the preferred embodiment.

FIG. 4 illustrates the waveform of the preferred embodiment with the marker in use.

FIG. 5 illustrates the amplitude and frequency difference readouts using the relative marker technique of the preferred embodiment.

FIGS. 6, 7 and 8 illustrate the display which is produced when a frequency or amplitude offset is used.

FIG. 9 illustrates the various active function readouts provided by the preferred embodiment.

FIG. 10 illiustrates the X and Y coordinate system used in the display of the preferred embodiment.

FIG. 11 illustrates the display waveforms present when all three traces available in the preferred embodiment are displayed simultaneously.

FIG. 12 is a block diagram of the sweep and refresh operations of the preferred embodiment.

FIG. 13 illustrates the use of the basic marker mode.

FIGS. 14A and 14B illustrate the reading of frequency and amplitude levels of displayed signals using the marker.

FIGS. 15A and 15B illustrate the differential marker technique of the preferred embodiment.

FIGS. 16A, 16B, 16C, 16D and 16E illustrate the marker zoom feature of the preferred embodiment.

FIGS. 17A and 17B illustrate an example of the automatic marker zoom feature of the preferred embodiment.

FIGS. 18A and 18B illustrate the use of the marker and the center frequency control to bring a signal of interest to the center of the display.

FIGS. 19A, 19B and 19C illustrate the changing of the center frequency by selecting start and stop frequencies using the markers.

FIGS. 19C, 19D and 19E illustrate the technique whereby the center frequency may be changed in increments equal to the frequency difference between the two marker positions.

FIG. 19F illustrates the use of the signal tracking feature of the preferred embodiment.

FIGS. 19F and 19G illustrate the signal tracking feature of the preferred embodiment.

FIG. 20 illustrates the relationship of FIGS. 20A and 20B.

FIGS. 20A and 20B taken together are a detailed block diagram of the preferred embodiment.

FIG. 21 illustrates the relationship of FIGS. 21A, 21B and 21C.

FIGS. 21A, 21B and 21C taken together are a circuit diagram of the front panel of the preferred embodiment.

FIG. 22 illustrates the relationship of FIGS. 22A, 22B, 22C, and 22D.

FIGS. 22A, 22B, 22C and 22D taken together illustrate the interface circuitry for the RF section to the processor 2015 of the preferred embodiment.

FIG. 23 is a schematic diagram of the 20 MHz reference circuit of the preferred embodiment.

FIG. 24 illustrates the relationship of FIGS. 24A and 24B.

FIGS. 24A and 24B taken together are a schematic diagram of the frequency control circuitry of the preferred embodiment.

FIG. 25 is a block diagram illustrating the relationship of the YTO, the YTO phase lock circuitry, and other circuits within the preferred embodiment.

FIG. 26 illustrates the relationship of FIGS. 26A and 26B.

FIGS. 26A and 26B taken together are a schematic diagram of the phase lock circuitry of the preferred embodiment.

FIG. 27 shows the relationshp of FIGS. 27A and 27B.

FIGS. 27A and 27B taken together are a schematic diagram of the RF converter circuitry of the preferred embodiment.

FIG. 28 is a schematic diagram of the second IF amplifier of the preferred embodiment.

FIG. 29 is a schematic diagram of the third converter circuitry of the preferred embodiment.

FIG. 30 is a schematic diagram of the pilot second IF amplifier of the preferred embodiment.

FIG. 31 is a schematic diagram of the pilot third converter circuitry of the preferred embodiment.

FIG. 32 shows the relationship of FIGS. 32A and 32B.

FIGS. 32A and 32B taken together are a schematic diagram of the 275 MHz phase lock circuitry of the preferred embodiment.

FIG. 33 is a schematic diagram of the 249 MHz phase lock oscillator of the preferred embodiment.

FIG. 34 shows the relationship of FIGS. 34A and 34B.

FIGS. 34A and 34B taken together are a schematic diagram of the 275 MHz phase lock oscillator of the preferred embodiment.

FIG. 35 shows the relationship of FIGS. 35A and 35B.

FIGS. 35A and 35B taken together are a schematic diagram of the 50 MHz voltage tuned oscillator of the preferred embodiment.

FIG. 36 shows the relationship of FIGS. 36A, 36B and 36C.

FIGS. 36A, 36B and 36C taken together are a schematic diagram of the frequency counter circuitry of the preferred embodiment.

FIG. 37 shows the relationship of FIGS. 37A and 37B.

FIGS. 37A and 37B taken together are a schematic diagram of the 249 MHz phase lock circuit of the preferred embodiment.

FIG. 38 shows the relationship of FIGS. 38A, 38B, 38C and 38D.

FIGS. 38A, 38B, 38C and 38D taken together are a schematic diagram of the processor used in the preferred embodiment.

FIG. 39 is a simplified block diagram of the processor used in the preferred embodiment.

FIG. 40 shows the relationship of FIGS. 40A, 40B and 40C.

FIGS. 40A, 40B and 40C taken together are a schematic diagram of the bandwidth filter circuitry of the preferred embodiment.

FIG. 41 shows the relationship of FIGS. 41A and 41B.

FIGS. 41A and 41B taken together are a schematic diagram of the IF control circuitry of the preferred embodiment.

FIG. 42 shows the relationship of FIGS. 42A and 42B.

FIGS. 42A and 42B taken together are a schematic diagram of the log amplifier and filter circuitry of the preferred embodiment.

FIG. 43 shows the relationship of FIGS. 43A and 43B.

FIGS. 43A and 43B taken together are a schematic diagram of the log amplifier and detector circuitry of the preferred embodiment.

FIG. 44 shows the relationship of FIGS. 44A and 44B.

FIGS. 44A and 44B taken together are a schematic diagram of the step gain circuitry of the preferred embodiment.

FIG. 45 shows the relationship of FIGS. 45A and 45B.

FIGS. 45A and 45B taken together are a schematic diagram of the 3 MHz bandwidth filter circuitry of the preferred embodiment.

FIG. 46 shows the relationship of FIGS. 46A and 46B.

FIGS. 46A and 46B taken together are a schematic diagram of the attenuator bandwidth filter circuitry of the preferred embodiment.

FIG. 47 is a schematic diagram of the down converter circuitry of the preferred embodiment.

FIG. 48 is a schematic diagram of the up converter circuitry of the preferred embodiment.

FIG. 49A is a block diagram of the video processing system of the preferred embodiment.

FIGS. 49B, 49C and 49D show the waveform improvement obtained using the video processing system of the preferred embodiment.

FIG. 50 shows the relationship of FIGS. 50A and 50B.

FIGS. 50A and 50B taken together are a schematic diagram of the video processor circuitry of the preferred embodiment.

FIGS. 51A and 51B taken together are a schematic diagram of the A/D converter circuitry of the preferred embodiment.

FIG. 52 shows the relationship of FIGS. 52A, 52B and 52C.

FIGS. 52A, 52B and 52C taken together are a schematic diagram of the track and hold circuitry of the preferred embodiment.

FIG. 53 shows the relationship of FIGS. 53A, 53B and 53C.

FIGS. 53A, 53B and 53C taken together are a schematic diagram of the data manipulator circuitry of the preferred embodiment.

FIG. 54 shows the relationship of FIGS. 54A, 54B and 54C.

FIGS. 54A, 54B and 54C taken together are a schematic diagram of the memory main control circuitry of the preferred embodiment.

FIG. 55 shows the relationship of FIGS. 55A and 55B.

FIGS. 55A and 55B taken together are a schematic diagram of the memory interface circuitry of the preferred embodiment.

FIG. 56 shows the relationship of FIGS. 56A, 56B and 56C.

FIGS. 56A, 56B and 56C taken together are a schematic diagram of the memory used in the preferred embodiment.

FIG. 57 shows the relationship of FIGS. 57A and 57B.

FIGS. 57A and 57B taken together are a schematic diagram of the line generator circuitry of the preferred embodiment.

FIG. 58 shows the relationship of FIGS. 58A and 58B.

FIG. 59 shows the relationship of FIGS. 59A and 59B.

FIGS. 58A, 58B, 59A and 59B taken together are a schematic diagram of the intensity control circuits of the preferred embodiment.

FIG. 60 shows the relationship of FIGS. 60A and 60B.

FIGS. 60A and 60B taken together are a schematic diagram of the sweep and video trigger circuits of the preferred embodiment.

FIG. 61 is a schematic diagram of the Y deflection amplifier of the preferred embodiment.

FIG. 62 is a schematic diagram of the X deflection amplifier of the preferred embodiment.

FIG. 63 is a schematic diagram of the status indicators and CRT controls of the preferred embodiment.

DESCRIPTION OF THE PREFERRED EMBODIMENT

Description of Basic Block Diagram

Figure 41B:
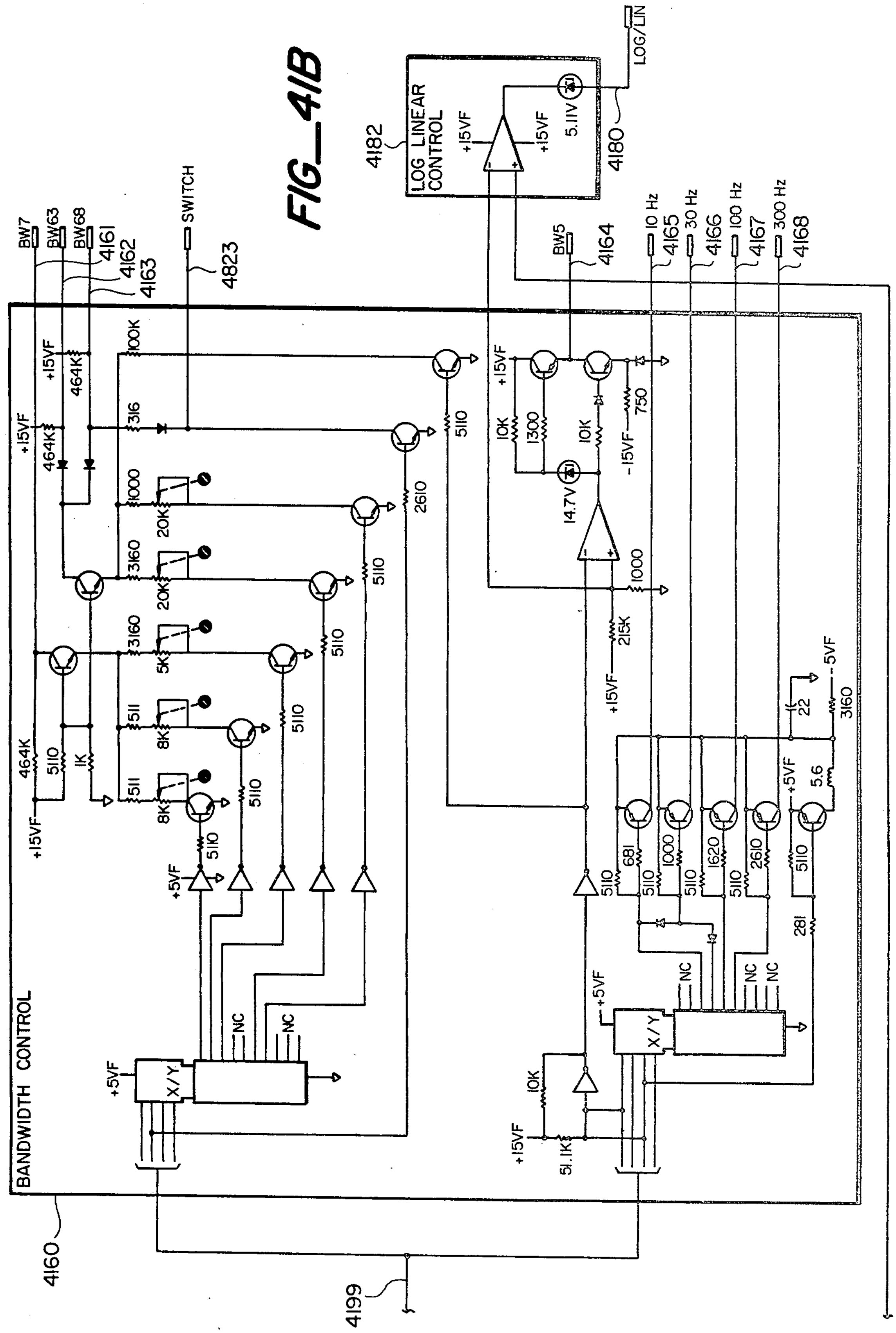

Referring to FIG. 1, there is shown a block diagram of the preferred embodiment. An input signal on line 102 is input to a mixer 104. The signal on line 102 is mixed with the output signals on line 106 from local oscillators 108 to produce intermediate frequency (IF) signals on line 105. These IF signals are then amplified and filtered by IF amplifiers 109. Local oscillators 108 are controlled by tuning control circuits 112 and scan control circuit 114. The output signals from IF amplifiers 109 are input to a detector 111 which generates a video signal on line 123. Under the control of video processor 125 and display controller 135, the output signal is digitized and stored in random access memory 140. The signal on line 115 from scanner 114 is used to determine the address where the digitized values are stored. Other data stored in memory 140 includes special trace constants, display annotations, the graticule, the display marker, and miscellaneous constants and values for other special functions.

The rate of acquisition of the data is controlled by the ramp time of the signal produced by scanner 114. Each ramp is logically divided into 1,000 intervals corresponding to the 1,000 addresses. Likewise, the display screen is divided into 1,000 steps from left to right, each address being one point on the display screen.

The display of the data occurs at a rate determined by display controller 135. Under control of the display controller 135, the data is read out of memory 140 to D to A converter 150 which provides an analog level input to line generator 155 whose output is then coupled to the Y plates on CRT 175. At the same time that display controller 135 is reading the vertical data from memory 140, the horizontal corresponding to the address from which the data came is generated by D to A 160 and output to line generator 165 which is coupled to the X or horizontal plates of CRT 175.

Special display features and input data from front panel 210 are provided over a bus 190. This transfer of data from the front panel 210 to display controller 135 is under the control of the main control processor 250 which has its own ROM 251 and RAM 252 memories.

Activation of keys on front panel 210 which is shown more fully in FIGS. 2 and 63 are serviced by an interrupt type routine which interrogates the front panel to determine what operations have been selected. Once the operation which is selected has been determined, a microprogram corresponding to the operation selected and stored in ROM 251 is executed to perform that operation. Typically, this involves the transfer of data from the main processor to the display controller 135 which operates as a "slave" controller. Slave or display controller 135 then performs the necessary calculations or manipulation of data stored in memory 140 to change the display.

DESCRIPTION OF THE FRONT PANEL CONTROLS

Referring now to FIG. 2, there is shown the front panel controls of the preferred embodiment. Using the front panel controls shown, the user has convenient control over functions such as center frequency, frequency span, reference level, resolution bandwidth, and sweep time. For example, center frequency is controlled by a switch 260, frequency span is controlled by a switch 262, the start frequency is controlled by a switch 264, the stop frequency is controlled by a switch 266, and the reference level is controlled by a switch 268. Once a function is selected, its value can be changed by using the data control keys 314, 318, 310 and 300. For example, using data keyboard 300, one can enter an exact digital value. Using rotary control 310, one has continuous tuning capability. While using switches 314 and 318, one may change the value of the active function in steps. The changes in values and conditions which are input will also immediately cause the appropriate change in the displayed waveform on display 400.

Basically, the front panel controls are divided into two groups, i.e., function controls and data controls. The type of measurement of the signals input via channels 425 may be selected using the function controls. The data controls and the other miscellaneous functions provided add to the measurement efficiency, convenience and capability of the instrument.

To measure the frequency and amplitude of a signal input via input controls 425, the signal is first moved to the center of display 400 by pressing center frequency control 260 and then rotating rotary control 310 until the part of the signal waveform which is desired to be measured is centered in the display. When the signal is centered, the readout on display 400 will automatically display the signal frequency at positions 451 and 452 as shown in FIG. 3.

For better frequency resolution the frequency span of the display may be narrowed by pressing frequency span control 262 and then pressing step down control 314. The new span value would be displayed in position 453 as shown in FIG. 3. The signal peak would then be brought to the reference level by activating reference level switch 268, control 314 and then adjusting rotary control 310.

The most convenient place to start a new measurement is with a full 1500 MHz frequency span. This is most easily accomplished by pressing instrument preset control 230. This automatically presets all the analyzer functions to a 0 Hz to 1500 MHz display with a 0 dBm reference level. In this way, the entire 1500 MHz span possible with the preferred embodiment may be viewed to facilitate selection of the particular frequency range to investigate.

Signal frequencies and amplitudes as well as differences between various signals can be read out directly using the marker controls 380 and the various data controls described above. The marker is activated by pressing marker normal switch 381. The rotary control knob 310 is then used to position the marker 410 as shown in FIG. 4. The amplitude and frequency of the signal at the marker position are read out continuously at position 412. Therefore, as one moves the marker along the signal waveform by moving rotary control 310, the MHz and dBm displays are continuously updated.

Using this feature of the preferred embodiment it is possible to measure the differences between any two points on the displayed waveform. For example, if the marker was at position 410 and one measured the difference between the marker position 410 as shown in FIG. 4 and the next signal peak, 411, one would press marker control button 382 and use rotary control 310 to move the second marker to peak 411. The amplitude and frequency differences are then read out continuously in position 415 as shown in FIG. 5. More measurement techniques using the marker are discussed in more detail below.

The data controls are used to both enter and change function values for the selected function. Rotary control 310 and the data step keys 314 and 318 are used to make incremental changes to the value of the activated function. To the right of the function keys 390 is the data keyboard 300 which allows the stored value to be changed or an exact value input. Furthermore, these data controls change the activated function value in a manner which depends on the specific function selected and the current value of that function. For example, if the center frequency function has been selected by center frequency switch 260, the center frequency can be changed continuously with rotary control 310 or in steps proportional to the frequency span with the data step keys 314 and 318, or set exactly with the data number units keyboard 300. Resolution bandwidth can be set only to discrete values. An entry from the keyboard which may not coincide with an allowable bandwidth will select the nearest bandwidth. All data entries are displayed on the CRT as they are changed.

If it is desired to prevent data entry, the function can be deactivated by pressing hold switch 320. The active function readout is then blanked and the enabled light 321 goes out, indicating that no data entry can be made. The reenabling of the data controls is accomplished by pressing any function key.

Rotary data control 310 allows the continuous change of center frequency, frequency span, reference level, and the positions of the marker, display line and threshhold. It can also change the function values which are only incremented. Clockwise rotation of the rotary control 310 will increase the functional value. For continuous changes, the sensitivity of rotary control 310 is determined by both the measurement range and the speed at which the knob is turned. For example, when the center frequency is activated, control knob 310 increases the value of the center frequency one horizontal division of span per one quarter turn.

Data step keys 314 and 318 allow rapid increase or decrease of the active function value. The step size is dependent either upon the analyzers measurements range, a preset amount, or, for those parameters with fixed values, the next value in a sequence. For example, if center frequency control 260 has been activated, step control 318 will increase the center frequency value by an amount equal to one division of the frequency span, i.e., 1/10 of the frequency span. If the center frequency step size has been preset using control 228, step control 318 will increase the center frequency by that preset amount. If the frequency span function was selected using control 262, step control 314 would change the span to the next lower value in predetermined sequence. If the center frequency is selected, each press of these step buttons results in a single step up or down of the center frequency value equal to the preselected value of 10% or to a preselected step value which has been stored using control 228.

The data keyboard 300 allows exact value entries to center frequency, frequency span, reference level, log scale and the positions of the markers, the display line, threshhold and the coupled functions. Coupled functions are those in which selection of one parameter will automatically select certain values for other parameters. This operation occurs whenever machine is in the auto mode as selected by controls 210, 214, 218, 222 and 226. This function can be disabled by placing these controls in the manual position. Function control 268 changes the absolute amplitude level of the top graticule line. The amplitude scale, i.e., the number of amplitude units per division is entered from the scale control group 225. Signal responses below the top graticule are measured by bringing the response to the reference level by activating switch 268. The maximum reference level value available is dependent on the input attenuator setting. Levels to the input mixer which could cause gain compression will be displayed off the top of the reference level graticule. The maximum reference level limit can be extended by activating shift control switch 410 and attenuate control switch 223. The reference level can be changed from +30 dBm to −99.9 dBm in 0.1 dB steps. Reference level dBm units are selected by instrument preset control 230 or with key function shift control 410. Reference level units may be read in dBmV, dBuV and volts. Of course, when a unit change is made, all readouts are converted so as to preserve the absolute power levels of all the readouts on the display.

The display readout of frequency and amplitude can be offset by values entered through using shift control key 410. The offset values are read out on the display. An offset frequency is entered by pressing shift control key 410, center frequency key 260 and then inputting the desired value via the data entry controls. An amplitude offset is entered by pressing shift control key 410, reference level control 268, and then inputting the desired amplitude offset via the data entry controls, i.e., keyboard 300. The amplitude offset can be used to take into effect external R.F. attenuation or gain in the reference level reading so that the signal level measured is the level at the input of the amplitude conversion device which is interposed between the spectrum analyzer and the signal source. For example, frequency offsets can be input such that when the spectrum analyzer of the preferred embodiment is used following a down converter, the frequency parameters can be entered and read out in actual, i.e., high frequency values. In the reverse situation, when an external preamplifier is used, its gain or loss may be taken into account to display the true signal level of the signal of interest before the preamplifier stage. Frequency offset is entered by activating shift control 410 followed by center frequency 260, and then inputting the desired frequency offset via data entry controls 300, 310, 314 and 318. This frequency offset may be used, for example, to provide a base band frequency display scale for a signal which has been converted up or down. Amplitude offset is entered by activating shift key 410 followed by reference level control 268 and then inputting the desired amplitude offset via data keyboard 300, rotary control 310 and/or step control keys 314 and 318. This amplitude offset can be used to take into effect external R.F. attenuation or gain in the reference level reading so that the signal measurement corresponds to the level at the input of the amplitude conversion device.

To eliminate a frequency offset, one simply activates shift control 410, followed by center frequency control 260, and then inputs a data offset value of zero. Also, any frequency or amplitude offset can be eliminated by pressing instrument preset control 230. The frequency or amplitude offset is added to all the frequency or amplitude readouts, respectively, on the CRT display including the marker, the display line, threshhold, and the start frequency and stop frequency values which are displayed.

Data entry from the keyboard may be in Hz, kHz, MHz or GHz for frequency and dBm, −dBm, mV and uV for amplitude. The amplitude offset readout is always in dB. An entry in voltage can be made and will be converted to dB offset. Least significant digits are rounded for frequency inputs and dropped for amplitude offset entries. An example of the display which is produced when a frequency or amplitude offset is used in the preferred embodiment is shown in FIG. 6. Note that the amplitude offset is displayed in position 610 while the frequency offset is displayed in positions 611 and 612.

For example, assume that a 102.6 MHz up converter with 12.7 dB attenuation is placed between a signal source and the preferred embodiment. The offsets can be set so that the CRT display shows the trace reference to the signal as input to the converter. Amplitude offset is entered as a positive value since the amplitude readout must represent a more powerful signal. To enter the offset value in this example, one would press shift control key 410, reference level control 268 and enter 12.7 on data entry keyboard 300 followed by +dBm units key 601. The offset is displayed in position 610 as shown in FIG. 7.

Frequency offset is entered as a negative, since the input to the converter is lower than the value displayed. To enter a frequency offset one would press shift control key 410, followed by hold key 320, followed by center frequency control 390, and then input 102.6 on data entry keyboard 300, followed by MHz units key 602. The frequency offset would be displayed in position 618 on the display and the new value for the center frequency would be displayed in position 619, as shown in FIG. 8.

Referring now to FIG. 9 there is shown the display of the preferred embodiment. The entire frequency span being analyzed is displayed across the horizontal width of the display, the start frequency occurring at the left-most edge 905 of the display while the stop frequency occurs at the right-most edge 907 of the display. The center frequency is represented by the center vertical line 911 in the middle of the display. Various function readouts are provided to help interpret the waveform 915 which is being displayed. For example, the reference level is displayed in position 917. Marker frequency and amplitude are displayed in position 922 whenever a marker option is selected. Sweep time is displayed in position 925. The start frequency or the center frequency are displayed in position 927, depending upon which function is active, while the stop frequency or frequency span is displayed in position 929, depending upon which function has been selected.

There is also an active function readout for the function which is under current data control. In FIG. 9, the start frequency has been selected to be changed via keyboard 300, rotary control 310 or step control buttons 314 and 318. Therefore, the word start is displayed in position 931. The start frequency was selected by start frequency control switch 264. Similarly, if the center frequency control 260, reference level control 268, stop frequency 266 or frequency span 262 were selected, the display would so indicated in position 931. If the marker functions 380 were selected, the marker frequency and amplitude would be displayed in this position. This display of the frequency and/or amplitude will change dynamically with the manipulation of the data controls.

The full scale sweep speed is indicated in position 925. The video bandwidth is displayed in position 935. The resolution bandwidth is displayed in position 936. The RF attenuation is displayed in position 940 while if the measurement is uncalibrated, this will be indicated in position 945. The threshhold level is displayed in position 950, while the display line parameters are displayed in position 951 and the amplitude offset value is displayed in position 952. It should be noted that the displayed parameters shown in FIG. 9 are not necessarily always displayed together. For example, the measurement uncalibrated message shown in position 945 would only be present if the measurement were uncalibrated. Furthermore, the active function and value in position 931 would depend upon the function selected by the function control keys 390.

Display Traces

Three separate traces referred to as Trace A, Trace B and Trace C can be written onto the display. Each trace is generated from 1,001 points across the graticule, connected by 1,000 point-to-point straight line vectors. The location of each point is designated by an X and a Y location using the graticule as a system of rectangular coordinates. This may be more clearly shown in FIG. 10. In addition, a trace overrange area which is also calibrated is provided which comprises an additional 23 display units above the top reference level graticule.

Trace controls 1,000 as shown in FIG. 2, may be used for controlling the writing, storing and manipulating of trace data. The three different traces are differentiated by their intensity. Trace A is bright, while Trace B and Trace C are comparatively dimmer. However, when there is any doubt, the specific trace can be isolated using view control 1010, blank control 1011, view control 1012 and blank control 1013.

Four mutually exclusive trace modes for Traces A and B determine the manner in which the traces are displayed. Indicator lights such as indicator 1003 indicate the current trace mode. Clear-Write control 1001 causes the display of the input signal response in Trace A. Max hold control 1002 causes the display and holding of the maximum responses of the input signal in Trace A. Both these controls are referred to as write mode controls, since they deal with the trace during a sweeping operation.

Store mode controls such as view control 1010 and blank control 1011 act on the trace information when the preferred embodiment is not in the sweeping mode. The view controls such as view control 1010 causes the storing of the current trace information in memory and displays it on the CRT. The blank controls such as blank control 1011 causes the storing of the current trace information and blanks it from the CRT display. An illustration of the display when all three traces are present is shown in FIG. 11.

Trace Memory

Display traces are not written onto the display directly from the spectrum analyzers IF section. Instead, the analog signal response from the IF section is converted into digital words and stored in a trace memory. The contents of these trace memories is then used to create the display on the CRT display. The way in which this information in the trace memories is displayed depends upon the trace mode selected by trace controls 1,000. A block diagram showing these steps is shown in FIG. 12. The analyzers response is transferred into the trace memories at the sweep rate of the analyzer, i.e., its sweep time. The trace memory is then written onto the display at a refresh rate of about 50 Hz, rapid enough to prevent flickering of the trace on the CRT display. This refresh rate remains constant and therefore, the trace intensities also remain constant, regardless of how the sweep times of the spectrum analyzer are changed. Note that in the specification the word sweep refers to the spectrum analyzer sweeping from a start frequency to a stop frequency while the term refresh refers to the transfer of display memory data to the display.

For the write modes, those selected using the clear write and max hold controls 1001, 1002, 1008 and 1009, the analyzer signal response is written into trace memory during the sweep and the memory contents are then immediately displayed on the CRT. When first activated, the clear write controls of the 1001 and 1008 sets all the values in their respective trace memory to zero, i.e., the trace will sweep along the bottom line graticule if no data is input to the memory. The max hold controls 1002 and 1009 cause the latest analyzer signal response to be written into its respective trace memory only at those data words that correspond to the horizontal positions where the latest signal response is greater than the previously stored signal response values. When both clear write controls 1001 and 1008 are activated, the preferred embodiment will sweep and alternately write into trace memories A and B. Using the store mode controls 1010, 1011, 1012 and 1013, the previous memory data is saved, and no updating of the trace memory is made. The view controls 1010 and 1012 cause the trace data stored in their respective memories to be displayed on the CRT. Blank controls 1011 and 1013 cause the trace data not to be displayed on the CRT.

Marker

There are two basic types of functions which are possible using the marker. Marker modes under the control of controls 381, 382, 383, 384, 385 and 386 are used to enable or disable the markers and their related functions. Marker entry controls 387, 388, 389 and 379 are used to allow the scaling of the display frequency and amplitude using the marker information.

The term markers is used in the preferred embodiment to refer to bright spots which are created directly on the display trace. The horizontal position of an activated marker is controlled by the data controls, i.e., keyboard 300, rotary control 310 and step keys 314 and 318. Using these controls, the marker can be positioned at a specific frequency with the data keyboard moved along the trace using rotary control 310 or caused to move along the trace in predetermined intervals using the step control keys 314 and 318. The readout of the marker amplitude and frequency, i.e., the amplitude and frequency of the trace where the marker is currently located, appears in the upper right of the display outside the graticule. This is as shown in FIG. 13 in position 1301.

When a marker mode is active through the use of controls 381, 382, 383, 384 and 385, the amplitude and frequency will also be displayed in the active function area of the graticule, that is, position 931.

Briefly, the marker controls operate as follows: Control 386 is used to turn the marker function on and off. Normal control 381 causes the direct readout of the amplitude and frequency of the point where the marker is along the trace. To cause the direct readout of the amplitude and frequency differences between two points on the trace, one activates control 382. The present position of the marker on the trace when this control is activated then becomes the reference point for subsequent measurements as the marker is moved along the trace.

An activated marker mode can be deactivated by activating another function such as display line or by data hold control 320. This does not erase the marker itself, nor does it suspend the upper right display readout features. When the marker mode is reactivated, the data controls and active function readouts will simply continue from their last position.

Normal control 381 activates a single marker at the center of the display on the trace of highest priority if multiple traces are being displayed. Trace priority is defined in greater detail below. Once the marker is displayed on the trace, it may be moved along the trace by using the data entry controls 310, 314, 318 and the data entry keyboard 300. Rotation of rotary control 310 moves the marker continuously along the displayed trace at about five horizontal divisions for each full turn. The marker appears to move smoothly along the trace, but it is actually moving in the smallest display unit increments which in the preferred embodiment are 1,000 units for the full horizontal span. Step controls 314 and 318 move the marker along the trace one-tenth of the total width per step. In the preferred embodiment, step control 314 moves the marker to the left while step control 318 moves the marker to the right. For exact positioning of the marker, values entered via keyboard 300 will cause the marker to be placed at the frequency entered. If one enters a frequency which is out of range of the displayed span, the marker will be placed at the graticule edge.

The marker greatly simplifies reading the frequencies and amplitudes of displayed signals. This is explained with respect to FIGS. 14A and 14B. For a given display, the single marker is activated by pressing normal control 381. This causes the frequency and amplitude information to be read out in display areas 1402 and 1403. Assume, for example, that one was interested in determining the frequency and amplitude of the signal peaks 1404 and 1405. To read the frequency and amplitude values at peak 1405, one would move rotary control 310 to move the marker along the waveform unit it was positioned at signal peak 1405 as shown in FIG. 14A. To read the information for signal peak 1404, one would move the rotary control 310 counter-clockwise until the marker 1400 was positioned at peak 1404 on waveform 1410. The frequency and amplitude information is read out continuously as the marker is moved. Therefore, as the marker is moved towards the peak, one can be sure when the peak is reached because it will be the highest amplitude displayed in display areas 1402 and 1403. As one moves the marker to either side of the peak of the signal waveform of interest, the amplitude reading would decrease. Thus, exact positioning of the marker is possible.

The differential marker technique using control 382 may be used to measure differences in frequency and amplitude between two points on the signal waveform. Activating control 382 causes a second marker to be generated at the position of the single marker already on the trace. If no single marker has been activated, control 382 will cause two markers to be generated at the center of the display. The first markers position is fixed. The second markers position, however, may be changed using the data controls 310, 314, 318 and keyboard 300. As the second marker is moved along the waveform, the first marker now stationary is used as a reference point. As the second marker is moved along the trace, the difference in frequency and amplitude between that markers position and the reference marker will be displayed in positions 1402 and 1403. As example showing the use of this differential marker technique is shown with respect to FIGS. 15A and 15B.

Referring now to FIG. 15A, assume that one is interested in determining the frequency and amplitude differential between the signal peak 1502 and the signal peak 1503. First, the marker would be set on one of the signal peaks, e.g., signal peak 1502 as shown, by using rotary control 310. Control 382 would then be activated to generate a second marker at this position.

Rotary control 310 would then be moved in the clockwise direction to move the second marker to peak 1503. The differences in the frequency and amplitude at the two signal peaks will then be read directly on the marker display in position 1402. In the example shown in FIG. 15B, the frequency difference is 7.67 MHz and −34.60 dB. As the marker is moved, the display in position 1402 changes dynamically. In this way, one can be sure that one is positioned at the very peak of the signal waveform at point 1503, since it will be the smallest differential displayed as one crosses the peak at point 1503.

Marker Zoom

Control 383 activates a single marker on the trace of highest priority. When the zoom mode is selected by control 383, rotary control 310 and step control keys 314 and 318 change the values of different functions. Rotary control 310 is used to position the marker along the signal waveform. Step controls 314 and 318, however, change the frequency span displayed by the spectrum analyzer and cause the frequency at the current marker position to become the new center frequency for the display. Thus, one moves the marker along the trace with rotary control 310 until a portion of the display is reached which is desired to be the new center frequency. Also, one may press zoom control 383 and then enter in an exact frequency via data keyboard 300. This will cause the marker to be positioned at the exact frequency on the display waveform. If that frequency is not on the display waveform, then the marker will be positioned at the graticule border.

For example, in wide frequency spans, it is often necessary to expand a portion of the frequency span about a specific signal in order to resolve questions regarding modulation sidebands or frequency drift. The use of the marker zoom feature to facilitate the display of the desired waveform and the desired frequency span is shown below with reference to FIGS. 16A, 16B, 16C, 16D and 16E.

Referring now to FIG. 16A there is shown a full span display from zero to 1500 MHz. A specific signal of interest is selected by activating zoom control 383 and using rotary control 310 to position the marker at a waveform peak 1601. To center the marker and the signal peak in the display and also expand the frequency span in one step, one would simply press step control 314 to achieve the display shown in FIG. 16B. For further expansion of the display about this signal, one could simply press step control 314 twice more to achieve the display shown in FIG. 16C. The marker could then be more accurately positioned at the signal peak using rotary control 310 to achieve the display shown in FIG. 16D. This recentering and expanding can be continued until the desired display is achieved. For example, one could continue expanding the display using step control 314 and recentering the marker using rotary control 310 until the display as shown in FIG. 16E was achieved. Note that the frequency span in FIG. 16E is from 257.39 MHz to 262.39 MHz with a center frequency at 259.890 MHz. As with the other marker functions, the marker mode may be disabled using control 386 which will also cause the marker readout to be blanked from the CRT display.

Automatic Zoom

The preferred embodiment can automatically zoom in on a signal peak specified by a marker. The desired frequency span can be directly input via keyboard 300. To use this automatic zoom function of the preferred embodiment, one would press normal marker control 381 and position rotary control 310 to identify the signal to be zoomed in upon. Then one would press signal track control 385 followed by span control 262 and then the desired frequency span would be entered via data keyboard 300. When the selected units key, e.g., key 601, 602, 603 or 604, is activated, the zooming process will begin.

Referring now to FIG. 17A and 17B, there is shown an example using the zooming process. Assume that a single carrier needs to be examined in a 200 KHz span in order to see the side bands present. A marker would be placed on the carrier of interest by pressing normal control 381 and positioning the marker using rotary control 310. One would then press signal track control 385 followed by frequency span control 262. The value of the desired frequency span would be entered via keyboard 300 by pressing digit keys 2,0,0, and the units key for KHz. The auto zoom process would then be completed and a display as shown in FIG. 17B would be displayed.

Peak Search

Activation of peak search control 387 places a single marker at the highest trace position of the highest priority trace. The active function is not changed. Using this control, one may place the marker at the peak of the signal response without using any of the other controls. The marker seeks the maximum trace response.

Marker Entry

Marker to center frequency control 388, marker to reference level control 379 and marker delta control 389 are used to immediately set the corresponding function value equal to the readout of the active marker or markers. When one presses control 388, the frequency at the current position of the marker automatically becomes the center frequency. Similarly pressing marker to reference level control 379 causes the amplitude at the current marker position to become the reference level value. Also, one may use the marker delta control 382 to place a second marker on the screen. Thereafter, control 389 may be used to cause the step size affected by step control 314 and 318 to be equal to the difference between the two marker positions.

One of the fastest and most convenient ways to bring a signal of interest to the center of the display as the center frequency is by using control 388. One simply activates a single marker by, e.g., control 381 and brings it to the desired signal using rotary control 310 or peak search control 387 if it is the largest signal displayed. The signal frequency where the marker is positioned may then become the center frequency by simply pressing control 388. The display before and after pressing of control 388 is shown with reference to FIGS. 18A and 18B, respectively. A single marker is activated and brought to the desired signal point by pressing control 381 to activate a single marker and then using rotary control 310 to bring it to the desired signal point, for example, as shown in FIG. 18A. Note that if this signal point is also the highest trace position on the highest priority trace, peak search control 387 may be used to place the marker at this position. Once a marker is positioned, the center frequency may be changed to the marker frequency by simply pressing control 388.

Control 388 may also be used to change the center frequency if start and stop frequencies are read out. In this way, the markers may be used to tune to a particular portion of a spectrum being displayed. This is shown with respect to FIGS. 19A, 19B, and 19C. A single marker is activated and placed at either end of the desired frequency span using control 381 and rotary control 310. For example, at point 1901 as shown in FIG. 19A, a second marker is activated using control 382 and positioned using rotary control 310. The start and stop frequencies for the displayed frequency span may then be set equal to the left and right marker frequencies, respectively, by shift control key 410 followed by control 382. The frequency difference between the two marker positions then automatically becomes the frequency span for the display.

The data step keys 314 and 318 can also be used to move the center frequency in increments equal to the marker or marker differential frequency. This is illustrated with respect to FIGS. 19C, 19D and 19E wherein there is shown a technique for viewing a fundamental and its harmonics or any other evenly spaced portion of the spectrum with high resolution. First, one would narrow the frequency span displayed about the fundamental frequency of interest as necessary using zoom control 383 as described above, centering the carrier frequency as needed. One then sets the center frequency step size by positioning the markers and pressing control 389. The center frequency is now enabled by pressing control 390. Therefore, with each press of step control key 318, successive harmonics will be displayed. For example, as shown in FIGS. 19D and 19E, the first activation of step control key 318 would show the second harmonic, the next press of step control key 318 would give the third harmonic, and so on. Similar stepping can be accomplished using the marker controls 382 and 389 and step control keys 314 and 318 to locate intermodulation products or other evenly spaced signals such as communication channels.

Signal Tracking Using Automatic Frequency Control

The preferred embodiment is capable of automatically maintaining a drifting signal at the center of the display. This allows narrow band measurements to be made on unlocked oscillators by having the spectrum analyzer track the input signal and allows other measurements which were heretofore extremely difficult.

To operate the signal tracking feature of the preferred embodiment, one would press normal control 381 and place the marker on the signal to be tracked with rotary control 310. Signal track control 385 is then pressed to initiate the tracking operation. As the signal drifts, the center frequency will automatically change to bring the signal and the marker to the center of the display. Marker off control 386 or activation of any other marker mode or instrument preset control 230 will disable the tracking function.

As an example of the use of this feature, there is shown in FIG. 19F a signal of interest. The upper sideband of the transmitter is to be monitored as the carrier frequency is tuned. Therefore, the marker is activated using normal control 381 and positioned using rotary control 310 at the peak of the upper sideband signal 2105. Once signal track control 385 is pressed, the upper carrier sideband 2105 is tracked and may be "zoomed" in to produce the display of FIG. 19G by pressing frequency span control 262 followed by digit keys 1 and 0 and units KHz key 603. As the carrier frequency changes, the sideband response will remain in the center of the display. The center frequency and marker frequency readouts on the display in positions 2120 and 2130, respectively, will read out the sideband's frequency. Therefore, a combination of the features of the preferred embodiment activated by a signal track control 385 and marker control 382 allows the real time signal frequency drift to be read on the display.

Detailed Block Diagram

The detailed circuitry of the preferred embodiment will now be discussed in more detail. Referring first to FIGS. 20A and 20B, there is shown a detailed block diagram of the preferred embodiment. FIG. 20A is primarily a block diagram of the RF section, while FIG. 20B is primarily a block diagram of the IF and display section of the preferred embodiment. Much of the interaction of the circuitry of the preferred embodiment is controlled by a processor 2015 which is described later in more detail. This processor operates under the control of microprograms which are stored in a memory 2014. Operator commands are input via the front panel 2020. The signal to be analyzed is input on line 425 through the front panel controls to the RF converter 2023. There it is converted using the 20 MHz reference signal provided on line 2017 from 20 MHz reference 2016 or from the frequency control unit 2022. Signal thus produced is thereafter processed by IF amplifiers 2019 or 2009 and converters 202 and 2010. Pilot third local oscillator 2007 produces the precise frequency in the range 238.5 MHz to 259.5 MHz that will allow the preferred embodiment to be tuned to frequencies between the 20 MHz reference combs. This processing results in the providing of a signal on line 2040 to the IF and display sections for further processing and an IF counter output signal on line 2042 as well as sweep signals on line 2044 and 2046 to the video processor 2060 and the track and hold circuitry 2065. Various filters and converters in the circuit 2050 act with IF control 2055, data manipulator and memory control 2058 to cause the digital representations of the sampled signal to be stored in memory 2070. Data manipulator and control circuit 2058 along with trigger circuitry 2072 determine the sweep rate and the trigger level. Representations of the analyzed signal are then displayed on cathode ray tube 2078.

Each one of these circuits shown in FIGS. 20A and 20B is described in more detail with respect to the detailed schematic diagrams and the description below. The numbers in each block refer to the detailed schematic diagrams for the circuitry used in the preferred embodiment to perform the functions of that block.

Referring now to FIGS. 21A, 21B and 21C, there is shown the circuitry of the front panel of the preferred embodiment. In this schematic, various front panel push-button keys, switches, and indicator LEDs as well as the input terminals 425 for the signal to be analyzed are shown. Other switch circuitry is shown in FIG. 63. The input select circuit 2102 includes two push-button switches, each with an LED in its center, i.e., switches 2104 and 2105. When switch 2105 is energized, input relay 2110 selects the input through the DC input connector 2112 for frequencies from 100 Hz to 1.5 GHz. Activation of switch 2104 selects the input through the blocking capacitor 2111 for frequencies from 100 KHz to 1.5 GHz.

Referring now to FIGS. 22A, 22B, 22C and 22D, there is shown the interface circuitry for the RF section to the processor 2015 shown in FIG. 20A and to the front panel controls. The keyboard is organized as a matrix of rows and columns of normally open single pole, single throw switches. This keyboard matrix 2210 includes drivers 2212 and 2214 for driving the rows of the matrix while drivers 2206 and 2208 gate the columns of the matrix onto the data bus. The processor determines which key has been activated by selectively polling the rows and columns through drivers 2206, 2208, 2212 and 2214 and causing them to be selectively read onto the data bus 2200.

The fact that a key has been pressed is determined by gate 2215. The circuit which includes transistor 2216 is used to de-bounce the key switch circuitry. Flip-flop 2213 latches when a key is pressed and is cleared later by the processor.

The instrument preset key generates the signal on line 2220 which presets various circuitry in the preferred embodiment. Also, the instrument preset signal on line 2220 causes the main processor to restart program execution at memory address 32. Service request circuitry 2230 encodes the various requests for service made by the Front Panel circuitry to the main processor 2015. For example, a signal on line 2231 is generated whenever the keyboard requires servicing, i.e., a key has been depressed. Similarly, the rotary pulse generator generates a request by providing a signal on line 2232. These requests are encoded by encoder 2236 and gated onto the data bus 2200 via gates 2238. Gates 2245A, 2245B, 2245C, 2245D detect any change in the signals HINT and LRMT on lines 2247 and 2248. Flip-flop 2249 is latched in response to detection of a change in their state. Transistor 2251 pulls the signal HSWP on line 2252 low whenever a request is pending. Whenever the signal HSWP drops to a low level, the flip-flop 2254 will be latched. Gates 2238 gate the encoded request onto data bus 2200. Gates 2238 also gate LHBZ, LZBZ and HINT onto the bus.

Rotary pulse generator circuit 2259 receives signals RPG1 and RPG2 on lines 2261 and 2262. From these two signals, the RPG circuit 2259 determines whether it should increment or decrement and the rate at which the incrementing or decrementing is to be done. For further description of this type of circuitry, refer to U.S. Pat. No. 4,016,432 issued on Apr. 5, 1977 to Michael S. Marzalek and entitled "Variable Rate Rotary Pulse Generator". The rotary pulse generator is coupled to the rotary control 310 on the front panel as shown in FIG. 2. Note that circuit 2263 provides a hold-off of about 70 milliseconds which prevents flip-flop 2265 from requesting a service request due to the rotation of rotary control 310 for that time period. This gives the preferred embodiment time to respond to the last service request from the rotary pulse generator and to continue or finish a sweep before the next request occurs. This enables the operator to have received visual feedback from the last manipulation of rotary control 310 before another input is acted upon.

Referring now to FIG. 22D, address decoder circuit 2285 decodes the address lines and enables the appropriate circuits to gate or store data onto data bus 2200. In FIG. 22C, phase-lock flag circuit 2280 provides signals or "flags" which indicate the presence or absence of certain preselected conditions in the preferred embodiment. The states of these flags are stored in register 2282 and may be read out onto data bus 2200 when desired through the enabling of the appropriate address decoder signal on a line 2283. Front panel LED drive circuit 2268 latches the state of the front panel LEDs (light emitting diodes) and sinks the current to light them. The signal LIPS clears these registers and causes the lighting of the LEDs anytime the instrument preset key 230 is pressed. RF attenuator drive circuit 2270 comprises register 2271 which latches the state of the RF attenuator at the input relay. Transistors 2272 and 2273 drive the input relay while transistors 2274A-E drive the RF attenuator. The bridge rectifiers 2275A, 2275B and 2275C act as transient suppressors for the RF attenuator solenoids.

Referring now to FIG. 23, there is shown the 20 MHz reference circuit of the preferred embodiment. A 10 MHz signal from a frequency standard is input via line 2302 and processed to provide 20 MHz reference signals to the front panel, the YIG-tuned oscillator phase-lock shown in FIG. 26, the 249 MHz phase-lock shown in FIG. 37, and the comb generator shown in FIG. 27A. During internal time base operation of the instrument, a 10 MHz signal is applied to doubler 2310 from time base circuit 2081. This signal is split by the resistor network 2311. Power is applied to the clock generator circuit 2320 and to the doubler buffer amplifier 2313. The 10 MHz signal input to the doubler is amplified by buffer 2313 and used to drive transistor amplifier 2315 through the impedance matching network comprising capacitor 2314 and inductor 2317. The output pulse produced from transistor 2315 is coupled into the 20 MHz resonator transformer 2316 and capacitor 2318 to produce the 20 MHz output signal on line 2319. The time base signal input on line 2302 is input to the clock generator circuit 2320 which provides a processor clock signal on line 2322 and a counter clock signal on line 2324.

The signal on line 2319 is input to crystal filter circuitry 2330 where it drives the emitter-follower circuit comprising transistor 2332 which in turn provides a low output impedance driver for the crystal filter. Center frequency adjustment 2334 is available to vary the center frequency of the filter. The filtered signal is amplified by the amplifier circuit comprising transistor 2335. Inductor 2336 and capacitor 2337 are used to match the impedance of PIN diode 2338. The current through the PIN diode 2338 sets the attenuation for the desired comb drive level for use in the comb generator circuitry described with respect to FIG. 27A.

A small amount of the comb drive signal is used by AGC amplifier circuitry 2340 to compare the drive level to a reference set by a comb drive adjustment 2342. Op amp 2345 compares the drive level on the line 2346 to the reference level set via contol 2342. The output from op amplifier 2345 is then set to bias PIN diode 2338 for a value of attenuation that will cause the rectified drive voltage to equal the reference voltage.

Indicator driver circuit 2360 compares the rectified drive voltage received via line 2368 with a fixed voltage. If the drive drops too low, op amp 2365 will turn on the NO REF LED.

Buffer amplifier circuit 2350 receives a small amount of 20 MHz comb drive signal via line 2351. This circuit provides a 20 MHz, minus 15 dBm reference signal to the YIG-tuned oscillator phase lock circuit described with respect to FIG. 26 and a 20 MHz minus 10 dBm signal to the 249 MHz phase lock described with respect to FIG. 33. Also supplied is drive for calibrator circuit 2370.

The 20 MHz reference signal received from buffer amplifier 2350 is amplified by an emitter coupled pair 2371. This signal is clipped by the emitter coupled pair 2372 to set a precise level. The output then goes through a low pass filter 2376 to reduce the harmonic content.

Referring now to FIG. 24A and FIG. 24B, there is shown the frequency control circuitry of the preferred embodiment. This circuitry provides the tuning voltage to the 50 MHz voltage tuned oscillator (VTO) described with respect to FIG. 35, current to the YIG-tuned oscillator (YTO) described with respect to FIG. 26, sweep to the selected oscillator, and bias to the YTO. It also provides latching of data for the RF converter which is described with respect to FIG. 25 as well as latching of data for the above mentioned oscillators. It also indicates to the RF interface circuitry shown in FIG. 23 when there is an over range of the phase lock voltage and it supplies a frequency analog voltage to the third converter described with respect to FIG. 29.

The sweep generator circuit 2410, the sweep reference voltage circuit 2420, and the sweep generator current source 2430 provide the sweep signal for the VTO, shown in FIG. 35, and YTO, shown in FIG. 26. This circuit also provides the horizontal display signal for the IF section.

The processor may stop the sweep at any time via signal HSWP on a line 2441. The timing capacitor 2412 receives a constant drive from transistor 2411 to provide the ramp for the sweeping frequency. The base emitter voltage of transistor 2411 sets the current. This voltage is determined by sweep generator current source circuit 2430 and by the output of operational amplifier 2422 in the sweep reference voltage circuit 2420. "Fast" potentiometer 2414 and "slow" potentiometer 2413 are provided to adjust sweep times to fit the particular characteristic curve of transistor 2411. Transistor 2415 acts as a buffer between transistor 2411 and sweep timing capacitor 2412 and also enables the sweep to be stopped by the sweep stop switch circuitry 2440 whenever the signal on line 2441 is low. The remainder of the sweep generator circuitry 2410 provides amplification to provide a useable sweep voltage. In the preferred embodiment, the sweep voltage provided on lines 2417 and 2418 varies between 0 and 10 volts. Sweep reference voltage circuitry 2420 basically provides temperature compensation of the sweep reference voltage.

Sweep generator current source 2430 comprises transistors 2433A, 2433B, 2433C, 2433D, 2433E and 2433F. These transistors are current switches which are controlled by register 2432. Register 2432 is loaded with a data word from I/O bus 2200 under control of address 5 signal on command bus 2299. The transistors switch resistors to provide appropriate current paths for the selected sweep times. Transistor 2434 is used for temperature compensation and causes a linear increase in the base emitter voltage of transistor 2411 in sweep generator 2410, causing an exponential increase in sweep time. In the preferred embodiment, when all six transistor switches 2433A-F are saturated, a 10 millisecond sweep will result; if transistor 2433A is off a times 10 multiplier is added causing a 100 millisecond sweep. Other multipliers are indicated on the schematic diagram.

The stopping of the sweep is accomplished by circuit 2440. The signal HSWP on line 2441 causes transistor 2445 to divert charging current from timing capacitor 2412 to ground thus stopping the sweep. An LED indicator 2447 is provided to provide an indication that the sweep has been stopped.

Decoder 2451 decodes the signals on address bus 2299 and provides the decoded address bus signals on line 2298. Decoded signals used to control circuitry elsewhere in the preferred embodiment are output by decoder 2253.

Referring now to FIGS. 24B and 24C, sweep attenuator circuit 2460 receives the sweep signal on line 2419 from sweep generator 2410 and provides an attenuated sweep signal on line 2461. D/A converter 2462 is a multiplying digital to analog converter whose input signal sweeps plus and minus five volts while the output signal which is buffered by op amp 2464 sweeps plus or minus five volts times N/1023 where N is the binary number input via lines 2463.

Various sweep options are selected by sweep select switches 2465 while reference voltages are provided by reference voltage circuits 2468.

Digital to analog converter circuits 2470 provide the VTO tune signal on line 2473 in response to the digital words received on data bus 2200. The digital words received from data bus 2200 are latched into registers 2474, 2476, 2477 and 2478. Circuits 2479A and 2479B are ten-bit multiplying digital to analog converters, similar to those manufactured by Analog Devices, Inc., and others.

The tuning signal provided on line 2478 is used to tune the VTO shown as block 2007 in FIG. 20A and described in more detail with respect to FIG. 35.

In a similar manner, circuits 2481, 2482, 2483, 2484, 2485 and 2486 provide control currents and bias voltages to the YIG-tuned oscillator (YTO). Tuning digital to analog converter 2481 receives digital words from data bus 2200 under control of address 3 on decoded address bus 2298. Circuit 2481 comprises a ten-bit digital to analog converter 2481C which responds to the data stored in latches 2481A and 2481B. YTO tuning signal is generated on a line 2481D and input to the YTO main coil tune driver circuit 2482 which sums the YTO tune signal with the sweep signal on line 2466.

The YIG-tuned oscillator is phase-locked to a reference voltage from the 20 MHz reference source 2016 shown in FIG. 20A by the phase lock circuitry shown in FIG. 26. The relationship of the YTO, the YTO phase lock circuitry and various other portions of the preferred embodiment is shown in the block diagram of FIG. 25.

Referring to FIGS. 26A and 26B, the phase lock circuitry phase locks the YTO to the 20 MHz reference voltage received from the circuitry shown in FIG. 23. A lock indication is provided and a filtered output of the pilot third IF amplifier circuit is routed to the frequency counter shown in FIG. 36. For wide sweeps, a sample/hold circuit retains the output voltage. 20 MHz reference amplifier 2605 receives the 20 MHz reference signal and provides such functions as impedance matching as well as setting the current and voltage levels necessary for the operation of phase frequency detector 2620.

Phase frequency detector 2620 is a dual D flip-flop 4-$\pi$-radian type detector consisting of D flip-flops 2621 and 2622. In the preferred embodiment, these are ECL flip-flops similar to 10131P manufactured by Motorola and others. If the signals at PIN 6 and 11 are in phase, outputs at PINS 2 and 14 will cancel when summed. If the signals are out of phase, outputs at PINS 2 and 14 will sum to an offset. When both flip-flops become set with active high (Q) outputs being at a logic high, gate 2623 will reset both flip-flop 2621 and flip-flop 2622. Note also that a low logic signal on line 2627 disables the phase frequency detector 2620.

Loop amplifier 2630 is configured as an integrator. Loop filter sample and hold circuit 2635 can be switched to several configurations, i.e., 10 KHz break point, loop grounded, or sample and hold.

Phase lock indicator 2640 circuit senses flip-flops 2621 and 2622 of phase frequency detector 2620 and provides the signal HULI on a line 2641 which indicates an unlocked YTO phase lock loop when in the high logic state.

Referring now to FIGS. 27A and 27B, there is shown the RF converter circuitry of the preferred embodiment. The RF converter circuitry has two conversion paths. In the first, the signal from the front panel is input via a line 2704 to first converter circuit 2705. The output is filtered, converted by converter 2760 and output via line 2763 to the IF amplifier shown in FIG. 28.

The second conversion path starts with the comb generator 2720. The comb generator takes the 20 MHz signal received from the 20 MHz reference 2016 which is shown in FIG. 23 and forms a pulse containing the harmonics of 20 MHz. This pilot signal provided on a line 2723 is input to pilot first converter 2730 which mixes power from circuit 2710 with the pilot signal. The output is filtered down, converted by down converter 2760 and sent to the second IF amplifier shown in FIG. 30.

The first LO distribution circuit 2710 takes power from YIG oscillator 2703 and splits and amplifies it for input to first converter circuit 2705 and pilot first converter 2730. The net result is that the IF signals on line 2763 and 2767 are provided to the second IF amplifier 2019 which is shown in greater detail in FIG. 28 and to pilot second IF amplifier 2009 which is shown in more detail in FIG. 30.

Referring now to FIG. 28, there is shown a second IF amplifier which receives the IF signal from the second converter shown in FIG. 27 which is processed through low pass filter 2805 which has a cutoff of about 500 MHz and filters out the LO frequency and harmonics from the RF converter. It is then amplified by amplifier 2810 which is a common emitter amplifier circuit with approximately 19 dB gain. The signal is then input to band pass filter 2815 which rejects the image frequency from the second converter. The 3 dB bandwidth of the filter is about 9 MHz.

The signal thus produced is input to the third converter circuitry 2020 shown in FIG. 29 where it is input to balance mixer 2910 and mixed with the signal provided by oscillator 2950 and amplified by amplifier 2940. The output from the mixer is then input to variable gain amplifier 2915. The output of oscillator 2950 is also input to buffer amplifier 2930 which provides the signal on line 2932 to the 275 MHz mixer described with respect to FIG. 32.

Referring now to FIG. 30, there is shown the pilot second IF amplifier which receives the signal on line 2767 from the second converter circuit shown in FIG. 27. This signal is processed by low pass filter 3010 which has a cutoff of approximately 500 MHz. It is amplified by common emitter amplifier 3015 which has a gain of approximately 19 dB and is then processed by band pass filter 3020 which has a 3 dB bandwidth of approximately 23 MHz. The filtered amplified signal thus obtained is output on line 3040 to the circuitry shown in FIG. 31. In the circuitry shown in FIG. 31, this signal on line 3040 is mixed by mixer 3110 with the signal received on line 3045 from the phase lock oscillator shown in FIG. 33. This signal thus produced is then amplified and filtered and provided to the YIG tuned oscillator phase lock circuitry shown in FIG. 26 via line 3150.

Referring now to FIGS. 32A and 32B, there is shown the 275 MHz phase lock circuitry of the preferred embodiment. In this circuit, the signal on line 3220 which is received from the circuitry shown in FIG. 34 is mixed with the signal received on line 2932 from the circuitry shown in FIG. 29. The difference frequency signal on line 3230 is then compared with the reference signal received on line 3210 from the 50 MHz voltage tuned oscillator. In response to this comparison, the 275 MHz tune control signal on line 3260 is generated. Detection of the phase lock loop is indicated by lock detector circuit 3250. When the loop is locked, the signal on line 3251 will be low. When it is unlocked, the output level on this line will be high.

Referring now to FIG. 34, there is shown the 275 MHz phase lock oscillator circuit of the preferred embodiment. This circuit provides a variable offset from the nominal 280 MHz signal. The circuit receives the 275 MHz tune signal on line 3260 which determines the frequency of the 275 MHz oscillator 3457. The output of the oscillator on line 3459 is mixed by mixer 3475 with the signal on line 3045 and the resulting signal is amplified and filtered and provided on line 3450 to the 249 MHz phase lock circuitry shown in FIG. 36.

Referring now to FIG. 35, the 50 MHz oscillator 3550 is tuned by the 50 MHz tune signal 3510 and the 50 MHz sweep signal on line 3520. These signals are shaped by shaping network 3530 and filtered by filter 3540 and used to tune the 50 MHz oscillator 3550. The output is divided by dividers 3570 and 3580 and the respective outputs are provided on line 3572 to the frequency counter circuitry shown in FIG. 36 or on line 3210 to the phase lock circuitry shown in FIG. 32.

In FIGS. 36A, 36B and 36C, there is shown the frequency counter circuitry of the preferred embodiment. This circuit counts the following frequencies: the 50 MHz voltage-tuned oscillator signal received on line 3572, the IF signal received on line 3611 and the pilot IF signal from the phase lock circuitry shown in FIG. 26. The respective signals are amplified by amplifier circuits 3612, 3614 and 3616. The amplified signals are then input to multiplexer 3640. Also input to multiplexer 3640 is the 10 MHz reference signal from counter control circuit 3630. The multiplexer gates one of these signals to the output line 3650 in response to the input selected by the code placed in register 3632 from the data bus 2200. Strobing of the data word from the data bus 2200 into register 3632 is accomplished via address decoder circuit 3660. The strobe signal is supplied on line 3661 and the selection of the frequency counter circuitry is determined by decoding the address signals received on lines 3664. The decoding of certain octal addresses is used for specific purposes. For example, the decoding of octal address 24 will result in a signal being produced on line 3667. This will cause the counter and bus registers 3680 and various other circuitry in the frequency counter to be reset. The decoding of address 25 will result in a signal on line 3668, and will cause the high order four digits to be read from counter 3680. In a similar fashion, the decoding of an octal address 26 will cause a signal to be provided on line 3669 and the lower four bits of counter circuit 3680 will be read out onto the data bus 2200.

Referring now to FIGS. 37A and 37B, there is shown the 249 MHz phase lock circuitry. The frequency of the signal received on line 3450 from the 275 MHz phase lock oscillator shown in FIG. 34 is divided by variable modulo frequency divider circuit 3725. Phase frequency detector 3710 then compares the signal provided by circuit 3725 with the signal produced by divider circuit 3705 in response to the 20 MHz reference signal received on line 3610. If the two inputs are out of phase control voltage is generated to force a change in the frequency of the 249 MHz phase lock oscillator shown in FIG. 33 until the inputs are in phase. Also, an indication of the locked or unlocked state of the phase lock loop is provided by circuit 3735. An LED 3735 is illuminated when the loop is unlocked and also a high logic signal is provided on a line 3736 to indicate the unlocked state.

Referring now to FIGS. 38A, 38B, 38C and 38D, there is shown the circuitry of the processor 2015 for the RF section of the preferred embodiment. The interface circuitry connecting the processor to the other circuitry of the preferred embodiment is shown in FIG. 38. Basically, these consist of memory interface 3880, bus circuits 3885, 3840 and 3830 as well as timing and synchronizing circuits such as timer 3805, clock circuit 3815, synchronizing circuit 3810 and clock drivers 3825. The processor executes the instructions shown in Appendix A to control the various operations of the preferred embodiment. A block diagram of the microprocessor used in the preferred embodiment is shown in FIG. 39. An explanation of the notation used in this processor and definitions of all the instructions are contained in Appendix A. The various programs used in the preferred embodiment are contained in Appendices B-1 through B-30. The signals produced by the instructions in the programs are detailed in Appendix B-31. Program execution by the processor is suspended through stop processor circuit 3801. This circuit responds to the controls on the front panel and to various other conditions throughout the machine.

The processor reset signal POP is provided on line 3811. Whenever this line goes low, the processor is reset and forced to begin the execution of the program which begins with the instruction at octal address 40 as soon as the line returns high. This may be caused by the pressing of the instrument preset button 230 on the front panel which causes the generation of the signal LIPS on line 3806 and by when power is first applied to the unit as indicated by the signal on line 3807. Once execution begins at instruction 40, various subprograms are executed which cause specific operations to occur in a predetermined sequence. Some examples of these operations are: phase lock the YIG-tuned oscillator, tune the voltage-tuned oscillator, select the correct scan time, select an appropriate frequency span width, set the IF section to the correct bandwidth and sensitivity, display the appropriate control settings on the CRT, etc. These programs interrogate the settings of the controls on the front panel and are responsive to changes in the circuitry and the front panel controls.

The subprograms which are in Appendices B-1 through B-30 are stored in a read-only memory which is read by the processor using a handshake interface circuit 3880. Any suitable ROM memory may be used. The address is output to the memory on lines 3992 and the signal HSTM on line 3994 is brought high. The positive edge of the signal on line 3994 causes the memory address register to receive the address on lines 3992.

The circuits shown in FIGS. 40A-C and 46A and 46B are bandwidth filters which operate at 21.4 MHz and are variable in bandwidth from 3 KHz to 3 MHz. The narrower bandwidths 3 KHz to 30 KHz are obtained from synchronously tuned crystal filters while the wider bandwidths are obtained from four synchronously tuned LC tank circuits. The IF control circuitry of the preferred embodiment is shown in FIGS. 41A and 41B. Control information for the IF video circuits is transmitted over data bus 2200. Address lines 2299 are monitored and decoded by circuit 4120 which controls the loading of the data on the bus 2200 into the input latches 4130. Data is strobed into the latches in response to the signal LTIO on line 4123 in response to the data word, gain control outputs are produced by circuit 4140, and predetermined attenuation steps are controlled by circuit 4150. In a similar fashion, bandwidth control circuit 4160 provides control signals on lines 4161, 4162, 4163, 4164, 4165, 4166, 4167, 4168. These signals control the crystal filters in LC tank circuits shown in FIGS. 40 and 46. The log linear control signal on line 4180 is provided by op amp circuit 4182. This signal is used in the circuitry shown in FIGS. 42A and 42B.

The log amplifier and filtering circuitry of FIGS. 42A and 42B provides the ability in the preferred embodiment to display signals in either a linear or a logarithmic mode. In the logarithmic mode, the calibrated display range is 90 dB. The circuitry of FIGS. 42A and 42B contains the first five of nine logarithmic stages and the circuitry shown in FIGS. 43A and 43B contains the circuitry for the last four logarithmic stages. After the IF signal received on line 4080 is processed by the five logarithmic amplifier stages of amplifier circuit 4230, the IF signal is processed by bandpass filter circuit 4240 and lowpass filter 4250 to yield the IF signal on lines 4280. All this circuitry is under control of the log/lin control signal on line 4180 and the AGC control signal on line 4193, and the LGIO control signal on line 4195. The AGC signal on line 4193 is used in the linear mode of display. The gain increases as the voltage of this signal becomes more negative. The signal varies between 0 and 15 volts and controls a gain range of approximately 65 dB. The LGIO signal controls circuitry within amplifier 4230 which is used to activate a 10 dB gain step in the linear mode.

The log amplifier detector circuitry shown in FIGS. 43A and 43B contains the last four of the nine logarithmic amplifier stages (the first five stages are in the amplifier/filter circuitry shown in FIG. 42). Stages 6 and 7 of amplifiers 4320 are also used in the linear mode as a switchable 20 dB gain step. The output signal from the amplifiers on line 4321 is applied to the PIN diode attenuator circuit 4325. When in the logarithmic mode, this attenuation is varied with temperature to compensate for bias variations in the logarithmic amplifier stages. The IF signal output on line 4326 is then detected by detector circuit 4340 to produce the vertical video signal on line 4342 which is input to video processor 2060 which is described in greater detail with respect to FIG. 50. The counter output limiter circuit 4350 provides an amplitude/limited signal at the IF frequency which is used for frequency counting. The circuitry shown in FIG. 44 provides three functions: oscillator circuit 4410 provides an 18.4 MHz LO frequency to the up converter and down converter circuitry shown in FIGS. 47 and 48 respectively. These signals are provided on lines 4413 and 4415 after being amplified by amplifier circuit 4412. Also, the circuitry of FIGS. 44A and 44B provides 65.9 dB of gain in discrete 0.1 dB steps (from −15.9 dB to +50 dB). This is accomplished through step gain circuits 4430, 4440 and 4450 as well as attenuators 4460. The level of gain or attenuation is determined by the control signals on lines 4431, 4441, 4451, 4461, 4462, 4463 and 4464. The resulting IF signal is output on line 4480. The control signals received are provided in response to the program control of processor 2015 and the settings of the front panel controls.

Figure 45A:
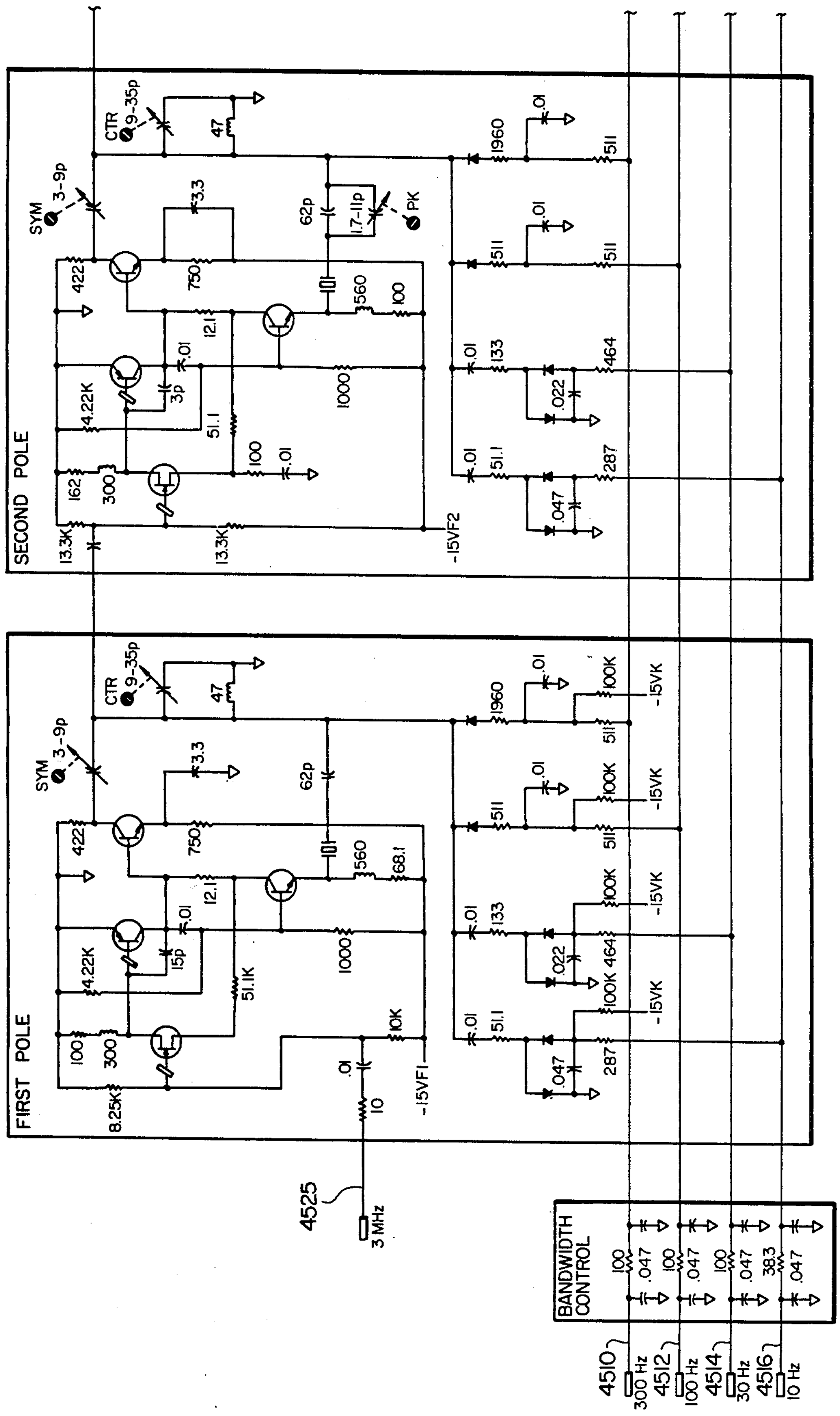

The 3 MHz filter circuitry shown in FIGS. 45A and 45B is a variable bandwidth filter centered at 3 MHz. The bandwidths are controlled from 10 Hz to 300 Hz in a 1-3-10 sequence by the control lines 4510, 4512, 4514 and 4516. The signal being filtered is received on line 4525 from the down converter circuitry shown in FIGS. 46A and 46B and the filtered output on line 4582 is input to the up converter circuitry shown in FIG. 47. The filter circuit shown in FIGS. 45A and 45B forms a five pole synchronously tuned bandpass filter. Each amplifier has a negative output impedance to compensate for the series resistance of the crystal resonator.

Referring now to FIGS. 46A and 46B, there is shown attenuator and bandwidth filter circuitry of the preferred embodiment. Attenuation of the input signal received on line 4601 is supplied by attenuator/amplifier circuit 4610 in response to the control signals 4603 and 4605. As in the bandwidth filter circuitry shown in FIG. 40, the narrower bandwidths of the filter are obtained from synchronously tuned crystal filters while the wider bandwidths are obtained from four synchronously tuned LC tank circuits.

In FIG. 47 there is shown the up converter of the preferred embodiment. For the narrow bandwidths, i.e., less than or equal to 1 KHz, this circuitry converts the 3 MHz IF signal received on line 4582 and converts it to a 21.4 MHz IF signal on line 4772. This is accomplished by mixing the 3 MHz signal on line 4582 with the 18.4 MHz signal received on line 4413.

FIG. 48 shows the down converter circuitry of the preferred embodiment whereby the 21.4 MHz IF signal received on line 4682 is converted to a 3 MHz IF signal and output on line 4525.

Video Processor

As mentioned above, in a spectrum analyzer with a digital display, i.e., where the display is produced in response to data representing a discrete number of sampled points, there is the problem that there may not be enough sample points to properly describe the analog signal. For example, assume that the display is made up of 1000 horizontal positions and their corresponding 1000 amplitude levels at those points. In that case, the resolution is 1/1000 of the full scale along the axis. For a 1000 MHz wide scan with an IF-bandwidth $<1$ MHz there would be a good chance of missing a signal or of displaying it with less than its true amplitude, because no sample was taken while the analyzer was sweeping across the signal. To avoid this problem, the ratio of scanwidth to bandwidth cannot exceed a certain ratio.

With 1000 samples per scanwidth, this ratio should be $\leqq 200$ so that at least five samples are taken while the signal is within the 3 dB bandwidth of the IF filter. This would keep the amplitude error to $<0.1$ dB for a 100 dB full screen display.

A problem is the aspect ratio (SW/BW=aspect ratio) limitation of digital storage, as well as the limitation of the absolute speed at which incoming data gets converted into digital. The Nyquist theorem for sampling a band limited signal has to be satisfied ($f_s > 2BW$) in order to retain all the information. With a max. conversion rate of 50 KHz from analog to digital, the widest IF-bandwidth which satisfies Nyquist is $\approx 10$ KHz. The analyzer has a max. IF-BW of 3 MHz and thus the 50 KHz sampling rate will lead to inaccurate descriptions of signals which have a 3 MHz information bandwidth, such signals as noise and impulse signals like RADAR.

Another problem is the sampling rate limitation. The previous aspect ratio limitation is really another form of sampling rate limitation. It is caused by the fact that there are insufficient numbers of samples to describe the display.

The real solutions would be to increase the sampling rate and the numbers of points displayed, but this is costly and not practical.

Other solutions are compromises which sacrifice some information in order to preserve that information which is most useful for spectrum analysis. In this regard, the most important parameter is correct signal amplitude. It can be obtained from a peak detector which precedes the A/D converter. The peak detector holds the max. signal which occurs between samples for the A/D. After sampling the peak detector output, the peak detector is reset to the input signal level. Thus, no signal peak is lost. Also, the preferred embodiment employs both a positive and negative peak detector circuit to allow a better presentation of signal noise, i.e., give an indication of the amplitude excursions in the noise signal.

A problem using the peak detector is that the displayed signal peak may show one address later than it actually occurred so that there would be an error in frequency. The seriousness of this problem depends on how many horizontal addresses are used.

Also, the peak detector will give a misleading display of noise as it traces out only the peaks of the noise impulses. The user might be misled into thinking that the noise has been smoothed by videofiltering. In that case, he would read the absolute noise level incorrectly, since the peak noise is many dB above the RMS noise level.

Another problem with using a positive peak detector only is that a signal which is just a few dB above the noise will look clean and again the user might not be aware that he is looking at the sum of signal plus peak noise. Measuring the signal level he could get several dB errors.

The preferred embodiment provides a better presentation of the noise which is presented by using a negative peak detector in addition to the previously described positive peak detector. The outputs from these two peak detectors are then displayed in a predetermined manner. For example, the display might simply alternate between the outputs from the positive and the negative peak detectors.

Video Signal Conditioning

The video processing technique of the present invention accommodates the requirements of digital storage. During a frequency sweep, 1000 samples of the video signal are taken and stored. However, simply taking and storing 1000 samples does not give adequate results with all combinations of resolution bandwidth, frequency span, and sweep time.

Consider, for example, an often-encountered spectrum analyzer input: short duration RF pulses occurring at a relatively low repetition rate. When the analyzer sweeps across the RF pulse spectrum, the output of the video detector is a series of short pulses. The shape of these pulses corresponds to the impulse response of the spectrum analyzer system (approximately Gaussain) and their rise time is 0.12 $\mu$s when the resolution bandwidth is at its widest setting (3 MHz). Representing this signal with sampled data would require a sampling rate higher than 6 MHz but there are other limiting factors, such as CRT resolution.

A high-quality CRT display might have a 10-cm horizontal axis and a resolution of 40 lines/cm. RF spectrum analyzers typically sweep no faster than 20 ms per sweep, so multiple video signals occurring within a 50-$\mu$s sweep segment (20 ms$\times$1/400) will not be resolved, but will appear on the display as a single vertical line having the amplitude of the largest video signal and an intensity proportional to the summation of all the signals occurring within that segment. Thus, a peak detector that retains the peak value encountered during each 50-$\mu$s period would permit sampling at a 20-KHz rate for the 20-ms sweep. However, the information contained in the intensity modulation would be lost, corresponding to the loss of information resulting from the use of the slower sampling rate (as compared to 6 MHz).

Wideband impulse-type signals are not the only ones that can cause difficulties for the conversion process. CW signals can also be misrepresented when the analyzer is set for a high-aspect-ratio display (aspect ratio is defined as the ratio of frequency span to resolution bandwidth). Because the video signal resulting from a CW signal during a frequency sweep is a replica of the shape of the resolution-bandwidth filter response curve, at least five samples must be taken within the −3-dB points on the response curve to assure that the peak amplitude is captured with less than 0.1-dB error. This would limit the aspect ratio to 200 for a 1000-point display using sampled data.

For larger aspect ratios, a peak detector enables the peak amplitude to be captured by only one sample per data point. The trade-off is a sacrifice in frequency accuracy of 0.1% of the frequency span, but this is well within the visual resolution of the displayed spectrum.

A peak detector can give a misleading representation of noise. With noise as the input signal, the video signal can be considered as a tightly packed random sequence of individual impulse responses. However, a peak detector retains only the noise peaks and information on the variance is lost. Indeed, this can lead to erroneous results in measurements of low-level signals that are barely above the noise level. The peak-detected waveform may look very much like a video-averaged waveform whereas the peak is much higher than the true average because of the noise fluctuations.

For this reason, the preferred embodiment has both a negative peak detector and a positive peak detector driven in parallel by the video detector. The general scheme is to display the positive peak values for the odd-numbered data points and the negative peak values for the even-numbered points, giving a realistic reconstruction of noisy signals. However, this introduces a complication because it is desired to retain only the positive peak values of clean signals so amplitude measurement accuracy is preserved. Therefore, the video processor of the preferred embodiment displays positive and negative peaks alternately only when noise is present. Otherwise, only the positive peaks are displayed. FIG. 49B illustrates the concept.

A block diagram of the video processor is shown in FIG. 49A. The video signal is applied to the positive and negative peak detectors simultaneously. Before the start of a sweep, the switches in the peak detectors are closed and the capacitors charge to the value of the video signal. At the start of the sweep, the display's digital processor opens the switches and the positive peak detector tracks increases in the video signal while the negative peak detector tracks decreases. For example, the output of the positive peak detector increases only when the video signal increases above the value already stored on the capacitor and, of course, it never decreases.

When the processor determines the end of a data position (sampling interval), it selects the output of one of the two peak detectors to represent the signal at the A-to-D converter. If it selected the positive peak detector, it would then close the corresponding switch, reinitializing the capacitor to the present value of the video signal. If it had selected the negative peak detector, it would not reset the positive peak detector, but would retain the value stored on the capacitor for use in the next data position. However, for reasons given later, the negative peak detector is reinitialized at the end of every data position.

DETECTING NOISE

The most important information the processor needs to decide which peak detector to choose is whether or not the incoming signal contains noise. As shown in FIG. 49B, a noisy video signal is characterized by many variations and large deviations. Noise is present in each of the ordinals 400 through 404 and the signal rises and falls repeatedly. However, in ordinals 405 through 407 there is no noise and the signal increases monotonically. Using these signal properties, it is a relatively simple matter to determine whether or not a data position contains noise.

The "rosenfell" detector of FIG. 49A tells the processor when noise is present. The input stage of the rosenfell detector consists of two comparators. The upper comparator detects when the instantaneous video signal is less than the positive peak detector output, which can only mean that the video signal is falling. In a similar manner, the other comparator indicates when the video signal is rising.

Whenever the video signal falls, it causes the "fell" flip-flop to be set and whenever it rises, it causes the "rose" flip-flop to be set. If the video signal both rose and fell within a data position, the AND gate would send a "rosenfell" indication to the processor, signifying the presence of noise within the data position. Both flip-flops are reset at the beginning of the next data position.

TO RESET OR NOT

The success of the detection technique at reconstructing the video signal hinges on the rules for resetting the peak detectors. Assume that FIG. 49C-1 shows a video signal of interest. FIG. 49C-2 shows the waveform obtained by the preferred embodiment using the positive peak detector only. FIG. 49C-3 shows the waveform obtained by the preferred embodiment using only the negative peak detector. Combining the use of the positive and negative peak detectors allows the reconstruction and accurate display of the video signal. These figures demonstrate the importance of resetting the positive peak detector only when it had been chosen to represent the signal for the data position. The aspect ratio for this case is 3000, so the video signal rises out of the noise, reaches its maximum, and returns to the noise level all within one data position. The rosenfell detector would indicate the presence of noise and, if the ordinal were even, the processor would choose the negative peak detector output. However, since the positive peak detector is not reset on this data position, it holds the maximum signal value for the next data position, where the positive peak value is chosen. Thus, the video signal is reconstructed appropriately.

Again, assume that FIG. 49D-1 shows a video signal of interest. Also, as above, FIG. 49D-2 illustrates the display obtained using only the positive peak detector where FIG. 49D-3 illustrates the display obtained using only the negative peak detector. FIG. 49D-4 shows the reconstructed video signal obtainable using both the positive and negative peak detectors. These figures demonstrate the importance of resetting the negative peak detector at the end of every data position. When a noise-free video signal reverses direction at its peak, the rosenfell detector sees both a rise and a fall and indicates that noise is present within the data position. Then if the processor is also at an even ordinal, the negative peak value would be chosen. But, since the negative peak detector was reset to the value of the signal at the beginning of the data position, its value will be only slightly different from the positive peak detector value and the smooth reconstruction of the video signal is not distributed perceptibly. At the next data position, the positive peak detector, which retained the maximum value, is chosen.

When the preferred embodiment is used for measuring noise or when it operates in a digital averaging mode, the rosenfell detector is bypassed and the video signal is sampled directly by the A-to-D converter.

The hardware implementation of this detection technique could encounter some practical problems when the analyzer sweeps slowly. The duration of a data position can become as long as 1.5 seconds and a peak value captured by either peak detector could be lost because of gradual discharge of the detector capacitor. This becomes a problem whenever the data position is 75 μs or longer; that is, the sweep time is 75 ms or longer. To avoid the loss of these values, the processor retrieves the values of both peak detectors from the A-to-D converter at least once every 30 μs, obtaining as many as 50,000 positive and negative peak detector values for the 1.5-second data positions. The processor, however, saves only the maximum and minimum values and at the end of the data position, chooses one or the other to represent the signal for that data position according to the same algorithm described above. These peak values, which the processor stores in its registers, are then reset whenever the peak detectors are reset. In effect, the processor simply extends the range of the peak detectors by carrying out the detection process digitally.

The A-to-D converter has 10-bit resolution, equivalent to a resolution of 0.1%. At the end of each data position, the display system processor takes the chosen value, performs any calculations that may be called for (max hold, A-B), and stores the result in memory along with sweep position information. The measurement data can be stored in any one of three area (A, B, or C) reserved for these data arrays. During the display cycles, the data from any one of these areas can be displayed individually or simultaneously with data from the other areas.

The definitions and method steps used in the preferred embodiment are briefly summarized below:

A "sample" is defined as a video a-d conversion which occurs every 20–50 μsec. A "data position" is defined as 1/1000 of the horizontal display. Each data position has a specific memory address:

Even Data Position = 2, 4, 6, . . . 1000

Odd Data Position = 1, 3, 5, . . . 1001

The time range per data position = 20 μs→1.5 sec. While the number of samples per data position may vary from 1 to 50 thousand, only one sample per data position can be displayed.

Positive and negative peak detectors are used to find maximum deviations. A positive peak is the maximum value within a data position, a negative peak is the minimum value. The reset of a peak detector initializes the peak detector to the present value of the video signal.

"Video signal falling" is defined as the condition when the incoming video signal is less than the value held on the positive peak detector. "Video signal rising" is defined as the condition when the incoming video signal is greater then the value held on the negative peak detector. "Video signal fell" indicates that a condition of "video signal falling" has occurred within a data position. "Video signal rose" indicates that a condition of "video signal rising" has occurred within a data position. "Video signal rosenfell" indicates that the video signal both rose and fell within a data position. The reset of the "rosenfell" detector clears the indication of "video signal rose" and "video signal fell."

In the preferred embodiment, odd data positions will always contain positive peak values. Even data positions will contain negative peak values only if the video signal is defined as "noise." Otherwise, even data positions will contain positive peak values. The presence of "noise" is indicated by the presence of a "video signal rosenfell."

The negative peak detector is reset at the end of every data position. The positive peak detector is reset after the positive peak value has been chosen for the data position. Therefore, when a negative peak value is chosen for an even data position, the psoitive peak detector will not be reset until the end of the following data position. This ensures that any positive peak occurring during the time of the even data position will be retained. The rosenfell detector is reset at the end of every data position.

For data positions of long duration, one or more pairs of positive and negative peak detector values are converted. When more than one pair is converted, the digital processor selects and keeps only the maximum and minimum values. At the end of the data position, the maximum value is assigned to be the positive peak value and the minimum value is assigned to be the negative peak value. The algorithm stated above is then followed, and the rule for resetting the positive and negative peak detectors is applied to resetting the positive and negative peak values.

To make noise density measurements, the peak detectors are bypassed and the video signal is sampled and converted directly. This allows noise computations on direct samples of the video signal.

It should be emphasized that the method used in the preferred embodiment is weighted towards preserving the positive peak excursions of the signal. Since this is the most important parameter for a spectrum analyzer, the negative excursions are preserved only to the extent necessary to indicate the signal variations as for noise. These sequences of variations between using the information from the positive and negative PD could also be effectively used.

Referring now to FIGS. 50A and 50B, there is shown the schematic diagram for the video processor circuit of the preferred embodiment. This circuit filters the detected IF signal received on line 4342 from the circuitry shown in FIG. 43. The circuit also sets the DB/DIV log scale and the reference level offsets. Also, it provides the IF video output signal on line 5080 as well as recorder output control signals on lines 5090 and 5091. Video filter circuit 5020 is an RC low pass filter with selectable R and C elements. The series resistance R is one of two values controlled by switch 5022. When the switch is closed or in the zero position, the 147 K resistor 5024 is short-circuited, and the series resistance is minimum. In this state, video bandwidths from 3 KHz to 3 MHz are attainable. The 3 MHz bandwidth is attained when transistors 5027A, B, C, D, E, F and G are turned off. When switch 5022 is open, the series resistance R is high, approximately equal to resistor 5024, and video bandwidths from 1 Hz to 1 KHz are attainable. The shunt capacitors 5029A through 5029G are selected by switching transistors 5027A through 5027G respectively. Only one of these switching transistors can be on at any one time and each capacitor except capacitor 5029G is used with the high series resistance for the lower bandwidths and the low series resistance for the higher bandwidths.

Log expand circuitry 5040 allows four different amplitude scales, 10, 5, 2 or 1 dB per division. Changes in the amplitude scale are accomplished by first amplifying the video signal and then attenuating it various amounts. Amplification is provided by FET input amplifier 5042 which has a gain of 5. The singal thus produced on line 5043 is then attenuated by voltage divider circuits under control of transistors 5045, 5046 and 5047. Diodes 5048A and 5048B clamp this attenuated signal at about minus 1.2 volts to prevent forward biasing any of the transistor 5045, 5046 and 5047 switch circuits in the forward state. A final amplifier consisting of transistor circuits 5049, 5050 and 5055 amplifies the attenuated signal by 4 and offsets the output plus 2 volts (a plus 2 volt output corresponds to a full scale signal). Log offset current source 5010 simulates log gain for reference levels below minus 60 dBm. This is achieved by offsetting the zero volt to 1 volt video input signal by driving current through the source resistance 5012. This current is changed by supplying different currents into the emitter of transistor 5014, the transistor current source. Currents are controlled by switching transistors 5015A, 5015B and 5015C.

The decode logic circuit 5030 performs additional decoding on control lines received from the IF control circuitry described with respect to FIG. 41. The signals VBWA, VBWB, VBWC and VBWD are received on lines 5031, 5032, 5033 and 5034 respectively. They are then decoded by a 1 of 8 decoder 5037 and the signals are then inverted by inverters 5039. In this way, the control signals are produced which control the capacitors in the video filter circuit 5020. The signals A LOG and B LOG are also decoded by decoding circuit 5030 which produces the control signals on lines 5041A, 5041B and 5041C which drive the switches that vary the attenuators in the log expand circuit 5040.

Figure 51:
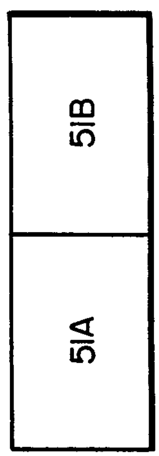
FIG. 51 shows the relationship of FIGS. 51A and 51B.

Referring now to FIGS. 51A and 51B, there is shown the analog/digital converter circuit of the preferred embodiment. This circuit is used to produce storable graph data. It converts analog data received from the track and hold circuitry shown in FIG. 52 on line 5280 and transfers this data to the digital storage bus 5130. The digital storage bus 5130 is used for all data input and output. The signal ADC on a line 5173 controls the loading of the digitized signals from ADC buffers 5120 onto data bus 5130. The signal HLD on a line 5177 is used to reset the ADC circuits 5110 and 5120 and to initiate the next analog to digital conversion. The signal LD RAMP on a line 5179 causes the updating of the ramp digital to analog converter 5160 by causing the loading and updating of the scan address latches 5150 with a new scan address. The signal TSTA on line 5171 enables the test bits from buffer 5190 onto the digital storage bus 5130.

The ADC circuit 5110 converts analog data into 10 bits of binary data which is placed in ADC buffers 5120 through the technique of successive approximation. The circuit comprises digital to analog converter 5113 and successive approximation register 5117. To begin a conversion, the ADC is first reset to all zeros by the signal HLD on line 5177 going low. When the signal HLD goes high, each bit is individually tried in a "trial" conversion starting with the most significant bit. A decision is made to retain or drop the bit based on the comparator output. Once the decision has been made for each of the 10 bits, a conversion complete signal on line 5117A sets a flip-flop 5119. This signal called BUSY can be transferred onto the digital storage bus through test bits buffer circuit 5190.

Ramp converter circuit 5160 makes a comparison between the analog sweep signal received on line 2046 and the scan address (X axis) received on the digital storage bus 5130 and input to latches 5150. Comparator 5167 makes the comparison and provides a signal RAMP on a line 5168. When this signal is high, it indicates that the scan address needs to be updated. When an update occurs, a new address is loaded into scan address latches 5150 and a new data point is sampled for A/D conversion. When a new address is placed in scan address latches 5150, an updated comparison between the sweep signal on line 2046 and the scan address in latches 5150. The signal SWP IN thus sets the sample rate. Minor adjustment can be made using variable potentiometer 5169.

Referring now to FIGS. 52A–C, the track and hold circuitry shown is used to insure that the true peak of the RF signal and a true representation of noise are displayed on the CRT display. This is accomplished by positive and negative peak detection circuits. The positive peak detector circuit 5210 acquires the most positive voltage to appear at its input on line 5080 and holds that voltage on holding capacitor 5214 until the circuit is reset by a pulse from the decoding and timing circuits 5320. C26 is discharged when the reset pulse turns on transistor 5117.

Negative peak detector circuit 5220 also receives the signal on line 5080 and acquires the most negative voltage to appear and holds that voltage on holding capacitor 5224 until reset by the reset pulse from decoding and timing circuits 5230.

Decoding and timing circuits 5230 provide the reset pulses to the peak detectors and the control signals to multiplexer circuit 5250. Signals received on lines 5251 and 5252 are used to control multiplexer circuit 5250. Signals HSWP on line 5231 and signal HOLD on line 5234 and signal RSEN on line 5235 control the providing of the reset pulses to positive and negative peak detectors 5210 and 5220. The status of the track and hold circuitry can be monitored by the control processor by monitoring status signal LTRK on line 5239. Track and hold circuit 5270 monitors the positive and negative peak detector output signals which are multiplexed through multiplexer 5250 onto line 5217. Track and hold circuit 5290 samples the signal on line 5271 and holds the sampled voltage on capacitor 5292. The output of the track and hold circuit on a line 5280 is then used by the analog to digital converter circuitry shown in FIG. 51 which converts it into Y axis graph data.

FIGS. 53A–C are a schematic diagram of the data manipulator circuitry of the preferred embodiment. This circuit contains 16 random access memory registers 5310 which are used for data storage during data manipulation. Thirty-two 12-bit ROM registers 5370 are used to store constants used during calculations. The arithmetic and logic unit 5350 is used to perform various arithmetic and logic functions upon the stored data. ALU circuits 5351, 5352 and 5353 are similar to the 74S181 circuits or the like manufactured by Texas Instruments and others. Circuit 5355 is a high-speed, look-ahead carry circuit similar to the 74S182 or the like manufactured by Texas Instruments and others. A pipeline register 5360 holds instructions received from the processor in sequential order. These instructions are then decoded by circuit 5380 and the appropriate arithmetic or logical functions are performed upon the stored data. Also, data words may be input and output to other areas of the circuitry of the preferred embodiment over I/O bus, i.e., digital storage bus 5130.

Referring now to FIGS. 54A–C, there is shown the main control circuitry or state machine which controls the digital storage processor. The digital storage processor includes the control circuitry shown in FIG. 54, the interface circuitry to the remainder of the spectrum analyzer of the preferred embodiment shown in FIG. 55, the data manipulating circuitry shown in FIG. 53 and the memory circuitry shown in FIG. 56.

State register 5430 indicates the present state and the position in the sequence in the sequence of operations being performed. This present state data is supplied to program ROMs 5420 on lines 5421 where it causes the program ROMs to read out the appropriate memory contents. The digital storage processor alternates between two programs. One is the main program shown in Appendix C1; the other is the interrupt program shown in Appendix C2. Link register 5440 is used to store the respective returning positions and store multiplexed qualifier to the respective programs as they are being executed and interrupts and other monitored machine conditions cause the processor to switch from one program to the other. Thus, each program resumes at the correct state when the other is completed or temporarily suspended. Control signals for the input section and the CRT display section are provided by control pulse circuit 5555 and addressable flip-flop circuit 5580. The instruction definitions for the program stored in program ROM 5420 are shown in Appendix C3.

In FIGS. 55A and 55B, there is shown the interface circuitry which provides data transfer between processor 2015 which is desired with respect to FIG. 20 and the digital storage processor which is desired with respect to FIGS. 53, 54, 55 and 56. Basically, this circuit provides for the inputting and outputting of circuitry via the two processors and through the preferred embodiment using instrument bus 2200 and digital storage bus 5130.

The memory circuitry shown in FIGS. 56A–C contains 4,096 12-bit words of random access memory storage in memory circuits 5630 and also contains 2,048 8-bit words in memory 5670. In memory circuits 5630 are stored all the data that may be displayed on the CRT including the display annotation data such as center frequency, reference level, the graticule, all characters and complete data for traces A, B and C. Character stroke memory 5670 contains the stroke description of each character, the length and direction of each stroke required to draw a character, i.e., all the alphabetic characters as well as all the numerals and other indicia used on the display.

Referring now to FIGS. 57A and 57B, there is shown the line generator circuitry of the preferred embodiment. This circuit receives a series of digital X and Y values which are loaded into X register circuit 5710 and Y register 5720. These values are received via bus 5130 and are clocked into the respective registers under control of the signals LDX and LDY. If signal LDX on line 5521 is present, the value on data bus 5130 will be loaded into the X register. If the signal LDY on line 5522 is present, then the digital word on data bus 5130 will be loaded into Y register 5720. The values placed in the X register 5710 and Y register 5720 are then converted to analog values by X digital to analog converter 5745 and Y digital to analog converter 5730. The successive X and Y values are connected with straight lines by a process called line generation which is similar to that of connecting dot-to-dot drawings on paper. Two independent line generators are required. The line generator circuit for the X values comprises summing-amplifier 5750, sample and hold circuit 5765, X intergrator 5780 and filter 5785. The Y line generator circuit comprises summing-amplifier 5760, sample and hold circuit 5775, Y integrator 5795 and Y filter 5790. For each line drawn, there is a set up period followed by a drawing period. During the set up period, i.e., the conversion to analog values for each set of X and Y data, display is blanked by the intensity control circuitry shown in FIG. 58 under control of the signal LLGBLANK on line 5811 and INTR on line 5821. X summing-amplifier 5750 receives the analog value for the next position on line 5746. It also receives an input indicating the present X value from integrator 5780 on line 5781 and it receives a shift value on line 5716 from expand register 5715. The three signals are summed to give a delta X equal to "next X" plus X shift minus present X. The X shift signal on line 5716 is a binary signal of zero volts or plus 5 volts and the amount of shift is adjusted by the potentiometer 5752.

Sample and hold circuit 5765 receives the new X value provided on line 5759 and holds it for input to the integrator 5780. Sample and hold circuit 5765 samples for 1 microsecond during the set up period and then holds the value during the drawing period which is either 4 microseconds or 19 microseconds. The sample mode is controlled by the signal SMPL on line 5767 while the hold mode is controlled by the signal HLDX on line 5769. Capacitor 5768 is the holding capacitor.

X integrator 5780 includes amplifier 5785, capacitor 5787 and transistor 5789 which form an integrate and hold circuit whose output is an analog signal on line 5783 which is the X display position. X filter 5788 is a 2.5 MHz low pass filter which smooths out transients from the X integrator and provides the signal LGX on line 5795. The Y circuitry works in a similar fashion and provides the signal LGY on line 5798. Y offset circuit 5755 supplies a signal to the Y summing amplifier 5760 such that the output of the Y line generator on line 5798 will be zero volts when the Y register contains all zeros and no origin shift for the display is present.

Referring now to FIGS. 58A and 58B, there is shown the intensity control circuitry of the preferred embodiment. This circuitry receives the delta X and delta Y signals on lines 5756 and 5758 respectively. It then approximates the line length and controls the Z axis level to the display. This circuitry also sets and controls the duration of the line generator drawing period which is either 4 microseconds or 19 microseconds depending on the approximate line length. The drawing period is controlled by providing the signal LL on line 5771. This circuitry also provides the drive signals to the line generator switches, and through the blanking logic 5850, it controls all display blanking.

The intensity level is modulated as a function of both delta X and delta Y signals received on lines 5756 and 5758. Line generator Z-axis circuit 5880 receives these signals and the magnitudes of these two signals are summed together to approximate line length. The output of this summing operation is provided to bright circuit 5888 on a line 5887. Bright circuit 5888 sets the Z-axis signal to maximum when bright lines are drawn. The signal LGZ on a line 5889 is output by bright control circuit 5888 and is input to multiplexer 5995 where it is multiplexed with the ESZ signal from the trigger circuitry shown in FIG. 60 and becomes the Z signal to the display. The Z signal also goes to the auxiliary Z circuit 5990 which provides the auxiliary Z signal on line 5991.

The line length approximation from the line generator Z-axis circuit 5880 also goes to the long line comparator circuit 5885 which decides whether the line should be drawn as a long line (19 microsecond drawing time) or a short line (4 microsecond drawing time). This decision is stored at the input register and sent to the line generator as the signal LL on line 5771. The long line/short line timing circuit 5820 uses the signal LL and the signal LGCLK on line 5818 to control the line generator set up and drawing periods. It provides the signal INTR on a line 5821 which is used by the main control circuitry shown in FIG. 54 to determine when to send new X and Y values to the line generator circuitry. It also provides timing signals to the integrator switch driver 5830 and the sample and hold switch driver 5870. These two circuits form the drive signals needed for the line generator.

The control of display blanking begins at the input register 5802. Blinking and blanking information are held in this register during the line drawing period. The blanking logic circuit 5850 controls the display blanking. It unblanks, blanks or blinks lines as required by input register 5802. It multiplexes the digital storage blanking with the fast sweep retrace blanking.

Referring now to FIG. 60 there is shown the trigger circuitry of the preferred embodiment. The most important function of the circuitry is to provide the HSWP signal on line 2441. This signal is generated by high sweep control circuit 6030. This signal is used by the A3 digital storage circuitry shown in FIG. 56 to control signal tracking and conversion. It is also used by the frequency control circuitry shown in FIG. 24 to control the sweep generator in that circuit (the sweep is in progress when the signal HSWP is high and is stopped immediately at any point during the sweep when the signal HSWP goes low). Several circuits in the RF section sweep under certain conditions. For example, when a front panel key is pressed the A15 processor described with respect to FIGS. 38A–D pulls HSWP low to immediately stop the sweep. The signal HSWP is caused to go high by the occurrence of a sweep trigger or by a command which is input over instrument bus 2200.

The fast sweep generator circuit 6020 produces a linear ramp voltage from zero volts to approximately plus 2.2 volts which is used as a horizontal sweep for the CRT display. This signal is provided on line 6021. Data on instrument bus line 2200, lines 11 through 14 specify the fast sweep generator sweep time. The data is latched into register 6012 in fast sweep time control circuit 6010. The data on bus 2200 is strobed into register 6012 when the address line on address bus 2298 is address 51 and strobe signal LTIO occurs. Once the value is loaded into register 6012, switchable current sources 6015 provide the control signals on line 6016 and 6017 which are used along with the most significant bit signal on line 6018 by fast sweep generator 6020 to provide the fast sweep ramp signal on line 6021.

Fast sweep control 6050 contains circuitry for the end of sweep detection and controls fast sweep dead time as well as fast sweep triggering. End of sweep detection is determined as follows: When the sweep ramp signal on line 6021 reaches about 2.2 volts, flip-flop 6052 is set and generates the signal on line 6053. This causes discharge switch 6026 to discharge timing capacitors 6023. This signal LRTRC on line 6053 is high during the sweep and supplies the retrace blanking signal to the intensity control circuitry shown in FIG. 59.

Multivibrator circuit 6057 controls the sweep dead time. The multivibrator is triggered at the end of the fast sweep ramp and holds flip-flop 6052 and 6053 reset for a time which is determined by the RC network 6065. In the preferred embodiment, the dead time is about 15 microseconds for sweep times and from one microsecond through 100 milliseconds and about 120 microseconds for sweep times from 200 microseconds through 10 milliseconds. Sweep trigger circuit 6040 produces triggers for all sweep times. It contains the video, external and line trigger circuits. The fast sweep free run oscillator 6042 triggers multiplexer circuit 6044 which provides the desired trigger signal on line 6049 and the fast sweep auto trigger circuit 6046. A valid trigger signal is provided on line 6049 when a negative going transition at the selected input of trigger multiplexer 6044 occurs. This trigger signal will start a sweep only if the fast sweep control circuit 6050 and the high sweep control circuit 6030 are in the proper states. Note that the trigger source desired is latched into trigger register 6041 and is received via data bus 2200.

In fast sweep mode, the X output of the line generator circuitry of FIG. 57 on line 5795 and the fast sweep ramp must be multiplexed to the X deflection amplifier shown in FIG. 61 to produce and display consisting of the graticule and characters with the fast sweep ramp and the analog video signal. The video signal from the video processor shown in FIG. 50 is multiplexed to the Y deflection amplifier shown in FIG. 60, when the fast sweep ramp is multiplexed to the X deflection amplifier. In fast sweep mode, the output from the line generator circuits of FIG. 57 is applied to the CRT deflection amplifiers following the completion of at least one fast sweep ramp.

To provide uniform intensity between the fast sweep trace and the other information displayed on the CRT, the fast sweep intensity control circuit 6070 generates a voltage to control the CRT beam intensity (Z-axis) when the fast sweep ramp is being multiplexed with the other signals. The FSZ signal is dependent on the duty cycle of the fast sweep ramp, i.e., the ratio of time during which the ramp is in progress to the sum of dead time and sweep time. In the preferred embodiments, this signal FSZ varies from about 150 millivolts for low beam intensity for high duty cycle operation to about 2 volts (high beam intensity for very low duty cycle operation). The signal LRTRC on line 6053 high during the fast sweep ramp provides a digital waveform which is averaged and inverted by transistors 6071 and its associated circuitry. This provides an output voltage to transistor 6072 that is dependent on the average value of the LRTRC signal.

Note that the signal HSWP on line 2441 may be cleared by setting instrument bus 2200 bit 13 high, selecting address 50 which will cause HSWP to be cleared at the next occurrence of strobe signal LTIO. Note that the signal HSWP may also be cleared by the digital control circuitry of FIG. 54 which provides the signal RSHS on line 6031.

FIGS. 61A and 61B show the X and Y deflection amplifiers which provide the drive signals to the CRT horizontal and vertical deflection plates.

Referring now to FIG. 62, there is shown the Z-axis circuitry of the preferred embodiment. This circuit receives two control signals from the intensity control circuitry shown in FIG. 58. One of these is a Z-axis signal on line 5998 which is a zero to 2 volt signal which is proportional to the CRT writing rate; the other is the blanking signal BLANK on line 5852. The Z signal after attenuation by the front panel intensity potentiometer 6222 drives the input stage of an amplifier comprising transistors 6226 and 6227. This amplifier supplies a differential current output to the focus gate amplifier circuitry 6250 and through the blanking switch circuitry 6210 to the control gate amplifier 6240.

The control gate amplifier 6240 is a virtual ground current summing junction. When the signal BLANK on line 5852 is low, transistor 6215 is off and the output of the control gate amplifier 6240 on line 6243 drops to a few volts blanking the CRT display.

The focus gate amplifier supplies a correction voltage on line 6253 to the focus grid of the CRT to compensate for defocusing effects which occur with varying intensity levels. The magnitude of this correction voltage is set by focus gain adjustment 6251.

FIG. 63 shows the schematic diagram of the keyboard switches of the preferred embodiment. Also shown is the circuitry for the status indicators which are activated as described in more detail above.

APPENDIX A

PROCESSOR 2015 MACHINE INSTRUCTIONS

NOTATION

Assembly language machine instructions are three-letter mnemonics. Each machine instruction source statement corresponds to a machine-operation in the object program produced by the assembler. Notation used is representing source statements is explained below:

| | |
|---|---|
| label | Optional statement label. Labels must begin with an alphabetic character, period, or certain other non-numeric characters. Labels may be one through five characters in length. If present, a label must begin in column 1. A space terminates a label. If a statement does not have label, then column 1 must be a blank. |
| m | Memory location. This can be an octal or decimal integer, a symbol used as a label elsewhere, or, an expression composed of a combination of these combined through + and - operators. Parentheses are not permitted in expressions. |
| n (lower case) | Numerical quantity. A numeric value that is not an address, but represents a shift or skip amount. |
| N (upper case) | Octal or decimal constant whose value is restricted to the range: $1 \leq N \leq 20_8 = 16_{10}$<br>ASMA allows N to also be any expression, provided that the value of the expression is within the stated range. |
| I | Indirect addressing indicator for memory reference instructions. Also indicates an automatic increment for place and withdraw instructions. |
| D | Decrement indicator for place and withdraw instructions. |
| P | Indicator used in Return instructions to instruct the IOC to pop its peripheral address stack. |
| reg. 0-7 | Register location. This can be an octal or decimal integer, or an assembler-pre-defined symbol. It might even be an expression. Regardless of what it is, it must have a value of $0_8$ through $7_8$, inclusive. |
| reg. 4-7 | Register location. Same rules as for reg. 0-7 above, except the value must be $4_8$ - $7_8$, inclusive. |
| .../... | The slash indicates the item on either side (but not both) may be used at this place in the source statement. |
| comments | Optional comments. Comments must be separated |

by at least one space from the material to the left of the comment.

[ ] Brackets indicate that the item contained within them is optional.

MEMORY REFERENCE GROUP

Each of the 14 memory reference instructions performs some operation based upon the contents of a referenced memory location. Unless the reference is to a location on the base page, it must be on the same current page as the instruction. The assembler determines which type of page-reference is used, and sets the B/C bit (bit 10) of the instruction accordingly. The least ten significant bits of the address of the referenced location are enclosed in bits 0-9 of the instruction. A memory reference may be indirect. In the source this is indicated with a ,I after the operand. This is assembled by making bit 15 of the instruction be a one.

| label | LDA | m [ ,I ] | comments |
|---|---|---|---|

Load A from m. The A register is loaded with the contents of the addressed memory location.

| label | LDB | m [ ,I ] | comments |
|---|---|---|---|

Load B from m. The B register is loaded with the contents of the addressed memory location.

| label | CPA | m [ ,I ] | comments |
|---|---|---|---|

Compare the contents of m with the contents of A; skip if unequal. The two 16-bit words are compared bit by bit. If they differ the next instruction is skipped, otherwise it is executed next.

| label | CPB | m [ ,I ] | comments |
|---|---|---|---|

Compare the contents of m with the contents of B; skip if unequal. The two 16-bit words are compared bit by bit. If they differ the next instruction is skipped, otherwise it is executed next.

| label | ADA | m [ ,I ] | comments |
|---|---|---|---|

Add the contents of m to A. The contents of the addressed memory location are added to those of A. The binary sum remains in A while the contents of m remain unchanged. If a carry occurs from bit 15 the E register is set to a one, otherwise, E is left unchanged. If an overflow occurs the OV register is set to a one, otherwise the OV register is left unchanged. The overflow condition occurs if there is a carry from either bits 14 or 15, but not both together.

| label | ADB | m [ ,I ] | comments |
|---|---|---|---|

Add the contents of m to B. Otherwise identical to ADA.

| label | STA | m [ ,I ] | comments |
|---|---|---|---|

Store the contents of A in m. The contents of the A register are stored into the addressed memory location, whose previous contents are lost.

| label | STB | m [ ,I ] | comments |
|---|---|---|---|

Store the contents of B in m. The contents of the B register are stored into the addressed memory location, whose previous contents are lost.

| label | JSM | m [ ,I ] | comments |
|---|---|---|---|

JSX is JSM to External Name

Jump to subroutine. JSM permits jumping to subroutines in either ROM or R/W memory. The value of the pointer in the return stack register (R) is incremented by one and the value of P (the location of the JSM) is stored in R,I. Program execution resumes at m.

MEMORY REFERENCE GROUP (CONT.)

| label | JMP | m [ ,I ] | comments |
|---|---|---|---|

JMX is JMP to External Name

Jump to m. Program execution continues at location m.

| label | ISZ | m [ ,I ] | comments |
|---|---|---|---|

Increment m; skip if zero. ISZ adds one to the contents of the referenced location, and writes the sum into that location. If the sum is zero, the next instruction is skipped. ISZ does not alter the contents of E and OV.

| label | DSZ | m [ ,I ] | comments |
|---|---|---|---|

Decrement m, skip if zero. DSZ subtracts one from the contents of the referenced location, and writes the difference into that location. If the difference is zero, the next instruction is skipped. DSZ does not alter the contents of E and OV.

| label | AND | m [ ,I ] | comments |
|---|---|---|---|

Logical and of A and m. The contents of A and m are and'ed, bit by bit, and the result is left in A.

| label | IOR | m [ ,I ] | comments |
|---|---|---|---|

Inclusive or of A and m. The contents of A and m are or'ed, bit by bit, and the result is left in A. The inclusive or is the "ordinary or" operation.

| label | RET | m [ ,P ] | comments |
|---|---|---|---|

Return. The R register is a pointer into a stack of words in R/W memory containing the addresses of previous subroutine calls. A read R,I occurs. That produces the address (P) of the latest JSM that occurred. The BPC then jumps to address P+n, and R is decremented. The value of n may range from -32 to 31, inclusive. The value of n is encoded into bits 0 through 5 of the instructions as a 6 bit, two's complement, binary number.

| label | CLA | comments |
|---|---|---|

Clear A.

of clearing the A register.

| label | CLB | comments |
|---|---|---|

Clear B.

of clearing the B register.

| label | NOP | comments |
|---|---|---|

Null operation.

SHIFT-ROTATE GROUP

The shift-rotate instructions perform re-arrangements of the bits of the A and B registers. Each shift-rotate instruction includes a four-bit field in which the shift or rotate amount is encoded. The number to be encoded in the field is represented by n. In the source text n may range from 1 to 16, inclusive. The four-bit field (bits 0 through 3) will contain the binary code for n-1.

| label | AAR | n | comments |
|---|---|---|---|

Arithmetic right shift of A. The A register is shifted right n places with the sign bit (bit 15) filling all vacated bit positions; the n+1 most significant bits become equal to the sign bit.

SHIFT-ROTATE GROUP (CONT.)

| label | ABR | n | comments |
|---|---|---|---|

Arithmetic right shift of B. The B register is shifted right n places with the sign bit (bit 15) filling all vacated bit positions; the n+1 most significant bits become equal to the sign bit.

| label | SAR | n | comments |
|---|---|---|---|

Shift A right. The A register is shifted right n places with all vacated bit positions cleared; the n most significant bits become zeros.

| label | SBR | n | comments |
|---|---|---|---|

Shift B right. The B register is shifted right n places with all vacated bit positions cleared: the n most significant bits become zeros.

| label | SAL | n | comments |
|---|---|---|---|

Shift A left. The A register is shifted left n places; the n least significant bits become zeros.

| label | SBL | n | comments |
|---|---|---|---|

Shift B left. The B register is shifted left n places; the n least significant bits become zeros.

| label | RAR | n | comments |
|---|---|---|---|

Rotate A right. The A register is rotated right n places, with bit 0 rotating into bit 15.

| label | RBR | n | comments |
|---|---|---|---|

Rotate B right. The B register is rotated right n places, with bit 0 rotating into bit 15.

ALTER-SKIP GROUP

The alter-skip instructions each contain a six bit field which allows a relative branch of any of 64 locations. The distance of the branch is represented by a displacement, n; n may be within the range of -32 to 31, inclusive.

The arguments for the instructions of this group are shown as *±n, or, m. An argument of n by itself will generally cause an error. Internally, the assembler subtracts the current value of * from the argument as part of the evaluation process. So *±n-* is simply ±n, and m-* becomes a relative displacement rather than an actual address. This business of subtracting * was done to allow symbols and addresses (these are m's) as arguments. Thus it is possible to write SZA HOOK. All that is required is that HOOK be within the allowable skip distance of the instruction.

Bits 0 through 5 are coded with the value of n (or m-*) as follows: if the value is positive or zero, bit 5 is zero, and bits 0 through 4 receive the straight binary code for the value of n - if the value is negative, bit 5 is a 1, and bits 0 through 4 receive a complemented and incremented binary code.

| For n or m-* = | bits 5 - 0 | meaning: |
|---|---|---|
| -32 | 100000 | if skip, next instruction is *-32 |
| - 7 | 111001 | if skip, next instruction is *-7 |
| - 1 | 111111 | if skip, next instruction is *-1 |
| 0 | 000000 | if skip, repeat this instruction |
| 1 | 000001 | do next instruction, regardless |
| 7 | 000111 | if skip, next instruction is *+7 |
| 31 | 011111 | if skip, next instruction is *+31 |

All instructions in the alter-skip group have the "skip" properties outlined above. Some of the instructions also have an optional "alter" property. This is where the general instruction form "skip if <some one bit condition>" is supplemented with the ability to alter the state of the bit mentioned in the condition. The alteration is to either set the bit, or clear it. If specified, the alteration is done *after* the condition is tested, never before.

ALTER-SKIP GROUP (CONT.)

To indicate in a source statement that an instruction includes the alter option, and to specify whether to clear or to set the tested bit, a comma-C or comma-S follows *±n/m. The C indicates clearing the bit, while an S indicates setting the bit.

The "alter" information is encoded into the 16 bit instruction word with 2 bits. For such instructions, bit 7 is called the H/$\bar{H}$ (Hold/Don't Hold) bit, and bit 6 is the C/S (Clear/Set) bit. If bit 7 is a zero (specifying H) the "alter" option is not active; neither S nor C followed n in the source statement of the instruction, and the tested bit is left unchanged. If bit 7 is a 1 (specifying $\bar{H}$), then "alter" option is active, and bit 6 specifies whether it is S or C.

| label | SZA | * ± n/m | comments |
|---|---|---|---|

Skip if A zero. If all 16 bits of the A register are zero, skip the amount indicated by n, or, to m.

| label | SZB | * ± n/m | comments |
|---|---|---|---|

Skip if B zero. If all 16 bits of the B register are zero, skip the amount indicated by n, or, to m.

| label | RZA | * ± n/m | comments |
|---|---|---|---|

Skip if A not zero. If any of the 16 bits of the A register are set, skip the amount indicated by n, or, to m.

| label | RZB | * ± n/m | comments |
|---|---|---|---|

Skip if B not zero. If any of the 16 bits of the B register are set, skip the amount indicated by n, or, to m.

| label | SIA | * ± n/m | comments |
|---|---|---|---|

Skip if A zero, and then increment A. The A register is tested, and then incremented by one. If all 16 bits of A were zero before the increment, skip the amount indicated by n, or, to m. SIA does not affect the contents of E or OV.

| label | SIB | * ± n/m | comments |
|---|---|---|---|

Skip if B zero, and then increment B. The B register is tested, and then incremented by one. If all 16 bits of B were zero before the increment, skip the amount indicated by n, or, to m. SIB does not affect the contents of E or OV.

| label | RIA | * ± n/m | comments |
|---|---|---|---|

Skip if A not zero, and then increment A. The A register is tested, and then incremented by one. If any bits of A were one before the increment, skip the amount indicated by n, or, to m. RIA does not affect the contents of E or OV.

| label | RIB | * ± n/m | comments |
|---|---|---|---|

Skip if B not zero, and then increment B. The B register is tested, and then incremented by one. If any bits of B were one before the increment, skip the amount indicated by n, or, to m. RIB does not affect the contents of E or OV.

In connection with the next four instructions, Flag and Status are controlled by the peripheral interface addressed by the current select code. The select code is the number that is stored in the register named PA, located in the IOC. Both Status and Flag originate such that when a missing interface is addressed Status and Flag will appear to be false, or not set.

| label | SFS | * ± n/m | comments |
|---|---|---|---|

Skip if Flag line set. If the Flag line is true, skip the amount indicated by n, or, to m.

| label | SFC | * ± n/m | comments |
|---|---|---|---|

ALTER-SKIP GROUP (CONT.)

Skip if Flag line clear. If the Flag line is false, skip the amount indicated by n, or, to m.

| | | | |
|---|---|---|---|
| label | SSS | * ± n/m | comments |

Skip if Status line set. If the Status line is true, skip the amount indicated by n, or, to m.

| | | | |
|---|---|---|---|
| label | SSC | * ± n/m | comments |

Skip if Status line clear. If the Status line is false, skip the amount indicated by n, or, to m.

| | | | |
|---|---|---|---|
| label | SDS | * ± n/m | comments |

Skip if Decimal Carry set. Decimal Carry (DC) is a one-bit register in the EMC. It is controlled by the EMC, but connected to the decimal carry input of the BPC. If DC is set, skip the amount indicated by n, or, to m.

| | | | |
|---|---|---|---|
| label | SDC | * ± n/m | comments |

Skip if Decimal Carry clear. Decimal Carry (DC) is a one-bit register in the EMC. It is controlled by the EMC, but connnected to the decimal carry input of the BPC. If DC is clear, skip the amount indicated by n, or, to m.

| | | | |
|---|---|---|---|
| label | SHS | * ± n/m | comments |

Skip if Halt line set. If the Halt line is true, skip the amount indicated by n, or, to m.

| | | | |
|---|---|---|---|
| label | SHC | * ± n/m | comments |

Skip if Halt line clear. If the Halt line if false, skip the amount indicated by n, or, to m.

| | | | |
|---|---|---|---|
| label | SLA | * ± n/m [ ,S/,C ] | comments |

Skip if the least significant bit of A is zero. If the least significant bit (bit 0) of the A register is a zero, skip the amount indicated by n, or, to m. If either S or C is present, bit 0 is altered accordingly after the test.

| | | | |
|---|---|---|---|
| label | SLB | * ± n/m [ ,S/,C ] | comments |

Skip if the least significant bit of B is zero. If the least significant bit (bit 0) of the B register is a zero, skip the amount indicated by n, or, to m. If either S of C is present, bit 0 is altered accordingly after the test.

| | | | |
|---|---|---|---|
| label | RLA | * ± n/m [ ,S/,C ] | comments |

Skip if the least significant bit of A is non-zero. If the least significant bit (bit 0) of the A register is a one, skip the amount indicated by n, or, to m. If either S or C is present, bit 0 altered accordingly after the test.

| | | | |
|---|---|---|---|
| label | RLB | * ± n/m [ ,S/,C ] | comments |

Skip if the least significant bit of B is non-zero. If the least significant bit (bit 0) of the B register is a one, skip the amount indicated by n, or, to m. If either S or C is present, bit 0 is altered accordingly after the test.

| | | | |
|---|---|---|---|
| label | SAP | * ± n/m [ ,S/,C ] | comments |

Skip if A positive. If the sign bit (bit 15) of the A register is a zero, skip the amount indicated by n, or, to m. If either S or C is present, bit 15 is altered accordingly after the test.

| | | | |
|---|---|---|---|
| label | SBP | * ± n/m [ ,S/,C ] | comments |

ALTER-SKIP GROUP (CONT.)

Skip if B positive. If the sign bit (bit 15) of the B register is a zero, skip the amount indicated by n, or, to m. If either S or C is present, bit 15 is altered accordingly after the test.

| | | | |
|---|---|---|---|
| label | SAM | * ± n/m [ ,S/,C ] | comments |

Skip if A minus. If the sign bit (bit 15) of the A register is a one, skip the amount indicated by n, or, to m. If either S or C is present, bit 15 is altered accordingly after the test.

| | | | |
|---|---|---|---|
| label | SBM | * ± n/m [ ,S/,C ] | comments |

Skip if B minus. If the sign bit (bit 15) of the B register is a one, skip the amount indicated by n, or, to m. If either S or C is present, bit 15 is altered accordingly after the test.

| | | | |
|---|---|---|---|
| label | SOS | * ± n/m [ ,S/,C ] | comments |

Skip if overflow set. If the one-bit overflow register (OV) is set, skip the amount indicated by n, or, to m. If either S or C is present, the OV register is altered accordingly after the test.

| | | | |
|---|---|---|---|
| label | SOC | * ± n/m [ ,S/,C ] | comments |

Skip if overflow clear. If the one-bit overflow register is clear, skip the amount indicated by n, or, to m. If either S or C is present, the OV register is altered accordingly after the test.

| | | | |
|---|---|---|---|
| label | SES | * ± n/m [ ,S/,C ] | comments |

Skip if extend set. If the extend register (E) is set, skip the amount indicated by n, or, to m. If either S or C is present, E is altered accordingly after the test.

| | | | |
|---|---|---|---|
| label | SEC | * ± n/m [ ,S/,C ] | comments |

Skip if extend clear. If the extend register (E) is clear, skip the amount indicated by n, or, to m. If either S or C is present, E is altered accordingly after the test.

COMPLEMENT-EXECUTE GROUP

| | | |
|---|---|---|
| label | CMA | comments |

Complement A. The A register is replaced by its one's (bit by bit) complement.

| | | |
|---|---|---|
| label | CMB | comments |

Complement B. The B register is replaced by its one's (bit by bit) complement.

| | | |
|---|---|---|
| label | TCA | comments |

Two's complement A. The A register is replaced by its one's (bit by bit) complement, and then incremented by one. The E and OV registers are updated according to the results of the increment, in the same fashion as for the ADA instruction.

| | | |
|---|---|---|
| label | TCB | comments |

Two's complement B. The B register is replaced by its one's (bit by bit) complement, and the incremented by one. The E and OV registers are updated according to the results of the increment, in the same fashion as for the ADB instruction.

| | | | |
|---|---|---|---|
| label | EXE | $0 \leq m \leq 37_8$ [ ,I ] | comments |

Execute register m. The contents of any register can be treated as the current instruction, and executed in the normal manner. The register is left unchanged unless the instruction code causes it to be altered. The next instruction executed will be the one following the EXE m, unless the code in m causes a branch.

Indirect addressing is allowed. An EXE m, I causes the contents of m to be taken as the address of the place in memory whose contents are to be executed; this can be anywhere in memory, and need not be another register. In 15-bit versions of the processor, multi-level indirect addressing with EXE instruction is possible. Only one level is possible with the 16-bit processor.

STACK GROUP

The stack group manages first-in, last-out firmware stacks. The "place" instructions put a word or byte into a stack pointed at by C or D.* The item that is placed is reg. 0-7. The "withdraw" instructions remove a word or a byte from a stack pointed at by C or D. The removed item is written into reg. 0-7.

By the end of each place or withdraw instruction the stack pointer is either incremented or decremented, as specified by the optional I or D, respectively. In the absence of either an I or a D, the assembler defaults to I for place instructions, and D for withdraw instructions.

Place instructions increment or decrement the stack pointer prior to the placement, and withdraw instructions do it after the withdrawal. In this way the pointer is always left pointing at the top of the stack.

For byte operations using 15-bit version of the processor bit 15 of the pointer register (C or D) indicates left or right half (1 = left, 0 = right). Stack instructions involving bytes toggle bit 15 at each increment or decrement; but the lower bits of the pointer increment or decrement only during the zero-to-one transition of bit 15.

In the 16-bit version of the processor, the least-significant bit of the pointer register indicates left or right half (1 = left, 0 = right). Full 16-bit addressing is maintained by a most-significant bit (for each pointer register) in the form of the CB and DB registers. The C and CB registers, and D and DB registers, act as 17-bit registers during the automatic increment or decrement to the pointer registers.

The values of C and D for place-byte instructions must not be the address of any internal register for the BPC, EMC, or IOC. The place and withdraw instructions can also initiate I/O operations, so they are also listed under the I/O group.

| | | | |
|---|---|---|---|
| label | PWC | reg. 0-7 [,I/,D] | comments |

Place the entire word of reg. into the stack pointed at by C.

| | | | |
|---|---|---|---|
| label | PWD | reg. 0-7 [,I/,D] | comments |

Place the entire word of reg. into the stack pointed at by D.

| | | | |
|---|---|---|---|
| label | PBC | reg. 0-7 [,I/,D] | comments |

Place the right half of reg. into the stack pointed at by C.

| | | | |
|---|---|---|---|
| label | PBD | reg. 0-7 [,I/,D] | comments |

Place the right half of reg. into the stack pointed at by D.

* C and D are registers in the IOC; addresses $16_8$ and $17_8$, respectively.

| | | | |
|---|---|---|---|
| label | WWC | reg. 0-7 [,I/,D] | comments |

Withdraw an entire word from the stack pointed at by C, and put it into reg.

| | | | |
|---|---|---|---|
| label | WWD | reg. 0-7 [,I/,D] | comments |

STACK GROUP (CONT.)

Withdraw an entire word from the stack pointed at by D, and put it into reg.

| label | WBC | reg. 0-7 [,I/,D] | comments |
|---|---|---|---|

Withdraw a byte from the stack pointed at by C, and put it into the right half of reg.

| label | WBD | reg. 0-7 [,I/,D] | comments |
|---|---|---|---|

Withdraw a byte from the stack pointed at by D, and put it into the right half of reg.

| label | CBL* | comments |
|---|---|---|

Set the CB register to a zero. This specifies the lower block of memory pointed at by C and CB.

| label | CBU* | comments |
|---|---|---|

Set the CB register to a one. This specifies the upper block of memory pointed at by C and CB.

| label | DBL* | comments |
|---|---|---|

Set the DB register to a zero. This specifies the lower block of memory pointed at by D and DB.

| label | DBU* | comments |
|---|---|---|

Set the DB register to a one. This specifies the upper block of memory pointed at by D and DB.

* Part of the 16-bit processor's instruction set only.

I/O GROUP

The states of $\overline{IC1}$ and $\overline{IC2}$ during the I/O Bus Cycles initiated by the instructions below depend upon which register is the operand of the instruction:

| | $\overline{IC1}$ | $\overline{IC2}$ |
|---|---|---|
| R4 | 1 | 1 |
| R5 | 1 | 0 |
| R6 | 0 | 1 |
| R7 | 0 | 0 |

| label | mem. ref. inst. | reg. 4-7 [,I] | comments |
|---|---|---|---|

Initiate an I/O Bus Cycle. Memory reference instructions 'reading' from reg. cause input I/O Bus Cycles; those 'writing' to reg. cause output I/O Bus Cycles. In either case the exchange is between A or B and the interface addressed by the PA register (Peripheral Address Register - $11_8$); reg. 4-7 do not really exist as physical registers within any chip on the IDA Bus.

| label | stack inst. | reg. 4-7 [,I/,D] | comments |
|---|---|---|---|

Initiate an I/O Bus Cycle. Place instructions 'read' from reg., therefore they cause input I/O Bus Cycles. Withdraw instructions 'write' into reg., therefore they cause output I/O Bus Cycles. In either case the exchange is between the addressed stack location and the interface addressed by PA.

INTERRUPT GROUP

| label | EIR | comments |
|---|---|---|

Enable the interrupt system. This instruction cancels DIR.

| | | |
|---|---|---|
| label | DIR | comments |

Disable the interrupt system. This instruction cancels EIR.

DMA GROUP

| | | |
|---|---|---|
| label | SDO* | comments |

Set DMA outwards. This instruction specifies the read-from-memory, write-to-peripheral direction for DMA transfers.

| | | |
|---|---|---|
| label | SDI* | comments |

Set DMA inwards. This instruction specifies the read-from-peripheral, write-to-memory direction for DMA transfers.

| | | |
|---|---|---|
| label | DMA | comments |

Enable the DMA mode. This instructions cancels PCM and DDR.

| | | |
|---|---|---|
| label | PCM | comments |

Enable the Pulse Count Mode. This instruction cancels DMA and DDR.

| | | |
|---|---|---|
| label | DDR | comments |

Disable Data Request. This instruction cancels the DMA Mode and the Pulse Count Mode.

THE FOUR-WORD GROUP

| | | | |
|---|---|---|---|
| label | CLR | N | comments |

Clear N words. This instruction clears N consecutive words, beginning with location $< A >$. Remember: $1 \leq N \leq 16_{10}$.

$$0 \rightarrow \text{location} < A >$$

$$0 \rightarrow \text{location} < A > + 1$$

$$\circ$$
$$\circ$$
$$\circ$$

$$0 \rightarrow \text{location} < A > + N - 1$$

| | | | |
|---|---|---|---|
| label | XFR | N | comments |

Transfer N words. This instruction transfers the N consecutive words beginning at location $< A >$ to those beginning at $< B >$. Remember: $1 \leq N \leq 16_{10}$.

$$\text{location} < A > \rightarrow \text{location} < B >$$

$$\text{location} < A > + 1 \rightarrow \text{location} < B > + 1$$

$$\circ$$
$$\circ$$
$$\circ$$

$$\text{location} < A > + N - 1 \rightarrow \text{location} < B > + N - 1$$

THE MANTISSA SHIFT GROUP

| | | |
|---|---|---|
| label | MRX | comments |

Mantissa right shift of AR1 r-times, $r = < B_{0-3} >$, and $0 \leq r \leq 17_8 = 15_{10}$.

1st shift: $< A_{0-3} > \rightarrow D_1; \ldots < D_i > \rightarrow D_{i+1}; \ldots D_{12}$ is lost
jth shift: $0 \rightarrow D_1; \ldots < D_i > \rightarrow D_{i+1}; \ldots D_{12}$ is lost
rth shift: $0 \rightarrow D_1; \ldots < D_i > \rightarrow D_{i+1}; \ldots < D_{12} > \rightarrow A_{0-3}; 0 \rightarrow DC; 0 \rightarrow A_{4-15}$ Notice:

1) The first shift does not necessarily shift in a zero; the first shift shifts in $< A_{0-3} >$.
2) The last digit shifted out ends up as $< A_{0-3} >$.
3) If only one digit-shift is done, (1) and (2) happen together.
4) After (2), SE is the same as $< A_{0-3} >$.
5) Any more than eleven shifts is wasteful.

| label | MRY | comments |
|---|---|---|

Mantissa right shift of AR2 $< B_{0-3} >$ -times. Otherwise identical to MRY.

| label | MLY | comments |
|---|---|---|

Mantissa left shift of AR2 one time.
$< A_{0-3} > \rightarrow D_{12}; \ldots < D_i > \rightarrow D_{i-1}; \ldots < D_1 > \rightarrow A_{0-3}$; $0 \rightarrow DC$; $0 \rightarrow A_{4-15}$ At the conclusion of the operation SE equals $< A_{0-3} >$.

| label | DRS | comments |
|---|---|---|

Mantissa right shift of AR1 one time.
$0 \rightarrow D_1; \ldots < D_i > \rightarrow D_{i+1}; \ldots < D_{12} > \rightarrow A_{0-3}$; $0 \rightarrow DC$; $0 \rightarrow A_{4-15}$ At the conclusion of the operation SE equals $< A_{0-3} >$.

| label | NRM | comments |
|---|---|---|

Normalize AR2. The mantissa digits of AR2 are shifted left until $D_1 \neq 0$. If the original $D_1$ is non-zero, no shifts occur. If twelve shifts occur, then AR2 equals zero, and no further shifts are done. The number of shifts is stored as a binary number in B i. $0 \rightarrow B_{4-15}$; # of shifts $\rightarrow B_{0-3}$
ii. For $0 \leq < B_{0-3} > \leq 11$; $0 \rightarrow DC$
iii. If $< B_{0-3} > = 12$; $1 \rightarrow DC$

THE ARITHMETIC GROUP

| label | CMX | comments |
|---|---|---|

Ten's complement of AR1. The mantissa of AR1 is replaced with its ten's complement, and DC is set to zero.

The bug concerns the way Sync is treated. Under the right conditions a bus grant (think "DMA cycle") causes the EMC to give Sync too early. The result is simultaneous use of the IDA Bus by the EMC and BPC. The most apparent result is that the next instruction fetch by the BPC is garbled, which is a disaster.

| label | CMY | comments |
|---|---|---|

Ten's complement of AR2. The mantissa of AR2 is replaced with it ten's complement, and DC is set to zero.

| label | CDC | comments |
|---|---|---|

Clear Decimal Carry. Clears the DC register; $0 \rightarrow DC$.

| label | FXA | comments |
|---|---|---|

Fixed-point addition. The mantissas of AR1 and AR2 are added together, along with DC (as a $D_{12}$-digit), and the result is placed in AR2. If an overflow occurs, DC is set to one, otherwise, DC is set to zero at the completion of the addition.

During the addition the exponents are not considered, and are left strictly alone. The signs are also left completely alone.

THE ARITHMETIC GROUP (CONT.)

$$< AR1 > = D_1 \quad D_2 \quad D_3\text{--------}D_{12}$$
$$< AR2 > = D_1 \quad D_2 \quad D_3\text{--------}D_{12}$$
$$+ \qquad < DC > \leftarrow \text{initial value of DC}$$

$$\text{(overflow)} \rightarrow \text{"}D_0\text{"} \; D_1 \quad D_2 \quad D_3\text{--------}D_{12} \rightarrow AR2$$

"$D_0$" → DC (final value of DC)

| label | MWA | comments |
|---|---|---|

Mantissa Word Add. < B > is taken as four BCD digits, and added, as $D_9$ through $D_{12}$, to AR2. DC is also added in as a $D_{12}$. The result is left in AR2. If an overflow occurs, DC is set to one, otherwise, DC is set to zero at the completion of the addition.

During the addition the exponents are not considered, and are left strictly alone; as are the signs. MWA is intended primarily for use in rounding routines.

$$< B > = \text{--------}D_9 \quad D_{10} \quad D_{11} \quad D_{12}$$
$$< AR2 > = D_1\text{------}D_9 \quad D_{10} \quad D_{11} \quad D_{12}$$
$$+ \qquad < DC > \leftarrow \text{initial value of DC}$$

$$\text{(overflow)} \rightarrow \text{"}D_0\text{"} \; D_1\text{------}D_9 \quad D_{10} \quad D_{11} \quad D_{12} \rightarrow AR2$$

"$D_0$" → DC (final value of DC)

| label | FMP | comments |
|---|---|---|

Fast multiply. The mantissas of AR1 and AR2 are added together (along with DC as $D_{12}$) < $B_{0-3}$>-times; the result accumulates in AR2.

The repeated additions are likely to cause some unknown number of overflows to occur. The number of overflows that occurs is returned in $A_{0-3}$.

FMP is used repeatedly to accumulate partial products during BCD multiplication. FMP operates strictly upon mantissa portions; signs and exponents are left strictly alone.

$$< AR2 > + ((< AR1 >) \cdot (< B_{0-3} >)) + DC \rightarrow AR2$$

DC doesn't enter into these repeated additions except for the first one as shown at right. 0 → DC immediately after each overflow.

Represents the initial value of DC.

$0 \rightarrow DC, \quad 0 \rightarrow A_{4-15} \qquad$ # of overflows → $A_{0-3}$

| label | MPY | comments |
|---|---|---|

Binary Multiply Using Booth's Algorithm. The (binary) signed two's complement contents of the A and B registers are multiplied together. The thirty-two bit product is also a signed two's complement number, and is stored back into A and B. B receives the sign and most-significant bits, and A the least-significant bits:

$$< A > \cdot < B > \rightarrow \overbrace{< B > < A >}$$

| label | FDV | comments |
|---|---|---|

Fast Divide. The mantissas of AR1 and AR2 are added together until the first decimal overflow occurs. The result of these additions accumulates into AR2. The number of additions without overflow (n) is placed into B.

$$< AR2 > + < AR1 > + < DC > \rightarrow AR2 \quad \text{(repeatedly until overflow)}$$

then $$0 \rightarrow DC, \quad 0 \rightarrow B_{4-15}, \quad n \rightarrow B_{0-3}$$

FDV is used in floating-point division to find the quotient digits of a division. In general, more than one application of FDV is needed to find each digit of the quotient.

As with the other BCD instructions, the signs and exponents of AR1 and AR2 are left strictly alone.

APPENDIX B-1

```
ASMB,R,L
                                        HED FLT POINT MATH ROUTINES - HYBRID VERSION
                                        NAM BPCFP,7  E110585-1009A \
 *
 *     A-E110585-1008A-2
 *       E110585-1008A  (S)
 *       E110585-1009A  (R)
 *     16 MAR 1978
 *     LYNN WHEELWRIGHT
 *
           0                            EXT AR1LD,.LADC,.MPYD,.DIVF,AR1LN,AR1LP,AR1L
           0                            ENT DIV1,DIV1B,DIV1P,DIV1T,MPY1,MPY1B,MPY1P
           0                            ENT MPY1T,ADD1,ADD1B,ADD1P,ADD1T,SUB1,SUB1B
           0                            ENT SUB1P,SUB1T,MIN1,MIN1B,MIN1P,MIN1T
           0                            EXT .AMIN,.BMIN,AR0D,AR1D,AR2D,AR3D
           0                    A       EQU 0
           1                    B       EQU 1
           3                    R       EQU 3
          16                    C       EQU 16B
          17                    D       EQU 17B
     77763                      E       EQU 77763B
          20                    AR2     EQU 20B
     77770                      AR1     EQU 77770B
     77774                      AR0     EQU 77774B
     77764                      AR3     EQU 77764B
 *
 *
 * FLOATING POINT SUBTRACT
 *
       0  42000       1X  SUB1   JSM AR1LD
       1  42000      10X         JSM .AMIN
       2  66000      34R         JMP FADC
       3  42000       5X  SUB1B  JSM AR1LN
       4  66000       1R         JMP SUB1+1
       5  42000       6X  SUB1P  JSM AR1LP
       6  66000       1R         JMP SUB1+1
       7  42000       7X  SUB1T  JSM AR1LT
      10  66000       1R         JMP SUB1+1
 *
 * FLOATING POINT ADD
 *
      11  42000      11X  MIN1B  JSM .BMIN
      12  42000       5X  ADD1B  JSM AR1LN        OPERAND ADDRESS ON CSTAK
      13  66000      34R         JMP FADC
      14  42000      11X  MIN1   JSM .BMIN
      15  42000       1X  ADD1   JSM AR1LD
      16  66000      34R         JMP FADC
      17  42000      11X  MIN1P  JSM .BMIN
      20  42000       6X  ADD1P  JSM AR1LP
      21  66000      34R         JMP FADC
      22   2000     162R  SFTA   LDA =D-12
      23 174040                  TCB
      24  20001       1A         ADA B
      25 172004                  SAP X11          ANYTHING TO DO?
      26   2000     163R         LDA =D0          YES
      27  75400                  MRX
      30  66000      55R         JMP ADONE
      31 170201           X11    RET 1
      32  42000      11X  MIN1T  JSM .BMIN
      33  42000       7X  ADD1T  JSM AR1LT        OPERAND ON CSTAK
      34   1770   77770A  FADC   LDA AR1
      35   4020      20A         LDB AR2
      36 170405                  AAR 6
      37 174405                  ABR 6
      40 174040                  TCB
      41  24000                  ADB A
      42  76413                  SZB ADONE        EXPON=?
      43 170457                  SBM SFTA         NO
      44   2000     162R         LDA =D-12
      45  20001       1A         ADA B
      46 172023                  SAP AR12         WORTH SHIFTING?
      47      1       1A         LDA B            YES
      50 170605                  SAL 6
      51  20020      20A         ADA AR2          FIX UP EXPONENT
      52  30020      20A         STA AR2
      53   2000     163R         LDA =D0
      54  75500                  MRY              SHIF ACCUM MANTISSA
      55  42000       2X  ADONE  JSM .LADC
      56  72717                  SDC NORM
      57     20      20A         LDA AR2
      60  22000     164R         ADA =B100
      61  30020      20A         STA AR2
      62   2000     165R         LDA =D1
      63   6000     165R         LDB =D1
      64  75500                  MRY
```

```
    65  22000      166R          ADA  =D-5
    66 172402                    SAM  *+2
    67  71000                    MWA
    70 170201                    RET  1
    71   2000      13X   AR12    LDA  AR1D
    72   6000      14X           LDB  AR2D
    73  71403                    XFR  4
    74 170201                    RET  1
    75  71500            NORM    NRM
    76  72306                    SDS  NZERO
    77 174605                    SBL  6
   100 174040                    TCB
   101  24020      20A           ADB  AR2
   102  34020      20A           STB  AR2
   103 170201                    RET  1
   104   6000     167R   NZERO   LDB  =B100100
   105  34020      20A           STB  AR2
   106 170201                    RET  1
 * FLOATING POINT MULTIPLY
   107  42000       6X   MPY1P   JSM  AR1LP
   110  66000     116R           JMP  FMPC
   111  42000       5X   MPY1B   JSM  AR1LN       OPERAND ADDRESS ON CSTAK
   112  66000     116R           JMP  FMPC
   113  42000       1X   MPY1    JSM  AR1DD
   114  66000     116R           JMP  FMPC
   115  42000       7X   MPY1I   JSM  AR1LI       OPERAND ON CSTAK
   116  42000       3X   FMPC    JSM  .MPYD
   117   2000      12X           LDA  AR0D
   120   6000      13X           LDB  AR1D
   121  71403                    XFR  4
   122  71500                    NRM
   123  76412                    SZB  FMPX
   124 174040                    TCB
   125      1       1A           LDA  B
   126 170605                    SAL  6
   127  20020      20A           ADA  AR2
   130  30020      20A           STA  AR2
   131  26000     170R           ADB  =D12
   132   2000     163R           LDA  =D0
   133  75400                    MRX
   134  71200                    FXA
   135 170201            FMPX    RET  1
 *
   136  42000       6X   DIV1P   JSM  AR1LP
   137  66000     145R           JMP  FDVC
   140  42000       5X   DIV1B   JSM  AR1LN       OPERAND ADDRESS ON CSTAK
   141  66000     145R           JMP  FDVC
   142  42000       1X   DIV1    JSM  AR1DD
   143  66000     145R           JMP  FDVC
   144  42000       7X   DIV1I   JSM  AR1LI       OPERAND ON CSTAK
   145   1771   77771A   FDVC    LDA  AR1+1
   146  61772   77772A           IOR  AR1+2
   147  61773   77773A           IOR  AR1+3
   150  72002                    RZA  FDVD
   151 170201                    RET  1
   152  42000       4X   FDVD    JSM  .DIVF
   153   2000      13X           LDA  AR1D
   154   6000      14X           LDB  AR2D
   155  71403                    XFR  4
   156     20      20A           LDA  AR2
   157  22000     164R           ADA  =B100
   160  30020      20A           STA  AR2
   161  66000      75R           JMP  NORM
   161                           END
   162 177764
   163      0
   164    100
   165      1
   166 177773
   167 100100
   170     14

.AMIN   10X      .BMID   11X      .DIVF   4X       .LADC   2X
.MPYD   3X       0       163R     1       165R     100     164R
100100  167R     14      170R     177764  162R     177773  166R

A       0A       ADD1    15R      ADD1B   12R      ADD1P   20R
ADD11   33R      ADONE   55R      AR0     77774A   AR0D    12X
AR1     77770A   AR12    71R      AR1D    13X      AR1DD   1X
AR1LN   5X       AR1LP   6X       AR1LI   7X       AR2     20A
AR2D    14X      AR3     77764A   AR3D    15X      B       1A
C       16A      D       17A      DIV1    142R     DIV1B   140R
DIV1P   136R     DIV1I   144R     E       77763A   FADC    34R
FDVC    145R     FDVD    152R     FMPC    116R     FMPX    135R
MIN1    14R      MIN1B   11R      MIN1P   17R      MIN1I   32R
MPY1    113R     MPY1B   111R     MPY1P   107R     MPY1I   115R
NORM    75R      NZERO   104R     R       3A       SFIA    22R
SUB1    0R       SUB1B   3R       SUB1P   5R       SUB1I   7R
XI1     31R

RSPMAX=2 MSPMAX=39 NSPMAX=6 SSPMAX=339 DSPMAX=61
```

APPENDIX B-2

```
ASMB,R,L
                                         HED MATH ROUTINES - CHIP VERSION \
                                         NAM BPCMC,7  E110585-1011A \
 *
 *     A-E110585-1010A-2
 *       E110585-1010A   (S)
 *       E110585-1011A   (R)
```

```
   *      12 JUN 1978
   *      LYNN WHEELWRIGHT
   *
       0                                     ENT ARILD,.LADC,.MPYD,.DIVD,.DIVF,ARILN,ARIL
       0                                     ENT .AMIN,.BMIN,ARILP,.BDVF,.BDVS
       0                                     ENT ADD2,ADD3,ADD2B,ADD3B,ADD4B
       0                                     ENT ADD2P,ADD3P,ADD4P,ADD2T,ADD4T
       0                                     ENT MIN2,MIN3,MIN2B,MIN3B,MIN4B
       0                                     ENT MIN2P,MIN3P,MIN4P,MIN2T,MIN4T
       0                                     ENT SUB2,SUB3,SUB2B,SUB3B,SUB4B
       0                                     ENT SUB2P,SUB3P,SUB4P,SUB2T,SUB4T
       0                                     ENT MPY2,MPY3,MPY2B,MPY3B,MPY4B
       0                                     ENT MPY2P,MPY3P,MPY4P,MPY2T,MPY4T
       0                                     ENT DIV2,DIV3,DIV4,DIV2B,DIV3B,DIV4B
       0                                     ENT DIV2P,DIV3P,DIV4P,DIV2T,DIV4T
       0                                     ENT MOD2,MOD3,MOD4,MOD2B,MOD3B,MOD4B
       0                                     ENT MOD2P,MOD3P,MOD4P,MOD2T,MOD4T
       0                                     ENT ADD3T,SUB3T,MIN3T,MPY3T,DIV3T,MOD3T
       0                                     EXT AR0D,AR1D,AR2D,AR3D,.FRPB
       0                              A      EQU 0
       1                              B      EQU 1
       3                              R      EQU 3
      16                              C      EQU 16B
      17                              D      EQU 17B
   77763                              E      EQU 77763B
      20                              AR2    EQU 20B
       0        21                    AR2M   ABS AR2+1
   77770                              AR1    EQU 77770B
       1     77771                    AR1M   ABS AR1+1
   77774                              AR0    EQU 77774B
       2     77775                    AR0M   ABS AR0+1
       3     77777                    AR0L   ABS AR0+3
   77764                              AR3    EQU 77764B
       4     77765                    AR3M   ABS AR3+1
       5     77767                    AR3L   ABS AR3+3
   *
   77762                              TMPA   EQU 77762B
   77761                              TMPB   EQU 77761B
   77760                              CNTR   EQU 77760B
   77757                              TMP    EQU 77757B
   77756                              INDX   EQU 77756B
   *
   *  LONG SUB
   *
       0     42000        437R        SUB2   JSM AR1LD
       7     42000        461R               JSM .AMIN
      10     66000         32R               JMP .LADC
      11     42000        443R        SUB2B  JSM AR1LN
      12     66000          7R               JMP SUB2+1
      13     42000        447R        SUB2P  JSM AR1LP
      14     66000          7R               JMP SUB2+1
      15     42000        454R        SUB2T  JSM AR1LT
      16     66000          7R               JMP SUB2+1
   *
   *  LONG ADD
   *
      17     42000        473R        MIN2P  JSM .BMIN
      20     42000        447R        ADD2P  JSM AR1LP
      21     66000         32R               JMP .LADC
      22     42000        473R        MIN2B  JSM .BMIN
      23     42000        443R        ADD2B  JSM AR1LN       OPERAND ADDRESS ON CSTAK
      24     66000         32R               JMP .LADC
      25     42000        473R        MIN2   JSM .BMIN
      26     42000        437R        ADD2   JSM AR1LD
      27     66000         32R               JMP .LADC
      30     42000        473R        MIN2T  JSM .BMIN
      31     42000        454R        ADD2T  JSM AR1LT       OPERAND ON CSTAK
      32      1770     77770A         .LADC  LDA AR1
      33     20020        20A                ADA AR2
      34      4020        20A                LDB AR2
      35     71700                           CDC             CLEAR CARRY
      36     73403                           RLA OPSGN
      37     71200                    SMSGN  EXA
      40    170201                           RET 1
      41     77613                    OPSGN  RLB NAR2,C      OPPOSITE SIGNS
      42      1770     77770A                LDA AR1
      43     73201                           SLA *+1,C
      44     31770     77770A                STA AR1
      45      1771     77771A                LDA AR1+1
      46     61772     77772A                IOR AR1+2
      47     61773     77773A                IOR AR1+3
      50     72002                           RZA *+2
      51    170201                           RET 1           NOTHING TO DO
      52     71140                           CMX             COMPLEMENT AR1
      53     66000         66R               JMP DOIT
      54     34020        20A         NAR2   STB AR2
      55        21        21A                LDA AR2+1
      56     60022        22A                IOR AR2+2
      57     60023        23A                IOR AR2+3
      60     72005                           RZA DOIT-1
      61      2000         2X                LDA AR1D        MOVE AR1 TO AR2
      62      6000         3X                LDB AR2D
      63     71403                           XFR 4
      64    170201                           RET 1
      65     71040                           CMY             COMPLEMENT AR2 (ACCUM)
      66     71200                    DOIT   EXA
      67     72303                           SDS CXIT        CARRY?
      70     44020        20A                ISZ AR2         NO, SET SIGN NEGATIVE
      71     71040                           CMY             COMPLEMENT ACCUM
      72     71700                    CXIT   CDC             CLEAR CARRY
```

```
      73 170201                   RET 1
*
*  LONG MULTIPLY
*
      74  42000     447R  MPY2P  JSM AR1LP
      75  66000     101R         JMP SMPYC
      76  42000     443R  MPY28  JSM AR1LN     OPERAND ADDRESS ON CSTAK
      77  66000     101R         JMP SMPYC
     100  42000     454R  MPY21  JSM AR1LI     OPERAND ON CSTAK
     101  42000     110R  SMPYC  JSM .MPYD
     102   2000       2R         LDA AR0M      MOVE AR0 TO AR2
     103   6000                  LDB AR2M
     104  71402                  XFR 3
     105 170201                  RET 1
     106  42000     437R  MPY2   JSM AR1LD
     107  66000     101R         JMP SMPYC
*
     110   6000       3R  .MPYD  LDB AR0L
     111  35756   77756A         STB INDX
     112   6000       5R         LDB AR3L
     113  35757   77757A         STB TMP
     114   2000                  LDA AR2M      MOVE AR2 TO AR3
     115   6000       4R         LDB AR3M
     116  71402                  XFR 3
     117  71602                  CLR 3
     120   2000       2R         LDA AR0M      CLEAR AR0,AR2
     121  71602                  CLR 3
     122  71700                  CDC
     123  42000     137R         JSM MPY40
     124  55757   77757A         DSZ TMP
     125  55756   77756A         DSZ INDX
     126  42000     137R         JSM MPY40
     127  55757   77757A         DSZ TMP
     130  55756   77756A         DSZ INDX
     131  42000     137R         JSM MPY40
     132   1770   77770A         LDA AR1
     133  20020      20A         ADA AR2
     134  52000     725R         AND =B177701
     135  30020      20A         STA AR2
     136 170201                  RET 1
     137   2000     726R  MPY40  LDA =D-4
     140  31760   77760A         STA CNTR
     141 105757   77757A  MPY42  LDB TMP,I     INDX=PRODUCT
     142  76415                  SZB MPY50     TMP=MPYR
     143 174703                  RBR 4
     144 135757   77757A         STB TMP,I
     145 174513                  SBR 12
     146  75000                  FMP
     147   6000     727R         LDB =D1
     150  75500                  MRY
     151 161756   77756A         IOR INDX,I
     152 170703                  RAR 4
     153 131756   77756A         STA INDX,I
     154  45760   77760A         ISZ CNTR
     155  66000     141R         JMP MPY42
     156 170201                  RET 1
     157     23      23A  MPY50  LDA AR2+3
     160 131756   77756A         STA INDX,I
     161   2000     730R         LDA =D0
     162   6000     731R         LDB =D4
     163  75500                  MRY
     164 170201                  RET 1
*
*  LONG DIVIDE
*
     165  42000     447R  DIV2P  JSM AR1LP
     166  66000     172R         JMP SDIVC
     167  42000     443R  DIV28  JSM AR1LN     OPERAND ADDRESS ON CSTAK
     170  66000     172R         JMP SDIVC
     171  42000     454R  DIV21  JSM AR1LI     OPERAND ON CSTAK
     172  42000     225R  SDIVC  JSM .DIVD
     173   2000       2X         LDA AR1D      MOVE AR1 TO AR2
     174   6000       3X         LDB AR2D
     175  71403                  XFR 4
     176 170201                  RET 1
     177  42000     437R  DIV2   JSM AR1LD
     200  66000     172R         JMP SDIVC
*
     201  42000     447R  MOD2P  JSM AR1LP
     202  66000     206R         JMP SMODC
     203  42000     443R  MOD28  JSM AR1LN     OPERAND ADDRESS ON CSTAK
     204  66000     206R         JMP SMODC
     205  42000     454R  MOD21  JSM AR1LI     OPERAND ON CSTAK
     206  42000     225R  SMODC  JSM .DIVD
     207   2000       3X         LDA AR2D
     210  66000     403R         JMP NINEC     RETURN FROM NINES COMP TO USER
     211  42000     437R  MOD2   JSM AR1LD
     212  66000     206R         JMP SMODC
*
     213   2000     732R  .DIVF  LDA =D-12     FLOATING POINT ENTRY
     214  31760   77760A         STA CNTR       DO 12 DIGITS
     215   2000       4R         LDA AR3M
     216  31757   77757A         STA TMP       DIVIDEND POINTER
     217  71602                  CLR 3          CLEAR LSH DIVIDEND
     220   2000       1X         LDA AR0D
     221  71603                  CLR 4         CLEAR QUOTIENT AND SHIFT COUNT
     222  72101                  RIA *+1
     223  31756   77756A         STA INDX      QUOTIENT POINTER
     224  66000     277R         JMP DVG02
     225  71500           .DIVD  NRM           BCD ENTRY
```

```
220  35762  77762A          STB IMPA         IMPA=# LEADING ZEROES IN DIVID
227   2000                  LDA AR2M         SAVE DIVIDEND IN AR0
230   6000      2R          LDB AR0M
231  71402                  XFR 3
232   2000      1R          LDA AR1M         FETCH DIVISOR
233   6000                  LDB AR2M
234  71402                  XFR 3
235  71500                  NRM              DIV BY ZERO ??
236  72706                  SDC DV001
237   6000    733R  DOVFL   LDB =B114631     RETURN TO DUMBELL - DIV BY ZER
240  35771  77771A          STB AR1+1
241  35772  77772A          STB AR1+2
242  35773  77773A          STB AR1+3
243 170201                  RET 1
244  35761  77761A  DV001   STB IMPB         IMPB=# LEADING ZEROES IN DIVIS
245 174140                  CMB              COMPUTE # DIGITS TO BE GENERAT
246  25762  77762A          ADB IMPA         -# DIGITS = IMPA-TMPB-1
247  35760  77760A          STB CNTR
250  26000    734R          ADB =D12
251  35774  77774A          STB AR0          # DIGITS TO RIGHT SHIFT QUOTIE
252   2000      2R          LDA AR0M            WHEN DONE
253   6000                  LDB AR2M
254  71402                  XFR 3            RETRIEVE DIVIDEND
255   5761  77761A          LDB IMPB
256  26000    732R          ADB =D-12        COMPUTE # DIGITS FOR LEFT SHIF
257  66000    262R          JMP *+3
260   2000    730R          LDA =D0
261  75541                  MLY              LEFT SHIFT FOR AR3 FOR FIRST D
262  76176                  RIB *-2
263   2000                  LDA AR2M         PUT IN AR3
264   6000      4R          LDB AR3M
265  35757  77757A          STB IMP          DIVIDEND POINTER
266  71402                  XFR 3
267   2000      2R          LDA AR0M
270  31756  77756A          STA INDX         QUOTIENT POINTER
271   6000                  LDB AR2M         RETRIEVE DIVIDEND
272  71402                  XFR 3
273  71602                  CLR 3            CLR AR0
274   2000    730R          LDA =D0
275   5761  77761A          LDB IMPB         RIGHT SHIFT AR2 FOR FIRST DIVI
276  75500                  MRY
277 173201          DV002   SOC *+1,C        CLEAR OVFL AND DC
300  71700                  CDC
301   2000      3X          LDA AR2D
302  42000    403R          JSM NINEC        9'S COMP AR2
303   2000      4X          LDA AR3D
304  42000    403R          JSM NINEC        9'S COMP AR3
305   5760  77760A          LDB CNTR
306 176404                  SBM *+4          ANYTHING TO DO?
307   2000      2X          LDA AR1D         NO
310  71603                  CLR 4            RESULT = 0
311 170201                  RET 1            EXIT TO USER
312  42000    342R          JSM DV015
313  42000    322R          JSM LOOP5
314  42000    322R          JSM LOOP5
315  42000    322R          JSM LOOP5
316  45756  77756A          ISZ INDX
317  42000    322R          JSM LOOP5
320  45757  77757A          ISZ IMP
321  66000    313R          JMP *-6
322 101757  77757A  LOOP5   LDA IMP,I        GET A DIGIT
323 170713                  RAR 12
324 131757  77757A          STA IMP,I
325  75541                  MLY              SHIFT IN DIVIDEND
326  12000    735R          CPA =D9          SHOULD BE NINE
327  66000    342R          JMP DV015        IT IS
330  22000    736R          ADA =D-10
331  31762  77762A          STA IMPA         TAKE SPECIAL ACTION
332   2000    737R          LDA =D-1          TO HANDLE 13 DIGIT REMAINDER
333  72501          DV005   STA *+1
334  75041                  FDV
335  20001      1A          ADA B            COUNT # OF ADDS IN A REG
336  45762  77762A          ISZ IMPA         DONE ENOUGH
337  66000    333R          JMP DV005        NO
340   4000                  LDB A
341  66000    343R          JMP DV020        STORE DIGIT IN QUOTIENT
342  75041          DV015   FDV              GENERATE QUOTIENT DIGIT
343  71140          DV020   CMX
344  71200                  FXA              RESTORE DIVIDEND
345  71140                  CMX
346 101756  77756A          LDA INDX,I       STORE DIGIT IN QUOTIENT
347 170603                  SAL 4
350  60001      1A          IOR B
351 131756  77756A          STA INDX,I
352  45760  77760A          ISZ CNTR         DONE 12 DIGITS?
353 170201                  RET 1            NO - RETURN TO LOOP
354  54003      3A          DSZ R            YES - POP RETURN ADDRESS
355   5774  77774A  DV045   LDB AR0          FIX UP LAST WORD OF QUOTIENT
356  77002                  SLB *+2
357 170603                  SAL 4
360 174500                  SBR 1
361  77002                  SLB *+2
362 170607                  SAL 8
363 131756  77756A          STA INDX,I
364   2000      2R  DV050   LDA AR0M         FIX UP QUOTIENT
365   6000      1R          LDB AR1M
366  71402                  XFR 3
367   2000    730R          LDA =D0
370   5774  77774A          LDB AR0
371  75400                  MRX              RIGHT JUSTIFY QUOTIENT
```

```
      372   1770  77770A              LDA AR1        FIX UP EXPONENT
      373   4020     20A              LDB AR2
      374  73202                      SLA *+2,C      CHECK SIGNS
      375  26000    727R              ADB =D1
      376 170040                      TCA
      377  20001      1A              ADA B
      400  52000    725R              AND =B177701
      401  31770  77770A              STA AR1
      402 170201                      RET 1
*                          NINES COMPLEMENT ACCUMULATOR
      403  42000    405R      NINEC   JSM NINED      AREG PTS TO ACCUMULATOR TO BE
      404  42000    405R              JSM NINED        COMPLEMENTED
      405  72501              NINED   SIA *+1
      406 104000                      LDB A,I
      407 174040                      TCB
      410  26000    733R              ADB =B114631
      411 134000                      STB A,I
      412 170201                      RET 1
*
      413      3      3A      FRP1    LDA R
      414  22000    740R              ADA =D-2
      415 144000                      ISZ A,I
      416 100000                      LDA A,I
      417 100000                      LDA A,I
      420 170201                      RET 1
*
      421  42000    413R      AR1SL   JSM FRP1       LOAD AR1 WITH 4 DIGIT BCD
      422 100000              AR1SA   LDA A,I
      423  31773  77773A              STA AR1+3
      424   2000      2X              LDA AR1D
      425  71602                      CLR 3
      426 170201                      RET 1
      427  70760              AR1SN   WWC A
      430  66000    422R              JMP AR1SA
      431  42000      5X      AR1SP   JSM .FRPB
      432 100001      1A              LDA B,I
      433  31773  77773A              STA AR1+3
      434   2000      2X              LDA AR1D
      435  71602                      CLR 3
      436 170201                      RET 1
      437  42000    413R      AR1LD   JSM FRP1
      440 172204                      SAP AR1LA,C
      441 100000                      LDA A,I
      442  66000    440R              JMP *-2
      443  70760              AR1LN   WWC A
      444   6000      2X      AR1LA   LDB AR1D
      445  71403                      XFR 4
      446 170201                      RET 1
      447  42000      5X      AR1LP   JSM .FRPB
      450      1      1A              LDA B
      451   6000      2X              LDB AR1D
      452  71403                      XFR 4
      453 170201                      RET 1
      454   2000    726R      AR1LT   LDA =D-4
      455  20016     16A              ADA C
      456  30016     16A              STA C
      457  72165                      RIA AR1LA
      460  66000    444R              JMP AR1LA
*
      461   5770  77770A      .AMIN   LDB AR1
      462  77302                      SLB *+2,S
      463  77606                      RLB *+6,C
      464  35770  77770A              STB AR1
      465   5771  77771A              LDB AR1+1
      466  25772  77772A              ADB AR1+2
      467  25773  77773A              ADB AR1+3
      470  76002                      RZB *+2
      471  35770  77770A              STB AR1
      472 170201                      RET 1
      473  35761  77761A      .BMIN   STB TMPB
      474   4020     20A              LDB AR2
      475  77302                      SLB *+2,S
      476  77606                      RLB *+6,C
      477  34020     20A              STB AR2
      500   4021     21A              LDB AR2+1
      501  24022     22A              ADB AR2+2
      502  24023     23A              ADB AR2+3
      503  76002                      RZB *+2
      504  34020     20A              STB AR2
      505   5761  77761A              LDB TMPB
      506 170201                      RET 1
*
      507  42000    421R      SUB3    JSM AR1SL
      510  42000    461R              JSM .AMIN
      511  66000     32R              JMP .LADC
      512  42000    427R      SUB3B   JSM AR1SN
      513  66000    510R              JMP SUB3+1
      514  42000    431R      SUB3P   JSM AR1SP
      515  66000    510R              JMP SUB3+1
      516  42000    473R      MIN3P   JSM .BMIN
      517  42000    431R      ADD3P   JSM AR1SP
      520  66000     32R              JMP .LADC
      521  42000    473R      MIN3B   JSM .BMIN
      522  42000    427R      ADD3B   JSM AR1SN      OPERAND ADDRESS ON CSTAK
      523  66000     32R              JMP .LADC
      524  42000    473R      MIN3    JSM .BMIN
      525  42000    421R      ADD3    JSM AR1SL
      526  66000     32R              JMP .LADC
*
      527  42000    431R      MPY3P   JSM AR1SP
      530  66000    101R              JMP SMPYC
```

```
531  42000   427R  MPY3B  JSM ARISN     OPERAND ADDRESS ON CSTAK
532  66000   101R         JMP SMPYC
533  42000   421R  MPY3   JSM ARISL
534  66000   101R         JMP SMPYC
*
535  42000   431R  DIV3P  JSM ARISP
536  66000   172R         JMP SDIVC
537  42000   427R  DIV3B  JSM ARISN     OPERAND ADDRESS ON CSTAK
540  66000   172R         JMP SDIVC
541  42000   421R  DIV3   JSM ARISL
542  66000   172R         JMP SDIVC
*
543  42000   431R  MOD3P  JSM ARISP
544  66000   206R         JMP SMODC
545  42000   427R  MOD3B  JSM ARISN     OPERAND ADDRESS ON CSTAK
546  66000   206R         JMP SMODC
547  42000   421R  MOD3   JSM ARISL
550  66000   206R         JMP SMODC
*
 31                ADD3I  EQU ADD2I
 30                MIN3I  EQU MIN2I
 15                SUB3I  EQU SUB2I
100                MPY3I  EQU MPY2I
171                DIV3I  EQU DIV2I
205                MOD3I  EQU MOD2I
*
551  42000   565R  MOD4B  JSM DIV4B     OPERAND ADDRESS ON CSTAK
552  66000   563R         JMP MOD4C+1
553  42000     5X  MOD4P  JSM .FRPB
554  66000   562R         JMP MOD4C
555  42000   571R  MOD4I  JSM DIV4I     OPERAND ON CSTAK
556  66000   563R         JMP MOD4C+1
557 144003     3A  MOD4   ISZ R,I
560 104003     3A         LDB R,I
561 104001     1A         LDB B,I
562  42000   576R  MOD4C  JSM BDIVB
563      1     1A         LDA B
564 170201                RET 1
*
565  70761         DIV4B  RWC B         OPERAND ADDRESS ON CSTAK
566  66000   576R         JMP BDIVB
567  42000     5X  DIV4P  JSM .FRPB
570  66000   576R         JMP BDIVB
571  70761         DIV4I  RWC B         OPERAND ON CSTAK
572  66000   577R         JMP BDIVC
573 144003     3A  DIV4   ISZ R,I
574 104003     3A         LDB R,I
575 104001     1A         LDB B,I       GET DEF TO ADDRESS
576 104001     1A  BDIVB  LDB B,I       GET DIVISOR
577  42000   635R  BDIVC  JSM .BDVS     SET UP FOR DIVIDE
600   6000   730R         LDB =D0
601 170600         BD005  SAL 1         SKIP OVER USELESS ZEROES
602 172007                SAM BD011,C
603  45777 77777A         ISZ AR0+3
604  66000   601R         JMP BD005
605 170201                RET 1
606 170600         BD010  SAL 1
607 174600                SBL 1
610 172202                SAP *+2,C
611  76501         BD011  SIB *+1
612  25774 77774A  .BDVF  ADB AR0
613 177603                SES *+3,C
614  25775 77775A         ADB AR0+1
615 177602                SES BD030,C
616  72501                SIA *+1
617  45777 77777A  BD030  ISZ AR0+3     DONE?
620  66000   606R         JMP BD010     NO.
621  35774 77774A         STB AR0
622   5757 77757A         LDB TMP
623 176002                SBP *+2
624 170040                TCA
625   5776 77776A         LDB AR0+2
626 176403                SBM *+3
627   5774 77774A         LDB AR0
630 170201                RET 1
631   5774 77774A         LDB AR0
632 174040                TCB
633 170040                TCA
634 170201                RET 1
635  76416         .BDVS  SZB BDVFL
636  31776 77776A         STA AR0+2     SAVE DIVIDEND
637  35757 77757A         STB TMP       SAVE DIVISOR
640 176402                SBM *+2
641 174040                TCB
642  35774 77774A         STB AR0       -DIVISOR
643 174040                TCB
644  35775 77775A         STB AR0+1     +DIVISOR
645   6000   741R         LDB =D-15
646  35777 77777A         STB AR0+3     CNTR
647 172002                SAP *+2
650 170040                TCA
651 177201                SEC *+1,C
652 170201                RET 1
653   4000         BDVFL  LDB A
654   2000   742R         LDA =D32767
655 176002                SBP *+2
656 170040                TCA
657 173701                SOS *+1,S
660 170201                RET 1
*
```

```
661  70761          ADD4B WWC B
662  66000   664R         JMP ADD4P+1
663  42000     5X   ADD4P JSM .FRPB
664 120001     1A         ADA B,1
665 170201                RET 1
666  70761          ADD4I WWC B
667  20001     1A         ADA B
670 170201                RET 1
671  70761          MPY4B WWC B
672  66000   674R         JMP MPY4P+1
673  42000     5X   MPY4P JSM .FRPB
674 104001     1A         LDB B,1
675  75617                MPY
676 170201                RET 1
677  70761          MPY4I WWC B
700  75617                MPY
701 170201                RET 1
702  42000     5X   SUB4P JSM .FRPB
703 104001     1A   SUBC  LDB B,1
704 174040                TCB
705  20001     1A         ADA B
706 170201                RET 1
707  70761          SUB4B WWC B
710  66000   703R         JMP SUBC
711  70761          SUB4I WWC B
712  66000   704R         JMP SUBC+1
713  42000     5X   MIN4P JSM .FRPB
714 170040          MINC  TCA
715 120001     1A         ADA B,1
716 170201                RET 1
717  70761          MIN4B WWC B
720  66000   714R         JMP MINC
721  70761          MIN4I WWC B
722 170040                TCA
723  20001     1A         ADA B
724 170201                RET 1
724                       END
725 177701
726 177774
727      1
730      0
731      4
732 177764
733 114631
734     14
735     11
736 177766
737 177777
740 177776
741 177761
742  77777
```

```
.AMIN   401R    .BDVP   612R    .BDVS   635R    .BMIN   473R
.DIVD   225R    .DIVF   213R    .FRPB   5X      .LADC   32R
.MPYD   110R    0       730R    1       727R    11      735R
114631  733R    14      734R    177701  725R    177761  741R
177764  732R    177766  736R    177774  726R    177776  740R
177777  737R    4       731R    77777   742R    A       0A
ADD2    26R     ADD2B   23R     ADD2P   20R     ADD2I   31R
ADD3    525R    ADD3B   522R    ADD3P   517R    ADD3I   31R
ADD4B   661R    ADD4P   663R    ADD4I   666R    AR0     77774A
AR0D    1X      AR0L    3R      AR0M    2R      AR1     77770A
AR1D    2X      AR1LA   444R    AR1LD   437R    AR1LN   443R
AR1LE   447R    AR1LT   454R    AR1M    1R      AR1SA   422R
AR1SL   421R    AR1SN   427R    AR1SF   431R    AR2     20A
AR2D    3X      AR2M    0R      AR3     77764A  AR3D    4X
AR3L    5R      AR3M    4R      B       1A      BD005   601R
BD010   606R    BD011   611R    BD030   617R    BDIVB   576R
BDIVC   577R    BOVFL   653R    C       16A     CNIR    77760A
CX11    72R     D       17A     DIV2    177R    DIV2B   167R
DIV2P   165R    DIV2I   171R    DIV3    541R    DIV3B   537R
DIV3P   535R    DIV3I   171R    DIV4    573R    DIV4B   565R
DIV4P   567R    DIV4I   571R    DOIT    66R     DOVFL   237R
DV001   244R    DV002   277R    DV005   333R    DV015   342R
DV020   343R    DV045   355R    DV050   364R    E       77763A
FRP1    413R    INDX    77756A  LOOP5   322R    MIN2    25R
MIN2B   22R     MIN2P   17R     MIN2I   30R     MIN3    524R
MIN3B   521R    MIN3P   516R    MIN3I   30R     MIN4B   717R
MIN4P   713R    MIN4I   721R    MINC    714R    MOD2    211R
MOD2B   203R    MOD2P   201R    MOD2I   205R    MOD3    547R
MOD3B   545R    MOD3P   543R    MOD3I   205R    MOD4    557R
MOD4B   551R    MOD4C   562R    MOD4P   553R    MOD4I   555R
MPY2    106R    MPY2B   76R     MPY2P   74R     MPY2I   100R
MPY3    533R    MPY3B   531R    MPY3P   527R    MPY3I   100R
MPY40   137R    MPY42   141R    MPY4B   671R    MPY4P   673R
MPY4I   677R    MPY50   157R    NAR2    54R     NINEC   403R
NINEL   405R    OPSGN   41R     R       3A      SDIVC   172R
SMODC   206R    SMPYC   101R    SMSGN   37R     SUB2    6R
SUB2B   11R     SUB2P   13R     SUB2I   15R     SUB3    507R
SUB3B   512R    SUB3P   514R    SUB3I   15R     SUB4B   707R
SUB4P   702R    SUB4I   711R    SUBC    703R    TMP     77757A
TMPA    77762A  TMPB    77761A
```

KSPMAX=2 MSPMAX=39 NSPMAX=6 SSPMAX=919 USPMAX=158

APPENDIX B-3

```
ASMB,R,L
                             HED BPC SERVICE ROUTINES - CHIP VERSION
                             NAM BSRVC,7   EI10585-1031A \
*
*     A-EI10585-1030A-2
```

```
     *          E110585-1030A   (S)
     *          E110585-1031A   (R)
     *          7 MAR 1976
     *          LINN WHEELWRIGHT
     *
          0                          ENT  .MVE4,.CSHV,.LDAP,.STRD,.STRB,.LDBI
          0                          ENT  .SAR2,.LDBA,.RAR2,.ADDR
          0                          ENT  .ARGS,.STBC,.ARGA,.ARGL
          0                          ENT  .OPC4,.CLBV,.LDBP,.STBP
          0                          ENT  .LDSI,.LDSA,.LDSP,.DSGN,.STAP
          0                          ENT  .RTNA,.RTNB,.RTNI,.RTNL
          0                          ENT  .CLNP,.CLAI,.CLAP
          0                          ENT  .CLBI,.CLBP,.FRPB
          0                   A      EQU  0
          1                   B      EQU  1
          3                   R      EQU  3
         16                   C      EQU  16B
         17                   D      EQU  17B
      77763                   E      EQU  77763B
         20                   AR2    EQU  20B
      77777                   TMP    EQU  77777B
          0                          EXT  AR2D
     *
          0 144003       3A   .ADDR  ISZ  R,I           FETCH DEF
          1 100003       3A          LDA  R,I
          2 100000                   LDA  A,I
          3 170201                   RET  1
     *
          4  77004            .FRPB  SLB  *+4           LSB=1 : VALUE
          5 174400                   ABR  1                LDB STACK INDEX
          6  25763   77763A          ADB  E                JSM .FRPB
          7 170201                   RET  1                    BREG=ADDRESS
         10 174400                   ABR  1             LSB=0 : NAME ITEM
         11  25763   77763A          ADB  E
         12 104001       1A          LDB  B,I
         13 170201                   RET  1
     *
         14 144003       3A   .LDBI  ISZ  R,I
         15 100003       3A          LDA  R,I
         16 100000                   LDA  A,I
         17  66000      22R          JMP  .LDB
         20  42000       4R   .LDBP  JSM  .FRPB
         21      1       1A   .LDBA  LDA  B
         22   6000       1X   .LDB   LDB  AR2D
         23  71403                   XFR  4
         24 170201                   RET  1
         25 104003       3A   .MVE4  LDB  R,I
         26  76501                   STB  *+1
         27 100001       1A          LDA  B,I
         30  76501                   STB  *+1
         31 104001       1A          LDB  B,I
         32  71403                   XFR  4
         33 170203                   RET  3
         34  70761            .STBC  WWC  B
         35  66000      50R          JMP  .STRB
         36  42000       4R   .STBP  JSM  .FRPB
         37  66000      50R          JMP  .STRB
         40 144003       3A   .STRD  ISZ  R,I
         41 104003       3A          LDB  R,I
         42 104001       1A          LDB  B,I
         43  66000      50R          JMP  .STRB
         44   4016      16A   .SAR2  LDB  C
         45  26000     203R          ADB  =D4
         46  34016      16A          STB  C
         47  26000     204R          ADB  =D-3
         50   2000       1X   .STRB  LDA  AR2D
         51  71403                   XFR  4
         52 170201                   RET  1
         53   2000       1X   .RTNB  LDA  AR2D
         54  71602                   CLR  3
         55   5763   77763A   .RTNI  LDB  E
         56  76101                   RIB  *+1
         57 100001       1A          LDA  B,I
         60  30023      23A          STA  AR2+3
         61   5763   77763A   .RTNA  LDB  E
         62  34016      16A          STB  C
         63  70761                   WWC  B
         64  35763   77763A          STB  E
         65  70761                   WWC  B
         66  24016      16A          ADB  C
         67  34016      16A          STB  C
         70 170201                   RET  1
         71   1763   77763A   .RTNL  LDA  E
         72   6000       1X          LDB  AR2D
         73  72101                   RIA  *+1
         74  71403                   XFR  4
         75  66000      61R          JMP  .RTNA
         76   6000     205R   .RAR2  LDB  =D-4
         77  24016      16A          ADB  C
        100  34016      16A          STB  C
        101  76501                   STB  *+1
        102 170201                   RET  1
        103     20      20A   .DSGN  LDA  AR2
        104 170700                   RAR  1
        105 170201                   RET  1
        106  35777   77777A   .ARGL  STB  TMP           AR2=1ST PARAM
        107  42000      44R          JSM  .SAR2
        110   5777   77777A          LDB  TMP
        111  66000     113R          JMP  .ARGS
        112  70540            .ARGA  PWC  A             AREG=1ST PARAM
        113  70541            .ARGS  PWC  B             BREG=-# WORDS ON STACK
```

```
114   5763   77763A              LDB E
115  70541                       PAC B
116   4016      16A              LDB C
117  35763   77763A              STB E
120 170201                       RET 1
121   6000     203R       .UPC4  LDB =D4      INCREMENT STACK 4
122  24016      16A              ADB C
123  34016      16A              STB C
124 170201                       RET 1
125 144003       3A       .CLB1  ISZ R,I      PUSH VARIABLE ON CSTAK
126 104003       3A              LDB R,I
127 104001       1A              LDB B,I
130  66000     132R              JMP .CLBV
131  42000       4R       .CLBP  JSM .FRPB    PUSH PARAM ITEM ON CSTAK
132      1       1A       .CLBV  LDA B        PUSH 4 WORDS ON CSTAK
133   4016      16A              LDB C
134  76501                       SIB *+1
135  71403                       XFR 4
136  26000     206R              ADB =D3
137  34016      16A              STB C
140 170201                       RET 1
141 144003       3A       .CLA1  ISZ R,I      PUSH DEF VALUE ON CSTAK
142 104003       3A              LDB R,I
143 104001       1A              LDB B,I
144  66000     153R              JMP .CSH
145  42000       4R       .CLAP  JSM .FRPB    PUSH VALUE OF ITEM ON CSTAK
146  66000     153R              JMP .CSH
147  42000       4R       .CLNP  JSM .FRPB    PUSH ADDRESS OF ITEM ON CSTAK
150  66000     154R              JMP .CSH+1
151 144003       3A       .CSHV  ISZ R,I      PUSH ADDRESS ON CSTAK
152 104003       3A              LDB R,I
153 104001       1A       .CSH   LDB B,I
154  70541                       PAC B
155 170201                       RET 1
156  42000       4R       .LDAP  JSM .FRPB
157 100001       1A              LDA B,I
160 170201                       RET 1
161   2000       1X       .LDSA  LDA AR2D
162  71602                       CLR 3
163  66000     175R              JMP .LDS1
164   2000       1X       .LDS1  LDA AR2D
165  71602                       CLR 3
166 144003       3A              ISZ R,I
167 104003       3A              LDB R,I
170 104001       1A              LDB B,I
171  66000     175R              JMP .LDS1
172   2000       1X       .LDSP  LDA AR2D
173  71602                       CLR 3
174  42000       4R              JSM .FRPB
175 100001       1A       .LDS1  LDA B,I
176  30023      23A       .LDS2  STA AR2+3
177 170201                       RET 1
200  42000       4R       .STAP  JSM .FRPB
201 130001       1A              STA B,I
202 170201                       RET 1
202                              END
203      4
204 177775
205 177774
206      3

.ADDR   0R       .ARGA   112R     .ARGL   106R     .ARGS   113R
.CLA1   141R     .CLAP   145R     .CLB1   125R     .CLBP   131R
.CLBV   132R     .CLNP   147R     .CSH    153R     .CSHV   151R
.DSGN   103R     .FRPB   4R       .LDAP   156R     .LDB    22R
.LDBA   21R      .LDB1   14R      .LDBP   20R      .LDS1   175R
.LDS2   176R     .LDSA   161R     .LDS1   164R     .LDSP   172R
.MVE4   25R      .RAR2   76R      .RTNA   61R      .RTNB   53R
.RTNJ   55R      .RTNL   71R      .SAR2   44R      .STAP   200R
.STBC   34R      .STBP   36R      .STRB   50R      .STRD   40R
.UPC4   121R     177774  205R     177775  204R     3       206R
4       203R     A       0A       AR2     20A      AR2D    1X
B       1A       C       16A      D       17A      E       77763A
R       3A       IPP     77777A

KSPMAX=2 MSPMAX=39 NSPMAX=6 SSPMAX=285 DSPMAX=158
```

APPENDIX B-4

```
ASFB,R,L
                                 HED ARRAY ADDRESS COMPUTE - CHIP VERSION \
                                 NAM ARRYC,7  ET10585-1033A \
*
*     A-ET10585-1032A-2
*       ET10585-1032A   (S)
*       ET10585-1033A   (F)
*     2 MAR 1978
*     DINN WHEELWRIGHT
*
     0                           ENT .ARRY,.ARRP
     0                           EXT .FRPB
     0                    A      EQU 0
     1                    B      EQU 1
     3                    R      EQU 3
    16                    C      EQU 16B
    17                    D      EQU 17B
 77763                    E      EQU 77763B
 77777                    IMP    EQU 77777B
 77776                    CNTR   EQU 77776B
 77775                    IPTR   EQU 77775B
```

```
  0   42000       1X  .ARRP  JSM .FRPB        GET ADDRESS OF ARRAY VECTOR
  1   66000       5R         JMP ARRAY
  2  144003       3A  .ARRY  ISZ R,I
  3  104003       3A         LDB R,I
  4  104001       1A         LDB B,I
  5   35775  77775A   ARRAY  STB TPTR
  6   70501                  STB *+1
  7   34017      17A         STB D
 10   70571                  WWD B,I          GET # OF DIMS
 11   35776  77776A          STB CNTR         D POINTS TO DIMENSION LIST
 12  174517                  CLB
 13   35777  77777A          STB TMP
 14   66000      21R         JMP LSTRT
 15  104017      17A  LOOP   LDB D,I
 16   75617                  MPY              Dmax*(Cmax*(Bmax*A+B)+C)+D
 17   31777  77777A          STA TMP
 20   70760                  WWC A
 21   22000      36R  LSTRT  ADA =D-1         STARTS WITH ELEMENT 1
 22   70571                  WWD B,I          GET NEXT DIMENSION LIMIT
 23  174040                  TCB
 24   24000                  ADB A            CHECK FOR OUT OF RANGE
 25  176402                  SBM *+2
 26  170517                  CLA              OUT OF RANGE
 27   21777  77777A          ADA TMP
 30   45776  77776A          ISZ CNTR
 31   66000      15R         JMP LOOP
 32  105775  77775A          LDB TPTR,I
 33   24000                  ADB A
 34  100001       1A         LDA B,I
 35  170201                  RET 1
 35                          END
 36  177777

.ARRP   0R       .ARRY   2R      .FRPB   1X       177777  36R
A       0A       ARRAY   5R      B       1A       C       16A
CNTR    77776A   D       17A     E       77763A   LOOP    15R
LSTRT   21R      R       3A      TMP     77777A   TPTR    77775A

KSPMAX=2 MSPMAX=39 NSPMAX=6 SSPMAX=90 DSPMAX=158
```

APPENDIX B-5

```
ASMB,R,L
                                              HED ARRAY ADDRESS COMPUTE - ONE DIMENSION
                                              NAM ARRYS,7  ET10585-1059A \
  *
  *       A-ET10585-1058A-2
  *         ET10585-1058A   (S)
  *         ET10585-1059A   (R)
  *       2 MAR 1978
  *       LYNN WHEELWRIGHT
  *
        0                                     ENT .ARAY,.ARAP,.LRAY,.LRAP
        0                                     EXT .FRPB
        0                          A          EQU 0
        1                          B          EQU 1
        3                          R          EQU 3
       16                          C          EQU 16B
       17                          D          EQU 17B
    77763                          E          EQU 77763B
    77777                          TMP        EQU 77777B
    77776                          CNTR       EQU 77776B
    77775                          TPTR       EQU 77775B
        0  170601                  .LRAP      SAL 2
        1   22000       25R                   ADA =D-3
        2   42000        1X        .ARAP      JSM .FRPB       GET ADDRESS OF ARRAY VECTOR
        3   66000       11R                   JMP ARRAY
        4  170601                  .LRAY      SAL 2
        5   22000       25R                   ADA =D-3
        6  144003        3A        .ARAY      ISZ R,I
        7  104003        3A                   LDB R,I
       10  104001        1A                   LDB B,I
       11   35775    77775A        ARRAY      STB TPTR
       12   22000       26R                   ADA =D-1        STARTS WITH ELEMENT 1
       13   26000       27R                   ADB =D2
       14  104001        1A                   LDB B,I
       15  174040                             TCB
       16   24000                             ADB A           CHECK FOR OUT OF RANGE
       17  176402                             SBM *+2
       20  170517                             CLA             OUT OF RANGE
       21  105775    77775A                   LDB TPTR,I      FETCH BEGIN OF ARRAY
       22   24000                             ADB A           ADD OFFSET
       23  100001        1A                   LDA B,I         FETCH ITEM
       24  170201                             RET 1
       24                                     END
       25  177775
       26  177777
       27       2

.ARAP   2R       .ARAY   6R       .FRPB   1X       .LRAP   0R
.LRAY   4R       177775  25R      177777  26R      2       27R
A       0A       ARRAY   11R      B       1A       C       16A
CNTR    77776A   D       17A      E       77763A   R       3A
TMP     77777A   TPTR    77775A

KSPMAX=2 MSPMAX=39 NSPMAX=6 SSPMAX=105 DSPMAX=158
```

APPENDIX B-6

```
ASMB,R,L
                                              HED TYPE CONVERSION ROUTINES - CHIP VERSION
                                              NAM TYPEC,7  ET10585-1013A \
  *
```

```
*    A-E110585-1012A-2
*      E110585-1012A  (S)
*      E110585-1013A  (R)
*    20 MAR 78
*    LINN WHEELWRIGHT
*
     0                       ENT  CNV12,CNV13,CNV14,CNV21,CNV23,CNV24
     0                       ENT  CNV31,CNV34,CNV41,CNV42,CNV43
     0                       ENT  CDB
     0                       EXT  AR2D
     0               A       EQU  0
     1               B       EQU  1
     3               R       EQU  3
    16               C       EQU  16B
    17               D       EQU  17B
 77763               E       EQU  77763B
    20               AR2     EQU  20B
 77776               CNTR    EQU  77776B
 77777               IMP     EQU  77777B
     0    6000  174R CNV43   LDB  =D0        CONVERT BINARY TO BCD
     1  172003               SAP  *+3
     2  170040               TCA
     3   76501               SIB  *+1
     4   34020   20A         STB  AR2
     5  174500               SBR  1
     6   34021   21A         STB  AR2+1
     7   34022   22A         STB  AR2+2
    10   30023   23A         STA  AR2+3
    11   22000  175R         ADA  =D-16
    12  172005               SAP  BCD10      A>=16
    13   22000  176R         ADA  =D6
    14  172424               SAM  BCD30      A<10
    15   62000  177R         IOR  =B20
    16   66000   37R         JMP  BCD20      THAT'S ALL
    17    2000  200R BCD10   LDA  =D-10000
    20   20023   23A         ADA  AR2+3
    21  172406               SAM  BCD15
    22   44022   22A         ISZ  AR2+2
    23   22000  200R         ADA  =D-10000
    24  172076               SAP  *-2
    25   22000  201R         ADA  =D10000
    26   30023   23A         STA  AR2+3
    27  170603       BCD15   SAL  4
    30    6000  202R         LDB  =D-1000
    31   42000   42R         JSM  BCD50
    32    6000  203R         LDB  =D-100
    33   42000   42R         JSM  BCD50
    34    6000  204R         LDB  =D-10
    35   42000   42R         JSM  BCD50
    36   60023   23A         IOR  AR2+3
    37   30023   23A BCD20   STA  AR2+3
    40  173201       BCD30   SOC  *+1,C
    41  170201               RET  1
    42   35777 77777A BCD50  STB  IMP
    43   24023   23A         ADB  AR2+3
    44  176410               SBM  BCD60
    45   72501               SIA  *+1
    46   25777 77777A        ADB  IMP
    47  176075               SBP  *-2
    50  174040               TCB
    51   25777 77777A        ADB  IMP
    52  174040               TCB
    53   34023   23A         STB  AR2+3
    54  170603       BCD60   SAL  4
    55  170201               RET  1
    56   42000   67R CNV13   JSM  CNV12
    57      21   21A CNV23   LDA  AR2+1
    60   60020   20A         IOR  AR2
    61   60022   22A         IOR  AR2+2
    62   72456               SZA  BCD30
    63  173701               SOS  *+1,S
    64    2000    1X         LDA  AR2D
    65   71602               CLR  3
    66  170201               RET  1
     0               CNV42   EQU  CNV43
    67    4020   20A CNV12   LDB  AR2
    70  176004               SBP  *+4
    71    2000    1X         LDA  AR2D
    72   71603               CLR  4
    73  170201               RET  1
    74  174405               ABR  6
    75  174040               TCB
    76   26000  205R         ADB  =D12
    77   76410               SZB  BCDY
   100  176413               SBM  BCDX
   101    2000  174R         LDA  =D0
   102   75500               MRY
   103   22000  206R         ADA  =D-5
   104  172403               SAM  BCDY
   105    6000  207R         LDB  =D1
   106   71000               MWA
   107    2000  207R BCDY    LDA  =D1
   110   50020   20A         AND  AR2
   111   30020   20A         STA  AR2
   112  170201               RET  1
   113  173774       BCDX    SOS  BCDY,S
   114   66000  107R         JMP  BCDY
   115   42000       CNV41   JSM  CNV43
   116   71500       CNV31   MRX
   117   72704               SLC  *+4
```

```
120   2000   210R         LDA  =B100100
121  30020    20A         STA  AR2
122 170201                RET  1
123      1     1A         LDA  B
124 170040                TCA
125  22000   205R         ADA  =D12
126 170505                SAL  6
127  60020    20A         IOR  AR2
130  30020    20A         STA  AR2
131 170201                RET  1
116                CNV21  EQU  CNV31
132  42000    67R  CNV14  JSM  CNV12
133     22    22A  CNV24  LDA  AR2+2
134  52000   211R         AND  =B177774
135  60021    21A         IOR  AR2+1
136  72015                RZA  OVFL
137     23    23A  CNV34  LDA  AR2+3
140  42000   156R         JSM  CDB
141   4022    22A         LDB  AR2+2
142  77002                SLB  *+2
143  22000   201R         ADA  =D10000
144 174500                SBR  1
145  77002                SLB  *+2
146  22000   212R         ADA  =D20000
147   4020    20A  CNVX1  LDB  AR2
150  77002                SLB  *+2
151 170040                TCA
152 170201                RET  1
153   2000   213R  OVFL   LDA  =D32767
154 173773                SOS  CNVX1,S
155  66000   147R         JMP  CNVX1
156   6000   174R  CDB    LDB  =D0
157  42000   167R         JSM  CDB20
160  42000   162R         JSM  CDB10
161  42000   162R         JSM  CDB10
162   4000         CDB10  LDB  A                  MPY BY 10
163 174601                SBL  2
164  24000                ADB  A
165 174600                SBL  1
166   1777 77777A         LDA  TMP
167 170713         CDB20  RAR  12
170  31777 77777A         STA  TMP
171  52000   214R         AND  =B17
172  20001     1A         ADA  B
173 170201                RET  1
173                       END
174      0
175 177760
176      6
177     20
200 154360
201  23420
202 176030
203 177634
204 177766
205     14
206 177773
207      1
210 100100
211 177774
212  47040
213  77777
214     17

0       174R   1       207R   100100  210R   14      205R
154360  200R   17      214R   176030  202R   177634  203R
177760  175R   177766  204R   177773  206R   177774  211R
20      177R   23420   201R   47040   212R   6       176R
77777   213R   A       0A     AR2     20A    AR20    1X
B       1A     BCD10   17R    BCD15   27R    BCD20   37R
BCD30   40R    BCD50   42R    BCD60   54R    BCDX    113R
BCT3    107R   C       16A    CDB     156R   CDB10   162R
CDB20   167R   CDIR    77776A CNV12   67R    CNV13   56R
CNV14   132R   CNV21   116R   CNV23   57R    CNV24   133R
CNV31   110R   CNV34   137R   CNV41   115R   CNV42   0R
CNV43   0R     CNVX1   147R   D       17A    E       77763A
OVFL    153R   R       3A     TMP     77777A

RSPMAX=2 MSPMAX=39 NSPMAX=6 SSPMAX=324 DSPMAX=155
```

APPENDIX B-7

```
ASMB,L,R
                                    HED ROUND BCDL NUMBER TO GIVEN DIGIT \
                                    NAM ROUND,7   E110585-1067A
     0                              ENT ROUND
     0                              EXT .DUFI
 *
 *    A-E110585-1066A-2
 *      E110585-1066A   (S)
 *      E110585-1067A   (R)
 *    29 MAR 1978
 *    LYNN WHEELWRIGHT
 *
 *       BCDL PROCEDURE ROUND(L,I); VALUE L,I; BCDL L; INTEGER I;
 *         L=QUANTITY TO BE ROUNDED
 *         I=DIGIT TO BE ROUNDED TO
 *       DIGITS NUMBERED 0 - 11  0=MOST SIGNIFICANT
 *
     0                      A       EQU 0
     1                      B       EQU 1
```

```
      16                  C      EQU 16B
       0 104016    16A    ROUND  LDB C,I
       1 174040                  TCB
       2  26000    17R           ADB =D11
       3 176003                  SBP *+3
       4  54016    16A           DSZ C
       5 170201                  RET 1
       6 134016    16A           STB C,I         SAVE SHIFT COUNT ON CSTAK
       7 170517                  CLA
      10  75500                  MRY
      11  22000    20R           ADA =D-5
      12 172403                  SAM *+3
      13   6000    21R           LDB =D1
      14  71000                  MWA             ADD 1 TO AR2
      15  70761                  MWC B           RETRIEVE SHIFT COUNT
      16  66000     1X           JMP .DLFT
      16            1A           END
      17     13
      20 177773
      21      1

.DLFT   1X        1     21R      13     17R      177773 20R
A       0A        B     1A       C      16A      ROUND  0R

KSFMAX=2 MSPMAX=39 NSPMAX=6 SSPMAX=40 DSPMAX=158
```

APPENDIX B-8

```
ASMB,R,L
                                 HED DECIMAL SHIFT FUNCTIONS - FDIGIT \
                                 NAM DSHFT,7  ET10585-1015A \
 *
 *      A-ET10585-1014A-2
 *        ET10585-1014A   (S)
 *        ET10585-1015A   (R)
 *      15 JULY 1977
 *      LYNN WHEELWRIGHT
 *
        0                        ENT .FDIG,.DLFT,.DRGT,.DSFT
 *
 *        DECIMAL SHIFT
 *        +=LEFT, -=RIGHT (BREG)
 *        AR2=DECIMAL NUMBER
 *        JSM .DSFT
 *
        0  76501          .FDIG  SIB *+1
        1 176411          .DSFT  SBM .DRGT
        2                 .DLFT  EQU *           AR2=DEC. NUM
        2  76407                 SZB DL20        BREG=# OF SHIFTS
        3 176402                 SBM *+2         JSM .DLFT    LEFT SHIFT AR2
        4 174040                 TCB
        5  76501                 SIB *+1
        6   2000    20R          LDA =D0
        7  75541                 MLY
       10  76176                 RIB *-2
       11 170201          DL20   RET 1
 *
       12                 .DRGT  EQU *           AR2=DEC. NUM
       12 176002                 SBP *+2         BREG=# OF SHIFTS (RIGHT)
       13 174040                 TCB             JSM .DRGT
       14   2000    20R          LDA =D0
       15  76402                 SZB *+2
       16  75500                 MRY
       17 170201                 RET 1
       17                        END
       20      0

.DLFT   2R       .DRGT  12R      .DSFT  1R       .FDIG  0R
0       20R      DL20   11R

KSFMAX=2 MSPMAX=39 NSPMAX=6 SSPMAX=39 DSPMAX=158
```

APPENDIX B-9

```
ASMB,R,L
                                 HED SHIFT ROTATE FUNCTIONS \
                                 NAM SHIFT,7  ET10585-1017A \
 *
 *      A-ET10585-1016A-2
 *        ET10585-1016A   (S)
 *        ET10585-1017A   (R)
 *      25 JULY 1977
 *      LYNN WHEELWRIGHT
 *
        0                        ENT .SRGT,.SLFT,.ARGT,.RLFT,.RRGT
        0                 A      EQU 0
        1                 B      EQU 1
        3                 R      EQU 3
       16                 C      EQU 16B
       17                 D      EQU 17B
   77777                  TMP    EQU 77777B
 *
        0  42000    12R   .SRGT  JSM ZCHK        LDA WORD
        1  42000    12R   .SLFT  JSM ZCHK        LDB SHIFT COUNT
        2  42000    12R   .ARGT  JSM ZCHK        JSM .(SHIFT)
        3  42000    12R   .RRGT  JSM ZCHK          AREG=RESULT
        4                 SDEF   DEF .SRGT
        5           6R    STAB   DEF *+1         *
        6 170500                 SAR 1           **
        7 170600                 SAL 1           *  *
       10 170400                 AAR 1           *   *
       11 170700                 RAR 1           *****
```

```
12  76414                   ZCHK  SZB  ZRIN
13  26000         33R             ADB  =D-1
14 174703                         RBR  4
15 174513                         SBR  12
16  35777     77777A              STB  IMF
17   6000          4R             LDB  SDEF
20 174040                         TCB
21 124003          3A             ADB  R,I
22  26000          5R             ADB  STAB
23 104001          1A             LDB  B,I
24  25777     77777A              ADB  IMF
25  70001                         EXE  3
26  54003          3A   ZRIN      DSZ  R
27 170201                         RET  1
30 174040               .RLFI     TCB
31  26000         34R             ADB  =D16
32  66000          3R             JMP  .RRGI
32                                END
33 177777
34     20

.ARGI   2R      .RLFI   30R      .RRGI   3R       .SLFI   1R
.SPGI   0R      177777  33R      20      34R      A       0A
B       1A      C       16A      D       17A      R       3A
SDEF    4R      STAB    5R       IMF     77777A   ZCHK    12R
ZRIN    26R

KSPMAX=2 ASPMAX=39 NSPMAX=6 SSPMAX=99 DSPMAX=158
```

APPENDIX B-10

```
ASMB,R,L
                                  HED TEST SET AND RESET BIT \
                                  NAM TSRBI,7  E110565-1019A \
 *
 *       A=E110565-1018A-2
 *         E110565-1018A  (S)
 *         E110565-1019A  (R)
 *       1 AUG 1977
 *       LINN WHEELWRIGHT
 *
     0                            ENT  .SBII,.RBII,.TBII
     0                    A       EQU  0
     1                    B       EQU  1
     3                    R       EQU  3
    16                    C       EQU  16B
    17                    D       EQU  17B
 77777                    IMF     EQU  77777B
 * BIT TEST AND SET FUNCTIONS
     0                    .TBII   EQU  *         TEST BIT AND SET SIGN
     0  42000      14R            JSM  BIT       LDA WORD
     1  50001       1A            AND  B         LDB BIT# (0-15)
     2  72402                     SZA  *+2       JSM .TBIT
     3   2000      27R            LDA  =D-1          AREG = RESULT
     4 170201                     RET  1
     5                    .SBII   EQU  *
     5  42000      14R            JSM  BIT
     6  60001       1A            IOR  B
     7 170201                     RET  1
    10  42000      14R    .RBII   JSM  BIT
    11 174140                     CMB
    12  50001       1A            AND  B
    13 170201                     RET  1
    14  31777   77777A    BIT     STA  IMF
    15   2000      30R            LDA  =D15
    16  50001       1A            AND  B
    17   6000      31R            LDB  =D1
    20  72404                     SZA  RIN
    21  22000      27R            ADA  =D-1
    22  62000      26R            IOR  SLFI
    23  70000                     EXE  A
    24   1777   77777A    RIN     LDA  IMF
    25 170201                     RET  1
    26 174600             SLFI    SEC  1
    26                            END
    27 177777
    30     17
    31      1

.RBII   10R     .SBII   5R       .TBII   0R       1       31R
17      30R     177777  27R      A       0A       B       1A
BIT     14R     C       16A      D       17A      R       3A
RIN     24R     SLFI    26R      IMF     77777A

KSPMAX=2 ASPMAX=39 NSPMAX=6 SSPMAX=82 DSPMAX=158
```

APPENDIX B-11

```
ASMB,R,L
                                  HED TEST AND TURN FUNCTIONS
                                  NAM TEST,7  E110565-1021A
 *
 *       A=E110565-1020A-2
 *         E110565-1020A  (S)
 *         E110565-1021A  (R)
 *       25 JULY 1977
 *       LINN WHEELWRIGHT
 *
     0                            ENT  .TEST,.TURN
     0                    A       EQU  0
```

```
         1                       B      EQU 1
         3                       R      EQU 3
        16                       C      EQU 16B
        17                       D      EQU 17B
     77777                       TMP    EQU 77777B
         0  42000     15R        .TEST  JSB KYGET
         1  50001      1A               AND B
         2  11777  77777A               CPA TMP
         3  66000      6R               JMP *+3            AREG_(ITEM AND MASK)=
         4   2000     40R               LDA =D0               (KEY AND MASK)
         5 170201                       RET 1
         6   2000     41R               LDA =D-1
         7 170201                       RET 1
        10  42000     15R        .TURN  JSB KYGET
        11 174140                       CMB
        12  50001      1A               AND B
        13  61777  77777A               IOR TMP            AREG_ITEM AND NOT MASK OR
        14 170201                       RET 1                    KEY AND MASK
        15  54003      3A        KYGET  DSZ R              AREG = KEY
        16 144003      3A               ISZ R,I            GET MASK
        17 104003      3A               LDB R,I
        20 104001      1A               LDB B,I
        21  70403                       SZB *+3
        22 104001      1A               LDB B,I
        23  66001     25R               JMP *+2
        24  70701                       [illegible] B
        25  50001      1A               AND B
        26  31777  77777A               STA TMP            TMP = KEY AND MASK
        27 144003      3A               ISZ R,I
        30 100003      3A               LDA R,I
        31 100000                       LDA A,I
        32  72403                       SZA *+3
        33 100000                       LDA A,I
        34  66000     36R               JMP *+2
        35  70700                       [illegible] A
        36  44003      3A               ISZ R              AREG=ITEM
        37 170201                       RET 1              BREG=MASK
        37                              END
        40      0
        41 177777

.TEST   0R        .TURN  10R       0      40R       177777 41R
A       0A        B      1A        C      16A       D      17A
KYGET   15R       R      3A        TMP    77777A

KSPMAX=2 RSPMAX=39 NSPMAX=6 SSPMAX=52 USPMAX=158
```

APPENDIX B-12

```
ASMB,R,L
                                        HED EQUAL CHECK
                                        NAM DEQL,7  ET10585-1023A
   *
   *     A-ET10585-1022A-2
   *       ET10585-1022A  (S)
   *       ET10585-1023A  (R)
   *     15 JULY 1977
   *     GINN WHEELWRIGHT
   *
          0                             ENT .EQL,.DEQL,.NEQL
         20                      AR2    EQU 20B
   *
          0     21     21A       .DEQL  LDA AR2+1
          1  60022     22A              IOR AR2+2
          2  60023     23A              IOR AR2+3
          3  72403               .EQL   SZA TRUE
          4   2000     12R       FALSE  LDA =D0
          5 170201                      RET 1
          6   2000     13R       TRUE   LDA =D-1
          7 170201                      RET 1
         10  72076               .NEQL  RZA TRUE
         11 170201                      RET 1
         11                             END
         12      0
         13 177777

.DEQL   0R        .EQL   3R        .NEQL  10R       0      12R
177777  13R       AR2    20A       FALSE  4R        TRUE   6R

KSPMAX=2 RSPMAX=39 NSPMAX=6 SSPMAX=52 USPMAX=158
```

APPENDIX B-13

```
ASMB,R,L
                                        HED EXECUTE CASE STATEMENT \
                                        NAM CASE,7  ET10585-1025A
   *
   *     A-ET10585-1024A-2
   *       ET10585-1024A  (S)
   *       ET10585-1025A  (R)
   *     25 JULY 1977
   *     LYNN WHEELWRIGHT
   *
          0                             ENT .CASE
          0                      A      EQU 0
          1                      B      EQU 1
          3                      R      EQU 3
         16                      C      EQU 16B
         17                      D      EQU 17B
   *
          0  72402               .CASE  SZA *+2         DEF CN
          1 172002                      SAP *+2         DEF CN-1
```

```
      2 170201                   RET 1               .
      3 104003      3A           LDB R,I             .
      4  54001      1A           DSZ B               DEF C1
      5 104001      1A           LDB B,I             DEC -N
      6  24000                   ADB A               JSM .CASE  AREG=CASE TO SELECT
      7 176402                   SEM *+2
     10 170201                   RET 1
     11 170140                   CMA
     12 120003      3A           ADA R,I
     13  54003      3A           DSZ R
     14 100000                   LDA A,I
     15 164000                   JMP A,I
     15                          END

.CASE   0R        A        0A        B        1A        C        16A
D       17A       R        3A

KSPMAX=2 MSPMAX=39 NSPMAX=6 SSPMAX=31 DSPMAX=158
```

APPENDIX B-14

```
ASMB,R,L
                                 HED PROCEDURE EXIT THROUGH FORMAL GOTO \
                                 NAM FGTO,7  ET10585-1027A
 *
 *    A-ET10585-1026A-2
 *      ET10585-1026A  (S)
 *      ET10585-1027A  (R)
 *    15 JULY 1977
 *    LYNN WHEELWRIGHT
 *
      0                          ENT .FGTO
      0                          EXT .CLV
      0                     A    EQU 0
      1                     B    EQU 1
      3                     R    EQU 3
     16                     C    EQU 16B
     17                     D    EQU 17B
 *
      0  42000      1X  .FGTO    JSM .CLV
      1 100001      1A           LDA B,I
      2  22000     11R           ADA =D-1
      3 104003      3A           LDB R,I
      4  54003      3A           DSZ R
      5 130003      3A           STA R,I
      6  26000     12R           ADB =D2
      7 104001      1A           LDB B,I
     10 164001      1A           JMP B,I          GO EXIT PROCEDURE
     10                          END
     11 177777
     12      2

.CLV    1X        .FGTO   0R        177777 11R        2        12R
A       0A        B       1A        C      16A        D        17A
R       3A

KSPMAX=2 MSPMAX=39 NSPMAX=6 SSPMAX=50 DSPMAX=158
```

APPENDIX B-15

```
ASMB,R,L
                                 HED READ AND WRITE ROUTINES - CHIP VERSION \
                                 NAM RDWRT,7  ET10585-1029A \
 *
 *    A-ET10585-1028A-2
 *      ET10585-1028A  (S)
 *      ET10585-1029A  (R)
 *    1 MAR 77
 *    LYNN WHEELWRIGHT
 *
      0                          ENT .WSTR,.R4,.R5,.R6,.R7
      0                          ENT .W4,.W5,.W6,.W7
      0                          ENT .WSTP
      0                          ENT .RS4,.RS5,.RS6,.RS7,.WS4,.WS5,.WS6,.WS7
      0                          ENT .WSPS,.WSTS
      0                     A    EQU 0
      1                     B    EQU 1
      3                     R    EQU 3
     16                     C    EQU 16B
     17                     D    EQU 17B
  77763                     E    EQU 77763B
      4                     R4   EQU 4
      5                     R5   EQU 5
      6                     R6   EQU 6
      7                     R7   EQU 7
     20                     AR2  EQU 20B
     11                     PA   EQU 11B
  77777                     CNTR EQU 77777B    AR1
 *
      0  34011     11A  .RS7     STB PA
      1      7      7A  .R7      LDA R7
      2  66000     27R           JMP RWEXT
      3  34011     11A  .RS6     STB PA
      4      6      6A  .R6      LDA R6
      5  66000     27R           JMP RWEXT
      6  34011     11A  .RS5     STB PA
      7      5      5A  .R5      LDA R5
     10  66000     27R           JMP RWEXT
```

```
      11  34011      11A  .RS4   STB PA
      12      4       4A  .R4    LDA R4
      13  66000      27R         JMP RWEXT
      14  34011      11A  .WS4   STB PA
      15 170140           .W4    CMA
      16  30004       4A         STA R4
      17  66000      27R         JMP RWEXT
      20  34011      11A  .WS5   STB PA
      21 170140           .W5    CMA
      22  30005       5A         STA R5
      23  66000      27R         JMP RWEXT
      24  34011      11A  .WS6   STB PA
      25 170140           .W6    CMA
      26  30006       6A         STA R6
      27 170140           RWEXT  CMA
      30  70430                  DIR
      31 170201                  RET 1
      32  34011      11A  .WS7   STB PA
      33 170140           .W7    CMA
      34  30007       7A         STA R7
      35  66000      27R         JMP RWEXT       LDB SUBCHANNEL (4-7)
 *                   LDA STRING ADDRESS
      36  30017      17A  .WSPS  STA D           JSM .WSPS
      37 144003       3A         ISZ R,I         DEC OUTPUT CHANNEL
      40 100003       3A         LDA R,I
      41 100000                  LDA A,I
      42  30011      11A         STA PA
      43  66000      54R         JMP .WSTS+1     LDB SUBCHANNEL (4-7)
      44 144003       3A  .WSTP  ISZ R,I         JSM .WSTP
      45 100003       3A         LDA R,I         DEC OUTPUT CHANNEL
      46 100000                  LDA A,I         DEF STRING
      47  30011      11A         STA PA
 *                   LDB SUBCHANNEL (4-7)
      50 144003       3A  .WSTR  ISZ R,I         JSM .WSTR
      51 100003       3A         LDA R,I         DEF STRING
      52 100000                  LDA A,I
      53  30017      17A  .WSTS  STA D           SET UP STACK POINTER
      54  74570                  WBD A,I         GET CHARACTER COUNT
      55  31777   77777A         STA CNTR
      56  72407                  SZA WS020
      57  74570           WS010  WBD A,I         GET CHAR
      60 170140                  CMA
      61 130001       1A         STA B,I
      62  70430                  DIR
      63  55777   77777A         DSZ CNTR
      64  66000      57R         JMP WS010
      65 170201           WS020  RET 1
      65                         END

.R4     12R     .R5     7R      .R6     4R      .R7     1R
.RS4    11R     .RS5    6R      .RS6    3R      .RS7    0R
.W4     15R     .W5     21R     .W6     25R     .W7     33R
.WS4    14R     .WS5    20R     .WS6    24R     .WS7    32R
.WSPS   36R     .WSTP   44R     .WSTR   50R     .WSTS   53R
A       0A      AR2     20A     B       1A      C       16A
CNTR    77777A  D       17A     E       77763A  PA      11A
R       3A      R4      4A      R5      5A      R6      6A
R7      7A      RWEXT   27R     WS010   57R     WS020   65R

KSPMAX=2 MSPMAX=39 NSPMAX=6 SSPMAX=182 DSPMAX=158
```

APPENDIX B-16

```
ASMB,R,L
                                        HED STORE A IN ADDRESS ON CSTAK
                                        NAM STAC,7  ET10585-1035A
 *
 *      A-ET10585-1034A-2
 *        ET10585-1034A  (S)
 *        ET10585-1035A  (R)
 *      15 JULY 1977
 *      LINN WHEELWRIGHT
 *
        0                               ENT .STAC
        0                      A        EQU 0
        1                      B        EQU 1
        3                      R        EQU 3
        16                     C        EQU 16B
        17                     D        EQU 17B
 *
        0  70761               .STAC    WWC B
        1 130001       1A               STA B,I
        2 170201                        RET 1
        2                               END

.STAC   0R      A       0A      B       1A      C       16A
D       17A     R       3A

KSPMAX=2 MSPMAX=39 NSPMAX=6 SSPMAX=31 DSPMAX=158
```

APPENDIX B-17

```
ASMB,R,L
                                 HED AND FROM  ADDRESS ON CSTAK \
                                 NAM ANDB,7  ET10585-1037A
 *
```

```
 *    A-ET10585-1036A-2
 *       ET10585-1036A   (S)
 *       ET10585-1037A   (R)
 *    15 JULY 1977
 *    LYNN WHEELWRIGHT
 *
        0                              ENT .ANDB
        0                       A      EQU 0
        1                       B      EQU 1
        3                       R      EQU 3
       16                       C      EQU 16B
       17                       D      EQU 17B
 *
        0  70761          .ANDB WWC B
        1 150001      1A        AND B,1
        2 170201                RET 1
        2                       END

.ANDB   0R      A      0A      B      1A      C      16A
D       17A     R      3A

KSPMAX=2 MSPMAX=39 NSPMAX=6 SSPMAX=31 DSPMAX=158
```

APPENDIX B-18

```
ASMB,R,L
                                       HED IOR FROM  ADDRESS ON CSTAK \
                                       NAM ORB,7  ET10585-1039A \

 *
 *    A-ET10585-1038A-2
 *       ET10585-1038A   (S)
 *       ET10585-1039A   (R)
 *    15 JULY 1977
 *    LYNN WHEELWRIGHT
 *
        0                              ENT .ORB
        0                       A      EQU 0
        1                       B      EQU 1
        3                       R      EQU 3
       16                       C      EQU 16B
       17                       D      EQU 17B
 *
        0  70761          .ORB  WWC B
        1 160001      1A        IOR B,1
        2 170201                RET 1
        2                       END

.ORB    0R      A      0A      B      1A      C      16A
D       17A     R      3A

KSPMAX=2 MSPMAX=39 NSPMAX=6 SSPMAX=30 DSPMAX=158
```

APPENDIX B-19

```
ASMB,R,L
                                       HED AND FROM CSTAK \
                                       NAM ANDT,7  ET10585-1041A

 *
 *    A-ET10585-1040A-2
 *       ET10585-1040A   (S)
 *       ET10585-1041A   (R)
 *    15 JULY 1977
 *    LYNN WHEELWRIGHT
 *
        0                              ENT .ANDT
        0                       A      EQU 0
        1                       B      EQU 1
        3                       R      EQU 3
       16                       C      EQU 16B
       17                       D      EQU 17B
 *
        0  70761          .ANDT WWC B
        1  50001      1A        AND B
        2 170201                RET 1
        2                       END

.ANDT   0R      A      0A      B      1A      C      16A
D       17A     R      3A

KSPMAX=2 MSPMAX=39 NSPMAX=6 SSPMAX=31 DSPMAX=158
```

APPENDIX B-20

```
ASMB,R,L
                                       HED IOR FROM CSTAK \
                                       NAM ORT,7  ET10585-1043A \

 *
 *    A-ET10585-1042A-2
 *       ET10585-1042A   (S)
 *       ET10585-1043A   (R)
 *    15 JULY 1977
 *    LYNN WHEELWRIGHT
 *
        0                              ENT .ORT
        0                       A      EQU 0
        1                       B      EQU 1
        3                       R      EQU 3
       16                       C      EQU 16B
```

```
     17                    D        EQU 17B
*
      0   70761            .ORI     **C B
      1   60001      1A             IOR B
      2  170201                     RET 1
      2                             END

.OR1     0R        A       0A        B        1A        C        16A
D        17A       R       3A

KSPMAX=2 MSPMAX=39 NSPMAX=6 SSPMAX=30 DSPMAX=158
```

APPENDIX B-21

```
ASMB,L
                                    HED ATTEN ERROR READ ROUTINE \
                                    NAM ATNER,7   85680-90012A \
      0                             ENT ATNER
*
*     A-85680-90011A-2
*       85680-90011A  (S)
*       85680-90012A  (R)
*     13 SEP 1977
*     LYNN WHEELWRIGHT
*
*        INTEGER PROCEDURE ATNER(RFAT); VALUE RFAT;
*           INTEGER RFAT;
*           EXTERNAL;
*
*        THIS PROCEDURE READS RF ATTEN ERROR COEFFICIENTS
*        FROM PROM ON RF INTERFACE BD. ERROR IS STORED IN UNITS
*        OF .2 DB.
*
      0                     A       EQU 0
     11                     PA      EQU 11B
*
      0   52000      20R    ATNER   AND =D7          ATNER(RFAT)
      1   22000      21R            ADA =D-2
      2  172003                     SAP *+3
      3  170517                     CLA
      4  170201                     RET 1
      5    4000                     LDB A
      6  174501                     SBR 2
      7   26000      22R            ADB =D6
     10   34011      11A            STB PA
     11   62000      23R            IOR =D4
     12  100000                     LDA A,I
     13  170140                     CMA
     14   70430                     DIR
     15  170607                     SAL 8
     16  170406                     AAR 7
     17  170201                     RET 1
     17                             END
     20       7
     21  177776
     22       6
     23       4

177776 21R       4      23R       6      22R       7       20R
A      0A       ATNER   0R       PA      11A

KSPMAX=2 MSPMAX=39 NSPMAX=6 SSPMAX=36 DSPMAX=158
```

APPENDIX B-22

```
ASMB,R,L
                                    HED CHARACTER ROUTINES FOR BPCL
                                    NAM AIPCR,7 ET10585-1053A
*
*     A-ET10585-1052A-2
*       ET10585-1052A  (S)
*       ET10585-1053A  (R)
*     7 MAR 1978
*     LYNN WHEELWRIGHT
*
      0                             ENT ACHAR,APCHR,ICHAR,PCHAR,IPCHR
      0                             EXT AR3D
*
*        PROCEDURE ACHAR(C,S); VALUE C,S;
*           INTEGER C; ALPHA S; EXTERNAL;
*        PROCEDURE PCHAR(P,C,S); VALUE P,C,S;
*           INTEGER P,C; ALPHA S; EXTERNAL;
*        PROCEDURE ICHAR(P,C,S); VALUE P,C,S;
*           INTEGER P,C; ALPHA S; EXTERNAL;
*
      0                     A       EQU 0
      1                     B       EQU 1
     16                     C       EQU 16B
     17                     D       EQU 17B
  77763                     E       EQU 77763B
  77762                     APTR    EQU 77762B
  77761                     CNTR    EQU 77761B
*
      0    6000      1X     APCHR   LDB AR3D         AREG=CHAR
      1   70541                     PWC B
*
```

```
      2 104016      16A  ACHAR LDB  C,I
      3  70540             PWC  A
      4 144001       1A        ISZ  B,1            INCREMENT LENGTH
      5 100001       1A        LDA  B,I            STRING LENGTH
*
      6 170700           PCHAR RAR  1
      7  70761                 WWC  B              GET CHARACTER
     10 120016      16A        ADA  C,I            FORM STRING ADDRESS
     11 172212                 SAP  EVEN,C         INDEX TO BYTE
     12  72101           ODD   RIA  *+1
     13  31762   77762A        STA  APTR
     14   2000     104R        LDA  =B377          FETCH BYTE MASK
     15 174607                 SBL  8              POSITION BYTE TO BE MERGED
     16 151762   77762A  PXIT  AND  APTR,I         MASK OFF UNWANTED BYTE
     17  60001       1A        IOR  B              MERGE NEW BYTE
     20 131762   77762A        STA  APTR,I         PUT IT BACK
     21  54016      16A        DSZ  C              FIX UP STACK
     22 170201                 RET  1              RETURN TO CALLER
     23  31762   77762A  EVEN  STA  APTR
     24   2000     105R        LDA  =B177400       FETCH BYTE MASK
     25  66000      16R        JMP  PXIT
*
     26   2000     106R  XIT3  LDA  =D-3
     27  20016      16A        ADA  C
     30  30016      16A        STA  C
     31 170201                 RET  1
*
     32  70541           IPCHR PWC  B              AREG=POSITION
     33  70541                 PWC  B
     34   6000       1X        LDB  AR3D           BREG=CHARACTER
     35  70741                 PWC  B,D
     36  66000      40R        JMP  *+2
*
     37  54016      16A  ICHAR DSZ  C              GET STRING ADDRESS
     40  70561                 WWC  B,1
     41  70540                 PWC  A              SAVE CHARACTER POSITION
     42 170040                 TCA
     43 172063                 SAP  XIT3           ILLEGAL CHAR POSITION
     44 120001       1A        ADA  B,I            GET LENGTH
     45 170140                 CMA
     46 172033                 SAP  IAPND          OFF END OF STRING - APPEND IT
     47 170400                 AAR  1
     50  31761   77761A        STA  CNTR           # OF WORDS TO JUGGLE
     51 100016      16A        LDA  C,I            CHECK FOR EVEN LEN AND ODD INS
     52  73004                 SLA  *+4
     53 100001       1A        LDA  B,I
     54  73403                 RLA  *+3            TEST FAILED - DON'T INCREASE C
     55  55761   77761A        DSZ  CNTR
     56 100001       1A        LDA  B,I
     57  72422                 SZA  IAPND          NULL STRING
     60 170500                 SAR  1
     61  20001       1A        ADA  B
     62  30017      17A        STA  D
     63  72101                 RIA  *+1
     64  31762   77762A        STA  APTR
     65 144001       1A        ISZ  B,1
     66 101762   77762A  ILOOP LDA  APTR,I
     67 170507                 SAR  8
     70  70771                 WWD  B
     71 174607                 SBL  8
     72  60001       1A        IOR  B
     73 131762   77762A        STA  APTR,I
     74  55762   77762A        DSZ  APTR
     75  45761   77761A        ISZ  CNTR
     76  66000      66R        JMP  ILOOP
     77  70760                 WWC  A
    100  66000       6R        JMP  PCHAR
    101  54016      16A  IAPND DSZ  C
    102  70760                 WWC  A
    103  66000       2R        JMP  ACHAR
    103                        END
    104    377
    105 177400
    106 177775

177400  105R      177775 106R     377     104R     A      0A
ACHAR   2R        APCHR  0R       APTR    77762A   AR3D   1X
B       1A        C      16A      CNTR    77761A   D      17A
E       77763A    EVEN   23R      IAPND   101R     ICHAR  37R
ILOOP   66R       IPCHR  32R      ODD     12R      PCHAR  6R
PXIT    16R       XIT3   26R

RSPMAX=2 MSPMAX=39 NSPMAX=6 SSPMAX=124 DSPMAX=158
```

APPENDIX B-23

```
ASMB,R,L
                                  HED STRING CONVERSIONS FOR BPCL
                                  NAM CNVST,7 ET10585-1055B

*
*      A-ET10585-1054B-2
*        ET10585-1054B  (S)
*        ET10585-1055B  (R)
*      23 MAR 78
*      LYNN WHEELWRIGHT
```

```
*
        0                               ENT  CNV15,CNV25,CNV45,APN25
        0                               EXT  AR3D,CNV43,IPCHR
*
         PROCEDURE CNV15(R); VALUE R;
           REAL R; EXTERNAL;
         PROCEDURE CNV25(D); VALUE D;
           BCDL D; EXTERNAL;
         PROCEDURE CNV45(I); VALUE I;
           INTEGER I; EXTERNAL;
         PROCEDURE APN25(D); VALUE D;
           BCDL D; EXTERNAL;
*
        0                         A      EQU  0
        1                         B      EQU  1
       16                         C      EQU  16B
       17                         D      EQU  17B
       20                         AR2    EQU  20B
    77764                         AR3    EQU  77764B
    77777                         CNTR   EQU  77777B
        0   42000       77R       CNV15  JSM  CNV25
        1   74770                 CN.10  WBD  A          REMOVE TRAILING ZEROES
        2   12000      146R              CPA  =B60
        3   66000        5R              JMP  *+2
        4   66000       17R              JMP  CN.20
        5   55764    77764A              DSZ  AR3
        6   66000        1R              JMP  CN.10
        7   45764    77764A              ISZ  AR3
       10      20       20A              LDA  AR2        NUM=0
       11   72406                        SZA  CN.20
       12  170416                        AAR  15         LIMIT EXP TO 1 TO -1
       13  172402                        SAM  *+2
       14   72501                        SIA  *+1
       15  170605                        SAL  6
       16   30020       20A              STA  AR2
       17    4020       20A       CN.20  LDB  AR2
       20  174405                        ABR  6
       21   76432                        SZB  LDP        ZERO EXP - INSERT DECIMAL PC
       22   26000      147R              ADB  =D3
       23  176435                        SBM  EXP        PROCESS EXPON
       24   26000      150R              ADB  =D-16      WITHIN BOUNDS FOR FXD FORMAT
       25  176033                        SBP  EXP          NO-PROCESS EXPON
       26   26000      151R              ADB  =D13
       27  176413                        SBM  LDZRO      GO INSERT LEADING ZEROES
       30      20       20A              LDA  AR2
       31   52000      152R              AND  =D1
       32  170040                        TCA
       33   21764    77764A              ADA  AR3
       34  170040                        TCA
       35   20001        1A              ADA  B
       36  172434                        SAM  CN.30      WITHIN STRING?
       37   21764    77764A              ADA  AR3        NO - LENGTHEN IT
       40   31764    77764A              STA  AR3
       41  170201                        RET  1
       42   70541                 LDZRO  PWC  B
       43    6000      146R              LDB  =B60
       44      20       20A              LDA  AR2
       45   52000      152R              AND  =D1
       46   72101                        RIA  *+1
       47   42000        3X              JSM  IPCHR
       50  144016       16A              ISZ  C,I
       51   66000       43R              JMP  LDZRO+1
       52   54016       16A              DSZ  C
       53      20       20A       LDP    LDA  AR2
       54   52000      152R              AND  =D1
       55   72101                 IDP    RIA  *+1
       56    6000      153R              LDB  =B56       DECIMAL POINT
       57   66000        3X              JMP  IPCHR
       60   42000      121R       EXP    JSM  APSET
       61    2000      154R              LDA  =B105      E
       62   42000      135R              JSM  APCHR
       63      20       20A              LDA  AR2
       64   70540                        PWC  A
       65  170405                        AAR  6
       66   42000        2X              JSM  CNV43
       67   42000      101R              JSM  APN25
       70   70760                        WWC  A
       71   66000       54R              JMP  LDP+1
       72      20       20A       CN.30  LDA  AR2
       73   52000      152R              AND  =D1
       74   20001        1A              ADA  B
       75   66000       55R              JMP  IDP
*
       76   42000        2X       CNV45  JSM  CNV43
       77    2000        1X       CNV25  LDA  AR3D       CLEAR STRING BUFFER
      100   71607                        CLR  8
      101   42000      121R       APN25  JSM  APSET
      102   71500                        NRM
      103   72702                        SDC  *+2
      104   54001        1A              DSZ  B
      105   26000      155R              ADB  =D-12
      106   35777    77777A              STB  CNTR
      107      20       20A              LDA  AR2
      110   73003                        SLA  ALOOP
```

```
111    2000    156R          LDA =B55        MINUS
112   42000    135R          JSM APCHR
113   75541           ALOOP  MLY
114   62000    146R          IOR =B60
115   42000    135R          JSM APCHR
116   45777  77777A          ISZ CNTR
117   66000    113R          JMP ALOOP
120  170201                  RET 1
121    5764  77764A   APSET  LDB AR3
122   76404                  SZB *+4
123   26000    157R          ADB =D-1
124  174700                  RBR 1
125   26000    160R          ADB =B100001    SET UP D REG AS CHAR POINTER
126   26000      1X          ADB AR3D
127   34017     17A          STB D
130  176204                  SBP *+4,C
131  100001      1A          LDA B,1
132   52000    161R          AND =B177400    MASK OFF GARBAGE BYTE
133  130001      1A          STA B,1
134  170201                  RET 1
135    4017     17A   APCHR  LDB D
136   45764  77764A          ISZ AR3         INCREMENT STRING LENGTH
137  176205                  SBP *+5,C       + = LAST CHAR WAS RIGHT BYTE
140  160001      1A          IOR B,I         - = LAST CHAR WAS LEFT BYTE
141  130001      1A          STA B,I
142   34017     17A          STB D
143  170201                  RET 1
144   74550                  PBD A,I         STORE LEFT CHAR,ZERO RIGHT CHA
145  170201                  RET 1
145                          END
146      60
147       3
150  177760
151      15
152       1
153      56
154     105
155  177764
156      55
157  177777
160  100001
161  177400

1       152R     100001  160R     105     154R     15      151R
177400  161R     177760  150R     177764  155R     177777  157R
3       147R     55      156R     56      153R     60      146R
A       0A       ALOOP   113R     APCHR   135R     APN25   101R
APSET   121R     AR2     20A      AR3     77764A   AR3D    1X
B       1A       C       16A      CN.10   1R       CN.20   17R
CN.30   72R      CNTR    77777A   CNV15   0R       CNV25   77R
CNV43   2X       CNV45   76R      D       17A      EXP     60R
IDP     55R      IPCHR   3X       LDP     53R      LDZRO   42R

KSPMAX=2 MSPMAX=39 NSPMAX=6 SSPMAX=206 DSPMAX=158
```

APPENDIX B-24

```
ASMB,R,L
                             HED TRACE DUMP TO HPIB \
                             NAM TDUMP,7 85680-90010A \
*
*    A-85680-90009A-2
*      85680-90009A  (S)
*      85680-90010A  (R)
*    28 APR 1978
*    LYNN WHEELWRIGHT
*
      0                      ENT TDUMP,PDUMP,ADUMP,SDUMP,STHPB,HPBSY,HBUS
      0                      ENT WHPIB,WEOI,IHPBT,IHPIB
      0                      EXT AR3D,CNV15,CNV45
*
*      PROCEDURE ADUMP(ADC,FMT,RDBMV);
*        VALUE ADC,FMT; INTEGER ADC,FMT;
*        REAL PROCEDURE RDBMV(A);
*          VALUE A; INTEGER A;
*        EXTERNAL;
*      PROCEDURE PDUMP(FMT,RDBMV);
*        VALUE FMT; INTEGER FMT;
*        REAL PROCEDURE RDBMV(A);
*          VALUE A; INTEGER A;
*        EXTERNAL;
*      PROCEDURE TDUMP(FMT,RDBMV);
*        VALUE FMT; INTEGER FMT;
*        REAL PROCEDURE RDBMV(A);
*          VALUE A; INTEGER A;
*        EXTERNAL;
*      PROCEDURE SDUMP(FMT,RDBMV,CNT,ADDR,INCR);
*        VALUE FMT,CNT,ADDR,INCR;
*        INTEGER FMT,CNT,ADDR,INCR;
*        REAL PROCEDURE RDBMV(A);
*          VALUE A; INTEGER A;
*        EXTERNAL;
*      PROCEDURE STHPB(S); VALUE S;
*        ALPHA S; EXTERNAL;
*      PROCEDURE HPBSY(ABORT,LOCAL);
*        LABEL ABORT,LOCAL; EXTERNAL;
```

```
*       PROCEDURE HBUSY; EXTERNAL;
*       PROCEDURE WHPIB(N); VALUE N; INTEGER N;
*         EXTERNAL;
*       PROCEDURE WEOI; EXTERNAL;
*       INTEGER PROCEDURE IHPIB;
*         EXTERNAL;
*       PROCEDURE IHPBT(DSTAD,COUNT); VALUE COUNT;
*         INTEGER DSTAD,COUNT; EXTERNAL;
*
           0                        A     EQU 0
           1                        B     EQU 1
           3                        R     EQU 3
           4                        R4    EQU 4
           5                        R5    EQU 5
           6                        R6    EQU 6
           7                        R7    EQU 7
          11                        PA    EQU 11B
          16                        C     EQU 16B
          17                        D     EQU 17B
       77763                        E     EQU 77763B
          20                        AR2   EQU 20B
       77764                        AR3   EQU 77764B
       77754                        FMI   EQU 77754B
       77753                        CNTR  EQU 77753B
       77752                        DBMNV EQU 77752B
       77751                        GTLCL EQU 77751B
       77750                        ABORT EQU 77750B
       77755                        SCNTR EQU 77755B
*
      0   6000     262R    IHPIB  LDB =D4
      1  34011      11A           STB PA
      2   6000     263R           LDB =B177
      3  34007       7A           STB R7         HPIB BINARY INPUT
      4   6000     264R    IHP05  LDB =D2
      5  34011      11A           STB PA
      6   4007       7A    IHP07  LDB R7
      7 174614                    SBL 13
     10  16000     141R           CPB HPBRQ      HPIB INPUT?
     11  66000      15R           JMP IHP10      YES
     12  16000     140R    IHP09  CPB LOCAL      LOCAL?
     13  66000      23R           JMP IHP25
     14  66000       6R           JMP IHP07
     15   6000     262R    IHP10  LDB =D4        YES
     16  34011      11A           STB PA
     17      5       5A           LDA R5
     20 170140                    CMA
     21  52000     265R           AND =B377
     22 170201                    RET 1
     23   4006       6A    IHP25  LDB R6
     24 174600                    SBL 1
     25 176461                    SBM IHP07      HPIB IN LOCAL?
     26 165751   77751A           JMP GTLCL,I    BAILOUT - GO TO LOCAL
*
     27  70760             IHPBT  WWC A          GET ADDRESS OF DSTAD
     30  31755   77755A           STA SCNTR
     31 100000                    LDA A,I
     32 170140                    CMA
     33   6000     266R           LDB =D6
     34  34011      11A           STB PA
     35  30004       4A           STA R4         SET DST ADDRESS
     36  70760                    WWC A          FETCH # WORDS TO BE INPUT
     37 172006                    SAP IHP50-1
     40  42000                    JSM IHPIB
     41 170607                    SAL 8
     42  31753   77753A           STA CNTR
     43  42000                    JSM IHPIB
     44  61753   77753A           IOR CNTR
     45  31753   77753A           STA CNTR
     46  42000             IHP50  JSM IHPIB
     47 170607                    SAL 8
     50  30017      17A           STA D
     51  42000                    JSM IHPIB
     52  60017      17A           IOR D
     53   6000     266R           LDB =D8
     54  34011      11A           STB PA
     55 170140                    CMA
     56  30006       6A           STA R6         WRITE WORD IN DST
     57 145755   77755A           ISZ SCNTR,I    INCREMENT DSTAD
     60  55753   77753A           DSZ CNTR
     61  66000      46R           JMP IHP50
     62 170201                    RET 1
*
     63  30017      17A    STHPB  STA D          DUMP STRING TO HPIB
     64  74571                    WBD B,I        GET LENGTH
     65  35755   77755A           STB SCNTR
     66  76407                    SZB *+7        NOTHING TO DO
     67  74570             SLOOP  WBD A,I
     70 170140                    CMA
     71  42000     116R           JSM HBUSY
     72  30006       6A           STA R6
     73  55755   77755A           DSZ SCNTR
     74  66000      67R           JMP SLOOP
     75 170201                    RET 1
*
```

```
 76  52000    267R  TSET   AND =D3
 77  22000    105R         ADA FTAB
100 100000                 LDA A,I         FETCH FORMAT POINTER
101  31754  77754A         STA FMT
102  70761                 WWC B           FETCH PROCEDURE ENTRY
103  35752  77752A         STB DBMNV
104 170201                 RET 1
105           106R  FTAB   DEF *+1
106           251R         DEF FMTAB
107           237R         DEF FMT4R
110           221R         DEF FMT8
111           230R         DEF FM116
*
112  70761          HPBSY  WWC B           FETCH LABELS
113  35750  77750A         STB ABORT
114  70761                 WWC B
115  35751  77751A         STB GTLCL
116   6000    264R  HBUSY  LDB =D2
117  34011     11A         STB PA
120   4007      7A  BLOOP  LDB R7
121 174611                 SBL 10
122 176413                 SBM DONE
123 174602                 SBL 3
124  16000    141R         CPB HPBRQ
125 165750  77750A         JMP ABORT,I
126  16000    140R         CPB LOCAL
127  66000    131R         JMP *+2
130  66000    120R         JMP BLOOP
131   4006      6A         LDB R6
132 174600                 SBL 1
133 176465                 SBM BLOOP
134 165751  77751A         JMP GTLCL,I
135   6000    262R  DONE   LDB =D4
136  34011     11A         STB PA
137 170201          TDONE  RET 1
140                 LOCAL  OCT 120000
141                 HPBRQ  OCT 20000
*
142  42000    116R  WEOI   JSM HBUSY
143   6000    270R         LDB =D-3
144  34007      7A         STB R7
145 170201                 RET 1
*
146 170140          WHP1B  CMA
147  42000    116R         JSM HBUSY
150  30006      6A         STA R6
151 170201                 RET 1
*
152  31753  77753A  ADUMP  STA CNTR
153  70760                 WWC A
154  42000     76R         JSM TSET        GET ARGUMENTS
155   1753  77753A         LDA CNTR
156   6000    271R         LDB =D1
157  35753  77753A         STB CNTR
160 170140                 CMA
161 165754  77754A         JMP FMT,I
*
162   6000    271R  PDUMP  LDB =D1
163  66000    165R         JMP TDUMP+1
164   6000    272R  TDUMP  LDB =D1001
165  35753  77753A         STB CNTR
166  42000     76R         JSM TSET
167   2000    266R  TLOOP  LDA =D8
170  30011     11A         STA PA
171      5      5A         LDA R5
172 141754  77754A         JSM FMT,I
173  55753  77753A         DSZ CNTR
174  66000    167R         JMP TLOOP
175 170201                 RET 1
*
176  42000     76R  SDUMP  JSM TSET        FETCH FORMAT AND PROCEDURE
177  70760                 WWC A           FETCH COUNT
200  31753  77753A         STA CNTR
201   2000    266R  SURLP  LDA =D8
202  30011     11A         STA PA
203  70760                 WWC A           FETCH DSTAD
204 170140                 CMA
205  30004      4A         STA R4          SET DSPL ADRS
206 170140                 CMA
207 120016     16A         ADA C,I         INCREMENT ADDRESS
210  70540                 PWC A
211  72600                 SFC *           WAIT FOR DIG STOR
212      5      5A         LDA R5          READ DIG STOR
213 141754  77754A         JSM FMT,I
214  55753  77753A         DSZ CNTR
215  66000    201R         JMP SURLP
216  54016     16A         DSZ C
217  54016     16A         DSZ C           UPDATE C STACK
220 170201                 RET 1
*
221 170501          FMT8   SAR 2
222   5753  77753A  FMT81  LDB CNTR
223  16000    271R         CPB =D1
224  42000    142R         JSM WEOI
```

```
     225  42000    116R  FMT82 JSM HBUSY
     226  30006      6A        STA R6
     227 170201                RET 1
 *
     230  62000    273R  FMT16 IOR =B170000
     231  70540                PWC A
     232 170707                RAR 8
     233  42000    116R        JSM HBUSY
     234  30006      6A        STA R6
     235  70760                WWC A
     236  66000    222R        JMP FMT81
 *
     237  62000    273R  FMT4R IOR =B170000
     240 170140                CMA
     241  42000      3X        JSM CNV45
     242   2000      1X  FMT4S LDA AR3D
     243  42000     63R        JSM STHPB
     244   2000    274R        LDA =B-16       CR
     245  42000    116R        JSM HBUSY
     246  30006      6A        STA R6
     247   2000    275R        LDA =B-13       LF
     250  66000    222R        JMP FMT81
 *
     251  62000    273R  FMTAB IOR =B170000
     252 170140                CMA
     253 141752  77752A        JSM DBMNV,I
     254 170517                CLA
     255   6000    276R        LDB =D7
     256  75500                MRY
     257  71500                NRM
     260  42000      2X        JSM CNV15
     261  66000    242R        JMP FMT4S
     261                       END
     262      4
     263    177
     264      2
     265    377
     266     10
     267      3
     270 177775
     271      1
     272   1751
     273 170000
     274 177762
     275 177765
     276      7

1       271R     10      266R     170000  273R     1751    272R
177     263R     177762  274R     177765  275R     177775  270R
2       264R     3       267R     377     265R     4       262R
7       276R     A       0A       ABORT   77750A   ADUMP   152R
AR2     20A      AR3     77764A   AR3D    1X       B       1A
BLOOP   120R     C       16A      CNTR    77753A   CNV15   2X
CNV45   3X       D       17A      DBMNV   77752A   DONE    135R
E       77763A   FMT     77754A   FMT16   230R     FMT4R   237R
FMT4S   242R     FMT8    221R     FMT81   222R     FMT82   225R
FMTAB   251R     FTAB    105R     GTLCL   77751A   HBUSY   116R
HPBRQ   141R     HPBSY   112R     IHP05   4R       IHP07   6R
IHP09   12R      IHP10   15R      IHP25   23R      IHP50   46R
IHPBI   27R      IHPIB   0R       LOCAL   140R     PA      11A
PDUMP   162R     R       3A       R4      4A       R5      5A
R6      6A       R7      7A       SCNTR   77755A   SDUMP   176R
SLOOP   67R      STHPB   63R      SURLP   201R     TDONE   137R
TDUMP   164R     TLOOP   167R     TSET    76R      WEOI    142R
WHPIB   146R

KSPMAX=2 MSPMAX=39 NSPMAX=6 SSPMAX=384 DSPMAX=158
```

APPENDIX B-25

```
ASMB,R,L
                                      HED VIDEO AVERAGE ROUTINE
                                      NAM VDAVG,7  ET10585-1047A \
    *
    *    A-ET10585-1046A-2
    *      ET10585-1046A  (S)
    *      ET10585-1047A  (R)
    *    15 JULY 1977
    *    LYNN WHEELWRIGHT
    *
          0                           ENT VDAVG,VDSUB
          0                           EXT .FLT,.FDVA,AR1D
          0   12000     213R   VDAVG  CPA =D1        N= AVERAGE #
          1   66000     135R          JMP STRTZ      P= PAGE OF MEMORY
          2   70540                   PWC A
          3   42000       1X          JSM .FLT
          4    2000       3X          LDA AR1D
          5    6000      13R          LDB AR3D
          6   71401                   XFR 2
          7   70760                   WWC A
         10   22000     214R          ADA =D-1
         11   42000       1X          JSM .FLT
         12   42000       2X          JSM .FDVA
         13           77764A   AR3D   DEF AR3
         14    1771   77771A          LDA AR1+1
```

```
 15  31767  77767A         STA  AR3+3       AR3+3=(N-1)/N
 16   2000    213R         LDA  =D1
 17  42000      1X         JSM  .FLT
 20  42000      2X         JSM  .FDVA       AR1=1/N
 21         77764A         DEF  AR3
 22   1770  77770A         LDA  AR1
 23  72004                 RZA  STR
 24   2000    116R         LDA  RET4
 25  30020     20A         STA  AR2
 26  66000     42R         JMP  STRTA
 27 170140          STR    CMA
 30  22000    120R         ADA  ABR1
 31  30023     23A         STA  AR2+3
 32  22000    215R         ADA  =B4100
 33  30021     21A         STA  AR2+1
 34  52000    216R         AND  =B17
 35 170040                 TCA
 36  22000    117R         ADA  SBL15
 37  30020     20A         STA  AR2
 40   2000    115R         LDA  RET1
 41  30022     22A         STA  AR2+2
 42  42000    121R  STRTA  JSM  SETUP
 43   5774  77774A  LOOPA  LDB  TRAB
 44  72600                 SFC  *
 45  34004      4A         STB  R4
 46   5775  77775A         LDB  TRC
 47  72600                 SFC  *
 50      5      5A         LDA  R5
 51 170140                 CMA
 52 170604                 SAL  5
 53  72600                 SFC  *
 54  34004      4A         STB  R4
 55   5767  77767A         LDB  AR3+3
 56  72600                 SFC  *
 57  75617                 MPY
 60  31764  77764A         STA  AR3
 61  35765  77765A         STB  AR3+1
 62      5      5A         LDA  R5
 63 170140                 CMA
 64 170604                 SAL  5
 65   5774  77774A         LDB  TRAB
 66  72600                 SFC  *
 67  34004      4A         STB  R4
 70   5771  77771A         LDB  AR1+1
 71  72600                 SFC  *
 72  75617                 MPY
 73  35776  77776A         STB  X
 74  40020     20A         JSM  AR2
 75  20001      1A         ADA  B
 76   5776  77776A         LDB  X
 77  70023                 EXE  AR2+3
100 177201                 SEC  *+1,C
101  21764  77764A         ADA  AR3
102 177202                 SEC  *+2,C
103  76501                 SIB  *+1
104  25765  77765A         ADB  AR3+1
105  26000    217R         ADB  =D8
106 174503                 SBR  4
107 174140                 CMB
110  34006      6A         STB  R6
111  45774  77774A         ISZ  TRAB
112  45775  77775A         ISZ  TRC
113  55777  77777A         DSZ  CNTR
114  66000     43R         JMP  LOOPA
115 170201          RET1   RET  1
116 170204          RET4   RET  4
117 174616          SBL15  SBL  15
120 174400          ABR1   ABR  1
 77764              AR3    EQU  77764B
    20              AR2    EQU  20B
 77770              AR1    EQU  77770B
 77774              TRAB   EQU  77774B
 77775              TRC    EQU  77775B
 77776              X      EQU  77776B
 77777              CNTR   EQU  77777B
     4              R4     EQU  4
     5              R5     EQU  5
     6              R6     EQU  6
     0              A      EQU  0
     1              B      EQU  1
    16              C      EQU  16B
    11              PA     EQU  11B
121   6000    220R  SETUP  LDB  =D1001
122  35777  77777A         STB  CNTR
123   6000    217R         LDB  =D8
124  34011     11A         STB  PA
125  70761                 WWC  B
126 174611                 SBL  10
127  26000    220R         ADB  =D1001
130 174140                 CMB
131  35774  77774A         STB  TRAB
132   6000    221R         LDB  =D-4074
133  35775  77775A         STB  TRC
134 170201                 RET  1
```

```
135  42000     121R  STRTZ  JSM SETUP
136   5775  77775A  LOOPZ  LDB TRC
137  72600                 SFC *
140  34004      4A         STB R4
141  72600                 SFC *
142      5      5A         LDA R5
143   5774  77774A         LDB TRAB
144  72600                 SFC *
145  34004      4A         STB R4
146  72600                 SFC *
147  30006      6A         STA R6
150  45774  77774A         ISZ TRAB
151  45775  77775A         ISZ TRC
152  55777  77777A         DSZ CNTR
153  66000    136R         JMP LOOPZ
154 170201                 RET 1
155   6000    213R  VDSUB  LDB =D1        C_C-B
156  70541                 PWC B
157  42000    121R         JSM SETUP
160   5774  77774A  LOOPS  LDB TRAB
161  72600                 SFC *
162  34004      4A         STB R4
163   5775  77775A         LDB TRC
164  72600                 SFC *
165      5      5A         LDA R5
166  72501                 SIA *+1
167 170604                 SAL 5
170  72600                 SFC *
171  34004      4A         STB R4
172  31776  77776A         STA X
173  72600                 SFC *
174      5      5A         LDA R5
175 170140                 CMA
176 170604                 SAL 5
177  21776  77776A         ADA X
200  72600                 SFC *
201  34004      4A         STB R4
202 170404                 AAR 5
203 170140                 CMA
204  72600                 SFC *
205  30006      6A         STA R6
206  45774  77774A         ISZ TRAB
207  45775  77775A         ISZ TRC
210  55777  77777A         DSZ CNTR
211  66000    160R         JMP LOOPS
212 170201                 RET 1
212                        END
213      1
214 177777
215   4100
216     17
217     10
220   1751
221 170026
```

```
.FDVA   2X       .FLT     1X        1       213R     10      217R
17      216R     170026   221R      1751    220R     177777  214R
4100    215R     A        0A        ABR1    120R     AR1     77770A
ARID    3X       AR2      20A       AR3     77764A   AR3D    13R
B       1A       C        16A       CNTR    77777A   LOOPA   43R
LOOPS   160R     LOOPZ    136R      PA      11A      R4      4A
R5      5A       R6       6A        RET1    115R     RET4    116R
SBL15   117R     SETUP    121R      STR     27R      STRTA   42R
STRTZ   135R     TRAB     77774A    TRC     77775A   VDAVG   0R
VDSUB   155R     X        77776A
```

KSPMAX=2 MSPMAX=39 NSPMAX=6 SSPMAX=205 DSPMAX=158

APPENDIX B-26

```
ASMB,R,L
                                 HED BINARY FLOATING POINT MATH \
                                 NAM BFLT,7  ET10585-1049A
 *
 *       A-ET10585-1046A-2
 *          ET10585-1048A   (S)
 *          ET10585-1049A   (R)
 *       1 AUG 1977
 *       LYNN WHEELWRIGHT
 *
         0                       ENT .FMPA,.FMPB,.FDVA,.FDVB,.FLT,.FIX
         0                       ENT .FADA,.FADB
         0                       EXT ARID,.BDVS,.BDVF
 *
 *         8 JUN 76
 *
         0 144003      3A  .FMPA ISZ R,1       JSM .FMPA  (AR1=ACCUM)
         1 104003      3A        LDB R,1       DEF OPERAND
         2 104001      1A        LDB B,1
         3 176677                SBM *-1,C     FOLLOW INDIRECTS
         4 100001      1A  .FMPB LDA B,1       GET EXPONENT
         5  21770  77770A        ADA AR1
         6  72501                SIA *+1
         7  31770  77770A        STA AR1       EXPONENTS DONE
        10  76501                SIB *+1
```

```
 11 100001       1A            LDA  B,I
 12   5771   77771A            LDB  AR1+1
 13  75617                     MPY
 14  76010                     RZB  FMPS
 15  72007                     RZA  FMPS
 16  66000      77R            JMP  FADNZ
 17 172002             FMPL    SAP  *+2
 20  76101                     RIB  *+1
 21 170600                     SAL  1
 22  55770   77770A            DSZ  AR1
 23                            NOP
 24  35771   77771A    FMPS    STB  AR1+1
 25 176404                     SBM  *+4
 26 174600                     SBL  1
 27 176070                     SBP  FMPL
 30 170201                     RET  1
 31 174600                     SBL  1
 32 176465                     SBM  FMPL
 33 170201                     RET  1
*
 34 144003       3A    .FDVA   ISZ  R,I
 35 104003       3A            LDB  R,I
 36 104001       1A            LDB  B,I
 37 176677                     SBM  *-1,C
 40 173201             .FDVB   SOC  *+1,C
 41 100001       1A            LDA  B,I
 42 170040                     TCA
 43  21770   77770A            ADA  AR1
 44  72501                     SIA  *+1
 45 173632                     SOS  FADNZ,C     EXPONENT OVERFLOW
 46  31773   77773A            STA  AR1+3
 47  76501                     SIB  *+1
 50 104001       1A            LDB  B,I
 51  16000     225R            CPB  =B100000
 52  66000      70R            JMP  FDV20
 53   1771   77771A            LDA  AR1+1
 54  42000       2X            JSM  .BDVS
 55 173407                     SOS  FDV10
 56   4000                     LDB  A
 57   2000     226R            LDA  =D0
 60  42000       3X            JSM  .BDVF
 61   4000                     LDB  A
 62   1773   77773A            LDA  AR1+3
 63  66000     112R            JMP  FADN-1
 64  31771   77771A    FDV10   STA  AR1+1
 65   2000     227R            LDA  =D32767
 66  31770   77770A            STA  AR1
 67 170201                     RET  1
 70   5771   77771A    FDV20   LDB  AR1+1
 71  16000     225R            CPB  =B100000
 72  66000      74R            JMP  *+2
 73  66000     112R            JMP  FADN-1
 74  72501                     SIA  *+1
 75 174500                     SBR  1
 76  66000     100R            JMP  FADNZ+1
*
 77   2000     230R    FADNZ   LDA  =D-32767
100  31770   77770A            STA  AR1
101  35771   77771A            STB  AR1+1
102 170201                     RET  1
103  35771   77771A    FADNN   STB  AR1+1
104 174600                     SBL  1
105  22000     231R            ADA  =D-1
106 176475                     SBM  *-3
107  66000     122R            JMP  FADNX
*
110   4000             .FLT    LDB  A            AREG = NUM TO BE FLOATED
111   2000     232R            LDA  =D15
112  31770   77770A            STA  AR1
113  76464             FADN    SZB  FADNZ
114   1770   77770A            LDA  AR1
115 176466                     SBM  FADNN
116  35771   77771A            STB  AR1+1
117 174600                     SBL  1
120  22000     231R            ADA  =D-1
121 176075                     SBP  *-3
122  72501             FADNX   SIA  *+1
123  31770   77770A            STA  AR1
124 170201                     RET  1
*
125 144003       3A    .FADA   ISZ  R,I          JSM .FADA
126 104003       3A            LDB  R,I          DEF OPERAND
127 104001       1A            LDB  B,I
130 176677                     SBM  *-1,C
131 100001       1A    .FADB   LDA  B,I          JSM .FADB
132 170040                     TCA               BREG = OPER. ADDRESS
133  21770   77770A            ADA  AR1
134 172423                     SAM  NEXPO
135  76501                     SIB  *+1
136  72003                     RZA  *+3
137 104001       1A            LDB  B,I
140  66000     146R            JMP  FADX-2
141  22000     233R            ADA  =D-16
142 172014                     SAP  FADX1
```

```
143  22000   202R          ADA ABR16
144 104001     1A          LDB B,I
145  70000                 EXE A
146 173201                 SOC *+1,C
147  25771 77771A          ADB AR1+1
150 173243         FADX    SOC FADN,C
151  45770 77770A          ISZ AR1
152                        NOP
153 174400                 ABR 1
154  26000   225R          ADB =B100000
155  35771 77771A          STB AR1+1
156 170201         FADXI   RET 1
157 170040         NEXPO   TCA
160  22000   233R          ADA =D-16
161 172405                 SAM *+5
162      1     1A          LDA B
163   6000     1X          LDB AR1D
164  71401                 XFR 2
165 170201                 RET 1
166  22000   201R          ADA AAR16
167  70540                 PWC A
170 100001     1A          LDA B,I
171  31770 77770A          STA AR1
172  76501                 STB *+1
173   1771 77771A          LDA AR1+1
174 170016                 EXE C,I
175 104001     1A          LDB B,I
176  24000                 ADB A
177  70760                 WWC A
200  66000   150R          JMP FADX
201 170417         AAR16   AAR 16
202 174417         ABR16   ABR 16
     *
203   1770 77770A  .FIX    LDA AR1          JSM .FIX
204   5771 77771A          LDB AR1+1
205 172415                 SAM FIXZ         CONTENTS OF AR1,AR1+1 FIXED
206  22000   234R          ADA =D-15
207  72405                 SZA FIXII+1
210 172006                 SAP FIXOV
211 170140                 CMA
212  62000   224R          IOR ABR1
213  70000         FIXII   EXE A
214      1     1A          LDA B
215 170201                 RET 1
216   2000   227R  FIXOV   LDA =D32767
217 176002                 SBP *+2
220 170040                 TCA
221 170201                 RET 1
222   2000   226R  FIXZ    LDA =D0
223 170201                 RET 1
224 174400         ABR1    ABR 1
      0            A       EQU 0
      1            B       EQU 1
      3            R       EQU 3
     16            C       EQU 16B
     17            D       EQU 17B
  77774            AR0     EQU 77774B
  77770            AR1     EQU 77770B
  77770                    END
225 100000
226      0
227  77777
230 100001
231 177777
232     17
233 177760
234 177761
```

| | | | | | | | |
|---|---|---|---|---|---|---|---|
| .BDVF | 3X | .BDVS | 2X | .FADA | 125R | .FADB | 131R |
| .FDVA | 34R | .FDVB | 40R | .FIX | 203R | .FLT | 110R |
| .FMPA | 0R | .FMPB | 4R | 0 | 226R | 100000 | 225R |
| 100001 | 230R | 17 | 232R | 177760 | 233R | 177761 | 234R |
| 177777 | 231R | 77777 | 227R | A | 0A | AAR16 | 201R |
| ABR1 | 224R | ABR16 | 202R | AR0 | 77774A | AR1 | 77770A |
| AR1D | 1X | B | 1A | C | 16A | D | 17A |
| FADN | 113R | FADNN | 103R | FADNX | 122R | FADNZ | 77R |
| FADX | 150R | FADXI | 156R | FDV10 | 64R | FDV20 | 70R |
| FIXII | 213R | FIXOV | 216R | FIXZ | 222R | FMPL | 17R |
| FMPS | 24R | NEXPO | 157R | R | 3A | | |

KSPMAX=2 MSPMAX=39 NSPMAX=6 SSPMAX=256 DSPMAX=158

APPENDIX B-27

DIGITAL STREAM ANALYSIS PROGRAM

```
ASMB,R,L
                                  HED DSA ROUTINES - BASE PAGE PORTION \
                                  NAM DSA,7  85680-90014A
 *
 *    A-85680-90013A-2
 *       85680-90013A  (S)
 *       85680-90014A  (R)
 *    27 SEP 1977
 *    LYNN WHEELWRIGHT
 *    DAVE SHARRIT
 *
```

```
      0                                EN1  PARTB,AR0D,AR1D,AR2D,AR3D
      0                                EX1  PINIT
      0                          A     EQU  0
      1                          B     EQU  1
      2                          P     EQU  2
      3                          R     EQU  3
      4                          R4    EQU  4
      5                          R5    EQU  5
      6                          R6    EQU  6
      7                          R7    EQU  7
     10                          IV    EQU  10B
     11                          PA    EQU  11B
     12                          W     EQU  12B
     13                          DMAPA EQU  13B
     14                          DMAC  EQU  14B
     15                          DMAMA EQU  15B
     16                          C     EQU  16B
     17                          D     EQU  17B
     20                          AR2   EQU  20B
     24                          SE    EQU  24B
  77774                          AR0   EQU  77774B
  77770                          AR1   EQU  77770B
  77764                          AR3   EQU  77764B
      0                                ORB
      0  74761                   PWRON WBC  B
      1  35770   77770A                STB  AR1
      2  66000      10R                JMP  .DSA
      3  77774                   AR0D  ABS  AR0
      4  77770                   AR1D  ABS  AR1
      5     20                   AR2D  ABS  AR2
      6  77764                   AR3D  ABS  AR3
      7          177746B         PARLC DEF  *-41B
     10                          PARTB EQU  *
     10                                ORR
```

APPENDIX B-28

```
HED DSA ROUTINES - MAIN PGM PORTION
*
*  CONSTANTS
*
 77707                           CM70  EQU  77707B
      0                          CM1   DEC  -1
      1                          B30   OCT  30
      2                          B10   OCT  10
      3                          HYPT1 OCT  205          HYBRID CHECK SUM
      4                          B40   OCT  100040
      5                          ROMMX OCT  140000       16 K ROM
      6                          SRLC1 OCT  057767
      7                          SRLC2 OCT  057777
*
**********************************
*     INSTRUMENT PRESET BEGINS HERE
**********************************
*
     10                          .DSA  EQU  *
     10 132000        7R         BEG   STA  SRLC2,I      CLEAR DSA COUNTER
*
**********************************
*   HYBRID REGISTER CHECK
**********************************
*
     11   2000        2R               LDA  B10
     12  71617                         CLR  16           CLEAR INTERNAL REGISTERS
     13  76603                         SSC  *+3
     14 170717                         RAR  16
     15  72176                         RIA  *-2          .5 SEC DELAY
     16 132000        6R               STA  SRLC1,I      CLOCK DSA COUNTER
     17   2000        2R               LDA  B10
     20   6000                   HYB2  LDB  CM1
     21  34003        3A         HYB3  STB  R
     22 104000                         LDB  A,I          READ REGISTER
     23  24012       12A               ADB  W
     24  34012       12A               STB  W            STORE CHECKSUM
     25   4003        3A               LDB  R
     26 134000                         STB  A,I          WRITE PATTERN
     27 174600                   HYC4  SBL  1            RIGHT SHIFT PATTERN
     30  76071                         RZB  HYB3         CYCLE BACK IF #0
     31  72501                         SIA  *+1          INCREMENT REGISTER INDEX
     32  12000        1R               CPA  B30          CHECK FOR LAST
     33  66000       35R               JMP  *+2
     34 176064                         SBP  HYB2         CYCLE BACK FOR NEXT REGISTER
     35  20012       12A               ADA  W
     36  12000        3R               CPA  HYPT1        CHECK CHECKSUM
     37  77202                         SLB  *+2,C
     40   6000                         LDB  CM1          ERROR DETECTED
     41  34015       15A               STB  DMAMA
*
**********************************
* ROM CHECKSUM
**********************************
*
     42   2000        4R               LDA  B40
     43  30017       17A               STA  D            INITIALIZE ROM LOCATION
     44     17       17A         ROMCH LDA  D
     45  12000        5R               CPA  ROMMX        CHECK FOR LAST ROM LOCATION
```

```
      46  66000     75R         JMP THRU
      47   6000                 LDB CM1
      50  34020     20A         STB AR2         INITIALIZE BYTE ACCUMULATORS
      51  74570                 WBD A,I         READ UPPER BYTE
      52  24000                 ADB A           SUM UPPER BYTE
      53  74570                 WBD A,I         READ LOWER BYTE/INCR. STACK
      54  20020     20A         ADA AR2
      55  30020     20A         STA AR2         STORE LOWER BYTE SUM
      56     17     17A         LDA D
      57 170604                 SAL 5
      60  72071                 RZA *-7         CHECK FOR END OF ROM CHIP
      61     17     17A         LDA D
      62 170511                 SAR 10
      63  22000      7B         ADA PARLC
      64 114000                 CPB A,I         CHECK UPPER BYTE CHECK SUM
      65  66000     67R         JMP CHK2
      66  66000     73R         JMP ERR
      67   4020     20A   CHK2  LDB AR2
      70  72501                 SIA *+1
      71 114000                 CPB A,I         CHECK LOWER BYTE CHECK SUM
      72  66000     44R         JMP ROMCH
      73   6000           ERR   LDB CM1
      74  34015     15A         STB DMAMA
      75 132000      6R   THRU  STA SRLC1,I
*
      76   2000    417R   MDSA  LDA B17
      77  30003      3A         STA R
*
     100  76211                 SSS RAM         DO RAM CHECK IF STATUS SET
     101  66000    161R         JMP EERAM         OTHERWISE JUMP TO EMC CHECK
*
     102   2000    413R   DSA   LDA B2
     103  30011     11A         STA PA
     104  30005      5A         STA R5          CLOCK IOSB
     105 132000      6R         STA SRLC1,I     CLOCK DSA COUNTER
     106  30005      5A         STA R5          CLOCK IOSB
     107  30005      5A         STA R5          CLOCK IOSB
     110 170201                 RET 1
*
*********************************
*      RAM TEST ROUTINE (FOR FOUR 1KX4 RAMS)
*********************************
*
     111 174517           RAM   SBR 16
     112  34021     21A         STB AR2+1
     113  34022     22A         STB AR2+2
     114   2000    150R         LDA RAMST
     115 134000                 STB A,I
     116  72501                 SIA *+1         CLEAR MEMORY
     117 172076                 SAP *-2
*
     120   6000    152R         LDB RAMT9
     121  42000    131R   RAMT1 JSM RAMTT
     122      1      1A         LDA B
     123 170040                 TCA
     124  30022     22A         STA AR2+2       STORE OLD PATTERN
     125 174700                 RBR 1           SHIFT PATTERN
     126  16000    152R         CPB RAMT9       CHECK FOR END
     127  66000    153R         JMP EDRAM
     130  66000    121R         JMP RAMT1
     131   2000    151R   RAMTT LDA RAMSS
     132  30023     23A         STA AR2+3
     133     23     23A   RAMTU LDA AR2+3
     134 176402                 SBM *+2
     135 170140                 CMA             COMPLEMENT ADDRESS
     136  62000    151R         IOR RAMSS
     137  30016     16A         STA C
     140  70760                 WWC A,D         READ RAM LOCATION
     141  20022     22A         ADA AR2+2       CHECK FOR CORRECT PATTERN
     142  60021     21A         IOR AR2+1
     143  30021     21A         STA AR2+1       STORE SCORE
     144  70541                 PWC B,I         WRITE NEXT PATTERN IN RAM LOCA
     145  44023     23A         ISZ AR2+3       INCREMENT ADDRESS, SKIP IF DON
     146  66000    133R         JMP RAMTU
     147 170201                 RET 1
     150                  RAMST OCT 076000
     151                  RAMSS OCT 176000
     152                  RAMT9 OCT 170360
*
     153     21     21A   EDRAM LDA AR2+1
     154   6000                 LDB CM1
     155  72404                 SZA EERAM       CHECK FOR PASS
     156 170600                 SAL 1
     157  34015     15A         STB DMAMA
     160  66000    155R         JMP *-3
*
     161  42000    102R   EERAM JSM DSA
*
*********************************
*      DIGITAL STORAGE ROUTINE
*********************************
*
     162   2000      2R   EMCH  LDA B10
```

```
      163   30011      11A            STA PA
      164   44011      11A            ISZ PA
      165    6000     432R            LDB DSTC
      166   34004       4A            STB R4
      167   30011      11A            STA PA
      170    2000     430R            LDA DSRAM
      171   76602                     SSC *+2
      172    2000     431R            LDA DSR2
      173   30022      22A            STA AR2+2
      174  170600                     SAL 1
      175   30004       4A            STA R4
      176  170040                     TCA
      177  174517                     CLB
      200   34006       6A            STB R6        SET DS RAM
      201   70430                     DIR
      202   72175                     RIA *-3
      203   34017      17A            STB D
      204   34023      23A            STB AR2+3
      205    2000     244R            LDA DST9
      206   72631                     SFC DST8
      207    4022      22A   DST1     LDB AR2+2
      210   34004       4A            STB R4
      211   30016      16A            STA C
      212  170517            DST2     CLA
      213      23      23A            LDA AR2+3
      214   20005       5A            ADA R5        READ DS MEMORY
      215   60017      17A            IOR D
      216   30017      17A            STA D
      217  170517                     CLA
      220   34004       4A            STB R4        SET DS ADDRESS
      221   70430                     DIR
      222  170517                     CLA
      223      16      16A            LDA C
      224   30006       6A            STA R6        WRITE DS MEMORY
      225   26000                     ADB CM1
      226  176064                     SBP DST2      INCR/SKIP
      227  170040                     TCA
      230   30023      23A            STA AR2+3
      231      16      16A            LDA C
      232  170600                     SAL 1
      233  172054                     SAP DST1      CYCLE BACK
      234    4017      17A            LDB D
      235  174603                     SBL 4
      236   76407                     SZB ETDS      CHECK FOR GOOD DS MEMORY
      237    2000     413R   DS18     LDA B2
      240   60015      15A            IOR DMAMA
      241   30015      15A            STA DMAMA
      242  174600                     SBL 1         SHIFT UNTIL BAD BITS GONE
      243   66000     236R            JMP *-5
      244                    DS19     OCT 5333
      245   42000     102R   ETDS     JSM DSA
*
*********************************
*       IOC INTERFACE VERIFY
*********************************
*
      246    6000     413R            LDB B2
      247   34011      11A            STB PA
      250    2000                     LDA CM1
      251   30005       5A            STA R5        SET KEY ROWS TO 0
      252   44011      11A            ISZ PA
      253  174600                     SBL 1
      254   34004       4A            STB R4        RESET RPG
      255   54011      11A            DSZ PA
      256       7       7A            LDA R7        READ RPG
      257  170140                     CMA
      260  170507                     SAR 8
      261    4006       6A            LDB R6        READ KEY COLUMN
      262  174607                     SBL 8
      263   24000                     ADB A
      264    2000     412R            LDA B1
      265   76702                     SHC *+2       CHECK LSRG
      266   76403                     SZB *+3       CHECK
      267   60015      15A            IOR DMAMA
      270   30015      15A            STA DMAMA     STATUS GND: CYCLE AUTOCHECK
*                       STATUS T1: COUNTER IGNORE
      271   76602                     SSC IOBEG     STATUS T2 OR T3: FULL POP TEST
      272   66000      10R            JMP BEG       STATUS T0: CYCLE IOC ROUTINE
*
****************************************************
*       IOC EXERCISE ROUTINE (RF SECTION INTERFACE)
****************************************************
*
      273    2000     420R   IOBEG    LDA STAK2
      274   30003       3A            STA R         INIT. RETURN STACK POINTER
      275  132000       6R            STA SRLC1,I   CLOCK DSA COUNTER (0111)
      276   76203                     SSS *+3
      277  132000       6R            STA SRLC1,I   CLOCK DSA (0011)
      300   66000       1X            JMP PINIT
      301  132000       7R            STA SRLC2,I   CLEAR DSA COUNTER
      302    2000     414R            LDA B4
      303   31776   77776A            STA LIND      INIT. LOOP INDEX
*
      304   42000     102R   STLOP    JSM DSA
```

```
      *
      305 170517                  SAR 16
      306  31777 77777A           STA APPL       INIT APPLIANCE COUNTER
      307   5777 77777A  LOPA     LDB APPL
      310  16000   410R           CPB CNTR       CHECK FOR = COUNTER
      311  66000   331R           JMP GOIO
      312 174500                  SBR 1
      313  16000   415R           CPB B5
      314  66000   322R           JMP NEXIO
      315 174501                  SBR 2
      316  16000   416R           CPB B6
      317  66000   331R           JMP GOIO
      320 174500                  SBR 1
      321  76410                  SZB GOIO
      322  45777 77777A  NEXIO    ISZ APPL
      323   5777 77777A           LDB APPL
      324 174505                  SBR 6
      325  76462                  SZB LOPA
      326  55776 77776A           DSZ LIND
      327  66000   304R           JMP STLOP
      330  66000   273R           JMP IOBEG
      331   2000   420R  GOIO     LDA PAT1
      332  42000   336R           JSM PATER      CYCLE IOC WITH PATTERN 1
      333   2000   421R           LDA PAT2
      334  42000   336R           JSM PATER      CYCLE IOC WITH PATTERN 2
      335  66000   322R           JMP NEXIO
      336   5777 77777A  PATER    LDB APPL
      337  16000   417R           CPB ATTEN      CHECK FOR ATTENUATOR
      340 170517                  SAR 16            AND CLEAR PATTERN
      341  30016    16A           STA C
      342   5777 77777A  PAT12    LDB APPL
      343 174701                  RBR 2
      344  34011    11A           STB PA         SET PER. ADDRESS
      345 174515                  SBR 14
      346  26000   414R           ADB B4
      347 130001     1A           STA B,I        OUTPUT PATTERN
      350   5777 77777A           LDB APPL
      351  16000   411R           CPB LCKFL      CHECK FOR FLAG ADDRESS AND
      352  42000   357R           JSM ROWSC          GO SUB ROWSCAN/READ
      353 170700                  RAR 1          ROTATE PATTERN
      354  10016    16A           CPA C          CHECK IF = STARTING PATTERN
      355 170201                  RET 1              AND RETURN
      356  66000   342R           JMP PATT2       LOOP BACK
      357  31774 77774A  ROWSC    STA LIND3
      360   6000     1R           LDB MAXCT
      361  35775 77775A           STB LIND2      INIT ROWSCAN LOOP COUNTER
      362   2000   422R           LDA PAT3
      363   6000   413R  ROWS2    LDB B2
      364  34011    11A           STB PA
      365  30005     5A           STA R5         OUTPUT PATTERN TO KEYROW LINES
      366  30001     1A           STA B
      367 174501                  SBR 2
      370  77003                  SLB *+3
      371  44011    11A           ISZ PA
      372  30006     6A           STA R6
      373  42000   400R           JSM READO
      374 170700                  RAR 1          ROTATE PATTERN
      375  55775 77775A           DSZ LIND2      DECREMENT ROWSCAN LOOP COUNTER
      376  66000   363R           JMP ROWS2      LOOP BACK IF NOT THROUGH
      377   1774 77774A           LDA LIND3
      400   5776 77776A  READO    LDB LIND
      401  26000   423R           ADB CONST
      402 104001     1A           LDB B,I
      403  34011    11A           STB PA
      404 174503                  SBR 4
      405 104001     1A           LDB B,I        READ INPUT DEVICE FOR THIS LOO
      406  35770 77770A           STB AR1
      407 170201                  RET 1
      *
      410                CNTR     OCT 24
      411                LCKFL    OCT 15
      412                B1       OCT 1
      413                B2       OCT 2
      414                B4       OCT 4
      415                B5       OCT 5
      416                B6       OCT 6
      417                B17      OCT 17
      420                PAT1     OCT 177757
      421                PAT2     OCT 007040
      422                PAT3     OCT 065200
      423        423R    CONST    DEF *
      424                         OCT 125        COUNTER
      425                         OCT 162        RPG
      426                         OCT 142        KEY COLUMN
      427                         OCT 0          A
        1                MAXCT    EQU B30
      417                ATTEN    EQU B17
      420                STAK2    EQU PAT1
    77737                CM40     EQU 77737B
      430                DSRAM    DEC 1023
      431                DSK2     DEC 4095
      432                DSTC     OCT 7737
    77777                APPL     EQU 77777B
    77776                LIND     EQU 77776B
```

```
386    77775                    LIND2  EQU  77775B
387    77774                    LIND3  EQU  77774B
388    77774                           END  PWRON
```

```
.DSA   10R     A      0A      APPL   77777A   AR0    77774A
AR0D   3B      AR1    77770A  AR1D   4B       AR2    20A
AR2D   5B      AR3    77764A  AR3D   6B       ATTEN  417R
B      1A      B1     412R    B10    2R       B17    417R
B2     413R    B30    1R      B4     414R     B40    4R
B5     415R    B6     416R    BEG    10R      C      16A
CHK2   67R     CM1    0R      CM40   77737A   CM70   77707A
CNTR   410R    CONST  423R    D      17A      DMAC   14A
DMAMA  15A     DMAPA  13A     DSA    102R     DSR2   431R
DSRAM  430R    DS11   207R    DST2   212R     DST8   237R
DS19   244R    DSTC   432R    EDRAM  153R     EERAM  161R
EMCH   162R    ERR    73R     ETDS   245R     GO1U   331R
HYB2   20R     HYB3   21R     HTC4   27R      HYPT1  3R
IOBEG  273R    IV     10A     LCKFL  411R     LIND   77776A
LIND2  77775A  LIND3  77774A  LOPA   307R     MAXCT  1R
MDSA   76R     NEXTO  322R    P      2A       PA     11A
PARLC  7B      PARTB  10B     PAT1   420R     PAT2   421R
PAT3   422R    PATER  336R    PATT2  342R     PINIT  1X
PWRON  0B      R      3A      R4     4A       R5     5A
R6     6A      R7     7A      RAM    111R     RAMSS  151R
RAMST  150R    RAMT1  121R    RAM19  152R     RAMTT  131R
RAMTU  133R    READO  400R    ROMCH  44R      ROMMX  5R
ROWS2  363R    ROWSC  357R    SE     24A      SRLC1  6R
SRLC2  7R      STAK2  420R    STLOP  304R     THRU   75R
W      12A

KSPMAX=2 MSPMAX=39 NSPMAX=6 SSPMAX=501 DSPMAX=158
KSPMAX=2 MSPMAX=39 NSPMAX=6 SSPMAX=501 DSPMAX=158
```

APPENDIX B-29

MEMORY MAP

```
DSA    1000   1433          40    50    1000
APR27  1433   34161         50    50    1000
BPCFP  34161  34352         50    50    123
BPCMC  34352  35315         50    50    123
BSRVC  35315  35524         50    50    123
\RRYC  35524  35563         50    50    123
ARRYS  35563  35613         50    50    123
TYPEC  35613  36030         50    50    123
ROUND  36030  36052         50    50    123
DSHFT  36052  36073         50    50    123
SHIFT  36073  36130         50    50    123
TSRB1  36130  36162         50    50    123
TEST   36162  36224         50    50    123
DEGL   36224  36240         50    50    123
CASE   36240  36256         50    50    123
RDWRT  36256  36344         50    50    123
STAC   36344  36347         50    50    123
ANDT   36347  36352         50    50    123
ORT    36352  36355         50    50    123
ATNER  36355  36401         50    50    123
ATPCR  36401  36510         50    50    123
CNVST  36510  36672         50    50    123
TDUMP  36672  37171         50    50    123
VDAVG  37171  37413         50    50    123
BFL1   37413  37650         50    50    123
LINKS: 121 777
```

```
.ADDR  35315  353     .AMIN  35033         .ANDT  36347  561
.ARAP  35565          .ARAI  35571  744    .ARGA  35427  776
.ARGL  35423  772     .ARGS  35430  746    .ARGT  36075
.ARRP  35524          .ARRY  35526  217    .BDVF  35164  121
.BDVS  35207  122     .BMIN  35045  443    .CASE  36240  602
.CLAI  35456          .CLAP  35462         .CLBI  35442  540
.CLBP  35446          .CLBV  35447         .CLNP  35464
.CSHV  35466  434     .DEQL  36224  752    .DIVD  34577
.DIVF  34565          .DLFT  36054  753    .DRGT  36064  755
.DSFT  36053  642     .DSGN  35420  174    .EQL   36227  701
.FADA  37540          .FADB  37544         .FDIG  36052  627
.FDVA  37447          .FDVB  37453         .FIX   37616
.FLT   37523          .FMPA  37413         .FMPB  37417
.FRPB  35321          .LADC  34404         .LDAP  35473  775
.LDBA  35336  624     .LDBI  35331  765    .LDBP  35335  736
.LDSA  35476  743     .LDSI  35501  751    .LDSP  35507
.LRAP  35563          .LRAY  35567  625    .MPYD  34462
.MVE4  35342  504     .NEQL  36234  617    .ORT   36352  615
.R4    36270          .R5    36265  501    .R6    36262  614
.R7    36257  211     .RAR2  35413         .RBIT  36140  606
.RLF1  36123  204     .RRGT  36076         .RS4   36267  330
.RS5   36264  730     .RS6   36261  212    .RS7   36256  702
.RTNA  35376  773     .RTNB  35370         .RTNI  35372  734
.RTNL  35406  631     .SAR2  35361  766    .SBIT  36135
.SLFT  36074  610     .SRGT  36073         .STAC  36344  342
.STAP  35515  735     .STBC  35351  300    .STBP  35353  761
.STRB  35365          .STRD  35355  770    .TBIT  36130  717
.TEST  36162  655     .TURN  36172  707    .UPC4  35436  771
.W4    36273  714     .W5    36277  706    .W6    36303  731
.W7    36311  705     .WS4   36272  727    .WS5   36276  703
.WS6   36302  732     .WS7   36310  677    .WSPS  36314
.WSTP  36322          .WSTR  36326  721    .WSTS  36331  726
```

```
ACHAR 36403 430     ADD1  34176 767     ADD1B 34173
ADD1P 34201         ADD1T 34214 756     ADD2  34400 567
ADD2B 34375         ADD2P 34372 570     ADD2T 34403 634
ADD3  35077 467     ADD3B 35074         ADD3P 35071
ADD3T 34403 601     ADD4B 35233 723     ADD4P 35235 665
ADD4T 35240 745     ADUMP 37044 354     APCHR 36401
APN25 36611         AR0D  43            AR1D  44
AR1LD 35011         AR1LN 35015         AR1LP 35021
AR1LT 35026         AR2D  45            AR3D  46
ATNER 36355 673     CDB   35771         CNV12 35702 737
CNV13 35671         CNV14 35745 155     CNV15 36510 431
CNV21 35731 742     CNV23 35672 565     CNV24 35746 754
CNV25 36607         CNV31 35731 750     CNV34 35752
CNV41 35730 757     CNV42 35613 652     CNV43 35613 637
CNV45 36606 426     DIV1  34323 747     DIV1B 34321
DIV1P 34317         DIV1T 34325 762     DIV2  34551 566
DIV2B 34541         DIV2P 34537         DIV2T 34543 462
DIV3  35113 572     DIV3B 35111         DIV3P 35107
DIV3T 34543         DIV4  35145 676     DIV4B 35137
DIV4P 35141         DIV4T 35143 201     HBUSY 37010 514
HPBSY 37004 433     ICHAR 36440         IHPBT 36721 357
IHPIB 36672 361     IPCHR 36433         MIN1  34175 764
MIN1B 34172         MIN1P 34200         MIN1T 34213
MIN2  34377 613     MIN2B 34374         MIN2P 34371 741
MIN2T 34402         MIN3  35076 635     MIN3B 35073
MIN3P 35070         MIN3T 34402         MIN4B 35271
MIN4P 35265 733     MIN4T 35273         MOD2  34563 543
MOD2B 34555         MOD2P 34553         MOD2T 34557
MOD3  35121         MOD3B 35117         MOD3P 35115
MOD3T 34557         MOD4  35131 653     MOD4B 35123
MOD4P 35125         MOD4T 35127         MPY1  34274 763
MPY1B 34272         MPY1P 34270 760     MPY1T 34276 740
MPY2  34460 564     MPY2B 34450         MPY2P 34446
MPY2T 34452 531     MPY3  35105 636     MPY3B 35103
MPY3P 35101         MPY3T 34452         MPY4B 35243
MPY4P 35245 715     MPY4T 35251 671     PARTB 50
PCHAR 36407         PDUMP 37054 351     PINIT 1433
ROUND 36030 503     SDUMP 37070 130     STHPB 36755 427
SUB1  34161         SUB1B 34164         SUB1P 34166
SUB1T 34170 152     SUB2  34360 573     SUB2B 34363
SUB2P 34365 526     SUB2T 34367 641     SUB3  35061 177
SUB3B 35064         SUB3P 35066         SUB3T 34367
SUB4B 35261 256     SUB4P 35254 656     SUB4T 35263 661
TDUMP 37056 352     VDAVG 37171 164     VDSUB 37346 165
WEOI  37034 435     WHPIB 37040 436
KSPMAX=1 MSPMAX=17 NSPMAX=0 SSPMAX=1617 BSPMAX=230 ESPMAX=418
FSPMAX=3 LSPMAX=231 XSPMAX=0
```

APPENDIX B-30

MAIN CONTROL PROGRAM

```
ASMB,L,R
                                    HED
                                    NAM APR27,3
         0                              ENT PINIT
         0                              EXT AR0D,AR1D,AR2D,AR3D
         0                          A   EQU 0
         1                          B   EQU 1
         2                          P   EQU 2
         3                          R   EQU 3
         4                          R4  EQU 4
         5                          R5  EQU 5
         6                          R6  EQU 6
         7                          R7  EQU 7
        10                          IV  EQU 10B
        11                          PA  EQU 11B
        12                          W   EQU 12B
        13                          DMAPA EQU 13B
        14                          DMAC  EQU 14B
        15                          DMAMA EQU 15B
        16                          C   EQU 16B
        17                          D   EQU 17B
     77763                          E   EQU 77763B
        20                          AR2 EQU 20B
        24                          SE  EQU 24B
     77774                          AR0 EQU 77774B
     77770                          AR1 EQU 77770B
     77764                          AR3 EQU 77764B
         0   2000     566R          PINIT LDA =B76000
         1  30003       3A                STA R
         2   2000     567R                LDA =B76100
         3  30016      16A                STA C
         4  31763   77763A                STA E
         5  66000       6R                JMP ANFNG
         6                          ANFNG EQU *
     77746                          V32742 EQU 32742   N
     77742                          V32738 EQU 32738   X
     77741                          V32737 EQU 32737   IY
        20                          V1   EQU 20B AR2
     77740                          V32736 EQU 32736   EFLAG
     77737                          V32735 EQU 32735   BLKS
        15                          V2   EQU 15B DMAMA
     77736                          V32734 EQU 32734   ETX
     77735                          V32733 EQU 32733   HPIB
     77734                          V32732 EQU 32732   CMOS
         6  66000   24714R                JMP A3
```

```
      7   77665A  V4 DEF T32693 MSTATE
     10           K5   OCT 177777   177777
     11           N6   DEC 39   39
  77665           T32693 EQU 32693
  77661           V32689 EQU 32689   LTEMP1
  77655           V32685 EQU 32685   LTEMP2
  77651           V32681 EQU 32681   LTEMP
  77713           V7   EQU T32693+22 FSTEP
  77645           V32677 EQU 32677   MFREQ
  77641           V32673 EQU 32673   VTOFREQ
  77635           V32669 EQU 32669   CFREST
  77631           V32665 EQU 32665   FPILOT
  77665           V8   EQU T32693   CFREQ
  77671           V9   EQU T32693+4   SPAN
  77724           V10 EQU T32693+31 AMF
  77625           V32661 EQU 32661   CSIGNL
  77707           V11 EQU T32693+18 FOFSET
  77621           V32657 EQU 32657   MANT
      3           V12 EQU 3 RPTR
     16           V13 EQU 16B CPTR
  77763           V14 EQU 77763B   EPTR
  77620           V32656 EQU 32656   PREFIX
  77617           V32655 EQU 32655   DECFLG
  77616           V32654 EQU 32654   XFLAG
  77675           V15 EQU T32693+8  BLEDS
  77676           V16 EQU T32693+9  TLEDS
  77677           V17 EQU T32693+10 RFAT
  77731           V18 EQU T32693+36 SINDEX
  77732           V19 EQU T32693+37 STIM
  77733           V20 EQU T32693+38 FSTIM
  77703           V21 EQU T32693+14 STRIG
  77700           V22 EQU T32693+11 RLVL
  77701           V23 EQU T32693+12 RVBW
  77702           V24 EQU T32693+13 VIDCON
  77721           V25 EQU T32693+28 MRKR
  77723           V26 EQU T32693+30 MKRMODE
  77720           V27 EQU T32693+27 AMLVL
  77717           V28 EQU T32693+26 AMKR
  77722           V29 EQU T32693+29 MKRLVL
  77730           V30 EQU T32693+35 KFLAG
  77706           V31 EQU T32693+17 ROFSET
  77705           V32 EQU T32693+16 THRESH
  77704           V33 EQU T32693+15 LEVLIN
  77615           V32653 EQU 32653   DAC1
  77614           V32652 EQU 32652   DAC2
  77613           V32651 EQU 32651   DAC4
  77612           V32650 EQU 32650   WCHR
  77611           V32649 EQU 32649   CHRC
  77610           V32648 EQU 32648   ALIM
  77607           V32647 EQU 32647   ACNT
  77606           V32646 EQU 32646   SRCEID
  77605           V32645 EQU 32645   SCANSL
  77604           V32644 EQU 32644   SATN
  77603           V32643 EQU 32643   PLOCK
  77602           V32642 EQU 32642   LKMSK
  77601           V32641 EQU 32641   HPBC
  77600           V32640 EQU 32640   CTIM
  77577           V32639 EQU 32639   CTBASE
  77656           V34 EQU V32685+1   BCDA
  77657           V35 EQU V32685+2   BCDB
  77660           V36 EQU V32685+3   BCDC
  77576           V32638 EQU 32638   RPGPTR
  77575           V32637 EQU 32637   K
  77574           V32636 EQU 32636   RPG
  77573           V32635 EQU 32635   I
  77572           V32634 EQU 32634   J
  77571           V32633 EQU 32633   L
  77570           V32632 EQU 32632   M
  77567           V32631 EQU 32631   KEYCOL
  77566           V32630 EQU 32630   KEYCODE
  77565           V32629 EQU 32629   SRQEN
  77564           V32628 EQU 32628   RPGCNT
  77563           V32627 EQU 32627   DSTAD
     12   77473A  V37 DEF T32571   BWFRQ
     13             OCT 177777   177777
     14           K38 OCT 70   70
  77473           T32571 EQU 32571
     15   77436A  V39 DEF T32542   BWAMP
     16             OCT 177777   177777
     17           N40 DEC 29   29
  77436           T32542 EQU 32542
  77473           V41 EQU T32571   KK
  77474           V42 EQU T32571+1   KL
  77475           V43 EQU T32571+2   KM
  77476           V44 EQU T32571+3   KN
  77435           V32541 EQU 32541   IF1
  77434           V32540 EQU 32540   IF2
  77433           V32539 EQU 32539   GIN1
  77432           V32538 EQU 32538   GIN2
  77431           V32537 EQU 32537   RPGSWP
  77430           V32536 EQU 32536   SLEN
  77713           V45 EQU T32693+22 ALIMSV
  77671           V46 EQU T32693+4  CTBSV
  77665           V47 EQU T32693   GIN1SV
```

```
77707     V48 EQU 132693+16 GIN2SV
77724     V49 EQU 132693+31 EFLGSV
77427     V32535 EQU 32535  AS
   20     T50 EQU *
   20     N51 DEC 2208  2208
   21     N52 DEC 128 128
   22     N53 DEC 0 0
   23     N54 DEC 2240  2240
   24     N55 DEC 432 432
   25         DEC 0 0
   26     N56 DEC 2272  2272
   27     N57 DEC 768 768
   30         DEC 0 0
   31     N58 DEC 2304  2304
   32     N59 DEC 336 336
   33     N60 DEC 960 960
   34     N61 DEC 2336  2336
   35     N62 DEC 80  80
   36         DEC 960 960
   37     N63 DEC 2368  2368
   40         DEC 0 0
   41     N64 DEC 896 896
   42     N65 DEC 2400  2400
   43         DEC 0 0
   44     N66 DEC 32  32
   45     N67 DEC 2432  2432
   46     N68 DEC 800 800
   47         DEC 32  32
   50         DEC 2400  2400
   51         DEC 0 0
   52         DEC 32  32
   53         DEC 2432  2432
   54     N69 DEC 704 704
   55         DEC 32  32
   56     N70 DEC 2976  2976
   57     N71 DEC 144 144
   60     N72 DEC 608 608
   61     N73 DEC 2688  2688
   62         DEC 80  80
   63     N74 DEC 992 992
   64     N75 DEC 3008  3008
   65         DEC 0 0
   66     N76 DEC 2560  2560
   67     N77 DEC 2496  2496
   70         DEC 0 0
   71     N78 DEC 640 640
   72     N79 DEC 2528  2528
   73         DEC 0 0
   74     N80 DEC 192 192
   75         DEC 2368  2368
   76         DEC 0 0
   77         DEC 896 896
  100     N81 DEC 2592  2592
  101     N82 DEC 816 816
  102         DEC 960 960
  103         DEC 2560  2560
  104     N83 DEC 720 720
  105         DEC 992 992
  106         DEC 2560  2560
  107     N84 DEC 656 656
  110         DEC 992 992
  111         DEC 2560  2560
  112         DEC 720 720
  113         DEC 992 992
  114         DEC 2560  2560
  115         DEC 704 704
  116         DEC 992 992
  117         DEC 2560  2560
  120         DEC 640 640
  121         DEC 992 992
  122         DEC 2560  2560
  123         DEC 704 704
  124         DEC 992 992
  125     N85 DEC 2752  2752
  126     N86 DEC 832 832
  127         DEC 768 768
  130     N87 DEC 2768  2768
  131         DEC 832 832
  132     N88 DEC 864 864
  133     N89 DEC 2784  2784
  134         DEC 832 832
  135         DEC 832 832
  136     N90 DEC 2800  2800
  137         DEC 832 832
  140         DEC 800 800
  141     N91 DEC 2816  2816
  142         DEC 832 832
  143     N92 DEC 928 928
  144     N93 DEC 2832  2832
  145         DEC 832 832
  146         DEC 704 704
  147     N94 DEC 2848  2848
  150         DEC 832 832
```

```
151                N95 DEC 736 736
152                N96 DEC 2864  2864
153                   DEC 832 832
154                   DEC 896 896
155                N97 DEC 2656  2656
156                   DEC 0 0
157                N98 DEC 480 480
160                N99 DEC 2960  2960
161                   DEC 832 832
162                N100  DEC 672 672
163                N101  DEC 2464  2464
164                   DEC 0 0
165                   DEC 768 768
166                N102  DEC 2624  2624
167                N103  DEC 368 368
170                   DEC 32  32
171                N104  DEC 2880  2880
172                N105  DEC 16  16
173                   DEC 960 960
174                N106  DEC 2384  2384
175                   DEC 0 0
176                   DEC 832 832
177                N107  DEC 2944  2944
200                   DEC 0 0
201                N108  DEC 352 352
202                N109  DEC 2192  2192
203                   DEC 0 0
204                N110  DEC 288 288
205                N111  DEC 2176  2176
206                   DEC 832 832
207                   DEC 640 640
210         20R    V112 DEF T50  SFIXY
211                   OCT 177777  177777
212                K113  OCT 170 170
77426              V32534 EQU 32534  UFLAG
152                V114  EQU T50+90  UNCALAD
213      77005A    V115 DEF T32261 ASAVE
214                K116  OCT 177776  177776
215                N117  DEC 7 7
216                   DEC 39  39
77005              T32261 EQU 32261
217                T118 EQU *
217        570R       DEF ="RES BW"
220        574R       DEF ="VBW"
221        577R       DEF ="SWP"
222        602R       DEF ="ATTEN"
223        606R       DEF ="REF"
224        611R       DEF =" "
225        613R       DEF ="CENTER"
226        617R       DEF ="SPAN"
227        622R       DEF ="START"
230        626R       DEF ="STOP"
231        631R       DEF ="STEP"
232        634R       DEF =" "
233        634R       DEF =" "
234        636R       DEF ="DL"
235        640R       DEF ="TH"
236        642R       DEF ="LINEAR"
237        634R       DEF =" "
240        646R       DEF ="MKR "
241        651R       DEF ="MKR    "
242        646R       DEF ="MKR "
243        655R       DEF ="CNTR "
244        661R       DEF ="CNTR    "
245        655R       DEF ="CNTR "
246        666R       DEF ="YTO UNLOCK "
247        675R       DEF ="249 UNLOCK "
250        704R       DEF ="275 UNLOCK "
251        713R       DEF ="OVEN COLD "
252        721R       DEF ="EXT REF "
253        726R       DEF ="VTO UNCAL "
254        734R       DEF ="YTO ERROR "
255        742R       DEF ="MEAS UNCAL"
256        750R       DEF ="VID AVG "
257        755R       DEF ="SRQ "
260        760R       DEF ="OFFSET"
261        760R       DEF ="OFFSET"
262        634R       DEF =" "
263        634R       DEF =" "
264        764R       DEF ="2nd LO "
265        771R       DEF ="CORR'D"
266        775R       DEF ="BATTERY "
267        217R    V119 DEF T118 SFTAB
270                   OCT 177777  177777
271                K120  OCT 50  50
272                T121 EQU *
272        570R       DEF ="RES BW"
273       1002R       DEF ="VIDEO BW"
274       1007R       DEF ="SWEEPTIME"
275       1015R       DEF ="RF ATTEN"
276       1022R       DEF ="REF LEVEL"
277       1030R       DEF ="LOG"
300        613R       DEF ="CENTER"
```

```
301    617R   DEF ="SPAN"
302    622R   DEF ="START"
303    626R   DEF ="STOP"
304   1033R   DEF ="CF STEP"
305   1040R   DEF ="TITLE:"
306   1044R   DEF ="DACS"
307   1047R   DEF ="DISPLAY LINE"
310   1056R   DEF ="THRESHOLD"
311    634R   DEF =" "
312    634R   DEF =" "
313   1064R   DEF ="MARKER"
314   1070R   DEF ="MARKER  "
315   1075R   DEF ="MARKER ZOOM"
316   1104R   DEF ="COUNTER"
317   1111R   DEF ="COUNTER  "
320   1117R   DEF ="COUNTER ZOOM"
321   1126R   DEF ="SAVE: REG"
322   1134R   DEF ="RECALL: REG"
323   1143R   DEF ="HP-IB ADRS: "
324   1152R   DEF ="ENTRY"
325    634R   DEF =" "
326   1156R   DEF ="PREAMP GAIN"
327   1165R   DEF ="SAVE LOCK"
330   1173R   DEF ="COUNTER RESOLN"
331    750R   DEF ="VID AVG "
332    634R   DEF =" "
333   1203R   DEF ="REF LVL OFFSET"
334   1213R   DEF ="FREQ OFFSET"
335   1222R   DEF ="SIGNAL IF"
336   1230R   DEF ="PILOT IF"
337   1235R   DEF ="VTO"
340   1240R   DEF ="SWEEP GEN"
341   1246R   DEF ="DSPL ADRS"
342   1254R   DEF ="WRITE:"
343   1260R   DEF ="MIXER LEVEL"
344   1267R   DEF ="DSPL ADRS INCR"
345    272R  V122 DEF T121 AFTAB
346             OCT 177777  177777
347          K123  OCT 53  53
350          T124 EQU *
350          K125  OCT 173776  173776
351          N126  DEC 1035  1035
352          N127  DEC 2060  2060
353             DEC 0 0
354          N128  DEC 1163  1163
355          N129  DEC 2085  2085
356          K130  OCT 173771  173771
357             DEC 1035  1035
360             DEC 2060  2060
361             DEC 0 0
362             DEC 1163  1163
363             DEC 2085  2085
364          K131  OCT 173764  173764
365             DEC 1035  1035
366          N132  DEC 2065  2065
367             DEC 0 0
370             DEC 1163  1163
371          N133  DEC 2100  2100
372          K134  OCT 173757  173757
373          K135  OCT 2002  2002
374             DEC 0 0
375          N136  DEC 2548  2548
376          K137  OCT 2001  2001
377          N138  DEC 216 216
400             OCT 2002  2002
401          N139  DEC 500 500
402          N140  DEC 2048  2048
403             OCT 2001  2001
404          N141  DEC 217 217
405             OCT 2002  2002
406          N142  DEC 1000  1000
407             DEC 2548  2548
410             OCT 2001  2001
411             DEC 216 216
412             DEC 1035  1035
413          N143  DEC 2152  2152
414          K144  OCT 173733  173733
415          K145  OCT 2202  2202
416          K146  OCT 4004  4004
417          K147  OCT 1774  1774
420             OCT 4004  4004
421          N148  DEC 4 4
422          K149  OCT 5774  5774
423             DEC 4 4
424             OCT 5774  5774
425             OCT 1774  1774
426          N150  DEC 1227  1227
427          K151  OCT 173714  173714
430          K152  OCT 2022  2022
431          K153  OCT 5750  5750
432             DEC 0 0
433          K154  OCT 4030  4030
434             DEC 0 0
435             OCT 5750  5750
```

```
436              DEC 0 0
437              OCT 4030   4030
440              DEC 0 0
441              DEC 1227   1227
442          K155  OCT 173675   173675
443              OCT 2002   2002
444              DEC 0 0
445              DEC 2048   2048
446          K156  OCT 3005   3005
447              OCT 2002   2002
450              OCT 5750   5750
451              DEC 0 0
452              DEC 2048   2048
453          N157  DEC 2148   2148
454              OCT 4030   4030
455              DEC 0 0
456              DEC 2048   2048
457              DEC 2148   2148
460          N158  DEC 1099   1099
461              DEC 1035   1035
462          N159  DEC 2119   2119
463              OCT 2002   2002
464              OCT 5750   5750
465              DEC 0 0
466              DEC 2048   2048
467              DEC 2048   2048
470              DEC 2048   2048
471          N160  DEC 24   24
472              OCT 3005   3005
473              OCT 2002   2002
474          K161  OCT 5634   5634
475              DEC 2048   2048
476              DEC 2048   2048
477          K162  OCT 1750   1750
500              OCT 5634   5634
501              DEC 2048   2048
502              DEC 2048   2048
503              DEC 24   24
504              DEC 1099   1099
505              DEC 1035   1035
506          N163  DEC 2139   2139
507              DEC 1227   1227
510          K164  OCT 173630   173630
511              OCT 2002   2002
512              DEC 1163   1163
513          N165  DEC 2115   2115
514          K166  OCT 173610   173610
515              OCT 2001   2001
516          K167  OCT 3777   3777
517          K168  OCT 2522   2522
520              DEC 0 0
521          N169  DEC 2695   2695
522          K170  OCT 2501   2501
523          N171  DEC 200 200
524          N172  DEC 208 208
525          K173  OCT 172100   172100
526          K174  OCT 2402   2402
527              DEC 16   16
530              DEC 2496   2496
531          K175  OCT 2401   2401
532          K176  OCT 176000   176000
533          K127  OCT 2060   2060
534          K177  OCT 174000   174000
535          N178  DEC 1027   1027
536          K179  OCT 172000   172000
537          K180  OCT 2024   2024
540    350R  V181 DEF T124 GRATCL
541              OCT 177777   177777
542              OCT 170 170
543          T182 EQU *
543          B183  HEX 10   10
544          B184  HEX 15   15
545          B185  HEX 20   20
546          B186  HEX 30   30
547          B120  HEX 50   50
550          B187  HEX 75   75
551          B188  HEX 99   99
552    543R  V189 DEF T182 LGTB
553              OCT 177777   177777
554          K117  OCT 7 7
555              EXT VDAVG
  0      5X  P196  EQU VDAVG
555              EXT VDSUB
  0      6X  P197  EQU VDSUB
555              EXT ATNER
  0      7X  P198  EQU ATNER
555              EXT ACHAR
  0     10X  P199  EQU ACHAR
555              EXT CNV15
  0     11X  P200  EQU CNV15
555              EXT CNV45
  0     12X  P201  EQU CNV45
555              EXT STHPB
```

```
      0                 13X   P202  EQU STHPB
    555                           EXT HPBSY
      0                 14X   P203  EQU HPBSY
    555                           EXT HBUSY
      0                 15X   P204  EQU HBUSY
    555                           EXT WEOI
      0                 16X   P205  EQU WEOI
    555                           EXT WHPIB
      0                 17X   P206  EQU WHPIB
    555                           EXT PDUMP
      0                 20X   P207  EQU PDUMP
    555                           EXT TDUMP
      0                 21X   P208  EQU TDUMP
    555                           EXT ADUMP
      0                 22X   P209  EQU ADUMP
    555                           EXT SDUMP
      0                 23X   P210  EQU SDUMP
    555                           EXT IHPIB
      0                 24X   P211  EQU IHPIB
    555                           EXT IHPBT
      0                 25X   P212  EQU IHPBT
    555                           EXT ROUND
      0                 26X   P213  EQU ROUND
    555                       P215  EQU * SKEY
    555    6000      1277R          LDB =D-1
    556   42000        27X          JSX .ARGA
    557    1676     77676A          LDA V16 TLEDS
    560   62000      1300R          IOR =B1000
    561   31676     77676A          STA V16 TLEDS
    562    6000      1301R          LDB =D-3   N
    563   42000        30X          JSX .LDAP
    564   42000     15546R          JSM P214   KEY
    565   66000        31X          JMX .RTNA
    566   76000
    567   76100
    570 RES BW
    574 VBW
    577 SWP
    602 ATTEN
    606 REF
    611
    613 CENTER
    617 SPAN
    622 START
    626 STOP
    631 STEP
    634
    636 DL
    640 TH
    642 LINEAR
    646 MKR
    651 MKR
    655 CNTR
    661 CNTR
    666 YTO UNLOCK
    675 249 UNLOCK
    704 275 UNLOCK
    713 OVEN COLD
    721 EXT REF
    726 VTO UNCAL
    734 YTO ERROR
    742 MEAS UNCAL
    750 VID AVG
    755 SRQ
    760 OFFSET
    764 2nd LO
    771 CORR'D
    775 BATTERY
   1002 VIDEO BW
   1007 SWEEPTIME
   1015 RF ATTEN
   1022 REF LEVEL
   1030 LOG
   1033 CF STEP
   1040 TITLE:
   1044 DACS
   1047 DISPLAY LINE
   1056 THRESHOLD
   1064 MARKER
   1070 MARKER
   1075 MARKER ZOOM
   1104 COUNTER
   1111 COUNTER
   1117 COUNTER ZOOM
   1126 SAVE: REG
   1134 RECALL: REG
   1143 HP-IB ADRS:
   1152 ENTRY
   1156 PREAMP GAIN
   1165 SAVE LOCK
   1173 COUNTER RESOLN
   1203 REF LVL OFFSET
   1213 FREQ OFFSET
   1222 SIGNAL IF
```

```
1230 PILOT IF
1235 VTO
1240 SWEEP GEN
1246 DSPL ADRS
1254 WRITE:
1260 MIXER LEVEL
1267 DSPL ADRS INCR
1277 177777
1300   1000
1301 177775
 566                             LIT
1302                            P224  EQU * LOG
1302    6000     1363R           LDB =D-4
1303   42000       32X           JSX .ARGL
1304   42000       33X           JSX .UPC4
1305   42000       34X           JSX .STRD
1306            77742A           DEF V32738  X
1307    1742    77742A           LDA V32738  IX
1310  170405                     AAR 6
1311   22000     1277R           ADA =D-1
1312   31741    77741A           STA V32737  IY
1313    2000     1364R           LDA =B100
1314   31742    77742A           STA V32738  IX
1315   30020       20A           STA V1  AR2
1316   42000       35X           JSX ADD1
1317             1365R           DEF =F3.1622776
1320   42000       36X           JSX .SAR2
1321   42000       37X           JSX .LDBI
1322             1365R           DEF =F3.1622776
1323   42000       40X           JSX MINI
1324            77742A           DEF V32738  X
1325   42000       41X           JSX MPY1
1326             1371R           DEF =F1.924950591
1327   42000       42X           JSX DIV1T
1330   42000       34X           JSX .STRD
1331            77742A           DEF V32738  X
1332   42000       41X           JSX MPY1
1333            77742A           DEF V32738  X
1334    6000     1375R           LDB =D-9  T
1335   42000       43X           JSX .STBP
1336   42000       41X           JSX MPY1
1337             1376R           DEF =F2.150025358@-3
1340   42000       35X           JSX ADD1
1341             1402R           DEF =F5.826876607@-3
1342    6000     1375R           LDB =D-9  T
1343   42000       44X           JSX MPY1P
1344   42000       35X           JSX ADD1
1345             1406R           DEF =F4.081138976@-2
1346    6000     1375R           LDB =D-9  T
1347   42000       44X           JSX MPY1P
1350   42000       35X           JSX ADD1
1351             1412R           DEF =F4.512095170-1
1352   42000       41X           JSX MPY1
1353            77742A           DEF V32738  X
1354   42000       35X           JSX ADD1
1355             1416R           DEF =F.5
1356   42000       36X           JSX .SAR2
1357    1741    77741A           LDA V32737  IY
1360   42000       45X           JSX CNV41
1361   42000       46X           JSX ADD1T
1362   66000       31X          JMX .RTNA
1363 177774
1364    100
1365 3.1622776
1371 1.924950591
1375 177767
1376 2.150025358@-3
1402 5.826876607@-3
1406 4.081138976@-2
1412 4.512095170-1
1416      .5
1363                             LIT
1422                            P225  EQU * FIX
1422    1742    77742A           LDA V32738  IX
1423  170405                     AAR 6
1424   31741    77741A           STA V32737  IY
1425  170040                     TCA
1426  172032                    SAP A226
1427    1741    77741A           LDA V32737  IY
1430  170040                     TCA
1431   22000     1456R           ADA =D12
1432   70540                     PWC A
1433   42000       37X           JSX .LDBI
1434            77742A           DEF V32738  XL
1435   70761                     WWC B
1436   42000       47X           JSX .DRGT
1437   42000       50X           JSX CNV24
1440   31741    77741A           STA V32737  IY
1441    1742    77742A           LDA V32738  IX
1442  170405                     AAR 6
1443   70540                     PWC A
1444   42000       37X           JSX .LDBI
1445            77742A           DEF V32738  XL
```

```
1446  70761              WWC B
1447  42000       51X     JSX .DLFT
1450  42000       34X     JSX .STRD
1451           77742A     DEF V32738   XL
1452   1742    77742A     LDA V32738   IX
1453  52000     1457R     AND =D1
1454  31742    77742A     STA V32738   IX
1455  66000     1462R     JMP A227
1456     14
1457      1
1456                      LIT
1460                     A226 EQU *
1460   2000     1463R     LDA =D0
1461  31741    77741A     STA V32737   IY
1462                     A227 EQU *
1462 170201               RET 1
1463      0
1463                      LIT
1464                     P228  EQU * PWR10
1464   6000     1363R     LDB =D-4
1465  42000       32X     JSX .ARGL
1466  42000       33X     JSX .DPC4
1467  42000       34X     JSX .STRD
1470           77742A     DEF V32738   X
1471  42000     1422R     JSM P225   FIX
1472   1741    77741A     LDA V32737   IY
1473  70540               PWC A
1474  42000       37X     JSX .LDBI
1475           77742A     DEF V32738   X
1476  42000       41X     JSX MPY1
1477            1512R     DEF =F2.302585093
1500  42000       34X     JSX .STRD
1501           77742A     DEF V32738   X
1502  42000       52X     JSX .DEQL
1503 172013              SAP A229
1504  42000       53X     JSX .LDSI
1505            1457R     DEF =D1
1506  42000       54X     JSX CNV31
1507  42000       34X     JSX .STRD
1510           77742A     DEF V32738   X
1511  66000     1632R     JMP A230
1512 2.302585093
1512                      LIT
1516                     A229 EQU *
1516  42000     1422R     JSM P225   FIX
1517  42000       37X     JSX .LDBI
1520            1565R     DEF =F8.680555550-3
1521  42000       41X     JSX MPY1
1522           77742A     DEF V32738   X
1523  42000       35X     JSX ADD1
1524            1571R     DEF =F4.375@-2
1525  42000       41X     JSX MPY1
1526           77742A     DEF V32738   X
1527  42000       35X     JSX ADD1
1530            1575R     DEF =F1.664930556@-1
1531  42000       41X     JSX MPY1
1532           77742A     DEF V32738   X
1533  42000       35X     JSX ADD1
1534            1601R     DEF =F.4992181875
1535  42000       41X     JSX MPY1
1536           77742A     DEF V32738   X
1537  42000       35X     JSX ADD1
1540            1605R     DEF =F1.000021701
1541  42000       41X     JSX MPY1
1542           77742A     DEF V32738   X
1543  42000       35X     JSX ADD1
1544            1611R     DEF =F1.000043403
1545  42000       34X     JSX .STRD
1546           77742A     DEF V32738   X
1547                     A231 EQU *
1547   1741    77741A     LDA V32737   IY
1550  72002               RZA *+2
1551  66000     1632R     JMP A232
1552 172402               SAM *+2
1553  66000     1621R     JMP A233
1554  42000       37X     JSX .LDBI
1555           77742A     DEF V32738   X
1556  42000       55X     JSX DIV1
1557            1615R     DEF =F2.718281828
1560  42000       34X     JSX .STRD
1561           77742A     DEF V32738   X
1562  45741    77741A     ISZ V32737   IY
1563                      NOP
1564  66000     1631R     JMP A234
1565 8.680555550-3
1571 4.375@-2
1575 1.664930556@-1
1601 .4992181875
1605 1.000021701
1611 1.000043403
1615 2.718281828
1565                      LIT
1621                     A233 EQU *
1621  42000       37X     JSX .LDBI
```

```
1622                 77742A      DEF V32738   X
1623   42000            41X      JSX MPY1
1624                  1615R      DEF =F2.718281828
1625   42000            34X      JSX .STRD
1626                 77742A      DEF V32738   X
1627   55741         77741A      DSZ V32737   IY
1630                             NOP
1631                            A234 EQU *
1631   66000          1547R       JMP A231
1632                            A232 EQU *
1632                            A230 EQU *
1632   70760                     WWC A
1633   31741         77741A      STA V32737   IY
1634  170605                     SAL 6
1635   21742         77742A      ADA V32738   IX
1636   31742         77742A      STA V32738   IX
1637   30020            20A      STA V1  AR2
1640   42000            37X      JSX .LDBI
1641                 77742A      DEF V32738   X
1642   66000            31X     JMX .RINA
1643                            T235 EQU *
1643                             DEC 0 0
1644                            N236  DEC 57   57
1645                            N237  DEC 470 470
1646                            N238  DEC 545 545
1647                            N239  DEC 1070  1070
1650                            N240  DEC 1145  1145
1651                  1643R     V241 DEF T235 RLADJ
1652                             OCT 177777  177777
1653                            K242  OCT 6 6
1654                            T243 EQU *
1654                            B53 HEX 0 0
1655                            B236  HEX 57   57
1656                            B237  HEX 470 470
1657                            B238  HEX 545 545
1660                            B239  HEX 1070  1070
1661                            B240  HEX 1145  1145
1662                  1654R     V244 DEF T243 RLADJB
1663                             OCT 177777  177777
1664                             OCT 6 6
1665                            P245  EQU * RLAD
1665  174517                     CLB
1666   42000            56X      JSX .ARGS
1667   44016            16A      ISZ C
1670    1730         77730A      LDA V30 KFLAG
1671  170513                     SAR 12
1672   52000          1457R      AND =D1
1673   70540                     PWC A
1674    1730         77730A      LDA V30 KFLAG
1675  170514                     SAR 13
1676   52000          1704R      AND =D6
1677   42000            57X      JSX ADD4T
1700   22000          1457R      ADA =D1
1701   42000            60X      JSX .ARAY
1702                  1651R      DEF V241   RLADJ
1703   66000            31X     JMX .RTNA
1704       6
1704                             LIT
1705                            P246  EQU * DBSHFT
1705    6000          1363R      LDB =D-4
1706   42000            32X      JSX .ARGL
1707   42000            33X      JSX .UPC4
1710    1675         77675A      LDA V15 BLEDS
1711  170140                     CMA
1712  170501                     SAR 2
1713   52000          1457R      AND =D1
1714   70540                     PWC A
1715   70761                     WWC B
1716   42000            47X      JSX .DRGT
1717   66000            31X     JMX .RTNA
1720                            P247  EQU * DBFIX
1720  174517                     CLB
1721   42000            56X      JSX .ARGS
1722   42000            33X      JSX .UPC4
1723    1730         77730A      LDA V30 KFLAG
1724  170514                     SAR 13
1725   52000          1704R      AND =D6
1726   22000          1457R      ADA =D1
1727   42000            60X      JSX .ARAY
1730                  1662R      DEF V244   RLADJB
1731   42000            61X      JSX .LDSA
1732    2000          1463R      LDA =D0
1733   75541                     MLY
1734   42000          1705R      JSM P246   DBSHFT
1735   66000            31X     JMX .RTNA
1736                            P248  EQU * NANOV
1736    6000          1363R      LDB =D-4
1737   42000            32X      JSX .ARGL
1740   42000            33X      JSX .UPC4
1741   42000            53X      JSX .LDSI
1742                  1770R      DEF =H2000
1743   42000          1705R      JSM P246   DBSHFT
1744   42000            62X      JSX CNV21
```

```
1745  42000      36X     JSX .SAR2
1746  42000    1720R     JSM P247   DBFIX
1747   6000    1375R     LDB =D-9   D
1750  42000      63X     JSX MIN2P
1751  42000      62X     JSX CNV21
1752  42000      42X     JSX DIV1T
1753  42000    1464R     JSM P228   PWR10
1754  42000      36X     JSX .SAR2
1755   1730   77730A     LDA V30 KFLAG
1756 170602              SAL 3
1757 172004             SAP A249
1760  42000      37X     JSX .LDBI
1761           1771R     DEF =F273.8606
1762  66000    1765R     JMP A250
1763                   A249 EQU *
1763  42000      37X     JSX .LDBI
1764           1775R     DEF =F223.606
1765                   A250 EQU *
1765  42000      64X     JSX MPY1T
1766  42000      65X     JSX CNV12
1767  66000      31X    JMX .RTNA
1770  20000
1771 273.8606
1775 223.606
1770                    LIT
2001                   P251   EQU * DBM
2001   6000    1363R     LDB =D-4
2002  42000      32X     JSX .ARGL
2003  42000      33X     JSX .UPC4
2004  42000      53X     JSX .LDS1
2005           1770R     DEF =H2000
2006  42000    1705R     JSM P246   DBSHFT
2007  42000      62X     JSX CNV21
2010  42000      36X     JSX .SAR2
2011   1730   77730A     LDA V30 KFLAG
2012 170602              SAL 3
2013 172004             SAP A252
2014  42000      37X     JSX .LDBI
2015           1771R     DEF =F273.8606
2016  66000    2021R     JMP A253
2017                   A252 EQU *
2017  42000      37X     JSX .LDBI
2020           1775R     DEF =F223.606
2021                   A253 EQU *
2021  42000      36X     JSX .SAR2
2022   6000    1375R     LDB =D-9   NV
2023  42000      66X     JSX .LDBP
2024  42000      52X     JSX .DEQL
2025 172004             SAP A254
2026  42000      53X     JSX .LDSI
2027           1457R     DEF =D1
2030  66000    2031R     JMP A255
2031                   A254 EQU *
2031                   A255 EQU *
2031  42000      62X     JSX CNV21
2032  42000      42X     JSX DIV1T
2033  42000    1302R     JSM P224   LOG
2034  42000      64X     JSX MPY1T
2035  42000      36X     JSX .SAR2
2036  42000    1720R     JSM P247   DBFIX
2037  42000      62X     JSX CNV21
2040  42000      46X     JSX ADD1T
2041  42000      65X     JSX CNV12
2042  66000      31X    JMX .RTNA
2043                   P256   EQU * DLIMIT
2043   6000    2066R     LDB =D-8
2044  42000      32X     JSX .ARGL
2045  42000      33X     JSX .UPC4
2046   6000    1375R     LDB =D-9   A
2047  42000      30X     JSX .LDAP
2050  73004              SLA A257
2051  42000      53X     JSX .LDSI
2052           1463R     DEF =D0
2053  66000    2065R     JMP A258
2054                   A257 EQU *
2054   6000    2067R     LDB =D-17 LIM
2055  42000      63X     JSX MIN2P
2056   4020      20A     LDB AR2
2057  77004              SLB A259
2060   6000    2067R     LDB =D-17 LIM
2061  42000      66X     JSX .LDBP
2062  66000    2065R     JMP A260
2063                   A259 EQU *
2063   6000    1375R     LDB =D-9   A
2064  42000      66X     JSX .LDBP
2065                   A260 EQU *
2065                   A258 EQU *
2065  66000      31X    JMX .RTNA
2066 177770
2067 177757
2066                    LIT
2070                   P261   EQU * IFBW
2070 174517              CLB
2071  42000      56X     JSX .ARGS
```

```
2072  44016      16A     ISZ C
2073   1434   77434A     LDA V32540  IF2
2074 170513              SAR 12
2075   6000    2107R     LDB =D3 IFBW
2076  42000      67X     JSX .STAP
2077 170040              TCA
2100  22000    1704R     ADA =D6
2101 172005             SAP A262
2102   6000    2107R     LDB =D3 IFBW
2103  42000      30X     JSX .LDAP
2104  22000    2110R     ADA =D-2
2105  66000      31X     JMX .RTNA
2106                    A262 EQU *
2106  66000      70X     JMX .RTNI
2107      3
2110 177776
2107                     LIT
2111                    P263  EQU * VBW
2111 174517              CLB
2112  42000      56X     JSX .ARGS
2113  44016      16A     ISZ C
2114   1434   77434A     LDA V32540  IF2
2115 170507              SAR 8
2116  52000    2131R     AND =B17
2117   6000    2107R     LDB =D3 VBW
2120  42000      67X     JSX .STAP
2121 170040              TCA
2122  22000    1704R     ADA =D6
2123 172005             SAP A264
2124   6000    2107R     LDB =D3 VBW
2125  42000      30X     JSX .LDAP
2126  22000    2110R     ADA =D-2
2127  66000      31X    JMX .RTNA
2130                    A264 EQU *
2130  66000      70X     JMX .RTNI
2131     17
2131                     LIT
2132                    P265  EQU * LIMIT
2132   6000    2110R     LDB =D-2
2133  42000      27X     JSX .ARGA
2134  44016      16A     ISZ C
2135   4000              LDB A
2136   2000    1463R     LDA =D0
2137 176413             SBM A266
2140   6000    1301R     LDB =D-3  I
2141  42000      30X     JSX .LDAP
2142   6000    2153R     LDB =D-5  J
2143  42000      71X     JSX MIN4P
2144 172004             SAP A267
2145   6000    2153R     LDB =D-5  J
2146  42000      30X     JSX .LDAP
2147  66000    2152R     JMP A268
2150                    A267 EQU *
2150   6000    1301R     LDB =D-3  I
2151  42000      30X     JSX .LDAP
2152                    A268 EQU *
2152                    A266 EQU *
2152  66000      31X     JMX .RTNA
2153 177773
2153                     LIT
2154                    P269  EQU * WSPIN
2154   1570   77570A     LDA V32632  M
2155 170603              SAL 4
2156  61571   77571A     IOR V32633  L
2157 170610              SAL 9
2160   6000    2107R     LDB =D3
2161  42000      72X     JSX .WS6
2162 170201              RET 1
2163                    P270  EQU * ILEDSOUT
2163   6000    1277R     LDB =D-1
2164  42000      27X     JSX .ARGA
2165  31676   77676A     STA V16 ILEDS
2166 170140              CMA
2167   6000    2172R     LDB =D13
2170  42000      72X     JSX .WS6
2171  66000      31X     JMX .RTNA
2172     15
2172                     LIT
2173                    P271  EQU * CRLF
2173   2000    2172R     LDA =D13
2174   6000    2203R     LDB =D8
2175  42000      72X     JSX .WS6
2176   2000    2204R     LDA =D10
2177  42000      73X     JSX .W6
2200   2000    2205R     LDA =B40
2201  42000      73X     JSX .W6
2202 170201              RET 1
2203     10
2204     12
2205     40
2203                     LIT
2206                    P272  EQU * SPACE
2206   2000    2205R     LDA =B40
2207   6000    2203R     LDB =D8
```

```
2210  42000     72X      JSX .WS6
2211 170201              RET 1
2212                    P273  EQU * DELTA
2212   6000   2221R      LDB =D9
2213  42000     74X      JSX .RS5
2214  31742  77742A      STA V32738   IX
2215   2000   2222R      LDA =D249
2216   6000   2203R      LDB =D8
2217  42000     72X      JSX .WS6
2220 170201              RET 1
2221     11
2222    371
2221                     LIT
2223                    P274  EQU * NBLK
2223   6000   1277R      LDB =D-1
2224  42000     27X      JSX .ARGA
2225   6000   2107R      LDB =D3
2226  75617              MPY
2227  22000   2110R      ADA =D-2
2230  31573  77573A      STA V32635   I
2231  42000     60X      JSX .ARAY
2232                210R DEF V112   SFTXY
2233   6000   2203R      LDB =D8
2234  42000     75X      JSX .WS4
2235   2000   1463R      LDA =D0
2236  42000     73X      JSX .W6
2237   2000   2275R      LDA =B2102
2240  42000     73X      JSX .W6
2241   1573  77573A      LDA V32635   I
2242  22000   1457R      ADA =D1
2243  42000     60X      JSX .ARAY
2244                210R DEF V112   SFTXY
2245  42000     73X      JSX .W6
2246   1573  77573A      LDA V32635   I
2247  22000   2276R      ADA =D2
2250  42000     60X      JSX .ARAY
2251                210R DEF V112   SFTXY
2252  62000   2277R      IOR =B4000
2253  42000     73X      JSX .W6
2254   2000   2300R      LDA =B2101
2255  42000     73X      JSX .W6
2256   6000   1301R      LDB =D-3   N
2257  42000     30X      JSX .LDAP
2260  42000     60X      JSX .ARAY
2261                267R DEF V119   SFTAB
2262   6000   1704R      LDB =D6
2263  42000     76X      JSX .WSTS
2264   6000   1301R      LDB =D-3   N
2265  42000     30X      JSX .LDAP
2266  12000   2301R      CPA =D19
2267  66000   2273R      JMP A276
2270  12000   2302R      CPA =D22
2271  66000   2273R      JMP *+2
2272  66000   2274R      JMP A275
2273                    A276 EQU *
2273  42000   2212R      JSM P273   DELTA
2274                    A275 EQU *
2274  66000     31X      JMX .RTNA
2275   2102
2276      2
2277   4000
2300   2101
2301     23
2302     26
2275                     LIT
2303                    P277  EQU * GOFSET
2303 174517              CLB
2304  42000     56X      JSX .ARGS
2305  44016     16A      ISZ C
2306   5677  77677A      LDB V17 RFAT
2307 174613              SBL 12
2310   1432  77432A      LDA V32538   GIN2
2311 176402              SBM A278
2312   1433  77433A      LDA V32539   GIN1
2313                    A278 EQU *
2313  66000     31X      JMX .RTNA
2314                    P279  EQU * SBLK
2314   6000   1277R      LDB =D-1
2315  42000     27X      JSX .ARGA
2316   6000   2107R      LDB =D3
2317  75617              MPY
2320  22000   2110R      ADA =D-2
2321  42000     60X      JSX .ARAY
2322                210R DEF V112   SFTXY
2323  70541              PWC B
2324   6000   1301R      LDB =D-3   N
2325  42000     30X      JSX .LDAP
2326  42000     60X      JSX .ARAY
2327                267R DEF V119   SFTAB
2330 100000              LDA A,I
2331  42000     77X      JSX ADD4B
2332  22000   2405R      ADA =D5
2333   6000   2203R      LDB =D8
```

```
2334   42000      75X    JSX .WS4
2335    2000    2205R    LDA =B40
2336   42000      73X    JSX .W6
2337    6000    1301R    LDB =D-3   N
2340   42000      30X    JSX .LDAP
2341  170500             SAR 1
2342   12000    2406R    CPA =D7
2343   66000    2351R    JMP A281
2344    6000    1301R    LDB =D-3   N
2345   42000      30X    JSX .LDAP
2346   12000    2407R    CPA =D34
2347   66000    2351R    JMP *+2
2350   66000    2355R    JMP A280
2351                   A281 EQU *
2351   42000    2173R    JSM P271   CRLF
2352    1616   77616A    LDA V32654   XFLAG
2353   62000    2410R    IOR =B200
2354   31616   77616A    STA V32654   XFLAG
2355                   A280 EQU *
2355    6000    1301R    LDB =D-3   N
2356   42000      30X    JSX .LDAP
2357   42000   14055R    JSM P216   MESSAGE
2360    6000    1301R    LDB =D-3   N
2361   42000      30X    JSX .LDAP
2362   12000    2411R    CPA =D4
2363   66000    2365R    JMP *+2
2364   66000    2374R    JMP A282
2365   42000    2303R    JSM P277   GOFSET
2366   72406             SZA A282
2367    6000    1704R    LDB =D6
2370   42000     100X    JSX .WS1R
2371            2412R    DEF =" PG "
2372    2000    2416R    LDA =D29
2373   42000   14055R    JSM P216   MESSAGE
2374                   A282 EQU *
2374    6000    1301R    LDB =D-3   N
2375   42000      30X    JSX .LDAP
2376    4000             LDB A
2377   26000    2417R    ADB =B177772
2400    2000    2420R    LDA =D145
2401   76402             SZB A283
2402    2000    2421R    LDA =D146
2403                   A283 EQU *
2403   42000      73X    JSX .W6
2404   66000      31X    JMX .RINA
2405       5
2406       7
2407      42
2410     200
2411       4
2412   PG
2416      35
2417  177772
2420     221
2421     222
2405                     LIT
2422                   P284   EQU * BLKAD
2422    6000    1277R    LDB =D-1
2423   42000      27X    JSX .ARGA
2424    6000    2107R    LDB =D3
2425   75617             MPY
2426   22000    2110R    ADA =D-2
2427   42000      60X    JSX .ARAY
2430             2101R   DEF V112   SFTXY
2431    6000    2203R    LDB =D8
2432   42000      75X    JSX .WS4
2433   66000      31X    JMX .RINA
2434                   P285   EQU * BLKOF
2434    6000    1277R    LDB =D-1
2435   42000      27X    JSX .ARGA
2436   66000    2445R    JMP A286
2437                   T287 EQU *
2437                     DEC 0 0
2440                   K288   OCT 177401   177401
2441                   K289   OCT 742 742
2442            2437R  V290 DEF T287 SK16
2443                     OCT 177777   177777
2444                   K291   OCT 3 3
2445                   A286   EQU *
2445   42000    2422R    JSM P284   BLKAD
2446    6000    1301R    LDB =D-3   N
2447   42000      30X    JSX .LDAP
2450   12000    1456R    CPA =D12
2451   66000    2455R    JMP A293
2452   12000    2477R    CPA =D36
2453   66000    2455R    JMP *+2
2454   66000    2457R    JMP A292
2455                   A293 EQU *
2455    2000    2500R    LDA =D147
2456   66000    2475R    JMP A294
2457                   A292 EQU *
2457    6000    1301R    LDB =D-3   N
2460   42000      30X    JSX .LDAP
2461   52000    2131R    AND =D15
```

```
1138   2462  70540           PWC A
1139   2463   6000   1301R    LDB =D-3   N
1140   2464  42000     30X    JSX .LDAP
1141   2465 170503            SAR 4
1142   2466  22000   1457R    ADA =D1
1143   2467  42000     60X    JSX .ARAY
1144   2470          2442R    DEF V290   SK16
1145   2471  70761           WWC B
1146   2472  42000    101X    JSX .IBIT
1147   2473 170416            AAR 15
1148   2474  22000   2421R    ADA =D146
1149   2475                  A294 EQU *
1150   2475  42000     73X    JSX .W6
1151   2476  66000     31X    JMX .RTNA
       2477     44
       2500    223
1152   2477                   LIT
1153   2501                  P295  EQU * BLINK
1154   2501   6000   1277R    LDB =D-1
1155   2502  42000     27X    JSX .ARGA
1156   2503  42000   2223R    JSM P274   NBLK
1157   2504   6000   1301R    LDB =D-3   N
1158   2505  42000     30X    JSX .LDAP
1159   2506  42000   2422R    JSM P284   BLKAD
1160   2507   6000   1301R    LDB =D-3   N
1161   2510  42000     30X    JSX .LDAP
1162   2511   4000            LDB A
1163   2512  26000   2520R    ADB =B177741
1164   2513   2000   1463R    LDA =D0
1165   2514  76402           SZB A296
1166   2515   2000   2521R    LDA =B21
1167   2516                  A296 EQU *
1168   2516  42000     73X    JSX .W6
1169   2517  66000     31X    JMX .RTNA
       2520 177741
       2521     21
1170   2520                   LIT
1171   2522                  P297  EQU * RJUST
1172   2522   6000   2110R    LDB =D-2
1173   2523  42000     27X    JSX .ARGA
1174   2524  42000   2314R    JSM P279   SBLK
1175   2525   2000   2107R    LDA =D3
1176   2526   6000   1301R    LDB =D-3   N
1177   2527  42000    102X    JSX MPY4P
1178   2530  22000   2110R    ADA =D-2
1179   2531  42000     60X    JSX .ARAY
1180   2532           210R    DEF V112   SFIXY
1181   2533  22000   2276R    ADA =D2
1182   2534  42000    103X    JSX .W4
1183   2535   6000   1301R    LDB =D-3   N
1184   2536  42000     30X    JSX .LDAP
1185   2537  42000     60X    JSX .ARAY
1186   2540           267R    DEF V119   SFTAB
1187   2541 100000            LDA A,I
1188   2542  21430  77430A    ADA V32536   SLEN
1189   2543  22000   1457R    ADA =D1
1190   2544 170603            SAL 4
1191   2545   6000   2153R    LDB =D-5   P
1192   2546  42000     71X    JSX MIN4P
1193   2547  42000     73X    JSX .W6
1194   2550  66000     31X    JMX .RTNA
1195   2551                  P298  EQU * ABLK
1196   2551   1620  77620A    LDA V32656   PREFIX
1197   2552  12000   2406R    CPA =D7
1198   2553  66000   2555R    JMP *+2
1199   2554  66000   2566R    JMP A299
1200   2555   1675  77675A    LDA V15 BLEDS
1201   2556 170604            SAL 5
1202   2557 172007           SAP A299
1203   2560   2000   2565R    LDA =D11
1204   2561  42000   2223R    JSM P274   NBLK
1205   2562   2000   2565R    LDA =D11
1206   2563  42000   2314R    JSM P279   SBLK
1207   2564  66000   2570R    JMP A300
       2565     13
1208   2565                   LIT
1209   2566                  A299 EQU *
1210   2566   2000   2565R    LDA =D11
1211   2567  42000   2434R    JSM P285   BLKOF
1212   2570                  A300 EQU *
1213   2570   1616  77616A    LDA V32654   XFLAG
1214   2571  62000   2644R    IOR =B10000
1215   2572  31616  77616A    STA V32654   XFLAG
1216   2573   1601  77601A    LDA V32641   HPBC
1217   2574  52000   2645R    AND =B137777
1218   2575  31601  77601A    STA V32641   HPBC
1219   2576   2000   2646R    LDA =D3008
1220   2577  31737  77737A    STA V32735   BLKS
1221   2600   2000   1463R    LDA =D0
1222   2601  31617  77617A    STA V32655   DECFLG
1223   2602  31611  77611A    STA V32649   CHRC
1224   2603  42000     53X    JSX .LDSI
1225   2604          1463R    DEF =D0
```

```
2605  42000     34X     JSX .STRO
2606          77651A    DEF V32661  LTEMP
2607   1620   77620A    LDA V32656  PREFIX
2610  72433            SZA A301
2611  42000      60X    JSX .ARAY
2612            345R    DEF V122  AFTAB
2613 100000             LDA A,I
2614  22000    2406R    ADA =D7
2615  31612   77612A    STA V32650  NCHR
2616  21737   77737A    ADA V32735  BLKS
2617   6000    2203R    LDB =D8
2620  42000      75X    JSX .WS4
2621   1620   77620A    LDA V32656  PREFIX
2622  42000   14055R    JSM P216  MESSAGE
2623   1620   77620A    LDA V32656  PREFIX
2624 170040             TCA
2625  22000    2521R    ADA =D17
2626 172007            SAP A302
2627   1620   77620A    LDA V32656  PREFIX
2630  22000    2647R    ADA =D-24
2631 172004            SAP A302
2632  42000    2173R    JSM P271  CRLF
2633   2000    2521R    LDA =D17
2634  42000   14055R    JSM P216  MESSAGE
2635                   A302 EQU *
2635   1620   77620A    LDA V32656  PREFIX
2636 170500             SAR 1
2637  12000    1456R    CPA =D12
2640  66000    2643R    JMP A303
2641   2000    2500R    LDA =D147
2642  42000      73X    JSX .W6
2643                   A303 EQU *
2643                   A301 EQU *
2643 170201             RET 1
2644  10000
2645 137777
2646   5700
2647 177750
2644                    LIT
2650                   P304  EQU * UNCAL
2650   2000     152R    LDA V114  UNCALAD
2651   6000    2203R    LDB =D8
2652  42000      75X    JSX .WS4
2653   1426   77426A    LDA V32534  UFLAG
2654 172012             SAP A305
2655   2000    1463R    LDA =D0
2656  42000      73X    JSX .W6
2657   2000     152R    LDA V114  UNCALAD
2660  22000    2405R    ADA =D5
2661  42000     103X    JSX .W4
2662   6000    1704R    LDB =D6
2663  42000     100X    JSX .WSTR
2664            742R    DEF ="MEAS UNCAL"
2665  66000    2731R    JMP A306
2666                   A305 EQU *
2666   1733   77733A    LDA V20 FSTIM
2667 172415             SAM A309
2670   1426   77426A    LDA V32534  UFLAG
2671 170612             SAL 11
2672 172004             SAP A310
2673   1676   77676A    LDA V16 TLEDS
2674 170611             SAL 10
2675 172013             SAP A308
2676                   A310 EQU *
2676   1426   77426A    LDA V32534  UFLAG
2677 170615             SAL 14
2700 172004             SAP A311
2701   1676   77676A    LDA V16 TLEDS
2702 170614             SAL 13
2703 172005             SAP A308
2704                   A311 EQU *
2704                   A309 EQU *
2704   1426   77426A    LDA V32534  UFLAG
2705  52000    2723R    AND =B54
2706  22000    2724R    ADA =B177724
2707  72020             RZA A307
2710                   A308 EQU *
2710   2000    1463R    LDA =D0
2711  42000      73X    JSX .W6
2712   2000     152R    LDA V114  UNCALAD
2713  22000    2405R    ADA =D5
2714  42000     103X    JSX .W4
2715   6000    1704R    LDB =D6
2716  42000     100X    JSX .WSTR
2717           2725R    DEF =" *"
2720   2000    2420R    LDA =D145
2721  42000      73X    JSX .W6
2722  66000    2731R    JMP A312
2723     54
2724 177724
2725  *
2723                    LIT
2727                   A307 EQU *
```

```
2727    2000   2420R     LDA =D145
2730   42000     73X     JSX .W6
2731                    A312 EQU *
2731                    A306 EQU *
2731    1723  77723A     LDA V26 MKRMODE
2732  170040             ICA
2733   22000   2761R     ADA =D20
2734  172024            SAP A313
2735    1426  77426A     LDA V32534  UFLAG
2736  170610             SAL 9
2737  172021            SAP A313
2740    2000   2107R     LDA =D3
2741    5723  77723A     LDB V26 MKRMODE
2742   75617             MPY
2743   22000   2110R     ADA =D-2
2744   42000     60X     JSX .ARAY
2745           210R      DEF V112  SFTXY
2746   70541             PWC B
2747    1723  77723A     LDA V26 MKRMODE
2750   42000     60X     JSX .ARAY
2751            267R     DEF V119  SFTAB
2752  100000             LDA A,I
2753   42000     77X     JSX ADD4B
2754   22000   2405R     ADA =D5
2755   42000    103X     JSX .W4
2756    2000   2421R     LDA =D146
2757   42000     73X     JSX .W6
2760                    A313 EQU *
2760  170201             RET 1
2761      24
2761                     LIT
2762                    P314  EQU * AVGRSI
2762    2000   1277R     LDA =B177777
2763   31607  77607A     STA V32647  ACNT
2764    1426  77426A     LDA V32534  UFLAG
2765   62000   2771R     IOR =B126
2766   31426  77426A     STA V32534  UFLAG
2767   42000   2650R     JSM P304  UNCAL
2770  170201             RET 1
2771     126
2771                     LIT
2772                    P315  EQU * DALG
2772   42000   2762R     JSM P314  AVGRSI
2773    1702  77702A     LDA V24 VIDCON
2774  170611             SAL 10
2775  172002             SAP *+2
2776   66000   3043R     JMP A316
2777   66000   3006R     JMP A317
3000                    T318 EQU *
3000           3023R     DEF =" NEG PK"
3001           3030R     DEF =" POS PK"
3002           3035R     DEF =" SAMPLE"
3003           3000R    V319 DEF T318 ALGS
3004                     OCT 177777  177777
3005                     OCT 3 3
3006                    A317  EQU *
3006    2000   3042R     LDA =D37
3007   42000   2223R     JSM P274  NBLK
3010    1702  77702A     LDA V24 VIDCON
3011  170502             SAR 3
3012   52000   2107R     AND =D3
3013   22000   1457R     ADA =D1
3014   42000     60X     JSX .ARAY
3015           3003R     DEF V319  ALGS
3016    6000   1704R     LDB =D6
3017   42000     76X     JSX .WSTS
3020    2000   2420R     LDA =D145
3021   42000     73X     JSX .W6
3022   66000   3045R     JMP A320
3023  NEG PK
3030  POS PK
3035  SAMPLE
3042      45
3023                     LIT
3043                    A316 EQU *
3043    2000   3042R     LDA =D37
3044   42000   2434R     JSM P265  BLKOF
3045                    A320 EQU *
3045  170201             RET 1
3046                    P321  EQU * CLEAR
3046    6000   1277R     LDB =D-1
3047   42000     27X     JSX .ARGA
3050   22000   1277R     ADA =D-1
3051  170611             SAL 10
3052   22000   1457R     ADA =D1
3053    6000   2203R     LDB =D8
3054   42000     75X     JSX .WS4
3055    6000   1301R     LDB =D-3  N
3056   42000     30X     JSX .LDAP
3057    4000             LDB A
3060   26000   1363R     ADB =B177774
3061    2000   3110R     LDA =B2024
3062   76402            SZB A322
3063    2000   1463R     LDA =D0
```

```
3064                        A322 EQU *
3064    31572   77572A        STA V32634  J
3065     2000    3111R        LDA =B176001
3066    70540                 PWC A
3067     2000    1457R        LDA =D1
3070                        A323 EQU *
3070    31573   77573A        STA V32635  I
3071   170040                 TCA
3072    22000    3112R        ADA =D1001
3073   172005                 SAP A324
3074     1572   77572A        LDA V32634  J
3075    72003                 RZA A324
3076     2000    3113R        LDA =B2060
3077    66000    3101R        JMP A325
3100                        A324 EQU *
3100     1572   77572A        LDA V32634  J
3101                        A325 EQU *
3101    42000      73X        JSX .W6
3102     2000    1457R        LDA =D1
3103    21573   77573A        ADA V32635  I
3104   144016      16A        ISZ C,I
3105    66000    3070R        JMP A323
3106    54016      16A        DSZ C
3107    66000      31X        JMX .RTNA
3110     2024
3111   176001
3112     1751
3113     2060
3110                         LIT
3114                        P326  EQU * WDACS
3114     6000    1277R        LDB =D-1
3115    42000      27X        JSX .ARGA
3116     2000    3166R        LDA =D1023
3117    70540                 PWC A
3120     6000    1301R        LDB =D-3  DAC
3121    42000      30X        JSX .LDAP
3122    42000    2132R        JSM P265  LIMIT
3123    31613   77613A        STA V32651  DAC4
3124    31614   77614A        STA V32652  DAC2
3125    31615   77615A        STA V32653  DAC1
3126    42000     104X        JSX .TURN
3127             3166R        DEF =B1777
3130            77604A        DEF V32644  SATN
3131    31604   77604A        STA V32644  SATN
3132     2000    1463R        LDA =D0
3133    31605   77605A        STA V32645  SCANSL
3134    31602   77602A        STA V32642  LKMSK
3135     1616   77616A        LDA V32654  XFLAG
3136    62000    2277R        IOR =B4000
3137    31616   77616A        STA V32654  XFLAG
3140     1603   77603A        LDA V32643  PLOCK
3141    52000    3167R        AND =B5777
3142    62000    3170R        IOR =B152000
3143    31603   77603A        STA V32643  PLOCK
3144     1615   77615A        LDA V32653  DAC1
3145     6000    1463R        LDB =D0
3146    42000      75X        JSX .WS4
3147     1614   77614A        LDA V32652  DAC2
3150    42000     105X        JSX .W5
3151     1613   77613A        LDA V32651  DAC4
3152    42000     106X        JSX .W7
3153     1604   77604A        LDA V32644  SATN
3154     6000    1457R        LDB =D1
3155    42000      75X        JSX .WS4
3156     1603   77603A        LDA V32643  PLOCK
3157    42000      73X        JSX .W6
3160     1605   77605A        LDA V32645  SCANSL
3161    42000     106X        JSX .W7
3162     1602   77602A        LDA V32642  LKMSK
3163     6000    2107R        LDB =D3
3164    42000     107X        JSX .WS5
3165    66000      31X        JMX .RTNA
3166     1777
3167     5777
3170   152000
3166                         LIT
3171                        P327  EQU * HLDOF
3171     6000    1277R        LDB =D-1
3172    42000      27X        JSX .ARGA
3173     4000                 LDB A
3174    26000    1277R        ADB =B177777
3175     2000    1457R        LDA =D1
3176   176403                 SBM A328
3177     6000    1301R        LDB =D-3  N
3200    42000      30X        JSX .LDAP
3201                        A328 EQU *
3201   170601                 SAL 2
3202     6000    2405R        LDB =D5
3203    42000      75X        JSX .WS4
3204    66000      31X        JMX .RTNA
3205                        P329  EQU * BUSY
3205                        A330 EQU *
3205     6000    2276R        LDB =D2
3206    42000     110X        JSX .RS7
```

```
1487   3207  31567   77567A    STA V32631  KEYCOL
1488   3210 170612             SAL 11
1489   3211 172002             SAP A331
1490   3212  76673             SSC A330
1491   3213                   A331 EQU *
1492   3213 170201             RET 1
1493   3214                   P332  EQU * WAIT
1494   3214   6000    1277R    LDB =D-1
1495   3215  42000      27X    JSX .ARGA
1496   3216  42000    3171R    JSM P327  HLDOF
1497   3217  42000    3205R    JSM P329  BUSY
1498   3220  66000      31X    JMX .RTNA
1499   3221                   P333  EQU * CORREK
1500   3221 174517             CLB
1501   3222  42000      56X    JSX .ARGS
1502   3223  44016      16A    ISZ C
1503   3224   1740   77740A    LDA V32736  EFLAG
1504   3225  52000    3231R    AND =B60
1505   3226  22000    3232R    ADA =B177720
1506   3227  42000     111X    JSX .EQL
1507   3230  66000      31X   JMX .RTNA
       3231     60
       3232 177720
1508   3231                    LIT
1509   3233                   P334  EQU * IFSAV
1510   3233   1434   77434A    LDA V32540  IF2
1511   3234 170507             SAR 8
1512   3235  42000     104X    JSX .TURN
1513   3236           3242R    DEF =B377
1514   3237          77435A    DEF V32541  IF1
1515   3240  31701   77701A    STA V23 RVBW
1516   3241 170201             RET 1
       3242    377
1517   3242                    LIT
1518   3243                   P335  EQU * WIF1
1519   3243  42000    3233R    JSM P334  IFSAV
1520   3244   5730   77730A    LDB V30 KFLAG
1521   3245 174611             SBL 10
1522   3246   1435   77435A    LDA V32541  IF1
1523   3247 176002            SBP A336
1524   3250  52000    3254R    AND =B177437
1525   3251                   A336 EQU *
1526   3251   6000    2172R    LDB =D13
1527   3252  42000      75X    JSX .WS4
1528   3253 170201             RET 1
       3254 177437
1529   3254                    LIT
1530   3255                   P337  EQU * WRFAT
1531   3255   1677   77677A    LDA V17 RFAT
1532   3256 170140             CMA
1533   3257   6000    2107R    LDB =D3
1534   3260  42000     112X    JSX .WS7
1535   3261   2000    2411R    LDA =D4
1536   3262  42000    2314R    JSM P279   SBLK
1537   3263  42000    2762R    JSM P314   AVGRST
1538   3264   2000    2411R    LDA =D4
1539   3265  42000    3214R    JSM P332   WAIT
1540   3266   2000    2107R    LDA =D3
1541   3267   6000    2107R    LDB =D3
1542   3270  42000      75X    JSX .WS4
1543   3271   2000    2411R    LDA =D4
1544   3272  42000     103X    JSX .W4
1545   3273 170201             RET 1
1546   3274                   P338  EQU * RLMIN
1547   3274 174517             CLB
1548   3275  42000      56X    JSX .ARGS
1549   3276  44016      16A    ISZ C
1550   3277   5675   77675A    LDB V15 BLEDS
1551   3300 174605             SBL 6
1552   3301   2000    3311R    LDA =B176175
1553   3302 176006            SBP A339
1554   3303   1677   77677A    LDA V17 RFAT
1555   3304  52000    2406R    AND =D7
1556   3305   6000    3312R    LDB =D100
1557   3306  75617             MPY
1558   3307  22000    3313R    ADA =D-999
1559   3310                   A339 EQU *
1560   3310  66000      31X   JMX .RTNA
       3311 176175
       3312    144
       3313 176031
1561   3311                    LIT
1562   3314                   P340  EQU * MXRLVL
1563   3314 174517             CLB
1564   3315  42000      56X    JSX .ARGS
1565   3316  44016      16A    ISZ C
1566   3317   1677   77677A    LDA V17 RFAT
1567   3320 170403             AAR 4
1568   3321  66000      31X   JMX .RTNA
1569   3322                   P341  EQU * REATV
1570   3322 174517             CLB
1571   3323  42000      56X    JSX .ARGS
1572   3324  44016      16A    ISZ C
1573   3325   2000    1704R    LDA =D6
```

```
3326  70540            PWC A
3327  42000   3314R    JSM P340  MXRLVL
3330  42000    113X    JSX DIV4
3331          3312R    DEF =D100
3332  22000   1457R    ADA =D1
3333 170040            TCA
3334  21573  77573A    ADA V32635  I
3335  42000   2132R    JSM P265  LIMIT
3336  22000   1457R    ADA =D1
3337  66000     31X    JMX .RTNA
3340                  P342  EQU * RLMAX
3340 174517            CLB
3341  42000     56X    JSX .ARGS
3342  44016     16A    ISZ C
3343   5730  77730A    LDB V30 KFLAG
3344 174612            SBL 11
3345   2000   3404R    LDA =D700
3346 176404           SBM A343
3347  42000   3314R    JSM P340  MXRLVL
3350 170040            TCA
3351  22000   3405R    ADA =D300
3352                  A343 EQU *
3352  70540            PWC A
3353   5675  77675A    LDB V15 BLEDS
3354 174605            SBL 6
3355   2000   3404R    LDA =D700
3356 176021           SBP A344
3357   1677  77677A    LDA V17 RFAT
3360  52000   2406R    AND =D7
3361  70540            PWC A
3362   1730  77730A    LDA V30 KFLAG
3363 170612            SAL 11
3364 172005           SAP A346
3365  42000   2070R    JSM P261  IFBW
3366 170040            TCA
3367  22000   1704R    ADA =D6
3370 172403           SAM A345
3371                  A346 EQU *
3371   2000   1463R    LDA =D0
3372  66000   3374R    JMP A347
3373                  A345 EQU *
3373   2000   1457R    LDA =D1
3374                  A347 EQU *
3374  42000     57X    JSX ADD4T
3375   6000   3312R    LDB =D100
3376  75617            MPY
3377                  A344 EQU *
3377  42000   2132R    JSM P265  LIMIT
3400  70540            PWC A
3401  42000   3314R    JSM P340  MXRLVL
3402  42000     57X    JSX ADD4T
3403  66000     31X   JMX .RTNA
3404   1274
3405    454
3404                   LIT
3406                  P348  EQU * RFLC
3406 174517            CLB
3407  42000     56X    JSX .ARGS
3410  44016     16A    ISZ C
3411   2000   1463R    LDA =D0
3412   6000   2107R    LDB =D3 RFLC
3413  42000     67X    JSX .STAP
3414  42000   3221R    JSM P333  CORREK
3415 172402            SAM *+2
3416  66000   3515R    JMP A349
3417   1677  77677A    LDA V17 RFAT
3420  42000      7X    JSM P198  ATNER
3421  70540            PWC A
3422  42000   2070R    JSM P261  IFBW
3423  42000     60X    JSX .ARAY
3424            15R    DEF V39 BWAMP
3425  42000     57X    JSX ADD4T
3426  70540            PWC A
3427   1603  77603A    LDA V32643  PLOCK
3430 170140            CMA
3431 170511            SAR 10
3432  52000   1457R    AND =D1
3433  70540            PWC A
3434   2000   2131R    LDA =D15
3435  42000     60X    JSX .ARAY
3436            15R    DEF V39 BWAMP
3437  42000    114X    JSX MPY4T
3440  42000     57X    JSX ADD4T
3441  70540            PWC A
3442   2000   2406R    LDA =D7
3443  70540            PWC A
3444   1573  77573A    LDA V32635  I
3445  22000   1363R    ADA =D-4
3446  42000   2132R    JSM P265  LIMIT
3447  22000   2301R    ADA =D19
3450  42000     60X    JSX .ARAY
3451            15R    DEF V39 BWAMP
3452  42000     57X    JSX ADD4T
3453   6000   2107R    LDB =D3 RFLC
```

```
3454  42000     67X    JSX .STAP
3455   1435  77435A    LDA V32541  IF1
3456 172022           SAP A350
3457 170514            SAR 13
3460  52000   2107R    AND =D3
3461 170040            TCA
3462  22000   2416R    ADA =D29
3463  42000     60X    JSX .ARAY
3464             15R    DEF V39 BWAMP
3465  70541            PWC B
3466  42000   2070R    JSM P261  IFBW
3467   4000            LDB A
3470  26000   3526R    ADB =B177766
3471   2000   1457R    LDA =D1
3472 176402           SBM A351
3473   2000   3527R    LDA =D14
3474                  A351 EQU *
3474  42000     60X    JSX .ARAY
3475             15R    DEF V39 BWAMP
3476  42000     77X    JSX ADD4B
3477  66000   3511R    JMP A352
3500                  A350 EQU *
3500   1573  77573A    LDA V32635  I
3501  22000   1363R    ADA =D-4
3502 170516            SAR 15
3503  70540            PWC A
3504   2000   2131R    LDA =D15
3505  21573  77573A    ADA V32635  I
3506  42000     60X    JSX .ARAY
3507             15R    DEF V39 BWAMP
3510  42000    114X    JSX MPY4T
3511                  A352 EQU *
3511   6000   2107R    LDB =D3 RFLC
3512  42000    115X    JSX ADD4P
3513   6000   2107R    LDB =D3 RFLC
3514  42000     67X    JSX .STAP
3515                  A349 EQU *
3515   6000   2107R    LDB =D3 RFLC
3516  42000     30X    JSX .LDAP
3517 172003           SAP A353
3520  22000   2153R    ADA =D-5
3521  66000   3523R    JMP A354
3522                  A353 EQU *
3522  22000   2405R    ADA =D5
3523                  A354 EQU *
3523  42000    113X    JSX DIV4
3524           2204R    DEF =D10
3525  66000     31X    JMX .RTNA
3526 177766
3527     16
3530                   LIT
3530                  P355  EQU * REFLEV
3530   6000   1277R    LDB =D-1
3531  42000     27X    JSX .ARGA
3532  66000   3571R    JMP A356
3533                  T357 EQU *
3533                  K358  OCT 347 347
3534                  K359  OCT 346 346
3535                  K360  OCT 343 343
3536                  K361  OCT 342 342
3537                  K362  OCT 341 341
3540                  K363  OCT 340 340
3541                  K364  OCT 300 300
3542                  K365  OCT 140 140
3543                  K366  OCT 100 100
3544                  K367  OCT 40  40
3545                    DEC 0 0
3546                  K368  OCT 400 400
3547                  K142  OCT 1000  1000
3550           3533R  V369 DEF T357 REFLOG
3551                    OCT 177777  177777
3552                  K184  OCT 15  15
3553                  T370 EQU *
3553                  K371  OCT 370 370
3554                  K372  OCT 360 360
3555                  K373  OCT 350 350
3556                    OCT 340 340
3557                    OCT 300 300
3560                    OCT 140 140
3561                    OCT 100 100
3562                    OCT 40  40
3563                    DEC 0 0
3564                    OCT 400 400
3565                    OCT 1000  1000
3566           3553R  V374 DEF T370 REFLIN
3567                    OCT 177777  177777
3570                  K375  OCT 13  13
3571                  A356  EQU *
3571   1606  77606A    LDA V32646  SRCEID
3572 170615            SAL 14
3573 172007           SAP A376
3574   1606  77606A    LDA V32646  SRCEID
3575  62000   2644R    IOR =B10000
3576  31606  77606A    STA V32646  SRCEID
```

```
3577   2000   3654R     LDA =B20
3600   6000   2411R     LDB =D4
3601  42000    112X     JSX .MS7
3602                  A376 EQU *
3602   1435  77435A     LDA V32541  IF1
3603 170516             SAR 15
3604  70540             PWC A
3605  42000   2070R     JSM P261  IFBW
3606 170040             TCA
3607  22000   1704R     ADA =D6
3610 170140             CMA
3611 170516             SAR 15
3612  42000     57X     JSX ADD4T
3613   6000   3655R     LDB =D200
3614  75617             MPY
3615  22000   3656R     ADA =D999
3616  70540             PWC A
3617   5675  77675A     LDB V15 BLEDS
3620 174605             SBL 6
3621   2000   1457R     LDA =D1
3622 176003             SBP A377
3623   1677  77677A     LDA V17 RFAT
3624  52000   2406R     AND =D7
3625                  A377 EQU *
3625   6000   3312R     LDB =D100
3626  75617             MPY
3627  42000    116X     JSX SUB4T
3630  31742  77742A     STA V32738  IX
3631  42000   1665R     JSM P245  RLAD
3632   6000   1301R     LDB =D-3  LVL
3633  42000     71X     JSX MIN4P
3634  70540             PWC A
3635  42000   2303R     JSM P277  GOFSET
3636 170040             TCA
3637  21706  77706A     ADA V31 ROFSET
3640 170040             TCA
3641  42000     57X     JSX ADD4T
3642   6000   1301R     LDB =D-3  LVL
3643  42000     67X     JSX .STAP
3644  42000   3340R     JSM P342  RLMAX
3645   6000   1301R     LDB =D-3  LVL
3646  42000    117X     JSX SUB4P
3647 172010             SAP A378
3650  42000   3340R     JSM P342  RLMAX
3651   6000   1301R     LDB =D-3  LVL
3652  42000     67X     JSX .STAP
3653  66000   3671R     JMP A379
3654     20
3655    310
3656   1747
3654                    LIT
3657                  A378 EQU *
3657   1730  77730A     LDA V30 KFLAG
3660 170612             SAL 11
3661 172410             SAM A380
3662  42000   3274R     JSM P338  RLMIN
3663   6000   1301R     LDB =D-3  LVL
3664  42000     71X     JSX MIN4P
3665 172004             SAP A380
3666  42000   3274R     JSM P338  RLMIN
3667   6000   1301R     LDB =D-3  LVL
3670  42000     67X     JSX .STAP
3671                  A380 EQU *
3671                  A379 EQU *
3671   1742  77742A     LDA V32738  IX
3672   6000   1301R     LDB =D-3  LVL
3673  42000     71X     JSX MIN4P
3674 172007             SAP A381
3675   1742  77742A     LDA V32738  IX
3676  22000   3702R     ADA =D1999
3677   6000   1301R     LDB =D-3  LVL
3700  42000     67X     JSX .STAP
3701  66000   3740R     JMP A382
3702   3717
3702                    LIT
3703                  A381 EQU *
3703   1435  77435A     LDA V32541  IF1
3704 170516             SAR 15
3705   6000   3655R     LDB =D200
3706  75617             MPY
3707  21742  77742A     ADA V32738  IX
3710  22000   4044R     ADA =D1099
3711  70540             PWC A
3712   1675  77675A     LDA V15 BLEDS
3713 170140             CMA
3714 170510             SAR 9
3715  52000   1457R     AND =D1
3716  70540             PWC A
3717  42000   3314R     JSM P340  MXRLVL
3720  22000   3404R     ADA =D700
3721  42000    114X     JSX MPY4T
3722  42000     57X     JSX ADD4T
3723  31741  77741A     STA V32737  IX
```

```
3724    6000   1301R      LDB =D-3  LVL
3725   42000     30X      JSX .LDAP
3726    4000              LDB A
3727  174040              TCB
3730   25741  77741A      ADB V32737   IY
3731    1741  77741A      LDA V32737   IY
3732  176403             SBM A383
3733    6000   1301R      LDB =D-3  LVL
3734   42000     30X      JSX .LDAP
3735                    A383 EQU *
3735   22000   3702R      ADA =D1999
3736    6000   1301R      LDB =D-3  LVL
3737   42000     67X      JSX .STAP
3740                    A382 EQU *
3740   42000    113X      JSX DIV4
3741           3312R      DEF =D100
3742   22000   4045R      ADA =D-19
3743   31573  77573A      STA V32635  I
3744    1675  77675A      LDA V15 BLEDS
3745  170605              SAL 6
3746  172424             SAM A384
3747   42000   3322R      JSM P341  RFAIV
3750   42000    120X      JSX .TEST
3751           2406R      DEF =D7
3752          77677A      DEF V17 RFAI
3753   72017             RZA A384
3754    1573  77573A      LDA V32635  I
3755   70540              PWC A
3756    1742  77742A      LDA V32738   IX
3757   70540              PWC A
3760   42000   3322R      JSM P341  RFAIV
3761   42000    104X      JSX .TURN
3762           2406R      DEF =D7
3763          77677A      DEF V17 RFAI
3764   31677  77677A      STA V17 RFAI
3765   42000   3255R      JSM P337  WRFAI
3766   70760              WWC A
3767   31742  77742A      STA V32738   IX
3770   70760              WWC A
3771   31573  77573A      STA V32635  I
3772                    A384 EQU *
3772    1677  77677A      LDA V17 RFAI
3773   52000   2406R      AND =D7
3774  170040              TCA
3775   21573  77573A      ADA V32635  I
3776   70540              PWC A
3777   42000   2070R      JSM P261  IFBW
4000  170040              TCA
4001   22000   1704R      ADA =D6
4002  170140              CMA
4003  170516              SAR 15
4004  170600              SAL 1
4005   42000     57X      JSX ADD4I
4006   22000   2204R      ADA =D10
4007   31573  77573A      STA V32635  I
4010   42000   3406R      JSM P348  RFLC
4011   31572  77572A      STA V32634  J
4012    6000   1301R      LDB =D-3  LVL
4013   42000     30X      JSX .LDAP
4014   42000    113X      JSX DIV4
4015           3312R      DEF =D100
4016   70540              PWC A
4017    6000   1301R      LDB =D-3  LVL
4020   42000     30X      JSX .LDAP
4021   21572  77572A      ADA V32634  J
4022   42000    113X      JSX DIV4
4023           3312R      DEF =D100
4024   42000    116X      JSX SUB4T
4025  172021             SAP A385
4026    1742  77742A      LDA V32738   IX
4027   22000   3702R      ADA =D1999
4030   70540              PWC A
4031    6000   1301R      LDB =D-3  LVL
4032   42000     30X      JSX .LDAP
4033   21572  77572A      ADA V32634  J
4034   42000    116X      JSX SUB4T
4035  172411             SAM A385
4036   55573  77573A      DSZ V32635  I
4037                      NOP
4040   42000   3406R      JSM P348  RFLC
4041   22000   3312R      ADA =D100
4042   31572  77572A      STA V32634  J
4043   66000   4063R      JMP A386
4044    2113
4045  177755
4044                     LIT
4046                    A385 EQU *
4046    1742  77742A      LDA V32738   IX
4047   22000   3702R      ADA =D1999
4050   70540              PWC A
4051    6000   1301R      LDB =D-3  LVL
4052   42000     30X      JSX .LDAP
4053   21572  77572A      ADA V32634  J
```

```
1938   4054  42000      116X    JSX SUB4T
1939   4055 172006             SAP A387
1940   4056   1742    77742A    LDA V32738  IX
1941   4057  22000     3702R    ADA =D1999
1942   4060   6000     1301R    LDB =D-3  LVL
1943   4061  42000      117X    JSX SUB4P
1944   4062  31572    77572A    STA V32634  J
1945   4063                    A387 EQU *
1946   4063                    A386 EQU *
1947   4063   6000     1301R    LDB =D-3  LVL
1948   4064  42000       30X    JSX .LDAP
1949   4065  42000      121X    JSX MOD4
1950   4066            3312R    DEF =D100
1951   4067  21572    77572A    ADA V32634  J
1952   4070  42000      122X    JSX CNV42
1953   4071  42000       34X    JSX .STRD
1954   4072           77655A    DEF V32685  LTEMP2
1955   4073   1660    77660A    LDA V36 BCDC
1956   4074 170507              SAR 8
1957   4075   6000     4167R    LDB =B240
1958   4076  75617              MPY
1959   4077  21660    77660A    ADA V36 BCDC
1960   4100  42000      104X    JSX .TURN
1961   4101            3242R    DEF =B377
1962   4102           77434A    DEF V32540  IF2
1963   4103  31434    77434A    STA V32540  IF2
1964   4104   1435    77435A    LDA V32541  IF1
1965   4105 172006             SAP A388
1966   4106   1573    77573A    LDA V32635  I
1967   4107  22000     2276R    ADA =D2
1968   4110  42000       60X    JSX .ARAY
1969   4111            3550R    DEF V369  REFLOG
1970   4112  66000     4116R    JMP A389
1971   4113                    A388 EQU *
1972   4113   1573    77573A    LDA V32635  I
1973   4114  42000       60X    JSX .ARAY
1974   4115            3566R    DEF V374  REFLIN
1975   4116                    A389 EQU *
1976   4116  42000      104X    JSX .TURN
1977   4117            3166R    DEF =B1777
1978   4120           77435A    DEF V32541  IF1
1979   4121  31435    77435A    STA V32541  IF1
1980   4122  42000     3243R    JSM P335  WIF1
1981   4123   1434    77434A    LDA V32540  IF2
1982   4124  42000      105X    JSX .W5
1983   4125  42000     2303R    JSM P277  GOFSET
1984   4126  70540              PWC A
1985   4127  42000     3406R    JSM P348  RFLC
1986   4130  70540              PWC A
1987   4131  42000       37X    JSX .LDBI
1988   4132           77655A    DEF V32685  LTEMP2
1989   4133  42000       50X    JSX CNV24
1990   4134  70540              PWC A
1991   4135  42000     1665R    JSM P245  RLAD
1992   4136  42000       57X    JSX ADD4T
1993   4137  42000      116X    JSX SUB4T
1994   4140  21706    77706A    ADA V31 ROFSET
1995   4141  42000      116X    JSX SUB4T
1996   4142  22000     4170R    ADA =D-99
1997   4143  70540              PWC A
1998   4144   1677    77677A    LDA V17 RFAT
1999   4145  52000     2406R    AND =D7
2000   4146  21573    77573A    ADA V32635  I
2001   4147  22000     3526R    ADA =D-10
2002   4150  70540              PWC A
2003   4151  42000     2070R    JSM P261  IFBW
2004   4152 170040              TCA
2005   4153  22000     1704R    ADA =D6
2006   4154 170140              CMA
2007   4155 170416              AAR 15
2008   4156 170600              SAL 1
2009   4157  42000       57X    JSX ADD4T
2010   4160   6000     3312R    LDB =D100
2011   4161  75617              MPY
2012   4162  42000       57X    JSX ADD4T
2013   4163  31700    77700A    STA V22 RLVL
2014   4164   1730    77730A    LDA V30 RFLAG
2015   4165  42000    15050R    JSM P223  AMPU
2016   4166  66000       31X    JMX .RTNA
       4167    240
       4170 177635
2017   4167                    LIT
2018   4171                    P390  EQU * LGDB
2019   4171   6000     1277R    LDB =D-1
2020   4172  42000       27X    JSX .ARGA
2021   4173  42000      104X    JSX .TURN
2022   4174            4207R    DEF =B160000
2023   4175           77435A    DEF V32541  IF1
2024   4176  31435    77435A    STA V32541  IF1
2025   4177  42000     3243R    JSM P335  WIF1
2026   4200   2000     1704R    LDA =D6
2027   4201  42000     2314R    JSM P279  SBLK
2028   4202  42000     3221R    JSM P333  CORREK
2029   4203 172003             SAP A391
```

```
4204   1700  77700A     LDA V22 RLVL
4205  42000   3530R     JSM P355  REFLEV
4206                   A391 EQU *
4206  66000     31X     JMX .RTNA
4207 160000
4207                    LIT
4210                   P392  EQU * IFBWOUT
4210   6000   1277R     LDB =D-1
4211  42000     27X     JSX .ARGA
4212   1572  77572A     LDA V32634   J
4213  70540             PWC A
4214   1434  77434A     LDA V32540  IF2
4215  70540             PWC A
4216   6000   1301R     LDB =D-3  I
4217  42000     30X     JSX .LDAP
4220 170040             TCA
4221  22000   1704R     ADA =D6
4222 172006            SAP A393
4223   6000   1301R     LDB =D-3  I
4224  42000     30X     JSX .LDAP
4225  22000   2276R     ADA =D2
4226   6000   1301R     LDB =D-3  I
4227  42000     67X     JSX .STAP
4230                   A393 EQU *
4230   6000   1301R     LDB =D-3  I
4231  42000     30X     JSX .LDAP
4232 170613             SAL 12
4233  42000    104X     JSX .TURN
4234          4256R     DEF =B170000
4235         77434A     DEF V32540  IF2
4236  31434  77434A     STA V32540  IF2
4237   6000   2172R     LDB =D13
4240  42000    107X     JSX .WS5
4241  70760             WWC A
4242  31572  77572A     STA V32634  J
4243  11434  77434A     CPA V32540  IF2
4244  66000   4310R     JMP A394
4245  42000   2762R     JSM P314  AVGRST
4246  42000   3221R     JSM P333  CORREK
4247 172010            SAP A395
4250   1700  77700A     LDA V22 RLVL
4251  42000   3530R     JSM P355  REFLEV
4252  42000     37X     JSX .LDBI
4253         77665A     DEF V8  CFREQ
4254  42000   6750R     JSM P222  TUNE
4255  66000   4306R     JMP A396
4256 170000
4256                    LIT
4257                   A395 EQU *
4257   1572  77572A     LDA V32634  J
4260 170513             SAR 12
4261  31572  77572A     STA V32634  J
4262   6000   1301R     LDB =D-3  I
4263  42000     30X     JSX .LDAP
4264 170040             TCA
4265  22000   1704R     ADA =D6
4266 172005            SAP A399
4267   1572  77572A     LDA V32634  J
4270 170040             TCA
4271  22000   1704R     ADA =D6
4272 172012            SAP A398
4273                   A399 EQU *
4273   6000   1301R     LDB =D-3  I
4274  42000     30X     JSX .LDAP
4275 170040             TCA
4276  22000   1704R     ADA =D6
4277 172407            SAM A397
4300   1572  77572A     LDA V32634  J
4301 170040             TCA
4302  22000   1704R     ADA =D6
4303 172003            SAP A397
4304                   A398 EQU *
4304   1700  77700A     LDA V22 RLVL
4305  42000   3530R     JSM P355  REFLEV
4306                   A397 EQU *
4306                   A396 EQU *
4306   2000   1457R     LDA =D1
4307  42000   2314R     JSM P279  SBLK
4310                   A394 EQU *
4310  42000   3233R     JSM P334  IFSAV
4311  70760             WWC A
4312  31572  77572A     STA V32634  J
4313  66000     31X     JMX .RTNA
4314                   P400  EQU * VBWOUT
4314   6000   1277R     LDB =D-1
4315  42000     27X     JSX .ARGA
4316   1434  77434A     LDA V32540  IF2
4317  70540             PWC A
4320   6000   1301R     LDB =D-3  I
4321  42000     30X     JSX .LDAP
4322 170040             TCA
4323  22000   1704R     ADA =D6
4324 172006            SAP A401
4325   6000   1301R     LDB =D-3  I
```

```
4326  42000     30X    JSX .LDAP
4327  22000   2276R    ADA =D2
4330   6000   1301R    LDB =D-3   I
4331  42000     67X    JSX .STAP
4332                  A401 EQU *
4332   6000   1301R    LDB =D-3   I
4333  42000     30X    JSX .LDAP
4334 170607            SAL 8
4335  42000    104X    JSX .TURN
4336          4355R    DEF =B7400
4337         77434A    DEF V32540   IF2
4340  31434  77434A    STA V32540   IF2
4341   6000   2172R    LDB =D13
4342  42000    107X    JSX .WS5
4343  70760            WWC A
4344   6000   1301R    LDB =D-3   I
4345  42000     67X    JSX .STAP
4346  11434  77434A    CPA V32540   IF2
4347  66000   4351R    JMP A402
4350  42000   2762R    JSM P314   AVGRST
4351                  A402 EQU *
4351   2000   2276R    LDA =D2
4352  42000   2314R    JSM P279   SBLK
4353  42000   3233R    JSM P334   IFSAV
4354  66000     31X    JMX .RTNA
4355   7400
4355                   LIT
4356                  P403  EQU * EXPSIX
4356   6000   1277R    LDB =D-1
4357  42000     27X    JSX .ARGA
4360  42000     33X    JSX .UPC4
4361 170040            TCA
4362 172404            SAM A404
4363  42000     53X    JSX .LDSI
4364          1463R    DEF =D0
4365  66000   4410R    JMP A405
4366                  A404 EQU *
4366   6000   1301R    LDB =D-3   ST
4367  42000     30X    JSX .LDAP
4370  22000   1277R    ADA =D-1
4371  42000    113X    JSX DIV4
4372          1704R    DEF =D6
4373  22000   1277R    ADA =D-1
4374  70540            PWC A
4375   6000   1301R    LDB =D-3   ST
4376  42000     30X    JSX .LDAP
4377  22000   1277R    ADA =D-1
4400  42000    121X    JSX MOD4
4401          1704R    DEF =D6
4402  22000   1457R    ADA =D1
4403  42000     60X    JSX .ARAY
4404           552R    DEF V189   LGTB
4405  42000     61X    JSX .LDSA
4406  70761            WWC B
4407  42000    123X    JSX .DSFT
4410                  A405 EQU *
4410  66000     31X    JMX .RTNA
4411                  P406  EQU * EXP2
4411   6000   1277R    LDB =D-1
4412  42000     27X    JSX .ARGA
4413  42000     33X    JSX .UPC4
4414 170600            SAL 1
4415  22000   1277R    ADA =D-1
4416  42000   4356R    JSM P403   EXPSIX
4417  66000     31X    JMX .RTNA
4420                  P407  EQU * EXP3
4420   6000   1277R    LDB =D-1
4421  42000     27X    JSX .ARGA
4422  42000     33X    JSX .UPC4
4423   6000   2107R    LDB =D3
4424  75617            MPY
4425  22000   1457R    ADA =D1
4426  42000   4356R    JSM P403   EXPSIX
4427  66000     31X    JMX .RTNA
4430                  P408  EQU * LGSCL
4430 174517            CLB
4431  42000     56X    JSX .ARGS
4432  44016     16A    ISZ C
4433   1435  77435A    LDA V32541   IF1
4434 170514            SAR 13
4435  52000   2107R    AND =D3
4436 170040            TCA
4437  22000   2411R    ADA =D4
4440  42000   4411R    JSM P406   EXP2
4441  42000     50X    JSX CNV24
4442  66000     31X    JMX .RTNA
4443                  P409  EQU * DBMA
4443   6000   1277R    LDB =D-1
4444  42000     27X    JSX .ARGA
4445  42000     33X    JSX .UPC4
4446  42000   4430R    JSM P408   LGSCL
4447  70540            PWC A
4450   6000   1301R    LDB =D-3   ADC
4451  42000     30X    JSX .LDAP
```

```
4452 170604              SAL 5
4453 170404              AAR 5
4454 170040              TCA
4455  22000    4470R     ADA =D1000
4456  42000     114X     JSX MPY4T
4457  42000     122X     JSX CNV42
4460  42000      36X     JSX .SAR2
4461   1700   77700A     LDA V22 RLVL
4462  42000     122X     JSX CNV42
4463   2000    1463R     LDA =D0
4464  75541              MLY
4465  42000     124X     JSX SUB2T
4466  42000    1705R     JSM P246  DBSHFT
4467  66000      31X    JMX .RTNA
4470   1750
4470                     LIT
4471                    P410  EQU * DBMNV
4471   6000    1277R     LDB =D-1
4472  42000      27X     JSX .ARGA
4473  42000      33X     JSX .UPC4
4474   1435   77435A     LDA V32541  IF1
4475 172402              SAM *+2
4476  66000    4535R     JMP A411
4477   6000    1301R     LDB =D-3  A
4500  42000      30X     JSX .LDAP
4501  42000    4443R     JSM P409  DBMA
4502  42000      36X     JSX .SAR2
4503   1675   77675A     LDA V15 BLEDS
4504 170615              SAL 14
4505 172010             SAP A412
4506  42000    2070R     JSM P261  IFBW
4507  42000     125X     JSX CNV43
4510  42000     126X     JSX MPY3
4511           4532R     DEF =H500
4512  42000     127X     JSX MIN3
4513           1300R     DEF =H200
4514  66000    4517R     JMP A413
4515                    A412 EQU *
4515  42000      53X     JSX .LDS1
4516           1463R     DEF =D0
4517                    A413 EQU *
4517  42000     130X     JSX ADD2T
4520   6000    2107R     LDB =D3 DBMNV
4521  42000      43X     JSX .STBP
4522   1730   77730A     LDA V30 KFLAG
4523  52000    4533R     AND =B140000
4524  22000    4534R     ADA =B40000
4525  72004             RZA A414
4526  42000    1736R     JSM P248  NANOV
4527   6000    2107R     LDB =D3 DBMNV
4530  42000      43X     JSX .STBP
4531                    A414 EQU *
4531  66000    4622R     JMP A415
4532   2400
4533 140000
4534  40000
4532                     LIT
4535                    A411 EQU *
4535   1700   77700A     LDA V22 RLVL
4536   6000    2204R     LDB =D10
4537  75617              MPY
4540  42000     122X     JSX CNV42
4541  42000    1705R     JSM P246  DBSHFT
4542  42000    1736R     JSM P248  NANOV
4543  42000      62X     JSX CNV21
4544  42000      41X     JSX MPY1
4545           4623R     DEF =F1.0@-3
4546  42000      36X     JSX .SAR2
4547   6000    1301R     LDB =D-3  A
4550  42000      30X     JSX .LDAP
4551 170604              SAL 5
4552 170404              AAR 5
4553  42000      45X     JSX CNV41
4554  42000      64X     JSX MPY1I
4555  42000      65X     JSX CNV12
4556   6000    2107R     LDB =D3 DBMNV
4557  42000      43X     JSX .STBP
4560   1675   77675A     LDA V15 BLEDS
4561 170615              SAL 14
4562 172405             SAM A417
4563   1730   77730A     LDA V30 KFLAG
4564 170515              SAR 14
4565  12000    2107R     CPA =D3
4566  66000    4622R     JMP A416
4567                    A417 EQU *
4567   6000    2107R     LDB =D3 DBMNV
4570  42000      66X     JSX .LDBP
4571  42000    2001R     JSM P251  DBM
4572  42000      36X     JSX .SAR2
4573   1675   77675A     LDA V15 BLEDS
4574 170615              SAL 14
4575 172010             SAP A418
4576  42000    2070R     JSM P261  IFBW
4577  42000     125X     JSX CNV43
4600  42000     126X     JSX MPY3
```

```
4601              4532R      DEF =H500
4602   42000       127X      JSX MIN3
4603              4627R      DEF =H55
4604   66000      4607R      JMP A419
4605                        A418 EQU *
4605   42000        53X      JSX .LDSI
4606              1463R      DEF =D0
4607                        A419 EQU *
4607   42000       130X      JSX ADD21
4610    6000      2107R      LDB =D3 DBMNV
4611   42000        43X      JSX .STBP
4612    1730     77730A      LDA V30 KFLAG
4613 170515                  SAR 14
4614   12000      2107R      CPA =D3
4615   66000      4617R      JMP *+2
4616   66000      4622R      JMP A420
4617   42000      1736R      JSM P248  NANOV
4620    6000      2107R      LDB =D3 DBMNV
4621   42000        43X      JSX .STBP
4622                        A420 EQU *
4622                        A416 EQU *
4622                        A415 EQU *
4622   66000       131X      JMX .RTNL
4623 1.0E-3
4627     125
4623                         LIT
4630                        P421  EQU * RDBMV
4630    6000      1277R      LDB =D-1
4631   42000        27X      JSX .ARGA
4632   42000        33X      JSX .UPC4
4633    1675     77675A      LDA V15 BLEDS
4634   62000      2411R      IOR =D4
4635   31675     77675A      STA V15 BLEDS
4636    6000      1301R      LDB =D-3  A
4637   42000        30X      JSX .LDAP
4640   42000      4471R      JSM P410  DBMNV
4641   42000        62X      JSX CNV21
4642   42000        34X      JSX .STRD
4643             77742A      DEF V32738  X
4644    1675     77675A      LDA V15 BLEDS
4645   52000      2153R      AND =B177773
4646   31675     77675A      STA V15 BLEDS
4647    1730     77730A      LDA V30 KFLAG
4650 170515                  SAR 14
4651    4000                 LDB A
4652   26000      1301R      ADB =B177775
4653    2000      4663R      LDA =B1100
4654   76402                 SZB A422
4655    2000      2410R      LDA =B200
4656                        A422 EQU *
4656 170040                  TCA
4657   21742     77742A      ADA V32738  IX
4660   31742     77742A      STA V32738  IX
4661   30020        20A      STA V1  AR2
4662   66000        31X      JMX .RTNA
4663    1100
4663                         LIT
4664                        P423   EQU * VDCOP
4664   66000      4730R      JMP A424
4665                        T425 EQU *
4665                        D426  OCT 0,1010,103425,10000 20887151000
4671                        D427  OCT 0,1421,13424,4210 31117140888
4675                        D428  OCT 0,1050,103064,41042 22886344222
4701                        D429  OCT 0,1461,13064,51042  33116345222
4705                        D430  OCT 0,51104,43424,24210 524447142888
4711                        D431  OCT 0,51124,43425,30000 525447153000
4715                        D432  OCT 0,73050,103024,43146  762886144666
4721                        D433  OCT 0,73010,103424,13567  760887141777
4725              4665R     V434 DEF T425 NXTVDC
4726                         OCT 177777  177777
4727                         OCT 40  40
4730                        A424  EQU *
4730    5702     77702A      LDB V24 VIDCON
4731 174603                  SBL 4
4732    2000      5015R      LDA =B4007
4733 176010                  SBP A435
4734    1566     77566A      LDA V32630  KEYCODE
4735   22000      5016R      ADA =B-141
4736   70540                 PWC A
4737   42000        37X      JSX .LDBI
4740              5017R      DEF =F887007887007
4741   70761                 WWC B
4742   42000       132X      JSX .FDIG
4743                        A435 EQU *
4743   31572     77572A      STA V32634  J
4744   12000      2203R      CPA =D8
4745   66000      4747R      JMP *+2
4746   66000      4751R      JMP A436
4747    2000      5015R      LDA =B4007
4750   31572     77572A      STA V32634  J
4751                        A436 EQU *
4751    1566     77566A      LDA V32630  KEYCODE
4752   22000      5016R      ADA =B-141
4753   70540                 PWC A
```

```
4754   1702  77702A    LDA V24 VIDCON
4755 170603            SAL 4
4756 172012           SAP A437
4757   1676  77676A    LDA V16 TLEDS
4760 170610            SAL 9
4761 172004           SAP A438
4762  42000     37X    JSX .LDBI
4763           5023R   DEF =F76888148888
4764  66000    4767R   JMP A439
4765                  A438 EQU *
4765  42000     37X    JSX .LDBI
4766           5027R   DEF =F28888148888
4767                  A439 EQU *
4767  66000    4776R   JMP A440
4770                  A437 EQU *
4770   1702  77702A    LDA V24 VIDCON
4771  52000    2406R   AND =D7
4772  22000    1457R   ADA =D1
4773  42000    133X    JSX .LRAY
4774           4725R   DEF V434  NXTVDC
4775  42000    134X    JSX .LDBA
4776                  A440 EQU *
4776  70761            WWC B
4777  42000    132X    JSX .FDIG
5000  31573  77573A    STA V32635  I
5001 170613            SAL 12
5002 172004           SAP A441
5003   1702  77702A    LDA V24 VIDCON
5004  62000    2277R   IOR =B4000
5005  66000    5012R   JMP A442
5006                  A441 EQU *
5006   1573  77573A    LDA V32635  I
5007  42000    104X    JSX .TURN
5010          77572A   DEF V32634  J
5011          77702A   DEF V24 VIDCON
5012                  A442 EQU *
5012  31702  77702A    STA V24 VIDCON
5013  42000    2650R   JSM P304  UNCAL
5014 170201            RET 1
5015   4007
5016 177637
5017 887007887007
5023 768888148888
5027 288888148888
5015                   LIT
5033                  P443  EQU * CPERIOD
5033 174517            CLB
5034  42000     56X    JSX .ARGS
5035  44016     16A    ISZ C
5036   5730  77730A    LDB V30 KFLAG
5037 174605            SBL 6
5040   1577  77577A    LDA V32639  CTBASE
5041 176412           SBM A444
5042  42000     37X    JSX .LDBI
5043           5054R   DEF =F443020000000
5044   5605  77605A    LDB V32645  SCANSL
5045  42000    132X    JSX .FDIG
5046  70540            PWC A
5047   1604  77604A    LDA V32644  SATN
5050 170515            SAR 14
5051  52000    1457R   AND =D1
5052  42000     57X    JSX ADD4I
5053                  A444 EQU *
5053  66000     31X    JMX .RTNA
5054 443020000000
5054                   LIT
5060                  P445  EQU * WCNT
5060                  A446 EQU *
5060   6000    2276R   LDB =D2
5061  42000    110X    JSX .RS7
5062  31572  77572A    STA V32634  J
5063 170612            SAL 11
5064 172014           SAP A447
5065  76213           SSS A447
5066  76772           SHC A446
5067   1575  77575A    LDA V32637  K
5070 170500            SAR 1
5071  12000    1457R   CPA =D1
5072  66000    5074R   JMP *+2
5073  66000    5060R   JMP A446
5074   1572  77572A    LDA V32634  J
5075  52000    2406R   AND =D7
5076  22000    5115R   ADA =D-7
5077 172061           SAP A446
5100                  A447 EQU *
5100  76216           SSS A448
5101   1572  77572A    LDA V32634  J
5102 170612            SAL 11
5103 172013           SAP A449
5104   2000    1457R   LDA =D1
5105  42000    3214R   JSM P332  WAIT
5106   1575  77575A    LDA V32637  K
5107 170600            SAL 1
5110  42000    104X    JSX .TURN
```

```
5111          1704R   DEF =D6
5112         77616A   DEF V32654  XFLAG
5113  31616  77616A   STA V32654  XFLAG
5114  66000  32476R   JMP L193  RESET
5115 177771
5115                   LIT
5116                  A449 EQU *
5116                  A448 EQU *
5116 170201            RET 1
5117                  P450  EQU * COUNTIF
5117   6000   1277R   LDB =D-1
5120  42000     27X   JSX .ARGA
5121  42000     33X   JSX .UPC4
5122  42000     53X   JSX .LDSI
5123          1463R   DEF =D0
5124  42000     34X   JSX .STRD
5125         77655A   DEF V32685  LTEMP2
5126   6000   1301R   LDB =D-3  N
5127  42000     30X   JSX .LDAP
5130  12000   1704R   CPA =D6
5131  66000   5133R   JMP *+2
5132  66000   5140R   JMP A451
5133   1605  77605A   LDA V32645  SCANSL
5134  52000   2276R   AND =D2
5135  22000   1457R   ADA =D1
5136  31573  77573A   STA V32635  I
5137  66000   5213R   JMP A452
5140                  A451 EQU *
5140   1616  77616A   LDA V32654  XFLAG
5141 170613            SAL 12
5142 172016           SAP A453
5143   2000   1704R   LDA =D6
5144  70540            PWC A
5145  42000   5033R   JSM P443  CPERIOD
5146  70540            PWC A
5147   6000   1301R   LDB =D-3  N
5150  42000     30X   JSX .LDAP
5151  22000   1301R   ADA =D-3
5152  42000    135X   JSX .NEQL
5153 170516            SAR 15
5154  42000     57X   JSX ADD41
5155  42000   2132R   JSM P265  LIMIT
5156  31573  77573A   STA V32635  I
5157  66000   5213R   JMP A454
5160                  A453 EQU *
5160   5605  77605A   LDB V32645  SCANSL
5161   1600  77600A   LDA V32640  CTIM
5162  76005           RZB A455
5163  42000   2070R   JSM P261  IFBW
5164 170500            SAR 1
5165 170040            TCA
5166  22000   2565R   ADA =D11
5167                  A455 EQU *
5167  31573  77573A   STA V32635  I
5170   6000   1301R   LDB =D-3  N
5171  42000     30X   JSX .LDAP
5172  12000   2107R   CPA =D3
5173  66000   5175R   JMP *+2
5174  66000   5204R   JMP A456
5175   2000   2276R   LDA =D2
5176  70540            PWC A
5177   1573  77573A   LDA V32635  I
5200  22000   5115R   ADA =D-7
5201  42000   2132R   JSM P265  LIMIT
5202  22000   2107R   ADA =D3
5203  66000   5212R   JMP A457
5204                  A456 EQU *
5204   2000   2405R   LDA =D5
5205  70540            PWC A
5206   1573  77573A   LDA V32635  I
5207  22000   1363R   ADA =D-4
5210  42000   2132R   JSM P265  LIMIT
5211  22000   1457R   ADA =D1
5212                  A457 EQU *
5212  31573  77573A   STA V32635  I
5213                  A454 EQU *
5213                  A452 EQU *
5213 170601            SAL 2
5214  70540            PWC A
5215   6000   1301R   LDB =D-3  N
5216  42000     30X   JSX .LDAP
5217  52000   2107R   AND =D3
5220  42000    136X   JSX .ORT
5221   6000   2405R   LDB =D5
5222  42000     75X   JSX .WS4
5223  42000   5060R   JSM P445  WCNT
5224   6000   2405R   LDB =D5
5225  42000     74X   JSX .RS5
5226  31657  77657A   STA V35 BCDB
5227  42000    137X   JSX .R6
5230  31660  77660A   STA V36 BCDC
5231  76604           SSC A458
5232  42000     37X   JSX .LDBI
```

```
5233             5246R    DEF =F20000000
5234  66000      5245R    JMP A459
5235                     A458 EQU *
5235   1573     77573A    LDA V32635   I
5236 170040               TCA
5237  22000      1704R    ADA =D6
5240  70540               PWC A
5241  42000        37X    JSX .LDBI
5242            77655A    DEF V32685   LTEMP2
5243  70761               WWC B
5244  42000        51X    JSX .DLFT
5245                     A459 EQU *
5245  66000        31X    JMX .RTNA
5246 20000000
5246                      LIT
5252                     P460  EQU * YIGSLEW
5252 174517               CLB
5253  42000        56X    JSX .ARGS
5254  42000        33X    JSX .UPC4
5255   2000      1704R    LDA =D6
5256  42000      5117R    JSM P450   COUNTIF
5257  42000        34X    JSX .STRD
5260            77655A    DEF V32685   LTEMP2
5261   1573     77573A    LDA V32635   I
5262 170040               TCA
5263  22000      1704R    ADA =D6
5264  70540               PWC A
5265  42000        53X    JSX .LDSI
5266             1457R    DEF =D1
5267  70761               WWC B
5270  42000        51X    JSX .DLFT
5271  42000        34X    JSX .STRD
5272            77661A    DEF V32689   LTEMP1
5273  42000        53X    JSX .LDSI
5274             1463R    DEF =D0
5275   6000      2107R    LDB =D3 YIGSLEW
5276  42000        43X    JSX .STBP
5277   2000      1463R    LDA =D0
5300  31567     77567A    STA V32631   KEYCOL
5301                     A461 EQU *
5301  42000        37X    JSX .LDBI
5302            77655A    DEF V32685   LTEMP2
5303   6000      2107R    LDB =D3 YIGSLEW
5304  42000        63X    JSX MIN2P
5305   4020        20A    LDB AR2
5306  77202               SLB *+2,C
5307  34020        20A    STB AR2
5310  42000       140X    JSX MIN2
5311            77661A    DEF V32689   LTEMP1
5312   4020        20A    LDB AR2
5313  77407               RLB A463
5314  42000        37X    JSX .LDBI
5315             5340R    DEF =F8000000
5316  42000       140X    JSX MIN2
5317            77655A    DEF V32685   LTEMP2
5320   4020        20A    LDB AR2
5321  77024               SLB A462
5322                     A463 EQU *
5322   1567     77567A    LDA V32631   KEYCOL
5323  22000      5344R    ADA =D-4000
5324 172021               SAP A462
5325  45567     77567A    ISZ V32631   KEYCOL
5326                      NOP
5327  42000        37X    JSX .LDBI
5330            77655A    DEF V32685   LTEMP2
5331   6000      2107R    LDB =D3 YIGSLEW
5332  42000        43X    JSX .STBP
5333   2000      1704R    LDA =D6
5334  42000      5117R    JSM P450   COUNTIF
5335  42000        34X    JSX .STRD
5336            77655A    DEF V32685   LTEMP2
5337  66000      5301R    JMP A461
5340 8000000
5344 170140
5340                      LIT
5345                     A462 EQU *
5345  42000        37X    JSX .LDBI
5346            77655A    DEF V32685   LTEMP2
5347  66000        31X    JMX .RTNA
5350                     P464  EQU * SRQM
5350   1740     77740A    LDA V32736   EFLAG
5351 170604               SAL 5
5352 172404               SAM A465
5353   2000      1364R    LDA =B100
5354   6000      2411R    LDB =D4
5355  42000       112X    JSX .WS7
5356                     A465 EQU *
5356 170201               RET 1
5357                     P466  EQU * NOLOCK
5357   2000      1463R    LDA =D0
5360  31573     77573A    STA V32635   I
5361                     A467 EQU *
5361  45573     77573A    ISZ V32635   I
5362                      NOP
```

```
5363    1573   77573A    LDA V32635   I
5364  170040             TCA
5365   22000    3654R    ADA =D16
5366    4000             LDB A
5367    2000    1457R    LDA =D1
5370   42000     141X    JSX .SLFT
5371   51602   77602A    AND V32642   LKMSK
5372    6000    2107R    LDB =D3
5373   42000     107X    JSX .WS5
5374    6000    2276R    LDB =D2
5375   42000     110X    JSX .RS7
5376   31572   77572A    STA V32634   J
5377   52000    2406R    AND =D7
5400   12000    2406R    CPA =D7
5401   66000    5406R    JMP A468
5402    1573   77573A    LDA V32635   I
5403  170040             TCA
5404   22000    1704R    ADA =D6
5405  172054            SAP A467
5406                    A468 EQU *
5406    1573   77573A    LDA V32635   I
5407  170040             TCA
5410   22000    2276R    ADA =D2
5411  172024            SAP A469
5412    1573   77573A    LDA V32635   I
5413   22000    2417R    ADA =D-6
5414  172021            SAP A469
5415    1573   77573A    LDA V32635   I
5416   70540             PWC A
5417   42000    5350R    JSM P464   SRQM
5420    1573   77573A    LDA V32635   I
5421  170040             TCA
5422   22000    3654R    ADA =D16
5423    4000             LDB A
5424    1602   77602A    LDA V32642   LKMSK
5425   42000     142X    JSX .RBIT
5426   31602   77602A    STA V32642   LKMSK
5427    1573   77573A    LDA V32635   I
5430  170040             TCA
5431   22000    5515R    ADA =D30
5432   42000    2501R    JSM P295   BLINK
5433   70760             WWC A
5434   31573   77573A    STA V32635   I
5435                    A469 EQU *
5435    1573   77573A    LDA V32635   I
5436   66000    5540R    JMP A470
5437                    C471 EQU *
5437    2000    3166R    LDA =D1023
5440   70540             PWC A
5441    1613   77613A    LDA V32651   DAC4
5442   22000    1301R    ADA =D-3
5443   42000    2132R    JSM P265   LIMIT
5444   31613   77613A    STA V32651   DAC4
5445    6000    1463R    LDB =D0
5446   42000     112X    JSX .WS7
5447   72005            RZA A472
5450    1602   77602A    LDA V32642   LKMSK
5451   52000    5516R    AND =B37777
5452   62000    4534R    IOR =B40000
5453   31602   77602A    STA V32642   LKMSK
5454                    A472 EQU *
5454    2000    2405R    LDA =D5
5455   42000    3214R    JSM P332   WAIT
5456   66000    5541R    JMP A473
5457                    C474 EQU *
5457    2000    3166R    LDA =D1023
5460   70540             PWC A
5461    1613   77613A    LDA V32651   DAC4
5462   22000    2107R    ADA =D3
5463   42000    2132R    JSM P265   LIMIT
5464   31613   77613A    STA V32651   DAC4
5465    6000    1463R    LDB =D0
5466   42000     112X    JSX .WS7
5467   12000    3166R    CPA =D1023
5470   66000    5472R    JMP *+2
5471   66000    5476R    JMP A475
5472    1602   77602A    LDA V32642   LKMSK
5473   52000    5516R    AND =B37777
5474   62000    5517R    IOR =B100000
5475   31602   77602A    STA V32642   LKMSK
5476                    A475 EQU *
5476    2000    2405R    LDA =D5
5477   42000    3214R    JSM P332   WAIT
5500   66000    5541R    JMP A473
5501                    C476 EQU *
5501   42000    2154R    JSM P269   WSPIN
5502   66000    5541R    JMP A473
5503                    C477 EQU *
5503    2000    5520R    LDA =D24
5504   42000    2501R    JSM P295   BLINK
5505    1616   77616A    LDA V32654   XFLAG
5506  170610             SAL 9
5507  172013             SAP A478
```

```
5510  42000   5350R      JSM P464  SROM
5511   1602  77602A      LDA V32642  LKMSK
5512  52000   5521R      AND =B175777
5513  31602  77602A      STA V32642  LKMSK
5514  66000   5530R      JMP A479
5515     36
5516  37777
5517 100000
5520     30
5521 175777
5515                    LIT
5522                   A478 EQU *
5522   1616  77616A      LDA V32654  XFLAG
5523  62000   1364R      IOR =B100
5524  31616  77616A      STA V32654  XFLAG
5525  42000     37X      JSX .LDBI
5526         77665A      DEF V8  CFREQ
5527  42000   6750R      JSM P222  TUNE
5530                   A479 EQU *
5530  66000   5541R      JMP A473
5531          5503R      DEF C477
5532          5501R      DEF C476
5533          5541R      DEF A473
5534          5541R      DEF A473
5535          5457R      DEF C474
5536          5437R      DEF C471
5537                     DEC -7
5540  42000    143X    A470  JSX .CASE
5541                   A473 EQU *
5541   1602  77602A      LDA V32642  LKMSK
5542   6000   2107R      LDB =D3
5543  42000    107X      JSX .WS5
5544 170201              RET 1
5545                   P480  EQU * VTOSLEW
5545 174517              CLB
5546  42000     56X      JSX .ARGS
5547  42000     33X      JSX .UPC4
5550  42000     53X      JSX .LDSI
5551          1463R      DEF =D0
5552   6000   2107R      LDB =D3 VTOSLEW
5553  42000     43X      JSX .STBP
5554   2000   2107R      LDA =D3
5555  42000   5117R      JSM P450  COUNTIF
5556  42000     34X      JSX .STRD
5557         77655A      DEF V32685  LTEMP2
5560   1573  77573A      LDA V32635  I
5561 170040              TCA
5562  22000   1704R      ADA =D6
5563  70540              PWC A
5564  42000     53X      JSX .LDSI
5565          1457R      DEF =D1
5566  70761              WWC B
5567  42000     51X      JSX .DLFT
5570  42000     36X      JSX .SAR2
5571   1604  77604A      LDA V32644  SATN
5572 172004             SAP A481
5573  42000     53X      JSX .LDSI
5574          1463R      DEF =D0
5575  66000   5600R      JMP A482
5576                   A481 EQU *
5576  42000     53X      JSX .LDSI
5577          1364R      DEF =H40
5600                   A482 EQU *
5600  42000    144X      JSX ADD3T
5601  42000     34X      JSX .STRD
5602         77661A      DEF V32689  LTEMP1
5603   2000   1463R      LDA =D0
5604  31567  77567A      STA V32631  KEYCOL
5605                   A483 EQU *
5605   6000   2107R      LDB =D3 VTOSLEW
5606  42000     66X      JSX .LDBP
5607  42000    140X      JSX MIN2
5610         77655A      DEF V32685  LTEMP2
5611   4020     20A      LDB AR2
5612  77202              SLB *+2,C
5613  34020     20A      STB AR2
5614  42000    140X      JSX MIN2
5615         77661A      DEF V32689  LTEMP1
5616   4020     20A      LDB AR2
5617  77022             SLB A484
5620   1567  77567A      LDA V32631  KEYCOL
5621  22000   5640R      ADA =D-200
5622 172017             SAP A484
5623  45567  77567A      ISZ V32631  KEYCOL
5624                     NOP
5625  42000     37X      JSX .LDB1
5626         77655A      DEF V32685  LTEMP2
5627   6000   2107R      LDB =D3 VTOSLEW
5630  42000     43X      JSX .STBP
5631   2000   2107R      LDA =D3
5632  42000   5117R      JSM P450  COUNTIF
5633   2000   2107R      LDA =D3
```

```
5634   42000   5117R     JSM P450  COUNTIF
5635   42000     34X     JSX .STRD
5636          77655A     DEF V32685  LTEMP2
5637   66000   5605R     JMP A483
5640  177470
5640                    LIT
5641                    A484 EQU *
5641   42000     37X     JSX .LDB1
5642          77655A     DEF V32685  LTEMP2
5643   66000     31X    JMX .RTNA
5644                    P485  EQU * KSWP
5644    1604  77604A     LDA V32644  SATN
5645   52000   4534R     AND =B40000
5646   62000   1770R     IOR =B20000
5647    6000   1457R     LDB =D1
5650   42000     75X     JSX .WS4
5651  170201             RET 1
5652                    P486  EQU * SWPON
5652    1604  77604A     LDA V32644  SATN
5653    6000   1457R     LDB =D1
5654   42000     75X     JSX .WS4
5655  170201             RET 1
5656                    P487  EQU * VTOTUNE
5656    1605  77605A     LDA V32645  SCANSL
5657   73002            SLA A488
5660   42000   5644R     JSM P485  KSWP
5661                    A488 EQU *
5661    2000   2416R     LDA =D29
5662   42000   2434R     JSM P285  BLKOF
5663    2000   1300R     LDA =D512
5664   31615  77615A     STA V32653  DAC1
5665    2000   1463R     LDA =D0
5666   31573  77573A     STA V32635  I
5667    1605  77605A     LDA V32645  SCANSL
5670   73006            SLA A489
5671    1604  77604A     LDA V32644  SATN
5672   52000   4533R     AND =B140000
5673   62000   1770R     IOR =B20000
5674    6000   1457R     LDB =D1
5675   42000     75X     JSX .WS4
5676                    A489 EQU *
5676                    A490 EQU *
5676    1614  77614A     LDA V32652  DAC2
5677   21573  77573A     ADA V32635  I
5700   31614  77614A     STA V32652  DAC2
5701    1615  77615A     LDA V32653  DAC1
5702    6000   1463R     LDB =D0
5703   42000     75X     JSX .WS4
5704    1614  77614A     LDA V32652  DAC2
5705   42000    105X     JSX .W5
5706   42000   5545R     JSM P480  VTOSLEW
5707   42000    145X     JSX SUB2
5710          77641A     DEF V32673  VTOFREQ
5711   42000     34X     JSX .STRD
5712          77655A     DEF V32685  LTEMP2
5713   42000    146X     JSX DIV3
5714           5741R     DEF =H7500
5715   42000     50X     JSX CNV24
5716   31573  77573A     STA V32635  I
5717   72404            SZA A491
5720    1614  77614A     LDA V32652  DAC2
5721   52000   5742R     AND =B176000
5722   72454            SZA A490
5723                    A491 EQU *
5723    1614  77614A     LDA V32652  DAC2
5724   52000   5742R     AND =B176000
5725   72416            SZA A492
5726    2000   3166R     LDA =D1023
5727   70540             PWC A
5730    1614  77614A     LDA V32652  DAC2
5731   42000   2132R     JSM P265  LIMIT
5732   31614  77614A     STA V32652  DAC2
5733    6000   1463R     LDB =D0
5734   42000    107X     JSX .WS5
5735    2000   2416R     LDA =D29
5736   42000   2501R     JSM P295  BLINK
5737   42000   5350R     JSM P464  SRQM
5740   66000   5755R     JMP A493
5741   72400
5742  176000
5741                    LIT
5743                    A492 EQU *
5743    2000   3166R     LDA =D1023
5744   70540             PWC A
5745   42000     37X     JSX .LDB1
5746          77655A     DEF V32685  LTEMP2
5747   42000     50X     JSX CNV24
5750   42000    113X     JSX DIV4
5751           3654R     DEF =D16
5752   22000   1300R     ADA =D512
5753   42000   2132R     JSM P265  LIMIT
5754   31615  77615A     STA V32653  DAC1
5755                    A493 EQU *
```

```
5755    1615   77615A      LDA V32653  DAC1
5756    6000    1463R      LDB =D0
5757   42000      75X      JSX .WS4
5760    1605   77605A      LDA V32645  SCANSL
5761   73002              SLA A494
5762   42000    5652R      JSM P486  SWPON
5763                      A494 EQU *
5763  170201               RET 1
5764                      P495  EQU * FRQC
5764  174517               CLB
5765   42000      56X      JSX .ARGS
5766   42000      33X      JSX .UPC4
5767   42000    3221R      JSM P333  CORREK
5770  172006              SAP A496
5771   42000    2070R      JSM P261  IFBW
5772   42000     133X      JSX .GRAY
5773               12R     DEF V37 BWFRQ
5774   42000     134X      JSX .LDBA
5775   66000    6000R      JMP A497
5776                      A496 EQU *
5776   42000      53X      JSX .LDSI
5777            1463R      DEF =D0
6000                      A497 EQU *
6000   42000     145X      JSX SUB2
6001           77707A      DEF V11 FOFSET
6002   42000      36X      JSX .SAR2
6003    1605   77605A      LDA V32645  SCANSL
6004  170615               SAL 14
6005  172004              SAP A498
6006   42000      53X      JSX .LDSI
6007            6015R      DEF =H7000
6010   66000    6013R      JMP A499
6011                      A498 EQU *
6011   42000      53X      JSX .LDSI
6012            1463R      DEF =D0
6013                      A499 EQU *
6013   42000     130X      JSX ADD2T
6014   66000      31X     JMX .RTNA
6015   70000
6015                       LIT
6016                      P500   EQU * STUNE
6016    6000    1363R      LDB =D-4
6017   42000      32X      JSX .ARGL
6020   42000    5764R      JSM P495   FRQC
6021    6000    1375R      LDB =D-9  MFREQ
6022   42000     147X      JSX ADD2P
6023    6000    1375R      LDB =D-9  MFREQ
6024   42000      43X      JSX .STBP
6025   42000     150X      JSX ADD2
6026            6102R      DEF =F42500000
6027   42000     151X      JSX DIV2
6030            5246R      DEF =F20000000
6031   42000     152X      JSX CNV23
6032      23      23A      LDA AR2+3
6033   31746   77746A      STA V32742  N
6034    6000    1375R      LDB =D-9  MFREQ
6035   42000      66X      JSX .LDBP
6036   42000     150X      JSX ADD2
6037            6106R      DEF =F1400000
6040   42000      36X      JSX .SAR2
6041   42000      53X      JSX .LDSI
6042           77746A      DEF V32742  N
6043   42000     153X      JSX MPY2
6044            5246R      DEF =F20000000
6045   42000     124X      JSX SUB2T
6046   42000      34X      JSX .STRD
6047           77661A      DEF V32689  LTEMP1
6050   42000      37X      JSX .LDBI
6051            6112R      DEF =F4750000
6052   42000     140X      JSX MIN2
6053           77661A      DEF V32689  LTEMP1
6054   42000     151X      JSX DIV2
6055            6116R      DEF =F4000000
6056   42000      50X      JSX CNV24
6057  170040               TCA
6060   22000    2521R      ADA =D17
6061   31570   77570A      STA V32632   M
6062   42000     125X      JSX CNV43
6063   42000     127X      JSX MIN3
6064            6122R      DEF =H17
6065   42000     153X      JSX MPY2
6066            6116R      DEF =F4000000
6067   42000     150X      JSX ADD2
6070            6112R      DEF =F4750000
6071   42000     140X      JSX MIN2
6072           77661A      DEF V32689  LTEMP1
6073   42000     151X      JSX DIV2
6074            6123R      DEF =F250000
6075   42000      50X      JSX CNV24
6076   52000    3527R      AND =D14
6077   31571   77571A      STA V32633  L
6100   42000    2154R      JSM P269  WSPIN
```

```
3029    6101  66000        31X     JMX .RTNA
        6102 42500000
        6106 1400000
        6112 4750000
        6116 4000000
        6122       27
        6123 250000
3030    6102                        LIT
3031    6127                       P501  EQU * MKIS
3032    6127 174517                  CLB
3033    6130  42000       56X        JSX .ARGS
3034    6131  44016       16A        ISZ C
3035    6132   1723    77723A        LDA V26 MKRMODE
3036    6133  42000      135X        JSX .NEQL
3037    6134  70540                  PWC A
3038    6135   1605    77605A        LDA V32645  SCANSL
3039    6136  42000      135X        JSX .NEQL
3040    6137  51675    77675A        AND V15 BLEDS
3041    6140  61616    77616A        IOR V32654  XFLAG
3042    6141 170601                  SAL 2
3043    6142  70540                  PWC A
3044    6143   1740    77740A        LDA V32736  EFLAG
3045    6144  52000     6157R        AND =B10003
3046    6145  42000      111X        JSX .EQL
3047    6146 170140                  CMA
3048    6147  42000      136X        JSX .ORT
3049    6150  42000      154X        JSX .ANDT
3050    6151  70540                  PWC A
3051    6152   1730    77730A        LDA V30 KFLAG
3052    6153 170614                  SAL 13
3053    6154 170140                  CMA
3054    6155  42000      154X        JSX .ANDT
3055    6156  66000       31X       JMX .RTNA
        6157  10003
3056    6157                         LIT
3057    6160                       P502  EQU * EOS
3058    6160  42000     5644R         JSM P485   KSWP
3059    6161   1603    77603A         LDA V32643   PLOCK
3060    6162 170603                   SAL 4
3061    6163 172002                   SAP *+2
3062    6164  66000     6245R         JMP A503
3063    6165   1616    77616A         LDA V32654   XFLAG
3064    6166  52000     2302R         AND =B26
3065    6167  22000     6231R         ADA =B177754
3066    6170  72004                  RZA A504
3067    6171  42000       37X         JSX .LDB1
3068    6172           77665A         DEF V8  CFREQ
3069    6173  42000     6016R         JSM P500   STUNE
3070    6174                        A504 EQU *
3071    6174   1616    77616A         LDA V32654   XFLAG
3072    6175  52000     6232R         AND =B177761
3073    6176  31616    77616A         STA V32654   XFLAG
3074    6177   1730    77730A         LDA V30 KFLAG
3075    6200 170614                   SAL 13
3076    6201 172434                  SAM A505
3077    6202  42000     6127R         JSM P501   MKIS
3078    6203 172003                  SAP A506
3079    6204   1721    77721A         LDA V25 MRKR
3080    6205  66000     6207R         JMP A507
3081    6206                        A506 EQU *
3082    6206   2000     3112R         LDA =D1001
3083    6207                        A507 EQU *
3084    6207   6000     2221R         LDB =D9
3085    6210  42000       72X         JSX .W56
3086    6211   2000     1457R         LDA =D1
3087    6212  42000      106X         JSX .W7
3088    6213   1676    77676A         LDA V16 TLEDS
3089    6214  52000     6233R         AND =B600
3090    6215  22000     6234R         ADA =B177200
3091    6216  72007                  RZA A508
3092    6217   1702    77702A         LDA V24 VIDCON
3093    6220 170140                   CMA
3094    6221  42000      104X         JSX .TURN
3095    6222            1457R         DEF =D1
3096    6223           77702A         DEF V24 VIDCON
3097    6224  31702    77702A         STA V24 VIDCON
3098    6225                        A508 EQU *
3099    6225   2000     1463R         LDA =D0
3100    6226   6000     2203R         LDB =D8
3101    6227  42000      112X         JSX .W57
3102    6230  66000     6245R         JMP A509
        6231 177754
        6232 177761
        6233    600
        6234 177200
3103    6231                         LIT
3104    6235                        A505 EQU *
3105    6235   2000     6350R         LDA =D4073
3106    6236   6000     2221R         LDB =D9
3107    6237  42000       72X         JSX .W56
3108    6240   2000     6351R         LDA =D3073
3109    6241  42000      106X         JSX .W7
3110    6242   2000     6352R         LDA =D3072
```

```
6243    6000   2203R      LDB =D6
6244   42000    112X      JSX .WS7
6245                     A509 EQU *
6245                     A503 EQU *
6245    1616  77616A      LDA V32654  XFLAG
6246 170603               SAL 4
6247 172002               SAP *+2
6250  66000   6577R       JMP A510
6251    1616  77616A      LDA V32654  XFLAG
6252 170612               SAL 11
6253 172402               SAM *+2
6254  66000   6372R       JMP A511
6255    1603  77603A      LDA V32643  PLOCK
6256  52000   6353R       AND =B7777
6257  62000   6354R       IOR =B150000
6260  31603  77603A       STA V32643  PLOCK
6261  52000   2645R       AND =B137777
6262    6000   1457R      LDB =D1
6263  42000     72X       JSX .WS6
6264    2000   2107R      LDA =D3
6265  42000   3214R       JSM P332  WAIT
6266    2000   2107R      LDA =D3
6267  42000   3214R       JSM P332  WAIT
6270    2000   2107R      LDA =D3
6271  42000   3214R       JSM P332  WAIT
6272    2000   3166R      LDA =D1023
6273  70540               PWC A
6274  42000   5252R       JSM P460  YIGSLEW
6275  42000    145X       JSX SUB2
6276          5246R       DEF =F20000000
6277    6000   2405R      LDB =D5
6300  42000     47X       JSX .DRGT
6301  42000     50X       JSX CNV24
6302  42000    113X       JSX DIV4
6303          2521R       DEF =D17
6304 170040               TCA
6305  21613  77613A       ADA V32651  DAC4
6306  42000   2132R       JSM P265  LIMIT
6307  31613  77613A       STA V32651  DAC4
6310    6000   1463R      LDB =D0
6311  42000    112X       JSX .WS7
6312    2000   5515R      LDA =D30
6313  42000   2434R       JSM P285  BLKUP
6314    1613  77613A      LDA V32651  DAC4
6315    6000   2521R      LDB =D17
6316  75617               MPY
6317  42000    122X       JSX CNV42
6320    6000   2405R      LDB =D5
6321  42000     51X       JSX .DLFT
6322  42000     36X       JSX .SAR2
6323  42000   5764R       JSM P495  FRQC
6324  42000    150X       JSX ADD2
6325         77665A       DEF V8  CFREQ
6326  42000    124X       JSX SUB2T
6327    4020     20A      LDB AR2
6330  77202               SLB *+2,C
6331  34020     20A       STB AR2
6332  42000    140X       JSX MIN2
6333          6355R       DEF =F9000000
6334    4020     20A      LDB AR2
6335  77027               SLB A512
6336    1616  77616A      LDA V32654  XFLAG
6337 170610               SAL 9
6340 172421               SAM A513
6341    1616  77616A      LDA V32654  XFLAG
6342  62000   1364R       IOR =B100
6343  31616  77616A       STA V32654  XFLAG
6344  42000     37X       JSX .LDBI
6345         77665A       DEF V8  CFREQ
6346  42000   6750R       JSM P222  TUNE
6347  66000   6364R       JMP A514
6350    7751
6351    6001
6352    6000
6353    7777
6354 150000
6355 9000000
6356                      LIT
6361                     A513 EQU *
6361    2000   5515R      LDA =D30
6362  42000   2501R       JSM P295  BLINK
6363  42000   5350R       JSM P464  SRQM
6364                     A514 EQU *
6364                     A512 EQU *
6364    1603  77603A      LDA V32643  PLOCK
6365  52000   6371R       AND =B167777
6366  31603  77603A       STA V32643  PLOCK
6367  42000   5252R       JSM P460  YIGSLEW
6370  66000   6374R       JMP A515
6371 167777
6371                      LIT
6372                     A511 EQU *
6372    2000   5515R      LDA =D30
```

```
6373  42000    2434R    JSM P285   BLKOF
6374                   A515 EQU *
6374   1603   77603A    LDA V32643   PLOCK
6375   6000    1457R    LDB =D1
6376  42000      72X    JSX .WS6
6377   1605   77605A    LDA V32645   SCANSL
6400  73002             SLA A516
6401  42000    5545R    JSM P480   VTOSLEW
6402                   A516 EQU *
6402   2000    1277R    LDA =B177777
6403  31602   77602A    STA V32642   LKMSK
6404   6000    2107R    LDB =D3
6405  42000     107X    JSX .WS5
6406   1605   77605A    LDA V32645   SCANSL
6407 170040             TCA
6410  22000    1457R    ADA =D1
6411 172003             SAP A517
6412   2000    2107R    LDA =D3
6413  42000    3214R    JSM P332   WAIT
6414                   A517 EQU *
6414   2000    2411R    LDA =D4
6415  42000    3171R    JSM P327   HLDOF
6416   2000    1363R    LDA =B177774
6417  70540             PWC A
6420   2000    5520R    LDA =D24
6421                   A518 EQU *
6421  31572   77572A    STA V32634   J
6422  42000    2434R    JSM P285   BLKOF
6423   2000    1457R    LDA =D1
6424  21572   77572A    ADA V32634   J
6425 144016      16A    ISZ C,I
6426  66000    6421R    JMP A518
6427  54016      16A    DSZ C
6430                   A519 EQU *
6430   6000    2276R    LDB =D2
6431  42000     110X    JSX .RS7
6432  31567   77567A    STA V32631   KEYCOL
6433  52000    6122R    AND =B27
6434  22000    6450R    ADA =B177751
6435  72473             SZA A519
6436                   A520 EQU *
6436   1567   77567A    LDA V32631   KEYCOL
6437  52000    2406R    AND =D7
6440  12000    2406R    CPA =D7
6441  66000    6443R    JMP *+2
6442  66000    6451R    JMP A521
6443  42000    5357R    JSM P466   NOLOCK
6444   6000    2276R    LDB =D2
6445  42000     110X    JSX .RS7
6446  31567   77567A    STA V32631   KEYCOL
6447  66000    6436R    JMP A520
6450 177751
6450                    LIT
6451                   A521 EQU *
6451   1616   77616A    LDA V32654   XFLAG
6452  52000    6512R    AND =B177677
6453  31616   77616A    STA V32654   XFLAG
6454 170612             SAL 11
6455 172402             SAM *+2
6456  66000    6516R    JMP A522
6457   1602   77602A    LDA V32642   LKMSK
6460  52000    6513R    AND =B35777
6461  31602   77602A    STA V32642   LKMSK
6462   6000    2107R    LDB =D3
6463  42000     107X    JSX .WS5
6464   1605   77605A    LDA V32645   SCANSL
6465 170615             SAL 14
6466 172002             SAP A523
6467  42000    3205R    JSM P329   BUSY
6470                   A523 EQU *
6470   2000    2107R    LDA =D3
6471  42000    3214R    JSM P332   WAIT
6472   1603   77603A    LDA V32643   PLOCK
6473  52000    6514R    AND =B77777
6474   6000    1457R    LDB =D1
6475  42000      72X    JSX .WS6
6476   1603   77603A    LDA V32643   PLOCK
6477  52000    6353R    AND =B7777
6500  62000    6515R    IOR =B50000
6501  31603   77603A    STA V32643   PLOCK
6502   6000    1457R    LDB =D1
6503  42000      72X    JSX .WS6
6504  42000    5652R    JSM P486   SWPON
6505   2000    2107R    LDA =D3
6506  42000    3214R    JSM P332   WAIT
6507   2000    2107R    LDA =D3
6510  42000    3214R    JSM P332   WAIT
6511  66000    6576R    JMP A524
6512 177677
6513  35777
6514  77777
6515  50000
6512                    LIT
6516                   A522 EQU *
```

```
6516    1604   77604A      LDA V32644  SATN
6517   52000    4533R      AND =B140000
6520   62000    1770R      IOR =B20000
6521    6000    1457R      LDB =D1
6522   42000      75X      JSX .WS4
6523    1740   77740A      LDA V32736  EFLAG
6524   52000    2107R      AND =D3
6525   72023              RZA A525
6526   42000    5545R      JSM P480  VTOSLEW
6527   42000     145X      JSX SUB2
6530           77641A      DEF V32673  VTOFREQ
6531   42000      34X      JSX .STRD
6532           77655A      DEF V32685  DTEMP2
6533   42000      50X      JSX CNV24
6534   42000     113X      JSX DIV4
6535            3654R      DEF =D16
6536   21615   77615A      ADA V32653  DAC1
6537   31615   77615A      STA V32653  DAC1
6540   52000    5742R      AND =B176000
6541   72403              SZA A526
6542   42000    5656R      JSM P487  VTOTUNE
6543   66000    6547R      JMP A527
6544                     A526 EQU *
6544    1615   77615A      LDA V32653  DAC1
6545    6000    1463R      LDB =D0
6546   42000      75X      JSX .WS4
6547                     A527 EQU *
6547   66000    6553R      JMP A528
6550                     A525 EQU *
6550    1616   77616A      LDA V32654  XFLAG
6551   62000    2203R      IOR =B10
6552   31616   77616A      STA V32654  XFLAG
6553                     A528 EQU *
6553    1604   77604A      LDA V32644  SATN
6554   52000    6514R      AND =B77777
6555    6000    1457R      LDB =D1
6556   42000      75X      JSX .WS4
6557    2000    2276R      LDA =D2
6560   42000    3214R      JSM P332  WAIT
6561   42000    5652R      JSM P486  SWPON
6562   42000    5545R      JSM P480  VTOSLEW
6563    1616   77616A      LDA V32654  XFLAG
6564   52000    1375R      AND =B177767
6565   31616   77616A      STA V32654  XFLAG
6566    2000    2405R      LDA =D5
6567   42000    3171R      JSM P327  HLDOF
6570                     A529 EQU *
6570    6000    2276R      LDB =D2
6571   42000     110X      JSX .RS7
6572   31567   77567A      STA V32631  KEYCOL
6573   52000    6122R      AND =B27
6574   22000    6450R      ADA =B177751
6575   72473              SZA A529
6576                     A524 EQU *
6576   66000    6617R      JMP A530
6577                     A510 EQU *
6577    1616   77616A      LDA V32654  XFLAG
6600  170612               SAL 11
6601  172005              SAP A531
6602    1603   77603A      LDA V32643  PLOCK
6603   52000    6353R      AND =B7777
6604   62000    6515R      IOR =B50000
6605   31603   77603A      STA V32643  PLOCK
6606                     A531 EQU *
6606    1603   77603A      LDA V32643  PLOCK
6607    6000    1457R      LDB =D1
6610   42000      72X      JSX .WS6
6611    2000    1463R      LDA =D0
6612    6000    2107R      LDB =D3
6613   42000     107X      JSX .WS5
6614   42000    5652R      JSM P486  SWPON
6615    2000    2411R      LDA =D4
6616   42000    3214R      JSM P332  WAIT
6617                     A530 EQU *
6617   42000    2070R      JSM P261  IFBW
6620  170400               AAR 1
6621  170040               TCA
6622   22000    1704R      ADA =D6
6623   42000    3171R      JSM P327  HLDOF
6624   42000    5060R      JSM P445  WCNT
6625   42000    2111R      JSM P263  VBW
6626  170400               AAR 1
6627  170040               TCA
6630   22000    1704R      ADA =D6
6631   42000    3171R      JSM P327  HLDOF
6632   42000    5060R      JSM P445  WCNT
6633    1603   77603A      LDA V32643  PLOCK
6634   62000    2277R      IOR =B4000
6635   31603   77603A      STA V32643  PLOCK
6636    6000    1457R      LDB =D1
6637   42000      72X      JSX .WS6
6640  170201               RET 1
6641                     P532  EQU * LOSHFT
6641    6000    1363R      LDB =D-4
6642   42000      32X      JSX .ARGL
```

```
6643   1730   77730A     LDA V30 KFLAG
6644  52000    2107R     AND =D3
6645  72023             RZA A533
6646   1605   77605A     LDA V32645   SCANSL
6647  52000    1704R     AND =D6
6650  72015             RZA A534
6651  42000     150X     JSX ADD2
6652            6677R     DEF =F7500000
6653  42000     146X     JSX DIV3
6654            2405R     DEF =D5
6655   6000    2405R     LDB =D5
6656  42000     132X     JSX .FDIG
6657 170611              SAL 10
6660 170140              CMA
6661  42000     104X     JSX .TURN
6662            6703R     DEF =B2000
6663           77603A     DEF V32643   PLOCK
6664  66000    6667R     JMP A535
6665                   A534 EQU *
6665   1603   77603A     LDA V32643   PLOCK
6666  62000    6703R     IOR =B2000
6667                   A535 EQU *
6667  66000    6675R     JMP A536
6670                   A533 EQU *
6670   1730   77730A     LDA V30 KFLAG
6671 170611              SAL 10
6672  42000     104X     JSX .TURN
6673            6703R     DEF =B2000
6674           77603A     DEF V32643   PLOCK
6675                   A536 EQU *
6675  31603   77603A     STA V32643   PLOCK
6676  66000      31X     JMX .RTNA
6677 7500000
6703   2000
6677                    LIT
6704                   P537  EQU * CPILOT
6704   6000    1277R     LDB =D-1
6705  42000      27X     JSX .ARGA
6706  42000      33X     JSX .UPC4
6707  42000    5117R     JSM P450  COUNTIF
6710  42000     150X     JSX ADD2
6711            6717R     DEF =F10000000
6712  42000     155X     JSX MOD2
6713            5246R     DEF =F20000000
6714  42000     150X     JSX ADD2
6715            6717R     DEF =F10000000
6716  66000      31X    JMX .RTNA
6717 10000000
6717                    LIT
6723                   P538  EQU * CSBLK
6723   1675   77675A     LDA V15 BLEDS
6724  52000    1457R     AND =D1
6725 170600              SAL 1
6726  22000    2406R     ADA =D7
6727  42000    2314R     JSM P279  SBLK
6730   2000    6703R     LDA =D1024
6731  70540              PWC A
6732   1675   77675A     LDA V15 BLEDS
6733  52000    1457R     AND =D1
6734 170600              SAL 1
6735  22000    2203R     ADA =D8
6736  42000    2522R     JSM P297  RJUST
6737 170201              RET 1
6740                   P539  EQU * CFDUMP
6740   1606   77606A     LDA V32646   SRCEID
6741  73006             SLA A540
6742  62000    5517R     IOR =B100000
6743  31606   77606A     STA V32646   SRCEID
6744   2000    3654R     LDA =B20
6745   6000    2411R     LDB =D4
6746  42000     112X     JSX .WS7
6747                   A540 EQU *
6747 170201              RET 1
6750                   P222  EQU * TUNE
6750   6000    1363R     LDB =D-4
6751  42000      32X     JSX .ARGL
6752  42000     156X     JSX .CLBI
6753            7220R     DEF =F1739100000
6754  42000      37X     JSX .LDBI
6755           77707A     DEF V11 FOFSET
6756   6000    1375R     LDB =D-9  F
6757  42000      63X     JSX MIN2P
6760  42000    2043R     JSM P256  DLIMIT
6761   6000    1375R     LDB =D-9  F
6762  42000      43X     JSX .STBP
6763  42000     150X     JSX ADD2
6764           77707A     DEF V11 FOFSET
6765  42000      34X     JSX .STRD
6766           77665A     DEF V8  CFREQ
6767  42000    6740R     JSM P539  CFDUMP
6770  42000    5764R     JSM P495  FRQC
6771   6000    1375R     LDB =D-9  F
6772  42000     147X     JSX ADD2P
```

```
6773  42000    150X    JSX ADD2
6774          77707A   DEF V11 FOFSET
6775   6000    1375R   LDB =D-9  F
6776  42000     43X    JSX .STBP
6777   1603   77603A   LDA V32643  PLOCK
7000  52000    6353R   AND =B7777
7001  62000    4533R   IOR =B140000
7002  31603   77603A   STA V32643  PLOCK
7003  42000    5644R   JSM P485  KSWP
7004   1603   77603A   LDA V32643  PLOCK
7005  31573   77573A   STA V32635  I
7006   6000    1375R   LDB =D-9  F
7007  42000     66X    JSX .LDBP
7010  42000    6641R   JSM P532  LOSHFT
7011   1603   77603A   LDA V32643  PLOCK
7012  52000    7224R   AND =B27777
7013  62000    7225R   IOR =B110000
7014   6000    1457R   LDB =D1
7015  42000     72X    JSX .WS6
7016  42000    3221R   JSM P333  CORREK
7017 172010           SAP A541
7020   1603   77603A   LDA V32643  PLUCK
7021  42000    120X    JSX .TEST
7022           6703R   DEF =B2000
7023          77573A   DEF V32635  I
7024  72003           RZA A541
7025   1700   77700A   LDA V22 RLVL
7026  42000    3530R   JSM P355  REFLEV
7027                  A541 EQU *
7027  42000     37X    JSX .LDB1
7030          77665A   DEF V8  CFREQ
7031  42000    6016R   JSM P500  STUNE
7032   5604   77604A   LDB V32644  SATN
7033 174600            SBL 1
7034   2000    7226R   LDA =B42000
7035 176402           SBM A542
7036   2000    6015R   LDA =B70000
7037                  A542 EQU *
7037   6000    2107R   LDB =D3
7040  42000     72X    JSX .WS6
7041   1603   77603A   LDA V32643  PLUCK
7042 170604            SAL 5
7043 172004           SAP A543
7044  42000     37X    JSX .LDBI
7045           7227R   DEF =F31100000
7046  66000    7051R   JMP A544
7047                  A543 EQU *
7047  42000     37X    JSX .LDBI
7050           7233R   DEF =F26100000
7051                  A544 EQU *
7051  42000     36X    JSX .SAR2
7052   6000    1375R   LDB =D-9  F
7053  42000     66X    JSX .LDBP
7054  42000    150X    JSX ADD2
7055          77661A   DEF V32689  LTEMP1
7056  42000    124X    JSX SUB2T
7057  42000    151X    JSX DIV2
7060           7237R   DEF =F1700000
7061  42000     50X    JSX CNV24
7062  31613   77613A   STA V32651  DAC4
7063   5613   77613A   LDB V32651  DAC4
7064 174040            TCB
7065  26000    3166R   ADB =D1023
7066 176002           SBP A545
7067  22000    7243R   ADA =D-12
7070                  A545 EQU *
7070   6000    1463R   LDB =D0
7071  42000    112X    JSX .WS7
7072   1604   77604A   LDA V32644  SATN
7073 170600            SAL 1
7074 172031           SAP A546
7075  42000     37X    JSX .LDB1
7076           7244R   DEF =F2250000
7077  42000    140X    JSX MIN2
7100          77661A   DEF V32689  LTEMP1
7101  42000    151X    JSX DIV2
7102           6116R   DEF =F4000000
7103  42000     50X    JSX CNV24
7104 170040            TCA
7105  22000    2521R   ADA =D17
7106  31570   77570A   STA V32632  M
7107  42000    125X    JSX CNV43
7110  42000    127X    JSX MIN3
7111           6122R   DEF =H17
7112  42000    153X    JSX MPY2
7113           6116R   DEF =F4000000
7114  42000    150X    JSX ADD2
7115           7244R   DEF =F2250000
7116  42000    140X    JSX MIN2
7117          77661A   DEF V32689  LTEMP1
7120  42000    151X    JSX DIV2
7121           6123R   DEF =F250000
7122  42000     50X    JSX CNV24
```

```
7123  52000   3527R      AND =D14
7124  31571  77571A      STA V32633   L
7125                   A546 EQU *
7125   1570  77570A      LDA V32632   M
7126 170040              TCA
7127  22000   2521R      ADA =D17
7130 170603              SAL 4
7131  21571  77571A      ADA V32633   L
7132  42000    122X      JSX CNV42
7133  42000    153X      JSX MPY2
7134          6123R      DEF =F250000
7135  42000    140X      JSX MIN2
7136         77661A      DEF V32689   LTEMP1
7137  42000     36X      JSX .SAR2
7140   1604  77604A      LDA V32644   SATN
7141 170600              SAL 1
7142 172004              SAP A547
7143  42000     53X      JSX .LDSI
7144          3654R      DEF =H10
7145  66000   7150R      JMP A548
7146                   A547 EQU *
7146  42000     53X      JSX .LDSI
7147          2405R      DEF =D5
7150                   A548 EQU *
7150  42000    157X      JSX MPY2I
7151  42000     34X      JSX .SIRD
7152         77641A      DEF V32673   VTOFREQ
7153  42000   5656R      JSM P487   VTOTUNE
7154  42000   5252R      JSM P460   YIGSLEW
7155   2000   3166R      LDA =D1023
7156  70540              PWC A
7157   2000   1704R      LDA =D6
7160  42000   6704R      JSM P537   CPILOT
7161   6000   1375R      LDB =D-9   F
7162  42000     63X      JSX MIN2P
7163  42000     36X      JSX .SAR2
7164   1603  77603A      LDA V32643   PLOCK
7165 170604              SAL 5
7166 172004              SAP A549
7167  42000     37X      JSX .LDB1
7170          5246R      DEF =F20000000
7171  66000   7174R      JMP A550
7172                   A549 EQU *
7172  42000     37X      JSX .LDB1
7173          7250R      DEF =F25000000
7174                   A550 EQU *
7174  42000    130X      JSX ADD2T
7175  42000    151X      JSX DIV2
7176          7237R      DEF =F1700000
7177  42000     50X      JSX CNV24
7200  42000   2132R      JSM P265   LIMIT
7201  31613  77613A      STA V32651   DAC4
7202   6000   1463R      LDB =D0
7203  42000    112X      JSX .WS7
7204  42000   2154R      JSM P269   WSPIN
7205  42000   5252R      JSM P460   YIGSLEW
7206   1603  77603A      LDA V32643   PLOCK
7207  52000   6371R      AND =B167777
7210  31603  77603A      STA V32643   PLOCK
7211  42000     53X      JSX .LDSI
7212          1463R      DEF =D0
7213  42000     34X      JSX .SIRD
7214         77635A      DEF V32669   CFREST
7215  42000   6723R      JSM P538   CSBLK
7216  42000   6160R      JSM P502   EOS
7217  66000     31X      JMX .RTNA
7220 1739100000
7224  27777
7225 110000
7226  42000
7227 31100000
7233 26100000
7237 1700000
7243 177764
7244 2250000
7250 25000000
                         LIT
7220                   P551  EQU * LOGSIX
7254
7254   6000   1363R      LDB =D-4
7255  42000     32X      JSX .ARGL
7256  44016     16A      ISZ C
7257  42000     52X      JSX .DEGL
7260 172005              SAP A552
7261   2000   1463R      LDA =D0
7262   6000   2107R      LDB =D3 LOGSIX
7263  42000     67X      JSX .STAP
7264  66000   7326R      JMP A553
7265                   A552 EQU *
7265   4020     20A      LDB AR2
7266  77202              SLB *+2,C
7267  34020     20A      STB AR2
7270  71500              NRM
7271  35573  77573A      STB V32635   I
```

```
7272    6000   2204R     LDB =D10
7273   42000     47X     JSX .DRGT
7274    6000   1375R     LDB =D-9   L
7275   42000     43X     JSX .STBP
7276    1573  77573A     LDA V32635   I
7277  170040             ICA
7300   22000   2565R     ADA =D11
7301    6000   1704R     LDB =D6
7302   75617             MPY
7303   22000   1457R     ADA =D1
7304    6000   2107R     LDB =D3 LOGSIX
7305   42000     67X     JSX .STAP
7306    2000   1457R     LDA =D1
7307                    A555 EQU *
7307   31573  77573A     STA V32635   I
7310   42000     60X     JSX .ARAY
7311             552R     DEF V189   LGTB
7312   42000     61X     JSX .LDSA
7313    6000   1375R     LDB =D-9   L
7314   42000    160X     JSX SUB2P
7315    4020     20A     LDB AR2
7316   77010             SLB A554
7317    6000   1457R     LDB =D1
7320   25763  77763A     ADB E
7321  144001      1A     ISZ B,I
7322                     NOP
7323    2000   1457R     LDA =D1
7324   21573  77573A     ADA V32635   I
7325   66000   7307R     JMP A555
7326                    A554 EQU *
7326                    A553 EQU *
7326   66000     70X     JMX .RTNI
7327                    P556  EQU * LOG2
7327    6000   1363R     LDB =D-4
7330   42000     32X     JSX .ARGL
7331   44016     16A     ISZ C
7332   42000   7254R     JSM P551   LOGSIX
7333   22000   1457R     ADA =D1
7334  170400             AAR 1
7335   66000     31X     JMX .RTNA
7336                    P557  EQU * LOG3
7336    6000   1363R     LDB =D-4
7337   42000     32X     JSX .ARGL
7340   44016     16A     ISZ C
7341   42000   7254R     JSM P551   LOGSIX
7342   42000    113X     JSX DIV4
7343            2107R     DEF =D3
7344   66000     31X     JMX .RTNA
7345                    P558  EQU * SCANT
7345    6000   1363R     LDB =D-4
7346   42000     32X     JSX .ARGL
7347   66000   7413R     JMP A559
7350                    T560 EQU *
7350                    K561   OCT 174077   174077
7351                    K562   OCT 170057   170057
7352                    K563   OCT 164067   164067
7353                    K564   OCT 160047   160047
7354                    K565   OCT 150073   150073
7355                    K566   OCT 144053   144053
7356                    K567   OCT 140075   140075
7357                    K568   OCT 130055   130055
7360                    K569   OCT 124065   124065
7361                    K570   OCT 120045   120045
7362                    K571   OCT 110071   110071
7363                    K572   OCT 104051   104051
7364                    K573   OCT 100076   100076
7365                    K574   OCT 56   56
7366                    K575   OCT 66   66
7367                    K576   OCT 46   46
7370                    K577   OCT 72   72
7371                    K578   OCT 52   52
7372                    K579   OCT 74   74
7373                    K580   OCT 54   54
7374                    K581   OCT 64   64
7375                    K582   OCT 44   44
7376                       OCT 70   70
7377                       OCT 50   50
7400                    K583   OCT 34   34
7401                    K584   OCT 14   14
7402                    K160   OCT 24   24
7403                       DEC 4 4
7404                    K186   OCT 30   30
7405                    K183   OCT 10   10
7406                    K185   OCT 20   20
7407                       DEC 0 0
7410            7350R   V585 DEF T560  SCANTAB
7411                       OCT 177777   177777
7412                       OCT 40   40
7413                    A559  EQU *
7413   42000     37X     JSX .LDBI
7414          77671A     DEF V9  SPAN
7415   42000     52X     JSX .DEQL
7416  172413             SAM A586
```

```
7417  42000     37X      JSX .LDB1
7420          7555R      DEF =F20000
7421   6000   1375R      LDB =D-9  ST
7422  42000     63X      JSX MIN2P
7423   4020     20A      LDB AR2
7424  77005             SLB A586
7425  42000     37X      JSX .LDB1
7426          7555R      DEF =F20000
7427   6000   1375R      LDB =D-9  ST
7430  42000     43X      JSX .STBP
7431                    A586 EQU *
7431   1604  77604A      LDA V32644  SATN
7432  70540              PWC A
7433   1606  77606A      LDA V32646  SRCEID
7434  73006             SLA A587
7435  62000   1770R      IOR =B20000
7436  31606  77606A      STA V32646  SRCEID
7437   2000   3654R      LDA =B20
7440   6000   2411R      LDB =D4
7441  42000    112X      JSX .WS7
7442                    A587 EQU *
7442   6000   1375R      LDB =D-9  ST
7443  42000     66X      JSX .LDBP
7444  42000    140X      JSX MIN2
7445          7561R      DEF =F15000
7446   4020     20A      LDB AR2
7447  77402              RLB *+2
7450  66000   7572R      JMP A588
7451   1732  77732A      LDA V19 STIM
7452  70540              PWC A
7453   2000   2205R      LDA =D32
7454  70540              PWC A
7455   6000   1375R      LDB =D-9  ST
7456  42000     66X      JSX .LDBP
7457  42000   7254R      JSM P551  LOGSIX
7460  22000   2647R      ADA =D-24
7461  42000   2132R      JSM P265  LIMIT
7462  31731  77731A      STA V18 SINDEX
7463  42000     60X      JSX .ARAY
7464          7410R      DEF V585  SCANTAB
7465  31732  77732A      STA V19 STIM
7466  70760              WWC A
7467  31573  77573A      STA V32635  I
7470  11732  77732A      CPA V19 STIM
7471  66000   7473R      JMP A589
7472  42000   2762R      JSM P314  AVGRST
7473                    A589 EQU *
7473   1731  77731A      LDA V18 SINDEX
7474 170040              TCA
7475  22000   2405R      ADA =D5
7476 170505              SAR 6
7477  42000    104X      JSX .TURN
7500          1300R      DEF =B1000
7501         77702A      DEF V24 VIDCON
7502  31702  77702A      STA V24 VIDCON
7503   1731  77731A      LDA V18 SINDEX
7504 170040              TCA
7505  22000   7565R      ADA =D18
7506  70540              PWC A
7507   1605  77605A      LDA V32645  SCANSL
7510  42000    111X      JSX .EQL
7511  42000    136X      JSX .ORI
7512  42000    104X      JSX .TURN
7513          5517R      DEF =B100000
7514         77604A      DEF V32644  SATN
7515  31604  77604A      STA V32644  SATN
7516   1733  77733A      LDA V20 FSTIM
7517 172402              SAM *+2
7520  66000   7554R      JMP A590
7521   1676  77676A      LDA V16 TLEDS
7522  52000   7566R      AND =B617
7523  72431             SZA A590
7524   1702  77702A      LDA V24 VIDCON
7525  52000   7567R      AND =B173777
7526  31702  77702A      STA V24 VIDCON
7527   2000   1463R      LDA =D0
7530   6000   2203R      LDB =D8
7531  42000     75X      JSX .WS4
7532   5676  77676A      LDB V16 TLEDS
7533 174614              SBL 13
7534   2000   3113R      LDA =B2060
7535 176402             SBM A591
7536   2000   7570R      LDA =B2020
7537                    A591 EQU *
7537  42000     73X      JSX .W6
7540   2000   6703R      LDA =D1024
7541  42000    103X      JSX .W4
7542   5676  77676A      LDB V16 TLEDS
7543 174611              SBL 10
7544   2000   3113R      LDA =B2060
7545 176402             SBM A592
7546   2000   7571R      LDA =B2030
7547                    A592 EQU *
```

```
3833   7547   42000     73X      JSX .W6
3834   7550    2000   1463R      LDA =D0
3835   7551   31733  77733A      STA V20 FSTIM
3836   7552   42000  10747R      JSM P219  MKRDEL
3837   7553   42000  15224R      JSM P221  TRIGR
3838   7554                     A590 EQU *
3839   7554   66000   7641R      JMP A593
       7555   20000
       7561   15000
       7565      22
       7566     617
       7567  173777
       7570    2020
       7571    2030
3840   7555                       LIT
3841   7572                     A588 EQU *
3842   7572    1702  77702A      LDA V24 VIDCON
3843   7573   52000   7666R      AND =B172777
3844   7574   62000   2277R      IOR =B4000
3845   7575   31702  77702A      STA V24 VIDCON
3846   7576    2000   1463R      LDA =D0
3847   7577    6000   2203R      LDB =D8
3848   7600   42000     75X      JSX .WS4
3849   7601    2000   3113R      LDA =B2060
3850   7602   42000     73X      JSX .W6
3851   7603    2000   6703R      LDA =D1024
3852   7604   42000    103X      JSX .W4
3853   7605    2000   3113R      LDA =B2060
3854   7606   42000     73X      JSX .W6
3855   7607    2000   6352R      LDA =D3072
3856   7610   42000    103X      JSX .W4
3857   7611    2000   3110R      LDA =B2024
3858   7612   42000     73X      JSX .W6
3859   7613    2000   7667R      LDA =B157
3860   7614   42000  15546R      JSM P214  KEY
3861   7615    2000   1456R      LDA =D12
3862   7616   70540              PWC A
3863   7617    6000   1375R      LDB =D-9  SI
3864   7620   42000     66X      JSX .LDBP
3865   7621   42000   7327R      JSM P556  LOG2
3866   7622   22000   1277R      ADA =D-1
3867   7623   42000   2132R      JSM P265  LIMIT
3868   7624   22000   1457R      ADA =D1
3869   7625   31731  77731A      STA V18 SINDEX
3870   7626   42000     60X      JSX .ARAY
3871   7627           7410R      DEF V585  SCANTAB
3872   7630   31733  77733A      STA V20 FSTIM
3873   7631    2000   1463R      LDA =D0
3874   7632   31732  77732A      STA V19 STIM
3875   7633   42000  10747R      JSM P219  MKRDEL
3876   7634    1604  77604A      LDA V32644  SATN
3877   7635   52000   6514R      AND =B77777
3878   7636   31604  77604A      STA V32644  SATN
3879   7637    2000   7670R      LDA =B164
3880   7640   42000  15546R      JSM P214  KEY
3881   7641                     A593 EQU *
3882   7641    1604  77604A      LDA V32644  SATN
3883   7642    6000   1457R      LDB =D1
3884   7643   42000     75X      JSX .WS4
3885   7644    1732  77732A      LDA V19 STIM
3886   7645   42000    105X      JSX .W5
3887   7646   70760              WWC A
3888   7647   31573  77573A      STA V32635  I
3889   7650   42000    120X      JSX .TEST
3890   7651           5517R      DEF =B100000
3891   7652          77604A      DEF V32644  SATN
3892   7653   72005              RZA A594
3893   7654   42000   6160R      JSM P502  EOS
3894   7655    2000   2107R      LDA =D3
3895   7656    6000   2107R      LDB =D3
3896   7657   42000     75X      JSX .WS4
3897   7660                     A594 EQU *
3898   7660    1733  77733A      LDA V20 FSTIM
3899   7661    6000   1456R      LDB =D12
3900   7662   42000    112X      JSX .WS7
3901   7663    2000   2107R      LDA =D3
3902   7664   42000   2314R      JSM P279  SBLK
3903   7665   66000     31X      JMX .RTNA
       7666  172777
       7667     157
       7670     164
3904   7666                       LIT
3905   7671                     P595   EQU * YIGSHFT
3906   7671    1603  77603A      LDA V32643  PLUCK
3907   7672   31573  77573A      STA V32635  I
3908   7673   42000   5764R      JSM P495  FRQC
3909   7674   42000    150X      JSX ADD2
3910   7675          77665A      DEF V8  CFREQ
3911   7676   42000   6641R      JSM P532  LOSHFT
3912   7677    1603  77603A      LDA V32643  PLUCK
3913   7700   42000    120X      JSX .TEST
3914   7701           6703R      DEF =B2000
3915   7702          77573A      DEF V32635  I
3916   7703   72025              RZA A596
3917   7704    1616  77616A      LDA V32654  XFLAG
```

```
7705  52000   7731R    AND =B177737
7706  31616  77616A    STA V32654   XFLAG
7707   5573  77573A    LDB V32635   I
7710 174604            SBL 5
7711   2000   2107R    LDA =D3
7712 176402           SBM A597
7713   2000   1301R    LDA =B177775
7714                  A597 EQU *
7714  21613  77613A    ADA V32651   DAC4
7715  31613  77613A    STA V32651   DAC4
7716   1603  77603A    LDA V32643   PLOCK
7717   6000   1457R    LDB =D1
7720  42000     72X    JSX .WS6
7721   1613  77613A    LDA V32651   DAC4
7722   6000   1463R    LDB =D0
7723  42000    112X    JSX .WS7
7724  42000   3221R    JSM P333   CORREK
7725 172003           SAP A598
7726   1700  77700A    LDA V22 RLVL
7727  42000   3530R    JSM P355   REFLEV
7730                  A598 EQU *
7730                  A596 EQU *
7730 170201            RET 1
7731 177737
                       LIT
7731                  P599  EQU * FPNLON
7732                  
7732   1565  77565A    LDA V32629   SRQEN
7733   6000   2276R    LDB =D2
7734  42000    107X    JSX .WS5
7735 172404           SAM A600
7736   2000   2107R    LDA =D3
7737   6000   2107R    LDB =D3
7740  42000     75X    JSX .WS4
7741                  A600 EQU *
7741   1565  77565A    LDA V32629   SRQEN
7742  42000    104X    JSX .TURN
7743          5517R    DEF =B100000
7744         77675A    DEF V15 BLEDS
7745  31675  77675A    STA V15 BLEDS
7746 170140            CMA
7747   6000   2276R    LDB =D2
7750  42000     75X    JSX .WS4
7751   1601  77601A    LDA V32641   HPBC
7752 172005           SAP A601
7753   1602  77602A    LDA V32642   LKMSK
7754   6000   2107R    LDB =D3
7755  42000    107X    JSX .WS5
7756  42000     15X    JSM P204   HBUSY
7757                  A601 EQU *
7757   1601  77601A    LDA V32641   HPBC
7760 170601            SAL 2
7761 172007           SAP A602
7762   1676  77676A    LDA V16 TLEDS
7763 170501            SAR 2
7764  52000   2410R    AND =B200
7765  61601  77601A    IOR V32641   HPBC
7766   6000   2411R    LDB =D4
7767  42000    112X    JSX .WS7
7770                  A602 EQU *
7770   1601  77601A    LDA V32641   HPBC
7771  52000   7774R    AND =B57777
7772  31601  77601A    STA V32641   HPBC
7773 170201            RET 1
7774  57777
                       LIT
7774                  P603  EQU * CSCANBW
7775
7775   1675  77675A    LDA V15 BLEDS
7776 170610            SAL 9
7777 172426           SAM A604
10000  1605  77605A    LDA V32645   SCANSL
10001 72424           SZA A604
10002  2000   2565R    LDA =D11
10003 70540            PWC A
10004  1605  77605A    LDA V32645   SCANSL
10005 52000   1704R    AND =D6
10006  4000            LDB A
10007  2000   2565R    LDA =D11
10010 76402           SZB A605
10011  2000   2172R    LDA =D13
10012                 A605 EQU *
10012 70540            PWC A
10013 42000     37X    JSX .LDB1
10014        77671A    DEF V9   SPAN
10015 42000   7254R    JSM P551   LOGSIX
10016 42000    116X    JSX SUB4F
10017 42000    113X    JSX DIV4
10020         2107R    DEF =D3
10021 22000   2110R    ADA =D-2
10022 42000   2132R    JSM P265   LIMIT
10023 22000   2276R    ADA =D2
10024 42000   4210R    JSM P392   IFBWOUT
10025                 A604 EQU *
```

```
10025  42000   2070R     JSM P261  IFBW
10026  31473  77473A     STA V41 KK
10027   1675  77675A     LDA V15 BLEDS
10030 170607             SAL 8
10031 172407            SAM A606
10032   1473  77473A     LDA V41 KK
10033  22000   2110R     ADA =D-2
10034 170502             SAR 3
10035 170040             TCA
10036  21473  77473A     ADA V41 KK
10037  42000   4314R     JSM P400  VBWOUT
10040                  A606 EQU *
10040  42000   2111R     JSM P263  VBW
10041  31476  77476A     STA V44 KN
10042   1605  77605A     LDA V32645  SCANSL
10043  72002             RZA *+2
10044  66000  10274R     JMP A607
10045   1473  77473A     LDA V41 KK
10046 170040             TCA
10047  21476  77476A     ADA V44 KN
10050 172006            SAP A608
10051   1473  77473A     LDA V41 KK
10052  21476  77476A     ADA V44 KN
10053   6000   2107R     LDB =D3
10054  75617             MPY
10055  66000  10061R     JMP A609
10056                  A608 EQU *
10056   2000   1704R     LDA =D6
10057   5473  77473A     LDB V41 KK
10060  75617             MPY
10061                  A609 EQU *
10061  70540             PWC A
10062  42000     37X     JSX .LDBI
10063         77671A     DEF V9  SPAN
10064  42000   7254R     JSM P551  LOGSIX
10065  22000  10141R     ADA =D38
10066  42000    116X     JSX SUB4T
10067  70540             PWC A
10070   1616  77616A     LDA V32654  XFLAG
10071 170605             SAL 6
10072 170416             AAR 15
10073 170601             SAL 2
10074  42000     57X     JSX ADD4T
10075  31656  77656A     STA V34 BCDA
10076  42000     53X     JSX .LDSI
10077          1770R     DEF =H2000
10100  42000    140X     JSX MIN2
10101         77671A     DEF V9  SPAN
10102   4020     20A     LDB AR2
10103  77402             RLB *+2
10104  66000  10145R     JMP A610
10105   2000   2107R     LDA =D3
10106   5473  77473A     LDB V41 KK
10107  75617             MPY
10110  70540             PWC A
10111  42000     37X     JSX .LDBI
10112         77671A     DEF V9  SPAN
10113  42000   7254R     JSM P551  LOGSIX
10114  22000  10142R     ADA =D31
10115  42000    116X     JSX SUB4T
10116  70540             PWC A
10117   1616  77616A     LDA V32654  XFLAG
10120 170605             SAL 6
10121 170416             AAR 15
10122 170601             SAL 2
10123  42000     57X     JSX ADD4T
10124  31657  77657A     STA V35 BCDB
10125   1473  77473A     LDA V41 KK
10126  22000   1363R     ADA =D-4
10127 172011            SAP A611
10130   1657  77657A     LDA V35 BCDB
10131  22000  10143R     ADA =D-43
10132 172006            SAP A611
10133   1616  77616A     LDA V32654  XFLAG
10134 170605             SAL 6
10135 172403            SAM A611
10136   2000  10144R     LDA =D43
10137  31657  77657A     STA V35 BCDB
10140                  A611 EQU *
10140  66000  10161R     JMP A612
10141     46
10142     37
10143 177725
10144     53
10141                   LIT
10145                  A610 EQU *
10145   2000   2107R     LDA =D3
10146   5473  77473A     LDB V41 KK
10147  75617             MPY
10150 170040             TCA
10151  22000  10237R     ADA =D52
10152  70540             PWC A
10153   1616  77616A     LDA V32654  XFLAG
```

```
10154 170605           SAL 6
10155 170416           AAR 15
10156 170601           SAL 2
10157  42000     57X   JSX ADD4T
10160  31657  77657A   STA V35 BCDB
10161                 A612 EQU *
10161   1657  77657A   LDA V35 BCDB
10162 170040           TCA
10163  21656  77656A   ADA V34 BCDA
10164 172003          SAP A613
10165   1657  77657A   LDA V35 BCDB
10166  31656  77656A   STA V34 BCDA
10167                 A613 EQU *
10167   2000   2107R   LDA =D3
10170   5476  77476A   LDB V44 KN
10171  75617           MPY
10172 170040           TCA
10173  22000  10240R   ADA =D47
10174  70540           PWC A
10175   1616  77616A   LDA V32654  XFLAG
10176 170605           SAL 6
10177 170416           AAR 15
10200 170601           SAL 2
10201  42000     57X   JSX ADD4T
10202  31657  77657A   STA V35 BCDB
10203 170040           TCA
10204  21656  77656A   ADA V34 BCDA
10205 172003          SAP A614
10206   1657  77657A   LDA V35 BCDB
10207  31656  77656A   STA V34 BCDA
10210                 A614 EQU *
10210   1675  77675A   LDA V15 BLEDS
10211 170601           SAL 2
10212 172006          SAP A615
10213   1656  77656A   LDA V34 BCDA
10214  22000  10241R   ADA =D-29
10215 172003          SAP A615
10216   2000   2416R   LDA =D29
10217  31656  77656A   STA V34 BCDA
10220                 A615 EQU *
10220   1656  77656A   LDA V34 BCDA
10221  22000  10242R   ADA =D-27
10222 172003          SAP A616
10223   2000  10243R   LDA =D27
10224  31656  77656A   STA V34 BCDA
10225                 A616 EQU *
10225   1656  77656A   LDA V34 BCDA
10226 170040           TCA
10227  22000  10244R   ADA =D56
10230 172015          SAP A617
10231   2000  10244R   LDA =D56
10232  31656  77656A   STA V34 BCDA
10233   1426  77426A   LDA V32534  UFLAG
10234  62000   5517R   IOR =B100000
10235  31426  77426A   STA V32534  UFLAG
10236  66000  10250R   JMP A618
10237     64
10240     57
10241 177743
10242 177745
10243     33
10244     70
10237                  LIT
10245                 A617 EQU *
10245   1426  77426A   LDA V32534  UFLAG
10246  52000   6514R   AND =B77777
10247  31426  77426A   STA V32534  UFLAG
10250                 A618 EQU *
10250   1675  77675A   LDA V15 BLEDS
10251 170606           SAL 7
10252 172411          SAM A619
10253   1656  77656A   LDA V34 BCDA
10254  22000   2647R   ADA =D-24
10255  11731  77731A   CPA V18 SINDEX
10256  66000  10262R   JMP A620
10257   1656  77656A   LDA V34 BCDA
10260  42000   4356R   JSM P403  EXPSIX
10261  42000   7345R   JSM P558  SCANT
10262                 A620 EQU *
10262  66000  10273R   JMP A621
10263                 A619 EQU *
10263   1656  77656A   LDA V34 BCDA
10264  22000   2647R   ADA =D-24
10265 170040           TCA
10266  21731  77731A   ADA V18 SINDEX
10267 172004          SAP A622
10270   1426  77426A   LDA V32534  UFLAG
10271  62000   5517R   IOR =B100000
10272  31426  77426A   STA V32534  UFLAG
10273                 A622 EQU *
10273                 A621 EQU *
10273  66000  10277R   JMP A623
10274                 A607 EQU *
```

```
10274    1426  77426A     LDA V32534  UFLAG
10275   52000   6514R     AND =B77777
10276   31426  77426A     STA V32534  UFLAG
10277                    A623 EQU *
10277   42000   2650R     JSM P304  UNCAL
10300  170201             RET 1
10301                    P624  EQU * MKRACT
10301    1616  77616A     LDA V32654  XFLAG
10302  170602             SAL 3
10303  172006             SAP A625
10304    1576  77576A     LDA V32638  RPGPTR
10305   12000   7565R     CPA =D18
10306   66000  10310R     JMP *+2
10307   66000  10311R     JMP A625
10310   42000  12334R     JSM P217  MBLK
10311                    A625 EQU *
10311  170201             RET 1
10312                    P218  EQU * MKREL
10312  174517             CLB
10313   42000     56X     JSX .ARGS
10314   44016     16A     ISZ C
10315    1723  77723A     LDA V26 MKRMODE
10316   42000    121X     JSX MOD4
10317            2107R    DEF =D3
10320   22000   1277R     ADA =D-1
10321   42000    111X     JSX .EQL
10322   66000     31X     JMX .RTNA
10323                    P626  EQU * MKRROK
10323  174517             CLB
10324   42000     56X     JSX .ARGS
10325   44016     16A     ISZ C
10326    1676  77676A     LDA V16 TLEDS
10327   52000   2477R     AND =B44
10330   22000  10335R     ADA =B177734
10331   42000    111X     JSX .EQL
10332   61733  77733A     IOR V20 FSTIM
10333  170140             CMA
10334   66000     31X     JMX .RTNA
10335  177734
10335                     LIT
10336                    P627  EQU * MKRAD
10336   42000  10323R     JSM P626  MKRROK
10337  172022             SAP A628
10340    1702  77702A     LDA V24 VIDCON
10341  170603             SAL 4
10342  172004             SAP A631
10343    1676  77676A     LDA V16 TLEDS
10344  170615             SAL 14
10345  172404             SAM A630
10346                    A631 EQU *
10346    1676  77676A     LDA V16 TLEDS
10347   52000  10360R     AND =B201
10350   72403             SZA A629
10351                    A630 EQU *
10351    1721  77721A     LDA V25 MRKR
10352   66000  10355R     JMP A632
10353                    A629 EQU *
10353    1721  77721A     LDA V25 MRKR
10354   22000   6703R     ADA =D1024
10355                    A632 EQU *
10355    6000   2203R     LDB =D8
10356   42000     75X     JSX .W64
10357   66000  10410R     JMP A633
10360     201
10360                     LIT
10361                    A628 EQU *
10361    1721  77721A     LDA V25 MRKR
10362   70540             PWC A
10363    1723  77723A     LDA V26 MKRMODE
10364   70540             PWC A
10365    1675  77675A     LDA V15 BLEDS
10366   70540             PWC A
10367    2000  10411R     LDA =B114
10370   42000  15546R     JSM P214  KEY
10371   70760             WWC A
10372   31675  77675A     STA V15 BLEDS
10373   70760             WWC A
10374   31723  77723A     STA V26 MKRMODE
10375   70760             WWC A
10376   31721  77721A     STA V25 MRKR
10377    1566  77566A     LDA V32630  KEYCODE
10400   12000  10412R     CPA =B113
10401   66000  10403R     JMP *+2
10402   66000  10406R     JMP A635
10403    1575  77575A     LDA V32637  K
10404   12000   2405R     CPA =D5
10405   66000  10410R     JMP A634
10406                    A635 EQU *
10406   54003      3A     DSZ V12 RPTR
10407                     NOP
10410                    A634 EQU *
10410                    A633 EQU *
```

```
10410 170201              RET 1
10411    114
10412    113
10411                    LIT
10413                    P636  EQU * MKRUN
10413   1721   77721A     LDA V25 MRKR
10414  12000    3166R     CPA =D1023
10415  66000   10417R     JMP *+2
10416  66000   10424R     JMP A637
10417   2000   10522R     LDA =D501
10420  31721   77721A     STA V25 MRKR
10421  42000     161X     JSX .MVE4
10422          77665A     DEF V8  CFREQ
10423          77645A     DEF V32677  MFREQ
10424                    A637 EQU *
10424   1675   77675A     LDA V15 BLEDS
10425 170601              SAL 2
10426 172427             SAM A638
10427   2000    2203R     LDA =D8
10430  70540              PWC A
10431   1721   77721A     LDA V25 MRKR
10432  22000   10523R     ADA =D-501
10433  42000     122X     JSX CNV42
10434  42000     153X     JSX MPY2
10435          77671A     DEF V9  SPAN
10436  42000      26X     JSM P213  ROUND
10437   6000    2107R     LDB =D3
10440  42000      47X     JSX .DRGT
10441  42000     150X     JSX ADD2
10442          77665A     DEF V8  CFREQ
10443  42000      34X     JSX .STRD
10444          77645A     DEF V32677  MFREQ
10445  42000   10312R     JSM P218  MKREL
10446 172007             SAP A639
10447  42000      37X     JSX .LDB1
10450          77724A     DEF V10 AMP
10451  42000     140X     JSX MIN2
10452          77645A     DEF V32677  MFREQ
10453  42000      34X     JSX .STRD
10454          77645A     DEF V32677  MFREQ
10455                    A639 EQU *
10455                    A638 EQU *
10455  42000   10336R     JSM P627  MKRAD
10456   1675   77675A     LDA V15 BLEDS
10457 170613              SAL 12
10460 172402              SAM *+2
10461  66000   10525R     JMP A640
10462   1721   77721A     LDA V25 MRKR
10463  70540              PWC A
10464   2000   10524R     LDA =D968
10465  70540              PWC A
10466   1721   77721A     LDA V25 MRKR
10467  22000    2067R     ADA =D-17
10470  42000    2132R     JSM P265  LIMIT
10471  22000    1457R     ADA =D1
10472  31721   77721A     STA V25 MRKR
10473   2000    1463R     LDA =D0
10474  31722   77722A     STA V29 MKRLVL
10475  42000   10336R     JSM P627  MKRAD
10476   2000    2205R     LDA =D32
10477  70540              PWC A
10500                    A641 EQU *
10500  42000     162X     JSX .R5
10501  31473   77473A     STA V41 KK
10502 170604              SAL 5
10503 170404              AAR 5
10504  21722   77722A     ADA V29 MKRLVL
10505  31722   77722A     STA V29 MKRLVL
10506 154016      16A     DSZ C,I
10507  66000   10500R     JMP A641
10510  54016      16A     DSZ C
10511   2000    3166R     LDA =D1023
10512  70540              PWC A
10513   1722   77722A     LDA V29 MKRLVL
10514 170404              AAR 5
10515  42000    2132R     JSM P265  LIMIT
10516  31722   77722A     STA V29 MKRLVL
10517  70760              WWC A
10520  31721   77721A     STA V25 MRKR
10521  66000   10532R     JMP A642
10522    765
10523 177013
10524   1710
10522                    LIT
10525                    A640 EQU *
10525  42000     162X     JSX .R5
10526  31573   77573A     STA V32635  1
10527 170604              SAL 5
10530 170404              AAR 5
10531  31722   77722A     STA V29 MKRLVL
10532                    A642 EQU *
10532   1675   77675A     LDA V15 BLEDS
10533 170611              SAL 10
```

```
10534 172011              SAP A643
10535   1705    77705A    LDA V32 THRESH
10536  52000     1363R    AND =B177774
10537 170040              TCA
10540  21722    77722A    ADA V29 MKRLVL
10541 172004              SAP A643
10542   1705    77705A    LDA V32 THRESH
10543  52000     1363R    AND =B177774
10544  31722    77722A    STA V29 MKRLVL
10545                    A643 EQU *
10545   2000    10706R    LDA =D2050
10546  42000      103X    JSX .W4
10547   2000    10707R    LDA =B2202
10550  42000       73X    JSX .W6
10551   2000     4470R    LDA =D1000
10552  70540              PWC A
10553   1721    77721A    LDA V25 MRKR
10554  22000     1363R    ADA =D-4
10555  42000     2132R    JSM P265  LIMIT
10556  42000       73X    JSX .W6
10557   2000    10710R    LDA =D1015
10560  70540              PWC A
10561   1722    77722A    LDA V29 MKRLVL
10562  22000     1363R    ADA =D-4
10563  42000     2132R    JSM P265  LIMIT
10564  22000    10711R    ADA =D2052
10565  42000       73X    JSX .W6
10566   1575    77575A    LDA V32637  K
10567  12000     2107R    CPA =D3
10570  66000    10641R    JMP A644
10571   6000     2221R    LDB =D9
10572  42000       74X    JSX .RS5
10573  31573    77573A    STA V32635  I
10574   6000     2203R    LDB =D8
10575  42000       74X    JSX .RS5
10576  31573    77573A    STA V32635  I
10577  52000     6353R    AND =B7777
10600 170040              TCA
10601  21721    77721A    ADA V25 MRKR
10602 170040              TCA
10603 172005              SAP A645
10604  42000     6127R    JSM P501  MKIS
10605 172003              SAP A645
10606   1721    77721A    LDA V25 MRKR
10607  66000    10611R    JMP A646
10610                    A645 EQU *
10610   2000     3112R    LDA =D1001
10611                    A646 EQU *
10611  70540              PWC A
10612   1730    77730A    LDA V30 KFLAG
10613 170614              SAL 13
10614 172403              SAM A647
10615   2000     1463R    LDA =D0
10616  66000    10620R    JMP A648
10617                    A647 EQU *
10617   2000     6352R    LDA =D3072
10620                    A648 EQU *
10620  42000       57X    JSX ADD4I
10621   6000     2221R    LDB =D9
10622  42000       72X    JSX .WS6
10623   2000     2521R    LDA =D17
10624  42000     2422R    JSM P284  BLKAD
10625  42000      162X    JSX .R5
10626  31573    77573A    STA V32635  I
10627  52000     3166R    AND =B1777
10630  12000     2421R    CPA =D146
10631  66000    10633R    JMP *+2
10632  66000    10641R    JMP A649
10633   1723    77723A    LDA V26 MKRMODE
10634  42000     2223R    JSM P274  NBLK
10635   2000     2421R    LDA =D146
10636  42000       73X    JSX .W6
10637   2000     2521R    LDA =D17
10640  42000     2223R    JSM P274  NBLK
10641                    A649 EQU *
10641                    A644 EQU *
10641   1675    77675A    LDA V15 BLEDS
10642 170601              SAL 2
10643 172416              SAM A650
10644   1723    77723A    LDA V26 MKRMODE
10645  42000     2422R    JSM P284  BLKAD
10646   1435    77435A    LDA V32541  IF1
10647  52000     4207R    AND =B160000
10650  22000     5517R    ADA =B100000
10651  72006              RZA A651
10652   1722    77722A    LDA V29 MKRLVL
10653  22000    10712R    ADA =D-100
10654 172003              SAP A651
10655   2000     2521R    LDA =B21
10656  66000    10660R    JMP A652
10657                    A651 EQU *
10657   2000     1463R    LDA =D0
```

```
10660                         A652 EQU *
10660  42000        73X         JSX .W6
10661                         A650 EQU *
10661   1675    77675A          LDA V15 BLEDS
10662 170601                    SAL 2
10663 172012                   SAP A654
10664   1426    77426A          LDA V32534  UFLAG
10665 170610                    SAL 9
10666 172405                   SAM A655
10667   1575    77575A          LDA V32637  K
10670  12000     2276R          CPA =D2
10671  66000    10673R          JMP *+2
10672  66000    10675R          JMP A654
10673                         A655 EQU *
10673   1605    77605A          LDA V32645  SCANSL
10674  72005                    RZA A653
10675                         A654 EQU *
10675   2000     7570R          LDA =D1040
10676  70540                    PWC A
10677   1723    77723A          LDA V26 MKRMODE
10700  42000     2522R          JSM P297  RJUST
10701                         A653 EQU *
10701   2000     6703R          LDA =D1024
10702  70540                    PWC A
10703   2000     2521R          LDA =D17
10704  42000     2522R          JSM P297  RJUST
10705 170201                    RET 1
10706   4002
10707   2202
10710   1767
10711   4004
10712 177634
                                LIT
10706                         P656  EQU * GRAT
10713                         
10713   6000     2110R          LDB =D-2
10714  42000       27X          JSX .ARGA
10715   6000     2153R          LDB =D-5  N
10716  42000       30X          JSX .LDAP
10717 170040                    TCA
10720   6000     1301R          LDB =D-3  M
10721  42000      115X          JSX ADD4P
10722  22000     1277R          ADA =B177777
10723  70540                    PWC A
10724   6000     1301R          LDB =D-3  M
10725  42000       30X          JSX .LDAP
10726                         A657 EQU *
10726  31573    77573A          STA V32635  I
10727  42000       60X          JSX .ARAY
10730              540R         DEF V181  GRATCL
10731  31572    77572A          STA V32634  J
10732 172005                   SAP A658
10733 170040                    TCA
10734   6000     2203R          LDB =D8
10735  42000       75X          JSX .WS4
10736  66000    10741R          JMP A659
10737                         A658 EQU *
10737   6000     2203R          LDB =D8
10740  42000       72X          JSX .WS6
10741                         A659 EQU *
10741   2000     1457R          LDA =D1
10742  21573    77573A          ADA V32635  I
10743 144016       16A          ISZ C,I
10744  66000    10726R          JMP A657
10745  54016       16A          DSZ C
10746  66000       31X          JMX .RTNA
10747                         P219  EQU * MKRDEL
10747   1723    77723A          LDA V26 MKRMODE
10750  72002                    RZA *+2
10751  66000    11007R          JMP A660
10752  42000    10413R          JSM P636  MKRON
10753  42000    10301R          JSM P624  MKRACT
10754  42000    10312R          JSM P218  MKREL
10755 172026                   SAP A661
10756  42000    10323R          JSM P626  MKROK
10757 172024                   SAP A661
10760   2000     5015R          LDA =D2055
10761   6000     2203R          LDB =D8
10762  42000       75X          JSX .WS4
10763   2000    10707R          LDA =B2202
10764  42000       73X          JSX .W6
10765   2000     4470R          LDA =D1000
10766  70540                    PWC A
10767   1717    77717A          LDA V28 AMKR
10770  22000     1363R          ADA =D-4
10771  42000     2132R          JSM P265  LIMIT
10772  42000       73X          JSX .W6
10773   2000    10710R          LDA =D1015
10774  70540                    PWC A
10775   1720    77720A          LDA V27 AMLVL
10776  22000     1363R          ADA =D-4
10777  42000     2132R          JSM P265  LIMIT
11000  22000    10711R          ADA =D2052
```

```
11001  42000     73X   JSX .W6
11002  66000  11007R   JMP A662
11003                 A661 EQU *
11003   2000   2221R   LDA =D9
11004  70540           PWC A
11005   2000   2406R   LDA =D7
11006  42000  10713R   JSM P656  GRAT
11007                 A662 EQU *
11007                 A660 EQU *
11007 170201           RET 1
11010                 P663  EQU * STMRKR
11010   6000   1277R   LDB =D-1
11011  42000     27X   JSX .ARGA
11012   2000   4470R   LDA =D1000
11013  70540           PWC A
11014   6000   1301R   LDB =D-3  X
11015  42000     30X   JSX .LDAP
11016  22000   1277R   ADA =D-1
11017  42000   2132R   JSM P265  LIMIT
11020  22000   1457R   ADA =D1
11021  31721  77721A   STA V25 MRKR
11022   1616  77616A   LDA V32654  XFLAG
11023  52000   1704R   AND =D6
11024  22000   1363R   ADA =B177774
11025  72011          RZA A664
11026   1616  77616A   LDA V32654  XFLAG
11027  52000   2153R   AND =B177773
11030  31616  77616A   STA V32654  XFLAG
11031 170612          SAL 11
11032 172004          SAP A665
11033  42000     37X   JSX .LDBI
11034         77665A   DEF V8  CFREQ
11035  42000   6016R   JSM P500  STUNE
11036                 A665 EQU *
11036                 A664 EQU *
11036   1426  77426A   LDA V32534  UFLAG
11037  62000   1364R   IOR =B100
11040  31426  77426A   STA V32534  UFLAG
11041  42000  10413R   JSM P636  MKRON
11042  42000   2650R   JSM P304  UNCAL
11043  66000     31X   JMX .RTNA
11044                 P666  EQU * WTHRSH
11044   6000   1277R   LDB =D-1
11045  42000     27X   JSX .ARGA
11046   2000   4470R   LDA =D1000
11047  70540           PWC A
11050   6000   1301R   LDB =D-3  T
11051  42000     30X   JSX .LDAP
11052  42000   2132R   JSM P265  LIMIT
11053  31705  77705A   STA V32 THRESH
11054   2000  11067R   LDA =D2169
11055   6000   2203R   LDB =D8
11056  42000     75X   JSX .WS4
11057   1705  77705A   LDA V32 THRESH
11060 170501           SAR 2
11061  52000  11070R   AND =B170777
11062  62000  11071R   IOR =B3000
11063  42000     73X   JSX .W6
11064   2000   2131R   LDA =D15
11065  42000   2314R   JSM P279  SBLK
11066  66000     31X   JMX .RTNA
11067   4171
11070 170777
11071   3000
11067                  LIT
11072                 P667  EQU * WLVLN
11072   6000   1277R   LDB =D-1
11073  42000     27X   JSX .ARGA
11074   2000   4470R   LDA =D1000
11075  70540           PWC A
11076   6000   1301R   LDB =D-3  L
11077  42000     30X   JSX .LDAP
11100  42000   2132R   JSM P265  LIMIT
11101  31704  77704A   STA V33 LEVLIN
11102   2000  11117R   LDA =D2060
11103   6000   2203R   LDB =D8
11104  42000     75X   JSX .WS4
11105   2000  10707R   LDA =B2202
11106  42000     73X   JSX .W6
11107   2000   1463R   LDA =D0
11110  42000     73X   JSX .W6
11111   1704  77704A   LDA V33 LEVLIN
11112  62000   2277R   IOR =D2048
11113  42000     73X   JSX .W6
11114   2000   3527R   LDA =D14
11115  42000   2314R   JSM P279  SBLK
11116  66000     31X   JMX .RTNA
11117   4014
11117                  LIT
11120                 P668  EQU * SPANW
11120   6000   1363R   LDB =D-4
11121  42000     32X   JSX .ARGL
```

```
11122  66000   11200R    JMP A669
11123                    T670 EQU *
11123                    D671  OCT 0,0,20,0  100000
11127                    D672  OCT 0,0,400,0 1000000
11133                    D673  OCT 0,0,20000,0 20000000
11137                    D674  OCT 0,27,0,0  1700000000
11143          11123R    V675 DEF T670 SPANLIMIT
11144                      OCT 177777  177777
11145                      OCT 20  20
11146                    T676 EQU *
11146                    D677  OCT 0,20106,0,0 2.046@-1
11152                    D678  OCT 0,10043,0,0 1.023@-1
11156                    D679  OCT 177600,50425,0,0  5.115@-3
11162                    D680  OCT 177400,60027,62160,54400  6.0176470590-5
11166          11146R    V681 DEF T676 SWPSENS
11167                      OCT 177777  177777
11170                      OCT 20  20
11171                    T682 EQU *
11171                    N683  DEC 1 1
11172                      DEC 1 1
11173                    N684  DEC 2 2
11174                      DEC 4 4
11175          11171R    V685 DEF T682 SCANITEM
11176                      OCT 177777  177777
11177                    K148  OCT 4 4
11200                    A669  EQU *
11200   1605   77605A      LDA V32645  SCANSL
11201  70540               PWC A
11202  42000      34X      JSX .STRD
11203          77671A      DEF V9  SPAN
11204   1606   77606A      LDA V32646  SRCEID
11205  73006              SLA A686
11206  62000    4534R      IOR =B40000
11207  31606   77606A      STA V32646  SRCEID
11210   2000    3654R      LDA =B20
11211   6000    2411R      LDB =D4
11212  42000     112X      JSX .WS7
11213                    A686 EQU *
11213  71500               NRM
11214  35600   77600A      STB V32640  CTIM
11215   6000    1463R      LDB =D0
11216  42000     132X      JSX .FDIG
11217  22000    2417R      ADA =D-6
11220 172003              SAP A687
11221  45600   77600A      ISZ V32640  CTIM
11222                      NOP
11223                    A687 EQU *
11223  42000      37X      JSX .LDBI
11224          77671A      DEF V9  SPAN
11225  42000     127X      JSX MIN3
11226           1457R      DEF =D1
11227   4020      20A      LDB AR2
11230  77414              RLB A688
11231   1604   77604A      LDA V32644  SATN
11232  31573   77573A      STA V32635  I
11233   2000    4207R      LDA =B160000
11234  31604   77604A      STA V32644  SATN
11235   2000    1463R      LDA =D0
11236  31605   77605A      STA V32645  SCANSL
11237  42000      53X      JSX .LDSI
11240           1463R      DEF =D0
11241  42000      34X      JSX .STRD
11242          77671A      DEF V9  SPAN
11243  66000   11401R      JMP A689
11244                    A688 EQU *
11244   1604   77604A      LDA V32644  SATN
11245  70540               PWC A
11246   1733   77733A      LDA V20 FSTIM
11247 172004              SAP A690
11250   1675   77675A      LDA V15 BLEDS
11251  52000   11303R      AND =B177377
11252  31675   77675A      STA V15 BLEDS
11253                    A690 EQU *
11253  42000     156X      JSX .CLBI
11254          11304R      DEF =F1699999900
11255  42000      53X      JSX .LDSI
11256          11310R      DEF =H100
11257  42000     140X      JSX MIN2
11260          77671A      DEF V9  SPAN
11261  42000    2043R      JSM P256  DLIMIT
11262  42000     163X      JSX ADD3
11263          11310R      DEF =H100
11264  42000      34X      JSX .STRD
11265          77671A      DEF V9  SPAN
11266   2000    1457R      LDA =D1
11267  31573   77573A      STA V32635  I
11270                    A691 EQU *
11270   1573   77573A      LDA V32635  I
11271  42000     133X      JSX .LRAY
11272          11143R      DEF V675  SPANLIMIT
11273  42000     134X      JSX .LDBA
11274  42000     145X      JSX SUB2
```

```
11275          77671A      DEF V9   SPAN
11276   4020      20A      LDB AR2
11277  77012              SLB A692
11300  45573   77573A      ISZ V32635  I
11301                      NOP
11302  66000   11270R      JMP A691
11303 177377
11304 1699999900
11310    400
11303                     LIT
11311                    A692 EQU *
11311   1573   77573A      LDA V32635  I
11312  42000      60X      JSX .ARAY
11313          11175R      DEF V685   SCANITEM
11314  31605   77605A      STA V32645   SCANSL
11315  42000      37X      JSX .LDBI
11316          77671A      DEF V9   SPAN
11317  42000      62X      JSX CNV21
11320  42000      36X      JSX .SAR2
11321   1573   77573A      LDA V32635  I
11322  42000     133X      JSX .LRAY
11323          11166R      DEF V681   SWPSENS
11324  42000     134X      JSX .LDBA
11325  42000      64X      JSX MPY11
11326  42000      65X      JSX CNV12
11327  42000      34X      JSX .STRD
11330          77655A      DEF V32685   LTEMP2
11331   2000    6703R      LDA =B2000
11332  31604   77604A      STA V32644   SATN
11333                    A693 EQU *
11333  42000      37X      JSX .LDBI
11334          77655A      DEF V32685   LTEMP2
11335  42000     127X      JSX MIN3
11336          11353R      DEF =H1023
11337   4020      20A      LDB AR2
11340  77014              SLB A694
11341  42000      37X      JSX .LDBI
11342          77655A      DEF V32685   LTEMP2
11343   6000    1457R      LDB =D1
11344  42000      47X      JSX .DRGT
11345  42000      34X      JSX .STRD
11346          77655A      DEF V32685   LTEMP2
11347   1604   77604A      LDA V32644   SATN
11350 170600               SAL 1
11351  31604   77604A      STA V32644   SATN
11352  66000   11333R      JMP A693
11353  10043
11353                     LIT
11354                    A694 EQU *
11354   1573   77573A      LDA V32635   I
11355  12000    1457R      CPA =D1
11356  66000   11360R      JMP *+2
11357  66000   11363R      JMP A695
11360   1604   77604A      LDA V32644   SATN
11361  62000    4534R      IOR =B40000
11362  31604   77604A      STA V32644   SATN
11363                    A695 EQU *
11363  70760               WWC A
11364  31573   77573A      STA V32635   I
11365   1731   77731A      LDA V18 SINDEX
11366 170040               TCA
11367  22000    7565R      ADA =D18
11370  42000     104X      JSX .TURN
11371           5517R      DEF =B100000
11372          77604A      DEF V32644   SATN
11373  70540               PWC A
11374  42000      37X      JSX .LDBI
11375          77655A      DEF V32685   LTEMP2
11376  42000      50X      JSX CNV24
11377  42000     136X      JSX .ORT
11400  31604   77604A      STA V32644   SATN
11401                    A689 EQU *
11401   1605   77605A      LDA V32645   SCANSL
11402  22000    2110R      ADA =D-2
11403 172005              SAP A696
11404   1603   77603A      LDA V32643   PLOCK
11405  52000   11451R      AND =B67777
11406  62000    5517R      IOR =B100000
11407  31603   77603A      STA V32643   PLOCK
11410                    A696 EQU *
11410   1604   77604A      LDA V32644   SATN
11411   6000    1457R      LDB =D1
11412  42000      75X      JSX .WS4
11413   1605   77605A      LDA V32645   SCANSL
11414  42000     106X      JSX .W7
11415   1603   77603A      LDA V32643   PLOCK
11416  42000      73X      JSX .W6
11417  70760               WWC A
11420  31572   77572A      STA V32634   J
11421   1605   77605A      LDA V32645   SCANSL
11422 170040               TCA
11423  22000    1457R      ADA =D1
11424 170412               AAR 11
11425  42000     104X      JSX .TURN
11426           3654R      DEF =D16
```

```
11427              77616A     DEF V32654  XFLAG
11430    31616     77616A     STA V32654  XFLAG
11431     1605     77605A     LDA V32645  SCANSL
11432    11572     77572A     CPA V32634  J
11433    66000     11435R     JMP *+2
11434    66000     11442R     JMP A698
11435     1573     77573A     LDA V32635  I
11436    42000       120X     JSX .TEST
11437               4534R     DEF =B40000
11440              77604A     DEF V32644  SATN
11441    72011               RZA A697
11442                       A698 EQU *
11442    42000        37X     JSX .LDB1
11443              77665A     DEF V8  CFREQ
11444    42000      6750R     JSM P222  TUNE
11445     2000      2107R     LDA =D3
11446     6000      2107R     LDB =D3
11447    42000        75X     JSX .WS4
11450    66000     11462R     JMP A699
11451    67777
11451                         LIT
11452                       A697 EQU *
11452    42000      6723R     JSM P538  CSBLK
11453     1600     77600A     LDA V32640  CTIM
11454   170040                TCA
11455    22000      2406R     ADA =D7
11456   172004               SAP A700
11457     2000      2107R     LDA =D3
11460     6000      2107R     LDB =D3
11461    42000        75X     JSX .WS4
11462                       A700 EQU *
11462                       A699 EQU *
11462    42000      7775R     JSM P603  CSCANBW
11463    66000        31X     JMX .RTNA
11464                       P701  EQU * STEPD
11464     6000      1363R     LDB =D-4
11465    42000        32X     JSX .ARGL
11466    42000        37X     JSX .LDB1
11467              77707A     DEF V11 FOFSET
11470    42000       140X     JSX MIN2
11471              77665A     DEF V8  CFREQ
11472     6000      1375R     LDB =D-9  F
11473    42000       147X     JSX ADD2P
11474    42000        34X     JSX .STRD
11475              77655A     DEF V32685  LTEMP2
11476     1655     77655A     LDA V32685  LTEMP2
11477    73010               SLA A702
11500    42000        37X     JSX .LDB1
11501              77665A     DEF V8  CFREQ
11502    42000       140X     JSX MIN2
11503              77707A     DEF V11 FOFSET
11504     6000      1375R     LDB =D-9  F
11505    42000        43X     JSX .STBP
11506    66000     11523R     JMP A703
11507                       A702 EQU *
11507    42000       140X     JSX MIN2
11510               7220R     DEF =F1739100000
11511     4020        20A     LDB AR2
11512    77011               SLB A704
11513    42000        37X     JSX .LDB1
11514              77665A     DEF V8  CFREQ
11515    42000       140X     JSX MIN2
11516               7220R     DEF =F1739100000
11517    42000       150X     JSX ADD2
11520              77707A     DEF V11 FOFSET
11521     6000      1375R     LDB =D-9  F
11522    42000        43X     JSX .STBP
11523                       A704 EQU *
11523                       A703 EQU *
11523    42000        37X     JSX .LDB1
11524              77665A     DEF V8  CFREQ
11525     6000      1375R     LDB =D-9  F
11526    42000       147X     JSX ADD2P
11527    42000        34X     JSX .STRD
11530              77665A     DEF V8  CFREQ
11531     6000      1375R     LDB =D-9  F
11532    42000        66X     JSX .LDBP
11533    42000        52X     JSX .DEQL
11534   172002                SAP *+2
11535    66000     12177R     JMP A705
11536    42000      6740R     JSM P539  CFDUMP
11537     1616     77616A     LDA V32654  XFLAG
11540    62000      2205R     IOR =B40
11541    31616     77616A     STA V32654  XFLAG
11542     1571     77571A     LDA V32633  L
11543    70540                PWC A
11544     1604     77604A     LDA V32644  SATN
11545   170600                SAL 1
11546   172014               SAP A706
11547    42000       161X     JSX .MVE4
11550              11555R     DEF =F2500000
11551              77661A     DEF V32689  LTEMP1
11552     2000     11561R     LDA =D667
11553    31573     77573A     STA V32635  I
11554    66000     11567R     JMP A707
11555  2500000
11561     1233
```

```
11555                       LIT
11562                     A706 EQU *
11562  42000      161X      JSX .MVE4
11563           11777R      DEF =F1250000
11564           77661A      DEF V32689   LTEMP1
11565   2000    12003R      LDA =D333
11566  31573    77573A      STA V32635   I
11567                     A707 EQU *
11567   1604    77604A      LDA V32644   SAIN
11570 170600                SAL 1
11571 172004                SAP A708
11572  42000       37X      JSX .LDBI
11573           12004R      DEF =F200000
11574  66000    11577R      JMP A709
11575                     A708 EQU *
11575  42000       37X      JSX .LDBI
11576           12010R      DEF =F400000
11577                     A709 EQU *
11577  42000       36X      JSX .SAR2
11600   6000     1375R      LDB =D-9  F
11601  42000       66X      JSX .LDBP
11602   6000     1375R      LDB =D-9  F
11603  42000      147X      JSX ADD2P
11604   6000     1704R      LDB =D6
11605  42000       51X      JSX .DLFT
11606  42000      164X      JSX DIV2T
11607  42000       34X      JSX .STRD
11610           77655A      DEF V32685   LTEMP2
11611  42000      146X      JSX DIV3
11612            5741R      DEF =H7500
11613  42000       50X      JSX CNV24
11614  21614    77614A      ADA V32652   DAC2
11615  31614    77614A      STA V32652   DAC2
11616  42000       37X      JSX .LDBI
11617           77655A      DEF V32685   LTEMP2
11620  42000      140X      JSX MIN2
11621           77641A      DEF V32673   VTOFREQ
11622  42000       34X      JSX .STRD
11623           77641A      DEF V32673   VTOFREQ
11624  42000       37X      JSX .LDBI
11625            7250R      DEF =F25000000
11626  42000      140X      JSX MIN2
11627           77641A      DEF V32673   VTOFREQ
11630  42000       34X      JSX .STRD
11631           77742A      DEF V32738   XL
11632   4020       20A      LDB AR2
11633  77202                SLB *+2,C
11634  34020       20A      STB AR2
11635  42000      140X      JSX MIN2
11636           77661A      DEF V32689   LTEMP1
11637   4020       20A      LDB AR2
11640  77026                SLB A710
11641   1742    77742A      LDA V32738   IX
11642 170601                SAL 2
11643 170040                TCA
11644  22000     2276R      ADA =D2
11645  31742    77742A      STA V32738   IX
11646  21571    77571A      ADA V32633   L
11647  31571    77571A      STA V32633   L
11650   1742    77742A      LDA V32738   IX
11651 170400                AAR 1
11652   5573    77573A      LDB V32635   I
11653  75617                MPY
11654  21614    77614A      ADA V32652   DAC2
11655  31614    77614A      STA V32652   DAC2
11656   1742    77742A      LDA V32738   IX
11657  42000      122X      JSX CNV42
11660  42000      153X      JSX MPY2
11661           77661A      DEF V32689   LTEMP1
11662  42000      140X      JSX MIN2
11663           77641A      DEF V32673   VTOFREQ
11664  42000       34X      JSX .STRD
11665           77641A      DEF V32673   VTOFREQ
11666                     A710 EQU *
11666  42000       37X      JSX .LDBI
11667           77655A      DEF V32685   LTEMP2
11670  42000       50X      JSX CNV24
11671  42000      113X      JSX DIV4
11672            3654R      DEF =D16
11673  21615    77615A      ADA V32653   DAC1
11674  31615    77615A      STA V32653   DAC1
11675  70760                WWC A
11676  31573    77573A      STA V32635   I
11677  11571    77571A      CPA V32633   L
11700  66000    11702R      JMP *+2
11701  66000    11716R      JMP A712
11702   1615    77615A      LDA V32653   DAC1
11703  52000     5742R      AND =B176000
11704  72012                RZA A712
11705  42000       37X      JSX .LDBI
11706           77655A      DEF V32685   LTEMP2
11707   4020       20A      LDB AR2
11710  77202                SLB *+2,C
11711  34020       20A      STB AR2
11712  42000      127X      JSX MIN3
11713            5741R      DEF =H7500
11714   4020       20A      LDB AR2
```

```
11715  77002               SLB A711
11716                     A712 EQU *
11716  42000    5656R      JSM P487   VIOTUNE
11717                     A711 EQU *
11717   1615   77615A      LDA V32653  DAC1
11720   6000    1463R      LDB =D0
11721  42000      75X      JSX .#S4
11722   1614   77614A      LDA V32652  DAC2
11723  42000     105X      JSX .#5
11724   6000    1375R      LDB =D-9   F
11725  42000      66X      JSX .LDBP
11726   6000    1375R      LDB =D-9   F
11727  42000     147X      JSX ADD2P
11730   6000    1704R      LDB =D6
11731  42000      47X      JSX .DRGI
11732  42000      50X      JSX CNV24
11733 170600               SAL 1
11734 170040               TCA
11735  21571   77571A      ADA V32633  L
11736  31571   77571A      STA V32633  L
11737 170403               AAR 4
11740 170040               TCA
11741  21570   77570A      ADA V32632  M
11742  31570   77570A      STA V32632  M
11743   1571   77571A      LDA V32633  L
11744  52000    3527R      AND =D14
11745  31571   77571A      STA V32633  L
11746   1746   77746A      LDA V32742  N
11747  70540               PWC A
11750                     A713 EQU *
11750   1570   77570A      LDA V32632  M
11751  22000    2066R      ADA =D-8
11752 172417               SAM A715
11753   1570   77570A      LDA V32632  M
11754  12000    2203R      CPA =D8
11755  66000   11757R      JMP *+2
11756  66000   12015R      JMP A714
11757   1571   77571A      LDA V32633  L
11760 170040               TCA
11761  22000    2204R      ADA =D10
11762 172407               SAM A716
11763   1571   77571A      LDA V32633  L
11764 170040               TCA
11765 172030               SAP A714
11766   1604   77604A      LDA V32644  SATN
11767 170600               SAL 1
11770 172425               SAM A714
11771                     A716 EQU *
11771                     A715 EQU *
11771   1570   77570A      LDA V32632  M
11772  22000   12014R      ADA =D-13
11773  42000     113X      JSX DIV4
11774           2405R      DEF =D5
11775  31573   77573A      STA V32635  I
11776  66000   12042R      JMP A717
11777 1250000
12003    515
12004 200000
12010 400000
12014 177763
11777                      LIT
12015                     A714 EQU *
12015   1570   77570A      LDA V32632  M
12016 170040               TCA
12017  22000    2172R      ADA =D13
12020 172413               SAM A719
12021   1570   77570A      LDA V32632  M
12022  12000    2172R      CPA =D13
12023  66000   12025R      JMP *+2
12024  66000   12040R      JMP A718
12025   1571   77571A      LDA V32633  L
12026  22000    3526R      ADA =D-10
12027 172011               SAP A718
12030   1604   77604A      LDA V32644  SATN
12031 170600               SAL 1
12032 172006               SAP A718
12033                     A719 EQU *
12033   1570   77570A      LDA V32632  M
12034  22000    2066R      ADA =D-8
12035  42000     113X      JSX DIV4
12036           2405R      DEF =D5
12037  66000   12041R      JMP A720
12040                     A718 EQU *
12040   2000    1463R      LDA =D0
12041                     A720 EQU *
12041  31573   77573A      STA V32635  I
12042                     A717 EQU *
12042   6000    2405R      LDB =D5
12043  75617               MPY
12044 170040               TCA
12045  21570   77570A      ADA V32632  M
12046  31570   77570A      STA V32632  M
12047   1573   77573A      LDA V32635  I
12050  42000     125X      JSX CNV43
12051  42000     163X      JSX ADD3
12052          77746A      DEF V32742  N
12053     23      23A      LDA AR2+3
12054  31746   77746A      STA V32742  N
12055   1573   77573A      LDA V32635  I
```

```
12056  72402             SZA *+2
12057  66000   11750R     JMP A713
12060  42000    2154R     JSM P269  WSPIN
12061   6000    1375R     LDB =D-9  F
12062  42000      66X     JSX .LDBP
12063  42000     150X     JSX ADD2
12064          77635A     DEF V32669  CFREST
12065   6000    1375R     LDB =D-9  F
12066  42000      43X     JSX .STBP
12067  70760              WWC A
12070  31573   77573A     STA V32635  I
12071   4020      20A     LDB AR2
12072  77202              SLB *+2,C
12073  34020      20A     STB AR2
12074  42000     145X     JSX SUB2
12075           7237R     DEF =F1700000
12076   4020      20A     LDB AR2
12077  77017             SLB A722
12100   1573   77573A     LDA V32635  I
12101  42000     120X     JSX .TEST
12102           1277R     DEF =B177777
12103          77746A     DEF V32742  N
12104  72412             SZA A722
12105   1605   77605A     LDA V32645  SCANSL
12106 170615              SAL 14
12107 172402              SAM *+2
12110  66000   12173R     JMP A721
12111   1731   77731A     LDA V18 SINDEX
12112 170040              TCA
12113  22000    2221R     ADA =D9
12114 172402              SAM *+2
12115  66000   12173R     JMP A721
12116                    A722 EQU *
12116   2000    3166R     LDA =D1023
12117  70540              PWC A
12120   6000    1375R     LDB =D-9  F
12121  42000      66X     JSX .LDBP
12122  42000     151X     JSX DIV2
12123           7237R     DEF =F1700000
12124  42000      50X     JSX CNV24
12125  21613   77613A     ADA V32651  DAC4
12126  42000    2132R     JSM P265  LIMIT
12127  31613   77613A     STA V32651  DAC4
12130   6000    1463R     LDB =D0
12131  42000     112X     JSX .WS7
12132   6000    1375R     LDB =D-9  F
12133  42000      66X     JSX .LDBP
12134  42000     155X     JSX MOD2
12135           7237R     DEF =F1700000
12136  42000      34X     JSX .STRD
12137          77635A     DEF V32669  CFREST
12140   1616   77616A     LDA V32654  XFLAG
12141 170612              SAL 11
12142 172415             SAM A723
12143   1603   77603A     LDA V32643  PLOCK
12144  52000   11451R     AND =B67777
12145  62000    7225R     IOR =B110000
12146   6000    1457R     LDB =D1
12147  42000      72X     JSX .WS6
12150  42000    7671R     JSM P595  YIGSHFT
12151  42000    5252R     JSM P460  YIGSLEW
12152   1603   77603A     LDA V32643  PLOCK
12153   6000    1457R     LDB =D1
12154  42000      72X     JSX .WS6
12155  42000    5252R     JSM P460  YIGSLEW
12156  66000   12166R     JMP A724
12157                    A723 EQU *
12157  42000      37X     JSX .LDBI
12160          12167R     DEF =F100000000
12161  42000     140X     JSX MIN2
12162          77671A     DEF V9  SPAN
12163   4020      20A     LDB AR2
12164  77002             SLB A725
12165  42000    6160R     JSM P502  EUS
12166                    A725 EQU *
12166                    A724 EQU *
12166  66000   12177R     JMP A726
12167 100000000
12167                     LIT
12173                    A721 EQU *
12173   6000    1375R     LDB =D-9  F
12174  42000      66X     JSX .LDBP
12175  42000      34X     JSX .STRD
12176          77635A     DEF V32669  CFREST
12177                    A726 EQU *
12177                    A705 EQU *
12177  66000      31X     JMX .RINA
12200                    P727  EQU * STEPH
12200   6000    1363R     LDB =D-4
12201  42000      32X     JSX .ARGL
12202   1763   77763A     LDA E
12203  22000    2153R     ADA =D-5
12204  22000    2107R     ADA =D3
12205  31573   77573A     STA V32635  I
12206 101573   77573A     LDA V32635,I  I
12207  52000    2110R     AND =B177776
12210 131573   77573A     STA V32635,I  I
12211  42000     126X     JSX MPY3
12212           2405R     DEF =D5
```

```
12213    6000    1457R     LDB =D1
12214   42000      47X     JSX .DRGT
12215   42000   11464R     JSM P701   STEPD
12216   42000      37X     JSX .LDBI
12217           77671A     DEF V9  SPAN
12220    6000    1375R     LDB =D-9  F
12221   42000     147X     JSX ADD2P
12222   42000   11120R     JSM P668  SPANW
12223   66000      31X     JMX .RTNA
12224                     P728  EQU * STEPL
12224    6000    1363R     LDB =D-4
12225   42000      32X     JSX .ARGL
12226    1763   77763A     LDA E
12227   22000    2153R     ADA =D-5
12230   22000    2107R     ADA =D3
12231   31573   77573A     STA V32635  I
12232  101573   77573A     LDA V32635,I  I
12233   52000    2110R     AND =B177776
12234  131573   77573A     STA V32635,I  I
12235   42000     126X     JSX MPY3
12236            2405R     DEF =D5
12237    6000    1457R     LDB =D1
12240   42000      47X     JSX .DRGT
12241   42000   11464R     JSM P701   STEPD
12242    6000    1375R     LDB =D-9  F
12243   42000      66X     JSX .LDBP
12244   42000     140X     JSX MIN2
12245           77671A     DEF V9  SPAN
12246   42000   11120R     JSM P668  SPANW
12247   66000      31X     JMX .RTNA
12250                     P729  EQU * STEPF
12250    6000    1363R     LDB =D-4
12251   42000      32X     JSX .ARGL
12252   42000   11464R     JSM P701   STEPD
12253    1600   77600A     LDA V32640   CTIM
12254  170040              TCA
12255   22000    2203R     ADA =D8
12256  172004              SAP A730
12257    2000    2107R     LDA =D3
12260    6000    2107R     LDB =D3
12261   42000      75X     JSX .WS4
12262                     A730 EQU *
12262    2000    2406R     LDA =D7
12263   42000    2314R     JSM P279   SBLK
12264   66000      31X     JMX .RTNA
12265                     P731  EQU * DSWRT
12265    6000    1277R     LDB =D-1
12266   42000      27X     JSX .ARGA
12267    1563   77563A     LDA V32627   DSTAD
12270    6000    2203R     LDB =D8
12271   42000      75X     JSX .WS4
12272    6000    1301R     LDB =D-3  N
12273   42000      30X     JSX .LDAP
12274   42000      73X     JSX .W6
12275    1563   77563A     LDA V32627   DSTAD
12276   22000    1457R     ADA =D1
12277   52000    6353R     AND =B7777
12300   31563   77563A     STA V32627   DSTAD
12301   66000      31X     JMX .RTNA
12302                     P732  EQU * WKEY
12302    1612   77612A     LDA V32650   NCHR
12303   21737   77737A     ADA V32735   BLKS
12304   21611   77611A     ADA V32649   CHRC
12305    6000    2203R     LDB =D8
12306   42000      75X     JSX .WS4
12307    1566   77566A     LDA V32630   KEYCODE
12310   42000      73X     JSX .W6
12311    2000    2500R     LDA =D147
12312   42000      73X     JSX .W6
12313   42000      73X     JSX .W6
12314   45611   77611A     ISZ V32649   CHRC
12315                      NOP
12316  170201              RET 1
12317                     P733  EQU * CLRNUM
12317    1616   77616A     LDA V32654   XFLAG
12320  170602              SAL 3
12321  172012              SAP A734
12322    2000    1463R     LDA =D0
12323   31611   77611A     STA V32649   CHRC
12324    1616   77616A     LDA V32654   XFLAG
12325   52000    6371R     AND =B167777
12326   31616   77616A     STA V32654   XFLAG
12327   42000      53X     JSX .LDSI
12330            1463R     DEF =D0
12331   42000      34X     JSX .STRD
12332           77651A     DEF V32681   LTEMP
12333                     A734 EQU *
12333  170201              RET 1
12334                     P217  EQU * MBLK
12334    1576   77576A     LDA V32638   RPGPTR
12335   12000    7565R     CPA =D18
12336   66000   12341R     JMP A735
12337   42000    2551R     JSM P298   ABLK
12340   66000   12473R     JMP A736
12341                     A735 EQU *
12341    1723   77723A     LDA V26 MKRMODE
12342   22000   12375R     ADA =D-21
12343  172405              SAM A738
12344    1426   77426A     LDA V32534   UFLAG
```

```
12345 170610                SAL 9
12346 172002                SAP *+2
12347  66000   12456R       JMP A737
12350                      A738 EQU *
12350  66000   12376R       JMP A739
12351                      P740  EQU * COPY
12351                      A741 EQU *
12351   1573   77573A       LDA V32635   I
12352  42000    103X        JSX .W4
12353  42000    162X        JSX .R5
12354  31656   77656A       STA V34 BCDA
12355  52000    3242R       AND =B377
12356  31656   77656A       STA V34 BCDA
12357   1572   77572A       LDA V32634   J
12360  42000    103X        JSX .W4
12361   1656   77656A       LDA V34 BCDA
12362  12000    2421R       CPA =D146
12363  66000   12365R       JMP A742
12364  42000      73X       JSX .W6
12365                      A742 EQU *
12365  45573   77573A       ISZ V32635   I
12366                       NOP
12367  45572   77572A       ISZ V32634   J
12370                       NOP
12371  12000    2421R       CPA =D146
12372  66000   12374R       JMP *+2
12373  66000   12351R       JMP A741
12374 170201                RET 1
12375 177753
12375                       LIT
12376                      A739   EQU *
12376  42000   12317R       JSM P733   CLRNUM
12377   1616   77616A       LDA V32654  XFLAG
12400  62000    2644R       IOR =B10000
12401  31616   77616A       STA V32654   XFLAG
12402   2000    1463R       LDA =D0
12403  31617   77617A       STA V32655   DECFLG
12404   1737   77737A       LDA V32735   BLKS
12405  21612   77612A       ADA V32650   NCHR
12406  31572   77572A       STA V32634   J
12407   6000    2203R       LDB =D8
12410  34011      11A       STB PA
12411   2000    2107R       LDA =D3
12412   5723   77723A       LDB V26 MKRMODE
12413  75617                MPY
12414  22000    2110R       ADA =D-2
12415  42000      60X       JSX .ARAY
12416              210R     DEF V112   SFTXY
12417  70541                PWC B
12420   1723   77723A       LDA V26 MKRMODE
12421  42000      60X       JSX .ARAY
12422              267R     DEF V119   SFTAB
12423 100000                LDA A,I
12424  42000      77X       JSX ADD4B
12425  22000    1704R       ADA =D6
12426  31573   77573A       STA V32635   I
12427  42000   12351R       JSM P740   COPY
12430  42000    2173R       JSM P271   CRLF
12431   1572   77572A       LDA V32634   J
12432  22000    2276R       ADA =D2
12433  31572   77572A       STA V32634   J
12434   2000    2107R       LDA =D3
12435   6000    2521R       LDB =D17
12436  75617                MPY
12437  22000    2110R       ADA =D-2
12440  42000      60X       JSX .ARAY
12441              210R     DEF V112   SFTXY
12442  70541                PWC B
12443   2000    2521R       LDA =D17
12444  42000      60X       JSX .ARAY
12445              267R     DEF V119   SFTAB
12446 100000                LDA A,I
12447  42000      77X       JSX ADD4B
12450  22000    1704R       ADA =D6
12451  31573   77573A       STA V32635   I
12452  42000   12351R       JSM P740   COPY
12453   2000    2500R       LDA =D147
12454  42000      73X       JSX .W6
12455  66000   12473R       JMP A743
12456                      A737 EQU *
12456  42000   12317R       JSM P733   CLRNUM
12457   1612   77612A       LDA V32650   NCHR
12460  21737   77737A       ADA V32735   BLKS
12461   6000    2203R       LDB =D8
12462  42000      75X       JSX .WS4
12463   2000    2500R       LDA =D147
12464  42000      73X       JSX .W6
12465  42000      73X       JSX .W6
12466   1616   77616A       LDA V32654   XFLAG
12467  62000    2644R       IOR =B10000
12470  31616   77616A       STA V32654   XFLAG
12471   2000    1463R       LDA =D0
12472  31617   77617A       STA V32655   DECFLG
12473                      A743 EQU *
12473                      A736 EQU *
12473 170201                RET 1
12474                      P744   EQU * UNITS
12474  66000   12513R       JMP A746
12475                      A747 EQU *
```

```
12475                     B748  HEX 1113   1113
12476                     B749  HEX 2311   2311
12477                     B750  HEX 1114   1114
12500                     B751  HEX 0223   0223
12501                     B752  HEX 2111   2111
12502                     B753  HEX 1110   1110
12503                        HEX 10  10
12504                     B754  HEX 2010   2010
12505                     B755  HEX 210 210
12506                     B683  HEX 1 1
12507                     B756  HEX 1200   1200
12510            12475R   V757 DEF I747 UNITSTAB
12511                        OCI 177777   177777
12512                        OCI 13  13
12513                     A746  EQU *
12513    1740    77740A      LDA V32736   EFLAG
12514  170606                SAL 7
12515  172025               SAP A758
12516    1601    77601A      LDA V32641   HPBC
12517  170601                SAL 2
12520  172422               SAM A758
12521    2000     3654R      LDA =B20
12522    6000     2411R      LDB =D4
12523   42000      112X      JSX .WS7
12524    1740    77740A      LDA V32736   EFLAG
12525   52000    11303R      AND =B177377
12526   31740    77740A      STA V32736   EFLAG
12527    1616    77616A      LDA V32654   XFLAG
12530  170600                SAL 1
12531  172011               SAP A759
12532    1620    77620A      LDA V32656   PREFIX
12533   12000    10243R      CPA =D27
12534   66000    12542R      JMP A759
12535    1565    77565A      LDA V32629   SRQEN
12536   52000     5517R      AND =B100000
12537   62000     6514R      IOR =B77777
12540   31565    77565A      STA V32629   SRQEN
12541   66000    13027R      JMP L745   EXU
12542                     A759 EQU *
12542                     A758 EQU *
12542    1620    77620A      LDA V32656   PREFIX
12543   72002                RZA *+2
12544   66000    13027R      JMP A760
12545    1566    77566A      LDA V32630   KEYCODE
12546   12000     2107R      CPA =D3
12547   66000    12551R      JMP *+2
12550   66000    12555R      JMP A761
12551    1616    77616A      LDA V32654   XFLAG
12552  170602                SAL 3
12553  172002                SAP *+2
12554   66000    13027R      JMP A760
12555                     A761 EQU *
12555    1617    77617A      LDA V32655   DECFLG
12556  172003               SAP A762
12557   22000     1457R      ADA =D1
12560   31617    77617A      STA V32655   DECFLG
12561                     A762 EQU *
12561    1616    77616A      LDA V32654   XFLAG
12562  170602                SAL 3
12563  172407               SAM A764
12564    1611    77611A      LDA V32649   CHRC
12565   12000     1457R      CPA =D1
12566   66000    12570R      JMP *+2
12567   66000    12604R      JMP A763
12570    1651    77651A      LDA V32681   LTS
12571   73013               SLA A763
12572                     A764 EQU *
12572    1651    77651A      LDA V32681   LTS
12573   73005               SLA A765
12574   42000       53X      JSX .LDSI
12575             1457R      DEF =D1
12576   42000      165X      JSX .BMIN
12577   66000    12602R      JMP A766
12600                     A765 EQU *
12600   42000       53X      JSX .LDSI
12601             1457R      DEF =D1
12602                     A766 EQU *
12602   42000       34X      JSX .STRD
12603            77651A      DEF V32681   LTEMP
12604                     A763 EQU *
12604    1601    77601A      LDA V32641   HPBC
12605  170600                SAL 1
12606  172014               SAP A767
12607   42000       37X      JSX .LDBI
12610            77651A      DEF V32681   LTEMP
12611   42000       50X      JSX CNV24
12612   21617    77617A      ADA V32655   DECFLG
12613   31617    77617A      STA V32655   DECFLG
12614   42000      161X      JSX .MVE4
12615            77621A      DEF V32657   MANI
12616            77651A      DEF V32681   LTEMP
12617    1601    77601A      LDA V32641   HPBC
12620   52000     2645R      AND =B137777
12621   31601    77601A      STA V32641   HPBC
12622                     A767 EQU *
12622    1620    77620A      LDA V32656   PREFIX
12623   22000     1277R      ADA =D-1
12624   52000     2107R      AND =D3
12625   22000     2203R      ADA =D8
```

```
12626  70540                   PwC A
12627   1620    77620A         LDA V32656   PREFIX
12630  22000     2107R         ADA =D3
12631 170501                   SAR 2
12632  42000       60X         JSX .ARAY
12633            12510R        DEF V757  UNITSTAB
12634  42000       61X         JSX .LDSA
12635  70761                   WWC B
12636  42000      132X         JSX .FDIG
12637  66000    13001R         JMP A768
12640                         C769 EQU *
12640   1566    77566A         LDA V32630   KEYCODE
12641  12000     2107R         CPA =D3
12642  66000    12644R         JMP *+2
12643  66000    12661R         JMP A770
12644   1620    77620A         LDA V32656   PREFIX
12645  12000     2107R         CPA =D3
12646  66000    12655R         JMP A771
12647   1576    77576A         LDA V32638   RPGP1R
12650  12000     7565R         CPA =D18
12651  66000    12653R         JMP *+2
12652  66000    12661R         JMP A770
12653   1605    77605A         LDA V32645   SCANSL
12654  72005                   RZA A770
12655                         A771 EQU *
12655   1617    77617A         LDA V32655   DECFLG
12656  22000     1704R         ADA =D6
12657  31617    77617A         STA V32655   DECFLG
12660  66000    12706R         JMP A772
12661                         A770 EQU *
12661   1566    77566A         LDA V32630   KEYCODE
12662  12000    10240R         CPA =B57
12663  66000    12665R         JMP *+2
12664  66000    12670R         JMP A773
12665   1617    77617A         LDA V32655   DECFLG
12666  22000     2221R         ADA =D9
12667  31617    77617A         STA V32655   DECFLG
12670                         A773 EQU *
12670   1566    77566A         LDA V32630   KEYCODE
12671  12000    12734R         CPA =B43
12672  66000    12674R         JMP *+2
12673  66000    12677R         JMP A774
12674   1617    77617A         LDA V32655   DECFLG
12675  22000     1704R         ADA =D6
12676  31617    77617A         STA V32655   DECFLG
12677                         A774 EQU *
12677   1566    77566A         LDA V32630   KEYCODE
12700  12000    10141R         CPA =B46
12701  66000    12703R         JMP *+2
12702  66000    12706R         JMP A775
12703   1617    77617A         LDA V32655   DECFLG
12704  22000     2107R         ADA =D3
12705  31617    77617A         STA V32655   DECFLG
12706                         A775 EQU *
12706                         A772 EQU *
12706  66000    13002R         JMP A776
12707                         C777 EQU *
12707   1566    77566A         LDA V32630   KEYCODE
12710  12000     2107R         CPA =D3
12711  66000    12713R         JMP *+2
12712  66000    12735R         JMP A778
12713   1730    77730A         LDA V30 KFLAG
12714 170606                   SAL 7
12715 172005                  SAP A779
12716   1620    77620A         LDA V32656   PREFIX
12717 170500                   SAR 1
12720  12000     2406R         CPA =D7
12721  66000    12735R         JMP A778
12722                         A779 EQU *
12722   1730    77730A         LDA V30 KFLAG
12723 170515                   SAR 14
12724   4000                   LDB A
12725  26000     1301R         ADB =B177775
12726   2000     2221R         LDA =D9
12727  76402                  SZB A780
12730   2000     1457R         LDA =D1
12731                         A780 EQU *
12731  21617    77617A         ADA V32655   DECFLG
12732  31617    77617A         STA V32655   DECFLG
12733  66000    12775R         JMP A781
12734     43
12734                          LIT
12735                         A778 EQU *
12735   1566    77566A         LDA V32630   KEYCODE
12736  22000    10241R         ADA =D-29
12737  42000      113X         JSX DIV4
12740             2107R        DEF =D3
12741  66000    12774R         JMP A782
12742                         C783 EQU *
12742   1617    77617A         LDA V32655   DECFLG
12743  22000     2107R         ADA =D3
12744  31617    77617A         STA V32655   DECFLG
12745  66000    12775R         JMP A784
12746                         C785 EQU *
12746  45617    77617A         ISZ V32655   DECFLG
12747                          NOP
12750  42000       37X         JSX .LDBI
12751            77651A        DEF V32681   LTEMP
12752  42000      165X         JSX .BMIN
12753  42000       34X         JSX .STRD
```

```
12754          77651A   DEF V32681  LTEMP
12755  66000   12775R   JMP A784
12756                  C786 EQU *
12756   1617   77617A   LDA V32655  DECFLG
12757  22000    1704R   ADA =D6
12760  31617   77617A   STA V32655  DECFLG
12761  66000   12775R   JMP A784
12762                  C787 EQU *
12762  45617   77617A   ISZ V32655  DECFLG
12763                   NOP
12764  66000   12775R   JMP A784
12765          12762R   DEF C787
12766          12775R   DEF A784
12767          12775R   DEF A784
12770          12756R   DEF C786
12771          12746R   DEF C785
12772          12742R   DEF C783
12773                   DEC -7
12774  42000     143X  A782  JSX .CASE
12775                  A784 EQU *
12775                  A781 EQU *
12775  66000   13002R   JMP A776
12776          12707R   DEF C777
12777          12640R   DEF C769
13000                   DEC -3
13001  42000     143X  A768  JSX .CASE
13002                  A776 EQU *
13002   1617   77617A   LDA V32655  DECFLG
13003 172010           SAP A788
13004  22000    2565R   ADA =D11
13005  70540            PWC A
13006  42000      37X   JSX .LDBI
13007          77651A   DEF V32681  LTEMP
13010  42000      26X   JSM P213  ROUND
13011  42000      34X   JSX .STRD
13012          77651A   DEF V32681  LTEMP
13013                  A788 EQU *
13013  42000      37X   JSX .LDBI
13014          77651A   DEF V32681  LTEMP
13015   5617   77617A   LDB V32655  DECFLG
13016  42000     123X   JSX .DSFT
13017  42000      34X   JSX .STRD
13020          77651A   DEF V32681  LTEMP
13021   1616   77616A   LDA V32654  XFLAG
13022  52000   11451R   AND =B67777
13023  62000    5517R   IOR =B100000
13024  31616   77616A   STA V32654  XFLAG
13025   2000    1463R   LDA =D0
13026  31617   77617A   STA V32655  DECFLG
13027                  A760 EQU *
13027                  L745  EQU * EXU
13027 170201            RET 1
13030                  P789  EQU * WCRLF
13030   2000    2172R   LDA =D13
13031  42000      17X   JSM P206  WHPIB
13032   1730   77730A   LDA V30 KFLAG
13033 170607            SAL 9
13034 172402           SAM A790
13035  42000      16X   JSM P205  WEOI
13036                  A790 EQU *
13036   2000    2204R   LDA =D10
13037  42000      17X   JSM P206  WHPIB
13040   1730   77730A   LDA V30 KFLAG
13041  52000   13044R   AND =B177577
13042  31730   77730A   STA V30 KFLAG
13043 170201            RET 1
13044 177577
13044                   LIT
13045                  P791  EQU * UHPB
13045   1601   77601A   LDA V32641  HPBC
13046 172406           SAM A792
13047  62000    5517R   IOR =B100000
13050  31601   77601A   STA V32641  HPBC
13051   2000    1463R   LDA =D0
13052   6000    2107R   LDB =D3
13053  42000     107X   JSX .WS5
13054                  A792 EQU *
13054  42000     166X   JSX .CSHV
13055          32476R   DEF L193  RESET
13056  42000     166X   JSX .CSHV
13057          32473R   DEF L195  ABORT
13060  42000      14X   JSM P203  HPBSY
13061 170201            RET 1
13062                  P793  EQU * NDUMP
13062   6000    2417R   LDB =D-6
13063  42000      32X   JSX .ARGL
13064  66000   13163R   JMP A794
13065                  I795 EQU *
13065          13126R   DEF ="Hz"
13066          13130R   DEF ="kHz"
13067          13133R   DEF ="MHz"
13070          13065R  V796 DEF I795 HZUNIT
13071                   OCT 177777  177777
13072                   OCT 3 3
13073                  I797 EQU *
13073                  N798  DEC 237 237
13074                  K799  OCT 155 155
13075                   OCT 40  40
13076          13073R  V800 DEF I797 SUNIT
```

```
13077                        OCT 177777  177777
13100                        OCT 3 3
13101                       T801 EQU *
13101                       K802  OCT 156 156
13102                        DEC 237 237
13103                        OCT 155 155
13104                        OCT 40  40
13105               13101R  V803 DEF T801 VUNIT
13106                        OCT 177777  177777
13107                        OCT 4 4
77773                       V804  EQU 77773B  ASEND
13110                       P805  EQU * DBL
13110    1675       77675A   LDA V15 BLEDS
13111  170501                SAR 2
13112   52000        1457R   AND =D1
13113   22000        1457R   ADA =D1
13114  170040                TCA
13115   21573       77573A   ADA V32635  I
13116   31656       77656A   STA V34 BCDA
13117  172006               SAP A806
13120    6000       13136R   LDB =D-11 DIGS
13121   42000          71X   JSX MIN4P
13122   31573       77573A   STA V32635  I
13123    6000       13136R   LDB =D-11 DIGS
13124   42000          67X   JSX .STAP
13125                       A806 EQU *
13125  170201                RET 1
13126 HZ
13130 KHZ
13133 MHZ
13136 177765
13126                        LIT
13137                       P807  EQU * HZSEC
13137    1573       77573A   LDA V32635  I
13140   42000         121X   JSX MOD4
13141                2107R   DEF =D3
13142   31656       77656A   STA V34 BCDA
13143   72405               SZA A809
13144    1573       77573A   LDA V32635  I
13145  170040                TCA
13146   22000        2221R   ADA =D9
13147  172004               SAP A808
13150                       A809 EQU *
13150    1656       77656A   LDA V34 BCDA
13151   22000        2107R   ADA =D3
13152   31656       77656A   STA V34 BCDA
13153                       A808 EQU *
13153    1573       77573A   LDA V32635  I
13154   12000        1456R   CPA =D12
13155   66000       13157R   JMP *+2
13156   66000       13162R   JMP A810
13157    1656       77656A   LDA V34 BCDA
13160   22000        2107R   ADA =D3
13161   31656       77656A   STA V34 BCDA
13162                       A810 EQU *
13162  170201                RET 1
13163                       A794  EQU *
13163    6000        1375R   LDB =D-9  NUM
13164   42000          66X   JSX .LDBP
13165   71500                NRM
13166   35573       77573A   STB V32635  I
13167   42000          34X   JSX .STRD
13170               77742A   DEF V32738  XL
13171    6000       13136R   LDB =D-11 DIGS
13172   42000          30X   JSX .LDAP
13173  172402                SAM *+2
13174   66000       13247R   JMP A811
13175   42000          37X   JSX .LDBI
13176               77671A   DEF V9  SPAN
13177   42000          52X   JSX .DEQL
13200  172015               SAP A812
13201    2000        2107R   LDA =D3
13202   70540                PWC A
13203   42000        2070R   JSM P261  IFBW
13204  170500                SAR 1
13205   22000        2110R   ADA =D-2
13206   42000        2132R   JSM P265  LIMIT
13207   21573       77573A   ADA V32635  I
13210  170040                TCA
13211   22000        1456R   ADA =D12
13212    6000       13136R   LDB =D-11 DIGS
13213   42000          67X   JSX .STAP
13214   66000       13225R   JMP A813
13215                       A812 EQU *
13215   71500                NRM
13216   35572       77572A   STB V32634  J
13217    1573       77573A   LDA V32635  I
13220  170040                TCA
13221   21572       77572A   ADA V32634  J
13222   22000        2411R   ADA =D4
13223    6000       13136R   LDB =D-11 DIGS
13224   42000          67X   JSX .STAP
13225                       A813 EQU *
13225  170040                TCA
13226  172410               SAM A814
13227   42000          53X   JSX .LDSI
13230                1463R   DEF =D0
13231   42000          34X   JSX .STRD
13232               77742A   DEF V32738  XL
```

```
13233   2000   1456R   LDA =D12
13234  31573  77573A   STA V32635  I
13235  66000  13247R   JMP A815
13236                 A814 EQU *
13236   6000  13136R   LDB =D-11 DIGS
13237  42000     30X   JSX .LDAP
13240  22000   1277R   ADA =D-1
13241  70540           PWC A
13242  42000     37X   JSX .LDBI
13243         77742A   DEF V32738  XL
13244  42000     26X   JSM P213  ROUND
13245  42000     34X   JSX .STRD
13246         77742A   DEF V32738  XL
13247                 A815 EQU *
13247                 A811 EQU *
13247   1573  77573A   LDA V32635  I
13250  12000   1456R   CPA =D12
13251  66000  13253R   JMP *+2
13252  66000  13260R   JMP A816
13253   2000   1457R   LDA =D1
13254  31573  77573A   STA V32635  I
13255   6000  13136R   LDB =D-11 DIGS
13256  42000     67X   JSX .STAP
13257  66000  13263R   JMP A817
13260                 A816 EQU *
13260 170040           TCA
13261  22000   1456R   ADA =D12
13262  31573  77573A   STA V32635  I
13263                 A817 EQU *
13263   6000  13136R   LDB =D-11 DIGS
13264  42000     30X   JSX .LDAP
13265 170040           TCA
13266  21573  77573A   ADA V32635  I
13267 172004          SAP A818
13270   1573  77573A   LDA V32635  I
13271   6000  13136R   LDB =D-11 DIGS
13272  42000     67X   JSX .STAP
13273                 A818 EQU *
13273   6000  13136R   LDB =D-11 DIGS
13274  42000     30X   JSX .LDAP
13275  31656  77656A   STA V34 BCDA
13276   6000  12014R   LDB =D-13 UNTS
13277  42000     30X   JSX .LDAP
13300  66000  13357R   JMP A819
13301                 C820 EQU *
13301  42000  13137R   JSM P807  HZSEC
13302  66000  13360R   JMP A821
13303                 C822 EQU *
13303  42000  13137R   JSM P807  HZSEC
13304  66000  13360R   JMP A821
13305                 C823 EQU *
13305   1730  77730A   LDA V30 KFLAG
13306 170515           SAR 14
13307  12000   2107R   CPA =D3
13310  66000  13312R   JMP *+2
13311  66000  13322R   JMP A824
13312   1573  77573A   LDA V32635  I
13313  42000    121X   JSX MOD4
13314          2107R   DEF =D3
13315  31656  77656A   STA V34 BCDA
13316  72003          RZA A825
13317   2000   2107R   LDA =D3
13320  31656  77656A   STA V34 BCDA
13321                 A825 EQU *
13321  66000  13323R   JMP A826
13322                 A824 EQU *
13322  42000  13110R   JSM P805  DBL
13323                 A826 EQU *
13323  66000  13360R   JMP A821
13324                 C827 EQU *
13324  42000  13110R   JSM P805  DBL
13325  66000  13360R   JMP A821
13326                 C828 EQU *
13326   1573  77573A   LDA V32635  I
13327  22000   1363R   ADA =D-4
13330  31656  77656A   STA V34 BCDA
13331 172006          SAP A829
13332   2000   2411R   LDA =D4
13333  31573  77573A   STA V32635  I
13334   6000  13136R   LDB =D-11 DIGS
13335  42000     67X   JSX .STAP
13336  66000  13346R   JMP A830
13337                 A829 EQU *
13337   1573  77573A   LDA V32635  I
13340 170040           TCA
13341  22000   2406R   ADA =D7
13342 172004          SAP A831
13343   1656  77656A   LDA V34 BCDA
13344   6000  13136R   LDB =D-11 DIGS
13345  42000     67X   JSX .STAP
13346                 A831 EQU *
13346                 A830 EQU *
13346  66000  13360R   JMP A821
13347         13326R   DEF C828
13350         13324R   DEF C827
13351         13360R   DEF A821
13352         13305R   DEF C823
13353         13360R   DEF A821
13354         13303R   DEF C822
```

```
13355                 13301R    DEF C820
13356                           DEC -8
13357   42000           143X  A819  JSX .CASE
13360                         A821 EQU *
13360    1573         77573A    LDA V32635  I
13361   22000          1277R    ADA =D-1
13362   42000           113X    JSX DIV4
13363                  2107R    DEF =D3
13364   31573         77573A    STA V32635  I
13365    6000         12014R    LDB =D-13 UNTS
13366   42000            30X    JSX .LDAP
13367   22000          1301R    ADA =D-3
13370  172007                  SAP A832
13371    1573         77573A    LDA V32635  I
13372  170040                   TCA
13373   22000          2276R    ADA =D2
13374  172003                  SAP A832
13375    2000          2276R    LDA =D2
13376   31573         77573A    STA V32635  I
13377                         A832 EQU *
13377    1656         77656A    LDA V34 BCDA
13400    6000         13136R    LDB =D-11 DIGS
13401   42000            71X    JSX MIN4P
13402  172004                  SAP A833
13403    1656         77656A    LDA V34 BCDA
13404    6000         13136R    LDB =D-11 DIGS
13405   42000            67X    JSX .STAP
13406                         A833 EQU *
13406    2000         13442R    LDA =B30060
13407   31773         77773A    STA V804  ASEND
13410    1656         77656A    LDA V34 BCDA
13411  170605                   SAL 6
13412   61742         77742A    IOR V32738  IX
13413   31742         77742A    STA V32738  IX
13414   42000            37X    JSX .LDBI
13415                 77742A    DEF V32738  X
13416   42000            11X    JSM P200  CNV15
13417    1742         77742A    LDA V32738  IX
13420   52000          1457R    AND =D1
13421    6000         13136R    LDB =D-11 DIGS
13422   42000           115X    JSX ADD4P
13423   70540                   PWC A
13424    1742         77742A    LDA V32738  IX
13425  170405                   AAR 6
13426    6000         13136R    LDB =D-11 DIGS
13427   42000           117X    JSX SUB4P
13430  170516                   SAR 15
13431   42000            57X    JSX ADD4T
13432   31572         77572A    STA V32634  J
13433  101427         77427A    LDA V32535,I  AS
13434  170040                   TCA
13435   21572         77572A    ADA V32634  J
13436  172005                  SAP A834
13437    1572         77572A    LDA V32634  J
13440  131427         77427A    STA V32535,I  AS
13441   66000         13467R    JMP A835
13442   30060
13442                          LIT
13443                         A834 EQU *
13443  101427         77427A    LDA V32535,I  AS
13444  170040                   TCA
13445   21572         77572A    ADA V32634  J
13446  170040                   TCA
13447  172020                  SAP A836
13450  101427         77427A    LDA V32535,I  AS
13451   70540                   PWC A
13452    1742         77742A    LDA V32738  IX
13453   52000          1457R    AND =D1
13454   21656         77656A    ADA V34 BCDA
13455   70761                   WWC B
13456   10001             1A    CPA B
13457   66000         13461R    JMP *+2
13460   66000         13465R    JMP A837
13461    1427         77427A    LDA V32535  AS
13462   70540                   PWC A
13463    2000         13532R    LDA =B56
13464   42000            10X    JSM P199  ACHAR
13465                         A837 EQU *
13465    1572         77572A    LDA V32634  J
13466  131427         77427A    STA V32535,I  AS
13467                         A836 EQU *
13467                         A835 EQU *
13467    1601         77601A    LDA V32641  HPBC
13470  172402                   SAM *+2
13471   66000         13555R    JMP A838
13472    6000         12014R    LDB =D-13 UNTS
13473   42000            30X    JSX .LDAP
13474   12000          1457R    CPA =D1
13475   66000         13512R    JMP A840
13476   12000          2276R    CPA =D2
13477   66000         13512R    JMP A840
13500    6000         12014R    LDB =D-13 UNTS
13501   42000            30X    JSX .LDAP
13502   12000          2411R    CPA =D4
13503   66000         13505R    JMP *+2
13504   66000         13551R    JMP A839
13505    1730         77730A    LDA V30 KFLAG
13506  170515                   SAR 14
```

```
13507  12000   2107R    CPA =D3
13510  66000  13512R    JMP *+2
13511  66000  13551R    JMP A839
13512                 A840 EQU *
13512   1573  77573A    LDA V32635  I
13513   6000   2107R    LDB =D3
13514  75617            MPY
13515  31573  77573A    STA V32635  I
13516   6000  12014R    LDB =D-13 UNTS
13517  42000     30X    JSX .LDAP
13520 170500            SAR 1
13521  66000  13536R    JMP A841
13522                 C842 EQU *
13522   1573  77573A    LDA V32635  I
13523  22000   2417R    ADA =D-6
13524  31573  77573A    STA V32635  1
13525  66000  13537R    JMP A843
13526                 C844 EQU *
13526   1573  77573A    LDA V32635  I
13527  22000   1375R    ADA =D-9
13530  31573  77573A    STA V32635  1
13531  66000  13537R    JMP A843
13532     56
13532                   LIT
13533         13526R    DEF C844
13534         13522R    DEF C842
13535                   DEC -3
13536  42000    143X  A841  JSX .CASE
13537                 A843 EQU *
13537   1573  77573A    LDA V32635  1
13540  72411           SZA A845
13541   1427  77427A    LDA V32535  AS
13542  70540            PwC A
13543   2000  13554R    LDA =B105
13544  42000     10X    JSM P199  ACHAR
13545   1427  77427A    LDA V32535  AS
13546  42000     13X    JSM P202  STHPB
13547   1573  77573A    LDA V32635  I
13550  42000     12X    JSM P201  CNV45
13551                 A845 EQU *
13551                 A839 EQU *
13551   1427  77427A    LDA V32535  AS
13552  42000     13X    JSM P202  STHPB
13553  66000  13776R    JMP A846
13554    105
13554                   LIT
13555                 A838 EQU *
13555  45573  77573A    ISZ V32635  1
13556                   NOP
13557   1427  77427A    LDA V32535  AS
13560   6000   1704R    LDB =D6
13561  42000     76X    JSX .WSTS
13562 101427  77427A    LDA V32535,I  AS
13563  22000   1457R    ADA =D1
13564  31430  77430A    STA V32536  SLEN
13565   1616  77616A    LDA V32654  XFLAG
13566 170607            SAL 8
13567 172006           SAP A847
13570   2000   2172R    LDA =D13
13571  42000     73X    JSX .W6
13572   2000   2204R    LDA =D10
13573  42000     73X    JSX .W6
13574  66000  13602R    JMP A848
13575                 A847 EQU *
13575   6000  12014R    LDB =D-13 UNTS
13576  42000     30X    JSX .LDAP
13577  72403           SZA A849
13600   2000   2205R    LDA =B40
13601  42000     73X    JSX .W6
13602                 A849 EQU *
13602                 A848 EQU *
13602   1616  77616A    LDA V32654  XFLAG
13603  52000  13044R    AND =B177577
13604  31616  77616A    STA V32654  XFLAG
13605   6000  12014R    LDB =D-13 UNTS
13606  42000     30X    JSX .LDAP
13607  66000  13775R    JMP A850
13610                 C851 EQU *
13610   1573  77573A    LDA V32635  I
13611  42000     60X    JSX .ARAY
13612         13070R    DEF V796  HZUNIT
13613   6000   1704R    LDB =D6
13614  42000     76X    JSX .WSTS
13615   1573  77573A    LDA V32635  I
13616  42000     60X    JSX .ARAY
13617         13070R    DEF V796  HZUNIT
13620 100000            LDA A,I
13621  21430  77430A    ADA V32536  SLEN
13622  31430  77430A    STA V32536  SLEN
13623  66000  13776R    JMP A852
13624                 C853 EQU *
13624   1573  77573A    LDA V32635  1
13625  42000     60X    JSX .ARAY
13626         13076R    DEF V800  SUNIT
13627  42000     73X    JSX .W6
13630   6000   1704R    LDB =D6
13631  42000    100X    JSX .WSTR
13632         13665R    DEF ="sec"
13633   1430  77430A    LDA V32536  SLEN
```

```
13634  22000    2411R    ADA =D4
13635  31430   77430A    STA V32536   SLEN
13636  66000   13776R    JMP A852
13637                   C854 EQU *
13637   6000    1704R    LDB =D6
13640  42000     100X    JSX .WSTR
13641          13670R    DEF ="dB"
13642   1430   77430A    LDA V32536   SLEN
13643  22000    2276R    ADA =D2
13644  31430   77430A    STA V32536   SLEN
13645  66000   13776R    JMP A852
13646                   C855 EQU *
13646   1730   77730A    LDA V30 KFLAG
13647 170515             SAR 14
13650  12000    2107R    CPA =D3
13651  66000   13653R    JMP *+2
13652  66000   13672R    JMP A856
13653   1430   77430A    LDA V32536   SLEN
13654  22000    2276R    ADA =D2
13655  31430   77430A    STA V32536   SLEN
13656   1573   77573A    LDA V32635   I
13657  42000      60X    JSX .ARAY
13660          13105R    DEF V803   VUNIT
13661  42000      73X    JSX .W6
13662   2000    2771R    LDA =B126
13663  42000      73X    JSX .W6
13664  66000   13715R    JMP A857
13665 sec
13670 dB
13665                    LIT
13672                   A856 EQU *
13672   6000    1704R    LDB =D6
13673  42000     100X    JSX .WSTR
13674          13670R    DEF ="dB"
13675   1730   77730A    LDA V30 KFLAG
13676 172003             SAP A858
13677   2000   13752R    LDA =D237
13700  66000   13702R    JMP A859
13701                   A858 EQU *
13701   2000   13753R    LDA =B155
13702                   A859 EQU *
13702  42000      73X    JSX .W6
13703   1430   77430A    LDA V32536   SLEN
13704  22000    2107R    ADA =D3
13705  31430   77430A    STA V32536   SLEN
13706   1730   77730A    LDA V30 KFLAG
13707 170515             SAR 14
13710  72405             SZA A860
13711  45430   77430A    ISZ V32536   SLEN
13712                    NOP
13713   2000    2771R    LDA =B126
13714  42000      73X    JSX .W6
13715                   A860 EQU *
13715                   A857 EQU *
13715   1675   77675A    LDA V15 BLEDS
13716 170615             SAL 14
13717 172007             SAP A861
13720   1430   77430A    LDA V32536   SLEN
13721  22000    2406R    ADA =D7
13722  31430   77430A    STA V32536   SLEN
13723   6000    1704R    LDB =D6
13724  42000     100X    JSX .WSTR
13725          13754R    DEF =" (1 Hz)"
13726                   A861 EQU *
13726  66000   13776R    JMP A852
13727                   C862 EQU *
13727   6000    1704R    LDB =D6
13730  42000     100X    JSX .WSTR
13731          13761R    DEF ="dB/"
13732   1430   77430A    LDA V32536   SLEN
13733  22000    2107R    ADA =D3
13734  31430   77430A    STA V32536   SLEN
13735  66000   13776R    JMP A852
13736                   C863 EQU *
13736   6000    1704R    LDB =D6
13737  42000     100X    JSX .WSTR
13740          13670R    DEF ="dB"
13741   1430   77430A    LDA V32536   SLEN
13742  22000    2276R    ADA =D2
13743  31430   77430A    STA V32536   SLEN
13744  66000   13776R    JMP A852
13745                   C864 EQU *
13745   2000   13764R    LDA =B130
13746  42000      73X    JSX .W6
13747  45430   77430A    ISZ V32536   SLEN
13750                    NOP
13751  66000   13776R    JMP A852
13752    355
13753    155
13754 (1 Hz)
13761 dB/
13764    130
13752                    LIT
13765          13745R    DEF C864
13766          13736R    DEF C863
13767          13727R    DEF C862
13770          13646R    DEF C855
13771          13637R    DEF C854
13772          13624R    DEF C853
```

```
13773          13610R    DEF C851
13774                    DEC -8
13775  42000     143X    A850  JSX .CASE
13776                    A852 EQU *
13776                    A846 EQU *
13776  66000      31X    JMX .RTNA
13777                    P865  EQU * DSPITEM
13777   2000    2646R    LDA =D3008
14000  31737   77737A    STA V32735  BLKS
14001   2000   14033R    LDA =D3012
14002   6000    2203R    LDB =D8
14003  42000      75X    JSX .W54
14004   1620   77620A    LDA V32656  PREFIX
14005  72002             RZA *+2
14006  66000   14047R    JMP A866
14007  42000      60X    JSX .ARAY
14010             345R   DEF V122  AFTAB
14011   6000    1704R    LDB =D6
14012  42000      76X    JSX .WSTS
14013   1620   77620A    LDA V32656  PREFIX
14014  12000    2301R    CPA =D19
14015  66000   14021R    JMP A868
14016  12000    2302R    CPA =D22
14017  66000   14021R    JMP *+2
14020  66000   14022R    JMP A867
14021                    A868 EQU *
14021  42000    2212R    JSM P273  DELTA
14022                    A867 EQU *
14022   1620   77620A    LDA V32656  PREFIX
14023 170500             SAR 1
14024  12000    1456R    CPA =D12
14025  66000   14027R    JMP *+2
14026  66000   14037R    JMP A869
14027   6000    1704R    LDB =D6
14030  42000     100X    JSX .WSTR
14031          14034R    DEF ="    "
14032  66000   14040R    JMP A870
14033   5704
14034
14033                    LIT
14037                    A869 EQU *
14037  42000    2173R    JSM P271  CRLF
14040                    A870 EQU *
14040   1620   77620A    LDA V32656  PREFIX
14041  42000      60X    JSX .ARAY
14042             345R   DEF V122  AFTAB
14043 100000             LDA A,1
14044  22000    2406R    ADA =D7
14045  31612   77612A    STA V32650  NCHR
14046  66000   14051R    JMP A871
14047                    A866 EQU *
14047   2000    2411R    LDA =D4
14050  31612   77612A    STA V32650  NCHR
14051                    A871 EQU *
14051   2000    2500R    LDA =D147
14052  42000      73X    JSX .W6
14053  42000      73X    JSX .W6
14054 170201             RET 1
14055                    P216  EQU * MESSAGE
14055   6000    1277R    LDB =D-1
14056  42000      27X    JSX .ARGA
14057  66000   14413R    JMP A872
14060                    C873 EQU *
14060   2000    1457R    LDA =D1
14061  70540             PWC A
14062  70540             PWC A
14063  42000    2070R    JSM P261  IFBW
14064  42000    4420R    JSM P407  EXP3
14065  42000   13062R    JSM P793  NDUMP
14066  66000   14414R    JMP A874
14067                    C875 EQU *
14067   2000    1457R    LDA =D1
14070  70540             PWC A
14071  70540             PWC A
14072  42000    2111R    JSM P263  VBW
14073  42000    4420R    JSM P407  EXP3
14074  42000   13062R    JSM P793  NDUMP
14075  66000   14414R    JMP A874
14076                    C876 EQU *
14076   2000    2276R    LDA =D2
14077  70540             PWC A
14100  70540             PWC A
14101   1733   77733A    LDA V20 FSTIM
14102 172004             SAP A877
14103   1731   77731A    LDA V18 SINDEX
14104  42000    4411R    JSM P406  EXP2
14105  66000   14111R    JMP A878
14106                    A877 EQU *
14106   1731   77731A    LDA V18 SINDEX
14107  22000    5520R    ADA =D24
14110  42000    4356R    JSM P403  EXPSIX
14111                    A878 EQU *
14111  42000   13062R    JSM P793  NDUMP
14112  66000   14414R    JMP A874
14113                    C879 EQU *
14113   2000    2107R    LDA =D3
14114  70540             PWC A
14115   2000    2276R    LDA =D2
14116  70540             PWC A
```

```
14117   1677  77677A   LDA V17 RFAT
14120  52000   2406R   AND =D7
14121   6000   2204R   LDB =D10
14122  75617           MPY
14123  42000    122X   JSX CNV42
14124  42000  13062R   JSM P793  NDUMP
14125  66000  14414R   JMP A874
14126                 C880 EQU *
14126   2000   2411R   LDA =D4
14127  70540           PWC A
14130  70540           PWC A
14131   2000   4470R   LDA =D1000
14132  42000   4471R   JSM P410  DBMNV
14133  42000  13062R   JSM P793  NDUMP
14134  66000  14414R   JMP A874
14135                 C881 EQU *
14135   1435  77435A   LDA V32541  IF1
14136 172010          SAP A882
14137   2000   2405R   LDA =D5
14140  70540           PWC A
14141   2000   2276R   LDA =D2
14142  70540           PWC A
14143  42000   4430R   JSM P408  LGSCL
14144  42000    122X   JSX CNV42
14145  42000  13062R   JSM P793  NDUMP
14146                 A882 EQU *
14146  66000  14414R   JMP A874
14147                 C883 EQU *
14147   2000   1457R   LDA =D1
14150  70540           PWC A
14151   2000   1277R   LDA =B177777
14152  70540           PWC A
14153  42000     37X   JSX .LDBI
14154         77665A   DEF V8  CFREQ
14155  42000  13062R   JSM P793  NDUMP
14156  66000  14414R   JMP A874
14157                 C884 EQU *
14157   2000   1457R   LDA =D1
14160  70540           PWC A
14161   2000   1277R   LDA =B177777
14162  70540           PWC A
14163  42000     37X   JSX .LDBI
14164         77671A   DEF V9  SPAN
14165  42000  13062R   JSM P793  NDUMP
14166  66000  14414R   JMP A874
14167                 C885 EQU *
14167   2000   1457R   LDA =D1
14170  70540           PWC A
14171   2000   1277R   LDA =B177777
14172  70540           PWC A
14173  42000     37X   JSX .LDBI
14174         77671A   DEF V9  SPAN
14175  42000    126X   JSX MPY3
14176          2405R   DEF =D5
14177   6000   1457R   LDB =D1
14200  42000     47X   JSX .DRGT
14201  42000    140X   JSX MIN2
14202         77665A   DEF V8  CFREQ
14203  42000  13062R   JSM P793  NDUMP
14204  66000  14414R   JMP A874
14205                 C886 EQU *
14205   2000   1457R   LDA =D1
14206  70540           PWC A
14207   2000   1277R   LDA =B177777
14210  70540           PWC A
14211  42000     37X   JSX .LDBI
14212         77671A   DEF V9  SPAN
14213  42000    126X   JSX MPY3
14214          2405R   DEF =D5
14215   6000   1457R   LDB =D1
14216  42000     47X   JSX .DRGT
14217  42000    150X   JSX ADD2
14220         77665A   DEF V8  CFREQ
14221  42000  13062R   JSM P793  NDUMP
14222  66000  14414R   JMP A874
14223                 C887 EQU *
14223   2000   1457R   LDA =D1
14224  70540           PWC A
14225   2000   1277R   LDA =B177777
14226  70540           PWC A
14227  42000     37X   JSX .LDBI
14230         77713A   DEF V7  FSTEP
14231  42000  13062R   JSM P793  NDUMP
14232  66000  14414R   JMP A874
14233                 C888 EQU *
14233   2000   1463R   LDA =D0
14234  70540           PWC A
14235   2000   2411R   LDA =D4
14236  70540           PWC A
14237   1614  77614A   LDA V32652  DAC2
14240  42000    122X   JSX CNV42
14241  42000  13062R   JSM P793  NDUMP
14242  66000  14414R   JMP A874
14243                 C889 EQU *
14243   2000   2411R   LDA =D4
14244  70540           PWC A
14245  70540           PWC A
14246   1704  77704A   LDA V33 LEVLIN
14247  42000   4471R   JSM P410  DBMNV
```

```
14250  42000   13062R     JSM P793  NDUMP
14251  66000   14414R     JMP A874
14252                   C890 EQU *
14252   2000    2411R     LDA =D4
14253  70540              PWC A
14254  70540              PWC A
14255   1705   77705A     LDA V32 THRESH
14256  52000    1363R     AND =B177774
14257  42000    4471R     JSM P410  DBMNV
14260  42000   13062R     JSM P793  NDUMP
14261  66000   14414R     JMP A874
14262                   C891 EQU *
14262   1675   77675A     LDA V15 BLEDS
14263 170501              SAR 2
14264  62000    2411R     IOR =D4
14265  42000     104X     JSX .TURN
14266           1704R     DEF =D6
14267          77675A     DEF V15 BLEDS
14270  31675   77675A     STA V15 BLEDS
14271  42000   10312R     JSM P218  MKREL
14272 172402              SAM *+2
14273  66000   14341R     JMP A892
14274   1730   77730A     LDA V30 KFLAG
14275 170515              SAR 14
14276  12000    2107R     CPA =D3
14277  66000   14301R     JMP *+2
14300  66000   14341R     JMP A892
14301   2000    2406R     LDA =D7
14302  70540              PWC A
14303   2000    2107R     LDA =D3
14304  70540              PWC A
14305   1435   77435A     LDA V32541  IF1
14306 172015             SAP A893
14307   1720   77720A     LDA V27 AMLVL
14310  42000    4471R     JSM P410  DBMNV
14311  42000      62X     JSX CNV21
14312  42000      36X     JSX .SAR2
14313   1722   77722A     LDA V29 MKRLVL
14314  42000    4471R     JSM P410  DBMNV
14315  42000      62X     JSX CNV21
14316  42000      41X     JSX MPY1
14317          14335R     DEF =F10000.0
14320  42000      42X     JSX DIV1T
14321  42000      65X     JSX CNV12
14322  66000   14333R     JMP A894
14323                   A893 EQU *
14323   1720   77720A     LDA V27 AMLVL
14324  42000     122X     JSX CNV42
14325  42000      36X     JSX .SAR2
14326   1722   77722A     LDA V29 MKRLVL
14327  42000     122X     JSX CNV42
14330   6000    2411R     LDB =D4
14331  42000      51X     JSX .DLFI
14332  42000     164X     JSX DIV2I
14333                   A894 EQU *
14333  42000   13062R     JSM P793  NDUMP
14334  66000   14365R     JMP A895
14335 10000.0
14335                     LIT
14341                   A892 EQU *
14341  42000   10312R     JSM P218  MKREL
14342 172003             SAP A896
14343   2000    1704R     LDA =D6
14344  66000   14346R     JMP A897
14345                   A896 EQU *
14345   2000    2411R     LDA =D4
14346                   A897 EQU *
14346  70540              PWC A
14347   2000    2405R     LDA =D5
14350  70540              PWC A
14351  42000   10312R     JSM P218  MKREL
14352 172004             SAP A898
14353   1720   77720A     LDA V27 AMLVL
14354  42000    4471R     JSM P410  DBMNV
14355  66000   14360R     JMP A899
14356                   A898 EQU *
14356  42000      53X     JSX .LDSI
14357           1463R     DEF =D0
14360                   A899 EQU *
14360  42000      36X     JSX .SAR2
14361   1722   77722A     LDA V29 MKRLVL
14362  42000    4471R     JSM P410  DBMNV
14363  42000     124X     JSX SUB2T
14364  42000   13062R     JSM P793  NDUMP
14365                   A895 EQU *
14365   1675   77675A     LDA V15 BLEDS
14366  52000    5115R     AND =B177771
14367  31675   77675A     STA V15 BLEDS
14370  66000   14414R     JMP A874
14371          14262R     DEF C891
14372          14414R     DEF A874
14373          14252R     DEF C890
14374          14243R     DEF C889
14375          14233R     DEF C888
14376          14414R     DEF A874
14377          14223R     DEF C887
14400          14205R     DEF C886
14401          14167R     DEF C885
14402          14157R     DEF C884
```

```
14403         14147R    DEF C883
14404         14135R    DEF C881
14405         14126R    DEF C880
14406         14113R    DEF C879
14407         14076R    DEF C876
14410         14067R    DEF C875
14411         14060R    DEF C873
14412                   DEC -18
14413  42000    143X   A872  JSX .CASE
14414                  A874 EQU *
14414   6000   1301R    LDB =D-3  N
14415  42000     30X    JSX .LDAP
14416  42000    113X    JSX DIV4
14417          1704R    DEF =D6
14420  12000   2107R    CPA =D3
14421  66000  14423R    JMP *+2
14422  66000  14511R    JMP A900
14423   1733  77733A    LDA V20 FSTIM
14424 172002            SAP *+2
14425  66000  14511R    JMP A900
14426   1605  77605A    LDA V32645  SCANSL
14427  72027            RZA A901
14430   2000   2276R    LDA =D2
14431  70540            PWC A
14432   2000   2411R    LDA =D4
14433  70540            PWC A
14434   1731  77731A    LDA V18 SINDEX
14435  22000   5520R    ADA =D24
14436  42000   4356R    JSM P403  EXPSIX
14437   6000   2107R    LDB =D3
14440  42000     47X    JSX .DRGT
14441  42000     36X    JSX .SAR2
14442  42000  10312R    JSM P218  MKREL
14443 172005            SAP A902
14444   1717  77717A    LDA V28 AMKR
14445 170040            TCA
14446  21721  77721A    ADA V25 MRKR
14447  66000  14452R    JMP A903
14450                  A902 EQU *
14450   1721  77721A    LDA V25 MRKR
14451  22000   1277R    ADA =D-1
14452                  A903 EQU *
14452  42000    122X    JSX CNV42
14453  42000    157X    JSX MPY2T
14454  42000  13062R    JSM P793  NDUMP
14455  66000  14510R    JMP A904
14456                  A901 EQU *
14456   1675  77675A    LDA V15 BLEDS
14457 170601            SAL 2
14460 172011            SAP A905
14461  42000     37X    JSX .LDBI
14462         77645A    DEF V32677  MFREQ
14463  71500            NRM
14464  35572  77572A    STB V32634  J
14465  42000     37X    JSX .LDBI
14466         77671A    DEF V9  SPAN
14467  71500            NRM
14470  35573  77573A    STB V32635  I
14471                  A905 EQU *
14471   2000   1457R    LDA =D1
14472  70540            PWC A
14473   5675  77675A    LDB V15 BLEDS
14474 174601            SBL 2
14475   2000   1277R    LDA =B177777
14476 176006            SBP A906
14477  42000   5033R    JSM P443  CPERIOD
14500  22000   1704R    ADA =D6
14501 170040            TCA
14502  21572  77572A    ADA V32634  J
14503 170040            TCA
14504                  A906 EQU *
14504  70540            PWC A
14505  42000     37X    JSX .LDBI
14506         77645A    DEF V32677  MFREQ
14507  42000  13062R    JSM P793  NDUMP
14510                  A904 EQU *
14510  66000  14740R    JMP A907
14511                  A900 EQU *
14511   6000   1301R    LDB =D-3  N
14512  42000     30X    JSX .LDAP
14513  22000  14714R    ADA =D-25
14514  66000  14737R    JMP A908
14515                  C909 EQU *
14515   2000   1463R    LDA =D0
14516  70540            PWC A
14517   2000   2276R    LDA =D2
14520  70540            PWC A
14521   1735  77735A    LDA V32733  HPIB
14522  42000    122X    JSX CNV42
14523  42000  13062R    JSM P793  NDUMP
14524  66000  14740R    JMP A910
14525                  C911 EQU *
14525   2000   1463R    LDA =D0
14526  70540            PWC A
14527   2000   1456R    LDA =D12
14530  70540            PWC A
14531  42000     37X    JSX .LDBI
14532         77651A    DEF V32681  LTEMP
14533  42000  13062R    JSM P793  NDUMP
```

```
14534  66000  14740R     JMP A910
14535                   C912 EQU *
14535   2000   1704R     LDA =D6
14536  70540             PWC A
14537   2000   2411R     LDA =D4
14540  70540             PWC A
14541  42000   2303R     JSM P277   GOFSET
14542  42000    122X     JSX CNV42
14543  42000  13062R     JSM P793   NDUMP
14544  66000  14740R     JMP A910
14545                   C913 EQU *
14545   2000   1457R     LDA =D1
14546  70540             PWC A
14547  70540             PWC A
14550   1730  77730A     LDA V30 KFLAG
14551 170605             SAL 6
14552 172012             SAP A914
14553   1577  77577A     LDA V32639  CTBASE
14554 170040             TCA
14555  22000   1704R     ADA =D6
14556  70540             PWC A
14557  42000     53X     JSX .LDSI
14560          1457R     DEF =D1
14561  70761             WWC B
14562  42000     51X     JSX .DLFT
14563  66000  14566R     JMP A915
14564                   A914 EQU *
14564  42000     53X     JSX .LDSI
14565          1463R     DEF =D0
14566                   A915 EQU *
14566  42000  13062R     JSM P793   NDUMP
14567  66000  14740R     JMP A910
14570                   C916 EQU *
14570   2000   1463R     LDA =D0
14571  70540             PWC A
14572   2000   2405R     LDA =D5
14573  70540             PWC A
14574   1610  77610A     LDA V32648   ALIM
14575  42000    122X     JSX CNV42
14576  42000  13062R     JSM P793   NDUMP
14577  66000  14740R     JMP A910
14600                   C917 EQU *
14600   2000   1463R     LDA =D0
14601  70540             PWC A
14602   2000   2107R     LDA =D3
14603  70540             PWC A
14604  42000     37X     JSX .LDBI
14605         77655A     DEF V32685   LTEMP2
14606  42000  13062R     JSM P793   NDUMP
14607  66000  14740R     JMP A910
14610                   C918 EQU *
14610   2000   1704R     LDA =D6
14611  70540             PWC A
14612   2000   2411R     LDA =D4
14613  70540             PWC A
14614   1706  77706A     LDA V31 ROFSET
14615  42000    122X     JSX CNV42
14616  42000  13062R     JSM P793   NDUMP
14617  66000  14740R     JMP A910
14620                   C919 EQU *
14620   2000   1457R     LDA =D1
14621  70540             PWC A
14622   2000   1277R     LDA =B177777
14623  70540             PWC A
14624  42000     37X     JSX .LDBI
14625         77707A     DEF V11 FOFSET
14626  42000  13062R     JSM P793   NDUMP
14627  66000  14740R     JMP A910
14630                   C920 EQU *
14630   2000   1457R     LDA =D1
14631  70540             PWC A
14632   2000   1456R     LDA =D12
14633  70540             PWC A
14634  42000     37X     JSX .LDBI
14635         77625A     DEF V32661   CSIGNL
14636  42000  13062R     JSM P793   NDUMP
14637   1601  77601A     LDA V32641   HPBC
14640 172005             SAP A921
14641   2000   2723R     LDA =B54
14642  42000     17X     JSM P206   WHPIB
14643   2000   2172R     LDA =D13
14644  42000  14055R     JSM P216   MESSAGE
14645                   A921 EQU *
14645  66000  14740R     JMP A910
14646                   C922 EQU *
14646   2000   2477R     LDA =D36
14647  42000  14055R     JSM P216   MESSAGE
14650  66000  14740R     JMP A910
14651                   C923 EQU *
14651   2000   2477R     LDA =D36
14652  42000  14055R     JSM P216   MESSAGE
14653  66000  14740R     JMP A910
14654                   C924 EQU *
14654   2000   2276R     LDA =D2
14655  70540             PWC A
14656   2000   2107R     LDA =D3
```

```
14657  70540              PWC A
14660  42000        37X   JSX .LDBI
14661           77625A    DEF*V32651  CSIGNL
14662  42000    13062R    JSM P793   NDUMP
14663  66000    14740R    JMP A910
14664                   C925 EQU *
14664   2000     1463R    LDA =D0
14665  70540              PWC A
14666   2000     2411R    LDA =D4
14667  70540              PWC A
14670   1563    77563A    LDA V32627   DSTAD
14671  42000      122X    JSX CNV42
14672  42000    13062R    JSM P793   NDUMP
14673  66000    14740R    JMP A910
14674                   C926 EQU *
14674   2000     2411R    LDA =D4
14675  70540              PWC A
14676  70540              PWC A
14677   1730    77730A    LDA V30 KFLAG
14700 170515              SAR 14
14701  12000     2107R    CPA =D3
14702  66000    14704R    JMP *+2
14703  66000    14710R    JMP A927
14704  42000     3314R    JSM P340   MXRLVL
14705  42000      122X    JSX CNV42
14706  42000     1736R    JSM P248   NANOV
14707  66000    14712R    JMP A928
14710                   A927 EQU *
14710  42000     3314R    JSM P340   MXRLVL
14711  42000      122X    JSX CNV42
14712                   A928 EQU *
14712  42000    13062R    JSM P793   NDUMP
14713  66000    14740R    JMP A910
14714 177747
14714                     LIT
14715           14674R    DEF C926
14716           14740R    DEF A910
14717           14664R    DEF C925
14720           14654R    DEF C924
14721           14651R    DEF C923
14722           14646R    DEF C922
14723           14630R    DEF C920
14724           14620R    DEF C919
14725           14610R    DEF C918
14726           14600R    DEF C917
14727           14570R    DEF C916
14730           14545R    DEF C913
14731           14740R    DEF A910
14732           14535R    DEF C912
14733           14740R    DEF A910
14734           14525R    DEF C911
14735           14515R    DEF C909
14736                     DEC -18
14737  42000      143X  A908  JSX .CASE
14740                   A910 EQU *
14740                   A907 EQU *
14740  66000       31X    JMX ,RTNA
14741                   P929  EQU * ENTRY
14741   6000     1277R    LDB =D-1
14742  42000       27X    JSX .ARGA
14743 172002              SAP *+2
14744 170040              TCA
14745  31576    77576A    STA V32638   RPGPTR
14746  31620    77620A    STA V32656   PREFIX
14747  42000      113X    JSX DIV4
14750            1704R    DEF =D6
14751  12000     2107R    CPA =D3
14752  66000    14754R    JMP *+2
14753  66000    14756R    JMP A930
14754   2000     7565R    LDA =D18
14755  31576    77576A    STA V32638   RPGPTR
14756                   A930 EQU *
14756   2000     1463R    LDA =D0
14757  31564    77564A    STA V32628   RPGCNT
14760  31431    77431A    STA V32537   RPGSWP
14761   2000     2107R    LDA =D3
14762   6000     2107R    LDB =D3
14763  42000       75X    JSX .WS4
14764   6000     1301R    LDB =D-3   N
14765  42000       30X    JSX .LDAP
14766 172003              SAP A931
14767   2000     1463R    LDA =D0
14770  31576    77576A    STA V32638   RPGPTR
14771                   A931 EQU *
14771  42000    13777R    JSM P865   DSPITEM
14772  42000     2551R    JSM P298   ABLK
14773   1616    77616A    LDA V32654   XFLAG
14774 170600              SAL 1
14775 172013              SAP A932
14776   1620    77620A    LDA V32656   PREFIX
14777  12000    10243R    CPA =D27
15000  66000    15004R    JMP A934
15001   1740    77740A    LDA V32736   EFLAG
15002 170606              SAL 7
15003 172003              SAP A933
15004                   A934 EQU *
15004   2000    15026R    LDA =B7760
15005  66000    15007R    JMP A935
15006                   A933 EQU *
```

```
15006    2000    6514R    LDA =B77777
15007                   A935 EQU *
15007   31565   77565A    STA V32629  SRQEN
15010                   A932 EQU *
15010    1576   77576A    LDA V32638  RPGPTR
15011   42000     111X    JSX .EGL
15012   70540             PWC A
15013    1565   77565A    LDA V32629  SRQEN
15014   52000   15026R    AND =B7760
15015   22000   15027R    ADA =B170020
15016   42000     111X    JSX .EQL
15017   42000     136X    JSX .ORT
15020  170140             CMA
15021   42000     104X    JSX .TURN
15022             5517R   DEF =B100000
15023            77565A   DEF V32629  SRQEN
15024   31565   77565A    STA V32629  SRQEN
15025   66000      31X    JMX .RTNA
15026    7760
15027  170020
15026                    LIT
15030                   P936  EQU * ALTCK
15030    1676   77676A    LDA V16 TLEDS
15031   52000    6233R    AND =B600
15032   22000    6234R    ADA =B177200
15033   72013            RZA A937
15034    1566   77566A    LDA V32630  KEYCODE
15035  170040             TCA
15036   22000   15047R    ADA =B145
15037  172004            SAP A938
15040    1702   77702A    LDA V24 VIDCON
15041   52000    2110R    AND =B177776
15042   66000   15045R    JMP A939
15043                   A938 EQU *
15043    1702   77702A    LDA V24 VIDCON
15044   62000    1457R    IOR =D1
15045                   A939 EQU *
15045   31702   77702A    STA V24 VIDCON
15046                   A937 EQU *
15046  170201             RET 1
15047     145
15047                    LIT
15050                   P223  EQU * AMPU
15050    6000    1277R    LDB =D-1
15051   42000      27X    JSX .ARGA
15052   42000    1665R    JSM P245  RLAD
15053   31573   77573A    STA V32635  I
15054    6000    1301R    LDB =D-3  N
15055   42000      30X    JSX .LDAP
15056   42000     104X    JSX .TURN
15057             4533R   DEF =B140000
15060            77730A   DEF V30 KFLAG
15061   31730   77730A    STA V30 KFLAG
15062    1573   77573A    LDA V32635  I
15063  170040             TCA
15064   21700   77700A    ADA V22 RLVL
15065   70540             PWC A
15066   42000    1665R    JSM P245  RLAD
15067   42000      57X    JSX ADD4T
15070   31700   77700A    STA V22 RLVL
15071    2000    2405R    LDA =D5
15072   42000    2314R    JSM P279  SBLK
15073    1675   77675A    LDA V15 BLEDS
15074  170612             SAL 11
15075  172003            SAP A940
15076    2000    3527R    LDA =D14
15077   42000    2314R    JSM P279  SBLK
15100                   A940 EQU *
15100    1675   77675A    LDA V15 BLEDS
15101  170611             SAL 10
15102  172003            SAP A941
15103    2000    2131R    LDA =D15
15104   42000    2314R    JSM P279  SBLK
15105                   A941 EQU *
15105    1723   77723A    LDA V26 MKRMODE
15106   72407            SZA A942
15107   42000   10323R    JSM P626  MRKROK
15110  172005            SAP A942
15111    2000    6703R    LDA =D1024
15112   70540             PWC A
15113    2000    2521R    LDA =D17
15114   42000    2522R    JSM P297  RJUST
15115                   A942 EQU *
15115   42000   10301R    JSM P624  MKRACT
15116   66000      31X    JMX .RTNA
15117                   P943  EQU * SMODE
15117    1675   77675A    LDA V15 BLEDS
15120  170613             SAL 12
15121  172404            SAM A945
15122    1730   77730A    LDA V30 KFLAG
15123  170614             SAL 13
15124  172003            SAP A944
15125                   A945 EQU *
15125    2000   15047R    LDA =B145
15126   66000   15130R    JMP A946
15127                   A944 EQU *
15127    2000   15132R    LDA =B141
15130                   A946 EQU *
15130   42000     555R    JSM P215  SKEY
```

```
15131 170201              RET 1
15132    141
15132                    LIT
15133                    P947  EQU * TRNOFF
15133   6000    1277R     LDB =D-1
15134  42000      27X     JSX .ARGA
15135  11620   77620A     CPA V32656  PREFIX
15136  66000   15140R     JMP *+2
15137  66000   15142R     JMP A948
15140   2000    1463R     LDA =D0
15141  42000   14741R     JSM P929  ENTRY
15142                    A948 EQU *
15142  66000      31X     JMX .RTNA
15143                    P949  EQU * UNBLANK
15143   1575   77575A     LDA V32637  K
15144  12000    2107R     CPA =D3
15145  66000   15222R     JMP A950
15146   6000    2221R     LDB =D9
15147  42000      74X     JSX .RS5
15150  31742   77742A     STA V32738  IX
15151   6000    2203R     LDB =D8
15152  42000      74X     JSX .RS5
15153  31742   77742A     STA V32738  IX
15154  52000    3166R     AND =B1777
15155  31742   77742A     STA V32738  IX
15156   1676   77676A     LDA V16 TLEDS
15157  52000    1704R     AND =D6
15160  72404             SZA A951
15161   1742   77742A     LDA V32738  IX
15162  22000    6703R     ADA =D1024
15163  31742   77742A     STA V32738  IX
15164                    A951 EQU *
15164                    A952 EQU *
15164   1742   77742A     LDA V32738  IX
15165  42000     103X     JSX .W4
15166   2000    1375R     LDA =B177767
15167  70540              PWC A
15170   2000    1463R     LDA =D0
15171                    A953 EQU *
15171  31573   77573A     STA V32635  I
15172  42000     162X     JSX .R5
15173  31572   77572A     STA V32634  J
15174   1573   77573A     LDA V32635  I
15175  21742   77742A     ADA V32738  IX
15176  42000     103X     JSX .W4
15177   5572   77572A     LDB V32634  J
15200 174604              SBL 5
15201   1572   77572A     LDA V32634  J
15202 176402             SBM A954
15203  52000    7567R     AND =B173777
15204                    A954 EQU *
15204  42000      73X     JSX .W6
15205   2000    1457R     LDA =D1
15206  21573   77573A     ADA V32635  I
15207 144016      16A     ISZ C,I
15210  66000   15171R     JMP A953
15211  54016      16A     DSZ C
15212   1742   77742A     LDA V32738  IX
15213  22000    6703R     ADA =D1024
15214  31742   77742A     STA V32738  IX
15215  22000   15223R     ADA =D-2048
15216 172004             SAP A955
15217   1676   77676A     LDA V16 TLEDS
15220  52000    3231R     AND =B60
15221  72443             SZA A952
15222                    A955 EQU *
15222                    A950 EQU *
15222 170201              RET 1
15223 174000
15223                    LIT
15224                    P221  EQU * TRIGR
15224  66000   15235R     JMP A956
15225                    T957 EQU *
15225                    K958  OCT 140000  140000
15226                    K959  OCT 50000 50000
15227                    K960  OCT 44000 44000
15230                     DEC 0 0
15231                    K961  OCT 54000 54000
15232          15225R    V962 DEF T957 MTRIG
15233                     OCT 177777  177777
15234                    K963  OCT 5 5
15235                    A956  EQU *
15235   1607   77607A     LDA V32647  ACNT
15236 172003             SAP A964
15237   2000    1463R     LDA =D0
15240  31607   77607A     STA V32647  ACNT
15241                    A964 EQU *
15241  42000    2650R     JSM P304  UNCAL
15242  42000   15143R     JSM P949  UNBLANK
15243   1676   77676A     LDA V16 ILEDS
15244 170512              SAR 11
15245  52000    2406R     AND =D7
15246  22000    1457R     ADA =D1
15247  42000      60X     JSX .ARAY
15250          15232R     DEF V962  MTRIG
15251  31703   77703A     STA V21 STRIG
15252 172005             SAP A965
15253   1733   77733A     LDA V20 FSTIM
15254 172003             SAP A965
```

```
15255    2000   4534R    LDA =B40000
15256   31703  77703A    STA V21 STRIG
15257                   A965 EQU *
15257    1730  77730A    LDA V30 KFLAG
15260  170613            SAL 12
15261  172006           SAP A966
15262    1733  77733A    LDA V20 FSTIM
15263  172004           SAP A966
15264    1703  77703A    LDA V21 STRIG
15265   52000   2645R    AND =B137777
15266   31703  77703A    STA V21 STRIG
15267                   A966 EQU *
15267    1603  77603A    LDA V32643  PLOCK
15270   52000   7567R    AND =B173777
15271   31603  77603A    STA V32643  PLOCK
15272   42000   6160R    JSM P502  EOS
15273  170201            RET 1
15274                   P967  EQU * TMODE
15274    6000   1277R    LDB =D-1
15275   42000     27X    JSX .ARGA
15276   42000    104X    JSX .TURN
15277          15312R    DEF =B34000
15300          77676A    DEF V16 ILEDS
15301   42000   2163R    JSM P270  ILEDSOUf
15302    6000   1301R    LDB =D-3  N
15303   42000     30X    JSX .LDAP
15304   42000    104X    JSX .TURN
15305           2203R    DEF =D8
15306          77730A    DEF V30 KFLAG
15307   31730  77730A    STA V30 KFLAG
15310   42000  15224R    JSM P221  TRIGR
15311   66000     31X    JMX .RTNA
15312   34000
15312                    LII
15313                   P968  EQU * CFDF
15313    6000   1277R    LDB =D-1
15314   42000     27X    JSX .ARGA
15315   42000    104X    JSX .TURN
15316           1457R    DEF =D1
15317          77675A    DEF V15 BLEDS
15320   31675  77675A    STA V15 BLEDS
15321   52000   1457R    AND =D1
15322  170600            SAL 1
15323   22000   2406R    ADA =D7
15324   42000   2223R    JSM P274  NBLK
15325    1675  77675A    LDA V15 BLEDS
15326   52000   1457R    AND =D1
15327  170600            SAL 1
15330   22000   2203R    ADA =D8
15331   42000   2223R    JSM P274  NBLK
15332   42000   6723R    JSM P538  CSBLK
15333   66000     31X    JMX .RTNA
15334                   P969  EQU * CLRDA
15334    1620  77620A    LDA V32656  PREFIX
15335   12000  15343R    CPA =D40
15336   66000  15340R    JMP *+2
15337   66000  15342R    JMP A970
15340    2000   1463R    LDA =D0
15341   42000  14741R    JSM P929  ENTRY
15342                   A970 EQU *
15342  170201            RET 1
15343      50
15343                    LIT
15344                   P971  EQU * USFT
15344    1676  77676A    LDA V16 ILEDS
15345   52000  15350R    AND =B176777
15346   42000   2163R    JSM P270  ILEDSOUT
15347  170201            RET 1
15350  176777
15350                    LIf
15351                   P972  EQU * SAVPREP
15351    1601  77601A    LDA V32641  HPBC
15352   52000  15404R    AND =B177400
15353   61577  77577A    IOR V32639  CTBASE
15354   31671  77671A    STA V46 CTBSV
15355    1610  77610A    LDA V32648  ALIM
15356  170600            SAL 1
15357   61713  77713A    IOR V45 ALIMSV
15360   31713  77713A    STA V45 ALIMSV
15361    1740  77740A    LDA V32736  EFLAG
15362   42000    104X    JSX .TURN
15363           1363R    DEF =B177774
15364          77724A    DEF V49 EFLGSV
15365   70540            PWC A
15366    1426  77426A    LDA V32534  UFLAG
15367  170501            SAR 2
15370   52000   2276R    AND =D2
15371   42000    136X    JSX .ORT
15372   31724  77724A    STA V49 EFLGSV
15373    1433  77433A    LDA V32539  GIN1
15374  170600            SAL 1
15375   61665  77665A    IOR V47 GIN1SV
15376   31665  77665A    STA V47 GIN1SV
15377    1432  77432A    LDA V32538  GIN2
15400  170600            SAL 1
15401   61707  77707A    IOR V48 GIN2SV
15402   31707  77707A    STA V48 GIN2SV
15403  170201            RET 1
15404  177400
```

```
15404                        LIT
15405                       P973  EQU * SAVCLR
15405    2000     1463R       LDA =D0
15406   31671    77671A       STA V46 CTBSV
15407    1713    77713A       LDA V45 ALIMSV
15410   52000     1457R       AND =D1
15411   31713    77713A       STA V45 ALIMSV
15412    1724    77724A       LDA V49 EFLGSV
15413   52000     1457R       AND =D1
15414   31724    77724A       STA V49 EFLGSV
15415    1665    77665A       LDA V47 GIN1SV
15416   52000     1457R       AND =D1
15417   31665    77665A       STA V47 GIN1SV
15420    1707    77707A       LDA V48 GIN2SV
15421   52000     1457R       AND =D1
15422   31707    77707A       STA V48 GIN2SV
15423  170201                 RET 1
15424                       P974  EQU * SAVFIX
15424    1713    77713A       LDA V45 ALIMSV
15425  170500                 SAR 1
15426   31610    77610A       STA V32648  ALIM
15427    1671    77671A       LDA V46 CTBSV
15430   52000     3242R       AND =B377
15431   31577    77577A       STA V32639  CTBASE
15432    1724    77724A       LDA V49 EFLGSV
15433   42000      104X       JSX .TURN
15434            15467R       DEF =B143454
15435            77740A       DEF V32736  EFLAG
15436   31740    77740A       STA V32736  EFLAG
15437    1724    77724A       LDA V49 EFLGSV
15440  170601                 SAL 2
15441   42000      104X       JSX .TURN
15442             2203R       DEF =D8
15443            77426A       DEF V32534  UFLAG
15444   31426    77426A       STA V32534  UFLAG
15445    1671    77671A       LDA V46 CTBSV
15446   42000      104X       JSX .TURN
15447            15470R       DEF =B1400
15450            77601A       DEF V32641  HPBC
15451   31601    77601A       STA V32641  HPBC
15452    6000     1704R       LDB =D6
15453   42000       74X       JSX .RS5
15454   31572    77572A       STA V32634  J
15455  170601                 SAL 2
15456  172407                SAM A975
15457    1665    77665A       LDA V47 GIN1SV
15460  170400                 AAR 1
15461   31433    77433A       STA V32539  GIN1
15462    1707    77707A       LDA V48 GIN2SV
15463  170400                 AAR 1
15464   31432    77432A       STA V32538  GIN2
15465                       A975 EQU *
15465   42000    15405R       JSM P973  SAVCLR
15466  170201                 RET 1
15467  143454
15470    1400
15467                        LIT
15471                       P976  EQU * NUMBER
15471    1620    77620A       LDA V32656  PREFIX
15472   72002                 RZA *+2
15473   66000    15531R       JMP A977
15474   42000    12317R       JSM P733  CLRNUM
15475    1611    77611A       LDA V32649  CHRC
15476   22000     7243R       ADA =D-12
15477  172017                SAP A978
15500   42000       37X       JSX .LDBI
15501            77651A       DEF V32681  LTEMP
15502    1566    77566A       LDA V32630  KEYCODE
15503   75541                 MLY
15504   42000       34X       JSX .STRD
15505            77651A       DEF V32681  LTEMP
15506   42000    12302R       JSM P732  WKEY
15507    1617    77617A       LDA V32655  DECFLG
15510  172006                SAP A979
15511    1601    77601A       LDA V32641  HPBC
15512  170600                 SAL 1
15513  172403                SAM A979
15514   55617    77617A       DSZ V32655  DECFLG
15515                         NOP
15516                       A979 EQU *
15516                       A978 EQU *
15516    1620    77620A       LDA V32656  PREFIX
15517  170500                 SAR 1
15520   12000     1456R       CPA =D12
15521   66000    15523R       JMP *+2
15522   66000    15531R       JMP A980
15523    2000     2411R       LDA =D4
15524    6000     2411R       LDB =D4
15525   42000      112X       JSX .WS7
15526    1616    77616A       LDA V32654  XFLAG
15527   62000     5517R       IOR =B100000
15530   31616    77616A       STA V32654  XFLAG
15531                       A980 EQU *
15531                       A977 EQU *
15531  170201                 RET 1
15532                       P981  EQU * DSPW
15532    1620    77620A       LDA V32656  PREFIX
15533   12000    15544R       CPA =D41
15534   66000    15536R       JMP *+2
```

```
15535  66000  15541R     JMP A983
15536   1616  77616A     LDA V32654   XFLAG
15537 170602             SAL 3
15540 172403             SAM A982
15541                   A983 EQU *
15541   2000  15545R     LDA =B177727
15542  42000  14741R     JSM P929  ENTRY
15543                   A982 EQU *
15543 170201             RET 1
15544     51
15545 177727
15544                    LIT
15546                   P214  EQU * KEY
15546   6000   1277R     LDB =D-1
15547  42000     27X     JSX .ARGA
15550  31566  77566A     STA V32630   KEYCODE
15551   2000   1463R     LDA =D0
15552  31564  77564A     STA V32628   RPGCNT
15553   1616  77616A     LDA V32654   XFLAG
15554  52000  15666R     AND =B77776
15555  31616  77616A     STA V32654   XFLAG
15556   1601  77601A     LDA V32641   HPBC
15557 170140             CMA
15560 170600             SAL 1
15561  51616  77616A     AND V32654   XFLAG
15562 170600             SAL 1
15563 172033            SAP A985
15564   1740  77740A     LDA V32736   EFLAG
15565 170606             SAL 7
15566 172405            SAM A988
15567   1620  77620A     LDA V32656   PREFIX
15570  12000  10243R     CPA =D27
15571  66000  15573R     JMP *+2
15572  66000  15601R     JMP A987
15573                   A988 EQU *
15573   1566  77566A     LDA V32630   KEYCODE
15574  22000  15667R     ADA =B-47
15575 172421            SAM A986
15576   1566  77566A     LDA V32630   KEYCODE
15577  12000  10240R     CPA =B57
15600  66000  15616R     JMP A986
15601                   A987 EQU *
15601   1620  77620A     LDA V32656   PREFIX
15602  12000  10243R     CPA =D27
15603  66000  15605R     JMP *+2
15604  66000  24634R     JMP L984  EXIT
15605   1566  77566A     LDA V32630   KEYCODE
15606 170040             TCA
15607  22000  15670R     ADA =B55
15610 172402             SAM *+2
15611  66000  24634R     JMP L984  EXIT
15612   1566  77566A     LDA V32630  KEYCODE
15613  22000  15671R     ADA =B-72
15614 172402             SAM *+2
15615  66000  24634R     JMP L984  EXIT
15616                   A986 EQU *
15616                   A985 EQU *
15616   1676  77676A     LDA V16 TLEDS
15617 170605             SAL 6
15620 172402             SAM *+2
15621  66000  15702R     JMP A989
15622   1566  77566A     LDA V32630   KEYCODE
15623  12000   2204R     CPA =B12
15624  66000  15637R     JMP A991
15625  12000   2107R     CPA =D3
15626  66000  15637R     JMP A991
15627   1566  77566A     LDA V32630   KEYCODE
15630  11736  77736A     CPA V32734   ETX
15631  66000  15633R     JMP *+2
15632  66000  15641R     JMP A990
15633   1620  77620A     LDA V32656   PREFIX
15634  12000   1456R     CPA =D12
15635  66000  15637R     JMP *+2
15636  66000  15641R     JMP A990
15637                   A991 EQU *
15637   2000  15672R     LDA =B140
15640  31566  77566A     STA V32630   KEYCODE
15641                   A990 EQU *
15641   1566  77566A     LDA V32630   KEYCODE
15642  12000  15673R     CPA =B52
15643  66000  15645R     JMP *+2
15644  66000  15647R     JMP A992
15645   2000  15670R     LDA =B55
15646  31566  77566A     STA V32630   KEYCODE
15647                   A992 EQU *
15647   1620  77620A     LDA V32656   PREFIX
15650  12000   1456R     CPA =D12
15651  66000  15653R     JMP *+2
15652  66000  15674R     JMP A993
15653   1566  77566A     LDA V32630   KEYCODE
15654  12000  15672R     CPA =B140
15655  66000  15674R     JMP A993
15656   1566  77566A     LDA V32630   KEYCODE
15657  12000   3042R     CPA =B45
15660  66000  15674R     JMP A993
15661   1611  77611A     LDA V32649   CHRC
15662  22000  15671R     ADA =D-58
15663 172002            SAP A994
```

```
15664  42000   12302R     JSM P732   WKEY
15665                    A994 EQU *
15665  66000   24634R     JMP L984   EXIT
15666  77776
15667 177731
15670     55
15671 177706
15672    140
15673     52
15666                      LIT
15674                    A993 EQU *
15674   1566   77566A     LDA V32630  KEYCODE
15675  22000   15701R     ADA =B-40
15676 172002             SAP A996
15677  42000   15344R     JSM P971   USFT
15700                    A996 EQU *
15700                    A995 EQU *
15700  66000   15712R     JMP A997
15701 177740
15701                      LIT
15702                    A989 EQU *
15702   1566   77566A     LDA V32630  KEYCODE
15703  22000    3232R     ADA =B-60
15704 172406             SAM A998
15705   1566   77566A     LDA V32630  KEYCODE
15706  22000   15671R     ADA =B-72
15707 172003             SAP A998
15710  42000   15471R     JSM P976   NUMBER
15711  66000   24634R     JMP L984   EXIT
15712                    A998 EQU *
15712                    A997 EQU *
15712   1566   77566A     LDA V32630  KEYCODE
15713 170504               SAR 5
15714  22000    1457R     ADA =D1
15715  66000   24626R     JMP A999
15716                    C1000 EQU *
15716   1566   77566A     LDA V32630  KEYCODE
15717  22000    1457R     ADA =D1
15720  66000   16754R     JMP A1001
15721                    C1002 EQU *
15721   1616   77616A     LDA V32654  XFLAG
15722 170515               SAR 14
15723   6000   15026R     LDB =B7760
15724  75617               MPY
15725  42000     104X     JSX .TURN
15726            6514R     DEF =B77777
15727           77565A     DEF V32629  SRQEN
15730  31565   77565A     STA V32629  SRQEN
15731   6000    2276R     LDB =D2
15732  42000     107X     JSX .WS5
15733   1740   77740A     LDA V32736  EFLAG
15734  52000   16167R     AND =B175377
15735  62000   11310R     IOR =B400
15736  31740   77740A     STA V32736  EFLAG
15737  66000   16755R     JMP A1003
15740                    C1004 EQU *
15740   1676   77676A     LDA V16 TLEDS
15741  52000   16170R     AND =B611
15742  72410              SZA A1005
15743   1740   77740A     LDA V32736  EFLAG
15744  62000    2277R     IOR =B4000
15745  31740   77740A     STA V32736  EFLAG
15746   1601   77601A     LDA V32641  HPBC
15747  52000   16171R     AND =B157777
15750  31601   77601A     STA V32641  HPBC
15751  42000   15224R     JSM P221   TRIGR
15752                    A1005 EQU *
15752  66000   16755R     JMP A1003
15753                    C1006 EQU *
15753  42000   12474R     JSM P744   UNITS
15754  66000   16755R     JMP A1003
15755                    C1007 EQU *
15755  42000   15224R     JSM P221   TRIGR
15756   1740   77740A     LDA V32736  EFLAG
15757  52000   16172R     AND =B174777
15760  62000    1300R     IOR =B1000
15761  31740   77740A     STA V32736  EFLAG
15762  66000   16755R     JMP A1003
15763                    C1008 EQU *
15763   2000    2411R     LDA =D4
15764  42000    3046R     JSM P321   CLEAR
15765   2000    6352R     LDA =D3072
15766  31563   77563A     STA V32627  DSTAD
15767   1426   77426A     LDA V32534  UFLAG
15770  52000   16173R     AND =B177733
15771  31426   77426A     STA V32534  UFLAG
15772  42000    2650R     JSM P304   UNCAL
15773  66000   16755R     JMP A1003
15774                    C1009 EQU *
15774   1740   77740A     LDA V32736  EFLAG
15775  52000   16174R     AND =B174377
15776  62000    6703R     IOR =B2000
15777  31740   77740A     STA V32736  EFLAG
16000   1616   77616A     LDA V32654  XFLAG
16001 170600               SAL 1
16002 172021             SAP A1010
16003   1620   77620A     LDA V32656  PREFIX
16004  12000   10243R     CPA =D27
16005  66000   16023R     JMP A1010
```

```
16006   1565  77565A       LDA V32629   SRQEN
16007  52000   5517R       AND =B100000
16010  62000   6514R       IOR =B77777
16011  31565  77565A       STA V32629   SRQEN
16012   6000   2276R       LDB =D2
16013  42000    107X       JSX .WS5
16014   2000   2411R       LDA =D4
16015  42000   3214R       JSM P332   WAIT
16016   2000   2107R       LDA =D3
16017   6000   2107R       LDB =D3
16020  42000     75X       JSX .WS4
16021   2000   2411R       LDA =D4
16022  42000    103X       JSX .W4
16023                A1010 EQU *
16023  66000  16755R       JMP A1003
16024                C1011 EQU *
16024   1740  77740A       LDA V32736   EFLAG
16025  52000   5521R       AND =B175777
16026  31740  77740A       STA V32736   EFLAG
16027  66000  16755R       JMP A1003
16030                C1012 EQU *
16030   1601  77601A       LDA V32641   HPBC
16031  52000  16175R       AND =B176377
16032  62000  11310R       IOR =B400
16033  31601  77601A       STA V32641   HPBC
16034  66000  16755R       JMP A1003
16035                C1013 EQU *
16035   1601  77601A       LDA V32641   HPBC
16036  52000  16175R       AND =B176377
16037  62000   1300R       IOR =B1000
16040  31601  77601A       STA V32641   HPBC
16041  66000  16755R       JMP A1003
16042                C1014 EQU *
16042  42000  13045R       JSM P791   OHPB
16043  42000     24X       JSM P211   IHPIB
16044  31567  77567A       STA V32631   KEYCOL
16045  42000     53X       JSX .LDSI
16046          1463R       DEF =D0
16047  42000     34X       JSX .STRD
16050         77655A       DEF V32685   LTEMP2
16051   1567  77567A       LDA V32631   KEYCOL
16052  52000   2406R       AND =D7
16053  31660  77660A       STA V36 BCDC
16054   1567  77567A       LDA V32631   KEYCOL
16055 170600               SAL 1
16056  42000    104X       JSX .TURN
16057         16176R       DEF =B160
16060         77660A       DEF V36 BCDC
16061  31660  77660A       STA V36 BCDC
16062   1567  77567A       LDA V32631   KEYCOL
16063 170601               SAL 2
16064  42000    104X       JSX .TURN
16065         16177R       DEF =B3400
16066         77660A       DEF V36 BCDC
16067  31660  77660A       STA V36 BCDC
16070  42000   7732R       JSM P599   FPNLON
16071   2000  16200R       LDA =D33
16072  42000   2501R       JSM P295   BLINK
16073   2000  16200R       LDA =D33
16074  42000   2314R       JSM P279   SBLK
16075  66000  16755R       JMP A1003
16076                C1015 EQU *
16076   1601  77601A       LDA V32641   HPBC
16077  52000  16175R       AND =B176377
16100  62000  15470R       IOR =B1400
16101  31601  77601A       STA V32641   HPBC
16102  66000  16755R       JMP A1003
16103                C1016 EQU *
16103  42000  13045R       JSM P791   OHPB
16104   2000  16201R       LDA =D1025
16105  31573  77573A       STA V32635   I
16106   2000   3112R       LDA =D1001
16107  70540               PWC A
16110  42000    166X       JSX .CSHV
16111         77573A       DEF V32635   I
16112  42000     25X       JSM P212   IHPBT
16113  66000  16755R       JMP A1003
16114                C1017 EQU *
16114   1676  77676A       LDA V16 ILEDS
16115 170605               SAL 6
16116 172403               SAM A1018
16117   2000  16200R       LDA =D33
16120  42000   2434R       JSM P285   BLKOF
16121                A1018 EQU *
16121  66000  16755R       JMP A1003
16122                C1019 EQU *
16122   1601  77601A       LDA V32641   HPBC
16123  52000  16175R       AND =B176377
16124  31601  77601A       STA V32641   HPBC
16125  66000  16755R       JMP A1003
16126                C1020 EQU *
16126  42000  15532R       JSM P981   DSPW
16127  42000  13045R       JSM P791   OHPB
16130  42000     24X       JSM P211   IHPIB
16131 170607               SAL 8
16132  31572  77572A       STA V32634   J
16133  42000     24X       JSM P211   IHPIB
16134  61572  77572A       IOR V32634   J
16135  42000  12265R       JSM P731   DSWRT
16136  66000  16755R       JMP A1003
```

```
16137                      C1021 EQU *
16137  42000    13045R       JSM P791   OHPB
16140  42000    10323R       JSM P626   MRKROK
16141 172402                 SAM *+2
16142  66000    16220R       JMP A1022
16143   1723    77723A       LDA V26 MKRMODE
16144  72002                 RZA *+2
16145  66000    16220R       JMP A1022
16146   1675    77675A       LDA V15 BLEDS
16147 170601                 SAL 2
16150 172010                SAP A1023
16151   1426    77426A       LDA V32534   UFLAG
16152 170610                 SAL 9
16153 172005                SAP A1023
16154   1601    77601A       LDA V32641   HPBC
16155  52000    15470R       AND =B1400
16156  72002                 RZA *+2
16157  66000    16220R       JMP A1022
16160                      A1023 EQU *
16160   1601    77601A       LDA V32641   HPBC
16161  52000    15470R       AND =B1400
16162  72020                RZA A1024
16163   2000     7565R       LDA =D18
16164  42000    14055R       JSM P216   MESSAGE
16165  42000    13030R       JSM P789   WCRLF
16166  66000    16217R       JMP A1025
16167 175377
16170    611
16171 157777
16172 174777
16173 177733
16174 174377
16175 176377
16176    160
16177   3400
16200     41
16201   2001
16167                        LIT
16202                      A1024 EQU *
16202  42000      166X       JSX .CSHV
16203             4630R      DEF P421   RDBMV
16204   1601    77601A       LDA V32641   HPBC
16205 170507                 SAR 8
16206  70540                 PWC A
16207  42000    10312R       JSM P218   MKREL
16210 172005                SAP A1026
16211   1717    77717A       LDA V28 AMKR
16212 170040                 TCA
16213  21721    77721A       ADA V25 MRKR
16214  66000    16216R       JMP A1027
16215                      A1026 EQU *
16215   1721    77721A       LDA V25 MRKR
16216                      A1027 EQU *
16216  42000       22X       JSM P209   ADUMP
16217                      A1025 EQU *
16217  66000    16224R       JMP A1028
16220                      A1022 EQU *
16220  42000      167X       JSX .ADDR
16221            16243R      DEF ="999999999999"
16222  42000       13X       JSM P202   SIHPB
16223  42000    13030R       JSM P789   WCRLF
16224                      A1028 EQU *
16224  66000    16755R       JMP A1003
16225                      C1029 EQU *
16225  42000    13045R       JSM P791   OHPB
16226  42000    10323R       JSM P626   MRKROK
16227 172402                 SAM *+2
16230  66000    16270R       JMP A1030
16231   1723    77723A       LDA V26 MKRMODE
16232  72002                 RZA *+2
16233  66000    16270R       JMP A1030
16234   1601    77601A       LDA V32641   HPBC
16235  52000    15470R       AND =B1400
16236  72014                RZA A1031
16237   2000     2521R       LDA =D17
16240  42000    14055R       JSM P216   MESSAGE
16241  42000    13030R       JSM P789   WCRLF
16242  66000    16267R       JMP A1032
16243 999999999999
16243                        LIT
16252                      A1031 EQU *
16252  42000      166X       JSX .CSHV
16253             4630R      DEF P421   RDBMV
16254   1601    77601A       LDA V32641   HPBC
16255 170507                 SAR 8
16256  70540                 PWC A
16257  42000    10312R       JSM P218   MKREL
16260 172005                SAP A1033
16261   1720    77720A       LDA V27 AMLVL
16262 170040                 TCA
16263  21722    77722A       ADA V29 MKRLVL
16264  66000    16266R       JMP A1034
16265                      A1033 EQU *
16265   1722    77722A       LDA V29 MKRLVL
16266                      A1034 EQU *
16266  42000       22X       JSM P209   ADUMP
16267                      A1032 EQU *
16267  66000    16274R       JMP A1035
16270                      A1030 EQU *
16270  42000      167X       JSX .ADDR
```

```
16271                 16243R     DEF ="999999999999"
16272   42000           13X      JSM P202   STHPB
16273   42000        13030R      JSM P789   WCRLF
16274                          A1035 EQU *
16274   66000        16755R      JMP A1003
16275                          C1036 EQU *
16275    2000         1457R      LDA =D1
16276    6000         2203R      LDB =D8
16277   42000           75X      JSX .WS4
16300   42000        13045R      JSM P791   OHPB
16301   42000          166X      JSX .CSHV
16302                 4630R      DEF P421   RDBMV
16303    1601        77601A      LDA V32641   HPBC
16304 170507                     SAR 8
16305   42000           21X      JSM P208   IDUMP
16306   66000        16755R      JMP A1003
16307                          C1037 EQU *
16307    2000        16201R      LDA =D1025
16310    6000         2203R      LDB =D8
16311   42000           75X      JSX .WS4
16312   42000        13045R      JSM P791   OHPB
16313   42000          166X      JSX .CSHV
16314                 4630R      DEF P421   RDBMV
16315    1601        77601A      LDA V32641   HPBC
16316 170507                     SAR 8
16317   42000           21X      JSM P208   TDUMP
16320   66000        16755R      JMP A1003
16321                          C1038 EQU *
16321    1563        77563A      LDA V32627   DSTAD
16322    6000         2203R      LDB =D8
16323   42000           75X      JSX .WS4
16324   22000         1457R      ADA =D1
16325   52000         6353R      AND =B7777
16326   31563        77563A      STA V32627   DSTAD
16327   42000        13045R      JSM P791   OHPB
16330   42000          166X      JSX .CSHV
16331                 4630R      DEF P421   RDBMV
16332    1601        77601A      LDA V32641   HPBC
16333 170507                     SAR 8
16334   42000           20X      JSM P207   PDUMP
16335   42000        15334R      JSM P969   CLRDA
16336   66000        16755R      JMP A1003
16337                          C1039 EQU *
16337   66000        16407R      JMP A1040
16340                          T1041 EQU *
16340                          K1042 OCT 24050  24050
16341                          K1043 OCT 23447  23447
16342                          K1044 OCT 3001   3001
16343                          K1045 OCT 22445  22445
16344                          K1046 OCT 4007   4007
16345                          K1047 OCT 21042  21042
16346                          K1048 OCT 7416   7416
16347                          K1049 OCT 11022  11022
16350                          K1050 OCT 10421  10421
16351                          K1051 OCT 21443  21443
16352                          K1052 OCT 20040  20040
16353                          K1053 OCT 6014   6014
16354                          K1054 OCT 17430  17430
16355                          K1055 OCT 22044  22044
16356                          K1056 OCT 23046  23046
16357                          K1057 OCT 20441  20441
16360                          K1058 OCT 5413   5413
16361                          K1059 OCT 6415   6415
16362                 16340R   V1060 DEF T1041 OTLIST
16363                                OCT 177777  177777
16364                          K1061 OCT 22   22
16365                          P1062 EQU * NOSKIP
16365 174517                     CLB
16366   42000           56X      JSX .ARGS
16367   44016           16A      ISZ C
16370    1573        77573A      LDA V32635   I
16371   22000        16400R      ADA =D-145
16372   70540                    PWC A
16373    1573        77573A      LDA V32635   I
16374 170040                     TCA
16375   22000         2500R      ADA =D147
16376   42000          136X      JSX .ORT
16377   66000           31X      JMX .RTNA
16400 177557
16400                            LIT
16401                          P1063 EQU * DSRD
16401    6000         2203R      LDB =D8
16402   42000           74X      JSX .RS5
16403   31573        77573A      STA V32635   I
16404   52000         6353R      AND =B7777
16405   31573        77573A      STA V32635   I
16406 170201                     RET 1
16407                          A1040 EQU *
16407   42000        13045R      JSM P791   OHPB
16410    2000        16476R      LDA =B177756
16411   70540                    PWC A
16412    2000         1457R      LDA =D1
16413                          A1064 EQU *
16413   31572        77572A      STA V32634   J
16414   42000           60X      JSX .ARAY
16415                 16362R     DEF V1060 OTLIST
16416 170507                     SAR 8
16417   31573        77573A      STA V32635   I
16420    1572        77572A      LDA V32634   J
16421   42000           60X      JSX .ARAY
```

```
16422                16362R    DEF V1060 OTLIST
16423   52000         3242R    AND =B377
16424   31741        77741A    STA V32737  IY
16425    1573        77573A    LDA V32635  I
16426  170040                  TCA
16427   21741        77741A    ADA V32737  IY
16430   22000         1277R    ADA =B177777
16431   70540                  PWC A
16432    1741        77741A    LDA V32737  IY
16433                        A1065 EQU *
16433   31741        77741A    STA V32737  IY
16434   42000         2422R    JSM P284  BLKAD
16435   42000        16401R    JSM P1063 DSRD
16436   42000        16365R    JSM P1062 NOSKIP
16437  172402                  SAM *+2
16440   66000        16477R    JMP A1066
16441   42000        16401R    JSM P1063 DSRD
16442   42000        16401R    JSM P1063 DSRD
16443   42000        16401R    JSM P1063 DSRD
16444   42000        16401R    JSM P1063 DSRD
16445    1741        77741A    LDA V32737  IY
16446   12000         2172R    CPA =D13
16447   66000        16453R    JMP A1067
16450   12000         2477R    CPA =D36
16451   66000        16453R    JMP A1067
16452   42000        16401R    JSM P1063 DSRD
16453                        A1067 EQU *
16453                        A1068 EQU *
16453   42000        16365R    JSM P1062 NOSKIP
16454  172023                 SAP A1069
16455    1573        77573A    LDA V32635  I
16456   72421                 SZA A1069
16457    1573        77573A    LDA V32635  I
16460   12000         2521R    CPA =B21
16461   66000        16477R    JMP A1069
16462    1573        77573A    LDA V32635  I
16463   12000         2204R    CPA =D10
16464   66000        16470R    JMP A1071
16465   12000         2172R    CPA =D13
16466   66000        16470R    JMP *+2
16467   66000        16472R    JMP A1070
16470                        A1071 EQU *
16470    2000         2205R    LDA =B40
16471   31573        77573A    STA V32635  I
16472                        A1070 EQU *
16472    1573        77573A    LDA V32635  I
16473   42000           17X    JSM P206  WHPIB
16474   42000        16401R    JSM P1063 DSRD
16475   66000        16453R    JMP A1068
16476  177756
16476                          LIT
16477                        A1069 EQU *
16477                        A1066 EQU *
16477    1741        77741A    LDA V32737  IY
16500   12000         2172R    CPA =D13
16501   66000        16505R    JMP A1072
16502    1730        77730A    LDA V30 KFLAG
16503   62000         2410R    IOR =B200
16504   31730        77730A    STA V30 KFLAG
16505                        A1072 EQU *
16505   42000        13030R    JSM P789  WCRLF
16506    2000         1457R    LDA =D1
16507   21741        77741A    ADA V32737  IY
16510  144016           16A    ISZ C,I
16511   66000        16433R    JMP A1065
16512   54016           16A    DSZ C
16513    2000         1457R    LDA =D1
16514   21572        77572A    ADA V32634  J
16515  144016           16A    ISZ C,I
16516   66000        16413R    JMP A1064
16517   54016           16A    DSZ C
16520   66000        16755R    JMP A1003
16521                        C1073 EQU *
16521   42000        13045R    JSM P791  OHPB
16522    2000        10142R    LDA =B37
16523   42000           17X    JSM P206  WHPIB
16524   42000        15351R    JSM P972  SAVPREP
16525    2000        15607R    LDA =B177731
16526   70540                  PWC A
16527    2000         1457R    LDA =D1
16530                        A1074 EQU *
16530   31573        77573A    STA V32635  I
16531   42000           60X    JSX .ARAY
16532                    7R    DEF V4  MSTATE
16533  170507                  SAR 8
16534   42000           17X    JSM P206  WHPIB
16535    1573        77573A    LDA V32635  I
16536   42000           60X    JSX .ARAY
16537                    7R    DEF V4  MSTATE
16540   42000           17X    JSM P206  WHPIB
16541    2000         1457R    LDA =D1
16542   21573        77573A    ADA V32635  I
16543  144016           16A    ISZ C,I
16544   66000        16530R    JMP A1074
16545   54016           16A    DSZ C
16546   42000           16X    JSM P205  WEOI
16547    2000        16571R    LDA =B245
16550   42000           17X    JSM P206  WHPIB
16551   42000        15405R    JSM P973  SAVCLR
16552   66000        16755R    JMP A1003
```

```
16553                    C1075 EQU *
16553  66000   16572R      JMP A1076
16554                    P1077 EQU * KEYETX
16554 174517               CLB
16555  42000      56X      JSX .ARGS
16556  44016      16A      ISZ C
16557   1566   77566A      LDA V32630   KEYCODE
16560  22000    1301R      ADA =D-3
16561  42000     111X      JSX .EQL
16562  70540               PWC A
16563   1736   77736A      LDA V32734   ETX
16564 170040               TCA
16565  21566   77566A      ADA V32630   KEYCODE
16566  42000     111X      JSX .EQL
16567  42000     136X      JSX .URT
16570  66000      31X      JMX .RTNA
16571    245
16571                      LIT
16572                    A1076 EQU *
16572  42000   13045R      JSM P791   UHPB
16573  42000   15532R      JSM P981   DSPW
16574                    A1078 EQU *
16574  42000      24X      JSM P211   IHPIB
16575  31566   77566A      STA V32630   KEYCODE
16576  42000   16554R      JSM P1077 KEYETX
16577 172403               SAM A1079
16600   1566   77566A      LDA V32630   KEYCODE
16601  42000   12265R      JSM P731   DSWRT
16602                    A1079 EQU *
16602  42000   16554R      JSM P1077 KEYETX
16603 172071               SAP A1078
16604  66000   16755R      JMP A1003
16605                    C1080 EQU *
16605   2000   16710R      LDA =B177730
16606  42000   14741R      JSM P929   ENTRY
16607  66000   16755R      JMP A1003
16610                    C1081 EQU *
16610  42000   15532R      JSM P981   DSPW
16611   1601   77601A      LDA V32641   HPBC
16612  52000   16711R      AND =B165777
16613  31601   77601A      STA V32641   HPBC
16614  66000   16755R      JMP A1003
16615                    C1082 EQU *
16615   1601   77601A      LDA V32641   HPBC
16616  52000    6371R      AND =B167777
16617  31601   77601A      STA V32641   HPBC
16620  66000   16755R      JMP A1003
16621                    C1083 EQU *
16621   1601   77601A      LDA V32641   HPBC
16622  52000   16712R      AND =B163777
16623  62000    2644R      IOR =B10000
16624  31601   77601A      STA V32641   HPBC
16625  66000   16755R      JMP A1003
16626                    C1084 EQU *
16626   1565   77565A      LDA V32629   SRQEN
16627  62000    5517R      IOR =B100000
16630  31565   77565A      STA V32629   SRQEN
16631   2000    2107R      LDA =D3
16632   6000    2107R      LDB =D3
16633  42000      75X      JSX .WS4
16634  66000   16755R      JMP A1003
16635                    C1085 EQU *
16635  42000   13045R      JSM P791   UHPB
16636   1620   77620A      LDA V32656   PREFIX
16637  42000   14055R      JSM P216   MESSAGE
16640  42000   13030R      JSM P789   WCRLF
16641  66000   16755R      JMP A1003
16642                    C1086 EQU *
16642  42000   13045R      JSM P791   UHPB
16643  42000     166X      JSX .CSHV
16644          24714R      DEF L194   POP
16645  42000     166X      JSX .CSHV
16646          32473R      DEF L195   ABORT
16647  42000      14X      JSM P203   HPBSY
16650   2000   15667R      LDA =B177731
16651  70540               PWC A
16652   2000    1457R      LDA =D1
16653                    A1087 EQU *
16653  31573   77573A      STA V32635   I
16654  42000      24X      JSM P211   IHPIB
16655 170607               SAL 8
16656  31572   77572A      STA V32634   J
16657   1573   77573A      LDA V32635   I
16660  42000      60X      JSX .ARAY
16661              7R      DEF V4   MSTATE
16662  70541               PWC B
16663  42000      24X      JSM P211   IHPIB
16664  61572   77572A      IOR V32634   J
16665  42000     170X      JSX .STAC
16666   2000    1457R      LDA =D1
16667  21573   77573A      ADA V32635   I
16670 144016      16A      ISZ C,I
16671  66000   16653R      JMP A1087
16672  54016      16A      DSZ C
16673  42000      24X      JSM P211   IHPIB
16674  12000   16571R      CPA =B245
16675  66000   16677R      JMP *+2
16676  66000   24714R      JMP L194   POP
16677   1601   77601A      LDA V32641   HPBC
16700  52000    6514R      AND =B77777
```

```
7813  16701  31601  77601A     STA V32641  HPBC
7814  16702  42000  15424R     JSM P974  SAVFIX
7815  16703   2000  14714R     LDA =B177747
7816  16704  42000  14741R     JSM P929  ENTRY
7817  16705   2000   3231R     LDA =B60
7818  16706  42000  15546R     JSM P214  KEY
7819  16707  66000  16755R     JMP A1003
      16710 177730
      16711 165777
      16712 163777
7820  16710                   LIT
7821  16713         16642R     DEF C1086
7822  16714         16635R     DEF C1085
7823  16715         16626R     DEF C1084
7824  16716         16621R     DEF C1083
7825  16717         16615R     DEF C1082
7826  16720         16610R     DEF C1081
7827  16721         16605R     DEF C1080
7828  16722         16553R     DEF C1075
7829  16723         16755R     DEF A1003
7830  16724         16521R     DEF C1073
7831  16725         16337R     DEF C1039
7832  16726         16321R     DEF C1038
7833  16727         16307R     DEF C1037
7834  16730         16275R     DEF C1036
7835  16731         16225R     DEF C1029
7836  16732         16137R     DEF C1021
7837  16733         16126R     DEF C1020
7838  16734         16122R     DEF C1019
7839  16735         16114R     DEF C1017
7840  16736         16103R     DEF C1016
7841  16737         16076R     DEF C1015
7842  16740         16042R     DEF C1014
7843  16741         16035R     DEF C1013
7844  16742         16030R     DEF C1012
7845  16743         16024R     DEF C1011
7846  16744         15774R     DEF C1009
7847  16745         15763R     DEF C1008
7848  16746         15755R     DEF C1007
7849  16747         15753R     DEF C1006
7850  16750         15740R     DEF C1004
7851  16751         32476R     DEF L193  RESET
7852  16752         15721R     DEF C1002
7853  16753                    DEC -33
7854  16754  42000    143X   A1001 JSX .CASE
7855  16755                 A1003 EQU *
7856  16755  66000  24627R     JMP A1088
7857  16756                 C1089 EQU *
7858  16756   1566  77566A     LDA V32630  KEYCODE
7859  16757  22000   2520R     ADA =B-37
7860  16760  66000  17263R     JMP A1090
7861  16761                 C1091 EQU *
7862  16761   1676  77676A     LDA V16 TLEDS
7863  16762 170605             SAL 6
7864  16763 172004            SAP A1093
7865  16764   1601  77601A     LDA V32641  HPBC
7866  16765 170601             SAL 2
7867  16766 172402            SAM A1092
7868  16767                 A1093 EQU *
7869  16767  42000  12474R     JSM P744  UNITS
7870  16770                 A1092 EQU *
7871  16770  66000  17264R     JMP A1094
7872  16771                 C1095 EQU *
7873  16771   1601  77601A     LDA V32641  HPBC
7874  16772  52000  17017R     AND =B171777
7875  16773  31601  77601A     STA V32641  HPBC
7876  16774  66000  17264R     JMP A1094
7877  16775                 C1096 EQU *
7878  16775   1601  77601A     LDA V32641  HPBC
7879  16776  52000  17017R     AND =B171777
7880  16777  62000   6703R     IOR =B2000
7881  17000  31601  77601A     STA V32641  HPBC
7882  17001  66000  17264R     JMP A1094
7883  17002                 C1097 EQU *
7884  17002  42000  12474R     JSM P744  UNITS
7885  17003  66000  17264R     JMP A1094
7886  17004                 C1098 EQU *
7887  17004  42000  13045R     JSM P791  OHPB
7888  17005  42000     24X     JSM P211  IHPIB
7889  17006  31736  77736A     STA V32734  ETX
7890  17007  66000  17264R     JMP A1094
7891  17010                 C1099 EQU *
7892  17010   1617  77617A     LDA V32655  DECFLG
7893  17011  12000   1277R     CPA =B177777
7894  17012  66000  17014R     JMP *+2
7895  17013  66000  17020R     JMP A1100
7896  17014   2000   1463R     LDA =D0
7897  17015  31617  77617A     STA V32655  DECFLG
7898  17016  66000  17032R     JMP A1101
      17017 171777
7899  17017                    LIT
7900  17020                 A1100 EQU *
7901  17020  42000     37X     JSX .LDBI
7902  17021         77651A     DEF V32681  LTEMP
7903  17022   6000   1457R     LDB =D1
7904  17023  42000     47X     JSX .DRGT
7905  17024  42000     34X     JSX .STRD
7906  17025         77651A     DEF V32681  LTEMP
7907  17026   1617  77617A     LDA V32655  DECFLG
7908  17027 172003            SAP A1102
```

```
17030  22000   1457R    ADA =D1
17031  31617  77617A    STA V32655  DECFLG
17032                  A1102 EQU *
17032                  A1101 EQU *
17032   1611  77611A    LDA V32649  CHRC
17033 170040            TCA
17034 172012            SAP A1103
17035  55611  77611A    DSZ V32649  CHRC
17036                   NOP
17037   1737  77737A    LDA V32735  BLKS
17040  21612  77612A    ADA V32650  NCHR
17041  21611  77611A    ADA V32649  CHRC
17042   6000   2203R    LDB =D8
17043  42000     75X    JSX .WS4
17044   2000   2500R    LDA =D147
17045  42000     73X    JSX .W6
17046                  A1103 EQU *
17046   1611  77611A    LDA V32649  CHRC
17047  72010            RZA A1104
17050  42000     53X    JSX .LDSI
17051           1463R    DEF =D0
17052  42000     34X    JSX .STRD
17053          77651A    DEF V32681  LTEMP
17054   1616  77616A    LDA V32654  XFLAG
17055  62000   2644R    IOR =B10000
17056  31616  77616A    STA V32654  XFLAG
17057                  A1104 EQU *
17057  66000  17264R    JMP A1094
17060                  C1105 EQU *
17060  42000  12474R    JSM P744  UNITS
17061  66000  17264R    JMP A1094
17062                  C1106 EQU *
17062  42000  15224R    JSM P221  1RIGR
17063  66000  17264R    JMP A1094
17064                  C1107 EQU *
17064   1676  77676A    LDA V16 TLEDS
17065 170605            SAL 6
17066 172005            SAP A1108
17067  42000  15344R    JSM P971  USFT
17070   1616  77616A    LDA V32654  XFLAG
17071  62000  11310R    IOR =B400
17072  31616  77616A    STA V32654  XFLAG
17073                  A1108 EQU *
17073   5616  77616A    LDB V32654  XFLAG
17074 174606            SBL 7
17075   2000  17114R    LDA =B177742
17076 176402            SBM A1109
17077   2000   2647R    LDA =B177750
17100                  A1109 EQU *
17100  42000  14741R    JSM P929  ENTRY
17101  66000  17264R    JMP A1094
17102                  C1110 EQU *
17102   1676  77676A    LDA V16 TLEDS
17103 170605            SAL 6
17104 172011            SAP A1111
17105  42000  15344R    JSM P971  USFT
17106   1616  77616A    LDA V32654  XFLAG
17107  52000  11303R    AND =B177377
17110  31616  77616A    STA V32654  XFLAG
17111   2000   1463R    LDA =D0
17112  42000  14741R    JSM P929  ENTRY
17113  66000  17117R    JMP A1112
17114 177742
17114                   LIT
17115                  A1111 EQU *
17115   2000  14714R    LDA =B177747
17116  42000  14741R    JSM P929  ENTRY
17117                  A1112 EQU *
17117  66000  17264R    JMP A1094
17120                  C1113 EQU *
17120   2000   1463R    LDA =D0
17121  42000  14741R    JSM P929  ENTRY
17122  66000  17264R    JMP A1094
17123                  C1114 EQU *
17123   1676  77676A    LDA V16 TLEDS
17124 170605            SAL 6
17125 172006            SAP A1115
17126  42000  15344R    JSM P971  USFT
17127   2000  17132R    LDA =B177726
17130  42000  14741R    JSM P929  ENTRY
17131  66000  17206R    JMP A1116
17132 177726
17132                   LIT
17133                  A1115 EQU *
17133   2000  17230R    LDA =D441
17134  31613  77613A    STA V32651  DAC4
17135   6000   1463R    LDB =D0
17136  42000    112X    JSX .WS7
17137   2000   1463R    LDA =D0
17140  42000  14741R    JSM P929  ENTRY
17141  42000   2762R    JSM P314  AVGRST
17142  42000    161X    JSX .MVE4
17143          17231R    DEF =F750000000
17144          77665A    DEF V8  CFREQ
17145  42000    161X    JSX .MVE4
17146          17235R    DEF =F1500000000
17147          77671A    DEF V9  SPAN
17150   2000   2107R    LDA =D3
17151  31731  77731A    STA V18 SINDEX
17152  31600  77600A    STA V32640  CTIM
```

```
17153   1675  77675A      LDA V15 BLEDS
17154  52000  17241R      AND =B177077
17155  31675  77675A      STA V15 BLEDS
17156   2000   2172R      LDA =D13
17157  42000   4210R      JSM P392  IFBWOUT
17160   2000   2172R      LDA =D13
17161  42000   4314R      JSM P400  VBWOUT
17162   1616  77616A      LDA V32654  XFLAG
17163  52000  15404R      AND =B177400
17164  62000   3654R      IOR =B20
17165  31616  77616A      STA V32654  XFLAG
17166   2000   2411R      LDA =D4
17167  31605  77605A      STA V32645  SCANSL
17170  42000     37X      JSX .LDBI
17171         17235R      DEF =F1500000000
17172  42000  11120R      JSM P668  SPANW
17173  42000     37X      JSX .LDBI
17174         77665A      DEF V8  CFREQ
17175  42000   6750R      JSM P222  TUNE
17176  42000     37X      JSX .LDBI
17177          7555R      DEF =F20000
17200  42000   7345R      JSM P558  SCANT
17201  42000  15224R      JSM P221  TRIGR
17202   2000   1457R      LDA =D1
17203  42000  15313R      JSM P968  CFDF
17204   2000  10411R      LDA =B114
17205  42000  15546R      JSM P214  KEY
17206                   A1116 EQU *
17206  66000  17264R      JMP A1094
17207                   C1117 EQU *
17207  42000  12317R      JSM P733  CLRNUM
17210  42000  12302R      JSM P732  WKEY
17211   2000   1457R      LDA =D1
17212  31651  77651A      STA V32681  LTS
17213  42000  15344R      JSM P971  USFT
17214  66000  17264R      JMP A1094
17215                   C1118 EQU *
17215   1620  77620A      LDA V32656  PREFIX
17216  72407             SZA A1119
17217   1617  77617A      LDA V32655  DECFLG
17220  72005             RZA A1120
17221   2000   1277R      LDA =B177777
17222  31617  77617A      STA V32655  DECFLG
17223  42000  12317R      JSM P733  CLRNUM
17224  42000  12302R      JSM P732  WKEY
17225                   A1120 EQU *
17225                   A1119 EQU *
17225  66000  17264R      JMP A1094
17226                   C1121 EQU *
17226  42000  12474R      JSM P744  UNITS
17227  66000  17264R      JMP A1094
17230    671
17231 750000000
17235 1500000000
17241 177077
17230                     LIT
17242         17226R      DEF C1121
17243         17215R      DEF C1118
17244         17207R      DEF C1117
17245         17123R      DEF C1114
17246         17264R      DEF A1094
17247         17120R      DEF C1113
17250         17102R      DEF C1110
17251         17064R      DEF C1107
17252         17062R      DEF C1106
17253         17060R      DEF C1105
17254         17010R      DEF C1099
17255         17004R      DEF C1098
17256         17002R      DEF C1097
17257         16775R      DEF C1096
17260         16771R      DEF C1095
17261         16761R      DEF C1091
17262                     DEC -17
17263  42000    143X    A1090 JSX .CASE
17264                   A1094 EQU *
17264   1566  77566A      LDA V32630  KEYCODE
17265  22000  17330R      ADA =B-73
17266  66000  17506R      JMP A1122
17267                   C1123 EQU *
17267   1676  77676A      LDA V16 ILEDS
17270 170605              SAL 6
17271 172003             SAP A1124
17272   2000  10241R      LDA =B177743
17273  42000  14741R      JSM P929  ENTRY
17274                   A1124 EQU *
17274  42000  15344R      JSM P971  USFT
17275   1677  77677A      LDA V17 RFAT
17276  52000   1375R      AND =B177767
17277  31677  77677A      STA V17 RFAT
17300   6000   1704R      LDB =D6
17301  42000    171X      JSX .RS4
17302  31573  77573A      STA V32635  I
17303  42000    104X      JSX .TURN
17304         17331R      DEF =B30000
17305         77730A      DEF V30 KFLAG
17306  31730  77730A      STA V30 KFLAG
17307   1700  77700A      LDA V22 RLVL
17310  42000   3530R      JSM P355  REFLEV
17311   1426  77426A      LDA V32534  UFLAG
17312  70540              PWC A
```

```
17313  42000   3255R      JSM P337  WRFAT
17314  70760              WWC A
17315  31426  77426A      STA V32534  UFLAG
17316  42000   2650R      JSM P304  UNCAL
17317  42000   2551R      JSM P298  ABLK
17320  66000  17507R      JMP A1125
17321                   C1126 EQU *
17321   1676  77676A      LDA V16 ILEDS
17322 170605              SAL 6
17323 172007             SAP A1127
17324  42000  15344R      JSM P971  USFT
17325   2000   2520R      LDA =B177741
17326  42000  14741R      JSM P929  ENTRY
17327  66000  17427R      JMP A1128
17330 177705
17331  30000
17330                    LIT
17332                   A1127 EQU *
17332  42000  10323R      JSM P626  MRKROK
17333 172402              SAM *+2
17334  66000  17410R      JMP A1129
17335   1605  77605A      LDA V32645  SCANSL
17336  72002              RZA *+2
17337  66000  17410R      JMP A1129
17340   1723  77723A      LDA V26 MKRMODE
17341  72003             RZA A1130
17342   2000  17407R      LDA =B115
17343  42000  15546R      JSM P214  KEY
17344                   A1130 EQU *
17344   1730  77730A      LDA V30 KFLAG
17345 170612              SAL 11
17346  61675  77675A      IOR V15 BLEDS
17347 170140              CMA
17350  42000    104X      JSX .TURN
17351          1770R      DEF =B20000
17352         77675A      DEF V15 BLEDS
17353  31675  77675A      STA V15 BLEDS
17354   1723  77723A      LDA V26 MKRMODE
17355  42000    121X      JSX MOD4
17356          2107R      DEF =D3
17357  22000   7565R      ADA =D18
17360  70540              PWC A
17361   1675  77675A      LDA V15 BLEDS
17362 170601              SAL 2
17363 170516              SAR 15
17364   6000   2107R      LDB =D3
17365  75617              MPY
17366  42000     57X      JSX ADD4I
17367  31723  77723A      STA V26 MKRMODE
17370   1426  77426A      LDA V32534  UFLAG
17371  62000   1364R      IOR =B100
17372  31426  77426A      STA V32534  UFLAG
17373   1576  77576A      LDA V32638  RPGPTR
17374  12000   7565R      CPA =D18
17375  66000  17377R      JMP *+2
17376  66000  17401R      JMP A1131
17377   1723  77723A      LDA V26 MKRMODE
17400  42000  14741R      JSM P929  ENTRY
17401                   A1131 EQU *
17401   2000   2521R      LDA =D17
17402  42000   2434R      JSM P285  BLKOF
17403  42000   7775R      JSM P603  CSCANBW
17404  42000  10413R      JSM P636  MKRON
17405  42000  12334R      JSM P217  MBLK
17406  66000  17427R      JMP A1132
17407    115
17407                    LIT
17410                   A1129 EQU *
17410   1675  77675A      LDA V15 BLEDS
17411 170601              SAL 2
17412 172015             SAP A1133
17413   1723  77723A      LDA V26 MKRMODE
17414  42000    121X      JSX MOD4
17415          2107R      DEF =D3
17416  22000   7565R      ADA =D18
17417  31723  77723A      STA V26 MKRMODE
17420   1675  77675A      LDA V15 BLEDS
17421  52000  16171R      AND =B157777
17422  31675  77675A      STA V15 BLEDS
17423   2000   2521R      LDA =D17
17424  42000   2434R      JSM P285  BLKOF
17425  42000  10413R      JSM P636  MKRON
17426  42000   7775R      JSM P603  CSCANBW
17427                   A1133 EQU *
17427                   A1132 EQU *
17427                   A1128 EQU *
17427  66000  17507R      JMP A1125
17430                   C1134 EQU *
17430   1676  77676A      LDA V16 ILEDS
17431 170605              SAL 6
17432 172003             SAP A1135
17433   2000  10241R      LDA =B177743
17434  42000  14741R      JSM P929  ENTRY
17435                   A1135 EQU *
17435  42000  15344R      JSM P971  USFT
17436   1677  77677A      LDA V17 RFAT
17437  62000   2203R      IOR =B10
17440  31677  77677A      STA V17 RFAT
17441   6000   1704R      LDB =D6
17442  42000    171X      JSX .RS4
```

```
17443  31573   77573A        STA V32635  I
17444 170501                 SAR 2
17445  42000     104X        JSX .IORN
17446          17331R        DEF =B30000
17447          77730A        DEF V30 KFLAG
17450  31730   77730A        STA V30 KFLAG
17451   1700   77700A        LDA V22 RLVL
17452  42000    3530R        JSM P355  REFLEV
17453   1426   77426A        LDA V32534  UFLAG
17454  70540                 PWC A
17455  42000    3255R        JSM P337  WRFAT
17456  70760                 WWC A
17457  31426   77426A        STA V32534  UFLAG
17460  42000    2650R        JSM P304  UNCAL
17461  42000    2551R        JSM P298  ABLK
17462  66000   17507R        JMP A1125
17463                  C1136 EQU *
17463   1601   77601A        LDA V32641  HPBC
17464  62000    4534R        IOR =B40000
17465  31601   77601A        STA V32641  HPBC
17466  42000     161X        JSX .MVE4
17467          77651A        DEF V32681  LTEMP
17470          77621A        DEF V32657  MANT
17471   2000   15047R        LDA =B145
17472  31566   77566A        STA V32630  KEYCODE
17473  42000   12302R        JSM P732  WKEY
17474  42000      53X        JSX .LDSI
17475           1463R        DEF =D0
17476  42000      34X        JSX .STRD
17477          77651A        DEF V32681  LTEMP
17500  66000   17507R        JMP A1125
17501          17463R        DEF C1136
17502          17430R        DEF C1134
17503          17321R        DEF C1126
17504          17267R        DEF C1123
17505                        DEC -5
17506  42000     143X  A1122 JSX .CASE
17507                  A1125 EQU *
17507  66000   24627R        JMP A1088
17510                  C1137 EQU *
17510   1676   77676A        LDA V16 TLEDS
17511 170605                 SAL 6
17512 172002                 SAP *+2
17513  66000   20573R        JMP A1138
17514   1566   77566A        LDA V32630  KEYCODE
17515  22000   20421R        ADA =B-100
17516  66000   20571R        JMP A1139
17517                  C1140 EQU *
17517   1675   77675A        LDA V15 BLEDS
17520  52000    6512R        AND =B177677
17521  31675   77675A        STA V15 BLEDS
17522  42000    7775R        JSM P603  CSCANBW
17523   2000    1457R        LDA =D1
17524  42000   15133R        JSM P947  TRNOFF
17525  66000   20572R        JMP A1141
17526                  C1142 EQU *
17526   1675   77675A        LDA V15 BLEDS
17527  52000   13044R        AND =B177577
17530  31675   77675A        STA V15 BLEDS
17531  42000    7775R        JSM P603  CSCANBW
17532   2000    2276R        LDA =D2
17533  42000   15133R        JSM P947  TRNOFF
17534  66000   20572R        JMP A1141
17535                  C1143 EQU *
17535   1675   77675A        LDA V15 BLEDS
17536  52000   11303R        AND =B177377
17537  31675   77675A        STA V15 BLEDS
17540  42000    7775R        JSM P603  CSCANBW
17541   2000    2107R        LDA =D3
17542  42000   15133R        JSM P947  TRNOFF
17543  66000   20572R        JMP A1141
17544                  C1144 EQU *
17544   1675   77675A        LDA V15 BLEDS
17545  52000   15350R        AND =B176777
17546  31675   77675A        STA V15 BLEDS
17547   1700   77700A        LDA V22 RLVL
17550  42000    3530R        JSM P355  REFLEV
17551   2000    2411R        LDA =D4
17552  42000   15133R        JSM P947  TRNOFF
17553  66000   20572R        JMP A1141
17554                  C1145 EQU *
17554   1675   77675A        LDA V15 BLEDS
17555  52000    5521R        AND =B175777
17556  31675   77675A        STA V15 BLEDS
17557   2000    2565R        LDA =D11
17560  42000   15133R        JSM P947  TRNOFF
17561   2000    2565R        LDA =D11
17562  42000    2434R        JSM P285  BLKOF
17563  66000   20572R        JMP A1141
17564                  C1146 EQU *
17564   1675   77675A        LDA V15 BLEDS
17565  62000    1364R        IOR =B100
17566  31675   77675A        STA V15 BLEDS
17567   2000    1457R        LDA =D1
17570  42000   14741R        JSM P929  ENTRY
17571  66000   20572R        JMP A1141
17572                  C1147 EQU *
17572   1675   77675A        LDA V15 BLEDS
17573  62000    2410R        IOR =B200
17574  31675   77675A        STA V15 BLEDS
```

```
17575   2000   2276R    LDA =D2
17576  42000  14741R    JSM P929  ENTRY
17577  66000  20572R    JMP A1141
17600                 C1148 EQU *
17600   1675  77675A    LDA V15 BLEDS
17601  62000  11310R    IOR =B400
17602  31675  77675A    STA V15 BLEDS
17603   2000   2107R    LDA =D3
17604  42000  14741R    JSM P929  ENTRY
17605  66000  20572R    JMP A1141
17606                 C1149 EQU *
17606   1675  77675A    LDA V15 BLEDS
17607  62000   1300R    IOR =B1000
17610  31675  77675A    STA V15 BLEDS
17611   2000   2411R    LDA =D4
17612  42000  14741R    JSM P929  ENTRY
17613  66000  20572R    JMP A1141
17614                 C1150 EQU *
17614   1675  77675A    LDA V15 BLEDS
17615  62000   6703R    IOR =B2000
17616  31675  77675A    STA V15 BLEDS
17617   2000   2565R    LDA =D11
17620  42000  14741R    JSM P929  ENTRY
17621  66000  20572R    JMP A1141
17622                 C1151 EQU *
17622  42000  10323R    JSM P626  MRKROK
17623 172402            SAM *+2
17624  66000  17666R    JMP A1152
17625   2000   4256R    LDA =B170000
17626  31722  77722A    STA V29 MKRLVL
17627   2000   1457R    LDA =D1
17630  31721  77721A    STA V25 MRKR
17631  42000  10336R    JSM P627  MKRAD
17632   2000  20422R    LDA =B176027
17633  70540            PWC A
17634   2000   1457R    LDA =D1
17635                 A1153 EQU *
17635  31572  77572A    STA V32634  J
17636  42000    162X    JSX .R5
17637  31573  77573A    STA V32635  I
17640 170604            SAL 5
17641 170404            AAR 5
17642  31573  77573A    STA V32635  I
17643 170040            TCA
17644  21722  77722A    ADA V29 MKRLVL
17645 172005           SAP A1154
17646   1573  77573A    LDA V32635  I
17647  31722  77722A    STA V29 MKRLVL
17650   1572  77572A    LDA V32634  J
17651  31721  77721A    STA V25 MRKR
17652                 A1154 EQU *
17652   2000   1457R    LDA =D1
17653  21572  77572A    ADA V32634  J
17654 144016     16A    ISZ C,I
17655  66000  17635R    JMP A1153
17656  54016     16A    DSZ C
17657   1723  77723A    LDA V26 MKRMODE
17660  72003           RZA A1155
17661   2000   7565R    LDA =D18
17662  31723  77723A    STA V26 MKRMODE
17663                 A1155 EQU *
17663   1721  77721A    LDA V25 MRKR
17664  42000  11010R    JSM P663  STMRKR
17665  42000  10301R    JSM P624  MKRACT
17666                 A1152 EQU *
17666  66000  20572R    JMP A1141
17667                 C1156 EQU *
17667   2000   3166R    LDA =D1023
17670  31721  77721A    STA V25 MRKR
17671   1723  77723A    LDA V26 MKRMODE
17672  42000  15133R    JSM P947  TRNOFF
17673   2000   2521R    LDA =D17
17674  42000   2434R    JSM P285  BLKOF
17675   2000   7565R    LDA =D18
17676  42000   2434R    JSM P285  BLKOF
17677   2000   3042R    LDA =D37
17700  42000  15133R    JSM P947  TRNOFF
17701   2000  10141R    LDA =D38
17702  42000  15133R    JSM P947  TRNOFF
17703   2000   2477R    LDA =D36
17704  42000  15133R    JSM P947  TRNOFF
17705   1616  77616A    LDA V32654  XFLAG
17706  52000   2302R    AND =B26
17707  22000   6231R    ADA =B177754
17710  72004           RZA A1157
17711  42000     37X    JSX .LDBI
17712         77665A    DEF V8  CFREQ
17713  42000   6016R    JSM P500  STUNE
17714                 A1157 EQU *
17714   1616  77616A    LDA V32654  XFLAG
17715  52000   1704R    AND =D6
17716  22000   1363R    ADA =B177774
17717   4000            LDB A
17720   2000  20423R    LDA =B21016
17721  76402           SZB A1158
17722   2000  20424R    LDA =B21010
17723                 A1158 EQU *
17723  70540            PWC A
17724   2000   1463R    LDA =D0
17725  42000    104X    JSX .TURN
```

```
17726                      NOP
17727            77616A    DEF V32654  XFLAG
17730   31616    77616A    STA V32654  XFLAG
17731    2000     1463R    LDA =D0
17732   31723    77723A    STA V26 MKRMODE
17733    1740    77740A    LDA V32736  EFLAG
17734   52000     2644R    AND =B10000
17735  170600              SAL 1
17736   61601    77601A    IOR V32641  HPBC
17737   31601    77601A    STA V32641  HPBC
17740    1740    77740A    LDA V32736  EFLAG
17741   52000    20425R    AND =B167774
17742   31740    77740A    STA V32736  EFLAG
17743    2000     2221R    LDA =D9
17744   70540              PWC A
17745    2000     1457R    LDA =D1
17746   42000    10713R    JSM P656  GRAT
17747    1675    77675A    LDA V15 BLEDS
17750   31573    77573A    STA V32635  I
17751    1675    77675A    LDA V15 BLEDS
17752   52000    20426R    AND =B117767
17753   31675    77675A    STA V15 BLEDS
17754    1573    77573A    LDA V32635  I
17755  170613              SAL 12
17756  172002             SAP A1159
17757   42000    15117R     JSM P943  SMODE
17760                     A1159 EQU *
17760   42000     7775R     JSM P603  CSCANBW
17761   66000    20572R     JMP A1141
17762                     C1160 EQU *
17762   42000    10323R     JSM P626  MKRROK
17763  172030             SAP A1161
17764    1675    77675A     LDA V15 BLEDS
17765  170601               SAL 2
17766   70540               PWC A
17767    1605    77605A     LDA V32645  SCANSL
17770   42000      135X     JSX .NEQL
17771   42000      154X     JSX .ANDT
17772  170516               SAR 15
17773    6000     2107R     LDB =D3
17774   75617               MPY
17775   22000     7565R     ADA =D18
17776   31723    77723A     STA V26 MKRMODE
17777    2000    20427R     LDA =B173
20000   42000    15546R     JSM P214  KEY
20001    2000     2521R     LDA =D17
20002   42000     2434R     JSM P285  BLKOF
20003   42000    10413R     JSM P636  MKRON
20004    1723    77723A     LDA V26 MKRMODE
20005   42000    14741R     JSM P929  ENTRY
20006   42000    12334R     JSM P217  MBLK
20007    2000     2221R     LDA =D9
20010   70540               PWC A
20011    2000     2406R     LDA =D7
20012   42000    10713R     JSM P656  GRAT
20013                     A1161 EQU *
20013   66000    20572R     JMP A1141
20014                     C1162 EQU *
20014    1723    77723A     LDA V26 MKRMODE
20015   72425              SZA A1163
20016   42000    10323R     JSM P626  MKRROK
20017  172023              SAP A1163
20020   42000     2762R     JSM P314  AVGRST
20021   42000    10312R     JSM P218  MKREL
20022  172004              SAP A1164
20023   42000       37X     JSX .LDBI
20024            77724A     DEF V10 AMF
20025   66000    20030R     JMP A1165
20026                     A1164 EQU *
20026   42000       53X     JSX .LDSI
20027             1463R     DEF =D0
20030                     A1165 EQU *
20030   42000      150X     JSX ADD2
20031            77645A     DEF V32677  MFREQ
20032   42000     6750R     JSM P222  TUNE
20033    2000    10522R     LDA =D501
20034   31721    77721A     STA V25 MRKR
20035    1426    77426A     LDA V32534  UFLAG
20036   62000     1364R     IOR =B100
20037   31426    77426A     STA V32534  UFLAG
20040   42000     2650R     JSM P304  UNCAL
20041   42000    12334R     JSM P217  MBLK
20042                     A1163 EQU *
20042   66000    20572R     JMP A1141
20043                     C1166 EQU *
20043   42000    10323R     JSM P626  MRKROK
20044  172402               SAM *+2
20045   66000    20150R     JMP A1167
20046    1723    77723A     LDA V26 MKRMODE
20047   72003              RZA A1168
20050    2000    17407R     LDA =B115
20051   42000    15546R     JSM P214  KEY
20052                     A1168 EQU *
20052    2000    20427R     LDA =B173
20053   42000    15546R     JSM P214  KEY
20054   42000    10312R     JSM P218  MKREL
20055  172005              SAP A1170
20056    1723    77723A     LDA V26 MKRMODE
20057   11620    77620A     CPA V32656  PREFIX
20060   66000    20062R     JMP *+2
```

```
20061  66000  20145R    JMP A1169
20062                  A1170 EQU *
20062  42000  10312R    JSM P218  MKREL
20063 172006            SAP A1171
20064  42000     37X    JSX .LDBI
20065         77724A    DEF V10 AMF
20066  42000    150X    JSX ADD2
20067         77645A    DEF V32677  MFREQ
20070  66000  20073R    JMP A1172
20071                  A1171 EQU *
20071  42000     37X    JSX .LDBI
20072         77645A    DEF V32677  MFREQ
20073                  A1172 EQU *
20073  42000     34X    JSX .STRD
20074         77724A    DEF V10 AMF
20075  42000     53X    JSX .LDSI
20076          1463R    DEF =D0
20077  42000     34X    JSX .STRD
20100         77645A    DEF V32677  MFREQ
20101   1675  77675A    LDA V15 BLEDS
20102 170601            SAL 2
20103  70540            PWC A
20104   1605  77605A    LDA V32645  SCANSL
20105  42000    135X    JSX .NEQL
20106  42000    154X    JSX .ANDI
20107 170516            SAR 15
20110   6000   2107R    LDB =D3
20111  75617            MPY
20112  22000   2301R    ADA =D19
20113  31723  77723A    STA V26 MKRMODE
20114   1721  77721A    LDA V25 MRKR
20115  31717  77717A    STA V28 AMKR
20116   1722  77722A    LDA V29 MKRLVL
20117  31720  77720A    STA V27 AMLVL
20120   2000   2521R    LDA =D17
20121  42000   2434R    JSM P285  BLKOF
20122  42000  10413R    JSM P636  MKRON
20123   2000   2153R    LDA =B177773
20124  70540            PWC A
20125   2000  10706R    LDA =D2050
20126                  A1173 EQU *
20126  31573  77573A    STA V32635  I
20127   6000   2203R    LDB =D8
20130  42000     75X    JSX .WS4
20131  42000    162X    JSX .R5
20132  31572  77572A    STA V32634  J
20133   1573  77573A    LDA V32635  I
20134  22000   2405R    ADA =D5
20135  42000    103X    JSX .W4
20136   1572  77572A    LDA V32634  J
20137  42000     73X    JSX .W6
20140   2000   1457R    LDA =D1
20141  21573  77573A    ADA V32635  I
20142 144016     16A    ISZ C,I
20143  66000  20126R    JMP A1173
20144  54016     16A    DSZ C
20145                  A1169 EQU *
20145   1723  77723A    LDA V26 MKRMODE
20146  42000  14741R    JSM P929  ENTRY
20147  42000  12334R    JSM P217  MBLK
20150                  A1167 EQU *
20150  66000  20572R    JMP A1141
20151                  C1174 EQU *
20151  42000  10323R    JSM P626  MKKROK
20152 172012            SAP A1175
20153   2000  20427R    LDA =B173
20154  42000  15546R    JSM P214  KEY
20155   2000  17407R    LDA =B115
20156  42000  15546R    JSM P214  KEY
20157   1723  77723A    LDA V26 MKRMODE
20160  22000   2276R    ADA =D2
20161  31723  77723A    STA V26 MKRMODE
20162  42000  14741R    JSM P929  ENTRY
20163  42000  12334R    JSM P217  MBLK
20164                  A1175 EQU *
20164  66000  20572R    JMP A1141
20165                  C1176 EQU *
20165   1723  77723A    LDA V26 MKRMODE
20166  72416            SZA A1177
20167  42000  10323R    JSM P626  MKRROK
20170 172014            SAP A1177
20171  42000     37X    JSX .LDBI
20172         77645A    DEF V32677  MFREQ
20173   4020     20A    LDB AR2
20174  77202            SLB *+2,C
20175  34020     20A    STB AR2
20176  42000     34X    JSX .STRD
20177         77713A    DEF V7  FSTEP
20200   1675  77675A    LDA V15 BLEDS
20201  62000   6703R    IOR =B2000
20202  31675  77675A    STA V15 BLEDS
20203  42000  12334R    JSM P217  MBLK
20204                  A1177 EQU *
20204  66000  20572R    JMP A1141
20205                  C1178 EQU *
20205   1723  77723A    LDA V26 MKRMODE
20206  72433            SZA A1179
20207  42000  10323R    JSM P626  MKRROK
20210 172031            SAP A1179
20211   1722  77722A    LDA V29 MKRLVL
```

```
20212  42000   4471R     JSM P410  DBMNV
20213  42000     34X     JSX .STRD
20214          77655A    DEF V32685  LTEMP2
20215   1730   77730A    LDA V30 KFLAG
20216 170515             SAR 14
20217  12000    2107R    CPA =D3
20220  66000   20222R    JMP *+2
20221  66000   20224R    JMP A1180
20222  42000    2001R    JSM P251   DBM
20223  66000   20224R    JMP A1181
20224                   A1180 EQU *
20224                   A1181 EQU *
20224  42000     50X     JSX CNV24
20225  70540             P*C A
20226   1435   77435A    LDA V32541  IF1
20227 170140             CMA
20230 170516             SAR 15
20231   6000    2405R    LDB =D5
20232  75617             MPY
20233  42000     57X     JSX ADD4T
20234  42000    3530R    JSM P355   REFLEV
20235  42000    2762R    JSM P314   AVGRST
20236  42000   12334R    JSM P217   MBLK
20237   2000    4470R    LDA =D1000
20240  31722   77722A    STA V29 MKRLVL
20241                   A1179 EQU *
20241  66000   20572R    JMP A1141
20242                   C1182 EQU *
20242   1723   77723A    LDA V26 MKRMODE
20243  72414             SZA A1183
20244  42000   10323R    JSM P626   MRKRUK
20245 172012             SAP A1183
20246   1675   77675A    LDA V15 BLEDS
20247 170140             CMA
20250  42000    104X     JSX .TURN
20251           4534R    DEF =B40000
20252          77675A    DEF V15 BLEDS
20253  31675   77675A    STA V15 BLEDS
20254 170140             CMA
20255   6000    2276R    LDB =D2
20256  42000     75X     JSX .WS4
20257                   A1183 EQU *
20257  66000   20572R    JMP A1141
20260                   C1184 EQU *
20260   2000    1277R    LDA =B177777
20261  31574   77574A    STA V32636   RPG
20262   1616   77616A    LDA V32654   XFLAG
20263  62000    1457R    IOR =D1
20264  31616   77616A    STA V32654   XFLAG
20265  66000   20572R    JMP A1141
20266                   C1185 EQU *
20266   2000    1457R    LDA =D1
20267  31574   77574A    STA V32636   RPG
20270   1616   77616A    LDA V32654   XFLAG
20271  62000    1457R    IOR =D1
20272  31616   77616A    STA V32654   XFLAG
20273  66000   20572R    JMP A1141
20274                   C1186 EQU *
20274   2000    2406R    LDA =D7
20275  42000   14741R    JSM P929  ENTRY
20276   1675   77675A    LDA V15 BLEDS
20277  73003             SLA A1187
20300   2000    1463R    LDA =D0
20301  42000   15313R    JSM P968  CFDF
20302                   A1187 EQU *
20302  66000   20572R    JMP A1141
20303                   C1188 EQU *
20303   2000    2203R    LDA =D8
20304  42000   14741R    JSM P929  ENTRY
20305   1675   77675A    LDA V15 BLEDS
20306  73003             SLA A1189
20307   2000    1463R    LDA =D0
20310  42000   15313R    JSM P968  CFDF
20311                   A1189 EQU *
20311  66000   20572R    JMP A1141
20312                   C1190 EQU *
20312   2000    2221R    LDA =D9
20313  42000   14741R    JSM P929  ENTRY
20314   1675   77675A    LDA V15 BLEDS
20315  73403             RLA A1191
20316   2000    1457R    LDA =D1
20317  42000   15313R    JSM P968  CFDF
20320                   A1191 EQU *
20320  66000   20572R    JMP A1141
20321                   C1192 EQU *
20321   2000    2204R    LDA =D10
20322  42000   14741R    JSM P929  ENTRY
20323   1675   77675A    LDA V15 BLEDS
20324  73403             RLA A1193
20325   2000    1457R    LDA =D1
20326  42000   15313R    JSM P968  CFDF
20327                   A1193 EQU *
20327  66000   20572R    JMP A1141
20330                   C1194 EQU *
20330   2000    2405R    LDA =D5
20331  42000   14741R    JSM P929  ENTRY
20332  66000   20572R    JMP A1141
20333                   C1195 EQU *
20333   2000    6514R    LDA =B77777
20334   6000    2276R    LDB =D2
```

```
20335  42000    107X   JSX .WS5
20336   2000   2411R   LDA =D4
20337  42000   3214R   JSM P332  WAIT
20340   2000  10242R   LDA =B177745
20341  42000  14741R   JSM P929  ENTRY
20342   1565  77565A   LDA V32629  SRQEN
20343   6000   2276R   LDB =D2
20344  42000    107X   JSX .WS5
20345   2000   2411R   LDA =D4
20346  42000   3214R   JSM P332  WAIT
20347  66000  20572R   JMP A1141
20350                 C1196 EQU *
20350  42000  13045R   JSM P791  OHPB
20351  42000     24X   JSM P211  IHPIB
20352  31735  77735A   STA V32733  HPIB
20353  42000   7732R   JSM P599  FPNLON
20354   2000  14033R   LDA =D3012
20355   6000   2203R   LDB =D8
20356  42000     75X   JSX .WS4
20357   6000   1704R   LDB =D6
20360  42000    100X   JSX .WSTR
20361          1143R   DEF ="HP-IB ADRS: "
20362   1735  77735A   LDA V32733  HPIB
20363  22000   2205R   ADA =B40
20364  42000     73X   JSX .W6
20365   1735  77735A   LDA V32733  HPIB
20366  22000   1364R   ADA =B100
20367  42000     73X   JSX .W6
20370   2000   2205R   LDA =B40
20371  42000     73X   JSX .W6
20372   2000  20430R   LDA =D26
20373  42000  14055R   JSM P216  MESSAGE
20374  42000   2173R   JSM P271  CRLF
20375   6000   1704R   LDB =D6
20376  42000    100X   JSX .WSTR
20377         20431R   DEF ="REV 28.4.78"
20400   2000   2500R   LDA =D147
20401  42000     73X   JSX .W6
20402  66000  20572R   JMP A1141
20403                 C1197 EQU *
20403   2000   2276R   LDA =D2
20404  42000   3046R   JSM P321  CLEAR
20405   1734  77734A   LDA V32732  CMOS
20406  12000  20440R   CPA =B123456
20407  66000  20411R   JMP *+2
20410  66000  20442R   JMP A1198
20411   1730  77730A   LDA V30 KFLAG
20412 170610           SAL 9
20413 172005          SAP A1199
20414   2000  14714R   LDA =B177747
20415  42000  14741R   JSM P929  ENTRY
20416   2000  20441R   LDA =B67
20417  42000  15546R   JSM P214  KEY
20420                 A1199 EQU *
20420  66000  20525R   JMP A1200
20421 177700
20422 176027
20423  21016
20424  21010
20425 167774
20426 117767
20427    173
20430     32
20431 REV 28.4.78
20440 123456
20441     67
20421                  LIT
20442                 A1198 EQU *
20442   2000  15343R   LDA =D40
20443  42000   2501R   JSM P295  BLINK
20444   2000   7565R   LDA =D18
20445  31735  77735A   STA V32733  HPIB
20446   1616  77616A   LDA V32654  XFLAG
20447  52000  11303R   AND =B177377
20450  31616  77616A   STA V32654  XFLAG
20451   2000   5115R   LDA =B177771
20452  70540           PWC A
20453   2000   1457R   LDA =D1
20454                 A1201 EQU *
20454  31474  77474A   STA V42 KL
20455  42000  24635R   JSM P220  SAVEM
20456   2000   1457R   LDA =D1
20457  21474  77474A   ADA V42 KL
20460 144016     16A   ISZ C,I
20461  66000  20454R   JMP A1201
20462  54016     16A   DSZ C
20463   2000  10241R   LDA =B177743
20464  70540           PWC A
20465   2000   1457R   LDA =D1
20466                 A1202 EQU *
20466  31474  77474A   STA V42 KL
20467  42000     60X   JSX .ARAY
20470            15R   DEF V39 BWAMP
20471  70541           PWC B
20472   2000   1463R   LDA =D0
20473  42000    170X   JSX .STAC
20474   2000   1457R   LDA =D1
20475  21474  77474A   ADA V42 KL
20476 144016     16A   ISZ C,I
20477  66000  20466R   JMP A1202
```

```
20500  54016     16A     DSZ C
20501   2000  12014R     LDA =B177763
20502  70540             PWC A
20503   2000   2276R     LDA =D2
20504              A1203 EQU *
20504  31474  77474A     STA V42 KL
20505  42000    133X     JSX .LRAY
20506            12R     DEF V37 BWFRQ
20507  70541             PWC B
20510  42000     53X     JSX .LDSI
20511          1463R     DEF =D0
20512  42000    172X     JSX .STBC
20513   2000   1457R     LDA =D1
20514  21474  77474A     ADA V42 KL
20515 144016     16A     ISZ C,I
20516  66000  20504R     JMP A1203
20517  54016     16A     DSZ C
20520   1740  77740A     LDA V32736  EFLAG
20521  52000   2067R     AND =B177757
20522  31740  77740A     STA V32736  EFLAG
20523   2000  20440R     LDA =B123456
20524  31734  77734A     STA V32732  CMOS
20525              A1200 EQU *
20525   1735  77735A     LDA V32733  HPIB
20526 170600             SAL 1
20527  22000   1457R     ADA =D1
20530   6000   2411R     LDB =D4
20531  42000    112X     JSX .WS7
20532  66000  20572R     JMP A1141
20533         20403R     DEF C1197
20534         20350R     DEF C1196
20535         20333R     DEF C1195
20536         20330R     DEF C1194
20537         20321R     DEF C1192
20540         20312R     DEF C1190
20541         20303R     DEF C1188
20542         20274R     DEF C1186
20543         20266R     DEF C1185
20544         20260R     DEF C1184
20545         20242R     DEF C1182
20546         20205R     DEF C1178
20547         20165R     DEF C1176
20550         20151R     DEF C1174
20551         20043R     DEF C1166
20552         20014R     DEF C1162
20553         17762R     DEF C1160
20554         17667R     DEF C1156
20555         17622R     DEF C1151
20556         17614R     DEF C1150
20557         17606R     DEF C1149
20560         17600R     DEF C1148
20561         17572R     DEF C1147
20562         17564R     DEF C1146
20563         17554R     DEF C1145
20564         17544R     DEF C1144
20565         17535R     DEF C1143
20566         17526R     DEF C1142
20567         17517R     DEF C1140
20570                    DEC -30
20571  42000    143X A1139 JSX .CASE
20572              A1141 EQU *
20572  66000  22352R     JMP A1204
20573              A1138 EQU *
20573   1566  77566A     LDA V32630  KEYCODE
20574  12000  13554R     CPA =B105
20575  66000  20577R     JMP A1205
20576  42000  15344R     JSM P971  USFT
20577              A1205 EQU *
20577   1566  77566A     LDA V32630  KEYCODE
20600  22000  20421R     ADA =B-100
20601  66000  22351R     JMP A1206
20602              C1207 EQU *
20602   2000   1463R     LDA =D0
20603  42000  15050R     JSM P223  AMPU
20604  42000   2551R     JSM P298  ABLK
20605  66000  22352R     JMP A1208
20606              C1209 EQU *
20606   2000   4534R     LDA =B40000
20607  42000  15050R     JSM P223  AMPU
20610  42000   2551R     JSM P298  ABLK
20611  66000  22352R     JMP A1208
20612              C1210 EQU *
20612   2000   5517R     LDA =B100000
20613  42000  15050R     JSM P223  AMPU
20614  42000   2551R     JSM P298  ABLK
20615  66000  22352R     JMP A1208
20616              C1211 EQU *
20616   2000   4533R     LDA =B140000
20617  42000  15050R     JSM P223  AMPU
20620  42000   2551R     JSM P298  ABLK
20621  66000  22352R     JMP A1208
20622              C1212 EQU *
20622   2000   7243R     LDA =B177764
20623  42000  14741R     JSM P929  ENTRY
20624   1620  77620A     LDA V32656  PREFIX
20625  42000   2223R     JSM P274  NBLK
20626   2000   2407R     LDA =D34
20627  42000     60X     JSX .ARAY
20630           210R     DEF V112  SFIXY
20631  31737  77737A     STA V32735  BLKS
```

```
20632    2000   2405R    LDA =D5
20633   31612  77612A    STA V32650  NCHR
20634   21737  77737A    ADA V32735  BLKS
20635   42000    103X    JSX .W4
20636    2000  17330R    LDA =B177705
20637   70540            PWC A
20640    2000   1457R    LDA =D1
20641                   A1213 EQU *
20641   31573  77573A    STA V32635  I
20642    2000   2500R    LDA =D147
20643   42000     73X    JSX .W6
20644    2000   1457R    LDA =D1
20645   21573  77573A    ADA V32635  I
20646  144016     16A    ISZ C,I
20647   66000  20641R    JMP A1213
20650   54016     16A    DSZ C
20651   66000  22352R    JMP A1208
20652                   C1214 EQU *
77626                   V1215 EQU V32661+1   CSIGB
77627                   V1216 EQU V32661+2   CSIGC
77630                   V1217 EQU V32661+3   CSIGD
20652    1616  77616A    LDA V32654  XFLAG
20653   70540            PWC A
20654   62000   2277R    IOR =B4000
20655   31616  77616A    STA V32654  XFLAG
20656   42000  15224R    JSM P221  TRIGR
20657   70760            WWC A
20660   31616  77616A    STA V32654  XFLAG
20661    2000   1463R    LDA =D0
20662   31626  77626A    STA V1215 CSIGB
20663   31625  77625A    STA V32661  CSIGA
20664    2000   4533R    LDA =B140000
20665    6000   1456R    LDB =D12
20666   42000     72X    JSX .WS6
20667    2000  15343R    LDA =D40
20670    6000   2405R    LDB =D5
20671   42000     75X    JSX .WS4
20672                   A1218 EQU *
20672   76302            SHS A1219
20673   66000  20672R    JMP A1218
20674                   A1219 EQU *
20674   42000    162X    JSX .R5
20675   31627  77627A    STA V1216 CSIGC
20676   42000    137X    JSX .R6
20677   31630  77630A    STA V1217 CSIGD
20700    2000   1457R    LDA =D1
20701   42000   3214R    JSM P332  WAIT
20702    2000  15667R    LDA =B177731
20703   42000  14741R    JSM P929  ENTRY
20704   66000  22352R    JMP A1208
20705                   C1220 EQU *
20705    2000  15701R    LDA =B177740
20706   42000  14741R    JSM P929  ENTRY
20707    1730  77730A    LDA V30 KFLAG
20710   62000   2411R    IOR =D4
20711   31730  77730A    STA V30 KFLAG
20712    2000  21176R    LDA =B175
20713   42000  15546R    JSM P214  KEY
20714    1676  77676A    LDA V16 TLEDS
20715   52000   6233R    AND =B600
20716   22000   6234R    ADA =B177200
20717   72405            SZA A1222
20720    1676  77676A    LDA V16 TLEDS
20721   52000  21177R    AND =B210
20722   22000  21200R    ADA =B177570
20723   72003            RZA A1221
20724                   A1222 EQU *
20724    2000  21201R    LDA =B152
20725   42000  15546R    JSM P214  KEY
20726                   A1221 EQU *
20726    1676  77676A    LDA V16 TLEDS
20727   52000  21202R    AND =B401
20730   22000  11303R    ADA =B177377
20731   72003            RZA A1223
20732    2000   3312R    LDA =B144
20733   42000  15546R    JSM P214  KEY
20734                   A1223 EQU *
20734    1676  77676A    LDA V16 TLEDS
20735   52000  21203R    AND =B411
20736   22000   1277R    ADA =B177777
20737   72003            RZA A1224
20740    2000  15132R    LDA =B141
20741   42000  15546R    JSM P214  KEY
20742                   A1224 EQU *
20742    1676  77676A    LDA V16 TLEDS
20743   52000  21204R    AND =B211
20744   22000   2066R    ADA =B177770
20745   72003            RZA A1225
20746    2000  21205R    LDA =B147
20747   42000  15546R    JSM P214  KEY
20750                   A1225 EQU *
20750    2000  21201R    LDA =B152
20751   42000    555R    JSM P215  SKEY
20752   42000  15117R    JSM P943  SMODE
20753   42000  15224R    JSM P221  TRIGR
20754   66000  22352R    JMP A1208
20755                   C1226 EQU *
20755    1730  77730A    LDA V30 KFLAG
20756  170614            SAL 13
20757  172014            SAP A1227
```

```
20760   2000    2205R     LDA =D32
20761  42000   15133R     JSM P947  TRNOFF
20762   2000    2205R     LDA =D32
20763  42000    2434R     JSM P285  BLKOF
20764   2000   21206R     LDA =B153
20765  42000     555R     JSM P215  SKEY
20766   1730   77730A     LDA V30 KFLAG
20767  52000    2153R     AND =B177773
20770  31730   77730A     STA V30 KFLAG
20771  42000   15117R     JSM P943  SMODE
20772  42000   15224R     JSM P221  TRIGR
20773                   A1227 EQU *
20773  66000   22352R     JMP A1208
20774                   C1228 EQU *
20774   1730   77730A     LDA V30 KFLAG
20775  62000    3654R     IOR =B20
20776  31730   77730A     STA V30 KFLAG
20777  66000   22352R     JMP A1208
21000                   C1229 EQU *
21000   2000    1463R     LDA =D0
21001  42000    3114R     JSM P326  WDACS
21002   2000    2172R     LDA =D13
21003  42000   14741R     JSM P929  ENTRY
21004  66000   22352R     JMP A1208
21005                   C1230 EQU *
21005   2000   17407R     LDA =B115
21006  42000   15546R     JSM P214  KEY
21007   1740   77740A     LDA V32736  EFLAG
21010  52000    1363R     AND =B177774
21011  62000    2276R     IOR =B2
21012  31740   77740A     STA V32736  EFLAG
21013  66000   22352R     JMP A1208
21014                   C1231 EQU *
21014   1723   77723A     LDA V26 MKRMODE
21015  72407             SZA A1232
21016   1675   77675A     LDA V15 BLEDS
21017  52000    1375R     AND =B177767
21020  31675   77675A     STA V15 BLEDS
21021  42000   15117R     JSM P943  SMODE
21022  42000   10413R     JSM P636  MKRON
21023  42000   10301R     JSM P624  MKRACT
21024                   A1232 EQU *
21024  66000   22352R     JMP A1208
21025                   C1233 EQU *
21025  42000   10323R     JSM P626  MRKROK
21026 172013             SAP A1234
21027   1723   77723A     LDA V26 MKRMODE
21030  72003             RZA A1235
21031   2000   17407R     LDA =B115
21032  42000   15546R     JSM P214  KEY
21033                   A1235 EQU *
21033   1675   77675A     LDA V15 BLEDS
21034  62000    2203R     IOR =B10
21035  31675   77675A     STA V15 BLEDS
21036  42000   15117R     JSM P943  SMODE
21037  42000   10413R     JSM P636  MKRON
21040  42000   10301R     JSM P624  MKRACT
21041                   A1234 EQU *
21041  66000   22352R     JMP A1208
21042                   C1236 EQU *
21042   2000   17407R     LDA =B115
21043  42000   15546R     JSM P214  KEY
21044   1740   77740A     LDA V32736  EFLAG
21045  52000    1363R     AND =B177774
21046  62000    2107R     IOR =B3
21047  31740   77740A     STA V32736  EFLAG
21050  66000   22352R     JMP A1208
21051                   C1237 EQU *
21051  42000   10312R     JSM P218  MKREL
21052 172025             SAP A1238
21053  42000   10323R     JSM P626  MRKROK
21054 172023             SAP A1238
21055  42000      37X     JSX .LDBI
21056          77645A     DEF V32677  MFREQ
21057   4020      20A     LDB AR2
21060  77202              SLB *+2,C
21061  34020      20A     STB AR2
21062  42000   11120R     JSM P668  SPANW
21063  42000      37X     JSX .LDBI
21064          77645A     DEF V32677  MFREQ
21065  42000     146X     JSX DIV3
21066           2276R     DEF =D2
21067  42000     150X     JSX ADD2
21070          77724A     DEF V10 AMF
21071  42000    6750R     JSM P222  TUNE
21072   2000   10522R     LDA =D501
21073  42000   11010R     JSM P663  STMKKR
21074  42000    2762R     JSM P314  AVGRST
21075   2000   17407R     LDA =B115
21076  42000   15546R     JSM P214  KEY
21077                   A1238 EQU *
21077  66000   22352R     JMP A1208
21100                   C1239 EQU *
21100   2000   21207R     LDA =B177746
21101  42000   14741R     JSM P929  ENTRY
21102  66000   22352R     JMP A1208
21103                   C1240 EQU *
21103   2000   17407R     LDA =B115
21104  42000   15546R     JSM P214  KEY
21105   1740   77740A     LDA V32736  EFLAG
```

```
21106  52000   1363R    AND =B177774
21107  62000   1457R    IOR =B1
21110  31740  77740A    STA V32736   EFLAG
21111  66000  22352R    JMP A1208
21112                 C1241 EQU *
21112   1616  77616A    LDA V32654   XFLAG
21113  62000   6703R    IOR =B2000
21114  31616  77616A    STA V32654   XFLAG
21115  66000  22352R    JMP A1208
21116                 C1242 EQU *
21116   1730  77730A    LDA V30 KFLAG
21117  52000   1363R    AND =B177774
21120  31730  77730A    STA V30 KFLAG
21121   2000  10141R    LDA =D38
21122  42000   2434R    JSM P285   BLKOF
21123  42000     37X    JSX .LDBI
21124         77665A    DEF V8   CFREQ
21125  42000   6750R    JSM P222   TUNE
21126  66000  22352R    JMP A1208
21127                 C1243 EQU *
21127   1730  77730A    LDA V30 KFLAG
21130  52000   1363R    AND =B177774
21131  62000   1457R    IOR =B1
21132  31730  77730A    STA V30 KFLAG
21133   2000  10141R    LDA =D38
21134  42000   2223R    JSM P274   NBLK
21135   2000  21210R    LDA =D172
21136  42000     73X    JSX .W6
21137   2000   2420R    LDA =D145
21140  42000     73X    JSX .W6
21141  42000     37X    JSX .LDBI
21142         77665A    DEF V8   CFREQ
21143  42000   6750R    JSM P222   TUNE
21144  66000  22352R    JMP A1208
21145                 C1244 EQU *
21145   1730  77730A    LDA V30 KFLAG
21146  52000   1363R    AND =B177774
21147  62000   2276R    IOR =B2
21150  31730  77730A    STA V30 KFLAG
21151   2000  10141R    LDA =D38
21152  42000   2223R    JSM P274   NBLK
21153   2000  21211R    LDA =B136
21154  42000     73X    JSX .W6
21155   2000   2420R    LDA =D145
21156  42000     73X    JSX .W6
21157  42000     37X    JSX .LDBI
21160         77665A    DEF V8   CFREQ
21161  42000   6750R    JSM P222   TUNE
21162  66000  22352R    JMP A1208
21163                 C1245 EQU *
21163   2000  21212R    LDA =B177735
21164  42000  14741R    JSM P929   ENTRY
21165  66000  22352R    JMP A1208
21166                 C1246 EQU *
21166  66000  21417R    JMP A1247
21167                 P1248 EQU * SLVL
21167 174517            CLB
21170  42000     56X    JSX .ARGS
21171  44016     16A    ISZ C
21172   1722  77722A    LDA V29 MKRLVL
21173  42000   4471R    JSM P410   DBMNV
21174  42000     50X    JSX CNV24
21175  66000     31X   JMX .RTNA
21176    175
21177    210
21200 177570
21201    152
21202    401
21203    411
21204    211
21205    147
21206    153
21207 177746
21210    254
21211    136
21212 177735
21176                   LII
21213                 P1249 EQU * RFSET
21213   6000   1277R    LDB =D-1
21214  42000     27X    JSX .ARGA
21215  42000    104X    JSX .TURN
21216          2406R    DEF =D7
21217         77677A    DEF V17 RFAT
21220  31677  77677A    STA V17 RFAT
21221  42000   3255R    JSM P337   WRFAT
21222  66000     31X    JMX .RTNA
77467                 V1250 EQU T32542+25 A20
77466                 V1251 EQU T32542+24 A10
77465                 V1252 EQU T32542+23 A0
77460                 V1253 EQU T32542+18 SG50
77454                 V1254 EQU T32542+14 LOOFS
21223                 P1255 EQU * STLVL
21223  42000   2303R    JSM P277   GOFSET
21224  70540            PWC A
21225  42000   1665R    JSM P245   RLAD
21226  22000  21232R    ADA =D-70
21227  42000    116X    JSX SUB4I
21230  42000   3530R    JSM P355   REFLEV
21231 170201            RET 1
21232 177672
```

```
21232                     LIT
21233                     P1256 EQU * TKSCAN
21233    2000    1463R      LDA =D0
21234   31426   77426A      STA V32534  UFLAG
21235   31620   77620A      STA V32656  PREFIX
21236    2000   14033R      LDA =D3012
21237    6000    2203R      LDB =D8
21240   42000      75X      JSX .WS4
21241    6000    1704R      LDB =D6
21242   42000     100X      JSX .WSTR
21243           21301R      DEF ="CALIBRATING!"
21244    2000    2500R      LDA =D147
21245   42000      73X      JSX .W6
21246    1675   77675A      LDA V15 BLEDS
21247  170140               CMA
21250    6000    2276R      LDB =D2
21251   42000      75X      JSX .WS4
21252                     L1257 EQU * AGAIN
21252    2000    6514R      LDA =B77777
21253    6000    2276R      LDB =D2
21254   42000     107X      JSX .WS5
21255    2000    2107R      LDA =D3
21256    6000    2107R      LDB =D3
21257   42000      75X      JSX .WS4
21260    2000    2405R      LDA =D5
21261   42000     103X      JSX .W4
21262    2000    7670R      LDA =B164
21263   42000   15546R      JSM P214  KEY
21264    1702   77702A      LDA V24 VIDCON
21265    6000    2221R      LDB =D9
21266   42000      75X      JSX .WS4
21267    1703   77703A      LDA V21 STRIG
21270    6000    1456R      LDB =D12
21271   42000      72X      JSX .WS6
21272    2000    1463R      LDA =D0
21273    6000    2107R      LDB =D3
21274   42000     107X      JSX .WS5
21275    2000    1704R      LDA =D6
21276   42000     103X      JSX .W4
21277                     A1258 EQU *
21277   76311               SHS A1259
21300   66000   21277R      JMP A1258
21301 CALIBRAING!
21301                      LIT
21310                     A1259 EQU *
21310    6000    2276R      LDB =D2
21311   42000     110X      JSX .RS7
21312   31573   77573A      STA V32635  I
21313   52000    2406R      AND =D7
21314   72422               SZA A1260
21315    2000   14033R      LDA =D3012
21316    6000    2203R      LDB =D8
21317   42000      75X      JSX .WS4
21320    6000    1704R      LDB =D6
21321   42000     100X      JSX .WSTR
21322           21326R      DEF ="CALIB ABORTED"
21323    2000    2500R      LDA =D147
21324   42000      73X      JSX .W6
21325   66000   32476R      JMP L193  RESET
21326 CALIB ABORTED
21326                      LIT
21336                     A1260 EQU *
21336    2000   10412R      LDA =B113
21337   42000   15546R      JSM P214  KEY
21340    2000    2405R      LDA =D5
21341    6000    2107R      LDB =D3
21342   42000      75X      JSX .WS4
21343    1675   77675A      LDA V15 BLEDS
21344   62000    2411R      IOR =D4
21345   31675   77675A      STA V15 BLEDS
21346    1722   77722A      LDA V29 MKRLVL
21347  170040               TCA
21350   22000   21367R      ADA =D1019
21351  172404               SAM A1262
21352    1722   77722A      LDA V29 MKRLVL
21353   22000   10712R      ADA =D-100
21354  172025               SAP A1261
21355                     A1262 EQU *
21355    2000   14033R      LDA =D3012
21356    6000    2203R      LDB =D8
21357   42000      75X      JSX .WS4
21360    6000    1704R      LDB =D6
21361   42000     100X      JSX .WSTR
21362           21370R      DEF ="ADJUST AMPTD CAL"
21363    2000    2500R      LDA =D147
21364   42000      73X      JSX .W6
21365   42000    5350R      JSM P464  SRQM
21366   66000   32476R      JMP L193  RESET
21367    1773
21370 ADJUST AMPTD CAL
21367                      LIT
21401                     A1261 EQU *
21401    1721   77721A      LDA V25 MRKR
21402   22000   21413R      ADA =D-500
21403  172002               SAP *+2
21404  170040               TCA
21405  170040               TCA
21406   22000   21414R      ADA =D400
21407  172007               SAP A1263
21410    2000   21415R      LDA =B116
```

```
21411   42000   15546R     JSM P214  KEY
21412   66000   21252R     JMP L1257 AGAIN
21413  177014
21414     620
21415     116
21413                      LIT
21416                    A1263 EQU *
21416  170201              RET 1
21417                    A1247 EQU *
21417    2000   22222R     LDA =D39
21420   42000    2434R     JSM P285  BLKOF
21421    2000   15132R     LDA =B141
21422   42000   15546R     JSM P214  KEY
21423    2000   22223R     LDA =B143
21424   42000   15546R     JSM P214  KEY
21425    1730   77730A     LDA V30 KFLAG
21426   70540              PWC A
21427    1706   77706A     LDA V31 ROFSET
21430   70540              PWC A
21431    1677   77677A     LDA V17 RFAT
21432   70540              PWC A
21433    1606   77606A     LDA V32646   SRCEID
21434   70540              PWC A
21435    2000    1463R     LDA =D0
21436   31606   77606A     STA V32646   SRCEID
21437    1677   77677A     LDA V17 RFAT
21440   52000    2131R     AND =B17
21441   62000   22224R     IOR =B174700
21442   31677   77677A     STA V17 RFAT
21443    1676   77676A     LDA V16 TLEDS
21444   52000   22225R     AND =B410
21445   72403              SZA A1264
21446    2000   21206R     LDA =B153
21447   42000   15546R     JSM P214  KEY
21450                    A1264 EQU *
21450    2000    7667R     LDA =B157
21451   42000   15546R     JSM P214  KEY
21452    2000    1463R     LDA =D0
21453   31706   77706A     STA V31 ROFSET
21454    2000    2723R     LDA =B54
21455   42000   15546R     JSM P214  KEY
21456    2000   22226R     LDA =B166
21457   42000   15546R     JSM P214  KEY
21460    2000   22227R     LDA =B106
21461   42000   15546R     JSM P214  KEY
21462    2000    1463R     LDA =D0
21463   42000   15313R     JSM P968  CFDF
21464    1730   77730A     LDA V30 KFLAG
21465   52000   22230R     AND =B37770
21466   31730   77730A     STA V30 KFLAG
21467   42000   15050R     JSM P223  AMPU
21470    2000   22231R     LDA =B104
21471   42000   15546R     JSM P214  KEY
21472    1740   77740A     LDA V32736   EFLAG
21473   52000   22232R     AND =B177703
21474   31740   77740A     STA V32736   EFLAG
21475    2000   22233R     LDA =B162
21476   42000   15546R     JSM P214  KEY
21477   42000   21223R     JSM P1255 STLVL
21500   42000      37X     JSX .LDBI
21501           11133R     DEF D673   20000000
21502   42000     150X     JSX ADD2
21503           77707A     DEF V11 FOFSET
21504   42000    6750R     JSM P222  TUNE
21505   42000      37X     JSX .LDBI
21506            6717R     DEF =F10000000
21507   42000   11120R     JSM P668  SPANW
21510    2000   22234R     LDA =B124
21511   42000     555R     JSM P215  SKEY
21512   42000   21233R     JSM P1256 TKSCAN
21513    2000    2172R     LDA =D13
21514   22000    2110R     ADA =B177776
21515   42000     113X     JSX DIV4
21516            1277R     DEF =B177777
21517   22000    1277R     ADA =B177777
21520   70540              PWC A
21521    2000    2172R     LDA =D13
21522                    A1265 EQU *
21522   31474   77474A     STA V42 KL
21523   42000    4210R     JSM P392  IFBWOUT
21524    1474   77474A     LDA V42 KL
21525   42000    4420R     JSM P407  EXP3
21526   42000     126X     JSX MPY3
21527            2405R     DEF =D5
21530   42000   11120R     JSM P668  SPANW
21531    2000    2405R     LDA =D5
21532   42000    3214R     JSM P332  WAIT
21533   42000   21233R     JSM P1256 TKSCAN
21534    1474   77474A     LDA V42 KL
21535   42000     133X     JSX .LRAY
21536              12R     DEF V37 BWFRQ
21537   70541              PWC B
21540   42000      37X     JSX .LDBI
21541           11133R     DEF D673   20000000
21542   42000     140X     JSX MIN2
21543           77645A     DEF V32677   MFREQ
21544   42000     145X     JSX SUB2
21545           77707A     DEF V11 FOFSET
21546   42000     172X     JSX .STBC
21547    1474   77474A     LDA V42 KL
```

```
21550  42000     60X    JSX .ARAY
21551            15R    DEF V39 BWAMP
21552  70541            PWC B
21553  42000   2303R    JSM P277  GOFSET
21554  70540            PWC A
21555  42000  21167R    JSM P1248 SLVL
21556  22000   4470R    ADA =D1000
21557  42000    116X    JSX SUB4T
21560  42000    170X    JSX .STAC
21561   1474  77474A    LDA V42 KL
21562  12000   2221R    CPA =D9
21563  66000  21567R    JMP A1267
21564  12000   2204R    CPA =D10
21565  66000  21567R    JMP *+2
21566  66000  21623R    JMP A1266
21567                 A1267 EQU *
21567   2000  22235R    LDA =B161
21570  42000  15546R    JSM P214  KEY
21571   2000   4207R    LDA =B160000
21572  42000   4171R    JSM P390  LGDB
21573   2000   2405R    LDA =D5
21574  42000   3214R    JSM P332  WAIT
21575  42000  21233R    JSM P1256 IKSCAN
21576   6000   3526R    LDB =B177766
21577  25474  77474A    ADB V42 KL
21600   2000   3527R    LDA =D14
21601  76402           SZB A1268
21602   2000   1457R    LDA =D1
21603                 A1268 EQU *
21603  42000     60X    JSX .ARAY
21604            15R    DEF V39 BWAMP
21605  70541            PWC B
21606  42000   2303R    JSM P277  GOFSET
21607  70540            PWC A
21610   1474  77474A    LDA V42 KL
21611  42000     60X    JSX .ARAY
21612            15R    DEF V39 BWAMP
21613  70541            PWC B
21614  42000  21167R    JSM P1248 SLVL
21615  42000    173X    JSX SUB4B
21616  22000   4470R    ADA =D1000
21617  42000    116X    JSX SUB4T
21620  42000    170X    JSX .STAC
21621   2000  22233R    LDA =B162
21622  42000  15546R    JSM P214  KEY
21623                 A1266 EQU *
21623   1474  77474A    LDA V42 KL
21624  12000   2203R    CPA =D8
21625  66000  21627R    JMP *+2
21626  66000  21651R    JMP A1269
21627   2000   4627R    LDA =B125
21630  42000    555R    JSM P215  SKEY
21631   2000   2405R    LDA =D5
21632  42000   3214R    JSM P332  WAIT
21633  42000  21233R    JSM P1256 IKSCAN
21634  42000   2303R    JSM P277  GOFSET
21635  70540            PWC A
21636   2000   2203R    LDA =D8
21637  42000     60X    JSX .ARAY
21640            15R    DEF V39 BWAMP
21641  70541            PWC B
21642  42000  21167R    JSM P1248 SLVL
21643  22000   4470R    ADA =D1000
21644  42000    173X    JSX SUB4B
21645  42000    116X    JSX SUB4T
21646  31454  77454A    STA V1254 LOOFS
21647   2000  22234R    LDA =B124
21650  42000    555R    JSM P215  SKEY
21651                 A1269 EQU *
21651   1474  77474A    LDA V42 KL
21652 170040            TCA
21653  22000   2276R    ADA =D2
21654 172003           SAP A1270
21655   2000  21415R    LDA =B116
21656  42000  15546R    JSM P214  KEY
21657                 A1270 EQU *
21657   2000   1277R    LDA =B177777
21660  21474  77474A    ADA V42 KL
21661 144016     16A    ISZ C,I
21662  66000  21522R    JMP A1265
21663  54016     16A    DSZ C
21664   2000  22235R    LDA =B161
21665  42000  15546R    JSM P214  KEY
21666   2000   4207R    LDA =B160000
21667  42000   4171R    JSM P390  LGDB
21670   2000  22236R    LDA =B111
21671  42000  15546R    JSM P214  KEY
21672   2000   2411R    LDA =D4
21673  42000   4210R    JSM P392  IFBWOUT
21674  42000     53X    JSX .LDSI
21675          1300R    DEF =H200
21676  42000  11120R    JSM P668  SPANW
21677   2000   2405R    LDA =D5
21700  42000   3214R    JSM P332  WAIT
21701  42000  21233R    JSM P1256 IKSCAN
21702  42000  21167R    JSM P1248 SLVL
21703  31475  77475A    STA V43 KM
21704   2000   1363R    LDA =B177774
21705  70540            PWC A
21706   2000   1463R    LDA =D0
```

```
21707                        A1271 EQU *
21707   31474    77474A            STA V42 KL
21710   22000     2411R            ADA =D4
21711  170614                      SAL 13
21712   42000     4171R            JSM P390  LGDB
21713    2000     2405R            LDA =D5
21714   42000     3214R            JSM P332  WAIT
21715   42000    21233R            JSM P1256 TKSCAN
21716    1474    77474A            LDA V42 KL
21717  170040                      TCA
21720   22000     2416R            ADA =D29
21721   42000       60X            JSX .ARAY
21722               15R            DEF V39 BWAMP
21723   70541                      PWC B
21724   42000    21167R            JSM P1248 SLVL
21725  170040                      TCA
21726   21475    77475A            ADA V43 KM
21727  170040                      TCA
21730   42000      170X            JSX .STAC
21731    2000     1457R            LDA =D1
21732   21474    77474A            ADA V42 KL
21733  144016       16A            ISZ C,I
21734   66000    21707R            JMP A1271
21735   54016       16A            DSZ C
21736    2000    22233R            LDA =B162
21737   42000    15546R            JSM P214  KEY
21740    2000     2405R            LDA =D5
21741   42000     3214R            JSM P332  WAIT
21742   42000    21233R            JSM P1256 TKSCAN
21743   42000    21167R            JSM P1248 SLVL
21744   31475    77475A            STA V43 KM
21745    2000     1463R            LDA =D0
21746   31467    77467A            STA V1250 A20
21747    2000     2417R            LDA =B177772
21750   70540                      PWC A
21751    2000     2276R            LDA =D2
21752                        A1272 EQU *
21752   31474    77474A            STA V42 KL
21753   42000    21213R            JSM P1249 RFSET
21754   42000    21223R            JSM P1255 STLVL
21755    1474    77474A            LDA V42 KL
21756   12000     1704R            CPA =D6
21757   66000    21761R            JMP *+2
21760   66000    21766R            JMP A1273
21761    2000    22237R            LDA =B107
21762   42000    15546R            JSM P214  KEY
21763    2000     2276R            LDA =D2
21764   42000     4314R            JSM P400  VBWOUT
21765   42000     7775R            JSM P603  CSCANBW
21766                        A1273 EQU *
21766    2000     2405R            LDA =D5
21767   42000     3214R            JSM P332  WAIT
21770   42000    21233R            JSM P1256 TKSCAN
21771    1474    77474A            LDA V42 KL
21772  170040                      TCA
21773   22000    10243R            ADA =D27
21774   42000       60X            JSX .ARAY
21775               15R            DEF V39 BWAMP
21776   70541                      PWC B
21777    1677    77677A            LDA V17 RFAT
22000   42000        7X            JSM P198  ATNER
22001   70540                      PWC A
22002   42000    21167R            JSM P1248 SLVL
22003  170040                      TCA
22004   21475    77475A            ADA V43 KM
22005  170040                      TCA
22006   42000      116X            JSX SUB4T
22007   42000      170X            JSX .STAC
22010    2000     1457R            LDA =D1
22011   21474    77474A            ADA V42 KL
22012  144016       16A            ISZ C,I
22013   66000    21752R            JMP A1272
22014   54016       16A            DSZ C
22015    1435    77435A            LDA V32541  IF1
22016   62000    22240R            IOR =B740
22017    6000     2172R            LDB =D13
22020   42000       75X            JSX .WS4
22021    2000     2405R            LDA =D5
22022   42000     3214R            JSM P332  WAIT
22023   42000    21233R            JSM P1256 TKSCAN
22024    1677    77677A            LDA V17 RFAT
22025   42000        7X            JSM P198  ATNER
22026   70540                      PWC A
22027   42000    21167R            JSM P1248 SLVL
22030  170040                      TCA
22031   21475    77475A            ADA V43 KM
22032  170040                      TCA
22033  170040                      TCA
22034   21466    77466A            ADA V1251 A10
22035  170040                      TCA
22036   42000      116X            JSX SUB4T
22037   31460    77460A            STA V1253 SG50
22040    2000    22241R            LDA =B102
22041   42000    15546R            JSM P214  KEY
22042    2000     2107R            LDA =D3
22043   42000    21213R            JSM P1249 RFSET
22044   42000    21223R            JSM P1255 STLVL
22045    2000     2405R            LDA =D5
22046   42000     3214R            JSM P332  WAIT
22047   42000    21233R            JSM P1256 TKSCAN
```

```
22050    1677   77677A      LDA V17 RFAT
22051   42000       7X      JSM P198  AINER
22052   70540               PWC A
22053   42000   21167R      JSM P1248 SLVL
22054   42000     116X      JSX SUB4T
22055   31475   77475A      STA V43 KM
22056    2000    1301R      LDA =B177775
22057   70540               PWC A
22060    2000    1457R      LDA =D1
22061                     A1274 EQU *
22061   31474   77474A      STA V42 KL
22062   22000    2107R      ADA =D3
22063   42000   21213R      JSM P1249 RFSET
22064    1474   77474A      LDA V42 KL
22065  170602               SAL 3
22066   61435   77435A      IOR V32541  IF1
22067    6000    2172R      LDB =D13
22070   42000      75X      JSX .WS4
22071    2000    2405R      LDA =D5
22072   42000    3214R      JSM P332  WAIT
22073   42000   21233R      JSM P1256 IKSCAN
22074    1474   77474A      LDA V42 KL
22075  170040               TCA
22076   22000    2301R      ADA =D19
22077   42000      60X      JSX .ARAY
22100              15R      DEF V39 BWAMP
22101   70541               PWC B
22102    1677   77677A      LDA V17 RFAT
22103   42000       7X      JSM P198  AINER
22104   70540               PWC A
22105   42000   21167R      JSM P1248 SLVL
22106  170040               TCA
22107   21475   77475A      ADA V43 KM
22110  170040               TCA
22111   42000     116X      JSX SUB41
22112   42000     170X      JSX .STAC
22113    2000    1457R      LDA =D1
22114   21474   77474A      ADA V42 KL
22115  144016      16A      ISZ C,I
22116   66000   22061R      JMP A1274
22117   54016      16A      DSZ C
22120    2000   22235R      LDA =B161
22121   42000   15546R      JSM P214  KEY
22122    2000   22242R      LDA =B123
22123   42000     555R      JSM P215  SKEY
22124    2000    5115R      LDA =B177771
22125   70540               PWC A
22126    2000    2406R      LDA =D7
22127                     A1275 EQU *
22127   31573   77573A      STA V32635  I
22130   42000      60X      JSX .ARAY
22131              15R      DEF V39 BWAMP
22132   70541               PWC B
22133    1573   77573A      LDA V32635  I
22134   42000      60X      JSX .ARAY
22135              15R      DEF V39 BWAMP
22136  170040               TCA
22137   21465   77465A      ADA V1252 A0
22140  170040               TCA
22141   42000     170X      JSX .STAC
22142    2000    1457R      LDA =D1
22143   21573   77573A      ADA V32635  I
22144  144016      16A      ISZ C,I
22145   66000   22127R      JMP A1275
22146   54016      16A      DSZ C
22147   70760               WWC A
22150   31606   77606A      STA V32646  SRCEID
22151   70760               WWC A
22152   31677   77677A      STA V17 RFAT
22153   70760               WWC A
22154   31706   77706A      STA V31 ROFSET
22155   70760               WWC A
22156   31730   77730A      STA V30 KFLAG
22157   42000    3255R      JSM P337  WRFAT
22160    1675   77675A      LDA V15 BLEDS
22161   52000   22243R      AND =B176773
22162   31675   77675A      STA V15 BLEDS
22163    1740   77740A      LDA V32736  EFLAG
22164   52000   22232R      AND =B177703
22165   62000   22244R      IOR =B74
22166   31740   77740A      STA V32736  EFLAG
22167    2000   22222R      LDA =D39
22170   42000    2223R      JSM P274  NBLK
22171    2000    2723R      LDA =B54
22172   42000   15546R      JSM P214  KEY
22173    1730   77730A      LDA V30 KFLAG
22174   42000   15050R      JSM P223  AMPU
22175   42000    1665R      JSM P245  RLAD
22176   42000    3530R      JSM P355  REFLEV
22177    2000    1463R      LDA =D0
22200   42000   14741R      JSM P929  ENTRY
22201   60000   22352R      JMP A1208
22202                     C1276 EQU *
22202    1740   77740A      LDA V32736  EFLAG
22203   62000    2205R      IOR =B40
22204   31740   77740A      STA V32736  EFLAG
22205   42000    2762R      JSM P314  AVGRST
22206    1700   77700A      LDA V22 RLVL
22207   42000    3530R      JSM P355  REFLEV
22210   42000      37X      JSX .LDBI
```

```
9668  22211          77665A    DEF V8   CFREQ
9669  22212  42000    6750R    JSM P222  TUNE
9670  22213  42000    7775R    JSM P603  CSCANBW
9671  22214   1740   77740A    LDA V32736  EFLAG
9672  22215 170612             SAL 11
9673  22216 172027             SAP A1277
9674  22217   2000   22222R    LDA =D39
9675  22220  42000    2223R    JSM P274   NBLK
9676  22221  66000   22247R    JMP A1278
      22222     47
      22223    143
      22224 174700
      22225    410
      22226    166
      22227    106
      22230  37770
      22231    104
      22232 177703
      22233    162
      22234    124
      22235    161
      22236    111
      22237    107
      22240    740
      22241    102
      22242    123
      22243 176773
      22244     74
9677  22222                   LIT
9678  22245                   A1277 EQU *
9679  22245   2000   22222R    LDA =D39
9680  22246  42000    2434R    JSM P285    BLKOF
9681  22247                   A1278 EQU *
9682  22247  66000   22352R    JMP A1208
9683  22250                   C1279 EQU *
9684  22250   2000   22222R    LDA =D39
9685  22251  42000    2434R    JSM P285    BLKOF
9686  22252   1740   77740A    LDA V32736   EFLAG
9687  22253  52000    7731R    AND =B177737
9688  22254  31740   77740A    STA V32736   EFLAG
9689  22255   1700   77700A    LDA V22 RLVL
9690  22256  42000    3530R    JSM P355   REFLEV
9691  22257  42000      37X    JSX .LDBI
9692  22260          77665A    DEF V8   CFREQ
9693  22261  42000    6750R    JSM P222   TUNE
9694  22262  42000    7775R    JSM P603   CSCANBW
9695  22263  66000   22352R    JMP A1208
9696  22264                   C1280 EQU *
9697  22264   2000   22313R    LDA =B177736
9698  22265  42000   14741R    JSM P929   ENTRY
9699  22266  66000   22352R    JMP A1208
9700  22267                   C1281 EQU *
9701  22267   1740   77740A    LDA V32736   EFLAG
9702  22270  70540             PWC A
9703  22271  62000    2205R    IOR =B40
9704  22272  31740   77740A    STA V32736  EFLAG
9705  22273  42000   13045R    JSM P791   OHPB
9706  22274   2000    1704R    LDA =D6
9707  22275  70540             PWC A
9708  22276   2000    2411R    LDA =D4
9709  22277  70540             PWC A
9710  22300  42000    3406R    JSM P348   RFLC
9711  22301  42000     122X    JSX CNV42
9712  22302  42000   13062R    JSM P793    NDUMP
9713  22303  42000   13030R    JSM P789    WCKLF
9714  22304  70760             WWC A
9715  22305  31740   77740A    STA V32736   EFLAG
9716  22306  66000   22352R    JMP A1208
9717  22307                   C1282 EQU *
9718  22307   1730   77730A    LDA V30 KFLAG
9719  22310  62000   11310R    IOR =B400
9720  22311  31730   77730A    STA V30 KFLAG
9721  22312  66000   22352R    JMP A1208
      22313 177736
9722  22313                   LIT
9723  22314          22307R    DEF  C1282
9724  22315          22267R    DEF  C1281
9725  22316          22264R    DEF  C1280
9726  22317          22250R    DEF  C1279
9727  22320          22202R    DEF  C1276
9728  22321          21166R    DEF  C1246
9729  22322          21163R    DEF  C1245
9730  22323          21145R    DEF  C1244
9731  22324          21127R    DEF  C1243
9732  22325          21116R    DEF  C1242
9733  22326          21112R    DEF  C1241
9734  22327          21103R    DEF  C1240
9735  22330          21100R    DEF  C1239
9736  22331          21051R    DEF  C1237
9737  22332          21042R    DEF  C1236
9738  22333          21025R    DEF  C1233
9739  22334          21014R    DEF  C1231
9740  22335          21005R    DEF  C1230
9741  22336          21000R    DEF  C1229
9742  22337          20774R    DEF  C1228
9743  22340          20755R    DEF  C1226
9744  22341          20705R    DEF  C1220
9745  22342          20652R    DEF  C1214
9746  22343          20622R    DEF  C1212
9747  22344          20616R    DEF  C1211
```

```
22345                20612R     DEF C1210
22346                20606R     DEF C1209
22347                20602R     DEF C1207
22350                           DEC -29
22351    42000         143X   A1206 JSX .CASE
22352                         A1208 EQU *
22352                         A1204 EQU *
22352    66000       24627R     JMP A1068
22353                         C1283 EQU *
22353     1676       77676A     LDA V16 TLEDS
22354   170605                  SAL 6
22355   172002                  SAP *+2
22356    66000       23432R     JMP A1284
22357     1733       77733A     LDA V20 FSTIM
22360   172005                 SAP A1286
22361     1566       77566A     LDA V32630  KEYCODE
22362   170040                  TCA
22363    22000       22443R     ADA =B154
22364   172004                 SAP A1285
22365                         A1286 EQU *
22365     1566       77566A     LDA V32630  KEYCODE
22366    22000       22444R     ADA =B-140
22367    66000       22371R     JMP A1287
22370                         A1285 EQU *
22370     2000        1463R     LDA =D0
22371                         A1287 EQU *
22371    66000       23430R     JMP A1288
22372                         C1289 EQU *
22372    42000       15143R     JSM P949  UNBLANK
22373     1676       77676A     LDA V16 TLEDS
22374    52000       21200R     AND =B177570
22375    62000        2410R     IOR =B200
22376    42000        2163R     JSM P270  TLEDSOUT
22377     1426       77426A     LDA V32534  UFLAG
22400    62000        2276R     IOR =D2
22401    31426       77426A     STA V32534  UFLAG
22402     2000        1463R     LDA =D0
22403    31607       77607A     STA V32647  ACNT
22404     2000        1457R     LDA =D1
22405    42000        3046R     JSM P321  CLEAR
22406     2000        1463R     LDA =D0
22407     6000        2203R     LDB =D8
22410    42000          75X     JSX .WS4
22411     2000        7570R     LDA =B2020
22412    42000          73X     JSX .W6
22413    42000       10747R     JSM P219  MKRDEL
22414     1603       77603A     LDA V32643  PLOCK
22415    52000        7567R     AND =B173777
22416    31603       77603A     STA V32643  PLOCK
22417    42000        6160R     JSM P502  EOS
22420    42000        4664R     JSM P423  VDCUP
22421    66000       23431R     JMP A1290
22422                         C1291 EQU *
22422    42000       15030R     JSM P936  ALICK
22423     1676       77676A     LDA V16 TLEDS
22424    52000       21200R     AND =B177570
22425    62000        1457R     IOR =B1
22426    42000        2163R     JSM P270  TLEDSOUT
22427     2000        1463R     LDA =D0
22430     6000        2203R     LDB =D8
22431    42000          75X     JSX .WS4
22432     2000        7570R     LDA =B2020
22433    42000          73X     JSX .W6
22434    42000        4664R     JSM P423  VDCUP
22435     1676       77676A     LDA V16 TLEDS
22436   170613                  SAL 12
22437   172006                 SAP A1292
22440     2000       21206R     LDA =B153
22441    42000       15546R     JSM P214  KEY
22442    66000       22446R     JMP A1293
22443      154
22444   177640
22443                           L11
22445                         A1292 EQU *
22445    42000       15143R     JSM P949  UNBLANK
22446                         A1293 EQU *
22446     2000       22604R     LDA =B110
22447    42000         555R     JSM P215  SKEY
22450    42000       10747R     JSM P219  MKRDEL
22451     1603       77603A     LDA V32643  PLOCK
22452    52000        7567R     AND =B173777
22453    31603       77603A     STA V32643  PLOCK
22454    42000        6160R     JSM P502  EOS
22455    66000       23431R     JMP A1290
22456                         C1294 EQU *
22456     1676       77676A     LDA V16 TLEDS
22457   170610                  SAL 9
22460   172012                 SAP A1295
22461     1676       77676A     LDA V16 TLEDS
22462    52000        6512R     AND =B177677
22463    42000        2163R     JSM P270  TLEDSOUT
22464     1426       77426A     LDA V32534  UFLAG
22465    62000        2276R     IOR =D2
22466    31426       77426A     STA V32534  UFLAG
22467     2000        1277R     LDA =B177777
22470    31607       77607A     STA V32647  ACNT
22471    42000        4664R     JSM P423  VDCUP
22472                         A1295 EQU *
22472    66000       23431R     JMP A1290
22473                         C1296 EQU *
```

```
22473  42000  15030R   JSM P936  ALTCK
22474  42000  15143R   JSM P949  UNBLANK
22475   1676  77676A   LDA V16 TLEDS
22476  52000  21200R   AND =B177570
22477  62000   2276R   IOR =B2
22500  42000   2163R   JSM P270  TLEDSOUT
22501   2000   1463R   LDA =D0
22502   6000   2203R   LDB =D8
22503  42000     75X   JSX .WS4
22504   2000   7570R   LDA =B2020
22505  42000     73X   JSX .W6
22506  42000   4664R   JSM P423  VDCOP
22507  42000  10747R   JSM P219  MKRDEL
22510  66000  23431R   JMP A1290
22511                 C1297 EQU *
22511  42000  15030R   JSM P936  ALTCK
22512  42000  15143R   JSM P949  UNBLANK
22513   1676  77676A   LDA V16 TLEDS
22514  52000  21200R   AND =B177570
22515  62000   2411R   IOR =B4
22516  42000   2163R   JSM P270  TLEDSOUT
22517   2000   1463R   LDA =D0
22520   6000   2203R   LDB =D8
22521  42000     75X   JSX .WS4
22522   2000   3113R   LDA =B2060
22523  42000     73X   JSX .W6
22524  42000   4664R   JSM P423  VDCOP
22525  42000  10747R   JSM P219  MKRDEL
22526  66000  23431R   JMP A1290
22527                 C1298 EQU *
22527   1676  77676A   LDA V16 TLEDS
22530 170610           SAL 9
22531 172002           SAP *+2
22532  66000  22606R   JMP A1299
22533   2000  20422R   LDA =B176027
22534  70540           PWC A
22535   2000   1457R   LDA =D1
22536                 A1300 EQU *
22536  31573  77573A   STA V32635   I
22537  22000   6703R   ADA =D1024
22540   6000   2203R   LDB =D8
22541  42000     75X   JSX .WS4
22542  42000    162X   JSX .R5
22543  31572  77572A   STA V32634   J
22544   1573  77573A   LDA V32635   I
22545  42000    103X   JSX .W4
22546  42000    162X   JSX .R5
22547  31567  77567A   STA V32631   KEYCOL
22550   1573  77573A   LDA V32635   I
22551  42000    103X   JSX .W4
22552   1572  77572A   LDA V32634   J
22553 170604           SAL 5
22554  70540           PWC A
22555   1567  77567A   LDA V32631   KEYCOL
22556 170604           SAL 5
22557  42000    116X   JSX SUB4T
22560 170404           AAR 5
22561  42000     73X   JSX .W6
22562   2000   1457R   LDA =D1
22563  21573  77573A   ADA V32635   I
22564 144016     16A   ISZ C,I
22565  66000  22536R   JMP A1300
22566  54016     16A   DSZ C
22567   1676  77676A   LDA V16 TLEDS
22570  62000   1364R   IOR =B100
22571  42000   2163R   JSM P270  TLEDSOUT
22572  42000   4664R   JSM P423  VDCOP
22573   1676  77676A   LDA V16 TLEDS
22574  52000  22225R   AND =B410
22575  72410           SZA A1301
22576   1676  77676A   LDA V16 TLEDS
22577  52000  11303R   AND =B177377
22600  31676  77676A   STA V16 TLEDS
22601   2000  21201R   LDA =B152
22602  42000  15546R   JSM P214  KEY
22603  66000  22606R   JMP A1302
22604    110
22604                  LIT
22605                 A1301 EQU *
22605  42000  10747R   JSM P219  MKRDEL
22606                 A1302 EQU *
22606                 A1299 EQU *
22606  66000  23431R   JMP A1290
22607                 C1303 EQU *
22607   1676  77676A   LDA V16 TLEDS
22610  70540           PWC A
22611   2000   1463R   LDA =D0
22612  31607  77607A   STA V32647  ACNT
22613  42000  15143R   JSM P949  UNBLANK
22614   1426  77426A   LDA V32534  UFLAG
22615  62000   3654R   IOR =B20
22616  31426  77426A   STA V32534  UFLAG
22617   1676  77676A   LDA V16 TLEDS
22620  52000  22646R   AND =B177207
22621  62000  11310R   IOR =B400
22622  42000   2163R   JSM P270  TLEDSOUT
22623   2000   2276R   LDA =D2
22624  42000   3046R   JSM P321  CLEAR
22625   2000   6703R   LDA =D1024
22626   6000   2203R   LDB =D8
```

```
22627  42000     75X    JSX .WS4
22630   2000   7571R    LDA =B2030
22631  42000     73X    JSX .W6
22632   1603  77603A    LDA V32643  PLOCK
22633  52000   7567R    AND =B173777
22634  31603  77603A    STA V32643  PLOCK
22635  42000   6160R    JSM P502  EOS
22636  42000   4664R    JSM P423  VDCOP
22637  70760            WWC A
22640  31573  77573A    STA V32635  I
22641 170610            SAL 9
22642 172005           SAP A1304
22643   2000  15047R    LDA =B145
22644  42000  15546R    JSM P214  KEY
22645  66000  22650R    JMP A1305
22646 177207
22646                  LIT
22647                  A1304 EQU *
22647  42000  10747R    JSM P219  MKRDEL
22650                  A1305 EQU *
22650  66000  23431R    JMP A1290
22651                  C1306 EQU *
22651  42000  15030R    JSM P936  ALTCK
22652  42000   4664R    JSM P423  VDCOP
22653   1676  77676A    LDA V16 TLEDS
22654  52000  22661R    AND =B101
22655  72405           SZA A1307
22656   2000  15047R    LDA =B145
22657  42000  15546R    JSM P214  KEY
22660  66000  22663R    JMP A1308
22661    101
22661                  LIT
22662                  A1307 EQU *
22662  42000  15143R    JSM P949  UNBLANK
22663                  A1308 EQU *
22663   1676  77676A    LDA V16 TLEDS
22664  52000  22646R    AND =B177207
22665  62000   2203R    IOR =B10
22666  42000   2163R    JSM P270  TLEDSOUT
22667   2000   6703R    LDA =D1024
22670   6000   2203R    LDB =D8
22671  42000     75X    JSX .WS4
22672   2000   7571R    LDA =B2030
22673  42000     73X    JSX .W6
22674   2000  22604R    LDA =B110
22675  42000    555R    JSM P215  SKEY
22676  42000  10747R    JSM P219  MKRDEL
22677   1603  77603A    LDA V32643  PLOCK
22700  52000   7567R    AND =B173777
22701  31603  77603A    STA V32643  PLOCK
22702  42000   6160R    JSM P502  EOS
22703  66000  23431R    JMP A1290
22704                  C1309 EQU *
22704  42000  15143R    JSM P949  UNBLANK
22705   2000   1457R    LDA =D1
22706   6000   2203R    LDB =D8
22707  42000     75X    JSX .WS4
22710   2000  20422R    LDA =B176027
22711  70540            PWC A
22712   2000   1457R    LDA =D1
22713                  A1310 EQU *
22713  31573  77573A    STA V32635  I
22714  42000    162X    JSX .R5
22715  31572  77572A    STA V32634  J
22716   1573  77573A    LDA V32635  I
22717  22000   6703R    ADA =D1024
22720  42000    103X    JSX .W4
22721  42000    162X    JSX .R5
22722  31567  77567A    STA V32631  KEYCOL
22723   1573  77573A    LDA V32635  I
22724  22000   6703R    ADA =D1024
22725  42000    103X    JSX .W4
22726   1572  77572A    LDA V32634  J
22727  42000     73X    JSX .W6
22730   1573  77573A    LDA V32635  I
22731  42000    103X    JSX .W4
22732   1567  77567A    LDA V32631  KEYCOL
22733  42000     73X    JSX .W6
22734   2000   1457R    LDA =D1
22735  21573  77573A    ADA V32635  I
22736 144016     16A    ISZ C,I
22737  66000  22713R    JMP A1310
22740  54016     16A    DSZ C
22741   1426  77426A    LDA V32534  UFLAG
22742  52000   3654R    AND =B20
22743 170502            SAR 3
22744  70540            PWC A
22745   1426  77426A    LDA V32534  UFLAG
22746  52000   2276R    AND =D2
22747 170602            SAL 3
22750  42000    136X    JSX .ORT
22751  42000    104X    JSX .TURN
22752           7565R    DEF =B22
22753          77426A    DEF V32534  UFLAG
22754  31426  77426A    STA V32534  UFLAG
22755   1676  77676A    LDA V16 TLEDS
22756  52000  10360R    AND =B201
22757  72403           SZA A1311
22760   2000   3312R    LDA =B144
22761  42000  15546R    JSM P214  KEY
```

```
22762                      A1311 EQU *
22762     1676   77676A          LDA V16 TLEDS
22763    52000   22225R          AND =B410
22764    72404                   SZA A1312
22765     2000   21201R          LDA =B152
22766    42000   15546R          JSM P214  KEY
22767    66000   22771R          JMP A1313
22770                      A1312 EQU *
22770    42000   10747R          JSM P219  MKRDEL
22771                      A1313 EQU *
22771    42000    2650R          JSM P304  UNCAL
22772    66000   23431R          JMP A1290
22773                      C1314 EQU *
22773    42000   15030R          JSM P936  ALTCK
22774    42000   15143R          JSM P949  UNBLANK
22775     1676   77676A          LDA V16 TLEDS
22776    52000   23363R          AND =B177307
22777    62000    3654R          IOR =B20
23000    42000    2163R          JSM P270  TLEDSOUT
23001     2000    6703R          LDA =D1024
23002     6000    2203R          LDB =D8
23003    42000      75X          JSX .WS4
23004     2000    7571R          LDA =B2030
23005    42000      73X          JSX .W6
23006    42000    4664R          JSM P423  VDCOP
23007    42000   10747R          JSM P219  MKRDEL
23010    66000   23431R          JMP A1290
23011                      C1315 EQU *
23011    42000   15030R          JSM P936  ALTCK
23012    42000   15143R          JSM P949  UNBLANK
23013     1676   77676A          LDA V16 TLEDS
23014    52000   23363R          AND =B177307
23015    62000    2205R          IOR =B40
23016    42000    2163R          JSM P270  TLEDSOUT
23017     2000    6703R          LDA =D1024
23020     6000    2203R          LDB =D8
23021    42000      75X          JSX .WS4
23022     2000    3113R          LDA =B2060
23023    42000      73X          JSX .W6
23024    42000    4664R          JSM P423  VDCOP
23025    42000   10747R          JSM P219  MKRDEL
23026    66000   23431R          JMP A1290
23027                      C1316 EQU *
23027     2000   16201R          LDA =D1025
23030     6000    2203R          LDB =D8
23031    42000      75X          JSX .WS4
23032     2000   20422R          LDA =B176027
23033    70540                   PWC A
23034     2000   16201R          LDA =D1025
23035                      A1317 EQU *
23035    31573   77573A          STA V32635  I
23036    42000     162X          JSX .R5
23037    31572   77572A          STA V32634  J
23040     1573   77573A          LDA V32635  I
23041    42000     103X          JSX .W4
23042     1704   77704A          LDA V33 LEVLIN
23043   170604                   SAL 5
23044    70540                   PWC A
23045     1572   77572A          LDA V32634  J
23046   170604                   SAL 5
23047    42000     116X          JSX SUB4T
23050   170404                   AAR 5
23051    42000      73X          JSX .W6
23052     2000    1457R          LDA =D1
23053    21573   77573A          ADA V32635  I
23054   144016      16A          ISZ C,I
23055    66000   23035R          JMP A1317
23056    54016      16A          DSZ C
23057     1675   77675A          LDA V15 BLEDS
23060   170612                   SAL 11
23061   172410                   SAM A1318
23062     1704   77704A          LDA V33 LEVLIN
23063    42000   11072R          JSM P667  WLVLN
23064     2000    3527R          LDA =D14
23065    42000    2223R          JSM P274  NBLK
23066     1675   77675A          LDA V15 BLEDS
23067    62000    3654R          IOR =B20
23070    31675   77675A          STA V15 BLEDS
23071                      A1318 EQU *
23071     2000   21201R          LDA =B152
23072    42000   15546R          JSM P214  KEY
23073     1676   77676A          LDA V16 TLEDS
23074   170610                   SAL 9
23075   172002                   SAP A1319
23076    42000    2762R          JSM P314  AVGRST
23077                      A1319 EQU *
23077     1426   77426A          LDA V32534  UFLAG
23100    62000    3654R          IOR =B20
23101    31426   77426A          STA V32534  UFLAG
23102    42000    2650R          JSM P304  UNCAL
23103    66000   23431R          JMP A1290
23104                      C1320 EQU *
23104     2000    2131R          LDA =D15
23105    70540                   PWC A
23106     2000    2172R          LDA =D13
23107    42000   10713R          JSM P656  GRAT
23110     1675   77675A          LDA V15 BLEDS
23111    52000    2067R          AND =B177757
23112    31675   77675A          STA V15 BLEDS
23113     2000    3527R          LDA =D14
```

```
23114   42000   15133R     JSM P947  TRNOFF
23115    2000    3527R     LDA =D14
23116   42000    2434R     JSM P285  BLKOF
23117   66000   23431R     JMP A1290
23120                    C1321 EQU *
23120    1704   77704A     LDA V33 LEVLIN
23121   42000   11072R     JSM P667  WLVLN
23122    2000    3527R     LDA =D14
23123   42000   14741R     JSM P929  ENTRY
23124    2000    3527R     LDA =D14
23125   42000    2223R     JSM P274  NBLK
23126    1675   77675A     LDA V15 BLEDS
23127   62000    3654R     IOR =B20
23130   31675   77675A     STA V15 BLEDS
23131   66000   23431R     JMP A1290
23132                    C1322 EQU *
23132    2000   11067R     LDA =D2169
23133    6000    2203R     LDB =D8
23134   42000      75X     JSX .WS4
23135    2000   23364R     LDA =B3777
23136   42000      73X     JSX .W6
23137    1675   77675A     LDA V15 BLEDS
23140   52000    7731R     AND =B177737
23141   31675   77675A     STA V15 BLEDS
23142    2000    2131R     LDA =D15
23143   42000   15133R     JSM P947  TRNOFF
23144    2000    2131R     LDA =D15
23145   42000    2434R     JSM P285  BLKOF
23146   66000   23431R     JMP A1290
23147                    C1323 EQU *
23147    1705   77705A     LDA V32 THRESH
23150   42000   11044R     JSM P666  WTHRSH
23151    2000    2131R     LDA =D15
23152   42000   14741R     JSM P929  ENTRY
23153    2000    2131R     LDA =D15
23154   42000    2223R     JSM P274  NBLK
23155    1675   77675A     LDA V15 BLEDS
23156   62000    2205R     IOR =B40
23157   31675   77675A     STA V15 BLEDS
23160   66000   23431R     JMP A1290
23161                    C1324 EQU *
23161    1435   77435A     LDA V32541   IF1
23162  172417             SAM A1325
23163    1730   77730A     LDA V30 KFLAG
23164  170513              SAR 12
23165   42000     104X     JSX .TURN
23166            1456R     DEF =D12
23167           77740A     DEF V32736   EFLAG
23170   31740   77740A     STA V32736   EFLAG
23171    1435   77435A     LDA V32541   IF1
23172   62000    5517R     IOR =B100000
23173   31435   77435A     STA V32541   IF1
23174    1700   77700A     LDA V22 RLVL
23175   42000    3530R     JSM P355  REFLEV
23176    1740   77740A     LDA V32736   EFLAG
23177   42000   15050R     JSM P223  AMPU
23200   42000    2762R     JSM P314  AVGRST
23201                    A1325 EQU *
23201    2000    1704R     LDA =D6
23202   42000   14741R     JSM P929  ENTRY
23203    2000    1704R     LDA =D6
23204   42000    2223R     JSM P274  NBLK
23205    2000    1704R     LDA =D6
23206   42000    2314R     JSM P279  SBLK
23207   66000   23431R     JMP A1290
23210                    C1326 EQU *
23210    1435   77435A     LDA V32541   IF1
23211  172006             SAP A1327
23212    1730   77730A     LDA V30 KFLAG
23213   42000     104X     JSX .TURN
23214            4533R     DEF =B140000
23215           77740A     DEF V32736   EFLAG
23216   31740   77740A     STA V32736   EFLAG
23217                    A1327 EQU *
23217    1435   77435A     LDA V32541   IF1
23220   52000   23365R     AND =B17777
23221   31435   77435A     STA V32541   IF1
23222    1700   77700A     LDA V22 RLVL
23223   42000    3530R     JSM P355  REFLEV
23224    2000    1704R     LDA =D6
23225   42000   15133R     JSM P947  TRNOFF
23226    2000    3654R     LDA =D16
23227   42000    2223R     JSM P274  NBLK
23230    2000    2420R     LDA =D145
23231   42000      73X     JSX .W6
23232   42000    2762R     JSM P314  AVGRST
23233    1740   77740A     LDA V32736   EFLAG
23234  170613              SAL 12
23235   42000   15050R     JSM P223  AMPU
23236   42000    2551R     JSM P298  ABLK
23237   66000   23431R     JMP A1290
23240                    C1328 EQU *
23240    1676   77676A     LDA V16 TLEDS
23241   62000    1300R     IOR =B1000
23242   42000    2163R     JSM P270  TLEDSOUT
23243   66000   23431R     JMP A1290
23244                    C1329 EQU *
23244    1676   77676A     LDA V16 TLEDS
23245   52000    5521R     AND =B175777
23246   42000    2163R     JSM P270  TLEDSOUT
```

```
23247  42000   15224R     JSM P221  TRIGR
23250  66000   23431R     JMP A1290
23251                   C1330 EQU *
23251   1733   77733A     LDA V20 FSTIM
23252 172405             SAM A1331
23253   1676   77676A     LDA V16 TLEDS
23254  62000    6703R     IOR =B2000
23255  42000    2163R     JSM P270  TLEDSOUT
23256  42000   15224R     JSM P221  TRIGR
23257                   A1331 EQU *
23257  66000   23431R     JMP A1290
23260                   C1332 EQU *
23260   2000    1463R     LDA =D0
23261  42000   15274R     JSM P967  IMODE
23262  66000   23431R     JMP A1290
23263                   C1333 EQU *
23263   2000    2277R     LDA =B4000
23264  42000   15274R     JSM P967  IMODE
23265  66000   23431R     JMP A1290
23266                   C1334 EQU *
23266   2000    2644R     LDA =B10000
23267  42000   15274R     JSM P967  IMODE
23270  66000   23431R     JMP A1290
23271                   C1335 EQU *
23271   2000    1770R     LDA =B20000
23272  42000   15274R     JSM P967  IMODE
23273  66000   23431R     JMP A1290
23274                   C1336 EQU *
23274   1676   77676A     LDA V16 TLEDS
23275 170140              CMA
23276  52000    6514R     AND =B77777
23277  42000     104X     JSX .TURN
23300           4533R     DEF =B140000
23301          77676A     DEF V16 TLEDS
23302  42000    2163R     JSM P270  TLEDSOUT
23303   1676   77676A     LDA V16 TLEDS
23304 170600              SAL 1
23305 170403              AAR 4
23306  42000     104X     JSX .TURN
23307          23366R     DEF =B14000
23310          77435A     DEF V32541  IF1
23311  31435   77435A     STA V32541  IF1
23312  42000    3243R     JSM P335  WIF1
23313  66000   23431R     JMP A1290
23314                   C1337 EQU *
23314   1675   77675A     LDA V15 BLEDS
23315 170600              SAL 1
23316 172003             SAP A1338
23317   2000   22242R     LDA =B123
23320  42000   15546R     JSM P214  KEY
23321                   A1338 EQU *
23321  66000   23431R     JMP A1290
23322                   C1339 EQU *
23322   1676   77676A     LDA V16 TLEDS
23323 170140              CMA
23324  52000    2645R     AND =B137777
23325  42000     104X     JSX .TURN
23326           4533R     DEF =B140000
23327          77676A     DEF V16 TLEDS
23330  42000    2163R     JSM P270  TLEDSOUT
23331   1676   77676A     LDA V16 TLEDS
23332 170502              SAR 3
23333  42000     104X     JSX .TURN
23334          23366R     DEF =B14000
23335          77435A     DEF V32541  IF1
23336  31435   77435A     STA V32541  IF1
23337  42000    3243R     JSM P335  WIF1
23340  66000   23431R     JMP A1290
23341                   C1340 EQU *
23341   1675   77675A     LDA V15 BLEDS
23342 170601              SAL 2
23343 172003             SAP A1341
23344   2000   23367R     LDA =B75
23345  42000   15546R     JSM P214  KEY
23346                   A1341 EQU *
23346  66000   23431R     JMP A1290
23347                   C1342 EQU *
23347   1675   77675A     LDA V15 BLEDS
23350 170601              SAL 2
23351 172403             SAM A1343
23352   2000   23367R     LDA =B75
23353  42000   15546R     JSM P214  KEY
23354                   A1343 EQU *
23354  66000   23431R     JMP A1290
23355                   C1344 EQU *
23355   1675   77675A     LDA V15 BLEDS
23356 170600              SAL 1
23357 172403             SAM A1345
23360   2000   22242R     LDA =B123
23361  42000   15546R     JSM P214  KEY
23362                   A1345 EQU *
23362  66000   23431R     JMP A1290
23363 177307
23364   3777
23365  17777
23366  14000
23367     75
23363                    LIT
23370          23355R     DEF C1344
23371          23347R     DEF C1342
```

```
23372              23341R     DEF C1340
23373              23322R     DEF C1339
23374              23314R     DEF C1337
23375              23274R     DEF C1336
23376              23271R     DEF C1335
23377              23266R     DEF C1334
23400              23263R     DEF C1333
23401              23260R     DEF C1332
23402              23251R     DEF C1330
23403              23244R     DEF C1329
23404              23240R     DEF C1328
23405              23210R     DEF C1326
23406              23161R     DEF C1324
23407              23147R     DEF C1323
23410              23132R     DEF C1322
23411              23120R     DEF C1321
23412              23104R     DEF C1320
23413              23027R     DEF C1316
23414              23011R     DEF C1315
23415              22773R     DEF C1314
23416              22704R     DEF C1309
23417              22651R     DEF C1306
23420              22607R     DEF C1303
23421              22527R     DEF C1298
23422              22511R     DEF C1297
23423              22473R     DEF C1296
23424              22456R     DEF C1294
23425              22422R     DEF C1291
23426              22372R     DEF C1289
23427                         DEC -32
23430   42000        143X A1288 JSX .CASE
23431                     A1290 EQU *
23431   66000      24373R     JMP A1346
23432                     A1284 EQU *
23432   42000      15344R     JSM P971  USFT
23433    1566      77566A     LDA V32630  KEYCODE
23434   22000      23527R     ADA =B-137
23435   66000      24372R     JMP A1347
23436                     C1348 EQU *
23436    2000       1463R     LDA =D0
23437   42000      14741R     JSM P929  ENTRY
23440   66000      24373R     JMP A1349
23441                     C1350 EQU *
23441    1702      77702A     LDA V24 VIDCON
23442   52000      23530R     AND =B177707
23443   62000       2205R     IOR =B40
23444   31702      77702A     STA V24 VIDCON
23445   42000       2772R     JSM P315  DALG
23446   66000      24373R     JMP A1349
23447                     C1351 EQU *
23447    1702      77702A     LDA V24 VIDCON
23450   52000      23530R     AND =B177707
23451   62000       2203R     IOR =B10
23452   31702      77702A     STA V24 VIDCON
23453   42000       2772R     JSM P315  DALG
23454   66000      24373R     JMP A1349
23455                     C1352 EQU *
23455    2000      20422R     LDA =B176027
23456   70540                 PWC A
23457    2000       1457R     LDA =D1
23460                     A1353 EQU *
23460   31573      77573A     STA V32635   I
23461   22000       6703R     ADA =D1024
23462    6000       2203R     LDB =D8
23463   42000        75X      JSX .WS4
23464   42000       162X      JSX .R5
23465   31572      77572A     STA V32634   J
23466    1573      77573A     LDA V32635   I
23467   42000       103X      JSX .W4
23470   42000       162X      JSX .R5
23471   31567      77567A     STA V32631   KEYCOL
23472    1573      77573A     LDA V32635   I
23473   42000       103X      JSX .W4
23474    2000       3166R     LDA =D1023
23475   70540                 PWC A
23476    1572      77572A     LDA V32634   J
23477  170604                 SAL 5
23500  170404                 AAR 5
23501   70540                 PWC A
23502    1567      77567A     LDA V32631   KEYCOL
23503  170604                 SAL 5
23504  170404                 AAR 5
23505   42000        57X      JSX ADD41
23506   42000       2132R     JSM P265  LIMIT
23507   42000        73X      JSX .W6
23510    2000       1457R     LDA =D1
23511   21573      77573A     ADA V32635   I
23512  144016        16A      ISZ C,I
23513   66000      23460R     JMP A1353
23514   54016        16A      DSZ C
23515    1676      77676A     LDA V16 TLEDS
23516  170610                 SAL 9
23517  172012                SAP A1354
23520    1426      77426A     LDA V32534   UFLAG
23521   70540                 PWC A
23522    2000      22223R     LDA =B143
23523   42000      15546R     JSM P214  KEY
23524   70760                 WWC A
23525   31426      77426A     STA V32534   UFLAG
```

```
23526  66000  23534R     JMP A1355
23527 177641
23530 177707
23527                    LIT
23531                    A1354 EQU *
23531   1426  77426A     LDA V32534  UFLAG
23532  62000   2276R     IOR =D2
23533  31426  77426A     STA V32534  UFLAG
23534                    A1355 EQU *
23534  42000  10747R     JSM P219  MKRDEL
23535  42000   2650R     JSM P304  UNCAL
23536  66000  24373R     JMP A1349
23537                    C1356 EQU *
23537   1702  77702A     LDA V24 VIDCON
23540  52000  23530R     AND =B177707
23541  31702  77702A     STA V24 VIDCON
23542  42000   2772R     JSM P315  DALG
23543  66000  24373R     JMP A1349
23544                    C1357 EQU *
23544   1702  77702A     LDA V24 VIDCON
23545  52000  23530R     AND =B177707
23546  62000   3654R     IOR =B20
23547  31702  77702A     STA V24 VIDCON
23550  42000   2772R     JSM P315  DALG
23551  66000  24373R     JMP A1349
23552                    C1358 EQU *
23552   1730  77730A     LDA V30 KFLAG
23553  62000   1364R     IOR =B100
23554  31730  77730A     STA V30 KFLAG
23555  66000  24373R     JMP A1349
23556                    C1359 EQU *
23556   1435  77435A     LDA V32541  IF1
23557  62000   6703R     IOR =B2000
23560  31435  77435A     STA V32541  IF1
23561  42000   3243R     JSM P335  *IF1
23562  66000  24373R     JMP A1349
23563                    C1360 EQU *
23563   1435  77435A     LDA V32541  IF1
23564  52000   5521R     AND =B175777
23565  31435  77435A     STA V32541  IF1
23566  42000   3243R     JSM P335  *IF1
23567  66000  24373R     JMP A1349
23570                    C1361 EQU *
23570   2000  16201R     LDA =D1025
23571   6000   2203R     LDB =D8
23572  42000     75X     JSX .WS4
23573   2000  20422R     LDA =B176027
23574  70540             PWC A
23575   2000  16201R     LDA =D1025
23576                    A1362 EQU *
23576  31573  77573A     STA V32635  I
23577  42000    162X     JSX .R5
23600  31572  77572A     STA V32634  J
23601   1573  77573A     LDA V32635  I
23602  22000   2277R     ADA =D2048
23603  42000    103X     JSX .W4
23604  42000    162X     JSX .R5
23605  31567  77567A     STA V32631  KEYCOL
23606   1573  77573A     LDA V32635  I
23607  22000   2277R     ADA =D2048
23610  42000    103X     JSX .W4
23611   1572  77572A     LDA V32634  J
23612  42000     73X     JSX .W6
23613   1573  77573A     LDA V32635  I
23614  42000    103X     JSX .W4
23615   1567  77567A     LDA V32631  KEYCOL
23616  52000  23656R     AND =B7006
23617  22000  23657R     ADA =B175774
23620   4000             LDB A
23621   2000   3113R     LDA =B2060
23622  76402             SZB A1363
23623   1567  77567A     LDA V32631  KEYCOL
23624                    A1363 EQU *
23624  42000     73X     JSX .W6
23625   2000   1457R     LDA =D1
23626  21573  77573A     ADA V32635  I
23627 144016     16A     ISZ C,I
23630  66000  23576R     JMP A1362
23631  54016     16A     DSZ C
23632   1426  77426A     LDA V32534  UFLAG
23633  52000   2411R     AND =D4
23634 170601             SAL 2
23635  62000   2205R     IOR =B40
23636  70540             PWC A
23637   1426  77426A     LDA V32534  UFLAG
23640  52000   3654R     AND =B20
23641 170501             SAR 2
23642  42000    136X     JSX .ORT
23643  42000    104X     JSX .TURN
23644         10237R     DEF =B64
23645         77426A     DEF V32534  UFLAG
23646  31426  77426A     STA V32534  UFLAG
23647  42000   2650R     JSM P304  UNCAL
23650   1676  77676A     LDA V16 ILEDS
23651  52000  22225R     AND =B410
23652  72406             SZA A1364
23653   2000  21201R     LDA =B152
23654  42000  15546R     JSM P214  KEY
23655  66000  23661R     JMP A1365
23656   7006
23657 175774
```

```
23656                        LIT
23660                  A1364 EQU *
23660  42000  10747R         JSM P219  MKRDEL
23661                  A1365 EQU *
23661  66000  24373R         JMP A1349
23662                  C1366 EQU *
23662   2000   6352R         LDA =D3072
23663   6000   2203R         LDB =D8
23664  42000    75X          JSX .WS4
23665   2000   7571R         LDA =B2030
23666  42000    73X          JSX .W6
23667   1426  77426A         LDA V32534  UFLAG
23670  62000   2203R         IOR =B10
23671  31426  77426A         STA V32534  UFLAG
23672  42000   2650R         JSM P304  UNCAL
23673  66000  24373R         JMP A1349
23674                  C1367 EQU *
23674   2000   6352R         LDA =D3072
23675   6000   2203R         LDB =D8
23676  42000    75X          JSX .WS4
23677   2000   3110R         LDA =B2024
23700  42000    73X          JSX .W6
23701   1426  77426A         LDA V32534  UFLAG
23702  52000   1375R         AND =B177767
23703  31426  77426A         STA V32534  UFLAG
23704  42000   2650R         JSM P304  UNCAL
23705  66000  24373R         JMP A1349
23706                  C1368 EQU *
23706   2000  16201R         LDA =D1025
23707   6000   2203R         LDB =D8
23710  42000    75X          JSX .WS4
23711   2000  20422R         LDA =B176027
23712  70540                 PWC A
23713   2000  16201R         LDA =D1025
23714                  A1369 EQU *
23714  31573  77573A         STA V32635  I
23715  42000   162X          JSX .R5
23716  31572  77572A         STA V32634  J
23717   1573  77573A         LDA V32635  I
23720  22000   2277R         ADA =D2048
23721  42000   103X          JSX .W4
23722   1572  77572A         LDA V32634  J
23723  42000    73X          JSX .W6
23724   1573  77573A         LDA V32635  I
23725  22000   1457R         ADA =D1
23726  42000   103X          JSX .W4
23727   2000   1457R         LDA =D1
23730  21573  77573A         ADA V32635  I
23731 144016    16A          ISZ C,I
23732  66000  23714R         JMP A1369
23733  54016    16A          DSZ C
23734   1426  77426A         LDA V32534  UFLAG
23735  62000   2205R         IOR =B40
23736  70540                 PWC A
23737   1426  77426A         LDA V32534  UFLAG
23740 170501                 SAR 2
23741  42000   104X          JSX .TURN
23742          2411R         DEF =D4
23743                        NOP
23744  31426  77426A         STA V32534  UFLAG
23745  42000   2650R         JSM P304  UNCAL
23746  66000  24373R         JMP A1349
23747                  C1370 EQU *
23747   2000  24130R         LDA =D2065
23750   6000   2203R         LDB =D8
23751  42000    75X          JSX .WS4
23752   2000  24131R         LDA =D1035
23753  42000    73X          JSX .W6
23754   2000  24132R         LDA =D2168
23755  42000    73X          JSX .W6
23756  66000  24373R         JMP A1349
23757                  C1371 EQU *
23757   2000  24133R         LDA =D21
23760  70540                 PWC A
23761   2000   2301R         LDA =D19
23762  42000  10713R         JSM P656  GRAT
23763  66000  24373R         JMP A1349
23764                  C1372 EQU *
23764   2000  24134R         LDA =D2170
23765   6000   2203R         LDB =D8
23766  42000    75X          JSX .WS4
23767   2000   3113R         LDA =B2060
23770  42000    73X          JSX .W6
23771  66000  24373R         JMP A1349
23772                  C1373 EQU *
23772   2000  24134R         LDA =D2170
23773   6000   2203R         LDB =D8
23774  42000    75X          JSX .WS4
23775   2000  24135R         LDA =B2522
23776  42000    73X          JSX .W6
23777  66000  24373R         JMP A1349
24000                  C1374 EQU *
24000   1730  77730A         LDA V30 KFLAG
24001  62000   2205R         IOR =B40
24002  31730  77730A         STA V30 KFLAG
24003  42000   3243R         JSM P335  WIF1
24004  66000  24373R         JMP A1349
24005                  C1375 EQU *
24005   2000   3654R         LDA =B20
24006   6000   2411R         LDB =D4
```

```
24007  42000    112X    JSX .WS7
24010  66000  24373R    JMP A1349
24011                   C1376 EQU *
24011   1723  77723A    LDA V26 MKRMODE
24012  72413            SZA A1377
24013  42000  10323R    JSM P626  MRKROK
24014 172011            SAP A1377
24015   2000   4533R    LDA =B140000
24016  31703  77703A    STA V21 STRIG
24017   1601  77601A    LDA V32641  HPBC
24020  52000  16171R    AND =B157777
24021  31601  77601A    STA V32641  HPBC
24022   1740  77740A    LDA V32736  EFLAG
24023  62000   2644R    IOR =B10000
24024  31740  77740A    STA V32736  EFLAG
24025                   A1377 EQU *
24025  66000  24373R    JMP A1349
24026                   C1378 EQU *
24026   1616  77616A    LDA V32654  XFLAG
24027  62000   1770R    IOR =B20000
24030  31616  77616A    STA V32654  XFLAG
24031   1676  77676A    LDA V16 TLEDS
24032  62000   6703R    IOR =B2000
24033  42000   2163R    JSM P270  TLEDSOUT
24034   2000   7670R    LDA =B164
24035  42000    555R    JSM P215  SKEY
24036  42000  15224R    JSM P221  TRIGR
24037  66000  24373R    JMP A1349
24040                   C1379 EQU *
24040   1616  77616A    LDA V32654  XFLAG
24041  62000   2277R    IOR =B4000
24042  31616  77616A    STA V32654  XFLAG
24043   2000   2066R    LDA =B177770
24044  70540            PWC A
24045   2000   5520R    LDA =D24
24046                   A1380 EQU *
24046  31572  77572A    STA V32634  J
24047  42000   2501R    JSM P295  BLINK
24050   2000   1457R    LDA =D1
24051  21572  77572A    ADA V32634  J
24052 144016     16A    ISZ C,I
24053  66000  24046R    JMP A1380
24054  54016     16A    DSZ C
24055  66000  24373R    JMP A1349
24056                   C1381 EQU *
24056   2000   6352R    LDA =D3072
24057   6000   2203R    LDB =D8
24060  42000     75X    JSX .WS4
24061   2000  24136R    LDA =B2022
24062  42000     73X    JSX .W6
24063   2000   3654R    LDA =D16
24064  42000     73X    JSX .W6
24065   2000   2646R    LDA =D3008
24066  42000     73X    JSX .W6
24067   2000  16201R    LDA =B2001
24070  42000     73X    JSX .W6
24071   1675  77675A    LDA V15 BLEDS
24072  62000   2411R    IOR =D4
24073  31675  77675A    STA V15 BLEDS
24074                   L1382 EQU * CDUMP
24074   2000  10241R    LDA =B177743
24075  70540            PWC A
24076   2000   1457R    LDA =D1
24077                   A1383 EQU *
24077  31474  77474A    STA V42 KL
24100   1730  77730A    LDA V30 KFLAG
24101  62000   2410R    IOR =B200
24102  31730  77730A    STA V30 KFLAG
24103   2000   1704R    LDA =D6
24104  70540            PWC A
24105   2000   2411R    LDA =D4
24106  70540            PWC A
24107   1474  77474A    LDA V42 KL
24110  42000     60X    JSX .ARAY
24111            15R    DEF V39 BWAMP
24112  42000    122X    JSX CNV42
24113  42000  13062R    JSM P793  NDUMP
24114   1474  77474A    LDA V42 KL
24115 170040            TCA
24116  22000   1457R    ADA =D1
24117 172402            SAM *+2
24120  66000  24156R    JMP A1384
24121   1474  77474A    LDA V42 KL
24122  22000  24137R    ADA =D-14
24123 172033            SAP A1384
24124   1601  77601A    LDA V32641  HPBC
24125 172013            SAP A1385
24126  42000  13030R    JSM P789  WCRLF
24127  66000  24142R    JMP A1386
24130   4021
24131   2013
24132   4170
24133     25
24134   4172
24135   2522
24136   2022
24137 177762
24130                   LIT
24140                   A1385 EQU *
24140  42000   2206R    JSM P272  SPACE
```

```
24141  42000   2206R    JSM P272  SPACE
24142                  A1386 EQU *
24142   1730  77730A    LDA V30 KFLAG
24143  62000   2410R    IOR =B200
24144  31730  77730A    STA V30 KFLAG
24145   2000   1457R    LDA =D1
24146  70540            PWC A
24147   2000   1456R    LDA =D12
24150  70540            PWC A
24151   1474  77474A    LDA V42 KL
24152  42000    133X    JSX .LRAY
24153             12R   DEF V37 BWFRQ
24154  42000    134X    JSX .LDBA
24155  42000  13062R    JSM P793  NDUMP
24156                  A1384 EQU *
24156   1601  77601A    LDA V32641  HPBC
24157 172003           SAP A1387
24160  42000  13030R    JSM P789  WCRLF
24161  66000  24163R    JMP A1388
24162                  A1387 EQU *
24162  42000   2173R    JSM P271  CRLF
24163                  A1388 EQU *
24163   2000   1457R    LDA =D1
24164  21474  77474A    ADA V42 KL
24165 144016     16A    ISZ C,I
24166  66000  24077R    JMP A1383
24167  54016     16A    DSZ C
24170   2000   2417R    LDA =B177772
24171  70540            PWC A
24172   2000   2276R    LDA =D2
24173                  A1389 EQU *
24173  31474  77474A    STA V42 KL
24174  22000   5115R    ADA =D-7
24175 172004           SAP A1390
24176   1730  77730A    LDA V30 KFLAG
24177  62000   2410R    IOR =B200
24200  31730  77730A    STA V30 KFLAG
24201                  A1390 EQU *
24201   1474  77474A    LDA V42 KL
24202  42000      7X    JSM P198  AINER
24203  31572  77572A    STA V32634  J
24204   6000   2203R    LDB =D8
24205  34011     11A    STB PA
24206   2000   1704R    LDA =D6
24207  70540            PWC A
24210   2000   2411R    LDA =D4
24211  70540            PWC A
24212   1572  77572A    LDA V32634  J
24213  42000    122X    JSX CNV42
24214  42000  13062R    JSM P793  NDUMP
24215   1601  77601A    LDA V32641  HPBC
24216 172003           SAP A1391
24217  42000  13030R    JSM P789  WCRLF
24220  66000  24222R    JMP A1392
24221                  A1391 EQU *
24221  42000   2206R    JSM P272  SPACE
24222                  A1392 EQU *
24222   2000   1457R    LDA =D1
24223  21474  77474A    ADA V42 KL
24224 144016     16A    ISZ C,I
24225  66000  24173R    JMP A1389
24226  54016     16A    DSZ C
24227   1740  77740A    LDA V32736  EFLAG
24230  52000   1770R    AND =B20000
24231  61601  77601A    IOR V32641  HPBC
24232  52000  24237R    AND =B120000
24233  22000   4207R    ADA =B160000
24234  72004           RZA A1393
24235  42000  13045R    JSM P791  UHPB
24236  66000  24074R    JMP L1382 CDUMP
24237 120000
24237                  LIT
24240                  A1393 EQU *
24240   2000   3110R    LDA =B2024
24241   6000   2203R    LDB =D8
24242  42000     72X    JSX .WS6
24243   1675  77675A    LDA V15 BLEDS
24244  52000   2153R    AND =B177773
24245  31675  77675A    STA V15 BLEDS
24246   1730  77730A    LDA V30 KFLAG
24247  52000  13044R    AND =B177577
24250  31730  77730A    STA V30 KFLAG
24251  66000  24373R    JMP A1349
24252                  C1394 EQU *
24252   2000  24327R    LDA =B10010
24253  42000  15274R    JSM P967  TMODE
24254  66000  24373R    JMP A1349
24255                  C1395 EQU *
24255   2000  24330R    LDA =B20010
24256  42000  15274R    JSM P967  TMODE
24257  66000  24373R    JMP A1349
24260                  C1396 EQU *
24260   2000  16710R    LDA =B177730
24261  42000  14741R    JSM P929  ENTRY
24262  66000  24373R    JMP A1349
24263                  C1397 EQU *
24263   1563  77563A    LDA V32627  DSTAD
24264   6000   2203R    LDB =D8
24265  42000     75X    JSX .WS4
24266  22000   3112R    ADA =D1001
24267  52000   6353R    AND =B7777
```

```
24270  31563   77563A       STA V32627  DSTAD
24271  42000   13045R       JSM P791  OHPB
24272  42000    166X        JSX .CSHV
24273           4630R       DEF P421  RDBMV
24274   1601   77601A       LDA V32641  HPBC
24275 170507                SAR 8
24276  42000     21X        JSM P208  TDUMP
24277  42000   15334R       JSM P969  CLRDA
24300  66000   24373R       JMP A1349
24301                 C1398 EQU *
24301   2000   20430R       LDA =B32
24302  42000   15546R       JSM P214  KEY
24303  66000   24373R       JMP A1349
24304                 C1399 EQU *
24304  42000   13045R       JSM P791  OHPB
24305   2000    3112R       LDA =D1001
24306  70540                PWC A
24307  42000    166X        JSX .CSHV
24310          77563A       DEF V32627  DSTAD
24311  42000     25X        JSM P212  IHPBT
24312  42000   15334R       JSM P969  CLRDA
24313  66000   24373R       JMP A1349
24314                 C1400 EQU *
24314   2000   10143R       LDA =B177725
24315  42000   14741R       JSM P929  ENTRY
24316  66000   24373R       JMP A1349
24317                 C1401 EQU *
24317  42000   13045R       JSM P791  OHPB
24320   2000    1277R       LDA =B177777
24321  70540                PWC A
24322  42000    166X        JSX .CSHV
24323          77563A       DEF V32627  DSTAD
24324  42000     25X        JSM P212  IHPBT
24325  42000   15334R       JSM P969  CLRDA
24326  66000   24373R       JMP A1349
24327  10010
24330  20010
24327                       LIT
24331          24317R       DEF C1401
24332          24314R       DEF C1400
24333          24304R       DEF C1399
24334          24301R       DEF C1398
24335          24263R       DEF C1397
24336          24260R       DEF C1396
24337          24255R       DEF C1395
24340          24252R       DEF C1394
24341          24056R       DEF C1381
24342          24040R       DEF C1379
24343          24026R       DEF C1378
24344          24011R       DEF C1376
24345          24373R       DEF A1349
24346          24005R       DEF C1375
24347          24000R       DEF C1374
24350          23772R       DEF C1373
24351          23764R       DEF C1372
24352          23757R       DEF C1371
24353          23747R       DEF C1370
24354          23706R       DEF C1368
24355          23674R       DEF C1367
24356          23662R       DEF C1366
24357          23570R       DEF C1361
24360          23563R       DEF C1360
24361          23556R       DEF C1359
24362          23552R       DEF C1358
24363          23544R       DEF C1357
24364          23537R       DEF C1356
24365          23455R       DEF C1352
24366          23447R       DEF C1351
24367          23441R       DEF C1350
24370          23436R       DEF C1348
24371                       DEC -33
24372  42000    143X  A1347 JSX .CASE
24373                 A1349 EQU *
24373                 A1346 EQU *
24373  66000   24627R       JMP A1088
24374                 C1402 EQU *
24374   1566   77566A       LDA V32630  KEYCODE
24375 170040                TCA
24376  22000   24424R       ADA =B177
24377 172027                SAP A1403
24400   1566   77566A       LDA V32630  KEYCODE
24401  22000   24425R       ADA =B-220
24402 172024                SAP A1403
24403   1566   77566A       LDA V32630  KEYCODE
24404  31606   77606A       STA V32646  SRCEID
24405  73003                SLA A1404
24406  62000    4207R       IOR =B160000
24407  31606   77606A       STA V32646  SRCEID
24410                 A1404 EQU *
24410 170615                SAL 14
24411 172004                SAP A1405
24412   1606   77606A       LDA V32646  SRCEID
24413  62000    2644R       IOR =B10000
24414  31606   77606A       STA V32646  SRCEID
24415                 A1405 EQU *
24415   1606   77606A       LDA V32646  SRCEID
24416  52000    4256R       AND =B170000
24417  72404                SZA A1406
24420   2000    3654R       LDA =B20
24421   6000    2411R       LDB =D4
```

```
24422  42000      112X     JSX .*S7
24423                     A1406 EQU *
24423  66000    24617R     JMP A1407
24424    177
24425 177560
24424                      LIT
24426                     A1403 EQU *
24426   1566    77566A     LDA V32630  KEYCODE
24427  12000    24443R     CPA =B220
24430  66000    24432R     JMP *+2
24431  66000    24445R     JMP A1408
24432  42000    15344R     JSM P971  USFT
24433  42000    10312R     JSM P218  MKREL
24434 172004               SAP A1410
24435   1576    77576A     LDA V32638  RPGPTR
24436  12000     7565R     CPA =D18
24437  66000    24442R     JMP A1409
24440                     A1410 EQU *
24440   2000    24444R     LDA =B117
24441  42000    15546R     JSM P214  KEY
24442                     A1409 EQU *
24442  66000    24617R     JMP A1411
24443    220
24444    117
24443                      LIT
24445                     A1408 EQU *
24445  22000    24453R     ADA =B-236
24446 172006               SAP A1412
24447  42000    15344R     JSM P971  USFT
24450   2000    17407R     LDA =B115
24451  42000    15546R     JSM P214  KEY
24452  66000    24617R     JMP A1413
24453 177542
24453                      LIT
24454                     A1412 EQU *
24454   1566    77566A     LDA V32630  KEYCODE
24455  12000    24574R     CPA =B236
24456  66000    24460R     JMP *+2
24457  66000    24615R     JMP A1414
24460   1606    77606A     LDA V32646  SRCEID
24461 172017               SAP A1415
24462  42000      167X     JSX .ADDR
24463           24575R     DEF ="CF"
24464  42000       13X     JSM P202  STHPB
24465  42000       37X     JSX .LDBI
24466           77665A     DEF V8  CFREQ
24467  42000       62X     JSX CNV21
24470  42000       11X     JSM P200  CNV15
24471   1427    77427A     LDA V32535  AS
24472  42000       13X     JSM P202  STHPB
24473   1606    77606A     LDA V32646  SRCEID
24474  52000     6015R     AND =B70000
24475  72403               SZA A1416
24476   2000     2723R     LDA =B54
24477  42000       17X     JSM P206  WHPIB
24500                     A1416 EQU *
24500                     A1415 EQU *
24500   1606    77606A     LDA V32646  SRCEID
24501 170600               SAL 1
24502 172017               SAP A1417
24503  42000      167X     JSX .ADDR
24504           24577R     DEF ="SP"
24505  42000       13X     JSM P202  STHPB
24506  42000       37X     JSX .LDBI
24507           77671A     DEF V9  SPAN
24510  42000       62X     JSX CNV21
24511  42000       11X     JSM P200  CNV15
24512   1427    77427A     LDA V32535  AS
24513  42000       13X     JSM P202  STHPB
24514   1606    77606A     LDA V32646  SRCEID
24515  52000    17331R     AND =B30000
24516  72403               SZA A1418
24517   2000     2723R     LDA =B54
24520  42000       17X     JSM P206  WHPIB
24521                     A1418 EQU *
24521                     A1417 EQU *
24521   1606    77606A     LDA V32646  SRCEID
24522 170601               SAL 2
24523 172027               SAP A1419
24524  42000      167X     JSX .ADDR
24525           24601R     DEF ="ST"
24526  42000       13X     JSM P202  STHPB
24527   1733    77733A     LDA V20 FSTIM
24530 172004               SAP A1420
24531   1731    77731A     LDA V18 SINDEX
24532  42000     4411R     JSM P406  EXP2
24533  66000    24537R     JMP A1421
24534                     A1420 EQU *
24534   1731    77731A     LDA V18 SINDEX
24535  22000     5520R     ADA =D24
24536  42000     4356R     JSM P403  EXPSIX
24537                     A1421 EQU *
24537  42000       62X     JSX CNV21
24540  42000       41X     JSX MPY1
24541           24603R     DEF =F1@-6
24542  42000       11X     JSM P200  CNV15
24543   1427    77427A     LDA V32535  AS
24544  42000       13X     JSM P202  STHPB
24545   1606    77606A     LDA V32646  SRCEID
24546 170602               SAL 3
```

```
24547 172003              SAP A1422
24550   2000     2723R     LDA =B54
24551  42000       17X     JSM P206  WHP1B
24552                     A1422 EQU *
24552                     A1419 EQU *
24552   1606    77606A     LDA V32646  SRCEID
24553 170602               SAL 3
24554 172013              SAP A1423
24555  42000      167X     JSX .ADDR
24556           24607R     DEF ="RL"
24557  42000       13X     JSM P202  STHPB
24560   1700    77700A     LDA V22 RLVL
24561  42000       45X     JSX CNV41
24562  42000       41X     JSX MPY1
24563           24611R     DEF =F1@-1
24564  42000       11X     JSM P200  CNV15
24565   1427    77427A     LDA V32535  AS
24566  42000       13X     JSM P202  STHPB
24567                     A1423 EQU *
24567   1606    77606A     LDA V32646  SRCEID
24570  52000     6353R     AND =B7777
24571  31606    77606A     STA V32646  SRCEID
24572  42000    13030R     JSM P789  WCRLF
24573  66000    24617R     JMP A1424
24574    236
24575 CF
24577 SP
24601 ST
24603   1@-6
24607 RL
24611   1@-1
24574                      LIT
24615                     A1414 EQU *
24615   2000     1463R     LDA =D0
24616  42000    14741R     JSM P929  ENTRY
24617                     A1424 EQU *
24617                     A1413 EQU *
24617                     A1411 EQU *
24617                     A1407 EQU *
24617  66000    24627R     JMP A1088
24620           24374R     DEF C1402
24621           22353R     DEF C1283
24622           17510R     DEF C1137
24623           16756R     DEF C1089
24624           15716R     DEF C1000
24625                      DEC -6
24626  42000      143X    A999  JSX .CASE
24627                     A1088 EQU *
24627   1566    77566A     LDA V32630  KEYCODE
24630 170040               TCA
24631  22000    24424R     ADA =B177
24632 172002              SAP A1425
24633  42000    15344R     JSM P971  USF1
24634                     A1425 EQU *
24634                     L984  EQU * EXIT
24634  66000       31X     JMX .RTNA
24635                     P220  EQU * SAVEM
24635   6000     1277R     LDB =D-1
24636  42000       27X     JSX .ARGA
24637  42000    15351R     JSM P972  SAVPREP
24640   6000     1301R     LDB =D-3  S
24641  42000       30X     JSX .LDAP
24642  52000     2406R     AND =D7
24643  31572    77572A     STA V32634  J
24644   2000    15667R     LDA =B177731
24645  70540               PWC A
24646   2000     1457R     LDA =D1
24647                     A1426 EQU *
24647  31573    77573A     STA V32635  I
24650  70540               PWC A
24651   1572    77572A     LDA V32634  J
24652  42000      174X     JSX .ARRY
24653             213R     DEF V115  ASAVE
24654  70541               PWC B
24655   1573    77573A     LDA V32635  I
24656  42000       60X     JSX .ARAY
24657               7R     DEF V4  MSTATE
24660  42000      170X     JSX .STAC
24661   2000     1457R     LDA =D1
24662  21573    77573A     ADA V32635  I
24663 144016       16A     ISZ C,I
24664  66000    24647R     JMP A1426
24665  54016       16A     DSZ C
24666  42000    15405R     JSM P973  SAVCLR
24667  66000       31X     JMX .RTNA
24670                     P1427 EQU * NUMKEY
24670 174517               CLB
24671  42000       56X     JSX .ARGS
24672  44016       16A     ISZ C
24673   1566    77566A     LDA V32630  KEYCODE
24674  22000     3232R     ADA =B-60
24675 172415              SAM A1428
24676   1566    77566A     LDA V32630  KEYCODE
24677  22000    15671R     ADA =B-72
24700 172012              SAP A1428
24701   1620    77620A     LDA V32656  PREFIX
24702  12000     1456R     CPA =D12
24703  66000    24712R     JMP A1428
24704   1620    77620A     LDA V32656  PREFIX
24705 170500               SAR 1
```

```
24706  12000   1456R     CPA =D12
24707  66000  24712R     JMP A1428
24710   2000   1277R     LDA =D-1
24711  66000  24713R     JMP A1429
24712                   A1428 EQU *
24712 170517             CLA
24713                   A1429 EQU *
24713  66000     31X     JMX .RTNA
24714                   A3  EQU *
24714                   L194  EQU * POP
24714   2000   3166R     LDA =D1023
24715   6000   1463R     LDB =D0
24716  42000    112X     JSX .WS7
24717   2000   1704R     LDA =D6
24720  42000   3171R     JSM P327  HLDOF
24721   2000   2203R     LDA =D8
24722   6000   2411R     LDB =D4
24723  42000    112X     JSX .WS7
24724   2000   1770R     LDA =B20000
24725   6000   1456R     LDB =D12
24726  42000     72X     JSX .WS6
24727   2000   2107R     LDA =D3
24730  31736  77736A     STA V32734  ETX
24731   2000  25250R     LDA =B77764
24732  31427  77427A     STA V32535  AS
24733   2000   2406R     LDA =D7
24734  42000  24635R     JSM P220  SAVEM
24735  42000     53X     JSX .LDS1
24736          1463R     DEF =D0
24737  42000     34X     JSX .STRD
24740         77707A     DEF V11 FOFSET
24741   2000   3312R     LDA =D100
24742  31610  77610A     STA V32648  ALIM
24743  31705  77705A     STA V32 THRESH
24744   2000   6352R     LDA =D3072
24745  31563  77563A     STA V32627  DSTAD
24746   2000   3654R     LDA =B20
24747  31426  77426A     STA V32534  UFLAG
24750   1616  77616A     LDA V32654  XFLAG
24751  52000  11310R     AND =B400
24752  31616  77616A     STA V32654  XFLAG
24753   2000   1463R     LDA =D0
24754  31723  77723A     STA V26 MKRMODE
24755  31606  77606A     STA V32646  SRCEID
24756  31706  77706A     STA V31 ROFSET
24757  31434  77434A     STA V32540  IF2
24760  31603  77603A     STA V32643  PLOCK
24761  31565  77565A     STA V32629  SRQEN
24762   2000   1463R     LDA =D0
24763  31577  77577A     STA V32639  CTBASE
24764  31733  77733A     STA V20 FSTIM
24765  31575  77575A     STA V32637  K
24766  31604  77604A     STA V32644  SATN
24767  31614  77614A     STA V32652  DAC2
24770  31601  77601A     STA V32641  HPBC
24771  31607  77607A     STA V32647  ACNT
24772   2000   2107R     LDA =D3
24773  31431  77431A     STA V32537  RPGSWP
24774   2000  25251R     LDA =D550
24775  31704  77704A     STA V33 LEVLIN
24776   1740  77740A     LDA V32736  EFLAG
24777  52000   3654R     AND =D16
25000  62000  25252R     IOR =B2014
25001  31740  77740A     STA V32736  EFLAG
25002   2000   5517R     LDA =B100000
25003  31435  77435A     STA V32541  IF1
25004   6000   1704R     LDB =D6
25005  42000    171X     JSX .RS4
25006  31573  77573A     STA V32635  I
25007  42000    162X     JSX .R5
25010  31572  77572A     STA V32634  J
25011 170601             SAL 2
25012 172404             SAM A1431
25013   2000   1463R     LDA =D0
25014  31432  77432A     STA V32538  GIN2
25015  31433  77433A     STA V32539  GIN1
25016                   A1431 EQU *
25016   1573  77573A     LDA V32635  I
25017 170501             SAR 2
25020  52000  17331R     AND =B30000
25021  70540             PWC A
25022   1572  77572A     LDA V32634  J
25023  52000   4533R     AND =B140000
25024  42000    136X     JSX .ORT
25025  70540             PWC A
25026   1730  77730A     LDA V30 KFLAG
25027  52000   1364R     AND =B100
25030  42000    136X     JSX .ORT
25031  31730  77730A     STA V30 KFLAG
25032   2000  25253R     LDA =B174710
25033  31677  77677A     STA V17 RFAT
25034  42000    161X     JSX .MVE4
25035         12167R     DEF =F100000000
25036         77713A     DEF V7  FSTEP
25037   2000   4167R     LDA =B240
25040  42000   2163R     JSM P270  TLEDSOUT
25041   2000   1277R     LDA =B177777
25042  31602  77602A     STA V32642  LKMSK
25043   2000   2205R     LDA =B40
25044  31702  77702A     STA V24 VIDCON
```

```
25045      15      15A    LDA V2   DMAMA
25046  170612             SAL 11
25047   31675  77675A     STA V15 BLEDS
25050   72203            SFS A1432
25051   62000   2644R     IOR =B10000
25052   31675  77675A     STA V15 BLEDS
25053                   A1432 EQU *
25053  170140             CMA
25054    6000   2276R     LDB =D2
25055   42000     75X     JSX .WS4
25056    1702  77702A     LDA V24 VIDCON
25057    6000   2221R     LDB =D9
25060   42000     75X     JSX .WS4
25061    2000   1457R     LDA =D1
25062   42000   3046R     JSM P321   CLEAR
25063    2000   2107R     LDA =D3
25064   42000   3046R     JSM P321   CLEAR
25065    2000   2411R     LDA =D4
25066   42000   3046R     JSM P321   CLEAR
25067    2000  10142R     LDA =D31
25070   42000   2223R     JSM P274   NBLK
25071    2000  17114R     LDA =B177742
25072   70540             PWC A
25073    2000   2565R     LDA =D11
25074                   A1433 EQU *
25074   31572  77572A     STA V32634   J
25075   42000   2434R     JSM P285   BLKOF
25076    2000   1457R     LDA =D1
25077   21572  77572A     ADA V32634   J
25100  144016     16A     ISZ C,I
25101   66000  25074R     JMP A1433
25102   54016     16A     DSZ C
25103    2000   1463R     LDA =D0
25104    6000   2203R     LDB =D8
25105   42000     75X     JSX .WS4
25106    2000   7570R     LDA =B2020
25107   42000     73X     JSX .W6
25110    2000  25254R     LDA =D120
25111   70540             PWC A
25112    2000   1457R     LDA =D1
25113   42000  10713R     JSM P656   GRAT
25114    2000   2066R     LDA =B177770
25115   70540             PWC A
25116    2000   1457R     LDA =D1
25117                   A1434 EQU *
25117   31572  77572A     STA V32634   J
25120   42000   2223R     JSM P274   NBLK
25121    2000   1457R     LDA =D1
25122   21572  77572A     ADA V32634   J
25123  144016     16A     ISZ C,I
25124   66000  25117R     JMP A1434
25125   54016     16A     DSZ C
25126    2000   1463R     LDA =D0
25127   42000  14741R     JSM P929   ENTRY
25130    2000   1457R     LDA =D1
25131    6000   2107R     LDB =D3
25132   42000     75X     JSX .WS4
25133    2000   2276R     LDA =D2
25134   42000    103X     JSX .W4
25135    2000   2107R     LDA =D3
25136   42000    103X     JSX .W4
25137    2000   2411R     LDA =D4
25140   42000    103X     JSX .W4
25141    2000   2405R     LDA =D5
25142   42000    103X     JSX .W4
25143   42000   1665R     JSM P245   RLAD
25144   42000   3530R     JSM P355   REFLEV
25145    2000   1704R     LDA =D6
25146   42000   2314R     JSM P279   SBLK
25147   76603            SSC A1435
25150    2000  22226R     LDA =B166
25151   42000    555R     JSM P215   SKEY
25152                   A1435 EQU *
25152   42000   3205R     JSM P329   BUSY
25153    2000   2723R     LDA =B54
25154   42000  15546R     JSM P214   KEY
25155    2000   2276R     LDA =D2
25156   42000  15546R     JSM P214   KEY
25157    2000   2406R     LDA =D7
25160   42000  15546R     JSM P214   KEY
25161    6000   2276R     LDB =D2
25162   42000    175X     JSX .RS6
25163   31567  77567A     STA V32631   KEYCOL
25164   42000    176X     JSX .R7
25165   31572  77572A     STA V32634   J
25166    1567  77567A     LDA V32631   KEYCOL
25167  170140             CMA
25170   42000    104X     JSX .TURN
25171           4534R     DEF =B40000
25172          77616A     DEF V32654   XFLAG
25173   31616  77616A     STA V32654   XFLAG
25174  170600             SAL 1
25175  172003            SAP A1436
25176    2000   6514R     LDA =B77777
25177   31565  77565A     STA V32629   SRGEN
25200                   A1436 EQU *
25200    1572  77572A     LDA V32634   J
25201  170613             SAL 12
25202  172003            SAP A1437
25203    2000  25255R     LDA =D28
```

```
25204  42000    2223R     JSM P274  NBLK
25205                    A1437 EQU *
25205                    L190  EQU * LOOP
25205  42000    7732R     JSM P599  FPNLON
25206  76702              SHC *+2
25207  66000   25315R     JMP L192  WLOOP
25210   1575   77575A     LDA V32637  K
25211  12000    1457R     CPA =D1
25212  66000   25217R     JMP A1439
25213 170040              TCA
25214  22000    2107R     ADA =D3
25215 172402              SAM *+2
25216  66000   25256R     JMP A1438
25217                    A1439 EQU *
25217   1703   77703A     LDA V21 STRIG
25220  12000    1770R     CPA =B20000
25221  66000   25256R     JMP A1438
25222   1676   77676A     LDA V16 TLEDS
25223  52000   16170R     AND =B611
25224  72432              SZA A1438
25225   6000    2221R     LDB =D9
25226  42000      74X     JSX .RS5
25227  31567   77567A     STA V32631  KEYCOL
25230   6000    2203R     LDB =D8
25231  42000      74X     JSX .RS5
25232  31567   77567A     STA V32631  KEYCOL
25233  52000    6353R     AND =B7777
25234  70540              PWC A
25235   5730   77730A     LDB V30 KFLAG
25236 174614              SBL 13
25237   2000    6352R     LDA =D3072
25240 176402              SBM A1441
25241   2000    1463R     LDA =D0
25242                    A1441 EQU *
25242  22000    3112R     ADA =D1001
25243  42000     116X     JSX SUB4T
25244 172012              SAP A1440
25245   2000    2107R     LDA =D3
25246  31575   77575A     STA V32637  K
25247  66000   25707R     JMP L191  SLOOP
25250  77764
25251   1046
25252   2014
25253 174710
25254    170
25255     34
25250                     LIT
25256                    A1440 EQU *
25256                    A1438 EQU *
25256   5730   77730A     LDB V30 KFLAG
25257 174614              SBL 13
25260   1702   77702A     LDA V24 VIDCON
25261 176002              SBP A1442
25262  52000    2066R     AND =B177770
25263                    A1442 EQU *
25263   6000    2221R     LDB =D9
25264  42000      75X     JSX .WS4
25265   1676   77676A     LDA V16 TLEDS
25266  52000   16170R     AND =B611
25267  72003              RZA A1444
25270   1733   77733A     LDA V20 FSTIM
25271 172005              SAP A1443
25272                    A1444 EQU *
25272   1703   77703A     LDA V21 STRIG
25273   6000    1456R     LDB =D12
25274  42000      72X     JSX .WS6
25275  66000   25312R     JMP A1445
25276                    A1443 EQU *
25276   6000    2276R     LDB =D2
25277  42000     175X     JSX .RS6
25300  31567   77567A     STA V32631  KEYCOL
25301  42000     176X     JSX .R7
25302  31573   77573A     STA V32635  I
25303 170507              SAR 8
25304  72406              SZA A1446
25305   1573   77573A     LDA V32635  I
25306  52000    2066R     AND =B177770
25307  62000    2107R     IOR =B3
25310  31573   77573A     STA V32635  I
25311  66000   25333R     JMP L1430 RLOOP
25312                    A1446 EQU *
25312                    A1445 EQU *
25312   2000    1704R     LDA =D6
25313   6000    2107R     LDB =D3
25314  42000      75X     JSX .WS4
25315                    L192  EQU * WLOOP
25315   2000    1463R     LDA =D0
25316  31575   77575A     STA V32637  K
25317   2000    1277R     LDA =B177777
25320  31566   77566A     STA V32630  KEYCODE
25321                    A1447 EQU *
25321  76302              SHS A1448
25322  66000   25321R     JMP A1447
25323                    A1448 EQU *
25323   2000    1770R     LDA =B20000
25324   6000    1456R     LDB =D12
25325  42000      72X     JSX .WS6
25326   6000    2276R     LDB =D2
25327  42000     175X     JSX .RS6
25330  31567   77567A     STA V32631  KEYCOL
```

```
25331  42000    176X       JSX .R7
25332  31573  77573A       STA V32635  1
25333                    L1430 EQU * RLOOP
25333   2000   2405R       LDA =D5
25334   6000   2107R       LDB =D3
25335  42000     75X       JSX .WS4
25336   1573  77573A       LDA V32635  1
25337  52000   2406R       AND =D7
25340  22000   1457R       ADA =D1
25341  66000  25706R       JMP A1449
25342                    C1450 EQU *
25342   6000   2221R       LDB =D9
25343  42000     74X       JSX .RS5
25344  31567  77567A       STA V32631  KEYCOL
25345   6000   2203R       LDB =D6
25346  42000     74X       JSX .RS5
25347  31567  77567A       STA V32631  KEYCOL
25350  52000   6353R       AND =B7777
25351  31567  77567A       STA V32631  KEYCOL
25352  22000   1277R       ADA =D-1
25353  11721  77721A       CPA V25 MRKR
25354  66000  25356R       JMP *+2
25355  66000  25361R       JMP A1451
25356   2000   2276R       LDA =D2
25357  31575  77575A       STA V32637  K
25360  66000  25414R       JMP A1452
25361                    A1451 EQU *
25361   5730  77730A       LDB V30 KFLAG
25362 174614               SBL 13
25363   2000   6352R       LDA =D3072
25364 176402              SBM A1454
25365   2000   1463R       LDA =D0
25366                    A1454 EQU *
25366  22000   3112R       ADA =D1001
25367 170040               TCA
25370  21567  77567A       ADA V32631  KEYCOL
25371 170040               TCA
25372 172004              SAP A1453
25373   2000   2107R       LDA =D3
25374  31575  77575A       STA V32637  K
25375  66000  25414R       JMP A1455
25376                    A1453 EQU *
25376   1721  77721A       LDA V25 MRKR
25377  12000   3166R       CPA =D1023
25400  66000  25405R       JMP A1457
25401   1567  77567A       LDA V32631  KEYCOL
25402 170040               TCA
25403  21721  77721A       ADA V25 MRKR
25404 172010              SAP A1456
25405                    A1457 EQU *
25405   5730  77730A       LDB V30 KFLAG
25406 174614               SBL 13
25407   2000   6350R       LDA =D4073
25410 176402              SBM A1458
25411   2000   3112R       LDA =D1001
25412                    A1458 EQU *
25412   6000   2221R       LDB =D9
25413  42000     72X       JSX .WS6
25414                    A1456 EQU *
25414                    A1455 EQU *
25414                    A1452 EQU *
25414  66000  25707R       JMP A1459
25415                    C1460 EQU *
25415   2000   1457R       LDA =D1
25416  42000    103X       JSX .W4
25417   2000   2107R       LDA =D3
25420  31575  77575A       STA V32637  K
25421   1573  77573A       LDA V32635  1
25422 170613               SAL 12
25423 172004              SAP A1461
25424   2000  25255R       LDA =D28
25425  42000   2223R       JSM P274  NBLK
25426  66000  25431R       JMP A1462
25427                    A1461 EQU *
25427   2000  25255R       LDA =D28
25430  42000   2434R       JSM P285  BLKOF
25431                    A1462 EQU *
25431  66000  25707R       JMP A1459
25432                    C1463 EQU *
25432   2000   2276R       LDA =D2
25433  42000    103X       JSX .W4
25434   1567  77567A       LDA V32631  KEYCOL
25435 170140               CMA
25436  42000    104X       JSX .TURN
25437          4534R       DEF =B40000
25440         77616A       DEF V32654  XFLAG
25441  31616  77616A       STA V32654  XFLAG
25442 170600               SAL 1
25443 172014              SAP A1464
25444   1740  77740A       LDA V32736  EFLAG
25445 170606               SAL 7
25446 172405              SAM A1466
25447   1620  77620A       LDA V32656  PREFIX
25450  12000  10243R       CPA =D27
25451  66000  25453R       JMP *+2
25452  66000  25455R       JMP A1465
25453                    A1466 EQU *
25453   2000  15026R       LDA =B7760
25454  66000  25456R       JMP A1467
25455                    A1465 EQU *
```

```
25455    2000    6514R   LDA =B77777
25456                   A1467 EQU *
25456   66000   25462R   JMP A1468
25457                   A1464 EQU *
25457    1576   77576A   LDA V32638   RPGPTR
25460  170040            TCA
25461   52000    5517R   AND =B100000
25462                   A1468 EQU *
25462   31565   77565A   STA V32629   SRQEN
25463    2000   15672R   LDA =B140
25464   42000   15546R   JSM P214  KEY
25465   66000   25707R   JMP A1459
25466                   C1469 EQU *
25466    2000    1457R   LDA =D1
25467   31575   77575A   STA V32637   K
25470    1573   77573A   LDA V32635   I
25471  170507            SAR 8
25472   31573   77573A   STA V32635   I
25473    2000    1463R   LDA =D0
25474   31431   77431A   STA V32537   RPGSWP
25475    5567   77567A   LDB V32631   KEYCOL
25476  174606            SBL 7
25477    2000    1457R   LDA =D1
25500  176402           SBM A1470
25501    2000    1277R   LDA =B177777
25502                   A1470 EQU *
25502   31574   77574A   STA V32636   RPG
25503    5573   77573A   LDB V32635   I
25504   75617            MPY
25505   21564   77564A   ADA V32628   RPGCNT
25506   31564   77564A   STA V32628   RPGCNT
25507    2000    2107R   LDA =D3
25510   42000     103X   JSX .W4
25511   66000   25707R   JMP A1459
25512                   C1471 EQU *
25512    2000    1463R   LDA =D0
25513   31474   77474A   STA V42 KL
25514                   A1472 EQU *
25514    2000    3242R   LDA =B377
25515   31567   77567A   STA V32631   KEYCOL
25516    2000    1463R   LDA =D0
25517                   A1474 EQU *
25517   31573   77573A   STA V32635   I
25520   22000    7243R   ADA =D-12
25521  172021           SAP A1473
25522    1567   77567A   LDA V32631   KEYCOL
25523   12000    3242R   CPA =B377
25524   66000   25526R   JMP *+2
25525   66000   25542R   JMP A1473
25526    2000    2110R   LDA =B177776
25527    5573   77573A   LDB V32635   I
25530   42000     177X   JSX .RLFT
25531    6000    2276R   LDB =D2
25532   42000     107X   JSX .WS5
25533   42000     137X   JSX .R6
25534   31567   77567A   STA V32631   KEYCOL
25535   52000    3242R   AND =B377
25536   31567   77567A   STA V32631   KEYCOL
25537    2000    1457R   LDA =D1
25540   21573   77573A   ADA V32635   I
25541   66000   25517R   JMP A1474
25542                   A1473 EQU *
25542    2000   25621R   LDA =B177242
25543   70540            PWC A
25544    2000    1457R   LDA =D1
25545                   A1475 EQU *
25545   31572   77572A   STA V32634   J
25546   42000     137X   JSX .R6
25547   31566   77566A   STA V32630   KEYCODE
25550   52000    3242R   AND =B377
25551   11567   77567A   CPA V32631   KEYCOL
25552   66000   25555R   JMP A1476
25553    2000    3242R   LDA =B377
25554   31567   77567A   STA V32631   KEYCOL
25555                   A1476 EQU *
25555    2000    1457R   LDA =D1
25556   21572   77572A   ADA V32634   J
25557  144016      16A   ISZ C,I
25560   66000   25545R   JMP A1475
25561   54016      16A   DSZ C
25562   45474   77474A   ISZ V42 KL
25563                    NOP
25564    1474   77474A   LDA V42 KL
25565  170040            TCA
25566   22000    2107R   ADA =D3
25567  172404           SAM A1477
25570    1567   77567A   LDA V32631   KEYCOL
25571   12000    3242R   CPA =B377
25572   66000   25514R   JMP A1472
25573                   A1477 EQU *
25573    2000    1277R   LDA =B177777
25574   31566   77566A   STA V32630   KEYCODE
25575    1565   77565A   LDA V32629   SRQEN
25576   42000     105X   JSX .W5
25577    1567   77567A   LDA V32631   KEYCOL
25600   12000    3242R   CPA =B377
25601   66000   25631R   JMP A1478
25602    1730   77730A   LDA V30 KFLAG
25603   52000    6512R   AND =B177677
25604   31730   77730A   STA V30 KFLAG
25605    2000    1463R   LDA =D0
```

```
25606  31572   77572A      STA V32634  J
25607                  A1479 EQU *
25607   1572   77572A      LDA V32634  J
25610  22000    1375R      ADA =D-9
25611 172011              SAP A1480
25612   1567   77567A      LDA V32631   KEYCOL
25613   5572   77572A      LDB V32634  J
25614  42000     101X      JSX .TBIT
25615 172005              SAP A1480
25616  45572   77572A      ISZ V32634  J
25617                      NOP
25620  66000   25607R      JMP A1479
25621 177242
25621                      LIT
25622                  A1480 EQU *
25622   1573   77573A      LDA V32635   I
25623  22000    2107R      ADA =D3
25624 170602               SAL 3
25625  61572   77572A      IOR V32634  J
25626  31566   77566A      STA V32630   KEYCODE
25627   2000    2405R      LDA =D5
25630  31575   77575A      STA V32637   K
25631                  A1478 EQU *
25631   2000    2411R      LDA =D4
25632  42000    3214R      JSM P332   WAIT
25633   2000    2107R      LDA =D3
25634   6000    2107R      LDB =D3
25635  42000      75X      JSX .WS4
25636   2000    2411R      LDA =D4
25637  42000     103X      JSX .W4
25640  66000   25707R      JMP A1459
25641                  C1481 EQU *
25641   2000    2405R      LDA =D5
25642  31575   77575A      STA V32637  K
25643                  L1482 EQU * HLOOP
25643   6000    2411R      LDB =D4
25644  42000      74X      JSX .RS5
25645  31566   77566A      STA V32630   KEYCODE
25646  52000    3242R      AND =B377
25647  31566   77566A      STA V32630   KEYCODE
25650  42000   24670R      JSM P1427 NUMKEY
25651 172015               SAP A1483
25652   1601   77601A      LDA V32641   HPBC
25653  42000     106X      JSX .W7
25654  42000   15471R      JSM P976   NUMBER
25655                  A1484 EQU *
25655  76302               SHS A1485
25656  66000   25655R      JMP A1484
25657                  A1485 EQU *
25657   6000    2276R      LDB =D2
25660  42000     110X      JSX .RS7
25661  31573   77573A      STA V32635   I
25662  52000    2406R      AND =D7
25663  12000    1704R      CPA =D6
25664  66000   25643R      JMP L1482 HLOOP
25665  66000   25315R      JMP L192  WLOOP
25666                  A1483 EQU *
25666   1601   77601A      LDA V32641   HPBC
25667  62000    1770R      IOR =B20000
25670  31601   77601A      STA V32641   HPBC
25671  66000   25707R      JMP A1459
25672                  C1486 EQU *
25672   2000    2411R      LDA =D4
25673  31575   77575A      STA V32637   K
25674  66000   25707R      JMP A1459
25675          25672R      DEF C1486
25676          25641R      DEF C1481
25677          25707R      DEF A1459
25700          25512R      DEF C1471
25701          25466R      DEF C1469
25702          25432R      DEF C1463
25703          25415R      DEF C1460
25704          25342R      DEF C1450
25705                      DEC -9
25706  42000     143X  A1449 JSX .CASE
25707                  A1459 EQU *
25707                  L191  EQU * SLOOP
25707   1575   77575A      LDA V32637  K
25710  66000   32431R      JMP A1487
25711                  C1488 EQU *
25711   1564   77564A      LDA V32628   RPGCNT
25712  42000     122X      JSX CNV42
25713  42000      36X      JSX .SAR2
25714   1605   77605A      LDA V32645   SCANSL
25715  72005               RZA A1489
25716  42000    2070R      JSM P261   IFBW
25717  22000    2110R      ADA =D-2
25720  42000    4420R      JSM P407   EXP3
25721  66000   25730R      JMP A1490
25722                  A1489 EQU *
25722  42000      37X      JSX .LDB1
25723          77671A      DEF V9   SPAN
25724  42000      62X      JSX CNV21
25725  42000      41X      JSX MPY1
25726          26246R      DEF =F.005
25727  42000      65X      JSX CNV12
25730                  A1490 EQU *
25730  42000     157X      JSX MPY2I
25731  42000      34X      JSX .STRD
25732          77651A      DEF V32681   LTEMP
```

```
25733   1576  77576A     LDA V32638  RPGPTR
25734  66000  26275R     JMP A1491
25735                C1492 EQU *
25735   1564  77564A     LDA V32628  RPGCNT
25736 172002             SAP *+2
25737 170040             TCA
25740 170040             TCA
25741  22000   2301R     ADA =D19
25742 172013            SAP A1493
25743   2000   2565R     LDA =D11
25744  70540             PWC A
25745  42000   2070R     JSM P261  IFBW
25746  22000   2110R     ADA =D-2
25747  21574  77574A     ADA V32636  RPG
25750  42000   2132R     JSM P265  LIMIT
25751  22000   2276R     ADA =D2
25752  42000   4210R     JSM P392  IFBWOUT
25753  42000   7775R     JSM P603  CSCANBW
25754  42000   6723R     JSM P538  CSBLK
25755                A1493 EQU *
25755  66000  26276R     JMP A1494
25756                C1495 EQU *
25756   1564  77564A     LDA V32628  RPGCNT
25757 172002             SAP *+2
25760 170040             TCA
25761 170040             TCA
25762  22000   2301R     ADA =D19
25763 172010            SAP A1496
25764   2000   2172R     LDA =D13
25765  70540             PWC A
25766  42000   2111R     JSM P263  VBW
25767  21574  77574A     ADA V32636  RPG
25770  42000   2132R     JSM P265  LIMIT
25771  42000   4314R     JSM P400  VBWOUT
25772  42000   7775R     JSM P603  CSCANBW
25773                A1496 EQU *
25773  66000  26276R     JMP A1494
25774                C1497 EQU *
25774   1564  77564A     LDA V32628  RPGCNT
25775 172002             SAP *+2
25776 170040             TCA
25777 170040             TCA
26000  22000   2301R     ADA =D19
26001 172402             SAM *+2
26002  66000  26041R     JMP A1498
26003   1733  77733A     LDA V20 FSTIM
26004 172012            SAP A1499
26005   2000   2172R     LDA =D13
26006  70540             PWC A
26007   1731  77731A     LDA V18 SINDEX
26010  22000   1277R     ADA =D-1
26011  21574  77574A     ADA V32636  RPG
26012  42000   2132R     JSM P265  LIMIT
26013  22000   1457R     ADA =D1
26014  42000   4411R     JSM P406  EXP2
26015  66000  26037R     JMP A1500
26016                A1499 EQU *
26016   1605  77605A     LDA V32645  SCANSL
26017  72010            RZA A1501
26020   2000   2205R     LDA =D32
26021  70540             PWC A
26022   1731  77731A     LDA V18 SINDEX
26023  21574  77574A     ADA V32636  RPG
26024  42000   2132R     JSM P265  LIMIT
26025  22000   5520R     ADA =D24
26026  66000  26036R     JMP A1502
26027                A1501 EQU *
26027   2000   2416R     LDA =D29
26030  70540             PWC A
26031   1731  77731A     LDA V18 SINDEX
26032  22000   1301R     ADA =D-3
26033  21574  77574A     ADA V32636  RPG
26034  42000   2132R     JSM P265  LIMIT
26035  22000  10243R     ADA =D27
26036                A1502 EQU *
26036  42000   4356R     JSM P403  EXPSIX
26037                A1500 EQU *
26037  42000   7345R     JSM P558  SCANT
26040  42000   7775R     JSM P603  CSCANBW
26041                A1498 EQU *
26041  66000  26276R     JMP A1494
26042                C1503 EQU *
26042   1564  77564A     LDA V32628  RPGCNT
26043 172002             SAP *+2
26044 170040             TCA
26045 170040             TCA
26046  22000   2301R     ADA =D19
26047 172020            SAP A1504
26050   2000   1704R     LDA =D6
26051  70540             PWC A
26052   1677  77677A     LDA V17 RFAT
26053  52000   2406R     AND =D7
26054  21574  77574A     ADA V32636  RPG
26055  22000   1277R     ADA =D-1
26056  42000   2132R     JSM P265  LIMIT
26057  22000   1457R     ADA =D1
26060  42000    104X     JSX .TURN
26061          2406R     DEF =D7
26062         77677A     DEF V17 RFAT
26063  31677  77677A     STA V17 RFAT
```

```
26064    1700   77700A        LDA V22 RLVL
26065   42000    3530R        JSM P355  REFLEV
26066   42000    3255R        JSM P337  WRFAT
26067                   A1504 EQU *
26067   66000   26276R        JMP A1494
26070                   C1505 EQU *
26070   42000    4430R        JSM P408  LGSCL
26071   70540                 PWC A
26072    2000    2204R        LDA =D10
26073   42000     200X        JSX DIV4T
26074   70540                 PWC A
26075    1564   77564A        LDA V32628  RPGCNT
26076  172002                 SAP *+2
26077  170040                 TCA
26100   42000     116X        JSX SUB4T
26101  172412               SAM A1506
26102   42000    4430R        JSM P408  LGSCL
26103    5564   77564A        LDB V32628  RPGCNT
26104   75617                 MPY
26105   42000     113X        JSX DIV4
26106             2204R       DEF =D10
26107   21700   77700A        ADA V22 RLVL
26110   42000    3530R        JSM P355  REFLEV
26111    2000    1463R        LDA =D0
26112   31564   77564A        STA V32628  RPGCNT
26113                   A1506 EQU *
26113   66000   26276R        JMP A1494
26114                   C1507 EQU *
26114    1564   77564A        LDA V32628  RPGCNT
26115  172002                 SAP *+2
26116  170040                 TCA
26117  170040                 TCA
26120   22000    2301R        ADA =D19
26121  172017               SAP A1508
26122    2000    2107R        LDA =D3
26123   70540                 PWC A
26124    1435   77435A        LDA V32541  IF1
26125  170514                 SAR 13
26126   52000    2107R        AND =D3
26127  170040                 TCA
26130   21574   77574A        ADA V32636  RPG
26131  170040                 TCA
26132   42000    2132R        JSM P265  LIMIT
26133   62000    2411R        IOR =D4
26134  170614                 SAL 13
26135   42000    4171R        JSM P390  LGDB
26136    1730   77730A        LDA V30 KFLAG
26137   42000   15050R        JSM P223  AMPU
26140                   A1508 EQU *
26140   66000   26276R        JMP A1494
26141                   C1509 EQU *
26141   42000   12250R        JSM P729  STEPF
26142   66000   26276R        JMP A1494
26143                   C1510 EQU *
26143   42000     156X        JSX .CLB1
26144            11304R       DEF =F1699999900
26145   42000     150X        JSX ADD2
26146            77671A       DEF V9  SPAN
26147   42000     201X        JSX SUB3
26150            11310R       DEF =H100
26151   42000    2043R        JSM P256  DLIMIT
26152   42000     163X        JSX ADD3
26153            11310R       DEF =H100
26154   42000   11120R        JSM P668  SPAN*
26155   66000   26276R        JMP A1494
26156                   C1511 EQU *
26156   42000   12224R        JSM P728  STEPL
26157   66000   26276R        JMP A1494
26160                   C1512 EQU *
26160   42000   12200R        JSM P727  STEPH
26161   66000   26276R        JMP A1494
26162                   C1513 EQU *
26162   42000      37X        JSX .LDBI
26163            77713A       DEF V7  FSTEP
26164   42000     202X        JSX .DSGN
26165  170416                 AAR 15
26166  170600                 SAL 1
26167   22000    1457R        ADA =D1
26170   31572   77572A        STA V32634  J
26171   42000     156X        JSX .CLB1
26172            11137R       DEF D674  1700000000
26173    4020      20A        LDB AR2
26174   77202                 SLB *+2,C
26175   34020      20A        STB AR2
26176   42000     150X        JSX ADD2
26177            77651A       DEF V32681  LTEMP
26200   42000    2043R        JSM P256  DLIMIT
26201   42000      36X        JSX .SAR2
26202    1572   77572A        LDA V32634  J
26203   42000     122X        JSX CNV42
26204   42000     157X        JSX MPY2I
26205   42000      34X        JSX .STRD
26206            77713A       DEF V7  FSTEP
26207   66000   26276R        JMP A1494
26210                   C1514 EQU *
26210    1615   77615A        LDA V32653  DAC1
26211   21564   77564A        ADA V32628  RPGCNT
26212   42000    3114R        JSM P326  WDACS
26213   66000   26276R        JMP A1494
26214                   C1515 EQU *
```

```
26214     1704   77704A     LDA V33 LEVLIN
26215    21564   77564A     ADA V32628  RPGCNT
26216    42000   11072R     JSM P667  WLVLN
26217    66000   26276R     JMP A1494
26220                      C1516 EQU *
26220     1705   77705A     LDA V32 THRESH
26221    21564   77564A     ADA V32628  RPGCNT
26222    42000   11044R     JSM P666  WTHRSH
26223    66000   26276R     JMP A1494
26224                      C1517 EQU *
26224     1564   77564A     LDA V32628  RPGCNT
26225   172002              SAP *+2
26226   170040              TCA
26227   170040              TCA
26230    22000    2204R     ADA =D10
26231   172011              SAP A1518
26232     1564   77564A     LDA V32628  RPGCNT
26233   172002              SAP *+2
26234   170040              TCA
26235     5564   77564A     LDB V32628  RPGCNT
26236    75617              MPY
26237    42000     113X     JSX DIV4
26240             2203R     DEF =D8
26241    31564   77564A     STA V32628  RPGCNT
26242                      A1518 EQU *
26242     1721   77721A     LDA V25 MRKR
26243    21564   77564A     ADA V32628  RPGCNT
26244    42000   11010R     JSM P663  STMRKR
26245    66000   26276R     JMP A1494
26246     .005
26246                       LIT
26252            26224R     DEF C1517
26253            26276R     DEF A1494
26254            26276R     DEF A1494
26255            26220R     DEF C1516
26256            26214R     DEF C1515
26257            26210R     DEF C1514
26260            26276R     DEF A1494
26261            26162R     DEF C1513
26262            26160R     DEF C1512
26263            26156R     DEF C1511
26264            26143R     DEF C1510
26265            26141R     DEF C1509
26266            26114R     DEF C1507
26267            26070R     DEF C1505
26270            26042R     DEF C1503
26271            25774R     DEF C1497
26272            25756R     DEF C1495
26273            25735R     DEF C1492
26274                       DEC -19
26275    42000     143X    A1491 JSX .CASE
26276                      A1494 EQU *
26276     1576   77576A     LDA V32638  RPGPTR
26277    22000   13136R     ADA =D-11
26300   172002              SAP A1519
26301    42000    2762R     JSM P314  AVGRST
26302                      A1519 EQU *
26302    42000   12334R     JSM P217  MBLK
26303     1576   77576A     LDA V32638  RPGPTR
26304   170040              TCA
26305    22000    1704R     ADA =D6
26306   172407              SAM A1521
26307     1564   77564A     LDA V32628  RPGCNT
26310   172002              SAP *+2
26311   170040              TCA
26312   170040              TCA
26313    22000    2301R     ADA =D19
26314   172003              SAP A1520
26315                      A1521 EQU *
26315     2000    1463R     LDA =D0
26316    31564   77564A     STA V32628  RPGCNT
26317                      A1520 EQU *
26317    66000   32432R     JMP A1522
26320                      C1523 EQU *
26320     1723   77723A     LDA V26 MKRMODE
26321    72002              RZA *+2
26322    66000   26645R     JMP A1524
26323    42000   10413R     JSM P636  MKRON
26324     1616   77616A     LDA V32654  XFLAG
26325    62000    2203R     IOR =B10
26326    31616   77616A     STA V32654  XFLAG
26327     1675   77675A     LDA V15 BLEDS
26330   170601              SAL 2
26331   172402              SAM *+2
26332    66000   26570R     JMP A1525
26333     2000    2411R     LDA =D4
26334    42000    3214R     JSM P332  WAIT
26335     1571   77571A     LDA V32633  L
26336    70540              PWC A
26337     1570   77570A     LDA V32632  M
26340    70540              PWC A
26341     1746   77746A     LDA V32742  N
26342    70540              PWC A
26343    42000    5033R     JSM P443  CPERIOD
26344   170040              TCA
26345    22000    2276R     ADA =D2
26346   172013              SAP A1526
26347     1576   77576A     LDA V32638  RPGPTR
26350    22000   13136R     ADA =D-11
26351   172010              SAP A1526
```

```
26352    1565  77565A     LDA V32629   SRGEN
26353   52000   6514R     AND =B77777
26354    6000   2276R     LDB =D2
26355   42000    107X     JSX .WS5
26356    2000   2107R     LDA =D3
26357    6000   2107R     LDB =D3
26360   42000     75X     JSX .WS4
26361                   A1526 EQU *
26361    1616  77616A     LDA V32654   XFLAG
26362  170612             SAL 11
26363  172402             SAM *+2
26364   66000  26435R     JMP A1527
26365    2000   2203R     LDA =D8
26366   70540             PWC A
26367    1721  77721A     LDA V25 MRKR
26370   22000  10523R     ADA =D-501
26371   42000    122X     JSX CNV42
26372   42000    153X     JSX MPY2
26373          77671A     DEF V9   SPAN
26374   42000     26X     JSM P213   ROUND
26375    6000   2107R     LDB =D3
26376   42000     47X     JSX .DRGT
26377   42000    150X     JSX ADD2
26400          77665A     DEF V8   CFREQ
26401   42000   6016R     JSM P500   STONE
26402    2000   2411R     LDA =D4
26403   42000   3214R     JSM P332   WAIT
26404    2000   1457R     LDA =D1
26405   42000   5117R     JSM P450   COUNTIF
26406   42000     34X     JSX .STRD
26407          77661A     DEF V32689   LTEMP1
26410    2000   2276R     LDA =D2
26411   42000   6704R     JSM P537   CPILOT
26412   42000     34X     JSX .STRD
26413          77631A     DEF V32665   FPILOT
26414    2000   1457R     LDA =D1
26415   42000   5117R     JSM P450   COUNTIF
26416   42000    150X     JSX ADD2
26417          77661A     DEF V32689   LTEMP1
26420   42000    146X     JSX DIV3
26421           2276R     DEF =D2
26422   42000     36X     JSX .SAR2
26423    2000   2107R     LDA =D3
26424   42000   5117R     JSM P450   COUNTIF
26425   42000    146X     JSX DIV3
26426           2405R     DEF =D5
26427   42000    130X     JSX ADD2T
26430   42000    140X     JSX MIN2
26431          77631A     DEF V32665   FPILOT
26432   42000     34X     JSX .STRD
26433          77631A     DEF V32665   FPILOT
26434   66000  26506R     JMP A1528
26435                   A1527 EQU *
26435    1730  77730A     LDA V30 KFLAG
26436  170605             SAL 6
26437  172014            SAP A1529
26440    1577  77577A     LDA V32639   CTBASE
26441   12000   1704R     CPA =D6
26442   66000  26444R     JMP *+2
26443   66000  26453R     JMP A1529
26444    2000   2107R     LDA =D3
26445   42000   5117R     JSM P450   COUNTIF
26446    2000   2107R     LDA =D3
26447   42000   5117R     JSM P450   COUNTIF
26450   42000     34X     JSX .STRD
26451          77631A     DEF V32665   FPILOT
26452   66000  26456R     JMP A1530
26453                   A1529 EQU *
26453   42000   5545R     JSM P480   VIOSLEW
26454   42000     34X     JSX .STRD
26455          77631A     DEF V32665   FPILOT
26456                   A1530 EQU *
26456    2000   1457R     LDA =D1
26457   42000   5117R     JSM P450   COUNTIF
26460   42000     34X     JSX .STRD
26461          77661A     DEF V32689   LTEMP1
26462    1604  77604A     LDA V32644   SAIN
26463  170600             SAL 1
26464  172004            SAP A1531
26465   42000     53X     JSX .LDSI
26466           2205R     DEF =H20
26467   66000  26472R     JMP A1532
26470                   A1531 EQU *
26470   42000     53X     JSX .LDSI
26471           3654R     DEF =H10
26472                   A1532 EQU *
26472   42000     36X     JSX .SAR2
26473    2000   2107R     LDA =D3
26474   42000   5117R     JSM P450   COUNTIF
26475   42000    150X     JSX ADD2
26476          77631A     DEF V32665   FPILOT
26477   42000    164X     JSX DIV2T
26500   42000    150X     JSX ADD2
26501          77661A     DEF V32689   LTEMP1
26502   42000    140X     JSX MIN2
26503          11133R     DEF D673   20000000
26504   42000     34X     JSX .STRD
26505          77631A     DEF V32665   FPILOT
26506                   A1528 EQU *
26506    1570  77570A     LDA V32632   M
```

```
26507 170040          ICA
26510  22000   2521R  ADA =D17
26511 170603          SAL 4
26512  21571  77571A  ADA V32633  L
26513  42000    122X  JSX CNV42
26514  42000    153X  JSX MPY2
26515          6123R  DEF =F250000
26516  42000     36X  JSX .SAR2
26517  42000     53X  JSX .LDS1
26520         77746A  DEF V32742  N
26521  42000    153X  JSX MPY2
26522         11133R  DEF D673  20000000
26523  42000    124X  JSX SUB2T
26524  42000    150X  JSX ADD2
26525         77631A  DEF V32665  FPILOT
26526  42000    150X  JSX ADD2
26527         77707A  DEF V11 FOFSET
26530  42000     34X  JSX .STRD
26531         77645A  DEF V32677  MFREQ
26532  70760          WWC A
26533  31746  77746A  STA V32742  N
26534  70760          WWC A
26535  31570  77570A  STA V32632  M
26536  70760          WWC A
26537  31571  77571A  STA V32633  L
26540  42000   2154R  JSM P269  WSPIN
26541  42000  10312R  JSM P218  MKREL
26542 172007          SAP A1533
26543  42000     37X  JSX .LDBI
26544         77724A  DEF V10 AMF
26545  42000    140X  JSX MIN2
26546         77645A  DEF V32677  MFREQ
26547  42000     34X  JSX .STRD
26550         77645A  DEF V32677  MFREQ
26551                 A1533 EQU *
26551   1426  77426A  LDA V32534  UFLAG
26552  52000   6512R  AND =B177677
26553  31426  77426A  STA V32534  UFLAG
26554   1723  77723A  LDA V26 MKRMODE
26555  42000   2422R  JSM P284  BLKAD
26556   6000  26644R  LDB =B177160
26557  25722  77722A  ADB V29 MKRLVL
26560   2000   2521R  LDA =B21
26561 176402          SBM A1534
26562   2000   1463R  LDA =D0
26563                 A1534 EQU *
26563  42000     73X  JSX .W6
26564   2000   7570R  LDA =D1040
26565  70540          PWC A
26566   1723  77723A  LDA V26 MKRMODE
26567  42000   2522R  JSM P297  RJUST
26570                 A1525 EQU *
26570   1740  77740A  LDA V32736  EFLAG
26571  52000   2107R  AND =D3
26572  72417          SZA A1535
26573   1740  77740A  LDA V32736  EFLAG
26574  52000   2107R  AND =D3
26575  42000   5117R  JSM P450  COUNTIF
26576  42000     34X  JSX .STRD
26577         77625A  DEF V32661  CSIGNL
26600   1576  77576A  LDA V32636  RPGPTR
26601  12000   7565R  CPA =D18
26602  66000  26604R  JMP *+2
26603  66000  26611R  JMP A1536
26604   1740  77740A  LDA V32736  EFLAG
26605  52000   2107R  AND =D3
26606  22000  12734R  ADA =D35
26607  31620  77620A  STA V32656  PREFIX
26610  42000  13777R  JSM P865  DSPITEM
26611                 A1536 EQU *
26611                 A1535 EQU *
26611  42000  10301R  JSM P624  MKRACT
26612   1616  77616A  LDA V32654  XFLAG
26613  52000   1375R  AND =B177767
26614  31616  77616A  STA V32654  XFLAG
26615 170601          SAL 2
26616 172006          SAP A1537
26617   1616  77616A  LDA V32654  XFLAG
26620 170605          SAL 6
26621 172403          SAM A1537
26622   2000   1770R  LDA =B20000
26623  31703  77703A  STA V21 STRIG
26624                 A1537 EQU *
26624   1740  77740A  LDA V32736  EFLAG
26625 170602          SAL 3
26626 172007          SAP A1538
26627   1601  77601A  LDA V32641  HPBC
26630  62000   1770R  IOR =B20000
26631  31601  77601A  STA V32641  HPBC
26632   1740  77740A  LDA V32736  EFLAG
26633  52000   6371R  AND =B167777
26634  31740  77740A  STA V32736  EFLAG
26635                 A1538 EQU *
26635   1721  77721A  LDA V25 MRKR
26636  12000   3112R  CPA =D1001
26637  66000  26641R  JMP *+2
26640  66000  26645R  JMP A1539
26641   2000   2107R  LDA =D3
26642  31575  77575A  STA V32637  K
26643  66000  25707R  JMP L191  SLOOP
26644 177160
```

```
26644                           LIT
26645                           A1539 EQU *
26645                           A1524 EQU *
26645   66000    32432R          JMP A1522
26646                           C1540 EQU *
26646   66000    26762R          JMP A1541
26647                           P1542 EQU * PEAK
26647    6000     1277R          LDB =D-1
26650   42000       27X          JSX .ARGA
26651   44016       16A          ISZ C
26652   21721    77721A          ADA V25 MRKR
26653  170040                    TCA
26654   22000     1457R          ADA =D1
26655  172402                    SAM *+2
26656   66000    26757R          JMP A1543
26657    1721    77721A          LDA V25 MRKR
26660    6000     1301R          LDB =D-3  D
26661   42000      115X          JSX ADD4P
26662   22000    26755R          ADA =D-1000
26663  172402                    SAM *+2
26664   66000    26757R          JMP A1543
26665    1721    77721A          LDA V25 MRKR
26666    6000     1301R          LDB =D-3  D
26667   42000      115X          JSX ADD4P
26670   22000     1277R          ADA =D-1
26671   70540                    PWC A
26672    5730    77730A          LDB V30 KFLAG
26673  174614                    SBL 13
26674    2000     6352R          LDA =D3072
26675  176410                   SBM A1544
26676    1702    77702A          LDA V24 VIDCON
26677   52000     2406R          AND =D7
26700    4000                    LDB A
26701    2000    20430R          LDA =B32
26702   42000      101X          JSX .TBIT
26703  170504                    SAR 5
26704   52000     6703R          AND =D1024
26705                           A1544 EQU *
26705   42000       57X          JSX ADD4I
26706    6000     2203R          LDB =D8
26707   42000       75X          JSX .WS4
26710   42000      162X          JSX .R5
26711   31473    77473A          STA V41 KK
26712   42000      162X          JSX .R5
26713   31475    77475A          STA V43 KM
26714   42000      162X          JSX .R5
26715   31476    77476A          STA V44 KN
26716    1475    77475A          LDA V43 KM
26717  170604                    SAL 5
26720  170404                    AAR 5
26721   31475    77475A          STA V43 KM
26722    1722    77722A          LDA V29 MKRLVL
26723   22000    26756R          ADA =D-50
26724  170040                    TCA
26725   21475    77475A          ADA V43 KM
26726  170040                    TCA
26727  172022                   SAP A1545
26730    1473    77473A          LDA V41 KK
26731  170604                    SAL 5
26732  170404                    AAR 5
26733  170040                    TCA
26734   21475    77475A          ADA V43 KM
26735  172414                   SAM A1545
26736    1476    77476A          LDA V44 KN
26737  170604                    SAL 5
26740  170404                    AAR 5
26741  170040                    TCA
26742   21475    77475A          ADA V43 KM
26743  172406                   SAM A1545
26744    1475    77475A          LDA V43 KM
26745  170040                    TCA
26746  172003                   SAP A1545
26747    2000     1277R          LDA =D-1
26750   66000    26752R          JMP A1546
26751                           A1545 EQU *
26751  170517                    CLA
26752                           A1546 EQU *
26752    6000     2107R          LDB =D3 PEAK
26753   42000       67X          JSX .STAP
26754   66000    26761R          JMP A1547
26755  176030
26756  177716
26755                           LIT
26757                           A1543 EQU *
26757  170517                    CLA
26760   66000       31X          JMX .RTNA
26761                           A1547 EQU *
26761   66000       70X          JMX .RTNI
26762                           A1541 EQU *
26762    1740    77740A          LDA V32736  EFLAG
26763  170610                    SAL 9
26764  172002                    SAP *+2
26765   66000    27431R          JMP A1548
26766    1610    77610A          LDA V32648  ALIM
26767   70540                    PWC A
26770    1607    77607A          LDA V32647  ACNT
26771   22000     1457R          ADA =D1
26772   42000     2132R          JSM P265  LIMIT
26773   31607    77607A          STA V32647  ACNT
26774    1730    77730A          LDA V30 KFLAG
```

```
26775 170614                 SAL 13
26776 172402                 SAM *+2
26777  66000      27043R     JMP A1549
27000   1676      77676A     LDA V16 TLEDS
27001 170610                 SAL 9
27002 172002                 SAP A1550
27003  42000          6X     JSM P197  VDSUB
27004                      A1550 EQU *
27004   1676      77676A     LDA V16 TLEDS
27005 170507                 SAR 8
27006  52000       1457R     AND =D1
27007  70540                 PWC A
27010   1610      77610A     LDA V32648  ALIM
27011  70540                 PWC A
27012   1607      77607A     LDA V32647  ACNT
27013  22000       1277R     ADA =D-1
27014  42000       2132R     JSM P265  LIMIT
27015  22000       1457R     ADA =D1
27016  42000          5X     JSM P196  VDAVG
27017   1607      77607A     LDA V32647  ACNT
27020 170040                 TCA
27021 172005                 SAP A1551
27022   1426      77426A     LDA V32534  UFLAG
27023  52000      16173R     AND =B177733
27024  62000       2205R     IOR =B40
27025  31426      77426A     STA V32534  UFLAG
27026                      A1551 EQU *
27026   2000       2205R     LDA =D32
27027  42000       2223R     JSM P274  NBLK
27030  42000       2173R     JSM P271  CRLF
27031   2000       1463R     LDA =D0
27032  70540                 PWC A
27033   2000       2405R     LDA =D5
27034  70540                 PWC A
27035   1607      77607A     LDA V32647  ACNT
27036  42000        122X     JSX CNV42
27037  42000      13062R     JSM P793  NDUMP
27040   2000       2421R     LDA =D146
27041  42000         73X     JSX .W6
27042  66000      27045R     JMP A1552
27043                      A1549 EQU *
27043   2000       2205R     LDA =D32
27044  42000       2434R     JSM P285  BLKOF
27045                      A1552 EQU *
27045   1607      77607A     LDA V32647  ACNT
27046  22000       1277R     ADA =D-1
27047 172011                 SAP A1554
27050   1616      77616A     LDA V32654  XFLAG
27051 170605                 SAL 6
27052 172002                 SAP *+2
27053  66000      27367R     JMP A1553
27054   1675      77675A     LDA V15 BLEDS
27055 170600                 SAL 1
27056 172002                 SAP *+2
27057  66000      27367R     JMP A1553
27060                      A1554 EQU *
27060   1675      77675A     LDA V15 BLEDS
27061 170600                 SAL 1
27062 172402                 SAM *+2
27063  66000      27252R     JMP A1555
27064   1702      77702A     LDA V24 VIDCON
27065  52000       2406R     AND =D7
27066   4000                 LDB A
27067   2000      27101R     LDA =B253
27070  42000        101X     JSX .TBIT
27071 172402                 SAM *+2
27072  66000      27252R     JMP A1555
27073   1721      77721A     LDA V25 MRKR
27074  12000      10522R     CPA =D501
27075  66000      27102R     JMP A1559
27076   2000       1463R     LDA =D0
27077  31607      77607A     STA V32647  ACNT
27100  66000      27206R     JMP L1557 FNDIT
27101    253
27101                        LIT
27102                      A1559 EQU *
27102                      L1556 EQU * SEARCH
27102   2000      20422R     LDA =B176027
27103  70540                 PWC A
27104   2000       1463R     LDA =D0
27105                      A1560 EQU *
27105  31573      77573A     STA V32635  I
27106  42000      26647R     JSM P1542 PEAK
27107 172032                 SAP A1561
27110   1475      77475A     LDA V43 KM
27111  31572      77572A     STA V32634  J
27112   1573      77573A     LDA V32635  I
27113 170040                 TCA
27114  42000      26647R     JSM P1542 PEAK
27115   1475      77475A     LDA V43 KM
27116 170040                 TCA
27117  21572      77572A     ADA V32634  J
27120 172410                 SAM A1562
27121   1721      77721A     LDA V25 MRKR
27122  21573      77573A     ADA V32635  I
27123  31721      77721A     STA V25 MRKR
27124   6000       1277R     LDB =B177777
27125  24016        16A      ADB C
27126  34016        16A      STB C
27127  66000      27206R     JMP L1557 FNDIT
```

```
27130                       A1562 EQU *
27130    1573    77573A       LDA V32635  I
27131  170040                 TCA
27132   21721    77721A       ADA V25 MRKR
27133   31721    77721A       STA V25 MRKR
27134    6000     1277R       LDB =B177777
27135   24016       16A       ADB C
27136   34016       16A       STB C
27137   66000    27102R       JMP L1556 SEARCH
27140                       A1563 EQU *
27140   66000    27143R       JMP A1564
27141                       A1561 EQU *
27141    1475    77475A       LDA V43 KM
27142   31572    77572A       STA V32634  J
27143                       A1564 EQU *
27143    1573    77573A       LDA V32635  I
27144  170040                 TCA
27145   42000    26647R       JSM P1542 PEAK
27146  172024                SAP A1565
27147    1572    77572A       LDA V32634  J
27150  170040                 TCA
27151   21475    77475A       ADA V43 KM
27152  172411                SAM A1566
27153    1573    77573A       LDA V32635  I
27154  170040                 TCA
27155   21721    77721A       ADA V25 MRKR
27156   31721    77721A       STA V25 MRKR
27157    6000     1277R       LDB =B177777
27160   24016       16A       ADB C
27161   34016       16A       STB C
27162   66000    27206R       JMP L1557 FNDIT
27163                       A1566 EQU *
27163    1721    77721A       LDA V25 MRKR
27164   21573    77573A       ADA V32635  I
27165   31721    77721A       STA V25 MRKR
27166    6000     1277R       LDB =B177777
27167   24016       16A       ADB C
27170   34016       16A       STB C
27171   66000    27102R       JMP L1556 SEARCH
27172                       A1567 EQU *
27172                       A1565 EQU *
27172    2000     1457R       LDA =D1
27173   21573    77573A       ADA V32635  I
27174  144016       16A       ISZ C,I
27175   66000    27105R       JMP A1560
27176   54016       16A       DSZ C
27177    1722    77722A       LDA V29 MKRLVL
27200   42000      113X       JSX DIV4
27201             2204R       DEF =D10
27202  170040                 TCA
27203   21722    77722A       ADA V29 MKRLVL
27204   31722    77722A       STA V29 MKRLVL
27205   66000    27240R       JMP L1558 NOSIGNL
27206                       L1557 EQU * FNDIT
27206    1675    77675A       LDA V15 BLEDS
27207  170601                 SAL 2
27210  172403                SAM A1568
27211   42000    10413R       JSM P636  MKRON
27212   42000    10301R       JSM P624  MKRACT
27213                       A1568 EQU *
27213    2000     1463R       LDA =D0
27214   31575    77575A       STA V32637  K
27215   42000       37X       JSX .LDBI
27216            77665A       DEF V8  CFREQ
27217   42000      140X       JSX MIN2
27220            77645A       DEF V32677  MFREQ
27221   42000       36X       JSX .SAR2
27222   42000    10312R       JSM P218  MKREL
27223  172004                SAP A1569
27224   42000       37X       JSX .LDBI
27225            77724A       DEF V10 AMP
27226   66000    27231R       JMP A1570
27227                       A1569 EQU *
27227   42000       53X       JSX .LDSI
27230             1463R       DEF =D0
27231                       A1570 EQU *
27231   42000      130X       JSX ADD2T
27232   42000    11464R       JSM P701  STEPD
27233    2000     2107R       LDA =D3
27234   31575    77575A       STA V32637  K
27235   42000     6723R       JSM P538  CSBLK
27236    2000    10522R       LDA =D501
27237   31721    77721A       STA V25 MRKR
27240                       L1558 EQU * NOSIGNL
27240    1620    77620A       LDA V32656  PREFIX
27241   22000     1457R       ADA =D1
27242   52000     1363R       AND =B177774
27243   22000     2066R       ADA =B177770
27244   72005                RZA A1571
27245    1616    77616A       LDA V32654  XFLAG
27246  170602                 SAL 3
27247  172002                SAP A1571
27250   42000     2551R       JSM P298  ABLK
27251                       A1571 EQU *
27251   66000    27260R       JMP A1572
27252                       A1555 EQU *
27252    1723    77723A       LDA V26 MKRMODE
27253   72405                SZA A1573
27254   42000     6127R       JSM P501  MKIS
27255  172403                SAM A1573
```

```
27256  42000  10413R    JSM P636   MKRON
27257  42000  10301R    JSM P624   MKRACI
27260                 A1573 EQU *
27260                 A1572 EQU *
27260   1616  77616A    LDA V32654   XFLAG
27261 170605            SAL 6
27262 172402            SAM *+2
27263  66000  27336R    JMP A1574
27264   2000   1463R    LDA =D0
27265  31575  77575A    STA V32637   K
27266  31607  77607A    STA V32647   ACNT
27267  42000    37X     JSX .LDB1
27270         77671A    DEF V9   SPAN
27271  42000   7327R    JSM P556   LOG2
27272  22000   2110R    ADA =D-2
27273  42000   4411R    JSM P406   EXP2
27274  42000    34X     JSX .STRD
27275         77661A    DEF V32689   LTEMP1
27276  42000    37X     JSX .LDB1
27277         77651A    DEF V32681   LTEMP
27300  42000   140X     JSX MIN2
27301         77671A    DEF V9   SPAN
27302  42000    52X     JSX .DEQL
27303 172014            SAP A1575
27304  42000   2551R    JSM P298   ABLK
27305   1616  77616A    LDA V32654   XFLAG
27306 170600            SAL 1
27307 172403            SAM A1576
27310   2000   5517R    LDA =B100000
27311  31565  77565A    STA V32629   SKOEN
27312                 A1576 EQU *
27312   1616  77616A    LDA V32654   XFLAG
27313  52000  15350R    AND =B176777
27314  31616  77616A    STA V32654   XFLAG
27315  42000   7775R    JSM P603   CSCANBW
27316  66000  27336R    JMP A1577
27317                 A1575 EQU *
27317   2000   1463R    LDA =D0
27320  31575  77575A    STA V32637   K
27321  31607  77607A    STA V32647   ACNT
27322  42000    37X     JSX .LDB1
27323         77661A    DEF V32689   LTEMP1
27324  42000   140X     JSX MIN2
27325         77651A    DEF V32681   LTEMP
27326   4020    20A     LDB AR2
27327  77004            SLB A1578
27330  42000    37X     JSX .LDB1
27331         77661A    DEF V32689   LTEMP1
27332  66000  27335R    JMP A1579
27333                 A1578 EQU *
27333  42000    37X     JSX .LDB1
27334         77651A    DEF V32681   LTEMP
27335                 A1579 EQU *
27335  42000  11120R    JSM P668   SPANW
27336                 A1577 EQU *
27336                 A1574 EQU *
27336   1616  77616A    LDA V32654   XFLAG
27337 170605            SAL 6
27340 172427            SAM A1580
27341   1610  77610A    LDA V32648   ALIM
27342 170040            TCA
27343  21607  77607A    ADA V32647   ACNT
27344 172004            SAP A1581
27345   1730  77730A    LDA V30 KFLAG
27346 170614            SAL 13
27347 172420            SAM A1580
27350                 A1581 EQU *
27350   1740  77740A    LDA V32736   EFLAG
27351 170605            SAL 6
27352 172004            SAP A1582
27353   2000   2205R    LDA =B40
27354   6000   2411R    LDB =D4
27355  42000   112X     JSX .WS7
27356                 A1582 EQU *
27356   1740  77740A    LDA V32736   EFLAG
27357 170603            SAL 4
27360 172007            SAP A1583
27361   1601  77601A    LDA V32641   HPBC
27362  62000   1770R    IOR =B20000
27363  31601  77601A    STA V32641   HPBC
27364   1740  77740A    LDA V32736   EFLAG
27365  52000   7567R    AND =B173777
27366  31740  77740A    STA V32736   EFLAG
27367                 A1583 EQU *
27367                 A1580 EQU *
27367                 A1553 EQU *
27367   1431  77431A    LDA V32537   RPGSWP
27370  22000   1301R    ADA =D-3
27371 172003            SAP A1584
27372  45431  77431A    ISZ V32537   RPGSWP
27373                   NOP
27374                 A1584 EQU *
27374   1431  77431A    LDA V32537   RPGSWP
27375  12000   1457R    CPA =D1
27376  66000  27400R    JMP *+2
27377  66000  27431R    JMP A1585
27400   1576  77576A    LDA V32638   RPGPTR
27401  72430            SZA A1585
27402   1731  77731A    LDA V18 SINDEX
27403 170040            TCA
```

```
27404  22000    2221R   ADA =D9
27405 172005            SAP A1586
27406   2000    2107R   LDA =D3
27407   6000    2107R   LDB =D3
27410  42000      75X   JSX .WS4
27411  66000   27431R   JMP A1587
27412                  A1586 EQU *
27412   6000    2276R   LDB =D2
27413  42000     175X   JSX .RS6
27414  31567   77567A   STA V32631  KEYCOL
27415  42000     176X   JSX .R7
27416  31573   77573A   STA V32635  I
27417 170507            SAR 8
27420  72411            SZA A1588
27421   1616   77616A   LDA V32654  XFLAG
27422  62000    1704R   IOR =D6
27423  31616   77616A   STA V32654  XFLAG
27424   1573   77573A   LDA V32635  I
27425  52000    2066R   AND =B177770
27426  62000    2107R   IOR =B3
27427  31573   77573A   STA V32635  I
27430  66000   25333R   JMP L1430 RLOOP
27431                  A1588 EQU *
27431                  A1587 EQU *
27431                  A1585 EQU *
27431                  A1548 EQU *
27431   1740   77740A   LDA V32736  EFLAG
27432  52000    6512R   AND =B177677
27433  31740   77740A   STA V32736  EFLAG
27434   1607   77607A   LDA V32647  ACNT
27435 170040            TCA
27436 172033            SAP A1589
27437   1676   77676A   LDA V16 TLEDS
27440  52000    6233R   AND =B600
27441  22000    6234R   ADA =B177200
27442  72013            RZA A1590
27443   1702   77702A   LDA V24 VIDCON
27444  52000    2406R   AND =D7
27445   6000    2107R   LDB =D3
27446  75617            MPY
27447  22000    1457R   ADA =D1
27450   4000            LDB A
27451   1426   77426A   LDA V32534  UFLAG
27452  42000     142X   JSX .RBIT
27453  31426   77426A   STA V32534  UFLAG
27454  66000   27471R   JMP A1591
27455                  A1590 EQU *
27455   1676   77676A   LDA V16 TLEDS
27456  52000    1704R   AND =D6
27457  72004            RZA A1592
27460   1426   77426A   LDA V32534  UFLAG
27461  52000    1301R   AND =B177775
27462  31426   77426A   STA V32534  UFLAG
27463                  A1592 EQU *
27463   1676   77676A   LDA V16 TLEDS
27464  52000    3231R   AND =B60
27465  72004            RZA A1593
27466   1426   77426A   LDA V32534  UFLAG
27467  52000    2067R   AND =B177757
27470  31426   77426A   STA V32534  UFLAG
27471                  A1593 EQU *
27471                  A1591 EQU *
27471                  A1589 EQU *
27471   1600   77600A   LDA V32640  CTIM
27472 170040            TCA
27473  22000    2406R   ADA =D7
27474 172013            SAP A1594
27475   1576   77576A   LDA V32638  RPGPTR
27476  22000   13136R   ADA =D-11
27477 172010            SAP A1594
27500   1565   77565A   LDA V32629  SRQEN
27501  52000    6514R   AND =B77777
27502   6000    2276R   LDB =D2
27503  42000     107X   JSX .WS5
27504   2000    2107R   LDA =D3
27505   6000    2107R   LDB =D3
27506  42000      75X   JSX .WS4
27507                  A1594 EQU *
27507  76705            SHC A1595
27510   1616   77616A   LDA V32654  XFLAG
27511  62000    1704R   IOR =D6
27512  31616   77616A   STA V32654  XFLAG
27513  66000   32476R   JMP L193  RESET
27514                  A1595 EQU *
27514   1616   77616A   LDA V32654  XFLAG
27515 170604            SAL 5
27516 172402            SAM *+2
27517  66000   27736R   JMP A1596
27520   2000   27725R   LDA =D2880
27521   6000    2203R   LDB =D8
27522  42000      75X   JSX .WS4
27523   2000   24136R   LDA =B2022
27524  42000      73X   JSX .W6
27525   2000    3654R   LDA =D16
27526  42000      73X   JSX .W6
27527   2000    2646R   LDA =D3008
27530  42000      73X   JSX .W6
27531   2000   16201R   LDA =B2001
27532  42000      73X   JSX .W6
27533   2000    1463R   LDA =D0
```

```
27534  70540            PWC A
27535   2000    2411R    LDA =D4
27536  70540            PWC A
27537   1615   77615A    LDA V32653   DAC1
27540  42000     122X    JSX CNV42
27541  42000   13062R    JSM P793   NDUMP
27542  42000    2173R    JSM P271   CRLF
27543   2000    1463R    LDA =D0
27544  70540            PWC A
27545   2000    2411R    LDA =D4
27546  70540            PWC A
27547   1614   77614A    LDA V32652   DAC2
27550  42000     122X    JSX CNV42
27551  42000   13062R    JSM P793   NDUMP
27552  42000    2173R    JSM P271   CRLF
27553   2000    1463R    LDA =D0
27554  70540            PWC A
27555   2000    2411R    LDA =D4
27556  70540            PWC A
27557   1613   77613A    LDA V32651   DAC4
27560  42000     122X    JSX CNV42
27561  42000   13062R    JSM P793   NDUMP
27562  42000    2206R    JSM P272   SPACE
27563   2000    1463R    LDA =D0
27564  70540            PWC A
27565   2000    2107R    LDA =D3
27566  70540            PWC A
27567  42000    5764R    JSM P495   FRQC
27570  42000     150X    JSX ADD2
27571          77665A    DEF V8   CFREQ
27572  42000      36X    JSX .SAR2
27573   1603   77603A    LDA V32643   PLUCK
27574 170604             SAL 5
27575 172004            SAP A1597
27576  42000      53X    JSX .LDSI
27577           1463R    DEF =D0
27600  66000   27603R    JMP A1598
27601                  A1597 EQU *
27601  42000      37X    JSX .LDBI
27602          27726R    DEF =F5000000
27603                  A1598 EQU *
27603  42000     130X    JSX ADD2T
27604  42000     151X    JSX DIV2
27605           7237R    DEF =F1700000
27606  42000      36X    JSX .SAR2
27607   1613   77613A    LDA V32651   DAC4
27610  42000     122X    JSX CNV42
27611  42000     124X    JSX SUB2T
27612  42000   13062R    JSM P793   NDUMP
27613  42000    2173R    JSM P271   CRLF
27614   2000    1463R    LDA =D0
27615  70540            PWC A
27616   2000    2411R    LDA =D4
27617  70540            PWC A
27620  42000      53X    JSX .LDSI
27621          77746A    DEF V32742   N
27622  42000   13062R    JSM P793   NDUMP
27623  42000    2206R    JSM P272   SPACE
27624   2000    1463R    LDA =D0
27625  70540            PWC A
27626   2000    2411R    LDA =D4
27627  70540            PWC A
27630   1570   77570A    LDA V32632   M
27631  52000    2406R    AND =D7
27632  42000     122X    JSX CNV42
27633  42000   13062R    JSM P793   NDUMP
27634  42000    2206R    JSM P272   SPACE
27635   2000    1463R    LDA =D0
27636  70540            PWC A
27637   2000    2411R    LDA =D4
27640  70540            PWC A
27641   1571   77571A    LDA V32633   L
27642 170500             SAR 1
27643  42000     122X    JSX CNV42
27644  42000   13062R    JSM P793   NDUMP
27645  42000    2206R    JSM P272   SPACE
27646   1603   77603A    LDA V32643   PLUCK
27647 170511             SAR 10
27650 170140             CMA
27651  52000    1457R    AND =D1
27652  62000    3231R    IOR =B60
27653  42000      73X    JSX .W6
27654  42000    2173R    JSM P271   CRLF
27655   1604   77604A    LDA V32644   SATN
27656 170600             SAL 1
27657 172004            SAP A1599
27660  42000      53X    JSX .LDSI
27661           3654R    DEF =H10
27662  66000   27665R    JMP A1600
27663                  A1599 EQU *
27663  42000      53X    JSX .LDSI
27664           2405R    DEF =D5
27665                  A1600 EQU *
27665  42000      36X    JSX .SAR2
27666  42000      37X    JSX .LDBI
27667          77641A    DEF V32673   VTOFREQ
27670  42000     164X    JSX DIV2T
27671  42000      34X    JSX .STRD
27672          77661A    DEF V32689   LTEMP1
27673   2000    1463R    LDA =D0
```

```
27674   70540             PWC A
27675    2000    1456R    LDA =D12
27676   70540             PWC A
27677   42000   13062R    JSM P793  NDUMP
27700   42000    2173R    JSM P271  CRLF
27701    2000    1463R    LDA =D0
27702   70540             PWC A
27703    2000    1456R    LDA =D12
27704   70540             PWC A
27705    1570   77570A    LDA V32632   M
27706  170040             TCA
27707   22000    2521R    ADA =D17
27710  170603             SAL 4
27711   21571   77571A    ADA V32633  L
27712   42000     122X    JSX CNV42
27713   42000     153X    JSX MPY2
27714            6123R    DEF =F250000
27715   42000     150X    JSX ADD2
27716           77661A    DEF V32689  LTEMP1
27717   42000     140X    JSX MIN2
27720           27732R    DEF =F280000000
27721   42000   13062R    JSM P793  NDUMP
27722    2000    2500R    LDA =D147
27723   42000      73X    JSX .W6
27724   66000   27743R    JMP A1601
27725    5500
27726 5000000
27732 280000000
27725                    LIT
27730                   A1596 EQU *
27736    2000   27767R    LDA =D2884
27737    6000    2203R    LDB =D8
27740   42000      75X    JSX .WS4
27741    2000    2500R    LDA =D147
27742   42000      73X    JSX .W6
27743                   A1601 EQU *
27743    1676   77676A    LDA V16 ILEDS
27744  170604             SAL 5
27745  172023            SAP A1602
27746    1740   77740A    LDA V32736  EFLAG
27747  170602             SAL 3
27750  172420            SAM A1602
27751    1616   77616A    LDA V32654  XFLAG
27752  170605             SAL 6
27753  172415            SAM A1602
27754    1730   77730A    LDA V30 KFLAG
27755  170614             SAL 13
27756  172005            SAP A1603
27757    1610   77610A    LDA V32648  ALIM
27760  170040             TCA
27761   21607   77607A    ADA V32647  ACNT
27762  172406            SAM A1602
27763                   A1603 EQU *
27763   42000    2650R    JSM P304  UNCAL
27764    2000    1770R    LDA =B20000
27765   31703   77703A    STA V21 STRIG
27766   66000   27775R    JMP A1604
27767    5504
27767                    LIT
27770                   A1602 EQU *
27770    1616   77616A    LDA V32654  XFLAG
27771  170611             SAL 10
27772  172002            SAP A1605
27773   42000    7671R    JSM P595  YIGSHFT
27774                   A1605 EQU *
27774   42000   15224R    JSM P221  TRIGR
27775                   A1604 EQU *
27775   66000   32432R    JMP A1522
27776                   C1606 EQU *
27776   42000    5357R    JSM P466  NULOCK
27777   66000   32432R    JMP A1522
30000                   C1607 EQU *
30000    1566   77566A    LDA V32630  KEYCODE
30001   42000   15546R    JSM P214  KEY
30002    1616   77616A    LDA V32654  XFLAG
30003   73402             RLA *+2
30004   66000   30247R    JMP A1608
30005    1601   77601A    LDA V32641  HPBC
30006  170601             SAL 2
30007  172403            SAM A1609
30010    2000    2406R    LDA =D7
30011   42000   24635R    JSM P220  SAVEM
30012                   A1609 EQU *
30012    2000    1457R    LDA =D1
30013   31575   77575A    STA V32637  K
30014    1574   77574A    LDA V32636  RPG
30015    6000    3312R    LDB =D100
30016   75617             MPY
30017   31564   77564A    STA V32628  RPGCNT
30020    1574   77574A    LDA V32636  RPG
30021   42000     122X    JSX CNV42
30022   42000      36X    JSX .SAR2
30023    1605   77605A    LDA V32645  SCANSL
30024   72004            RZA A1610
30025   42000    2070R    JSM P261  IFBW
30026   42000    4420R    JSM P407  EXP3
30027   66000   30034R    JMP A1611
30030                   A1610 EQU *
30030   42000      37X    JSX .LDB1
30031           77671A    DEF V9  SPAN
```

```
30032    6000   1457R    LDB =D1
30033   42000     47X    JSX .DRG1
30034                  A1611 EQU *
30034   42000    157X    JSX MPY21
30035   42000     34X    JSX .STRD
30036          77651A    DEF V32681   LTEMP
30037    1576  77576A    LDA V32638   RPGPTR
30040   66000  30236R    JMP A1612
30041                  C1613 EQU *
30041    5435  77435A    LDB V32541   IF1
30042    2000   2204R    LDA =D10
30043  176004           SBP A1614
30044   42000   4430R    JSM P408   LGSCL
30045    6000   2204R    LDB =D10
30046   75617            MPY
30047                  A1614 EQU *
30047    5574  77574A    LDB V32636   RPG
30050   75617            MPY
30051   21700  77700A    ADA V22 RLVL
30052   42000   3530R    JSM P355   REFLEV
30053   66000  30237R    JMP A1615
30054                  C1616 EQU *
30054    1675  77675A    LDA V15 BLEDS
30055  170604            SAL 5
30056  172027           SAP A1617
30057    1574  77574A    LDA V32636   RPG
30060   42000    122X    JSX CNV42
30061   42000    153X    JSX MPY2
30062          77713A    DEF V7   FSTEP
30063   42000    150X    JSX ADD2
30064          77665A    DEF V8   CFREQ
30065   42000    145X    JSX SUB2
30066          77707A    DEF V11 FOFSET
30067   42000     34X    JSX .STRD
30070          77651A    DEF V32681   LTEMP
30071    1651  77651A    LDA V32681   LTEMP
30072   73412           RLA A1618
30073   42000    140X    JSX MIN2
30074           7220R    DEF =F1739100000
30075    4020     20A    LDB AR2
30076   77406           RLB A1618
30077    1574  77574A    LDA V32636   RPG
30100   42000    122X    JSX CNV42
30101   42000    153X    JSX MPY2
30102          77713A    DEF V7   FSTEP
30103   42000  12250R    JSM P729   STEPF
30104                  A1618 EQU *
30104   66000  30106R    JMP A1619
30105                  A1617 EQU *
30105   42000  12250R    JSM P729   STEPF
30106                  A1619 EQU *
30106   66000  30237R    JMP A1615
30107                  C1620 EQU *
30107   42000     37X    JSX .LDBI
30110          77671A    DEF V9   SPAN
30111   42000    163X    JSX ADD3
30112           1457R    DEF =D1
30113   42000   7327R    JSM P556   LOG2
30114   21574  77574A    ADA V32636   RPG
30115   42000   4411R    JSM P406   EXP2
30116   42000  11120R    JSM P668   SPANW
30117   66000  30237R    JMP A1615
30120                  C1621 EQU *
30120   42000  12224R    JSM P728   STEPL
30121   66000  30237R    JMP A1615
30122                  C1622 EQU *
30122   42000  12200R    JSM P727   STEPH
30123   66000  30237R    JMP A1615
30124                  C1623 EQU *
30124   42000     37X    JSX .LDBI
30125          77713A    DEF V7   FSTEP
30126   42000    202X    JSX .DSGN
30127  170416            AAR 15
30130  170600            SAL 1
30131   22000   1457R    ADA =D1
30132   31572  77572A    STA V32634   J
30133    2000   2416R    LDA =D29
30134   70540            PWC A
30135   42000   7327R    JSM P556   LOG2
30136   21574  77574A    ADA V32636   RPG
30137   42000   2132R    JSM P265   LIMIT
30140   42000   4411R    JSM P406   EXP2
30141   42000     36X    JSX .SAR2
30142    1572  77572A    LDA V32634   J
30143   42000    122X    JSX CNV42
30144   42000    157X    JSX MPY21
30145   42000     34X    JSX .STRD
30146          77713A    DEF V7   FSTEP
30147   66000  30237R    JMP A1615
30150                  C1624 EQU *
30150    1574  77574A    LDA V32636   RPG
30151  172004           SAP A1625
30152    1615  77615A    LDA V32653   DAC1
30153  170400            AAR 1
30154   66000  30162R    JMP A1626
30155                  A1625 EQU *
30155    5615  77615A    LDB V32653   DAC1
30156    2000   1457R    LDA =D1
30157   76403           SZB A1627
30160    1615  77615A    LDA V32653   DAC1
```

```
30161 170600                 SAL 1
30162                  A1627 EQU *
30162                  A1626 EQU *
30162  42000    3114R        JSM P326  WDACS
30163  66000   30237R        JMP A1615
30164                  C1628 EQU *
30164   1723   77723A        LDA V26 MKRMODE
30165  42000     121X        JSX MOD4
30166            2107R        DEF =D3
30167  12000    2276R        CPA =D2
30170  66000   30172R        JMP *+2
30171  66000   30207R        JMP A1629
30172  42000      37X        JSX .LDBI
30173           77645A        DEF V32677  MFREQ
30174  42000    6750R        JSM P222  TUNE
30175  42000    2762R        JSM P314  AVGRST
30176   2000   10522R        LDA =D501
30177  42000   11010R        JSM P663  STMRKR
30200  42000      37X        JSX .LDBI
30201           77671A        DEF V9  SPAN
30202  42000    7327R        JSM P556  LOG2
30203  21574   77574A        ADA V32636  RPG
30204  42000    4411R        JSM P406  EXP2
30205  42000   11120R        JSM P668  SPANW
30206  66000   30212R        JMP A1630
30207                  A1629 EQU *
30207   1721   77721A        LDA V25 MRKR
30210  21564   77564A        ADA V32628  RPGCNT
30211  42000   11010R        JSM P663  STMRKR
30212                  A1630 EQU *
30212  66000   30237R        JMP A1615
30213           30164R        DEF C1628
30214           30237R        DEF A1615
30215           30237R        DEF A1615
30216           25707R        DEF L191  SLOOP
30217           25707R        DEF L191  SLOOP
30220           30150R        DEF C1624
30221           30237R        DEF A1615
30222           30124R        DEF C1623
30223           30122R        DEF C1622
30224           30120R        DEF C1621
30225           30107R        DEF C1620
30226           30054R        DEF C1616
30227           25707R        DEF L191  SLOOP
30230           30041R        DEF C1613
30231           25707R        DEF L191  SLOOP
30232           25707R        DEF L191  SLOOP
30233           25707R        DEF L191  SLOOP
30234           25707R        DEF L191  SLOOP
30235                         DEC -19
30236  42000     143X  A1612 JSX .CASE
30237                  A1615 EQU *
30237   1576   77576A        LDA V32638  RPGPTR
30240  72404                 SZA A1631
30241  22000   13136R        ADA =D-11
30242 172002                 SAP A1631
30243  42000    2762R        JSM P314  AVGRST
30244                  A1631 EQU *
30244   2000    1463R        LDA =D0
30245  31564   77564A        STA V32628  RPGCNT
30246  42000   12334R        JSM P217  MBLK
30247                  A1608 EQU *
30247   1616   77616A        LDA V32654  XFLAG
30250 172402                 SAM *+2
30251  66000   32420R        JMP A1632
30252  66000   30456R        JMP A1634
30253                  P1635 EQU * LINLVL
30253 174517                 CLB
30254  42000      56X        JSX .ARGS
30255  44016      16A        ISZ C
30256   1566   77566A        LDA V32630  KEYCODE
30257  22000   15701R        ADA =B-40
30260  42000     111X        JSX .EQL
30261  70540                 PWC A
30262   1566   77566A        LDA V32630  KEYCODE
30263  22000   30302R        ADA =B-46
30264  42000     111X        JSX .EQL
30265  42000     136X        JSX .ORT
30266  70540                 PWC A
30267   1730   77730A        LDA V30 KFLAG
30270 170515                 SAR 14
30271  22000    1301R        ADA =D-3
30272  42000     111X        JSX .EQL
30273  70540                 PWC A
30274   1566   77566A        LDA V32630  KEYCODE
30275  22000    1301R        ADA =D-3
30276  42000     111X        JSX .EQL
30277  42000     154X        JSX .ANDT
30300  42000     136X        JSX .ORT
30301  66000      31X        JMX .RTNA
30302 177732
30302                         LIT
30303                  P1636 EQU * DBLVL
30303 174517                 CLB
30304  42000      56X        JSX .ARGS
30305  44016      16A        ISZ C
30306  42000   30253R        JSM P1635 LINLVL
30307 172005                 SAP A1637
30310  42000      37X        JSX .LDBI
30311           77651A        DEF V32681  LTEMP
```

```
30312  42000    2001R     JSM P251  DBM
30313  66000   30316R     JMP A1638
30314                    A1637 EQU *
30314  42000      37X     JSX .LDBI
30315          77651A     DEF V32681  LTEMP
30316                    A1638 EQU *
30316  42000      50X     JSX CNV24
30317   6000    2107R     LDB =D3 DBLVL
30320  42000      67X     JSX .STAP
30321 172002              SAP *+2
30322 170040              TCA
30323 170040              TCA
30324  22000   30336R     ADA =D20000
30325 172010              SAP A1639
30326   6000    2107R     LDB =D3 DBLVL
30327  42000      30X     JSX .LDAP
30330 172003              SAP A1640
30331   2000   30337R     LDA =B130740
30332  66000   30334R     JMP A1641
30333                    A1640 EQU *
30333   2000   30336R     LDA =D20000
30334                    A1641 EQU *
30334  66000      31X     JMX .RTNA
30335                    A1639 EQU *
30335  66000      70X     JMX .RTNI
30336  47040
30337 130740
30336                     LIT
30340                    P1642 EQU * ADCLVL
30340 174517              CLB
30341  42000      56X     JSX .ARGS
30342  44016      16A     ISZ C
30343   1730   77730A     LDA V30 KFLAG
30344 170606              SAL 7
30345 172007              SAP A1643
30346  42000      37X     JSX .LDBI
30347          77651A     DEF V32681  LTEMP
30350  42000      50X     JSX CNV24
30351   6000    2107R     LDB =D3 ADCLVL
30352  42000      67X     JSX .STAP
30353  66000   30423R     JMP A1644
30354                    A1643 EQU *
30354   1435   77435A     LDA V32541  IF1
30355 172023              SAP A1645
30356   2000    3166R     LDA =D1023
30357  70540              PWC A
30360  42000    4430R     JSM P408  LGSCL
30361  42000     122X     JSX CNV42
30362  42000      36X     JSX .SAR2
30363  42000   30303R     JSM P1636 DBLVL
30364 170040              TCA
30365  21700   77700A     ADA V22 RLVL
30366  42000     122X     JSX CNV42
30367   2000    1463R     LDA =D0
30370  75541              MLY
30371  42000     164X     JSX DIV2T
30372  42000      50X     JSX CNV24
30373 170040              TCA
30374  22000    4470R     ADA =D1000
30375  42000    2132R     JSM P265  LIMIT
30376  42000      45X     JSX CNV41
30377  66000   30421R     JMP A1646
30400                    A1645 EQU *
30400   1700   77700A     LDA V22 RLVL
30401  42000     122X     JSX CNV42
30402  42000    1736R     JSM P248  NANOV
30403  42000      62X     JSX CNV21
30404  42000      36X     JSX .SAR2
30405  42000   30253R     JSM P1635 LINLVL
30406 172405              SAM A1647
30407  42000      37X     JSX .LDBI
30410          77651A     DEF V32681  LTEMP
30411  42000    1736R     JSM P248  NANOV
30412  66000   30415R     JMP A1648
30413                    A1647 EQU *
30413  42000      37X     JSX .LDBI
30414          77651A     DEF V32681  LTEMP
30415                    A1648 EQU *
30415  42000      62X     JSX CNV21
30416  42000      41X     JSX MPY1
30417          30424R     DEF =F1.0@3
30420  42000      42X     JSX DIV1T
30421                    A1646 EQU *
30421  42000     203X     JSX CNV14
30422  66000      31X     JMX .RTNA
30423                    A1644 EQU *
30423  66000      70X     JMX .RTNI
30424  1.0@3
30424                     LIT
30430                    P1649 EQU * RBLK
30430   1706   77706A     LDA V31 ROFSET
30431  72004              RZA A1650
30432   2000    2407R     LDA =D34
30433  42000    2434R     JSM P285  BLKOF
30434  66000   30441R     JMP A1651
30435                    A1650 EQU *
30435   2000    2407R     LDA =D34
30436  42000    2223R     JSM P274  NBLK
30437   2000    2407R     LDA =D34
30440  42000    2314R     JSM P279  SBLK
```

```
30441                      A1651 EQU *
30441 170201                     RET 1
30442                      P1652 EQU * FBLK
30442  42000      37X            JSX .LDBI
30443          77707A            DEF V11 FOFSET
30444  42000      52X            JSX .DEGL
30445 172004                     SAP A1653
30446   2000   12734R            LDA =D35
30447  42000    2434R            JSM P285  BLKOF
30450  66000   30455R            JMP A1654
30451                      A1653 EQU *
30451   2000   12734R            LDA =D35
30452  42000    2223R            JSM P274  NBLK
30453   2000   12734R            LDA =D35
30454  42000    2314R            JSM P279  SBLK
30455                      A1654 EQU *
30455 170201                     RET 1
30456                      A1634 EQU *
30456   1620   77620A            LDA V32656  PREFIX
30457 170500                     SAR 1
30460  12000    1456R            CPA =D12
30461  66000   30467R            JMP A1655
30462   1601   77601A            LDA V32641  HPBC
30463 170601                     SAL 2
30464 172403                     SAM A1655
30465   2000    2406R            LDA =D7
30466  42000   24635R            JSM P220  SAVEM
30467                      A1655 EQU *
30467   1620   77620A            LDA V32656  PREFIX
30470  66000   31310R            JMP A1656
30471                      C1657 EQU *
30471   2000    2565R            LDA =D11
30472  70540                     PWC A
30473  42000      37X            JSX .LDBI
30474          77651A            DEF V32681  LTEMP
30475  42000    7336R            JSM P557  LOG3
30476  22000    2110R            ADA =D-2
30477  42000    2132R            JSM P265  LIMIT
30500  22000    2276R            ADA =D2
30501  42000    4210R            JSM P392  IFBWOUT
30502  42000    7775R            JSM P603  CSCANBW
30503  42000    6723R            JSM P538  CSBLK
30504  66000   31311R            JMP A1658
30505                      C1659 EQU *
30505   2000    2172R            LDA =D13
30506  70540                     PWC A
30507  42000      37X            JSX .LDBI
30510          77651A            DEF V32681  LTEMP
30511  42000    7336R            JSM P557  LOG3
30512  42000    2132R            JSM P265  LIMIT
30513  42000    4314R            JSM P400  VBWOUT
30514  42000    7775R            JSM P603  CSCANBW
30515  66000   31311R            JMP A1658
30516                      C1660 EQU *
30516  42000      37X            JSX .LDBI
30517          77651A            DEF V32681  LTEMP
30520   4020      20A            LDB AR2
30521  77202                     SLB *+2,C
30522  34020      20A            STB AR2
30523  42000    7345R            JSM P558  SCANT
30524  42000    7775R            JSM P603  CSCANBW
30525  66000   31311R            JMP A1658
30526                      C1661 EQU *
30526   2000    2406R            LDA =D7
30527  70540                     PWC A
30530  42000      37X            JSX .LDBI
30531          77651A            DEF V32681  LTEMP
30532   4020      20A            LDB AR2
30533  77202                     SLB *+2,C
30534  34020      20A            STB AR2
30535  42000     163X            JSX ADD3
30536           2221R            DEF =D9
30537   6000    2204R            LDB =D10
30540  42000     132X            JSX .FDIG
30541  42000    2132R            JSM P265  LIMIT
30542  42000     104X            JSX .TURN
30543           2406R            DEF =D7
30544          77677A            DEF V17 RFAT
30545  31677   77677A            STA V17 RFAT
30546  42000    3255R            JSM P337  WRFAT
30547   1700   77700A            LDA V22 RLVL
30550  42000    3530R            JSM P355  REFLEV
30551  66000   31311R            JMP A1658
30552                      C1662 EQU *
30552  42000   30303R            JSM P1636 DBLVL
30553  42000    3530R            JSM P355  REFLEV
30554  66000   31311R            JMP A1658
30555                      C1663 EQU *
30555   2000    2411R            LDA =D4
30556  70540                     PWC A
30557  42000      37X            JSX .LDBI
30560          77651A            DEF V32681  LTEMP
30561  42000    7327R            JSM P556  LOG2
30562  42000    2132R            JSM P265  LIMIT
30563 170040                     TCA
30564  22000    2411R            ADA =D4
30565  62000    2411R            IOR =D4
30566 170614                     SAL 13
30567  42000    4171R            JSM P390  LGDB
30570   1730   77730A            LDA V30 KFLAG
```

```
30571   42000   15050R    JSM P223  AMPU
30572   66000   31311R    JMP A1658
30573                    C1664 EQU *
30573   42000      37X    JSX .LDBI
30574           77651A    DEF V32681  LTEMP
30575   42000    6750R    JSM P222  TUNE
30576   66000   31311R    JMP A1658
30577                    C1665 EQU *
30577    1676   77676A    LDA V16 ILEDS
30600   52000    6233R    AND =B600
30601   72412             SZA A1667
30602    1675   77675A    LDA V15 BLEDS
30603  170600             SAL 1
30604  172007             SAP A1667
30605   42000      37X    JSX .LDBI
30606           77671A    DEF V9  SPAN
30607   42000     140X    JSX MIN2
30610           77651A    DEF V32681  LTEMP
30611    4020      20A    LDB AR2
30612   77405             RLB A1666
30613                    A1667 EQU *
30613   42000      37X    JSX .LDBI
30614           77651A    DEF V32681  LTEMP
30615   42000   11120R    JSM P668  SPAN*
30616   66000   30675R    JMP A1668
30617                    A1666 EQU *
30617    1616   77616A    LDA V32654  XFLAG
30620   52000   30663R    AND =B176771
30621   62000    1300R    IOR =B1000
30622   31616   77616A    STA V32654  XFLAG
30623   42000      53X    JSX .LDSI
30624           11310R    DEF =H100
30625   42000     140X    JSX MIN2
30626           77651A    DEF V32681  LTEMP
30627    4020      20A    LDB AR2
30630   77005             SLB A1669
30631   42000      53X    JSX .LDSI
30632           11310R    DEF =H100
30633   42000      34X    JSX .STRD
30634           77651A    DEF V32681  LTEMP
30635                    A1669 EQU *
30635    1616   77616A    LDA V32654  XFLAG
30636  170600             SAL 1
30637  172405             SAM A1670
30640    2000    6514R    LDA =B77777
30641   31565   77565A    STA V32629  SRQEN
30642    6000    2276R    LDB =D2
30643   42000     107X    JSX .WS5
30644                    A1670 EQU *
30644    1737   77737A    LDA V32735  BLKS
30645   21612   77612A    ADA V32650  NCHR
30646    6000    2203R    LDB =D8
30647   42000      75X    JSX .WS4
30650    6000    1704R    LDB =D6
30651   42000     100X    JSX .WSTR
30652           30664R    DEF =" AUTO ZOOM "
30653    2000    2500R    LDA =D147
30654   42000      73X    JSX .W6
30655    1601   77601A    LDA V32641  HPBC
30656  170601             SAL 2
30657  172014             SAP A1671
30660    2000    2276R    LDA =D2
30661   42000   15546R    JSM P214  KEY
30662   66000   30674R    JMP A1672
30663  176771
30664   AUTO ZOOM
30663                     LIT
30673                    A1671 EQU *
30673   42000   15224R    JSM P221  TRIGR
30674                    A1672 EQU *
30674   66000   25205R    JMP L190  LOOP
30675                    A1668 EQU *
30675   66000   31311R    JMP A1658
30676                    C1673 EQU *
30676   42000      37X    JSX .LDBI
30677           77671A    DEF V9  SPAN
30700   42000     146X    JSX DIV3
30701            2276R    DEF =D2
30702   42000      34X    JSX .STRD
30703           77742A    DEF V32738  XL
30704   42000      37X    JSX .LDBI
30705           77651A    DEF V32681  LTEMP
30706   42000     150X    JSX ADD2
30707           77665A    DEF V8  CFREQ
30710   42000     150X    JSX ADD2
30711           77742A    DEF V32738  XL
30712   42000     146X    JSX DIV3
30713            2276R    DEF =D2
30714   42000     145X    JSX SUB2
30715           77707A    DEF V11 FOFSET
30716   42000      34X    JSX .STRD
30717           77655A    DEF V32685  LTEMP2
30720   42000      37X    JSX .LDBI
30721           77742A    DEF V32738  XL
30722   42000     150X    JSX ADD2
30723           77665A    DEF V8  CFREQ
30724   42000     145X    JSX SUB2
30725           77651A    DEF V32681  LTEMP
30726    4020      20A    LDB AR2
30727   77010             SLB A1674
```

```
30730  42000      53X   JSX .LDSI
30731           1463R   DEF =D0
30732  42000   11120R   JSM P668  SPANW
30733  42000      37X   JSX .LDBI
30734          77651A   DEF V32681  LTEMP
30735  42000    6750R   JSM P222  TUNE
30736  66000   31021R   JMP A1675
30737                  A1674 EQU *
30737   1655   77655A   LDA V32685  LTEMP2
30740  73015            SLA A1676
30741  42000      37X   JSX .LDBI
30742          77707A   DEF V11 FOFSET
30743  42000    6750R   JSM P222  TUNE
30744  42000      37X   JSX .LDBI
30745          77651A   DEF V32681  LTEMP
30746   4020      20A   LDB AR2
30747  77202            SLB *+2,C
30750  34020      20A   STB AR2
30751  42000     126X   JSX MPY3
30752           2276R   DEF =D2
30753  42000   11120R   JSM P668  SPANW
30754  66000   31021R   JMP A1677
30755                  A1676 EQU *
30755  42000      37X   JSX .LDBI
30756          77655A   DEF V32685  LTEMP2
30757  42000     140X   JSX MIN2
30760           7220R   DEF =F1739100000
30761   4020      20A   LDB AR2
30762  77021            SLB A1678
30763  42000      37X   JSX .LDBI
30764          77707A   DEF V11 FOFSET
30765  42000     150X   JSX ADD2
30766           7220R   DEF =F1739100000
30767  42000    6750R   JSM P222  TUNE
30770  42000      37X   JSX .LDBI
30771          77651A   DEF V32681  LTEMP
30772  42000     140X   JSX MIN2
30773          77665A   DEF V8  CFREQ
30774  42000     126X   JSX MPY3
30775           2276R   DEF =D2
30776   4020      20A   LDB AR2
30777  77202            SLB *+2,C
31000  34020      20A   STB AR2
31001  42000   11120R   JSM P668  SPANW
31002  66000   31021R   JMP A1679
31003                  A1678 EQU *
31003  42000      37X   JSX .LDBI
31004          77665A   DEF V8  CFREQ
31005  42000     150X   JSX ADD2
31006          77742A   DEF V32738  XL
31007  42000     145X   JSX SUB2
31010          77651A   DEF V32681  LTEMP
31011  42000   11120R   JSM P668  SPANW
31012  42000      37X   JSX .LDBI
31013          77671A   DEF V9  SPAN
31014  42000     146X   JSX DIV3
31015           2276R   DEF =D2
31016  42000     150X   JSX ADD2
31017          77651A   DEF V32681  LTEMP
31020  42000    6750R   JSM P222  TUNE
31021                  A1679 EQU *
31021                  A1677 EQU *
31021                  A1675 EQU *
31021  66000   31311R   JMP A1658
31022                  C1680 EQU *
31022  42000      37X   JSX .LDBI
31023          77671A   DEF V9  SPAN
31024  42000     146X   JSX DIV3
31025           2276R   DEF =D2
31026  42000      34X   JSX .STRD
31027          77742A   DEF V32738  XL
31030  42000      37X   JSX .LDBI
31031          77651A   DEF V32681  LTEMP
31032  42000     150X   JSX ADD2
31033          77665A   DEF V8  CFREQ
31034  42000     145X   JSX SUB2
31035          77742A   DEF V32738  XL
31036  42000     146X   JSX DIV3
31037           2276R   DEF =D2
31040  42000     145X   JSX SUB2
31041          77707A   DEF V11 FOFSET
31042  42000      34X   JSX .STRD
31043          77655A   DEF V32685  LTEMP2
31044  42000      37X   JSX .LDBI
31045          77742A   DEF V32738  XL
31046  42000     140X   JSX MIN2
31047          77665A   DEF V8  CFREQ
31050  42000     140X   JSX MIN2
31051          77651A   DEF V32681  LTEMP
31052   4020      20A   LDB AR2
31053  77010            SLB A1681
31054  42000      53X   JSX .LDSI
31055           1463R   DEF =D0
31056  42000   11120R   JSM P668  SPANW
31057  42000      37X   JSX .LDBI
31060          77651A   DEF V32681  LTEMP
31061  42000    6750R   JSM P222  TUNE
31062  66000   31142R   JMP A1682
31063                  A1681 EQU *
31063  42000      37X   JSX .LDBI
31064          77655A   DEF V32685  LTEMP2
```

```
31065  42000    140X    JSX MIN2
31066          7220R    DEF =F1739100000
31067   4020     20A    LDB AR2
31070  77016           SLB A1683
31071  42000     37X    JSX .LDBI
31072         77707A    DEF V11 FOFSET
31073  42000    150X    JSX ADD2
31074          7220R    DEF =F1739100000
31075  42000   6750R    JSM P222  TUNE
31076  42000     37X    JSX .LDBI
31077         77665A    DEF V8  CFREQ
31100  42000    140X    JSX MIN2
31101         77651A    DEF V32681  LTEMP
31102  42000    126X    JSX MPY3
31103          2276R    DEF =D2
31104  42000  11120R    JSM P668  SPANW
31105  66000  31142R    JMP A1684
31106                 A1683 EQU *
31106   1655  77655A    LDA V32685  LTEMP2
31107  73015           SLA A1685
31110  42000     37X    JSX .LDBI
31111         77707A    DEF V11 FOFSET
31112  42000   6750R    JSM P222  TUNE
31113  42000     37X    JSX .LDBI
31114         77651A    DEF V32681  LTEMP
31115  42000    126X    JSX MPY3
31116          2276R    DEF =D2
31117   4020     20A    LDB AR2
31120  77202            SLB *+2,C
31121  34020     20A    STB AR2
31122  42000  11120R    JSM P668  SPANW
31123  66000  31142R    JMP A1686
31124                 A1685 EQU *
31124  42000     37X    JSX .LDBI
31125         77651A    DEF V32681  LTEMP
31126  42000    150X    JSX ADD2
31127         77742A    DEF V32738  XL
31130  42000    145X    JSX SUB2
31131         77665A    DEF V8  CFREQ
31132  42000  11120R    JSM P668  SPANW
31133  42000     37X    JSX .LDBI
31134         77671A    DEF V9  SPAN
31135  42000    146X    JSX DIV3
31136          2276R    DEF =D2
31137  42000    140X    JSX MIN2
31140         77651A    DEF V32681  LTEMP
31141  42000   6750R    JSM P222  TUNE
31142                 A1686 EQU *
31142                 A1684 EQU *
31142                 A1682 EQU *
31142  66000  31311R    JMP A1658
31143                 C1687 EQU *
31143  42000     37X    JSX .LDBI
31144         77651A    DEF V32681  LTEMP
31145   4020     20A    LDB AR2
31146  77202            SLB *+2,C
31147  34020     20A    STB AR2
31150  42000    140X    JSX MIN2
31151         11137R    DEF D674  1700000000
31152   4020     20A    LDB AR2
31153  77013           SLB A1688
31154  42000     37X    JSX .LDBI
31155         77651A    DEF V32681  LTEMP
31156  42000    202X    JSX .DSGN
31157 170416            AAR 15
31160 170600            SAL 1
31161  22000   1457R    ADA =D1
31162  42000    122X    JSX CNV42
31163  42000    153X    JSX MPY2
31164         11137R    DEF D674  1700000000
31165  66000  31170R    JMP A1689
31166                 A1688 EQU *
31166  42000     37X    JSX .LDBI
31167         77651A    DEF V32681  LTEMP
31170                 A1689 EQU *
31170  42000     34X    JSX .STRD
31171         77713A    DEF V7  FSTEP
31172  66000  31311R    JMP A1658
31173                 C1690 EQU *
31173   1566  77566A    LDA V32630  KEYCODE
31174  12000   2107R    CPA =D3
31175  66000  31177R    JMP *+2
31176  66000  31204R    JMP A1691
31177  42000     37X    JSX .LDBI
31200         77651A    DEF V32681  LTEMP
31201  42000     50X    JSX CNV24
31202  42000   3114R    JSM P326  WDACS
31203  66000  31261R    JMP A1692
31204                 A1691 EQU *
31204   2000   3166R    LDA =D1023
31205  70540            PWC A
31206  42000     37X    JSX .LDBI
31207         77651A    DEF V32681  LTEMP
31210  42000     50X    JSX CNV24
31211  42000   2132R    JSM P265  LIMIT
31212  31573  77573A    STA V32635  I
31213   1566  77566A    LDA V32630  KEYCODE
31214  22000  10241R    ADA =D-29
31215  42000    113X    JSX DIV4
31216          2107R    DEF =D3
31217  66000  31260R    JMP A1693
```

```
31220                 C1694 EQU *
31220   1573  77573A        LDA V32635  I
31221  31615  77615A        STA V32653  DAC1
31222   1573  77573A        LDA V32635  I
31223   6000   1463R        LDB =D0
31224  42000     75X        JSX .WS4
31225  66000  31261R        JMP A1695
31226                 C1696 EQU *
31226   1573  77573A        LDA V32635  I
31227  31613  77613A        STA V32651  DAC4
31230   1573  77573A        LDA V32635  I
31231   6000   1463R        LDB =D0
31232  42000    112X        JSX .WS7
31233  66000  31261R        JMP A1695
31234                 C1697 EQU *
31234   1573  77573A        LDA V32635  I
31235  31614  77614A        STA V32652  DAC2
31236   1573  77573A        LDA V32635  I
31237   6000   1463R        LDB =D0
31240  42000    107X        JSX .WS5
31241  66000  31261R        JMP A1695
31242                 C1698 EQU *
31242   1573  77573A        LDA V32635  I
31243  42000    104X        JSX .TURN
31244          3166R        DEF =B1777
31245         77604A        DEF V32644  SATN
31246   6000   1457R        LDB =D1
31247  42000     75X        JSX .WS4
31250  66000  31261R        JMP A1695
31251         31242R        DEF C1698
31252         31261R        DEF A1695
31253         31261R        DEF A1695
31254         31234R        DEF C1697
31255         31226R        DEF C1696
31256         31220R        DEF C1694
31257                       DEC -7
31260  42000    143X  A1693 JSX .CASE
31261                 A1695 EQU *
31261                 A1692 EQU *
31261  66000  31311R        JMP A1658
31262                 C1699 EQU *
31262  42000  30340R        JSM P1642 ADCLVL
31263  42000  11072R        JSM P667  WLVLN
31264  66000  31311R        JMP A1658
31265                 C1700 EQU *
31265  42000  30340R        JSM P1642 ADCLVL
31266  42000  11044R        JSM P666  WTHRSH
31267  66000  31311R        JMP A1658
31270         31265R        DEF C1700
31271         31262R        DEF C1699
31272         31173R        DEF C1690
31273         31311R        DEF A1658
31274         31143R        DEF C1687
31275         31022R        DEF C1680
31276         30676R        DEF C1673
31277         30577R        DEF C1665
31300         30573R        DEF C1664
31301         30555R        DEF C1663
31302         30552R        DEF C1662
31303         30526R        DEF C1661
31304         30516R        DEF C1660
31305         30505R        DEF C1659
31306         30471R        DEF C1657
31307                       DEC -16
31310  42000    143X  A1656 JSX .CASE
31311                 A1658 EQU *
31311   1620  77620A        LDA V32656  PREFIX
31312  22000  13136R        ADA =D-11
31313 172002               SAP A1701
31314  42000   2762R        JSM P314  AVGRST
31315                 A1701 EQU *
31315   1576  77576A        LDA V32638  RPGPTR
31316  12000   7565R        CPA =D18
31317  66000  31321R        JMP *+2
31320  66000  31421R        JMP A1702
31321   1730  77730A        LDA V30 KFLAG
31322 170606                SAL 7
31323 172012               SAP A1703
31324  42000  10312R        JSM P218  MKREL
31325   5717  77717A        LDB V28 AMKR
31326  75617                MPY
31327  42000    122X        JSX CNV42
31330  42000    140X        JSX MIN2
31331         77651A        DEF V32681  LTEMP
31332  42000     50X        JSX CNV24
31333  42000  11010R        JSM P663  STMRKR
31334  66000  31421R        JMP A1704
31335                 A1703 EQU *
31335   1605  77605A        LDA V32645  SCANSL
31336  72032               RZA A1705
31337  42000  10312R        JSM P218  MKREL
31340  70540                PWC A
31341   1717  77717A        LDA V28 AMKR
31342  22000   1277R        ADA =D-1
31343  42000    114X        JSX MPY4T
31344  42000     45X        JSX CNV41
31345  42000     36X        JSX .SAR2
31346   1731  77731A        LDA V18 SINDEX
31347  22000   1704R        ADA =D6
31350  42000   4356R        JSM P403  EXPSIX
```

```
31351  42000      62X     JSX CNV21
31352  42000      36X     JSX .SAR2
31353  42000      37X     JSX .LDBI
31354          77651A     DEF V32681  LTEMP
31355  42000      62X     JSX CNV21
31356  42000      42X     JSX DIV1T
31357  42000      36X     JSX .SAR2
31360  42000      53X     JSX .LDSI
31361           1457R     DEF =D1
31362  42000      54X     JSX CNV31
31363  42000      46X     JSX ADD1T
31364  42000     204X     JSX SUB1T
31365  42000     203X     JSX CNV14
31366  42000  11010R      JSM P663   STMRKR
31367  66000  31421R      JMP A1706
31370                   A1705 EQU *
31370  42000      37X     JSX .LDBI
31371          77671A     DEF V9  SPAN
31372  42000      62X     JSX CNV21
31373  42000      36X     JSX .SAR2
31374  42000  10312R      JSM P218   MKREL
31375  22000   1457R      ADA =D1
31376  42000     122X     JSX CNV42
31377  42000     153X     JSX MPY2
31400          77665A     DEF V8  CFREQ
31401  42000     140X     JSX MIN2
31402          77651A     DEF V32681  LTEMP
31403  42000      62X     JSX CNV21
31404  42000      41X     JSX MPY1
31405          30424R     DEF =F1.0@3
31406  42000      42X     JSX DIV1T
31407  42000      36X     JSX .SAR2
31410  42000  10312R      JSM P218   MKREL
31411 172003             SAP A1707
31412   1717  77717A      LDA V28 AMKR
31413  66000  31415R      JMP A1708
31414                   A1707 EQU *
31414   2000  10522R      LDA =D501
31415                   A1708 EQU *
31415  42000      45X     JSX CNV41
31416  42000      46X     JSX ADD1T
31417  42000     203X     JSX CNV14
31420  42000  11010R      JSM P663   STMRKR
31421                   A1706 EQU *
31421                   A1704 EQU *
31421                   A1702 EQU *
31421   1620  77620A      LDA V32656   PREFIX
31422  22000   6450R      ADA =D-23
31423  66000  32410R      JMP A1709
31424                   C1710 EQU *
31424   1566  77566A      LDA V32630   KEYCODE
31425  22000  31445R      ADA =B-61
31426 172414             SAM A1712
31427   1566  77566A      LDA V32630   KEYCODE
31430 170040              TCA
31431  22000  20441R      ADA =B67
31432 172410             SAM A1712
31433   1566  77566A      LDA V32630   KEYCODE
31434  12000  20441R      CPA =B67
31435  66000  31437R      JMP *+2
31436  66000  31446R      JMP A1711
31437   1616  77616A      LDA V32654   XFLAG
31440 170600              SAL 1
31441 172405             SAM A1711
31442                   A1712 EQU *
31442   2000   1463R      LDA =D0
31443  42000  14741R      JSM P929   ENTRY
31444  66000  31450R      JMP A1713
31445 177717
31445                    LIT
31446                   A1711 EQU *
31446   1566  77566A      LDA V32630  KEYCODE
31447  42000  24635R      JSM P220   SAVEM
31450                   A1713 EQU *
31450  66000  32411R      JMP A1714
31451                   C1715 EQU *
31451   1566  77566A      LDA V32630   KEYCODE
31452 170040              TCA
31453  22000  20441R      ADA =B67
31454 172402              SAM *+2
31455  66000  31557R      JMP A1716
31456   1566  77566A      LDA V32630   KEYCODE
31457  70540              PWC A
31460   2000   4207R      LDA =B160000
31461  42000   4171R      JSM P390   LGDB
31462   2000  15132R      LDA =B141
31463  42000  15546R      JSM P214   KEY
31464   2000  22223R      LDA =B143
31465  42000  15546R      JSM P214   KEY
31466   2000  21206R      LDA =B153
31467  42000  15546R      JSM P214   KEY
31470   2000  21206R      LDA =B153
31471  42000    555R      JSM P215   SKEY
31472   2000  22604R      LDA =B110
31473  42000    555R      JSM P215   SKEY
31474   2000   7670R      LDA =B164
31475  42000  15546R      JSM P214   KEY
31476   1740  77740A      LDA V32736   EFLAG
31477  52000   7731R      AND =B177737
31500  31740  77740A      STA V32736   EFLAG
```

```
31501    2000   22222R      LDA =D39
31502   42000    2434R      JSM P285  BLKOF
31503    1675   77675A      LDA V15 BLEDS
31504   52000   31541R      AND =B176077
31505   62000    1364R      IOR =B100
31506   31675   77675A      STA V15 BLEDS
31507   42000    2303R      JSM P277  GOFSET
31510   70540               PWC A
31511   42000    1665R      JSM P245  RLAD
31512   22000   21232R      ADA =D-70
31513   42000     116X      JSX SUB4T
31514   42000    3530R      JSM P355  REFLEV
31515   42000      37X      JSX .LDBI
31516           11133R      DEF D673  20000000
31517   42000     150X      JSX ADD2
31520           77707A      DEF V11 FOFSET
31521   42000    6750R      JSM P222  TUNE
31522   70760               WWC A
31523   31566   77566A      STA V32630  KEYCODE
31524   12000   10244R      CPA =B70
31525   66000   31527R      JMP *+2
31526   66000   31546R      JMP A1717
31527    2000    1456R      LDA =D12
31530   42000    4210R      JSM P392  IFBWOUT
31531   42000      37X      JSX .LDBI
31532           31542R      DEF =F2000000
31533   42000   11120R      JSM P668  SPANW
31534    2000   10411R      LDA =B114
31535   42000   15546R      JSM P214  KEY
31536    2000   17407R      LDA =B115
31537   42000   15546R      JSM P214  KEY
31540   66000   31556R      JMP A1718
31541  176077
31542 2000000
31541                      LIT
31546                    A1717 EQU *
31546    2000    2107R      LDA =D3
31547   42000    4210R      JSM P392  IFBWOUT
31550   42000      53X      JSX .LDSI
31551            1463R      DEF =D0
31552   42000   11120R      JSM P668  SPANW
31553   42000      37X      JSX .LDBI
31554            6717R      DEF =F10000000
31555   42000    7345R      JSM P558  SCANT
31556                    A1718 EQU *
31556   66000   32033R      JMP A1719
31557                    A1716 EQU *
31557    1566   77566A      LDA V32630  KEYCODE
31560   22000    3232R      ADA =B-60
31561  172004              SAP A1720
31562    2000    1463R      LDA =D0
31563   42000   14741R      JSM P929  ENTRY
31564   66000   32033R      JMP A1721
31565                    A1720 EQU *
31565   42000   15143R      JSM P949  UNBLANK
31566    1566   77566A      LDA V32630  KEYCODE
31567   52000    2406R      AND =D7
31570   31573   77573A      STA V32635  I
31571   72424              SZA A1722
31572    2000   15667R      LDA =B177731
31573   70540               PWC A
31574    2000    1457R      LDA =D1
31575                    A1723 EQU *
31575   31572   77572A      STA V32634  J
31576   42000      60X      JSX .ARAY
31577               7R      DEF V4  MSTATE
31600   70541               PWC B
31601    1572   77572A      LDA V32634  J
31602   70540               PWC A
31603    1573   77573A      LDA V32635  I
31604   42000     174X      JSX .ARRY
31605             213R      DEF V115  ASAVE
31606   42000     170X      JSX .STAC
31607    2000    1457R      LDA =D1
31610   21572   77572A      ADA V32634  J
31611  144016      16A      ISZ C,I
31612   66000   31575R      JMP A1723
31613   54016      16A      DSZ C
31614   42000   15424R      JSM P974  SAVFIX
31615                    A1722 EQU *
31615    1616   77616A      LDA V32654  XFLAG
31616   52000   31651R      AND =B150761
31617   31616   77616A      STA V32654  XFLAG
31620    1730   77730A      LDA V30 KFLAG
31621   52000   31652R      AND =B177137
31622   31730   77730A      STA V30 KFLAG
31623   42000    3255R      JSM P337  WRFAT
31624    1740   77740A      LDA V32736  EFLAG
31625   52000    1363R      AND =B177774
31626   31740   77740A      STA V32736  EFLAG
31627    1676   77676A      LDA V16 TLEDS
31630   52000   15350R      AND =B176777
31631   42000    2163R      JSM P270  TLEDSOUT
31632    1701   77701A      LDA V23 RVBW
31633   31435   77435A      STA V32541  IF1
31634    1701   77701A      LDA V23 RVBW
31635  170607               SAL 8
31636   31434   77434A      STA V32540  IF2
31637    1700   77700A      LDA V22 RLVL
31640   42000    3530R      JSM P355  REFLEV
```

```
31641   1675   77675A     LDA V15 BLEDS
31642 170612              SAL 11
31643 172010             SAP A1724
31644   2000    3527R     LDA =D14
31645  42000    2223R     JSM P274  NBLK
31646   1704   77704A     LDA V33 LEVLIN
31647  42000   11072R     JSM P667  *LVLN
31650  66000   31655R     JMP A1725
31651 150761
31652 177137
31651                    LIT
31653                    A1724 EQU *
31653   2000   13753R     LDA =B155
31654  42000   15546R     JSM P214  KEY
31655                    A1725 EQU *
31655   1675   77675A     LDA V15 BLEDS
31656 170611              SAL 10
31657 172006             SAP A1726
31660   2000    2131R     LDA =D15
31661  42000    2223R     JSM P274  NBLK
31662   1705   77705A     LDA V32 THRESH
31663  42000   11044R     JSM P666  *THRSH
31664  66000   31667R     JMP A1727
31665                    A1726 EQU *
31665   2000    7667R     LDA =B157
31666  42000   15546R     JSM P214  KEY
31667                    A1727 EQU *
31667   1733   77733A     LDA V20 FSTIM
31670 172004             SAP A1728
31671   1731   77731A     LDA V18 SINDEX
31672  42000    4411R     JSM P406  EXP2
31673  66000   31677R     JMP A1729
31674                    A1728 EQU *
31674   1731   77731A     LDA V18 SINDEX
31675  22000    5520R     ADA =D24
31676  42000    4356R     JSM P403  EXPSIX
31677                    A1729 EQU *
31677  42000    7345R     JSM P558  SCANT
31700   1675   77675A     LDA V15 BLEDS
31701  42000   15313R     JSM P966  CFDF
31702  42000      37X     JSX .LDBI
31703          77671A     DEF V9  SPAN
31704  42000   11120R     JSM P668  SPAN*
31705  42000      37X     JSX .LDBI
31706          77665A     DEF V8  CFREQ
31707  42000    6750R     JSM P222  TUNE
31710   2000    1463R     LDA =D0
31711   6000    2203R     LDB =D6
31712  42000      75X     JSX .*S4
31713   1676   77676A     LDA V16 TLEDS
31714 170614              SAL 13
31715 172403             SAM A1731
31716   1733   77733A     LDA V20 FSTIM
31717 172003             SAP A1730
31720                    A1731 EQU *
31720   2000    3113R     LDA =B2060
31721  66000   31723R     JMP A1732
31722                    A1730 EQU *
31722   2000    7570R     LDA =B2020
31723                    A1732 EQU *
31723  42000      73X     JSX .*6
31724   2000    6703R     LDA =D1024
31725  42000     103X     JSX .*4
31726   1676   77676A     LDA V16 TLEDS
31727 170611              SAL 10
31730 172403             SAM A1734
31731   1733   77733A     LDA V20 FSTIM
31732 172003             SAP A1733
31733                    A1734 EQU *
31733   2000    3113R     LDA =B2060
31734  66000   31736R     JMP A1735
31735                    A1733 EQU *
31735   2000    7571R     LDA =B2030
31736                    A1735 EQU *
31736  42000      73X     JSX .*6
31737   1426   77426A     LDA V32534  UFLAG
31740 170502              SAR 3
31741  52000    1457R     AND =D1
31742 170040              TCA
31743  22000   21206R     ADA =B153
31744  42000     555R     JSM P215  SKEY
31745   1730   77730A     LDA V30 KFLAG
31746  42000   15050R     JSM P223  AMPU
31747   2000    2417R     LDA =B177772
31750  70540              PWC A
31751   2000    1457R     LDA =D1
31752                    A1736 EQU *
31752  31567   77567A     STA V32631  KEYCOL
31753  42000    2223R     JSM P274  NBLK
31754   1567   77567A     LDA V32631  KEYCOL
31755  42000    2314R     JSM P279  SBLK
31756   2000    1457R     LDA =D1
31757  21567   77567A     ADA V32631  KEYCOL
31760 144016      16A     ISZ C,I
31761  66000   31752R     JMP A1736
31762  54016      16A     DSZ C
31763  42000    2772R     JSM P315  DALG
31764   1435   77435A     LDA V32541  IF1
31765 172405             SAM A1737
31766   2000    3654R     LDA =D16
```

```
31767   42000    2223R     JSM P274  NBLK
31770    2000    2420R     LDA =D145
31771   42000      73X     JSX .W6
31772                   A1737 EQU *
31772    2000    2521R     LDA =D17
31773   42000    2434R     JSM P285  BLKOF
31774    1723   77723A     LDA V26 MKRMODE
31775   72004             RZA A1738
31776    2000   10411R     LDA =B114
31777   42000   15546R     JSM P214  KEY
32000   66000   32002R     JMP A1739
32001                   A1738 EQU *
32001   42000   10/47R     JSM P219  MKRDEL
32002                   A1739 EQU *
32002    2000   10141R     LDA =D38
32003   42000    2434R     JSM P265  BLKOF
32004    1730   77730A     LDA V30 KFLAG
32005   52000    2107R     AND =D3
32006   72413             SZA A1740
32007    2000   10141R     LDA =D38
32010   42000    2223R     JSM P274  NBLK
32011    5730   77730A     LDB V30 KFLAG
32012  174615              SBL 14
32013    2000   21211R     LDA =B136
32014  176402             SBM A1741
32015    2000   21210R     LDA =D172
32016                   A1741 EQU *
32016   42000      73X     JSX .W6
32017    2000    2420R     LDA =D145
32020   42000      73X     JSX .W6
32021                   A1740 EQU *
32021    2000   22222R     LDA =D39
32022   42000    2434R     JSM P285  BLKOF
32023   42000    3221R     JSM P333  CORREK
32024  172003             SAP A1742
32025    2000   22222R     LDA =D39
32026   42000    2223R     JSM P274  NBLK
32027                   A1742 EQU *
32027   42000   30430R     JSM P1649 RBLK
32030   42000   30442R     JSM P1652 FBLK
32031   42000    2762R     JSM P314  AVGRST
32032   42000   15224R     JSM P221  TRIGR
32033                   A1721 EQU *
32033                   A1719 EQU *
32033   66000   32411R     JMP A1714
32034                   C1743 EQU *
32034    2000    5515R     LDA =D30
32035   70540              PWC A
32036   42000      37X     JSX .LDBI
32037           77651A     DEF V32681  LTEMP
32040   42000      50X     JSX CNV24
32041   42000    2132R     JSM P265  LIMIT
32042   31735   77735A     STA V32733  HPIB
32043  170600              SAL 1
32044   22000    1457R     ADA =D1
32045    6000    2411R     LDB =D4
32046   42000     112X     JSX .WS7
32047    2000   15343R     LDA =D40
32050   42000    2434R     JSM P285  BLKOF
32051    2000   20440R     LDA =B123456
32052   31734   77734A     STA V32732  CMOS
32053    2000    1463R     LDA =D0
32054   42000   14741R     JSM P929  ENTRY
32055   66000   32411R     JMP A1714
32056                   C1744 EQU *
32056    1737   77737A     LDA V32735  BLKS
32057   21612   77612A     ADA V32650  NCHR
32060    6000    2203R     LDB =D8
32061   42000      75X     JSX .WS4
32062    2000   10243R     LDA =D27
32063   42000   14055R     JSM P216  MESSAGE
32064    2000    2500R     LDA =D147
32065   42000      73X     JSX .W6
32066   66000   32415R     JMP L1633 DONE
32067                   C1745 EQU *
32067    1677   77677A     LDA V17 RFAT
32070  170613              SAL 12
32071  172006             SAP A1746
32072   42000      37X     JSX .LDBI
32073           77651A     DEF V32681  LTEMP
32074   42000      50X     JSX CNV24
32075   31432   77432A     STA V32538  GIN2
32076   66000   32103R     JMP A1747
32077                   A1746 EQU *
32077   42000      37X     JSX .LDBI
32100           77651A     DEF V32681  LTEMP
32101   42000      50X     JSX CNV24
32102   31433   77433A     STA V32539  GIN1
32103                   A1747 EQU *
32103   42000    2762R     JSM P314  AvGRS1
32104    1700   77700A     LDA V22 RLVL
32105   42000    3530R     JSM P355  REFLEV
32106    2000    2411R     LDA =D4
32107   42000    2314R     JSM P279  SBLK
32110   66000   32411R     JMP A1714
32111                   C1748 EQU *
32111   42000      37X     JSX .LDBI
32112           77651A     DEF V32681  LTEMP
32113   71500              NRM
32114   35577   77577A     STB V32639  CIBASE
```

```
32115    1577  77577A        LDA V32639  CTBASE
32116   12000   1456R        CPA =D12
32117   66000  32121R        JMP *+2
32120   66000  32125R        JMP A1749
32121    1730  77730A        LDA V30 KFLAG
32122   52000  15350R        AND =B176777
32123   31730  77730A        STA V30 KFLAG
32124   66000  32137R        JMP A1750
32125                  A1749 EQU *
32125    1730  77730A        LDA V30 KFLAG
32126   62000   1300R        IOR =B1000
32127   31730  77730A        STA V30 KFLAG
32130    2000   2405R        LDA =D5
32131   70540                PWC A
32132    1577  77577A        LDA V32639  CTBASE
32133   22000   2417R        ADA =D-6
32134   42000   2132R        JSM P265  LIMIT
32135   22000   1457R        ADA =D1
32136   31577  77577A        STA V32639  CTBASE
32137                  A1750 EQU *
32137   66000  32411R        JMP A1714
32140                  C1751 EQU *
32140    2000   5516R        LDA =D16383
32141   70540                PWC A
32142   42000     53X        JSX .LDSI
32143           1457R        DEF =D1
32144   42000    140X        JSX MIN2
32145          77651A        DEF V32681  LTEMP
32146   42000     50X        JSX CNV24
32147   42000   2132R        JSM P265  LIMIT
32150   22000   1457R        ADA =D1
32151   31610  77610A        STA V32648  ALIM
32152   66000  32411R        JMP A1714
32153                  C1752 EQU *
32153    1706  77706A        LDA V31 ROFSET
32154  170040                TCA
32155   21700  77700A        ADA V22 RLVL
32156   70540                PWC A
32157   42000  30303R        JSM P1636 DBLVL
32160   42000     57X        JSX ADD4T
32161   31700  77700A        STA V22 RLVL
32162   42000  30303R        JSM P1636 DBLVL
32163   31706  77706A        STA V31 ROFSET
32164    1730  77730A        LDA V30 KFLAG
32165   42000  15050R        JSM P223  AMPU
32166   42000  30430R        JSM P1649 RBLK
32167   66000  32411R        JMP A1714
32170                  C1753 EQU *
32170   42000     37X        JSX .LDBI
32171          77665A        DEF V8  CFREQ
32172   42000    150X        JSX ADD2
32173          77651A        DEF V32681  LTEMP
32174   42000    145X        JSX SUB2
32175          77707A        DEF V11 FOFSET
32176   42000     34X        JSX .STRD
32177          77665A        DEF V8  CFREQ
32200   42000    161X        JSX .MVE4
32201          77651A        DEF V32681  LTEMP
32202          77707A        DEF V11 FOFSET
32203   42000   6750R        JSM P222  TUNE
32204   42000  30442R        JSM P1652 FBLK
32205   66000  32411R        JMP A1714
32206                  C1754 EQU *
32206   42000     37X        JSX .LDBI
32207          77651A        DEF V32681   LTEMP
32210   42000     50X        JSX CNV24
32211   52000   6353R        AND =B7777
32212   31563  77563A        STA V32627   DSTAD
32213   66000  32411R        JMP A1714
32214                  C1755 EQU *
32214   42000     37X        JSX .LDBI
32215          77651A        DEF V32681   LTEMP
32216   42000     50X        JSX CNV24
32217   31572  77572A        STA V32634   J
32220  172003                SAP A1756
32221   52000   3166R        AND =B1777
32222   66000  32223R        JMP A1757
32223                  A1756 EQU *
32223                  A1757 EQU *
32223   70540                PWC A
32224    1601  77601A        LDA V32641   HPBC
32225   52000  23366R        AND =B14000
32226   22000  32250R        ADA =B164000
32227   72405                SZA A1759
32230    1601  77601A        LDA V32641   HPBC
32231   52000   6352R        AND =B6000
32232   22000   5742R        ADA =B176000
32233   72003                RZA A1758
32234                  A1759 EQU *
32234    2000   2277R        LDA =D2048
32235   66000  32237R        JMP A1760
32236                  A1758 EQU *
32236    2000   1463R        LDA =D0
32237                  A1760 EQU *
32237   42000    136X        JSX .ORT
32240   42000  12265R        JSM P731  DSWRT
32241    1601  77601A        LDA V32641   HPBC
32242  170140                CMA
32243   42000    104X        JSX .TURN
32244           2277R        DEF =B4000
```

```
32245            77601A    DEF V32641   HPBC
32246   31601    77601A    STA V32641   HPBC
32247   66000    32415R    JMP L1633 DONE
32250  164000
32250                      LIT
32251                      C1761 EQU *
32251   42000       53X    JSX .LDSI
32252            11310R    DEF =H100
32253   42000      165X    JSX .BMIN
32254   42000      145X    JSX SUB2
32255            77651A    DEF V32681   LTEMP
32256    4020       20A    LDB AR2
32257   77007              SLB A1762
32260   42000       53X    JSX .LDSI
32261            11310R    DEF =H100
32262   42000      165X    JSX .BMIN
32263   42000       34X    JSX .STRD
32264            77651A    DEF V32681   LTEMP
32265   66000    32302R    JMP A1763
32266                      A1762 EQU *
32266   42000       53X    JSX .LDSI
32267             2644R    DEF =H1000
32270   42000      165X    JSX .BMIN
32271   42000      140X    JSX MIN2
32272            77651A    DEF V32681   LTEMP
32273    4020       20A    LDB AR2
32274   77006              SLB A1764
32275   42000       53X    JSX .LDSI
32276             2644R    DEF =H1000
32277   42000      165X    JSX .BMIN
32300   42000       34X    JSX .STRD
32301            77651A    DEF V32681   LTEMP
32302                      A1764 EQU *
32302                      A1763 EQU *
32302    2000     2221R    LDA =D9
32303   70540              PWC A
32304   42000       37X    JSX .LDBI
32305            77651A    DEF V32681   LTEMP
32306   42000       26X    JSM P213   ROUND
32307    6000     2276R    LDB =D2
32310   42000       47X    JSX .DRGT
32311   42000       50X    JSX CNV24
32312    6000    32361R    LDB =D1600
32313   75617              MPY
32314   42000      104X    JSX .TURN
32315            32362R    DEF =B177760
32316            77677A    DEF V17 RFAT
32317   31677    77677A    STA V17 RFAT
32320   42000     2762R    JSM P314   AVGRST
32321    1700    77700A    LDA V22 RLVL
32322   42000     3530R    JSM P355   REFLEV
32323   66000    32411R    JMP A1714
32324                      C1765 EQU *
32324   42000    13045R    JSM P791   OHPB
32325    2000     4470R    LDA =D1000
32326   70540              PWC A
32327   42000       37X    JSX .LDBI
32330            77651A    DEF V32681   LTEMP
32331   42000       50X    JSX CNV24
32332   22000     1277R    ADA =D-1
32333   42000     2132R    JSM P265   LIMIT
32334   22000     1457R    ADA =D1
32335   31573    77573A    STA V32635   I
32336    1616    77616A    LDA V32654   XFLAG
32337   62000     2644R    IOR =B10000
32340   52000    15666R    AND =B77776
32341   31616    77616A    STA V32654   XFLAG
32342    1573    77573A    LDA V32635   I
32343   70540              PWC A
32344    1563    77563A    LDA V32627   DSTAD
32345   70540              PWC A
32346    2000     4470R    LDA =D1000
32347   42000      113X    JSX DIV4
32350            77573A    DEF V32635   I
32351   22000     1457R    ADA =D1
32352   70540              PWC A
32353   42000      166X    JSX .CSHV
32354             4630R    DEF P421   RDBMV
32355    1601    77601A    LDA V32641   HPBC
32356  170507              SAR 8
32357   42000       23X    JSM P210   SDUMP
32360   66000    32415R    JMP L1633 DONE
32361    3100
32362  177760
32361                      LIT
32363            32324R    DEF C1765
32364            32251R    DEF C1761
32365            32214R    DEF C1755
32366            32206R    DEF C1754
32367            32411R    DEF A1714
32370            32411R    DEF A1714
32371            32411R    DEF A1714
32372            32411R    DEF A1714
32373            32170R    DEF C1753
32374            32153R    DEF C1752
32375            32411R    DEF A1714
32376            32140R    DEF C1751
32377            32111R    DEF C1748
32400            32411R    DEF A1714
32401            32067R    DEF C1745
```

```
32402          32411R       DEF C1714
32403          32056R       DEF C1744
32404          32034R       DEF C1743
32405          31451R       DEF C1715
32406          31424R       DEF C1710
32407                       DEC -21
32410  42000     143X A1709 JSX .CASE
32411                 A1714 EQU *
32411  42000   12334R       JSM P217  MBLK
32412   1730   77730A       LDA V30 KFLAG
32413  52000   11303R       AND =B177377
32414  31730   77730A       STA V30 KFLAG
32415                 L1633 EQU * DONE
32415   1616   77616A       LDA V32654  XFLAG
32416  62000    2644R       IOR =B10000
32417  31616   77616A       STA V32654  XFLAG
32420                 A1632 EQU *
32420  52000   15666R       AND =B77776
32421  31616   77616A       STA V32654  XFLAG
32422  66000   32432R       JMP A1522
32423          30000R       DEF C1607
32424          27776R       DEF C1606
32425          26646R       DEF C1540
32426          26320R       DEF C1523
32427          25711R       DEF C1488
32430                       DEC -6
32431  42000     143X A1487 JSX .CASE
32432                 A1522 EQU *
32432   1616   77616A       LDA V32654  XFLAG
32433  52000    1704R       AND =D6
32434  72002                RZA *+2
32435  66000   25205R       JMP L190  LOOP
32436  76702                SHC *+2
32437  66000   25205R       JMP L190  LOOP
32440   1616   77616A       LDA V32654  XFLAG
32441 170500                SAR 1
32442  52000    2107R       AND =D3
32443  31575   77575A       STA V32637  K
32444   1616   77616A       LDA V32654  XFLAG
32445  52000    6232R       AND =B177761
32446  31616   77616A       STA V32654  XFLAG
32447   1575   77575A       LDA V32637  K
32450  12000    2276R       CPA =D2
32451  66000   32453R       JMP *+2
32452  66000   32462R       JMP A1766
32453   1616   77616A       LDA V32654  XFLAG
32454 170612                SAL 11
32455 172004               SAP A1767
32456  42000      37X       JSX .LDB1
32457          77665A       DEF V8  CFREQ
32460  42000    6016R       JSM P500  STUNE
32461                 A1767 EQU *
32461  66000   32471R       JMP A1768
32462                 A1766 EQU *
32462   1676   77676A       LDA V16 ILEDS
32463  52000   16170R       AND =B611
32464  72002                RZA *+2
32465  66000   25205R       JMP L190  LOOP
32466   1740   77740A       LDA V32736  EFLAG
32467  62000    1364R       IOR =B100
32470  31740   77740A       STA V32736  EFLAG
32471                 A1768 EQU *
32471  42000    7732R       JSM P599  FPNLUN
32472  66000   25707R       JMP L191  SLOOP
32473                 L195  EQU * ABORT
32473   1601   77601A       LDA V32641  HPBC
32474  52000   16171R       AND =B157777
32475  31601   77601A       STA V32641  HPBC
32476                 L193  EQU * RESET
32476   2000     566R       LDA =B76000
32477  30003       3A       STA V12 RPTR
32500   2000     567R       LDA =B76100
32501  31763   77763A       STA V14 EPTR
32502  30016      16A       STA V13 CPTR
32503   1616   77616A       LDA V32654  XFLAG
32504  52000    1375R       AND =B177767
32505  31616   77616A       STA V32654  XFLAG
32506   1730   77730A       LDA V30 KFLAG
32507  52000   13044R       AND =B177577
32510  31730   77730A       STA V30 KFLAG
32511   1675   77675A       LDA V15 BLEDS
32512  52000    2153R       AND =B177773
32513  31675   77675A       STA V15 BLEDS
32514   1601   77601A       LDA V32641  HPBC
32515 172007               SAP A1769
32516   1602   77602A       LDA V32642  LKMSK
32517   6000    2107R       LDB =D3
32520  42000     107X       JSX .WS5
32521   1601   77601A       LDA V32641  HPBC
32522  52000    6514R       AND =B77777
32523  31601   77601A       STA V32641  HPBC
32524                 A1769 EQU *
32524  66000   25205R       JMP L190  LOOP
32525  66000       6R STOP  JMP ANFNG
32525              6R       END ANFNG
---------------
MCCP  NCCP  IBCK  ICNT  NCNT  IV  MFLAG  KTX
0     0     0     0     1     12  -1     3
ISTAR=17435 KT=0
INPUT BUFFER NV:
  END ANFNG
RING BUFFER NW,MW:
1
```

APPENDIX B-31

ADDRESS ASSIGNMENTS

| ADDRESS DEC | ADDRESS OCT | FUNCTION | BITS 15 14 13 12 11 10 9 8 7 6 5 4 3 2 1 0 (left to right) |
|---|---|---|---|
| 0 | 0 | 50 MHz VTO LOW ORDER DAC | MSB (bit 9) ——— LSB (bit 0) |
| 1 | 1 | 50 MHz VTO HIGH ORDER DAC | MSB (bit 9) ——— LSB (bit 0) |
| 2 | 2 | NOT USED | |
| 3 | 3 | YIG DAC | MSB (bit 9) ——— LSB (bit 0) |
| 4 | 4 | SCAN ATTEN & VTO CONTROL | VTO HFLT, VTO HDIV, ÷00÷ 1, ÷10÷100, MSB ——— LSB |
| 5 | 5 | SCANTIME (1MSECX) | $\overline{10}$ $\overline{1.5}$ $\overline{2}$ $\overline{5}$ $\overline{10}$ $\overline{100}$ |
| 6 | 6 | YIG ø LOCK, SCAN RESET 2nd LO SHIFT | $\overline{HOLD}$, 100KHz LOOP BW, 10KHz LOOP BW, LOOP GND, $\overline{BCW}$ RESET, 2nd LO SHIFT |
| 7 | 7 | SCAN MODE | YIG MAIN, YIG FM, VTO |
| 8 | 10 | 85680 FRONT PANEL LEDS | RBW, YBW, SCAN TIME, SHIFT KEY, ATTN, LINE TRIG / EXT TRIG, SINGLE TRIG, VIDEO TRIG, RPG ENBLD., INPUT ø2, INPUT ø1 |
| 9 | 11 | KEY ROWS, RPG ENABLE | RPG ENABLE, ROW #11 ——— ROW #0 |
| 10 | 12 | KEY COLUMNS, QUALIFIERS | REMOTE, UNDB KEY DOWN, RPG SIGN, COL # 7 ——— COL #0 |
| 11 | 13 | RPG COUNT QUALIFIERS<br>SERVICE REQUEST CODE<br>0 0 0 HISCAN<br>0 0 1 EXT.REF<br>0 1 0 LOCAL/REM<br>0 1 1 RPG<br>1 0 0 KEYDOWN DEBOUNCED<br>1 0 1 LTGR<br>1 1 0 REMOTE REQ<br>1 1 1 UNLOCKED | MSB ——— RPG COUNT (BINARY) ——— LBS, HPIB BUSY, CTR BUSY, EXT REF, SERVICE REQUEST (SEE CODE) |
| 12 | 14 | RESETS<br>RESET CODE<br>0 0 0<br>0 0 1 EXT<br>0 1 0 LOCAL<br>0 1 1 RPG<br>1 0 0 KEYDOWN<br>1 0 1 HISCAN<br>1 1 0 STOP<br>1 1 1 | RESETS (SEE CODE) |
| 13 | 15 | ø LOCK FLAG ENABLE | LO DAC, HI DAC, REF NOT LOCKED, ø3, ø2, ø1 |
| 14 | 16 | 245MHz ø LOCK DIVIDE # = 9-M+.125(N)<br>FREQ = 280-VTO REF-[(DIVIDE #)(4)] | M: MSB ——— LSB, N (RATIO): MSB ——— LSB |
| 15 | 17 | INPUT RELAY ATTENUATOR<br>ATTEN CODE<br>0 0 0 70dB<br>0 0 1 60<br>0 1 0 50<br>0 1 1 40<br>1 0 0 30<br>1 0 1 20<br>1 1 0 10<br>1 1 1 0dB | RELAY 0 = IN ø1, ATTEN CODE |
| 16 | 20 | NOT USED | |
| 17 | 21 | HPIB TO HYBRID | x x x x x x x x (bits 7–0) |

ADDRESS ASSIGNMENTS

| ADDRESS DEC | ADDRESS OCT | FUNCTION | BITS 15 14 13 12 11 10 9 8 7 6 5 4 3 2 1 0 (left to right) |
|---|---|---|---|
| 18 | 22 | HYBRID TO HPIB | x x x x x x x x (bits 7–0) |
| 19 | 23 | HPIB STATUS | |
| 20 | 24 | COUNTER INPUT, PERIOD SELECT<br>INPUT CODE<br>0 0 TIMER<br>0 1 SIG IF<br>1 0 PILOT IF<br>1 1 VTO | M SECTION MSB ——— LSB, INPUT SELECT (SEE CODE) |
| 21 | 25 | COUNTER OUTPUT 4 MSD BCD | MSB ——— LSB |

| DEC | OCT | FUNCTION | BITS (MSB → LSB) |
|---|---|---|---|
| 22 | 26 | COUNTER OUTPUT<br>4 LSD BCD | MSB ———— LSB |
| 23 | 27 | NOT USED | |
| 24 | 30 | INPUT OPTS, &<br>POST ATTEN GAIN<br><br>INPUT OPT. CODE<br>0 0 50 Ω<br>0 1 75 Ω<br>1 0 HI #<br>1 1 NOT PRESENT | IN #2 OPTS (SEE CODE) IN #1 OPTS (SEE CODE) MSB ———— LSB 20 dB ATTEN ERROR |
| 25 | 31 | READOUT UNITS,<br>POST ATTEN GAIN<br><br>UNITS CODE<br>0 0 dBm<br>0 1 dBmV<br>1 0 dBμV<br>1 1 LIN | DEFAULT READOUT UNITS PRE-AMPS PRESENT (SEE CODE) MSB ———— LSB 30 dB ATTEN ERROR |
| 26 | 32 | MSB | MSB 40 dB ATTEN ERROR LSB |
| 27 | 33 | LSB | MSB 50 dB ATTEN ERROR LSB |
| 28 | 34 | MSB | MSB 60 dB ATTEN ERROR LSB |
| 29 | 35 | LSB | MSB 70 dB ATTEN ERROR LSB |
| 30 | 36 | NOT USED | |
| 31 | 37 | NOT USED | |
| 32 | 40 | DIGITAL STORAGE<br>SET ADDRESS | MSB ———— LSB |
| 33 | 41 | D.S. READ & INC.<br>ADDRESS | MSB ———— LSB |
| 34 | 42 | D.S. WRITE & INC.<br>ADDRESS | MSB ———— LSB |
| 35 | 43 | D.S. LOAD<br>OFFSET | MSB ———— LSB |
| 36 | 44 | D.S. VIDEO<br>CONTROL | MSB ———— LSB |
| 37 | 45 | D.S. READ SCAN<br>ADDRESS | MSB ———— LSB |
| 38 | 46 | D.S. LOAD<br>MARKER | MSB ———— LSB |
| 39 | 47 | D.S. LOAD SCAN<br>ADDRESS | MSB ———— LSB |
| 40 | 50 | NOT USED | |
| 49 | 61 | NOT USED | |
| 50 | 62 | SCAN TRIGGER<br>& SOURCE SEL.<br><br>SOURCE CODE<br>0 0 FREE RUN<br>0 1 EXT<br>1 0 LINE<br>1 1 VIDEO | GO ARM STOP SOURCE (SEE CODE) |

ADDRESS ASSIGNMENTS

| ADDRESS DEC | OCT | FUNCTION | 15 | 14 | 13 | 12 | 11 | 10 | 9 | 8 | 7 | 6 | 5 | 4 | 3 | 2 | 1 | 0 |
|---|---|---|---|---|---|---|---|---|---|---|---|---|---|---|---|---|---|---|
| 51 | 63 | FAST SCAN GEN<br>10 MSEC ÷ X | ON | X100 | X10 | X5 | X2 (X = MULTIPLY SELECTED VALUES) | | | | | | | | | | | |
| 52 | 64 | IF SCALE,<br>GAIN<br><br>SOURCE CODE<br>0 0 10dB<br>0 1 5<br>1 0 2<br>1 1 1 | LOG:1 LIN:0 | dB SCALE (SEE CODE) | | REC CAL | ZERO OFF | CRT | AZD | AID | SG 20 | SG 20 | SG 10 | LG 20 | LG 10 | OS 20 | OS 20 | OS 10 |
| 53 | 65 | IF BW, FINE<br>GAIN | MSB RES BW (SEE CODE) LSB | | | | MSB VID BW (SEE CODE) LSB | | | | ATTEN 8 | ATTEN 4 | ATTEN 2 | ATTEN 1 | ATTEN .8 | ATTEN .4 | ATTEN .2 | ATTEN .1 |

BANDWIDTH CODE

| CODE | RES BW | VID BW |
|---|---|---|
| 0 0 0 0 | | 1 Hz |
| 0 0 0 1 | | 3 Hz |
| 0 0 1 0 | 10 Hz | 10 Hz |
| 0 0 1 1 | 30 Hz | 30 Hz |
| 0 1 0 0 | 100 Hz | 100 Hz |
| 0 1 0 1 | 300 Hz | 300 Hz |
| 0 1 1 0 | 1 KHz | 1 KHz |
| 0 1 1 1 | | |
| 1 0 0 0 | | |
| 1 0 0 1 | 3 KHz | 3 KHz |
| 1 0 1 0 | 10 KHz | 10 KHz |
| 1 0 1 1 | 30 KHz | 30 KHz |
| 1 1 0 0 | 100 KHz | 100 KHz |
| 1 1 0 1 | 300 KHz | 300 KHz |

```
          1 1 1 0     1 MHz          1 MHz
          1 1 1 1     3 MHz          3 MHz

54   66   LEDS                       VIDEO  EXT LINE SINGLE SHIFT WRITE WRITE A-B BINK VIEW PEAK BINK VIEW PEAK
                                                     SWP         B     A         B    B    B    A    A    A
```

APPENDIX C-1

```
MICRO ASSEMBLER: 18 FEB 76

                                                        MICRA 23 APRIL 79
                                                        *
                                                        *       PRODUCTION  SOFTWARE  REVISION 02
                                                        *
                                                        *       L. BOWER, M. NEERING  4/23/79
                                                        *
                                                        *
                                                        *       REGISTERS:
                                                                DECLARE SC=0,BPCR=0,SCAN=1,SOFR=2,MKR=3
                                                                DECLARE POSPK=4,NEGPK=5,T=5,VDC=6,REF=7
                                                                DECLARE SCR=0,X=1,Y=2,THRESH=3,DC=4,MA=5
                                                                DECLARE SAVEA=6,CHR=7,DELTAY=7,RA=7
                                                        *
                                                        *       FLAGS:
                                                                DECLARE FLGA=8,FLGB=9,FLGC=10,LROMEN=0
                                                                DECLARE SELA=11,SELB=13,HOLD=15,CE=12
                                                                DECLARE FLGTA=3,FLGTB=4,FLGTC=6
                                                                DECLARE CHAR=1,BLINK=2,FS=3,BRIGHT=4
                                                                DECLARE LLGBLANK=5,DIM=6,FSTPT=7,DOTEN=14
                                                        *
                                                        *       I/O PORTS:
                                                                DECLARE ADC=0,BPCAD=6,BPCD=7,MDR=3
                                                                DECLARE RAMP=4,BPCO=6,STT=8,HSRS=11
                                                                DECLARE MEM=1,TSTA=4,TSTB=3,MAR=7
                                                                DECLARE RTN=2,LGCHAR=0,LGX=1,LGY=2,LGEXP=5
                                                                DECLARE RSTO=9,INCRSA=10,CLRSA=12,DRTIMER=13
                                                                DECLARE SRSEN=14,CRSEN=15
                                                        *
                                                        *       CONSTANTS:
                                                                DECLARE 0=0,1=15,2=1,4=2,8=2,15=3,16=4,32=5,97=6
                                                                DECLARE 255=7,1023=8,1024=9,2047=10,2048=11
                                                                DECLARE 3072=12,4032=13,4095=14,1032=1
                                                        *
                                                        *       QUALIFIERS:
                                                                DECLARE B0=0,B1=1,B2=2,B3=3,B4=4,B5=5,B6=6,B7=7
                                                                DECLARE B8=8,B9=9,B10=10,B11=11,ZERO=12,POS=14
                                                        *
                                                        *
                                                        *
                                                        *               MAIN PROGRAM
                                                        *
                                                        *        BPC SERVICE ROUTINE
                                                        *
                                                                ADRS 0
   0    0    2--1 1  0 3--17 17--0 2 1 6     HK         JCH H DAC=VDC*0
   1    0    1--1 1  0 3--17 17--0 4 1 6     CF         JCH H DAC=VDC
   2    0    1--1 1  0 2--17 17--0 5 0 6     CH         JCJ H SLROMEN DVDC=AC
   3    1    1--0 1  0 3--17 13--0 7 1 0     CJ         JCL OHSRS
   4    1    1--1 1 14 0--17  1--0 5 1 5     CL         JCM DT=B IMEM CCE
   5    0   27--0 1 13 2--17  6--0 4 0 5     CM         JCN H OBPCO DAC=T&B SSELA
   6    0  173--0 1 14 2--17  7--0 4 0 0     CD         JCF H OMAR DAC=BPCR&B SCE
   7    0    1--1 0 17 3--17 17--0 0 1 0     CG         JCI H W DAC=BPCR+1
  10    1    1--1 0  0 3--17 17--0 5 0 0     CI         JCK W DBPCR=AC
  11    0  175--1 0 14 0--17 17--0 7 1 0     CK         JCD H W CCE
  12    0  174--1 1  0 3--17  7--0 5 1 0     BV         JCD H DBPCR=B IBPCD
  13    0  173--1 1  0 3--17 17--0 5 0 0     BW         JCD H DBPCR=AC
  14    0  173--0 0 14 2--17  7--0 4 0 0     BX         JCG H W DAC=BPCR&B OMAR SCE
  15    1    5--1 1  0 3--17  7--0 5 1 2     BY         JCO DSOFR=B IBPCD
  16    1    4--1 1  0 3--17  7--0 5 1 6     BZ         JCO DVDC=B IBPCD
  17    1    3--1 1  0 3--17 17--0 5 0 0     CA         JCO DBPCR=AC
  20    1    2--1 1  0 3--17 17--0 5 0 3     CB         JCO DMKR=AC
  21    1    1--1 1  0 3--17  7--0 5 1 1     CC         JCO DSCAN=B IBPCD
  22    0   12--0 1  0 3--17  6--0 4 0 1     CO         JCN H DAC=SCAN&B OBPCO
  23    1  167--1 1 17 3--17 17--0 0 1 0     BR         JBV DAC=BPCR+1
  24    0  170--0 1  0 3--17  3--0 4 0 5     BS1        JBX H DAC=T&B OMDR
  25    1  171--1 1 17 3--17 17--0 1 1 0     BT         JBZ DAC=BPCR-1
  26    1  172--1 1 17 3--17 17--0 1 1 5     BU         JCB DAC=T-1
  27    1  174--1 1  0 3-- 1  7--0 5 1 5     BP         JBR QB1 DT=B IBPCD
  30    1  175--1 1  0 3-- 1  7--0 5 1 5     BQ         JBT QB1 DT=B IBPCD
  31    1  176--1 1  0 3-- 2  6--0 7 1 0     BO         JBP IBPCAD QB2
  32    0    1--1 1 15 2--17  6--0 7 1 0     BM         JBN H IBPCAD SSELB
  33    0  176--1 1  0 3-- 3  6--0 7 1 0     BN         JBO H IBPCAD QB3
  34    1    2--1 1 17 3--17  3--0 0 1 2     CN         JAC ITSTB DAC=SOFR+1
                                                        *
                                                        *
                                                        *        MAIN LOOP
  35    1    1--1 1 17 3--17  3--0 0 1 2     AB         JAC DAC=SOFR+1 ITSTB
  36    0    2--1 1 14 0--11 17--1 1 1 1     AC         JAD H DAC=SCAN-AC QB9 CCE
  37    0  173--1 1 14 0--17 17--0 7 1 0     BL         JBM H CCE
  40    0    1--0 1 13 2--17  4--0 7 0 0     AD         JAE H DB=AC ORAMP SSELA
  41    0    3--0 1 14 2--17  7--0 4 0 7     AE         JAG H DAC=REF&B OMAR SCE
  42    1    1--1 1 12 3--17 17--0 3 0 6     AJ         JAF DAC=VDC/2047&B
  43    1    3--1 1  0 3--10 17--0 5 0 5     AF         JAH DNEGPK=AC QB8
  44    0    1--1 1 17 3--17  6--0 0 1 7     AG         JAI H DAC=REF+1 IBPCAD
  45    0  170--1 1 17 0-- 0 17--0 5 0 7     AI         JAB H DREF=AC QB0 CHOLD
  46    0    1--1 1  0 3--17 17--0 2 1 5     AH         JAK H  DAC=NEGPK*0
  47    0    1--1 1  0 3--17 17--0 5 0 4     AK         JDI H DPOSPK=AC
  50    0  125--1 1  0 3--17  4--0 7 1 0     DI         JXA H ITSTA
  51    1    1--1 1 12 0--17 17--0 4 0 6     DJ         JAM DAC=VDC&B CFLGC
  52    0  167--1 1  0 3--17 17--0 7 1 0     AM         JAE H
  53    1    1--1 1 17 2--11 17--0 4 1 2     AN         JAO DAC=SOFR QB9 SHOLD
  54    1   44--0 1 12 0--17 17--1 1 1 1     AO         JAQ DAC=SCAN-AC OCRSEN CFLGC
                                                        *
                                                        *
                                                        *        SCAN STOP ROUTINE
  55    0   57--0 1 13 2-- 6 13--0 7 1 0     CQ         JCS H QFLGTC SSELA OHSRS
  56    1  177--1 1 14 0--17  4--0 7 1 0     CP         JCQ ITSTA CCE
```

```
                                                    *
                                                    *
                                                    *     DIGITAL PEAK INPUT ROUTINE
     57    1  24--1 1  0 3--17  4--0 7 1 0   EM    JEN ITSTA
     60    0   1--0 1  0 3-- 5 17--0 7 1 0   JT    JJU H QB5 OCRSEN
     61    0   1--1 1 11 0--17  4--0 7 1 0   JU    JJX H ITSTA CFLGB
     62    0  14--1 1 13 2--17 17--0 4 0 6   JX    JJY H DAC=VDC&B SSELA
     63    1  16--1 1 15 0-- 3 17--0 4 1 0   JV    JJW DAC=SC QFLGTA CSELB
     64    1   6--1 1  0 3--17 17--1 1 1 5   EB    JED DAC=NEGPK-AC
     65    1   1--1 1  0 3--17 17--1 1 1 4   EA    JEC DAC=POSPK-AC
     66    1   1--1 1 10 2--16 17--0 7 1 0   EC    JEE QPOS SFLGA
     67    1   1--1 1  0 3--17 17--0 4 1 0   EE    JEH DAC=SC
     70    1  32--1 1  0 3--17 17--0 5 0 4   EH    JEK DPOSPK=AC
     71    1 177--1 1  0 3--17 17--0 4 1 4   EG    JED DAC=POSPK JEH
     72    1   1--1 1 10 0--16 17--0 7 1 0   ED    JEF QPOS CFLGA
     73    1   1--1 1  0 3--17 17--0 4 1 0   EF    JEI DAC=SC
     74    1   1--1 1  0 3--17 17--0 4 1 5   EI    JEJ DAC=NEGPK
     75    1  25--1 1  0 3--17 17--0 5 0 5   EJ    JEK DNEGPK=AC
     76    1   1--1 1 15 0-- 3 17--0 4 0 6   JY    JJZ DAC=VDC&B QB3 CSELB
     77    1   1--1 1  0 3-- 3 17--0 4 1 0   JZ    JEL DAC=SC QB3
    100    0  22--1 1 17 2--17 17--0 5 0 4   EL    JEK H DPOSPK=AC SHOLD
    101    0 163--1 1 13 2--17 17--0 7 1 0   JW    JEB H SSELA
    102    0 133--0 1 15 2-- 0 16--0 7 1 0   AA    JAB H QB0 OSRSEN SSELB
    103    1   1--1 1  0 3-- 3 17--0 7 1 0   EN    QFLGTA
    104    0   1--1 1  0 3--17 17--0 4 1 0   EO    H DAC=SC
    105    1   7--1 1  0 3--17 17--1 1 1 5   ER    JES DAC=NEGPK-AC
    106    1   1--1 1  0 3--17 17--1 1 1 4   EP    DAC=POSPK-AC
    107    0   1--1 1  0 3--16 17--0 7 1 0   EQ    H QPOS
    110    0   1--1 1 15 2--17  3--0 4 1 0   ET    H DAC=SC SSELB ITSTB
    111    1   2--1 1 13 0--11 17--0 5 0 4   EX    JEZ DPOSPK=AC CSELA QB9
    112    1 177--1 1  0 3--17  3--0 4 1 4   EV    JEX DAC=POSPK ITSTB
    113    0  17--1 1 10 0--17 17--0 5 0 0   EZ    JZB H DSC=AC CFLGA
    114    1   1--1 1  0 3--16 17--0 7 1 0   ES    QPOS
    115    1   1--1 1  0 3--17 17--0 4 1 0   EU    DAC=SC
    116    1   1--1 1  0 3--17 17--0 4 1 5   EW    JEY DAC=NEGPK
    117    1   5--1 1  0 3--17 17--0 5 0 5   EY    JFA DNEGPK=AC
    120    1  15--0 1 11 2--17  4--0 7 0 0   AQ    JAS DB=AC ORAMP SFLGB
    121    0  33--0 1 17 0--17  4--0 7 0 0   AP    JAU H DB=AC ORAMP CHOLD
    122    0   1--1 1 17 2--17 17--0 5 0 0   EK    H DSC=AC SHOLD
    123    1  62--1 1  0 3--17 17--0 4 0 6   GB    JGD DAC=VDC&B
    124    0  30--0 1  0 3--17 10--0 5 0 0   FA    JAU H DSC=AC OSTT
    125    1   4--1 1  0 3--17  4--0 7 1 0   JP    JJN ITSTA
    126    0 131--1 1 17 0--17 17--0 4 0 6   JS    JEM H DAC=VDC&B CHOLD
    127    1   1--1 1 17 2--17  4--0 7 1 0   JQ    JJR ITSTA SHOLD
    130    0 176--1 1  0 3-- 4  0--0 5 1 0   JR    JJS H DSC=B IADC QFLGTB
    131    0 176--1 1 14 0-- 2 17--0 5 0 7   JN    JJQ H DREF=AC QB2 CCE
    132    0 124--1 1  0 3--17 17--0 7 1 0   ZB    JCP H
    133    1  67--1 1 15 2--17 17--0 4 0 6   FB    JJF DAC=VDC&B SSELB
    134    0  16--1 1 15 2--17 17--0 4 0 6   CS    JCU H DAC=VDC&B SSELB
                                                    *
                                                    *
                                                    *     FAST SCAN LOOP
    135    0   3--1 1 17 0--17 17--0 5 0 0   AS    JAY H CHOLD DSC=AC
    136    0 120--1 1 10 2--17 17--0 7 1 0   BK    JCP H SFLGA
    137    0   1--1 1  0 3-- 0 17--0 7 1 0   AW    H QB0
    140    0   1--1 1  0 3--17  6--0 7 1 0   AY    H IBPCAD
    141    0   2--0 1 14 2-- 0  7--0 4 0 7   BA    JBC H DAC=REF&B OMAR SCE QB0
    142    0  15--1 1 17 0--17  4--0 7 1 0   DP    JDN1 H ITSTA  CHOLD
    143    0   1--1 1 17 3--17  3--0 0 1 7   BC    H DAC=REF+1 ITSTB
    144    0   2--1 1  0 3--11 17--0 5 0 7   BE    JBG H DREF=AC QB9
    145    0 111--1 1 10 2--17 17--0 5 0 7   BJ    JCP H DREF=AC SFLGA
    146    1 170--1 1 14 0--17  4--0 7 1 0   BG    JBK ITSTA CCE
                                                    *
                                                    *
                                                    *     DIGITAL PEAK LOOP
    147    0  13--1 1 11 0-- 7 17--0 5 0 7   AZ    JBB H DREF=AC QB7 CFLGB
    150    0 106--1 1 10 2--17 17--0 5 0 7   BI    JCP H DREF=AC SFLGA
    151    0   3--1 1  0 3-- 0 17--0 7 1 0   AT    JAU H QB0
    152    0  63--1 1 12 2--11 17--0 7 1 0   CU    JJM H SFLGC QB9
    153    1 127--1 1  0 3--17  6--0 7 1 0   CT    JAA IBPCAD
    154    0   1--1 1 11 2--17  6--0 7 1 0   AU    IBPCAD H SFLGB
    155    0   4--0 1 14 2-- 0  7--0 4 0 7   AV    JAX H QB0 DAC=REF&B OMAR SCE
    156    0   1--1 1 17 0--17  4--0 7 1 0   DN    JDN1 H ITSTA CHOLD
    157    1   1--1 1  0 3-- 4 17--0 4 0 6   DN1   JDQ DAC=VDC&B QFLGTB
    160    0  27--0 1 17 3-- 5 16--0 0 1 1   DQ    JDR H DAC=SCAN+1 QB5 OSRSEN
    161    0 106--1 1 17 3--17  4--0 0 1 7   AX    JAZ H ITSTA DAC=REF+1
    162    1  51--1 1 14 0--17  3--0 7 1 0   BB    JDE CCE ITSTB
    163    1 165--1 1  0 3--17  4--0 7 1 0   BF    JBI ITSTA
                                                    *
                                                    *
                                                    *
                                                    *     FAST INPUT ROUTINE
    164    0   1--1 1  0 3--17 17--0 4 0 6   FF    JFH H DAC=VDC&B
    165    1   2--1 1  0 3-- 5  4--0 7 1 0   FH    JDF ITSTA QB5
    166    0  51--1 1 10 2--17 17--0 7 1 0   FG    JIV H SFLGA
    167    0   1--1 1  0 3-- 2 17--0 7 1 0   DF    JFI H QB2
    170    1   3--1 1 17 2--17  4--0 7 1 0   FI    JXX ITSTA SHOLD
    171    1   4--1 1 17 2--17  4--0 7 1 0   FP    JFR ITSTA SHOLD
    172    1   6--1 1  0 3--17 17--0 4 1 4   FK    JFT DAC=POSPK
    173    1 177--1 1  0 3--17  0--0 5 1 4   XX    JFK DPOSPK=B IADC
    174    0 174--1 1  0 3-- 2 17--0 7 1 0   FJ    JFI H QB2
    175    0   2--1 1  0 3-- 3  0--0 5 1 0   FR    JFS1 H DSC=B IADC QFLGTA
    176    0 173--1 1  0 3-- 2 17--0 7 1 0   FQ    JFP H QB2
    177    0   1--1 1 17 0--17  3--0 4 1 0   FS1   JFT H DAC=SC ITSTB CHOLD
    200    1 135--1 1  0 3--17 17--0 7 1 0   FT    JAS
    201    1 134--1 1 15 0--17 17--0 5 0 4   FW    JAS DPOSPK=AC CSELB
    202    0 162--1 1  0 3--11 17--0 7 1 0   FD    JFF H QB9
    203    0 161--1 1  0 3--11 17--0 5 0 4   FE    JFF H QB9 DPOSPK=AC
    204    0 121--1 1 17 3--17 17--0 0 1 7   JO    JJP H DAC=REF+1
                                                    *
                                                    *
                                                    *     INPUT SET UP ROUTINE
    205    0  64--1 1 11 3-- 2 17--0 0 1 1   GD    JGF H DAC=SCAN+1024 QB2
    206    1  32--1 1  0 3-- 2 17--0 4 0 6   CE1   JBH DAC=VDC&B QB2
    207    0   2--1 1  0 3--17  4--0 7 1 0   DH    JDT H ITSTA
```

```
210   0    1--1 1  0 3--17  4--0 4 1 1   DQ1   JDT H DAC=SCAN ITSTA
211   0   12--1 1  0 3--17 17--0 4 0 6   DT    JDW H DAC=VDC&B
212   1    1--1 1  0 3-- 1 17--0 7 0 0   DM    JDS DB=AC QB1
213   0    1--1 1 15 2-- 0 17--0 7 1 0   DS    H QB0 SSELB
214   1    4--1 1 13 2--17 17--0 4 0 6   DU    JJC DAC=VDC&B SSELA
215   0    1--1 1  0 3--17 17--0 7 1 0   DV    H
216   1    4--1 1 13 0--17 17--0 4 0 6   JB    JJF DAC=VDC&B CSELA
217   1    2--1 1 13 2--17 17--0 4 0 6   JA    JJE DAC=VDC&B SSELA
220   0   15--1 1 10 2--11 17--0 7 1 0   JC    JJM H QB9 SFLGA
221   0   14--1 1 10 2--11 17--0 7 1 0   JE    JJM H QB9 SFLGA
222   0   13--1 1 10 0--11 17--0 7 1 0   JF    JJM H QB9 CFLGA
223   0    1--1 1 10 2-- 4 17--0 4 0 6   DW    H DAC=VDC&B QB4 SFLGA
224   0    1--1 1 15 0-- 3 17--0 7 1 0   DZ    H QB3 CSELB
225   0    4--1 1 13 0--17 17--0 7 1 0   JG    JJI H CSELA
226   1    1--1 1 13 0--17 17--0 4 0 6   JH    DAC=VDC&B CSELA
227   0    6--1 1  0 3--11 17--0 7 1 0   JL    JJM H QB9
230   0    5--1 1 10 2--11 17--0 7 1 0   JK    JJM H QB9 SFLGA
231   1  171--1 1 15 2--17 17--0 4 0 6   JI    JJF DAC=VDC&B SSELB
232   1  176--1 1 13 2--17 17--0 4 0 6   JJ    JJK DAC=VDC&B SSELA
233   0  177--1 1 15 0--17 17--0 7 1 0   DE    JJJ H CSELB
234   0  127--1 1  0 3--11 17--0 7 1 0   BD    JBF H QB9
235   0  150--1 1 17 2--17 17--0 4 0 6   JM    JGD DAC=VDC&B H SHOLD
                                         *
                                         *
                                         *      MARKER CHECK ROUTINE
236   0    1--1 1 12 2--17 17--0 7 1 0   ZA    JIV H SFLGC
237   0  145--0 1 14 2--17  7--0 4 0 7   IV    JJO H DAC=REF&B OMAR SCE
240   0    1--1 1 12 0-- 0 17--0 7 1 0   BH    JCV H QB0 CFLGC
241   1    3--1 1  1 3--17 17--0 0 1 1   CV    JCX DAC=SCAN+1032
242   1    1--1 1  0 3--17 17--0 4 0 6   CW    JCZ DAC=VDC&B
243   1    4--1 1  0 3-- 1 17--0 7 1 0   CZ    JDA QB1
244   0    4--1 1  2 3--17 17--0 0 1 1   CX    JDC1 H DAC=SCAN+8
245   0    3--1 1 12 2--17 17--0 7 1 0   CY    JDC1 H SFLGC
246   0    2--1 1  2 3--17 17--0 0 1 1   DB    JDC1 H DAC=SCAN+8
247   1  176--1 1  1 3--17 17--0 0 1 1   DA    JCY DAC=SCAN+1032
250   0    1--0 1 14 2--17  7--0 7 0 0   DC1   JDD H DB=AC OMAR SCE
251   0    1--1 1  2 3--17 17--0 0 1 1   DD    JDL H DAC=SCAN+8
252   0    1--1 1  0 3--17 17--1 1 1 3   DL    JZD H DAC=MKR-AC
253   1    1--1 1  0 3--16 17--0 7 1 0   ZD    JZE QPOS
254   0    2--1 1 14 0--17  1--0 5 1 0   ZE    JFM1 H DSC=B IMEM CCE
255   0   10--1 0  0 3--17  3--0 7 1 0   FM    JFN H W ITSTB
256   0    7--1 1  0 3--17  3--0 7 1 0   FM1   JFN H ITSTB
257   1    1--1 1 13 3--17  4--0 3 1 0   DO    JDX DAC=SC/2048 ITSTA
260   1    1--0 1  0 3-- 6  3--0 7 0 0   DX    JDY DB=AC OMDR QFLGTC
261   1    1--1 1  0 3--17 17--0 7 1 0   DY    JFU
262   0    2--1 1  2 3--17 17--0 0 1 1   FU    JFL H DAC=SCAN+8
263   0    1--1 1  1 3--17 17--0 0 1 1   FV    JFL H DAC=SCAN+1032
264   0  171--0 0 14 2--17  7--0 7 0 0   FL    JFK H W DB=AC OMAR SCE
265   0    1--1 0 12 0--11 17--0 7 1 0   FN    JFO H W CFLGC QB9
266   0  150--1 0 14 0--17 17--0 7 1 0   FO    JZA H W CCE
                                         *
                                         *
                                         *      WRITE ROUTINE
267   1  113--0 1  0 3--17 13--0 2 0 6   IU    JFD DAC=VDC*0&B OMSRS
270   1  112--1 1  0 3--17 17--0 2 0 6   FC    JFD DAC=VDC*0&B
271   0    1--1 1  0 3--17 17--0 7 1 0   GF    JGG H
272   0    2--0 1 14 2--17  7--0 4 0 1   GG    JGI H DAC=SCAN&B OMAR SCE
273   0    1--0 1 14 2--17  7--0 7 0 0   GH    JGI H DB=AC OMAR SCE
274   0    1--1 1 17 3--17 17--0 1 1 2   GI    JGJ H DAC=SOFR-1
275   0    1--1 1  0 3--17  4--1 1 1 1   GJ    JGK H DAC=SCAN-AC ITSTA
276   1    1--0 1  0 3-- 4  4--0 7 0 0   GK    JGL DB=AC OMAMP QFLGTB
277   0    1--1 1 14 0--17  1--0 5 1 5   GL    JGM H DT=B IMEM CCE
300   0    2--1 1  0 3--17 17--0 4 0 5   GM    JGN H DAC=T&B
301   0   72--1 1 11 0--17 17--0 4 1 1   GE    JIR H DAC=SCAN CFLGB
302   1    1--1 1  0 3--12 17--0 4 0 6   GN    JGO DAC=VDC&B QB10
303   1    1--1 1 10 3-- 2 17--0 2 1 5   GO    JGP DAC=T*1023 QB2
304   1    2--1 1  0 3--17 17--0 7 1 0   GP    JGR
305   1    1--1 1 14 3--17 17--0 3 1 5   GQ    JGR DAC=T/3072
306   0    2--1 1  0 3--17 17--0 5 0 5   GR    JGS H DT=AC
307   0   27--1 1  0 3--17 17--0 5 0 5   HL    JHN H DT=AC
310   1    1--1 1  0 3--17 17--0 4 0 6   GS    JGT DAC=VDC&B
311   0    1--1 1  0 3-- 1 17--0 4 1 5   GT    JGU H DAC=T QB1
312   0    2--1 1  0 3--17 17--1 1 1 4   GU    JGV H DAC=POSPK-AC
313   1   55--1 1 17 3--17 17--0 0 1 1   IP    JIQ DAC=SCAN+1
314   1    2--1 1  0 3--17 17--0 4 0 6   GV    JGW DAC=VDC&B
315   1   11--1 1  0 3--16 17--0 7 1 0   HD    JHE QPOS
316   1    1--0 1  0 3-- 0  3--0 4 0 0   GW    JGX DAC=SC&B OMDR QB0
317   0    1--1 1 11 3--17 17--0 0 1 1   GX    JGY H DAC=SCAN+1024
320   0    2--0 0 14 2--17  7--0 4 0 1   GY    JHA H W DAC=SCAN&B OMAR SCE
321   0    1--0 0 14 2--17  7--0 7 0 0   GZ    JHA H W DB=AC OMAR SCE
322   0    1--1 0  0 3--17 17--0 7 1 0   HA    JHB H W
323   1    1--1 0 12 3--17 17--0 3 0 6   HB    JHC W DAC=VDC/2047&B
324   1  167--1 0 14 0--11 17--0 5 0 5   HC    JIP W CCE DNEGPK=AC QB9
325   0  142--1 1  0 3-- 3 17--0 7 1 0   IT    JIU H QFLGTA
326   0    1--0 1  0 3--17  3--0 4 0 5   HE    JHG H DAC=T&B OMDR
327   0    2--0 0 14 2--17  7--0 4 0 1   HG    JHH H W DAC=SCAN&B OMAR SCE
330   0  177--0 1  0 3--17  3--0 4 0 4   HF    JHG H DAC=POSPK&B OMDR
331   0    1--1 0 12 3--17 17--0 3 0 6   HH    JHI H W DAC=VDC/2047&B
332   0    1--1 0  0 3-- 0 17--0 5 0 5   HI    JHJ W DNEGPK=AC QB0 H
333   1    1--1 0 14 0--17 17--0 4 0 6   HJ    JIN W DAC=VDC&B CCE
334   1  157--1 1  0 3--11 17--0 7 1 0   IN    JIP QB9
335   0  157--1 1  0 3--17 17--0 7 1 0   GC    JGV H
336   1    1--1 1  0 3--17 17--0 4 0 6   HN    JHO DAC=VDC&B
337   1    1--1 1  0 3-- 1 17--0 4 1 5   HO    JHP DAC=T QB1
340   0    1--1 1  0 3--17 17--1 1 1 0   HP    JHQ H DAC=SC-AC
341   0    2--1 1  0 3--17 17--0 4 1 5   HQ    JHR H DAC=T
342   0   14--1 1  0 3--17 17--0 5 0 0   IB    JIC H DSC=AC
343   1    1--1 1  0 3--17 17--1 1 1 4   HR    JHS DAC=POSPK-AC
344   1    1--1 1  0 3--16 17--0 7 1 0   HS    JHT QPOS
345   1    1--0 1  0 3--17  3--0 4 0 5   HT    JHV DAC=T&B OMDR
346   0    2--1 1 11 3--17 17--0 0 1 1   HV    JHW H DAC=SCAN+1024
347   1  177--0 1  0 3--17  3--0 4 0 4   HU    JHV DAC=POSPK&B OMDR
350   0    1--0 0 14 2--17  7--0 7 0 0   HW    JHX H W DB=AC OMAR SCE
351   0    1--1 0 12 3--17 17--0 3 0 6   HX    JHY H W DAC=VDC/2047&B
352   0    1--1 0  0 3-- 0 17--0 5 0 5   HY    JHZ H W DNEGPK=AC QB0
```

```
353    1    1==1 0 14 0==17 17==0 4 0 6    HZ     JIO W DAC=VDC&B CCE
354    1 137==1 1  0 3==11 17==0 7 1 0    IO     JIP QB9
355    0 143==0 1  0 3==17  3==0 4 0 0    IA     JGY H DAC=SC&B OMDR
356    0    1==0 1 14 2==12  7==0 4 0 1    IC     JID H DAC=SCAN&B OMAR SCE QB10
357    0    1==1 1  0 3==17 17==0 4 0 6    ID     JIE H DAC=VDC&B
360    0    2==1 1 10 3== 0 17==0 2 1 0    IE     JIF H DAC=SC*1023 QB0
361    0    1==1 1 14 3== 0 17==0 3 1 0    IE1    JIF H DAC=SC/3072 QB0
362    1    1==1 1  0 3==17 17==0 5 0 4    IF     JIJ DPOSPK=AC
363    0    4==1 1 14 0==17  1==0 5 1 5    IJ     JIM H DT=B IMEM CCE
364    0 134==0 1 14 0==17  3==0 4 0 4    IH     JGY H DAC=POSPK&B OMDR CCE
365    1    1==1 1  0 3==12 17==0 7 1 0    IK     JIL QB10
366    1 116==1 1 10 3==17 17==0 2 1 5    IL     JGP DAC=T*1023
367    1 176==1 1  0 3==17 17==0 4 0 5    IM     JIK DAC=T&B
370    0    3==1 1  0 3==17 17==0 5 0 1    IQ     JIR H DSCAN=AC
371    1    1==1 1  0 3==17 17==0 5 0 1    XB     JXC DSCAN=AC
372    0    1==1 1 17 3==17 17==0 1 1 1    XC     JIR H DAC=SCAN-1
373    0    1==1 1  0 3==17 17==1 1 1 3    IR     JIS H DAC=MKR-AC
374    0 131==1 1  0 3==16  4==0 7 1 0    IS     JIT H ITSTA QPOS
                                          *
375    0   54==1 1  0 3== 0 17==0 7 1 0    XA     JDJ H QB0
                                          *
                                          *
                                          *
                                          *END OF MAIN PROGRAM***************************************
                                          *
                                          *
                                          *
                                          *
                                          *START OF  INTERRUPT PROGRAM***************************
                                          *
                                          *
                                          *
                                          *
                                                 ADRS 256                                  \DISPLAY BLOCK
                                          *
400    1    1==1 1 14 0==17 17==0 5 0 6    REFCTL DSAVEA=AC CCE                             \REFRESH CONTROL
401    1    1==1 1  0 3==17  3==0 2 1 0           DAC=SCR*0 ITSTB
402    1    1==1 1  5 0== 2 17==0 5 0 0           DSCR=AC CLLGBLANK QB2
403    1    1==1 1  0 2==17  3==0 6 1 0           DAC=%SCR SLROMEN ITSTB
404    1    2==0 1 16 0== 5 11==0 5 0 5           J+2 DMA=AC CDOTEN QB5 ORSTO               \FS MODE ENABLED
405    1    2==1 1 16 0== 0 17==0 5 0 5           J+2 DMA=AC CDOTEN QB0                     \FS MODE OFF
406    1   12==1 1  2 0==17  2==0 7 1 0           JIFS IRTN CBLINK                          \INITIATE FAST SCAN
407    1    1==1 1  3 0==17  2==0 7 1 0           IRTN CFS                                  \TIMER DONE?
410    0   55==0 1  2 0==17 15==0 4 1 6           JCORT DAC=SAVEA ODRTIMER H CBLINK         \YES START DISP REF
411    0 167==1 1  2 0==17 17==0 4 1 6           JREFCTL DAC=SAVEA H CBLINK                \NO WAIT FOR TIMER
412    1    1==1 1  0 3==17 17==0 5 0 6    FSTSCN DSAVEA=AC
413    1    1==1 1  0 3==17  3==0 5 1 7           ITSTB DCHR=B
414    1    2==1 1  6 3== 2 17==0 2 1 7           J+2 DAC=CHR*97 QB2
415    1    2==1 1  0 3==17  2==0 7 1 0           J+2 IRTN                                  \1:FSEN 2,3:AC=0
416    1 177==1 1  0 3==14 17==0 2 1 7           J-1 DAC=CHR*0 QZERO                       \1:FS DISB 2,3:AC#0
417    0   46==0 1  3 0==17 15==0 4 1 6           JCORT CFS ODRTIMER DAC=SAVEA H            \AC=0 REF DISPLAY
420    0 172==1 1  3 2==17 17==0 4 1 6    IFS    JFSTSCN H DAC=SAVEA SFS                   \GO TO FAST SCAN
421    0 157==1 1  0 3==17 17==0 4 1 6           JREFCTL H DAC=SAVEA                       \WAIT FOR RETRACE
                                          *
422    1    1==1 1  1 0==17 17==0 5 0 6    GRAPH  DSAVEA=AC CCHAR                           \BEGIN GRAPH MODE
423    1    2==1 1 12 3==17 17==0 2 1 0           J+2 DAC=SCR*2047                          \POSITIVE DATA
424    1    1==1 1  0 3==17 17==0 4 1 0           DAC=SCR                                   \NEGATIVE DATA
425    1    1==1 1  0 3==17 17==1 1 1 3           DAC=THRESH-AC                             \COMPARE DATA
426    1    1==1 1 17 3==16 17==0 0 1 5           DAC=MA+1 QPOS                             \        TO THRESH
427    1    1==0 1  0 3==17  7==0 5 0 5           DMA=AC OMAR
430    1    2==1 1  0 3==17 17==0 4 0 0           J+2 DAC=SCR&B                             \DATA>THRESH
431    1    1==1 1  0 3==17 17==0 4 0 3           DAC=THRESH&B                              \DATA>=THRESH
432    1    1==1 1  0 3==12 17==0 5 0 0           DSCR=AC QB10
433    1    1==1 1 13 3==17  3==0 2 1 0           DAC=SCR*2048 ITSTB
434    1    2==0 1  0 3== 4  2==0 4 0 0           J+2 DAC=SCR&B OLGY QB4                    \POS DATA TO Y LG
435    1    1==0 1  0 3== 4  2==0 5 0 0           DSCR=AC OLGY QB4                          \ZERO TO Y LINE GEN
436    1    1==1 1 14 2==13 17==0 4 0 7           DAC=DELTAY&B SCE QB11
437    1    2==1 1 10 3==12 17==0 2 1 2           J+2 DAC=Y*1023 QB10
440    1    2==1 1 10 3==17 17==0 2 1 2           J+2 DAC=Y*1023                            \FIRST PT
441    1    5==1 1  5 2==17 17==1 1 1 0           JOLDDY DAC=SCR-AC SLLGBLANK               \BLANK BIT OFF
442    1    2==1 1  5 0==17 17==1 1 1 0           J+2 DAC=SCR-AC CLLGBLANK                  \BLANK BIT SET
443    1    1==1 1  5 0==17 17==1 1 1 0           DAC=SCR-AC CLLGBLANK                      \BLANK BIT SET
444    1    4==1 1  0 3==17 17==0 5 0 7           J+4 DDELTAY=AC
445    1    3==1 1  0 3==17 17==0 5 0 7           J+3 DDELTAY=AC
446    1    3==1 1  0 3==16 17==0 5 0 7    OLDDY  J+3 DDELTAY=AC QPOS                       \OLD DELTAY>=0
447    1    1==1 1  0 3==16 17==0 5 0 7           DDELTAY=AC QPOS                           \OLD DELTAY<0
450    1    3==1 1 17 3==17 17==0 0 1 1           J+3 DAC=X+1
451    1    1==1 1 17 3==17 17==0 0 1 1           DAC=X+1
452    1    3==0 1 16 2==17  1==0 5 0 1           J+3 DX=AC OLGX SDOTEN                     \DELTAY SIGN CHANGED
453    1    2==0 1 16 0==17  1==0 5 0 1           J+2 DX=AC OLGX CDOTEN                     \DYSGN UNCHGD OR BLNK
454    1    1==0 1 16 2==17  1==0 5 0 1           DX=AC OLGX     SDOTEN                     \DELTAY SIGN CHANGED
455    1    1==1 1  0 3==17 17==0 4 1 0           DAC=SCR
456    1    1==1 1 14 0==17  1==0 5 1 0           IMEM DSCR=B CCE                           \READ NEXT MEM WORD
457    1    1==1 1  7 0==13 17==0 5 0 2           DY=AC QB11 CFSTPT                         \CLEAR FIRST PT FF
460    1    1==1 1  0 3==17 17==0 4 0 0           DAC=SCR&B
461    1    1==1 1  0 3==12 17==0 7 1 0           QB10
462    1   37==1 1  0 3==17  2==0 4 0 0    TOGRPH JGRLINK IRTN DAC=SCR&B
                                          *
463    0 115==1 1  0 3==17 17==0 4 1 6    RCLINK JREFCTL DAC=SAVEA H                       \GO TO REF CONTROL
464    0 114==1 1  0 3==17 17==0 4 1 6           JREFCTL H DAC=SAVEA                       \GO TO REF CONTROL
                                          *
465    1    1==1 1  1 0==17 17==0 5 0 6    CORT   DSAVEA=AC CCHAR                           \CONTROL OR THRESH
466    1    1==1 1  5 0==17 17==0 4 0 0           DAC=SCR&B CLLGBLANK
467    1    1==1 1  3 0==11 17==1 0 0 0           DAC=SCR+AC&B QB9 CFS
470    1    1==1 1  0 3== 5 17==1 0 1 0           DAC=SCR+AC QB5
471    1    2==1 1 10 3==17 17==0 3 1 5           J+2 DAC=MA/1023
472    1   14==1 1  0 3==17 17==1 0 1 0           JNEWTH DAC=SCR+AC                         \GO TO NEW THRESHOLD
473    1    2==1 1  4 0==17 17==0 4 0 0           J+2 DAC=SCR&B CBRIGHT                     \BRIGHT OFF
474    1 177==1 1  0 3==17 17==0 5 0 5           J-1 DMA=AC                                \SKIP PAGE
475    1    1==1 1 17 3== 3 17==0 0 1 5           DAC=MA+1 QB3
476    1    1==0 1 14 2==17  7==0 5 0 5           DMA=AC OMAR SCE
477    1    2==1 1  6 0==17 17==0 4 0 0           J+2 DAC=SCR&B CDIM                        \DIM OFF
500    1    1==1 1  6 2==17 17==0 4 0 0           DAC=SCR&B SDIM                            \DIM ON
501    1    1==1 1 16 0== 4 17==0 5 0 4           DDC=AC CDOTEN QB4
```

```
502  1   1--0 1  0 3--17  5--0 2 0 4          DAC=DC*0&B OLGEXP                    \EXPAND BITS TO LG
503  1   2--1 1  7 2-- 7 17--0 7 1 0          J+2 QB7 SFSTPT                       \SET FIRST PT FF
504  1   1--0 1  7 2-- 7  1--0 5 0 1          DX=AC OLGX QB7 SFSTPT                \CLEAR X POSITION
505  1  20--1 1 14 0--17  1--0 5 1 0          JDCMODE IMEM DSCR=B CCE              \READ NEXT MEM WORD
506  1   2--1 1  0 3--17 17--0 5 0 3   NEWTH  J+2 DTHRESH=AC                       \NEW THRESHOLD
507  1   1--1 1  0 3--17 17--0 5 0 3          DTHRESH=AC
510  1   1--1 1 17 3--12 17--0 0 1 5          DAC=MA+1 QB10
511  1   1--0 1 14 2--17  7--0 5 0 5          DMA=AC OMAR SCE
512  1   2--1 1 12 3--17 17--0 2 1 3          J+2 DAC=THRESH*2047                  \POSITIVE THRESH
513  1   1--1 1  0 3--17 17--0 4 1 3          DAC=THRESH                           \NEGATIVE THRESH
514  1   1--1 1 16 0--17 17--0 5 0 3          DTHRESH=AC CDOTEN                    \EXTEND SIGN
515  1   1--1 1  0 3--17 17--0 7 1 0          J+1
516  1   7--1 1 14 0--17  1--0 5 1 0          JDCMODE IMEM DSCR=B CCE              \READ NEXT MEM WORD
517  1   3--1 1  0 3--17  2--0 7 1 0   CLNEXT JCLLINK IRTN
520  1   3--1 1  0 3--17  2--0 4 0 4          J+3 DAC=DC&B IRTN
521  0 101--1 1  0 3--12 17--0 4 1 6   GRLINK JGRAPH H DAC=SAVEA QB10              \NEXT: GRAPH PT
522  0 143--1 1  0 3--17 17--0 4 1 6   CLLINK JCORT H DAC=SAVEA                    \NEXT: CNTL WORD
523  0 142--1 1  0 3--17 17--0 4 1 6          JCORT H DAC=SAVEA
524  0  62--1 1  0 3-- 3 17--0 4 1 6          JJUMP H DAC=SAVEA QB3                \NEXT: JUMP
525  1   2--0 1  0 3--13 14--0 4 0 4   DCMODE J+2 DAC=DC&B QB11 OCLRSA
526  1   1--0 1  4 2--13 14--0 4 0 4          DAC=DC&B QB11 SBRIGHT OCLRSA          \BRIGHT ON
527  1   1--0 1  0 0-- 2  7--0 4 0 0          DAC=SCR&B QB2 OMAR CLROMEN           \NEXT MAY BE A CHAR
530  1   2--1 1  0 3--12 17--0 4 0 4          J+2 DAC=DC&B QB10
531  1   1--1 1  0 3--17 17--0 4 0 4          DAC=DC&B
532  1   2--1 1  0 3-- 1 17--0 2 0 4          J+2 DAC=DC*0&B QB1
533  1 130--1 1  0 2--17  2--0 7 1 0          JRCLINK IRTN SLROMEN                 \GO TO REF CONT LINK
534  1   2--1 1  0 3-- 0 17--0 7 1 0          J+2 QB0
535  1 162--1 1  0 2-- 0 17--0 7 1 0          JCLNEXT QB0 SLROMEN                  \NEXT: CORT OR JUMP
536  1   4--1 1  0 3--17 17--0 5 0 7          J+4 DDELTAY=AC
537  1   1--1 1  0 2--17  2--0 4 0 4          DAC=DC&B SLROMEN IRTN
540  0  11--1 1  0 3--17 17--0 4 1 6          JVECTOR H DAC=SAVEA                  \GO TO VECTOR
541  0  45--1 1  0 3-- 3 17--0 4 1 6          JJUMP H DAC=SAVEA QB3                \GO TO JUMP
542  1   2--1 1 17 3--17 17--0 1 1 1          J+2 DAC=X-1
543  1  36--1 1  0 2--17  1--0 5 1 7          JTOCHR1 IMEM DCHR=B SLROMEN          \READ 1ST STROKE
544  1 116--1 1  0 2--17 17--0 5 0 1          JTOGRPH DX=AC SLROMEN                \NO X INCR ON 1ST PT
                                       *
545  0   4--1 1  0 3--17 17--0 4 1 6   VLINK  JVECTOR H DAC=SAVEA                  \GO TO VECTOR
546  0 117--1 1  0 3--17 17--0 4 1 6   FROMSC JCORT H DAC=SAVEA                    \GO TO CORT
547  0  54--1 1  0 3--17 17--0 4 1 6   SCLINK JSTCNTL H DAC=SAVEA                  \GO TO: SKIP TO CNTL
550  0  53--1 1  0 3--17 17--0 4 1 6          JSTCNTL H DAC=SAVEA                  \GO TO: SKIP TO CNTL
                                       *
551  1   1--1 1  1 0--17 17--0 5 0 6   VECTOR DSAVEA=AC CCHAR                      \VECTOR MODE
552  1   1--1 1 17 3--17 17--0 0 1 5          DAC=MA+1
553  1   1--0 1 14 2--17  7--0 5 0 5          DMA=AC OMAR SCE
554  1   1--1 1  0 3--17 17--0 4 0 0          DAC=SCR&B
555  1   1--1 1 17 3--13 17--0 0 1 5          DAC=MA+1 QB11
556  1   1--0 1  0 3--17  7--0 5 0 5          DMA=AC OMAR
557  1   3--1 1  0 3--17 17--0 4 0 0          J+3 DAC=SCR&B                        \ABSOLUTE VECTOR
560  1   1--1 1  0 3--17 17--0 4 1 1          DAC=X                                \INCREMENTAL VECTOR
561  1   1--1 1  0 3--17 17--1 0 0 0          DAC=SCR+AC&B
562  1   1--0 1 16 0--13  1--0 5 0 1          DX=AC OLGX QB11 CDOTEN               \SEND X TO LG
563  1   1--1 1 14 0--17  1--0 5 1 0          IMEM DSCR=B CCE
564  1   3--1 1 14 2--13 17--0 7 1 0          J+3 SCE QB11                         \ABSOLUTE VECTOR
565  1   1--1 1 14 2--13 17--0 4 1 2          DAC=Y QB11 SCE                       \INCREMENTAL VECTOR
566  1   2--1 1  0 3--17 17--1 0 0 0          J+2 DAC=SCR+AC&B
567  1   1--1 1  0 3--17 17--0 4 0 0          J+1 DAC=SCR&B
570  1   2--0 1  5 2--12  2--0 5 0 2          J+2 DY=AC OLGY SLLGBLANK QB10        \Y TO LG & UNBLANK
571  1   1--0 1  5 0--17  2--0 5 0 2          DY=AC OLGY CLLGBLANK                 \Y TO LG & BLANK
572  1   1--1 1 17 3--17 17--0 1 1 5          DAC=MA-1
573  1   2--1 1 14 0--17  1--0 5 1 0          J+2 IMEM DSCR=B CCE
574  1 152--1 1 14 0--17  2--0 5 0 5          JFROMSC DMA=AC IRTN CCE              \NEXT: CONTROL WORD
575  1   1--1 1  0 3--13 17--0 7 1 0          QB11
576  1   1--1 1  0 3--17 17--0 4 0 0          DAC=SCR&B
577  1   1--1 1  0 3--12 17--0 7 1 0          QB10
600  1 145--1 1  0 3--17  2--0 7 1 0          JVLINK IRTN
                                       *
601  1  50--1 1  3 3--17 17--0 2 1 7   TOCHR1 JTOCHR2 DAC=CHR*15                   \GOING TO CHAR MODE
                                       *
602  1   3--1 1 17 3--11 17--0 1 1 5   SCCORT J+3 DAC=MA-1 QB9
603  1   1--1 1  0 3--11 17--0 4 1 5   CTLTST DAC=MA QB9
604  1 143--1 1  0 3--17  2--0 7 1 0          JSCLINK IRTN                         \GO TO: SKIP TO CNTL
605  1 141--1 1  0 3--17  2--0 5 0 5          JFROMSC IRTN DMA=AC
                                       *
606  1   3--1 1  0 3--17 17--0 5 0 6   JUMP   JSTC1 DSAVEA=AC                      \JUMP ROUTINES
607  1  10--1 1  0 3--17 17--0 4 1 5   JSB    JSAVERA DAC=MA
610  1  15--0 1 14 2--17  7--0 5 0 5   STC2   JSTC3 DMA=AC OMAR SCE
611  1 177--1 1  0 3--17 17--0 4 1 5   STC1   J-1 DAC=MA
612  1   1--1 1  0 3--17 17--0 4 0 4          DAC=DC&B
613  1   1--1 1  0 3-- 7 17--0 4 0 4          DAC=DC&B QB7
614  1   1--1 1  0 3-- 6 17--0 7 1 0          QB6
615  1   3--1 1  2 3--17 17--0 1 1 3          JJMP DAC=THRESH-4
616  1 171--1 1 17 3--17 17--0 0 1 7          JJSB DAC=RA+1
617  1   1--1 1  0 3--17 17--0 5 0 7   SAVERA DRA=AC                               \SAVE RTN ADRS
620  1 170--1 1  0 3--17 17--0 4 1 0   JMP    JSTC2 DAC=SCR
621  1   1--1 1  0 3--14 17--0 5 0 3   DSZ    DTHRESH=AC QZERO
622  1 166--1 1  1 3--17 17--0 0 1 5          JSTC2 DAC=MA+2
623  1   1--1 1  0 3--17 17--0 5 0 6   STCNTL DSAVEA=AC
624  1 164--1 1 17 3--17 17--0 0 1 5          JSTC2 DAC=MA+1
625  1   1--1 1  0 3--17 17--0 7 1 0   STC3   J+1
626  1   1--1 1  5 0--17 17--0 7 1 0          CLLGBLANK                            \BLANK
627  1   1--1 1 17 3--17 17--0 0 1 5          DAC=MA+1
630  1   1--1 1 14 0--17  1--0 5 1 0          IMEM DSCR=B CCE                      \READ NEXT WORD
631  1   1--0 1 14 2--13  7--0 5 0 5          DMA=AC OMAR SCE QB11
632  1   1--1 1 16 0--17 17--0 4 0 0          DAC=SCR&B CDOTEN                     \DOT OFF
633  1   2--1 1  0 3--12 17--0 7 1 0          J+2 QB10
634  1   1--1 1  0 3--17 17--0 7 1 0          J+1
635  1   1--1 1 17 3--17 17--0 0 1 5          DAC=MA+1
636  1   2--1 1 14 0--17  1--0 5 1 0          J+2 IMEM DSCR=B CCE                  \READ NEXT WORD
637  1 143--1 1 14 0--17 17--0 4 0 0          JSCCORT DAC=SCR&B CCE                \MAY BE A CNTL WORD
640  1   1--0 1 14 2--13  7--0 5 0 5          DMA=AC OMAR SCE QB11
641  1   1--1 1  0 3--17 17--0 4 0 0          DAC=SCR&B
642  1   2--1 1  0 3--12 17--0 7 1 0          J+2 QB10
643  1   1--1 1  0 3--17 17--0 7 1 0          J+1
644  1   1--1 1  0 3--17 17--0 7 1 0          J+1
645  1   2--1 1 14 0--17  1--0 5 1 0          J+2 IMEM DSCR=B CCE                  \READ NEXT WORD
```

```
646   1 134--1 1 14 0--17 17--0 4 0 0          JSCCORT DAC=SCR&B CCE              \MAY BE A CNTL WORD
647   1   1--1 1  0 3--13 17--0 4 0 0          DAC=SCR&B QB11
650   1 133--1 1  0 3--12 17--0 4 0 0          JCTLTST DAC=SCR&B QB10
                                        *
651   1  45--1 1  0 3--14 17--0 4 1 1   TOCHR2 JTOCHR3 DAC=X QZERO                \GOING TO CHAR MODE
                                        *
652   1   1--0 1  0 3--17 12--0 5 0 6   CHARAC DSAVEA=AC OINCHSA                  \CHARACTER MODE
653   1   1--0 1  0 0--17  7--0 4 0 0          DAC=SCR&B OMAR CLROMEN
654   1   1--1 1  0 3--17 17--0 4 0 7          DAC=CHR&B
655   1   1--1 1  1 0-- 7 17--0 7 1 0          CCHAR QB7
656   1   1--1 1 17 3--17 17--0 0 1 5          DAC=MA+1
657   1   2--1 1  5 2--17 17--0 7 1 0          J+2 SLLGBLANK                      \UNBLANK STROKE
660   1   1--1 1  5 0--17 17--0 7 1 0          CLLGBLANK                          \BLANK STROKE
661   1   1--1 1  0 2--17  1--0 5 1 4          IMEM DDC=B SLROMEN                 \READ NEXT STROKE
662   1   1--0 1 14 2--17  7--0 5 0 5          DMA=AC OMAR SCE
663   1   1--1 1  7 3--17 17--0 2 1 4          DAC=DC*255
664   1   1--0 1  0 3--14  1--0 4 0 1          DAC=X&B OLGX QZERO                 \X POSITION TO LG
665   1   1--0 1  1 2--17  0--0 4 0 7          DAC=CHR&B OLGCHAR SCHAR            \CHAR STROKE TO LG
666   1  14--0 1 16 0--17 14--0 7 1 0          JCHREND OCLRSA CDOTEN              \GO TO END OF CHAR
667   1   1--1 1 17 3--17  3--0 1 1 5          DAC=MA-1 ITSTB                     \CONTINUE CHAR
670   1   1--1 1 14 0--13 17--0 5 0 5          DMA=AC CCE QB11                    \RESTORE MEM ADRS
671   1   1--1 1 16 0--17 17--0 4 1 4          DAC=DC CDOTEN                      \DOT OFF
672   1  26--1 1  0 3--17  2--0 5 0 7          JGOCHAR DCHR=AC IRTN               \GO DO NEXT STROKE
673   1   1--0 1  0 3--17  7--0 5 0 0          DSCR=AC OMAR                       \LINK TO NXT STROKE
674   1   1--0 1  0 0--17 14--0 7 1 0          OCLRSA CLROMEN
675   1   1--1 1  0 3--17 17--0 7 1 0          J+1
676   1   1--1 1  0 3--17 17--0 7 1 0          J+1
677   1   1--1 1  0 3--17 17--0 7 1 0          J+1
700   1   1--1 1  0 3--17  2--0 4 1 6          DAC=SAVEA IRTN
701   0 151--1 1  0 2--17  1--0 5 1 7          JCHARAC H IMEM DCHR=B SLROMEN      \GO DO NXT STROKE
702   1   1--1 1 14 0--17  1--0 5 1 0   CHREND IMEM CCE DSCR=B                    \GET NXT CHAR CODE
703   1   1--0 1  0 0--13  7--0 4 0 0          DAC=SCR&B OMAR CLROMEN QB11
704   1   1--1 1 17 3--12 17--0 0 1 4          DAC=DC+1 QB10                      \RESTORE DC REG
705   1   3--1 1  0 3--17 17--0 5 0 4          J+3 DDC=AC
706   1   1--1 1  0 3--17 17--0 5 0 4          DDC=AC
707   1   3--1 1  0 3--17 17--0 7 1 0          J+3
710   1   2--1 1  0 3--17 17--0 7 1 0          J+2
711   1  66--1 1  0 2--17  2--0 7 1 0          JFROMCH IRTN SLROMEN               \GO TO CORT
712   1   1--1 1  0 3--17 17--0 7 1 0          J+1
713   1   1--1 1  0 2--17  1--0 5 1 7          IMEM DCHR=B SLROMEN                \GET 1ST STROKE
714   1   1--1 1  3 3--17 17--0 2 1 7          DAC=CHR*15
715   1   1--1 1  4 3--14 17--0 0 1 1          DAC=X+16 QZERO                     \X TO NXT CHR POSN
716   1   1--1 1  0 3--17  2--0 5 0 1   TOCHR3 DX=AC IRTN
717   0   2--1 1  0 3--17 17--0 4 1 6   CHLINK JSPCHAR H DAC=SAVEA                \GO TO SPEC CHAR
720   0 132--1 1  0 3--17 17--0 4 1 6   GOCHAR JCHARAC H DAC=SAVEA                \GO TO CHARACTER
                                        *
721   1   1--1 1  1 0--17 17--0 5 0 6   SPCHAR DSAVEA=AC CCHAR                    \SPEC CHAR MODE
722   1   1--1 1 17 3--17 17--0 0 1 5          DAC=MA+1
723   1   1--0 1 14 2--17  7--0 7 0 0          DB=AC SCE OMAR
724   1   1--1 1  0 3--17 17--0 4 0 7          DAC=CHR&B
725   1   1--0 1  0 3-- 7 14--0 4 0 7          DAC=CHR&B OCLRSA QB7
726   1   1--1 1 15 3-- 6 17--0 3 0 7          DAC=CHR/4032&B QB6
727   1  13--1 1  0 3-- 5 17--0 4 0 7          JCHR6A0 DAC=CHR&B QB5              \CHR(7)=0
730   1   1--1 1  0 3--17 17--1 3 1 5          DAC=MA/AC                          \CHR(7)=1
731   1   7--1 1 14 0--17  1--0 5 1 0          JFMFD IMEM DSCR=B CCE
732   1   1--1 1 14 0--17 17--1 1 1 5   SKIP   DAC=MA-AC CCE                      \SKIP 32 OR 64
733   1   1--0 1 14 2--17  7--0 5 0 5          DMA=AC OMAR SCE
734   1   1--1 1 17 3--17 17--0 1 1 5          DAC=MA-1
735   1   1--1 1  0 3--17 17--0 5 0 5          DMA=AC
736   1   1--1 1  0 3--17 17--0 7 1 0          J+1
737   1  16--1 1 14 0--17  1--0 5 1 0          JCHR5A1 IMEM CCE DSCR=B            \READ NEXT WORD
740   1   1--0 1  0 3--17  7--0 2 0 0   FMFD   DAC=SCR*0&B OMAR                   \CLEAR X AND Y POSN
741   1  21--0 1  0 0--13  2--0 5 0 2          JSCHARX DY=AC OLGY CLROMEN QB11
742   1  12--1 1 14 0-- 4  1--0 5 1 0   CHR6A0 JCHR5A0 IMEM DSCR=B CCE QB4        \CHR(6)=0
743   1   1--1 1 14 0-- 4  1--0 5 1 0          IMEM DSCR=B CCE QB4                \CHR(6)=1
744   1   5--0 1  0 0--17  7--0 4 0 0          JNBLINK DAC=SCR&B OMAR CLROMEN     \CHR(5)=0
745   1   1--0 1  0 0--17  7--0 4 0 0          DAC=SCR&B OMAR CLROMEN             \CHR(5)=1
746   1   2--1 1  5 3--13 17--0 0 1 2   VTAB   JSCHARY DAC=Y+32 QB11              \VERTICAL TAB
747   1   1--1 1  5 3--13 17--0 1 1 2   LNFD   DAC=Y-32 QB11                      \LINE FEED
750   1  13--0 1  0 3--17  2--0 5 0 2   SCHARY JSCHARD DY=AC OLGY                 \Y POSN TO LG
751   1   2--1 1  2 0--13 17--0 7 1 0   NBLINK JSCHARN CBLINK QB11                \BLINK OFF
752   1   1--1 1  2 2--13 17--0 7 1 0          JSCHARN SBLINK QB11                \BLINK ON
753   1  10--1 1  0 3--17 17--0 7 1 0   SCHARN JSCHARD
754   1   4--0 1  0 0--17  7--0 4 0 0   CHR5A0 JSPACE DAC=SCR&B OMAR CLROMEN      \CHR(5)=0
755   1   1--0 1  0 0--17  7--0 4 0 0   CHR5A1 DAC=SCR&B OMAR CLROMEN             \CHR(5)=1
756   1 175--1 1  0 3--13 17--0 7 1 0   NULL   JSCHARN QB11                       \NULL CHARACTER
757   1   3--1 1  0 3--13 17--0 2 1 0   CR     JSCHARX DAC=SCR*0 QB11             \CARRIAGE RETURN
760   1   2--1 1  4 3--13 17--0 0 1 1   SPACE  JSCHARX DAC=X+16 QB11              \SPACE
761   1   1--1 1  4 3--13 17--0 1 1 1   BS     JSCHARX DAC=X-16 QB11              \BACKSPACE
762   1   1--0 1  0 3--17  1--0 5 0 1   SCHARX DX=AC OLGX                         \X POSN TO LG
763   1   3--1 1 16 0--17 17--0 4 0 0   SCHARD J+3 DAC=SCR&B CDOTEN               \DOT OFF
764   1   1--1 1 16 0--17 17--0 7 1 0          CDOTEN                             \DOT OFF
765   1   2--1 1 17 3--17 17--0 0 1 5          J+2 DAC=MA+1
766   1   1--1 1 17 3--12 17--0 0 1 5          DAC=MA+1 QB10
767   1   1--1 1  0 2--17  1--0 5 1 7          IMEM DCHR=B SLROMEN                \GET NXT 1ST STRK
770   1   2--1 1  3 3--17 17--0 2 1 7          J+2 DAC=CHR*15
771   1   6--1 1  5 0--17  2--0 5 0 5          JFROMCH DMA=AC CLLGBLANK IRTN      \GO TO CORT
772   1   1--1 1 17 3--14 17--0 0 1 5          DAC=MA+1 QZERO
773   1 124--1 1  5 0--17  2--0 5 0 5          JCHLINK IRTN DMA=AC CLLGBLANK      \END OF SP CHAR
                                               ADRS 511
777   0  66--1 1  0 3--17 17--0 4 1 6   FROMCH JCORT H DAC=SAVEA                  \GO TO CORT
                                                END

NO ERRORS ???
```

| | | | | | | | |
|---|---|---|---|---|---|---|---|
| 0 | 0 | 1 | 17 | 1023 | 10 | 1024 | 11 |
| 1032 | 1 | 15 | 3 | 16 | 4 | 2 | 1 |
| 2047 | 12 | 2048 | 13 | 255 | 7 | 3072 | 14 |
| 32 | 5 | 4 | 2 | 4032 | 15 | 4095 | 16 |
| 8 | 2 | 97 | 6 | AA | 102 | AB | 35 |
| AC | 36 | AD | 40 | ADC | 0 | AE | 41 |
| AF | 43 | AG | 44 | AH | 46 | AI | 45 |
| AJ | 42 | AK | 47 | AM | 52 | AN | 53 |
| AO | 54 | AP | 121 | AQ | 120 | AS | 135 |

| | | | | | | | |
|---|---|---|---|---|---|---|---|
| AT | 151 | AU | 154 | AV | 155 | AW | 137 |
| AX | 161 | AY | 140 | AZ | 147 | B0 | 0 |
| B1 | 1 | B10 | 12 | B11 | 13 | B2 | 2 |
| B3 | 3 | B4 | 4 | B5 | 5 | B6 | 6 |
| B7 | 7 | B8 | 10 | B9 | 11 | BA | 141 |
| BB | 162 | BC | 143 | BD | 234 | BE | 144 |
| BF | 163 | BG | 146 | BH | 240 | BI | 150 |
| BJ | 145 | BK | 136 | BL | 37 | BLINK | 2 |
| BM | 32 | BN | 33 | BO | 31 | BP | 27 |
| BPCAD | 6 | BPCD | 7 | BPCO | 6 | BPCR | 0 |
| BQ | 30 | BR | 23 | BRIGHT | 4 | BS | 761 |
| BS1 | 24 | BT | 25 | BU | 26 | BV | 12 |
| BW | 13 | BX | 14 | BY | 15 | BZ | 16 |
| CA | 17 | CB | 20 | CC | 21 | CD | 6 |
| CE | 14 | CE1 | 206 | CF | 1 | CG | 7 |
| CH | 2 | CHAR | 1 | CHARAC | 652 | CHLINK | 717 |
| CHR | 7 | CHR5A0 | 754 | CHR5A1 | 755 | CHR6A0 | 742 |
| CHREND | 702 | CI | 10 | CJ | 3 | CK | 11 |
| CL | 4 | CLLINK | 522 | CLNEXT | 517 | CLRSA | 14 |
| CM | 5 | CN | 34 | CO | 22 | CORT | 465 |
| CP | 56 | CQ | 55 | CR | 757 | CRSEN | 17 |
| CS | 134 | CT | 153 | CTLTST | 603 | CU | 152 |
| CV | 241 | CW | 242 | CX | 244 | CY | 245 |
| CZ | 243 | DA | 247 | DB | 246 | DC | 4 |
| DC1 | 250 | DCMODE | 525 | DD | 251 | DE | 233 |
| DELTAY | 7 | DF | 167 | DI | 50 | DIM | 6 |
| DJ | 51 | DL | 252 | DM | 212 | DN | 156 |
| DN1 | 157 | DO | 257 | DOTEN | 16 | DP | 142 |
| DQ | 160 | DQ1 | 210 | DR | 207 | DRTIMER | 15 |
| DS | 213 | DSZ | 621 | DT | 211 | DU | 214 |
| DV | 215 | DW | 223 | DX | 260 | DY | 261 |
| DZ | 224 | EA | 65 | EB | 64 | EC | 66 |
| ED | 72 | EE | 67 | EF | 73 | EG | 71 |
| EH | 70 | EI | 74 | EJ | 75 | EK | 122 |
| EL | 100 | EM | 57 | EN | 103 | EO | 104 |
| EP | 106 | EQ | 107 | ER | 105 | ES | 114 |
| ET | 110 | EU | 115 | EV | 112 | EW | 116 |
| EX | 111 | EY | 117 | EZ | 113 | FA | 124 |
| FB | 133 | FC | 270 | FD | 202 | FE | 203 |
| FF | 164 | FG | 166 | FH | 165 | FI | 170 |
| FJ | 174 | FK | 172 | FL | 264 | FLGA | 10 |
| FLGB | 11 | FLGC | 12 | FLGTA | 3 | FLGTB | 4 |
| FLGTC | 6 | FM | 255 | FM1 | 256 | FMFD | 740 |
| FN | 265 | FO | 266 | FP | 171 | FQ | 176 |
| FR | 175 | FROMCH | 777 | FROMSC | 546 | FS | 3 |
| FS1 | 177 | FSTPT | 7 | FSTSCN | 412 | FT | 200 |
| FU | 262 | FV | 263 | FW | 201 | GB | 123 |
| GC | 335 | GD | 205 | GE | 301 | GF | 271 |
| GG | 272 | GH | 273 | GI | 274 | GJ | 275 |
| GK | 276 | GL | 277 | GM | 300 | GN | 302 |
| GO | 303 | GOCHAR | 720 | GP | 304 | GQ | 305 |
| GR | 306 | GRAPH | 422 | GRLINK | 521 | GS | 310 |
| GT | 311 | GU | 312 | GV | 314 | GW | 316 |
| GX | 317 | GY | 320 | GZ | 321 | HA | 322 |
| HB | 323 | HC | 324 | HD | 315 | HE | 326 |
| HF | 330 | HG | 327 | HH | 331 | HI | 332 |
| HJ | 333 | HK | 0 | HL | 307 | HN | 336 |
| HO | 337 | HOLD | 17 | HP | 340 | HQ | 341 |
| HR | 343 | HS | 344 | HSRS | 13 | HT | 345 |
| HU | 347 | HV | 346 | HW | 350 | HX | 351 |
| HY | 352 | HZ | 353 | IA | 355 | IB | 342 |
| IC | 356 | ID | 357 | IE | 360 | IE1 | 361 |
| IF | 362 | IFS | 420 | IH | 364 | IJ | 363 |
| IK | 365 | IL | 366 | IM | 367 | IN | 334 |
| INCRSA | 12 | IO | 354 | IP | 313 | IQ | 370 |
| IR | 373 | IS | 374 | IT | 325 | IU | 267 |
| IV | 237 | JA | 217 | JB | 216 | JC | 220 |
| JE | 221 | JF | 222 | JG | 225 | JH | 226 |
| JI | 231 | JJ | 232 | JK | 230 | JL | 227 |
| JM | 235 | JMP | 620 | JN | 131 | JO | 204 |
| JP | 125 | JQ | 127 | JR | 130 | JS | 126 |
| JSB | 607 | JT | 60 | JU | 61 | JUMP | 606 |
| JV | 63 | JW | 101 | JX | 62 | JY | 76 |
| JZ | 77 | LGCHAR | 0 | LGEXP | 5 | LGX | 1 |
| LGY | 2 | LLGBLANK | 5 | LNFD | 747 | LROMEN | 0 |
| MA | 5 | MAR | 7 | MDR | 3 | MEM | 1 |
| MKR | 3 | NBLINK | 751 | NEGPK | 5 | NEWTH | 506 |
| NULL | 756 | OLDDY | 446 | POS | 16 | POSPK | 4 |
| RA | 7 | RAMP | 4 | RCLINK | 463 | REF | 7 |
| REFCTL | 400 | RSTO | 11 | RTN | 2 | SAVEA | 6 |
| SAVERA | 617 | SC | 0 | SCAN | 1 | SCCORT | 602 |
| SCHARD | 763 | SCHARN | 753 | SCHARX | 762 | SCHARY | 750 |
| SCLINK | 547 | SCR | 0 | SELA | 13 | SELB | 15 |
| SKIP | 732 | SOFR | 2 | SPACE | 760 | SPCHAR | 721 |
| SRSEN | 16 | STC1 | 611 | STC2 | 610 | STC3 | 625 |
| STCHIL | 623 | STT | 10 | T | 5 | THRESH | 3 |
| TOCHR1 | 601 | TOCHR2 | 651 | TOCHR3 | 716 | TOGRPH | 462 |
| TS1A | 4 | TS1B | 3 | VDC | 6 | VECTOR | 551 |
| VLINK | 545 | VTAB | 746 | X | 1 | XA | 375 |
| XB | 371 | XC | 372 | XX | 173 | Y | 2 |
| ZA | 236 | ZB | 132 | ZD | 253 | ZE | 254 |
| ZERO | 14 | | | | | | |

KSPMAX=7 MSPMAX=42 NSPMAX=45 SSPMAX=1850 ASPMAX=0 BSPMAX=0
DSPMAX=401

ROM 1

| | | | | | | | | | | | | | | | |
|---|---|---|---|---|---|---|---|---|---|---|---|---|---|---|---|
| 2 | 1 | 1 | 201 | 201 | 27 | 173 | 1 | 201 | 175 | 174 | 173 | 173 | 205 | 204 | 203 |
| 202 | 201 | 12 | 367 | 170 | 371 | 372 | 374 | 375 | 376 | 1 | 176 | 202 | 201 | 2 | 173 |
| 1 | 3 | 201 | 203 | 1 | 170 | 1 | 1 | 125 | 201 | 167 | 201 | 244 | 57 | 377 | 224 |
| 1 | 1 | 14 | 216 | 206 | 201 | 201 | 201 | 232 | 377 | 201 | 201 | 201 | 225 | 201 | 201 |
| 22 | 163 | 133 | 201 | 1 | 207 | 201 | 1 | 1 | 202 | 377 | 17 | 201 | 201 | 201 | 205 |
| 215 | 33 | 1 | 262 | 30 | 204 | 131 | 201 | 176 | 176 | 124 | 267 | 16 | 3 | 120 | 1 |

| | | | | | | | | | | | | | | | |
|---|---|---|---|---|---|---|---|---|---|---|---|---|---|---|---|
| 1 | 2 | 15 | 1 | 2 | 111 | 370 | 313 | 106 | 3 | 63 | 327 | 1 | 4 | 1 | 201 |
| 27 | 166 | 251 | 365 | 1 | 202 | 51 | 1 | 203 | 204 | 206 | 377 | 174 | 2 | 173 | 1 |
| 335 | 334 | 162 | 161 | 121 | 64 | 232 | 2 | 1 | 12 | 201 | 1 | 204 | 1 | 204 | 202 |
| 15 | 14 | 13 | 1 | 1 | 4 | 201 | 6 | 5 | 371 | 376 | 177 | 127 | 150 | 1 | 145 |
| 1 | 203 | 201 | 204 | 4 | 3 | 2 | 376 | 1 | 1 | 1 | 201 | 2 | 10 | 7 | 201 |
| 201 | 201 | 2 | 1 | 171 | 1 | 150 | 313 | 312 | 1 | 2 | 1 | 1 | 1 | 201 | 1 |
| 2 | 72 | 201 | 201 | 202 | 201 | 2 | 27 | 201 | 1 | 2 | 255 | 202 | 211 | 201 | 1 |
| 2 | 1 | 1 | 201 | 367 | 142 | 1 | 2 | 177 | 1 | 1 | 201 | 357 | 157 | 201 | 201 |
| 1 | 2 | 14 | 201 | 201 | 201 | 2 | 377 | 1 | 1 | 1 | 201 | 337 | 143 | 1 | 1 |
| 2 | 1 | 201 | 4 | 134 | 201 | 316 | 376 | 3 | 201 | 1 | 1 | 131 | 54 | 377 | 377 |
| 201 | 201 | 201 | 201 | 202 | 202 | 212 | 201 | 55 | 167 | 201 | 201 | 202 | 202 | 377 | 46 |
| 172 | 157 | 201 | 202 | 201 | 201 | 201 | 201 | 202 | 201 | 201 | 201 | 202 | 201 | 201 | 202 |
| 202 | 205 | 202 | 201 | 204 | 203 | 203 | 201 | 203 | 201 | 203 | 202 | 201 | 201 | 201 | 201 |
| 201 | 201 | 237 | 115 | 114 | 201 | 201 | 201 | 201 | 202 | 214 | 202 | 377 | 201 | 201 | 202 |
| 201 | 201 | 201 | 202 | 201 | 220 | 202 | 201 | 201 | 201 | 202 | 201 | 201 | 201 | 207 | 203 |
| 203 | 101 | 143 | 142 | 62 | 202 | 201 | 201 | 202 | 201 | 202 | 330 | 202 | 362 | 204 | 201 |
| 11 | 45 | 202 | 236 | 316 | 4 | 117 | 54 | 53 | 201 | 201 | 201 | 201 | 201 | 201 | 203 |
| 201 | 201 | 201 | 201 | 203 | 201 | 202 | 201 | 202 | 201 | 201 | 202 | 352 | 201 | 201 | 201 |
| 345 | 250 | 203 | 201 | 343 | 341 | 202 | 210 | 215 | 377 | 201 | 201 | 201 | 203 | 371 | 201 |
| 370 | 201 | 366 | 201 | 364 | 201 | 201 | 201 | 201 | 201 | 201 | 202 | 201 | 201 | 202 | 343 |
| 201 | 201 | 202 | 201 | 201 | 202 | 334 | 201 | 333 | 245 | 201 | 201 | 201 | 201 | 201 | 202 |
| 201 | 201 | 201 | 201 | 201 | 201 | 214 | 201 | 201 | 201 | 226 | 201 | 201 | 201 | 201 | 201 |
| 201 | 151 | 201 | 201 | 201 | 203 | 201 | 203 | 202 | 266 | 201 | 201 | 201 | 201 | 201 | 2 |
| 132 | 201 | 201 | 201 | 201 | 201 | 201 | 213 | 201 | 207 | 201 | 201 | 201 | 201 | 201 | 216 |
| 201 | 221 | 212 | 201 | 205 | 201 | 202 | 201 | 213 | 202 | 201 | 210 | 204 | 201 | 375 | 203 |
| 202 | 201 | 201 | 203 | 201 | 202 | 201 | 201 | 202 | 206 | 201 | 324 | 377 | 377 | 377 | 66 |

ROM 2

| | | | | | | | | | | | | | | | |
|---|---|---|---|---|---|---|---|---|---|---|---|---|---|---|---|
| 303 | 303 | 302 | 103 | 360 | 156 | 162 | 277 | 203 | 260 | 303 | 303 | 62 | 303 | 303 | 303 |
| 303 | 303 | 103 | 377 | 103 | 377 | 377 | 303 | 303 | 303 | 366 | 303 | 377 | 377 | 360 | 360 |
| 156 | 162 | 353 | 303 | 377 | 374 | 303 | 303 | 303 | 350 | 303 | 376 | 150 | 156 | 360 | 303 |
| 103 | 344 | 356 | 364 | 303 | 303 | 342 | 303 | 303 | 303 | 340 | 303 | 303 | 303 | 364 | 303 |
| 376 | 356 | 166 | 303 | 303 | 303 | 303 | 303 | 366 | 354 | 303 | 340 | 303 | 303 | 303 | 303 |
| 146 | 174 | 376 | 303 | 103 | 303 | 374 | 376 | 303 | 360 | 303 | 366 | 366 | 374 | 342 | 303 |
| 303 | 162 | 374 | 377 | 303 | 342 | 360 | 344 | 342 | 303 | 352 | 303 | 346 | 162 | 374 | 303 |
| 177 | 377 | 360 | 303 | 303 | 303 | 342 | 303 | 376 | 376 | 303 | 303 | 303 | 303 | 303 | 374 |
| 303 | 364 | 303 | 303 | 377 | 347 | 303 | 303 | 303 | 303 | 303 | 366 | 356 | 303 | 354 | 356 |
| 342 | 342 | 340 | 342 | 364 | 354 | 354 | 303 | 342 | 366 | 356 | 364 | 303 | 376 | 352 | 162 |
| 350 | 307 | 303 | 303 | 313 | 352 | 313 | 307 | 162 | 313 | 303 | 303 | 360 | 203 | 303 | 357 |
| 103 | 303 | 313 | 307 | 62 | 250 | 260 | 103 | 303 | 303 | 162 | 162 | 377 | 303 | 103 | 360 |
| 303 | 344 | 303 | 343 | 303 | 363 | 303 | 303 | 303 | 303 | 303 | 377 | 303 | 303 | 103 | 347 |
| 62 | 62 | 203 | 253 | 260 | 303 | 103 | 62 | 103 | 253 | 203 | 260 | 303 | 303 | 303 | 303 |
| 303 | 303 | 303 | 303 | 303 | 103 | 347 | 103 | 62 | 253 | 203 | 260 | 303 | 103 | 162 | 303 |
| 343 | 363 | 303 | 360 | 160 | 303 | 343 | 303 | 303 | 303 | 377 | 303 | 303 | 303 | 377 | 377 |
| 360 | 303 | 324 | 302 | 170 | 370 | 310 | 314 | 110 | 310 | 303 | 303 | 333 | 303 | 303 | 114 |
| 316 | 303 | 304 | 353 | 303 | 303 | 377 | 103 | 303 | 303 | 303 | 357 | 103 | 103 | 362 | 343 |
| 343 | 326 | 324 | 324 | 303 | 303 | 303 | 303 | 377 | 377 | 172 | 170 | 172 | 303 | 360 | 334 |
| 303 | 303 | 303 | 303 | 303 | 304 | 324 | 314 | 303 | 343 | 303 | 320 | 303 | 377 | 162 | 330 |
| 332 | 370 | 103 | 336 | 136 | 360 | 303 | 303 | 377 | 162 | 353 | 303 | 370 | 303 | 360 | 303 |
| 303 | 303 | 303 | 303 | 303 | 103 | 122 | 100 | 303 | 303 | 303 | 302 | 303 | 302 | 303 | 302 |
| 303 | 303 | 377 | 302 | 302 | 303 | 303 | 303 | 303 | 304 | 377 | 162 | 303 | 377 | 103 | 303 |
| 303 | 303 | 170 | 360 | 362 | 362 | 303 | 303 | 126 | 124 | 377 | 360 | 360 | 303 | 303 | 303 |
| 303 | 317 | 377 | 303 | 303 | 303 | 303 | 303 | 162 | 303 | 303 | 303 | 303 | 313 | 377 | 303 |
| 303 | 303 | 307 | 303 | 377 | 303 | 324 | 377 | 360 | 162 | 370 | 303 | 303 | 377 | 360 | 360 |
| 162 | 303 | 303 | 303 | 303 | 360 | 360 | 303 | 303 | 303 | 103 | 100 | 303 | 304 | 377 | 326 |
| 324 | 302 | 162 | 337 | 103 | 106 | 170 | 377 | 360 | 370 | 303 | 103 | 100 | 303 | 303 | 303 |
| 303 | 302 | 360 | 100 | 377 | 303 | 303 | 303 | 303 | 302 | 303 | 302 | 317 | 323 | 303 | 303 |
| 303 | 304 | 377 | 162 | 303 | 103 | 367 | 303 | 303 | 360 | 360 | 162 | 377 | 303 | 303 | 360 |
| 103 | 100 | 360 | 360 | 100 | 100 | 327 | 327 | 103 | 310 | 312 | 303 | 100 | 100 | 303 | 303 |
| 323 | 323 | 103 | 370 | 370 | 377 | 377 | 302 | 317 | 324 | 377 | 324 | 377 | 377 | 377 | 303 |

ROM 3

| | | | | | | | | | | | | | | | |
|---|---|---|---|---|---|---|---|---|---|---|---|---|---|---|---|
| 377 | 377 | 377 | 373 | 361 | 366 | 367 | 377 | 377 | 377 | 367 | 377 | 367 | 367 | 367 | 377 |
| 377 | 367 | 366 | 377 | 363 | 377 | 377 | 27 | 27 | 46 | 366 | 66 | 363 | 363 | 237 | 377 |
| 364 | 367 | 377 | 217 | 366 | 17 | 377 | 377 | 364 | 377 | 377 | 237 | 377 | 153 | 364 | 364 |
| 137 | 364 | 377 | 77 | 377 | 377 | 357 | 377 | 377 | 377 | 357 | 377 | 377 | 377 | 77 | 77 |
| 377 | 377 | 16 | 77 | 377 | 377 | 377 | 357 | 363 | 237 | 363 | 377 | 357 | 377 | 377 | 377 |
| 364 | 364 | 377 | 377 | 370 | 364 | 377 | 364 | 100 | 57 | 377 | 377 | 377 | 377 | 377 | 17 |
| 366 | 7 | 364 | 363 | 237 | 377 | 364 | 177 | 377 | 17 | 237 | 366 | 366 | 7 | 364 | 117 |
| 136 | 364 | 363 | 364 | 377 | 124 | 377 | 57 | 364 | 364 | 377 | 360 | 57 | 60 | 57 | 363 |
| 377 | 377 | 237 | 237 | 377 | 57 | 57 | 364 | 364 | 377 | 37 | 17 | 377 | 377 | 377 | 377 |
| 237 | 237 | 237 | 117 | 77 | 377 | 377 | 237 | 237 | 377 | 377 | 377 | 237 | 377 | 377 | 367 |
| 17 | 377 | 377 | 37 | 377 | 377 | 377 | 377 | 367 | 377 | 377 | 357 | 361 | 363 | 363 | 364 |
| 143 | 377 | 377 | 377 | 367 | 237 | 377 | 373 | 377 | 377 | 367 | 367 | 377 | 364 | 104 | 361 |
| 377 | 377 | 257 | 57 | 377 | 377 | 377 | 377 | 377 | 37 | 377 | 377 | 377 | 357 | 3 | 377 |
| 367 | 367 | 377 | 377 | 237 | 77 | 363 | 367 | 363 | 377 | 17 | 377 | 237 | 377 | 377 | 37 |
| 377 | 377 | 377 | 377 | 357 | 363 | 377 | 363 | 367 | 377 | 17 | 377 | 237 | 363 | 247 | 377 |
| 17 | 17 | 377 | 361 | 363 | 257 | 377 | 377 | 377 | 377 | 377 | 377 | 344 | 17 | 377 | 377 |
| 377 | 363 | 57 | 363 | 131 | 17 | 362 | 362 | 375 | 377 | 377 | 363 | 57 | 362 | 317 | 375 |
| 377 | 377 | 377 | 377 | 377 | 377 | 357 | 367 | 377 | 377 | 257 | 363 | 102 | 102 | 277 | 257 |
| 377 | 377 | 377 | 377 | 377 | 377 | 357 | 357 | 377 | 377 | 361 | 361 | 361 | 377 | 361 | 277 |
| 377 | 257 | 362 | 377 | 377 | 377 | 377 | 237 | 137 | 377 | 377 | 377 | 377 | 77 | 367 | 377 |
| 377 | 117 | 365 | 177 | 161 | 361 | 377 | 377 | 257 | 367 | 377 | 377 | 377 | 377 | 361 | 362 |
| 362 | 257 | 377 | 377 | 77 | 274 | 274 | 47 | 257 | 377 | 37 | 362 | 17 | 17 | 377 | 362 |
| 377 | 77 | 377 | 361 | 377 | 377 | 377 | 377 | 377 | 377 | 377 | 367 | 377 | 277 | 367 | 377 |
| 377 | 377 | 261 | 361 | 277 | 277 | 377 | 377 | 242 | 362 | 377 | 361 | 362 | 277 | 377 | 257 |
| 362 | 377 | 237 | 237 | 362 | 362 | 377 | 377 | 367 | 377 | 377 | 177 | 157 | 377 | 377 | 377 |
| 377 | 317 | 377 | 377 | 377 | 377 | 377 | 377 | 361 | 267 | 377 | 257 | 377 | 377 | 361 | 377 |
| 267 | 377 | 257 | 377 | 377 | 361 | 377 | 277 | 257 | 317 | 372 | 367 | 377 | 177 | 377 | 377 |
| 377 | 361 | 367 | 377 | 301 | 360 | 374 | 363 | 277 | 377 | 362 | 367 | 374 | 377 | 377 | 377 |
| 362 | 361 | 361 | 267 | 257 | 377 | 377 | 377 | 377 | 362 | 377 | 361 | 377 | 317 | 362 | 377 |
| 377 | 377 | 377 | 367 | 377 | 174 | 157 | 137 | 377 | 361 | 377 | 367 | 377 | 377 | 377 | 361 |
| 367 | 262 | 101 | 101 | 367 | 367 | 277 | 277 | 362 | 277 | 277 | 377 | 367 | 367 | 277 | 277 |
| 277 | 277 | 361 | 377 | 377 | 377 | 257 | 361 | 377 | 362 | 317 | 362 | 377 | 377 | 377 | 377 |

ROM 4

| | | | | | | | | | | | | | | | |
|---|---|---|---|---|---|---|---|---|---|---|---|---|---|---|---|
| 56 | 116 | 126 | 170 | 135 | 105 | 100 | 10 | 120 | 170 | 130 | 120 | 100 | 132 | 136 | 120 |
| 123 | 131 | 101 | 10 | 105 | 30 | 35 | 135 | 135 | 170 | 170 | 170 | 12 | 12 | 231 | 170 |
| 160 | 107 | 66 | 125 | 17 | 127 | 55 | 124 | 170 | 106 | 170 | 112 | 231 | 170 | 170 | 170 |
| 170 | 170 | 106 | 110 | 235 | 234 | 170 | 110 | 124 | 114 | 170 | 110 | 115 | 125 | 106 | 110 |

| | | | | | | | | | | | | | | | |
|---|---|---|---|---|---|---|---|---|---|---|---|---|---|---|---|
| 124 | 170 | 170 | 170 | 110 | 235 | 234 | 170 | 110 | 124 | 114 | 120 | 170 | 110 | 115 | 125 |
| 160 | 160 | 120 | 106 | 120 | 170 | 106 | 170 | 130 | 127 | 170 | 106 | 106 | 120 | 170 | 170 |
| 170 | 107 | 170 | 17 | 127 | 127 | 170 | 127 | 127 | 170 | 170 | 170 | 170 | 107 | 170 | 106 |
| 11 | 17 | 170 | 170 | 106 | 170 | 170 | 170 | 170 | 170 | 114 | 134 | 170 | 130 | 170 | 110 |
| 170 | 124 | 170 | 124 | 17 | 11 | 106 | 170 | 111 | 106 | 160 | 170 | 106 | 170 | 106 | 106 |
| 170 | 170 | 170 | 106 | 170 | 170 | 106 | 170 | 170 | 106 | 106 | 170 | 170 | 106 | 170 | 107 |
| 170 | 11 | 106 | 170 | 11 | 170 | 11 | 11 | 160 | 11 | 233 | 170 | 130 | 170 | 170 | 70 |
| 160 | 170 | 11 | 11 | 160 | 170 | 170 | 46 | 46 | 170 | 101 | 160 | 32 | 231 | 160 | 135 |
| 105 | 111 | 106 | 55 | 170 | 75 | 125 | 125 | 106 | 115 | 234 | 11 | 106 | 170 | 100 | 11 |
| 101 | 160 | 170 | 66 | 125 | 170 | 105 | 101 | 104 | 66 | 125 | 106 | 170 | 170 | 106 | 115 |
| 230 | 115 | 120 | 234 | 170 | 105 | 11 | 104 | 160 | 66 | 125 | 106 | 170 | 100 | 101 | 106 |
| 50 | 70 | 124 | 135 | 104 | 170 | 55 | 105 | 121 | 121 | 31 | 233 | 170 | 170 | 377 | 377 |
| 126 | 50 | 120 | 150 | 125 | 125 | 170 | 170 | 116 | 116 | 126 | 137 | 57 | 170 | 57 | 116 |
| 116 | 116 | 126 | 50 | 110 | 233 | 15 | 125 | 100 | 103 | 120 | 50 | 100 | 120 | 107 | 52 |
| 52 | 230 | 230 | 230 | 127 | 127 | 127 | 127 | 11 | 11 | 121 | 121 | 121 | 110 | 130 | 122 |
| 100 | 170 | 100 | 116 | 116 | 126 | 100 | 200 | 210 | 75 | 210 | 100 | 125 | 15 | 125 | 100 |
| 100 | 124 | 44 | 170 | 121 | 130 | 123 | 123 | 15 | 125 | 53 | 113 | 123 | 170 | 130 | 170 |
| 104 | 116 | 116 | 116 | 116. | 104 | 104 | 100 | 104 | 104 | 44 | 170 | 170 | 170 | 127 | 104 |
| 116 | 116 | 31 | 137 | 121 | 116 | 116 | 116 | 116 | 126 | 15 | 125 | 100 | 15 | 125 | 100 |
| 111 | 200 | 121 | 130 | 170 | 112 | 200 | 100 | 122 | 122 | 35 | 130 | 125 | 170 | 100 | 170 |
| 170 | 57 | 35 | 115 | 170 | 125 | 126 | 115 | 125 | 115 | 104 | 104 | 170 | 33 | 17 | 127 |
| 110 | 123 | 15 | 126 | 15 | 170 | 170 | 15 | 130 | 125 | 100 | 170 | 170 | 15 | 130 | 100 |
| 125 | 100 | 170 | 170 | 170 | 130 | 100 | 100 | 100 | 111 | 126 | 100 | 107 | 170 | 15 | 170 |
| 170 | 134 | 125 | 54 | 101 | 107 | 170 | 35 | 125 | 114 | 127 | 120 | 170 | 170 | 170 | 170 |
| 116 | 137 | 130 | 100 | 14 | 124 | 124 | 170 | 170 | 170 | 170 | 137 | 57 | 11 | 121 | 116 |
| 116 | 126 | 15 | 160 | 107 | 107 | 67 | 107 | 275 | 130 | 235 | 125 | 35 | 125 | 170 | 130 |
| 40 | 122 | 130 | 130 | 100 | 100 | 12 | 32 | 122 | 170 | 170 | 170 | 100 | 100 | 170 | 50 |
| 11 | 31 | 121 | 100 | 170 | 15 | 15 | 137 | 57 | 125 | 15 | 125 | 377 | 377 | 377 | 116 |

APPENDIX C-2

```
                                                         MICRA 2/4/77
                                                         *      DIGITAL STORAGE TEST PROGRAM
                                                         *
                                                         *      REGISTERS
                                                                DECLARE R0=0,R1=1,R2=2,R3=3,R4=4,R5=5,R6=6,R7=7
                                                                DECLARE A0=0,A1=1,A2=2,A3=3,A4=4,A5=5,A6=6,A7=7
                                                                DECLARE SCR=0,X=1,Y=2,THRESH=3,DC=4,MA=5
                                                                DECLARE SAVEA=6,CHR=7,DELTAY=7,RA=7
                                                         *
                                                         *
                                                         *      FLAGS
                                                                DECLARE LROMEN=0,CHAR=1,BLINK=2,FS=3,BRIGHT=4
                                                                DECLARE LLGBLANK=5,DIM=6,FSTPT=7,FLGA=8,FLGB=9
                                                                DECLARE FLGC=10,SELA=11,CE=12,SELB=13,DOTEN=14
                                                                DECLARE HOLD=15
                                                                DECLARE FLGTA=3,FLGTB=4,FLGTC=6
                                                         *
                                                         *
                                                         *      I/O PORTS
                                                                DECLARE ADC=0,MEM=1,RTN=2,TSTB=3,TSTA=4
                                                                DECLARE BPCAD=6,BPCD=7
                                                                DECLARE LGCHAR=0,LGX=1,LGY=2,MDR=3,RAMP=4
                                                                DECLARE LGEXP=5,BPCO=6,MAR=7,STT=8,RSTO=9
                                                                DECLARE INCRSA=10,HSRS=11,CLRSA=12,DRTIMER=13
                                                                DECLARE SRSEN=14,CRSEN=15
                                                         *
                                                         *
                                                         *      CONSTANTS
                                                                DECLARE 0=0,1=15,8=2,15=3,16=4,32=7,97=6,100=3
                                                                DECLARE 255=7,1023=8,1024=9,2047=10,2048=11
                                                                DECLARE 3072=12,4032=13,4095=14,1032=1,2140=4
                                                                DECLARE 2730=5,1365=6,500=13
                                                                DECLARE 2=1,4=2
                                                         *
                                                         *
                                                         *      QUALIFIERS
                                                                DECLARE B0=0,B1=1,B2=2,B3=3,B4=4,B5=5,B6=6
                                                                DECLARE B7=7,B8=8,B9=9,B10=10,B11=11,ZERO=12
                                                                DECLARE POS=14,TEST=13
                                                         *
                                                         *      STIMULUS SOFTWARE
                                                         *
                                                         *
                                                         *
                                                                ADRS 0
 0    0    5--1 1  0 3--17 17--0 2 0 4     AC      JAD H DAC=A4*0&B           \0000 0110 0011
 1    1  113--0 1  0 3--17  6--0 2 1 1     FA      JRTN7 DAC=R1*0 OBPCO
 2    0  176--1 1 10 2--14 17--0 5 0 4     AB      JAC H DA4=AC QZERO SFLGA   \0000 0000 0010\C
 3    0  177--1 1 17 3--15 17--0 3 0 0     AA      JAB H DAC=A0/1&B QTEST
 4    0   41--1 1  1 3--17 17--0 0 0 0     BH      JBI H DAC=A0+1032&B
 5    0    2--1 1 10 2--14 17--0 5 0 0     AD      JAE H DA0=AC QZERO SFLGA   \0000 0110 0011
 6    0   24--0 1  2 0--17  5--0 5 0 2     BA      JBB H DA2=AC OLGEXP CBLINK
 7    0   10--1 1 17 3--10 17--0 1 0 0     AE      JAF H DAC=A0-1&B QB8       \0000 0000 0000\C
10    0    2--1 1  5 3--13 17--0 3 0 2     AO      JAP H DAC=A2/2730&B QB11   \0001 0101 0101\C
11    0   24--1 1  5 3--12 17--0 2 0 5     AQ      JAR H DAC=A5*2730&B QB10   \1011 1111 1111\C
12    0  177--1 1  2 0-- 5 17--0 5 0 5     AP      JAQ H DA5=AC QB5 CBLINK    \0001 0101 0101\C
13    0   21--1 1  0 3-- 1 17--0 4 0 0     AS      JAT H DAC=A0&B QB1         \1010 1010 1010
14    0   17--1 1  6 3-- 3 17--0 3 0 3     AW      JAX H DAC=A3/1365&B QB3    \0000 0000 0111\C
15    0    3--1 1  0 3--15 17--0 6 0 0     AY      JAZ H DAC=%A0&B QTEST      \1111 1111 1111
16    0  172--1 1  5 2--17 17--0 5 0 2     AN      JAO H DA2=AC SLLGBLANK     \0101 0101 0101
17    0   20--1 1 14 0--16 17--0 5 0 4     AF      JAG H DA4=AC QPOS CCE      \0000 0000 0000
20    0    3--1 1  2 2-- 5 17--0 5 0 0     AZ      JZA H DA0=AC QB5 SBLINK    \1010 1010 1010
21    0    3--1 1  6 3-- 2 17--0 1 0 0     ZC      JZD H DAC=A0-1365&B QB2    \0101 0101 0101
22    0  172--1 1 16 0--13 17--0 5 0 2     AV      JAW H DA2=AC QB11 CDOTEN   \1011 1111 1111
23    0    3--1 1  0 3--11 17--0 4 0 0     ZA      JZB H DAC=A0&B QB9         \0101 0101 0101\C
24    0    1--1 1  0 2-- 0 17--0 5 0 4     ZD      JZE H DA4=AC QB0 SLROMEN   \0101 0101 0101
25    0    4--1 1 12 3-- 0 17--0 2 0 4     ZE      JZF H DAC=A4+2047&B QB0    \0000 0000 0000\C
26    0  173--1 1  4 0-- 6 17--0 7 0 0     ZB      JZC H DB=AC QB6 CBRIGHT    \0101 0101 0101
27    0  173--1 1  1 3-- 4 17--0 0 0 5     AU      JAV H DAC=A5+1032&B QB4    \1010 1010 1010\C
30    0  152--1 1  5 3-- 1 17--0 2 0 2     ZG      JAB H DAC=A2+2730&B QB1    \0000 0000 0000\C
31    1  177--1 1 10 0-- 2 17--0 7 0 0     ZF      JZG   DB=AC QB2 CFLGA      \0000 0000 0000\C
32    0    6--1 1  3 2--17 17--0 6 0 2     BB      JBC H DAC=%A2&B SFS
33    0  162--1 1  5 0-- 6 17--0 5 0 1     AX      JAY H DA1=AC QB6 CLLGBLANK \1010 1010 1010\C
34    0  173--1 1  0 3-- 3 17--0 5 0 7     AT      JAU H DA7=AC QB3           \1010 1010 1010
```

```
 35   0 156--1 1 16 2-- 4 17--0 5 0 3   AR    JAS H DA3=AC QB4 SDOTEN        \1011 1111 1111
 36   0 160--1 1 10 3--11 17--0 2 0 6   AM    JAN H DAC=A6+1023&B QB9        \1010 1010 1010
 37   0  41--1 1  5 3-- 7 17--0 1 0 4   AG    JAH H DAC=A4-2730&B QB7        \1111 1111 1111
 40   0   1--1 1  0 2--17 17--0 5 0 2   BC        H DA2=AC SLROMEN
 41   0   1--1 1 17 3--17 17--0 1 0 2   BD        H DAC=A2-1&B
 42   0   1--1 1  5 0--17 17--0 7 0 0   BE        H DB=AC CLLGBLANK
 43   0   1--1 1  0 3--15 17--0 2 0 4   BF        H DAC=A4*0&B QTEST
 44   0  27--1 1  4 2--17 17--0 5 0 0   BG    JCA H DA0=AC SBRIGHT
 45   0   1--0 1  0 2--17  3--0 5 0 7   BI        H DA7=AC SLROMEN OMDR
 46   0   1--0 1  2 3--17  4--0 1 0 0   BJ        H DAC=A0-8&B ORAMP         \UPDATE RAMP
 47   0   1--0 1 14 2--17  7--0 5 0 1   BK        H DA1=AC SCE   OMAR
 50   0   1--0 0 10 3--17  3--0 1 0 7   BL        H DAC=A7-1023&B W OMDR     \WRITE TO MEMORY
 51   0   1--0 0  7 0--17  6--0 5 0 6   BM        H DA6=AC W OBPCO CFSTPT    \UPDATE BPCO
 52   0   1--1 0 14 0--17 17--0 4 0 0   BN        H DAC=A0&B CCE W
 53   1   0--1 1  0 3--13 17--0 7 0 0   BO    JBO   DB=AC QB11               \INTERRUPT SYNCHRONIZE
 54   0   0--0 1 13 3--17  5--0 0 0 6   BP    JBP H DAC=A6+2048&B OLGEXP
 55   0   1--1 1  1 2--17 17--0 5 0 5   BQ        H DA5=AC SCHAR
 56   0   1--0 1 11 3--17  0--0 1 0 3   BR        H DAC=A3-1024&B OLGCHAR    \UPDATE LGCHAR
 57   0   1--1 1  1 0--17 17--0 5 0 4   BS1       H DA4=AC CCHAR
 60   0   1--1 1  6 0--17 17--0 6 0 5   BT        H DAC=%A5&B CDIM
 61   0   1--1 1  2 2--17 17--0 7 0 0   BU        H DB=AC SBLINK
 62   0   1--1 1 17 3--17 17--0 0 0 1   BV        H DAC=A1+1&B
 63   0  13--1 1  3 0--17 17--0 5 0 3   BW    JYC H DA3=AC CFS
 64   0   1--1 1 12 3--17 17--0 3 1 3   BX        H DAC=A3/2047
 65   0   1--1 1  4 0--17 17--0 7 0 0   BY        H DB=AC CBRIGHT
 66   0   1--1 1 17 3--15 17--0 0 0 0   BZ        H DAC=A0+1&B QTEST
 67   0   1--1 1  0 3--16 17--0 5 0 0   YA        H DA0=AC QPOS
 70   0 113--1 1 10 2--17 17--0 4 0 4   YB    JAA H DAC=A4&B SFLGA           \CYCLE BACK(DM CHECK)
 71   0  10--0 1 14 2--17  7--0 4 0 3   DA    JDB H DAC=A3&B OMAR SCE
 72   0 114--1 1 17 0--17  3--0 4 1 0   XJ    JBA H DAC=A0 ITSTB CHOLD       \READ TEST B
 73   0 111--1 1 10 0--17 17--0 7 0 0   CA    JBH H DB=AC CFLGA
 74   0  45--1 1  3 0-- 3 17--1 3 0 3   CB    JCC H DAC=A3/AC&B QB3  CFS
 75   0 107--1 1 10 2--17  7--0 4 1 0   XD    JBH H DAC=A0 IBPCD SFLGA       \READ BPC DATA
 76   0 166--1 1  0 3--17 17--0 6 0 2   YC    JBX H DAC=%A2&B
                                              ADRS 63
 77   0 137--1 1  4 2--10 17--0 5 0 0   AL    JAM H DA0=AC QB8 SBRIGHT       \0101 0101 0101
100   0  77--1 1  0 3--12 17--0 5 0 1   AH    JAI H DA1=AC QB10              \1111 1111 1111
101   0   2--1 1 12 0--17 17--1 0 0 3   DB    JDD H DAC=A3+AC&B CFLGC
102   0   1--1 1 11 0--17 17--1 1 0 3   DC1       H DAC=A3-AC&B CFLGB
103   0   1--1 1  6 2--17 17--0 7 0 0   DD        H DB=AC SDIM
104   0   1--1 1  2 3--17 17--0 2 0 2   DE        H DAC=A2*8&B
105   0   1--1 1 14 0--17  1--1 2 1 2   DF        H DAC=A2*AC CCE IMEM       \READ MEMORY
106   0   1--0 1  0 3--17 14--0 5 0 4   DG        H DA4=AC OCLRSA
107   0   1--0 1  0 0--17  7--0 4 0 5   DH        H DAC=A5&B OMAR CLROMEN
110   0   1--0 1  0 3--17 17--0 4 0 4   DI        H DAC=A4&B OCRSEN
111   0   1--1 1 13 0--17 17--1 0 0 4   DJ        H DAC=A4+AC&B CSELA
112   0   1--1 1 15 2--17 17--0 5 0 4   DK        H DA4=AC SSELB
113   0   1--1 1  0 3--13 17--0 6 0 2   DL        H DAC=%A2&B QB11
114   0   1--1 1  0 3--17  1--0 4 1 0   DM        H DAC=A0 IMEM              \READ CHAR ROM
115   0 172--0 1  0 3--17 12--0 4 0 6   DO    JDH H DAC=A6&B OINCRSA
116   0   1--1 1  0 2--17  6--0 4 1 0   DN        H DAC=A0 IBPCAD SLROMEN    \READ BPC ADDRESS
117   0   1--0 1  0 3--14  6--0 4 0 6   DP        H DAC=A6&B OBPCO QZERO
120   0   1--1 1  0 3--17 17--0 4 0 2   DQ        H DAC=A2&B
121   0   2--1 1  0 3--17  3--0 6 1 2         JDR H DAC=%A2 ITSTB            \READ TEST B
122   0 153--0 1  0 3--17  6--0 4 0 6         JXD H DAC=A6&B OBPCO
123   0   1--0 1  6 0--17 15--0 4 0 2   DR        H DAC=A2&B ODRTIMER CDIM
124   0   1--1 1  7 2--17  4--0 4 1 2             H DAC=A2 ITSTA SFSTPT      \READ TEST A
125   0   2--0 1 17 2--17 10--0 4 0 2         JDS H DAC=A2&B OSTT SHOLD
126   0  11--0 1  0 3--17 12--0 4 0 2   XA    JXB H DAC=A2&B OINCRSA
127   0   1--0 1 12 2--17  4--0 5 0 4   DS        H DA4=AC   SFLGC ORAMP
130   0   1--1 1 11 2--17 17--0 4 0 2   DT        H DAC=A2&B SFLGB
131   0   1--1 1  0 3--17  0--0 4 1 2   DU        H DAC=A2 IADC              \READ ADC
132   0   1--0 1  0 3--17 13--0 4 0 2   DV        H DAC=A2&B OHSRS
133   0   1--1 1  0 3--17  7--0 4 1 2   DW        H DAC=A2  IBPCD
134   0   1--1 1  0 3--17 17--0 4 0 4   DX        H DAC=A4&B
135   0   1--1 1  0 3--14 17--1 0 0 4   DY        H DAC=A4+AC&B QZERO
136   0 170--1 1 10 0--17 17--0 5 0 4   DZ    JXA H DA4=AC CFLGA
137   0   1--1 1  0 3--17  4--0 4 1 0   XB        H DAC=A0 ITSTA             \READ TEST A
140   0 132--0 1  0 3--17 11--0 4 0 2   XI    JXJ H DAC=A2&B ORSTO
141   0   1--1 1 17 3-- 2 17--0 0 0 3   CC        H DAC=A3+1&B QB2
142   0   2--1 1 15 0-- 1 17--0 5 0 3   CD    JCF H DA3=AC CSELB QB1
143   0   1--1 1 15 2-- 1 17--0 5 0 3             H DA3=AC SSELB QB1
144   0   2--1 1 13 0-- 4 17--0 4 0 3   CF    JCH H DAC=A3&B CSELA QB4
145   0   1--1 1 13 2-- 4 17--0 4 0 3   CG        H DAC=A3&B SSELA QB4
146   0   2--0 1  0 3--14 16--0 4 0 2   CH    JCJ H DAC=A2&B QZERO OSRSEN
147   0   1--0 1  0 3--14 17--0 4 0 2   CI        H DAC=A2&B QZERO OCRSEN
150   0   2--1 1 12 3--15 17--0 2 0 3   CJ    JCL H DAC=A3*2047&B QTEST
151   0   1--1 1 10 0--15 17--0 4 0 2   CK        H DAC=A2&B QTEST CFLGA
152   0   2--1 1 10 2--17 17--0 7 0 0   CL    JCN H DB=AC SFLGA
153   0   1--1 1 12 3--17 17--0 2 0 3   CM        H DAC=A3*2047&B
154   0   2--1 1 17 2--17 17--0 7 0 0   CN    JCP H DB=AC SHOLD
155   0   3--1 1 17 2--17 17--0 7 0 0   CO    JCQ H DB=AC SHOLD
156   1   0--1 1  2 2--13 17--0 7 0 0   CP    JCP   DB=AC QB11 SBLINK        \INTERRUPT SYNCHRONIZE
157   0 114--1 1  0 3--17 17--0 6 0 3   CR1   JCA H DAC=%A3&B
160   1   0--1 1  4 0--13 17--0 7 0 0   CQ    JCQ   DB=AC QB11 CBRIGHT
161   0 112--1 1 17 0--17 17--0 4 0 3   CS    JCA H DAC=A3&B CHOLD
                                              ADRS 126
176   0 101--1 1  0 3-- 7 17--0 6 0 1   AK    JAL H DAC=%A1&B QB7            \0101 0101 0101\C
177   0  77--1 1  6 3-- 5 17--0 0 0 0   AI    JAJ H DAC=A0+1365&B QB5        \0101 0101 0101\C
                                              ADRS 190
276   0 100--1 1  3 0--16 17--0 5 0 6   AJ    JAK H DA6=AC QPOS CFS          \0000 0000 0000\C
                                        *
                                        *
                                        *
                                        *
                                        *
                                        * SELF BOOT SOFTWARE
                                        *
                                              ADRS 114
162   1   6--1 1 11 3--17 17--0 0 1 1   LB2   JLB4 DAC=R1+1024               \MEMORY CLEAR
163   0   1--1 1  0 3--17 17--0 5 0 0   LB3   DR0=AC H
164   0   1- 0 0 14 2--17  7--0 4 0 0         DAC=R0&B OMAR  SCE H W
165   0   1--1 0 17 3--17 17--0 1 0 0         DAC=R0-1&B  W H
166   1   1--1 0  0 3--14 17--0 7 1 0         QZERO  W
```

```
167    1 173--1 0 14 0--17 17--0 7 1 0          JLB2 CCE W
                                          *
                                          *
170    1   1--1 1 10 0--17 17--0 5 0 6    LB4   DR6=AC          CFLGA          \REGISTER SET UPS
171    1   1--1 1 17 3--17 17--0 0 1 0          DAC=R0+1
172    1   1--1 1 11 0--17 17--1 0 1 6          DAC=R6+AC       CFLGB
173    1   1--1 1 12 0--17 17--0 5 0 2          DR2=AC          CFLGC
174    1   1--1 1  1 3--17 17--0 0 1 1          DAC=R1+1032
175    1   3--1 1 13 0--17 17--0 5 0 4          JZ1 DR4=AC      CSELA
                                                ADRS 128
200    1   1--1 1  2 3--17 17--0 0 1 4    Z1    DAC=R4+8
201    1   1--1 1 15 0--17 17--0 5 0 4          DR4=AC          CSELB
202    1   1--1 1 17 3--17 17--0 0 1 0          DAC=R0+1
203    1   1--1 1 17 0--17 17--1 0 1 2          DAC=R2+AC       CHOLD
204    1   1--1 1  0 3--17 17--0 5 0 3          DR3=AC
205    1   1--1 1  7 3--17 17--0 0 1 6          DAC=R6+32
206    1   1--0 1  0 3--17 16--0 5 0 5          DR5=AC          OSRSEN
207    1   1--1 1  7 3--17 17--0 0 1 5          DAC=R5+32
210    1   1--1 1  2 0--17 17--0 5 0 6          DR6=AC          CBLINK
211    1   1--1 1 17 3--17 17--0 0 1 6          DAC=R6+1
212    1   1--1 1  0 3--17 17--0 5 0 6          DR6=AC
                                          *
                                          *
213    0   1--0 1  0 3--17  3--0 4 0 4          DAC=R4&B OMDR H                     \ DIAGNAL GRAPH SET UP
214    0   2--0 0 14 2--17  7--0 4 0 1    LB5   JLB6 DAC=R1&B OMAR SCE H W
215    1   5--1 1  0 3--17 17--0 2 1 0          JLB7 DAC=R0*0
216    0   1--1 0  0 3--17 17--0 7 1 0    LB6   W H
217    0   1--1 0 17 3--17 17--0 0 0 1          DAC=R1+1&B H W
220    1   1--1 0 14 0--12 17--0 5 0 1          DR1=AC QB10  W CCE
221    0 173--0 0  0 3--17  3--0 4 0 1          JLB5 DAC=R1&B OMDR H W
                                          *
222    1   1--1 1  0 3--17 17--0 5 0 1    LB7   DR1=AC                              \GRATICLE GENERATION
223    1   1--1 1  0 3--17 17--0 5 0 4          DR4=AC
224    1   1--1 1  1 3--17 17--0 0 1 4          DAC=R4+1032
225    1   1--1 1  0 3--17 17--0 5 0 0          DR0=AC
226    1   1--1 1  7 3--17 17--0 1 1 0          DAC=R0-32
227    1   1--1 1  0 3--17 17--0 5 0 0          DR0=AC
230    0   1--0 1  0 3--17  3--0 4 0 2          DAC=R2&B OMDR H
231    0   1--0 0 14 2--17  7--0 4 0 0          DAC=R0&B OMAR SCE H W
232    0   1--1 0  0 3--17 17--0 5 0 2          DR2=AC H W
233    0   1--1 0 17 3--17 17--0 0 1 0          DAC=R0+1 H W
234    0   1--1 0 10 2--17 17--0 5 0 0          DR0=AC H W  SFLGA
235    0   1--1 0 13 3--17 17--0 0 1 4          DAC=R4+2048 H W
236    1  26--1 0 14 0--17 17--0 5 0 5          JSUB1 DR5=AC W CCE
                                          *
                                          *
237    1  25--1 1 10 2--17 17--0 5 0 5    LNK0  JSUB1 DR5=AC SFLGA   \HORZ GRATICULE LOOP
240    1   1--1 1 11 2--17 17--0 5 0 5    LNK1  DR5=AC SFLGB
241    1   1--1 1  0 3--17 17--0 4 1 2          DAC=R2
242    1  22--1 1  0 3--17 17--0 5 0 4          JSUB1 DR4=AC
243    1   1--1 1 12 2--17 17--1 1 1 5    LNK3  DAC=R5-AC SFLGC
244    1   1--1 1 10 0--16 17--0 7 1 0          QPOS CFLGA
245    1   1--1 1  4 3--17 17--0 0 1 5          DAC=R5+2148
246    1  16--1 1 12 0--17 17--0 5 0 5          JSUB1 DR5=AC CFLGC
247    1   1--1 1 13 3--17 17--0 0 1 5    Z2    DAC=R5+2048
250    1  14--1 1  0 3--17 17--0 5 0 5          JSUB1 DR5=AC
251    1   1--1 1  0 3--17 17--0 5 0 5    LNK2  DR5=AC
252    1   1--1 1 11 0--17 17--0 4 1 1          DAC=R1 CFLGB
253    1  11--1 1  0 3--17 17--0 5 0 4          JSUB1 DR4=AC
                                          *
                                          *
254    1 107--0 1  0 2--17  3--0 4 0 1    Z4    JLB3 DAC=R1&B OMDR SLROMEN
                                          *
255    1   7--1 1  0 3--17 17--0 5 0 5    LNK6  JSUB1 DR5=AC          \VERT GRATICULE LOOP
256    1   1--1 1 11 0--16 17--0 5 0 4    LNK7  DR4=AC QPOS CFLGB
257    1   1--1 1 13 3--17 17--0 0 1 1          DAC=R1+2048
260    0  36--0 1  0 3--17  3--0 4 0 6          JLB8 DAC=R6&B OMDR H
261    1   3--1 1  0 3--17 17--0 5 0 5          JSUB1 DR5=AC
262    1   2--1 1 10 0--17 17--0 5 0 5    LNK5  JSUB1 DR5=AC CFLGA
263    1 164--1 1 11 2--17 17--0 5 0 4    LNK4  JZ2  DR4=AC SFLGB
                                          *
                                          *
264    0   1--0 1  0 3--17  3--0 4 0 4    SUB1  DAC=R4&B OMDR H
265    0   1--0 0 14 2--17  7--0 4 0 0          DAC=R0&B OMAR W H SCE
266    0   1--1 0 17 3--17 17--0 0 1 0          DAC=R0+1 W H
267    1   1--1 0  0 3--17 17--0 5 0 0          DR0=AC W
270    1   1--1 0 14 0--17 17--0 7 1 0          W CCE
271    0   1--0 0  0 3--17  3--0 4 0 5          DAC=R5&B OMDR W H
272    0   1--0 0 14 2--17  7--0 4 0 0          DAC=R0&B OMAR W H SCE
273    0   4--1 0 17 3--17  4--0 0 1 0          JZ3 DAC=R0+1 ITSTA W H
                                          *
274    1 143--1 1  4 3--17 17--0 0 1 5    RTN0  JLNK0 DAC=R5+2148
275    1 143--1 1 13 3--17 17--0 1 1 5    RTN1  JLNK1 DAC=R5-2048
                                          *
                                                ADRS 191
277    0   1--1 0  0 3-- 6  4--0 7 1 0    Z3    ITSTA QFLGTC  W H
300    0   1--1 0 14 0-- 4  4--0 7 1 0          QFLGTB ITSTA W H CCE
301    1   2--1 1  0 3-- 3 17--0 5 0 0          JPRTN1 QFLGTA DR0=AC
302    1   3--1 1  0 3-- 3 17--0 5 0 0          JPRTN3 QFLGTA DR0=AC
                                          *
303    1 171--1 1  0 3--17 17--0 7 1 0    PRTN1 JRTN0
304    1   3--1 1  0 3--17 17--0 7 1 0    PRTN2 JRTN2
305    1   4--1 1  0 3--17 17--0 7 1 0    PRTN3 JRTN4
306    1   5--1 1  0 3--17 17--0 7 1 0    PRTN4 JRTN6
                                          *
307    1 142--1 1 13 3--17 17--0 1 1 5    RTN2  JLNK2 DAC=R5-2048
310    0 133--1 1  2 3--17 17--0 1 1 2    RTN3  JLNK3 DAC=R2-8 H
311    1 152--1 1  3 3--17 17--0 1 1 4    RTN4  JLNK4 DAC=R4-100
312    1 150--1 1  0 3--17 17--0 4 1 2    RTN5  JLNK5 DAC=R2
313    1 142--1 1 10 2--17 17--0 4 1 1    RTN6  JLNK6 DAC=R1 SFLGA
314    1 142--1 1  3 3--17 17--0 1 1 4    RTN7  JLNK7 DAC=R4-100
                                          *
                                          *
315    1 137--0 1 14 0--17 13--0 5 0 1    LB1   JZ4 DR1=AC OHSRS CCE
```

```
                                            *
                                            *
316   0    1--0 0 14 2--17  7--0 4 0 0     LB8    DAC=RO&B OMAR W H SCE  \CONTROL ASCII
317   0    1--1 0 17 3--17 17--0 0 1 0            DAC=RO+1 W H
320   1    1--1 0  0 3--17 17--0 5 0 0            DRO=AC W
321   1    1--1 0  7 3--17 17--0 0 1 1            DAC=R1+32 W
                                            *
                                            *
322   1    1--1 0 14 0--17 17--0 5 0 4            DR4=AC W CCE    \ASCII CHARACTER LOOP
323   1    1--1 1  7 3--17 17--0 0 1 4            DAC=R4+32
324   1    1--1 1  0 3--17 17--0 5 0 6            DR6=AC
325   1    1--1 1  0 3--17 17--0 5 0 5            DR5=AC
326   0    2--0 1  0 3--17  3--0 4 0 5     LB9    JLB10 DAC=R5&B H OMDR
327   0    6--1 1 12 3--17 17--0 0 1 1            JLB11 DAC=R1+2047 H
330   0    1--0 0 14 2--17  7--0 4 0 0     LB10   DAC=RO&B OMAR W H SCE
331   0    1--1 0 17 3--17 17--0 0 1 5            DAC=R5+1 W H
332   0    1--1 0  0 3--17 17--0 5 0 5            DR5=AC W H
333   0    1--1 0 17 3-- 7 17--0 0 1 0            DAC=RO+1 QB7 W H
334   1  172--1 0 14 0--17 17--0 5 0 0            JLB9 DRO=AC W CCE
                                            *
335   0    1--0 1  0 3--17  3--0 7 0 0     LB11   DB=AC OMDR H
336   0    1--0 0 14 2--17  7--0 4 0 0            DAC=RO&B OMAR W H SCE
337   0    1--1 0 17 3--17 17--0 0 1 0            DAC=RO+1 W H
340   1    1--1 0 13 0--17 17--0 5 0 0            DRO=AC W CSELA
341   0    1--0 1 14 0--17  3--0 4 0 3            DAC=R3&B OMDR H CCE
342   0    1--0 0 14 2--17  7--0 4 0 0            DAC=RO&B OMAR W H SCE
343   0    1--1 0  0 3--17 17--0 4 1 1            DAC=R1 W H
344   0    1--1 0  0 3--17 17--0 5 0 0            DRO=AC W H
                                            *
                                            *
345   0    1--1 0 15 3--17 17--0 0 1 1     LB12   DAC=R1+500 W H
346   1    1--1 0 14 0--17 17--0 5 0 5            DR5=AC W CCE
347   1    1--1 1  7 3--17 17--0 1 1 5            DAC=R5-32
350   1    1--1 1 15 2--17 17--0 5 0 4            DR4=AC SSELB
351   1    1--1 1  7 3--17 17--0 0 1 5            DAC=R5+32
352   1    1--1 1 10 0--17 17--0 5 0 6            DR6=AC CFLGA
353   0    1--0 1  0 3--17  3--0 4 0 0            DAC=RO&B OMDR H
354   0    3--0 0 11 0--17  7--0 4 0 6            JSUB2 DAC=R6&B OMAR W H CFLGB
355   0    2--0 0 10 2--17  7--0 4 0 4     LNO    JSUB2 DAC=R4&B OMAR W H SFLGA
356   0    1--0 0 11 2--17  7--0 4 0 5     LN1    JSUB2 DAC=R5&B OMAR W H SFLGB
                                            *
                                            *
357   0    1--1 0 14 2--17 17--0 7 1 0     SUB2   SCE W H
360   0    1--1 0 12 2--17 17--0 7 1 0            W H SFLGC
361   1    1--1 0 17 3--17 17--0 0 1 7            DAC=R7+1 W
362   0    1--1 0 14 0--17 17--0 5 0 7            DR7=AC H W CCE
363   0    1--0 1  0 3--17  7--0 4 0 7            DAC=R7&B OMAR H
364   0    1--1 1 14 2--17 17--0 7 1 0            H SCE
365   0    1--1 1  0 3--17  4--0 7 1 0            ITSTA H
366   0    1--1 1  0 3-- 6 17--0 7 1 0            QFLGTC H
367   1    1--1 1 17 2--17  4--0 7 1 0     LB13   ITSTA SHOLD
370   0    2--1 1 14 0-- 4  0--0 5 1 0            JLB14 DRO=B IADC QFLGTB H CCE
371   0  176--1 1 14 0-- 2 17--0 7 1 0            JLB13 QB2 H CCE
372   1    1--1 1 17 0--17  4--0 7 1 0     LB14   ITSTA CHOLD
373   1    2--1 1  0 3-- 3 17--0 7 1 0            JLB15 QFLGTA
374   0  151--0 1 13 0--17  3--0 4 0 0     RT3    JLB12 DAC=RO&B OMDR H CSELA
375   0    1--1 1  0 3--17 17--0 7 1 0     LB15   H
376   0  157--0 1 15 0--17  3--0 4 0 0     RT0    JLNO DAC=RO&B OMDR H CSELB
377   0  157--0 1 13 2--17  3--0 4 0 0     RT1    JLN1 DAC=RO&B OMDR H SSELA
                                            *
                                            *
                                                  ADRS          256             \BEGIN INTERRUPT
400   0    2--1 1  0 3--17 17--0 2 0 0     MA1    JMB H DAC=A0+0&B              \TURN ON LOCATION
401   0    3--1 1  0 3--15  2--0 5 0 1     ME     JMF H DA1=AC QTEST IRTN
402   0   31--1 1  0 3--14  2--0 5 0 0     MB     JMC H DA0=AC QZERO IRTN       \0000 0000 0111
403   0  176--1 1 10 0--17 17--0 5 0 0     MD     JME H DA0=AC CFLGA
404   0   30--1 1  0 3--17 17--0 5 0 7     MF     JNA H DA7=AC
405   0   27--1 1  5 2--17 17--0 7 0 0     NW     JNA H DB=AC SLLGBLANK
406   0  177--1 1 13 3--17  2--0 3 0 0     NV     JNW H DAC=A0/2048&B IRTN
407   0    1--1 1 15 3--17 17--0 0 0 0     NB         H DAC=A0+4032&B
410   0    1--0 1 14 2--17  7--0 5 0 1                H DA1=AC OMAR SCE
411   0    1--1 1 12 3--17 17--0 1 0 1                H DAC=A1-2047&B
412   0    1--1 1 16 2--17 17--0 5 0 2                H DA2=AC SDOTEN
413   0    1--1 1 10 3--17 17--0 0 0 2                H DAC=A2+1023&B
414   0    1--1 1 14 0--17 17--0 5 0 3                H DA3=AC CCE
415   0    1--1 1  0 3--17 17--0 1 0 3                H DAC=A3-0&B
416   0    1--0 1 16 0--17  1--0 5 0 5                H DA5=AC OLGX CDOTEN
417   0    1--0 1  7 3--17  3--0 0 0 5                H DAC=A5+255&B OMDR
420   0    1--0 1 14 2--17  7--0 5 0 4                H DA4=AC OMAR SCE
421   0    1--0 1  6 3--17  2--0 0 0 4                H DAC=A4+97&B OLGY
422   0    1--1 1  5 0--17 17--0 5 0 6                H DA6=AC CLLGBLANK
423   0    1--1 1  7 3--17 17--0 0 0 6                H DAC=A6+32&B
424   0    1--1 1 14 0--17 17--0 5 0 7                H DA7=AC CCE
425   0    1--1 1  4 3--17 17--0 3 0 7                H DAC=A7/16&B
426   0    1--1 1 14 2--17 17--0 7 0 0                H DB=AC SCE
427   0    1--1 1  3 3--17 17--0 1 0 6                H DAC=A6-15&B
430   0    1--1 1  1 0--17 17--0 5 0 5                H DA5=AC CCHAR
431   0    1--1 1 17 3--17 17--0 1 0 5                H DAC=A5-1&B
432   0  154--1 1 14 0--17 17--0 5 0 4     NU     JNV H DA4=AC CCE
433   0  147--1 1  6 3--15 17--0 3 0 0     MC     JMB H DAC=A0/97&B QTEST        \000 000 0010
434   0  153--1 1 16 2--17 17--0 5 0 0     NA     JNB H DA0=AC CDOTEN SDOTEN
435   1    1--1 1  0 3--17 17--0 7 1 0     TA     \BEGIN NORMAL INTERRUPT ROUTINE
                                            *
                                            *
436   0   66--1 1  0 3--17 17--0 7 1 0     GOCORT JCORT H
                                            *
437   1    1--1 1 14 0--17 17--0 5 0 6     REFCTL DSAVEA=AC CCE                  \REFRESH CONTROL
440   1    1--1 1  0 3--17  3--0 2 1 0            DAC=SCR+0 ITSTB
441   1    1--1 1  5 0-- 2 17--0 5 0 0            DSCR=AC CLLGBLANK QB2
442   1    1--1 1  0 2--17  3--0 6 1 0            DAC=%SCR SLROMEN ITSTB
443   1    3--1 1 16 0-- 0 17--0 5 0 5            J+3 DMA=AC CDOTEN QB0          \FS MODE NOT ALLOWED
444   1    2--1 1 16 0-- 0 17--0 5 0 5            J+2 DMA=AC CDOTEN QB0          \FS MODE OFF
445   1   12--1 1  2 0--17  2--0 7 1 0            JIFS IRTN CBLINK               \INITIATE FAST SCAN
446   1    1--1 1  3 0--17  2--0 7 1 0            IRTN CFS                       \TIMER DONE?
```

```
447    0  55--0 1  2 0--17 15--0 4 1 6           JCORT DAC=SAVEA ODRTIMER H CBLINK   \YES START DISP REF
450    0 167--1 1  2 0--17 17--0 4 1 6           JREFCTL DAC=SAVEA H CBLINK          \NO WAIT FOR TIMER
451    1   1--1 1  0 3--17 17--0 5 0 6    FSTSCN DSAVEA=AC
452    1   1--1 1  0 3--17  3--0 5 1 7           ITSTB DCHR=B
453    1   2--1 1  6 3-- 2 17--0 2 1 7           J+2 DAC=CHR*97 QB2
454    1   2--1 1  0 3--17  2--0 7 1 0           J+2 IRTN                            \1:FSEN 2,3:AC=0
455    1 177--1 1  0 3--14 17--0 2 1 7           J-1 DAC=CHR*0 QZERO                 \1:FS DISB 2,3:AC80
456    0  46--0 1  3 0--17 15--0 4 1 6           JCORT CFS ODRTIMER DAC=SAVEA H      \AC=0 REF DISPLAY
457    0 172--1 1  3 2--17 17--0 4 1 6    IFS    JFSTSCN H DAC=SAVEA SFS             \GO TO FAST SCAN
460    0 157--1 1  0 3--17 17--0 4 1 6           JREFCTL H DAC=SAVEA                 \WAIT FOR RETRACE
                                          *
461    1   1--1 1  1 0--17 17--0 5 0 6    GRAPH  DSAVEA=AC CCHAR                     \BEGIN GRAPH MODE
462    1   2--1 1 12 3--17 17--0 2 1 0           J+2 DAC=SCR*2047                    \POSITIVE DATA
463    1   1--1 1  0 3--17 17--0 4 1 0           DAC=SCR                             \NEGATIVE DATA
464    1   1--1 1  0 3--17 17--1 1 1 3           DAC=THRESH-AC                       \COMPARE DATA
465    1   1--1 1 17 3--16 17--0 0 1 5           DAC=MA+1 QPOS                       \       TO THRESH
466    1   1--0 1  0 3--17  7--0 5 0 5           DMA=AC OMAR
467    1   2--1 1  0 3--17 17--0 4 0 0           J+2 DAC=SCR&B                       \DATA>THRESH
470    1   1--1 1  0 3--17 17--0 4 0 3           DAC=THRESH&B                        \DATA>=THRESH
471    1   1--1 1  0 3--12 17--0 5 0 0           DSCR=AC QB10
472    1   1--1 1 13 3--17  3--0 2 1 0           DAC=SCR*2048 ITSTB
473    1   2--0 1  0 3-- 4  2--0 4 0 0           J+2 DAC=SCR&B OLGY QB4              \POS DATA TO Y LG
474    1   1--0 1  0 3-- 4  2--0 5 0 0           DSCR=AC OLGY QB4                    \ZERO TO Y LINE GEN
475    1   1--1 1 14 2--13 17--0 4 0 7           DAC=DELTAY&B SCE QB11
476    1   2--1 1 10 3--12 17--0 2 1 2           J+2 DAC=Y*1023 QB10
477    1   2--1 1 10 3--17 17--0 2 1 2           J+2 DAC=Y*1023                      \FIRST PT
500    1   5--1 1  5 2--17 17--1 1 1 0           JOLDDY DAC=SCR-AC SLLGBLANK         \BLANK BIT OFF
501    1   2--1 1  5 0--17 17--1 1 1 0           J+2 DAC=SCR-AC CLLGBLANK            \BLANK BIT SET
502    1   1--1 1  5 0--17 17--1 1 1 0           DAC=SCR-AC CLLGBLANK                \BLANK BIT SET
503    1   4--1 1  0 3--17 17--0 5 0 7           J+4 DDELTAY=AC
504    1   3--1 1  0 3--17 17--0 5 0 7           J+3 DDELTAY=AC
505    1   3--1 1  0 3--16 17--0 5 0 7    OLDDY  J+3 DDELTAY=AC QPOS                 \OLD DELTAY>=0
506    1   1--1 1  0 3--16 17--0 5 0 7           DDELTAY=AC QPOS                     \OLD DELTAY<0
507    1   3--1 1 17 3--17 17--0 0 1 1           J+3 DAC=X+1
510    1   1--1 1 17 3--17 17--0 0 1 1           DAC=X+1
511    1   3--0 1 16 2--17  1--0 5 0 1           J+3 DX=AC OLGX SDOTEN               \DELTAY SIGN CHANGED
512    1   2--0 1 16 0--17  1--0 5 0 1           J+2 DX=AC OLGX CDOTEN               \DYSGN UNCHGD OR BLNK
513    1   1--0 1 16 2--17  1--0 5 0 1           DX=AC OLGX     SDOTEN               \DELTAY SIGN CHANGED
514    1   1--1 1  0 3--17 17--0 4 1 0           DAC=SCR
515    1   1--1 1 14 0--17  1--0 5 1 0           IMEM DSCR=B CCE                     \READ NEXT MEM WORD
516    1   1--1 1  7 0--13 17--0 5 0 2           DY=AC QB11 CFSTPT                   \CLEAR FIRST PT FF
517    1   1--1 1  0 3--17 17--0 4 0 0           DAC=SCR&B
520    1   1--1 1  0 3--12 17--0 7 1 0           QB10
521    1  37--1 1  0 3--17  2--0 4 0 0    TOGRPH JGRLINK IRTN DAC=SCR&B
                                          *
522    0 115--1 1  0 3--17 17--0 4 1 6    RCLINK JREFCTL DAC=SAVEA H                 \GO TO REF CONTROL
523    0 114--1 1  0 3--17 17--0 4 1 6           JREFCTL H DAC=SAVEA                 \GO TO REF CONTROL
                                          *
524    1   1--1 1  1 0--17 17--0 5 0 6    CORT   DSAVEA=AC CCHAR                     \CONTROL OR THRESH
525    1   1--1 1  5 0--17 17--0 4 0 0           DAC=SCR&B CLLGBLANK
526    1   1--1 1  3 0--11 17--1 0 0 0           DAC=SCR+AC&B QB9 CFS
527    1   1--1 1  0 3-- 5 17--1 0 1 0           DAC=SCR+AC QB5
530    1   2--1 1 10 3--17 17--0 3 1 5           J+2 DAC=MA/1023
531    1  14--1 1  0 3--17 17--1 0 1 0           JNEWTH DAC=SCR+AC                   \GO TO NEW THRESHOLD
532    1   2--1 1  4 0--17 17--0 4 0 0           J+2 DAC=SCR&B CBRIGHT               \BRIGHT OFF
533    1 177--1 1  0 3--17 17--0 5 0 5           J-1 DMA=AC                          \SKIP PAGE
534    1   1--1 1 17 3-- 3 17--0 0 1 5           DAC=MA+1 QB3
535    1   1--0 1 14 2--17  7--0 5 0 5           DMA=AC OMAR SCE
536    1   2--1 1  6 0--17 17--0 4 0 0           J+2 DAC=SCR&B CDIM                  \DIM OFF
537    1   1--1 1  6 2--17 17--0 4 0 0           DAC=SCR&B SDIM                      \DIM ON
540    1   1--1 1 16 0-- 4 17--0 5 0 4           DDC=AC CDOTEN QB4
541    1   1--0 1  0 3--17  5--0 2 0 4           DAC=DC*0&B OLGEXP                   \EXPAND BITS TO LG
542    1   2--1 1  7 2-- 7 17--0 7 1 0           J+2 QB7 SFSTPT                      \SET FIRST PT FF
543    1   1--0 1  7 2-- 7  1--0 5 0 1           DX=AC OLGX QB7 SFSTPT               \CLEAR X POSITION
544    1  20--1 1 14 0--17  1--0 5 1 0           JDCMODE IMEM DSCR=B CCE             \READ NEXT MEM WORD
545    1   2--1 1  0 3--17 17--0 5 0 3    NEWTH  J+2 DTHRESH=AC                      \NEW THRESHOLD
546    1   1--1 1  0 3--17 17--0 5 0 3           DTHRESH=AC
547    1   1--1 1 17 3--12 17--0 0 1 5           DAC=MA+1 QB10
550    1   1--0 1 14 2--17  7--0 5 0 5           DMA=AC OMAR SCE
551    1   2--1 1 12 3--17 17--0 2 1 3           J+2 DAC=THRESH*2047                 \POSITIVE THRESH
552    1   1--1 1  0 3--17 17--0 4 1 3           DAC=THRESH                          \NEGATIVE THRESH
553    1   1--1 1 16 0--17 17--0 5 0 3           DTHRESH=AC CDOTEN                   \EXTEND SIGN
554    1   1--1 1  0 3--17 17--0 7 1 0           J+1
555    1   7--1 1 14 0--17  1--0 5 1 0           JDCMODE IMEM DSCR=B CCE             \READ NEXT MEM WORD
556    1   3--1 1  0 3--17  2--0 7 1 0    CLNEXT JCLLINK IRTN
557    1   3--1 1  0 3--17  2--0 4 0 4           J+3 DAC=DC&B IRTN
560    0 101--1 1  0 3--12 17--0 4 1 6    GRLINK JGRAPH H DAC=SAVEA QB10             \NEXT: GRAPH PT
561    0 143--1 1  0 3--17 17--0 4 1 6    CLLINK JCORT H DAC=SAVEA                   \NEXT: CNTL WORD
562    0 142--1 1  0 3--17 17--0 4 1 6           JCORT H DAC=SAVEA
563    0  23--1 1  0 3-- 3 17--0 4 1 6           JVECTOR H DAC=SAVEA QB3             \NEXT: DEFAULT TO VEC
564    1   2--0 1  0 3--13 14--0 4 0 4    DCMODE J+2 DAC=DC&B QB11 OCLRSA
565    1   1--0 1  4 2--13 14--0 4 0 4           DAC=DC&B QB11 SBRIGHT OCLRSA        \BRIGHT ON
566    1   1--0 1  0 0-- 2  7--0 4 0 0           DAC=SCR&B QB2 OMAR CLROMEN          \NEXT MAY BE A CHAR
567    1   2--1 1  0 3--12 17--0 4 0 4           J+2 DAC=DC&B QB10
570    1   1--1 1  0 3--17 17--0 4 0 4           DAC=DC&B
571    1   2--1 1  0 3-- 1 17--0 2 0 4           J+2 DAC=DC*0&B QB1
572    1 130--1 1  0 2--17  2--0 7 1 0           JRCLINK IRTN SLROMEN                \GO TO REF CONT LINK
573    1   2--1 1  0 3-- 0 17--0 7 1 0           J+2 QB0
574    1 162--1 1  0 2-- 0 17--0 7 1 0           JCLNEXT QB0 SLROMEN                 \NEXT: CORT OR JUMP
575    1   4--1 1  0 3--17 17--0 5 0 7           J+4 DDELTAY=AC
576    1   1--1 1  0 2--17  2--0 4 0 4           DAC=DC&B SLROMEN IRTN
577    0   7--1 1  0 3--17 17--0 4 1 6           JVECTOR H DAC=SAVEA                 \GO TO VECTOR
600    0   6--1 1  0 3-- 3 17--0 4 1 6           JVECTOR H DAC=SAVEA QB3             \DEFAULT TO VECTOR
601    1   2--1 1 17 3--17 17--0 1 1 1           J+2 DAC=X-1
602    1  34--1 1  0 2--17  1--0 5 1 7           JTOCHR1 IMEM DCHR=B SLROMEN         \READ 1ST STROKE
603    1 116--1 1  0 2--17 17--0 5 0 1           JTOGRPH DX=AC SLROMEN               \NO X INCR ON 1ST PT
                                          *
604    0   2--1 1  0 3--17 17--0 4 1 6    VLINK  JVECTOR H DAC=SAVEA                 \GO TO VECTOR
605    0 117--1 1  0 3--17 17--0 4 1 6    FROMSC JCORT H DAC=SAVEA                   \GO TO CORT
                                          *
606    1   1--1 1  1 0--17 17--0 5 0 6    VECTOR DSAVEA=AC CCHAR                     \VECTOR MODE
607    1   1--1 1 17 3--17 17--0 0 1 5           DAC=MA+1
610    1   1--0 1 14 2--17  7--0 5 0 5           DMA=AC OMAR SCE
611    1   1--1 1  0 3--17 17--0 4 0 0           DAC=SCR&B
612    1   1--1 1 17 3--13 17--0 0 1 5           DAC=MA+1 QB11
```

```
613  1    1--0 1  0 3--17  7--0 5 0 5          DMA=AC OMAR
614  1    3--1 1  0 3--17 17--0 4 0 0          J+3 DAC=SCR&B                    \ABSOLUTE VECTOR
615  1    1--1 1  0 3--17 17--0 4 1 1          DAC=X                            \INCREMENTAL VECTOR
616  1    1--1 1  0 3--17 17--1 0 0 0          DAC=SCR+AC&B
617  1    1--0 1  0 3--13  1--0 5 0 1          DX=AC OLGX QB11                  \SEND X TO LG
620  1    1--1 1 14 0--17  1--0 5 1 0          IMEM DSCR=B CCE
621  1    3--1 1 14 2--13 17--0 7 1 0          J+3 SCE QB11                     \ABSOLUTE VECTOR
622  1    1--1 1 14 2--13 17--0 4 1 2          DAC=Y QB11 SCE                   \INCREMENTAL VECTOR
623  1    2--1 1  0 3--17 17--1 0 0 0          J+2 DAC=SCR+AC&B
624  1    1--1 1  0 3--17 17--0 4 0 0          J+1 DAC=SCR&B
625  1    2--0 1  5 2--12  2--0 5 0 2          J+2 DY=AC OLGY SLLGBLANK QB10    \Y TO LG & UNBLANK
626  1    1--0 1  5 0--17  2--0 5 0 2          DY=AC OLGY CLLGBLANK             \Y TO LG & BLANK
627  1    1--1 1 16 0--17 17--0 1 1 5          DAC=MA-1 CDOTEN                  \THIS STATE NOT USED
630  1    2--1 1 14 0--17  1--0 5 1 0          J+2 IMEM DSCR=B CCE              \        BY TEST PROG
631  1  154--1 1 14 0--17  2--0 5 0 5          JFROMSC DMA=AC IRTN CCE          \NEXT: CONTROL WORD
632  1    1--1 1  0 3--13 17--0 7 1 0          QB11
633  1    1--1 1  0 3--17 17--0 4 0 0          DAC=SCR&B
634  1    1--1 1  0 3--12 17--0 7 1 0          QB10
635  1  147--1 1  0 3--17  2--0 7 1 0          JVLINK IRTN
                                        *
636  1    1--1 1  3 3--17 17--0 2 1 7   TOCHR1 JTOCHR2 DAC=CHR*15           \GOING TO CHAR MODE
                                        *
                                        *
637  1   45--1 1  0 3--14 17--0 4 1 1   TOCHR2 JTOCHR3 DAC=X QZERO          \GOING TO CHAR MODE
                                        *
640  1    1--0 1  0 3--17 12--0 5 0 6   CHARAC DSAVEA=AC OINCRSA            \CHARACTER MODE
641  1    1--0 1  0 0--17  7--0 4 0 0          DAC=SCR&B OMAR CLROMEN
642  1    1--1 1  0 3--17 17--0 4 0 7          DAC=CHR&B
643  1    1--1 1  1 0-- 7 17--0 7 1 0          CCHAR QB7
644  1    1--1 1 17 3--17 17--0 0 1 5          DAC=MA+1
645  1    2--1 1  5 2--17 17--0 7 1 0          J+2 SLLGBLANK                    \UNBLANK STROKE
646  1    1--1 1  5 0--17 17--0 7 1 0          CLLGBLANK                        \BLANK STROKE
647  1    1--1 1  0 2--17  1--0 5 1 4          IMEM DDC=B SLROMEN               \READ NEXT STROKE
650  1    1--0 1 14 2--17  7--0 5 0 5          DMA=AC OMAR SCE
651  1    1--1 1  7 3--17 17--0 2 1 4          DAC=DC*255
652  1    1--0 1  0 3--14  1--0 4 0 1          DAC=X&B OLGX QZERO               \X POSITION TO LG
653  1    1--0 1  1 2--17  0--0 4 0 7          DAC=CHR&B OLGCHAR SCHAR          \CHAR STROKE TO LG
654  1   14--0 1 16 0--17 14--0 7 1 0          JCHREND OCLRSA CDOTEN            \GO TO END OF CHAR
655  1    1--1 1 17 3--17  3--0 1 1 5          DAC=MA-1 ITSTB                   \CONTINUE CHAR
656  1    1--1 1 14 0--13 17--0 5 0 5          DMA=AC CCE QB11                  \RESTORE MEM ADRS
657  1    1--1 1 16 0--17 17--0 4 1 4          DAC=DC CDOTEN                    \DOT OFF
660  1   26--1 1  0 3--17  2--0 5 0 7          JGOCHAR DCHR=AC IRTN             \GO DO NEXT STROKE
661  1    1--0 1  0 3--17  7--0 5 0 0          DSCR=AC OMAR                     \LINK TO NXT STROKE
662  1    1--0 1  0 0--17 14--0 7 1 0          OCLRSA CLROMEN
663  1    1--1 1  0 3--17 17--0 7 1 0          J+1
664  1    1--1 1  0 3--17 17--0 7 1 0          J+1
665  1    1--1 1  0 3--17 17--0 7 1 0          J+1
666  1    1--1 1  0 3--17  2--0 4 1 6          DAC=SAVEA IRTN
667  0  151--1 1  0 2--17  1--0 5 1 7          JCHARAC H IMEM DCHR=B SLROMEN    \GO DO NXT STROKE
670  1    1--1 1 14 0--17  1--0 5 1 0   CHREND IMEM CCE DSCR=B              \GET NXT CHAR CODE
671  1    1--0 1  0 0--13  7--0 4 0 0          DAC=SCR&B OMAR CLROMEN QB11
672  1    1--1 1 17 3--12 17--0 0 1 4          DAC=DC+1 QB10                    \RESTORE DC REG
673  1    3--1 1  0 3--17 17--0 5 0 4          J+3 DDC=AC
674  1    1--1 1  0 3--17 17--0 5 0 4          DDC=AC
675  1    3--1 1  0 3--17 17--0 7 1 0          J+3
676  1    2--1 1  0 3--17 17--0 7 1 0          J+2
677  1   63--1 1  0 2--17 17--0 7 1 0          JFROMCH      SLROMEN             \GO TO CORT
700  1    1--1 1  0 3--17 17--0 7 1 0          J+1
701  1    1--1 1  0 2--17  1--0 5 1 7          IMEM DCHR=B SLROMEN              \GET 1ST STROKE
702  1    1--1 1  3 3--17 17--0 2 1 7          DAC=CHR*15
703  1    1--1 1  4 3--14 17--0 0 1 1          DAC=X+16 QZERO                   \X TO NXT CHR POSN
704  1    1--1 1  0 3--17  2--0 5 0 1   TOCHR3 DX=AC IRTN
705  0    2--1 1  0 3--17 17--0 4 1 6   CHLINK JSPCHAR H DAC=SAVEA          \GO TO SPEC CHAR
706  0  132--1 1  0 3--17 17--0 4 1 6   GOCHAR JCHARAC H DAC=SAVEA          \GO TO CHARACTER
                                        *
707  1    1--1 1  1 0--17 17--0 5 0 6   SPCHAR DSAVEA=AC CCHAR              \SPEC CHAR MODE
710  1    1--1 1 17 3--17 17--0 0 1 5          DAC=MA+1
711  1    1--0 1 14 2--17  7--0 7 0 0          DB=AC SCE OMAR
712  1    1--1 1  0 3--17 17--0 4 0 7          DAC=CHR&B
713  1    1--0 1  0 3-- 7 14--0 4 0 7          DAC=CHR&B OCLRSA QB7
714  1    1--1 1 15 3-- 6 17--0 3 0 7          DAC=CHR/4032&B QB6
715  1   13--1 1  0 3-- 5 17--0 4 0 7          JCHR6A0 DAC=CHR&B QB5            \CHR(7)=0
716  1    1--1 1  0 3--17 17--1 3 1 5          DAC=MA/AC                        \CHR(7)=1
717  1    7--1 1 14 0--17  1--0 5 1 0          JFMFD IMEM DSCR=B CCE
720  1    1--1 1 14 0--17 17--1 1 1 5   SKIP   DAC=MA-AC CCE                \SKIP 32 OR 64
721  1    1--0 1 14 2--17  7--0 5 0 5          DMA=AC OMAR SCE
722  1    1--1 1 17 3--17 17--0 1 1 5          DAC=MA-1
723  1    1--1 1  0 3--17 17--0 5 0 5          DMA=AC
724  1    1--1 1  0 3--17 17--0 7 1 0          J+1
725  1   16--1 1 14 0--17  1--0 5 1 0          JCHR5A1 IMEM CCE DSCR=B          \READ NEXT WORD
726  1    1--0 1  0 3--17  7--0 2 0 0   FMFD   DAC=SCR*0&B OMAR             \CLEAR X AND Y POSN
727  1   21--0 1  0 0--13  2--0 5 0 2          JSCHARX DY=AC OLGY CLROMEN QB11
730  1   12--1 1 14 0-- 4  1--0 5 1 0   CHR6A0 JCHR5A0 IMEM DSCR=B CCE QB4  \CHR(6)=0
731  1    1--1 1 14 0-- 4  1--0 5 1 0          IMEM DSCR=B CCE QB4              \CHR(6)=1
732  1    5--0 1  0 0--17  7--0 4 0 0          JNBLINK DAC=SCR&B OMAR CLROMEN   \CHR(5)=0
733  1    1--0 1  0 0--17  7--0 4 0 0          DAC=SCR&B OMAR CLROMEN           \CHR(5)=1
734  1    2--1 1  7 3--13 17--0 0 1 2   VTAB   JSCHARY DAC=Y+32 QB11        \VERTICAL TAB
735  1    1--1 1  7 3--13 17--0 1 1 2   LNFD   DAC=Y-32 QB11                \LINE FEED
736  1   13--0 1  0 3--17  2--0 5 0 2   SCHARY JSCHARD DY=AC OLGY           \Y POSN TO LG
737  1    2--1 1  2 0--13 17--0 7 1 0   NBLINK JSCHARN CBLINK QB11          \BLINK OFF
740  1    1--1 1  2 2--13 17--0 7 1 0          JSCHARN SBLINK QB11              \BLINK ON
741  1   10--1 1  0 3--17 17--0 7 1 0   SCHARN JSCHARD
742  1    4--0 1  0 0--17  7--0 4 0 0   CHR5A0 JSPACE DAC=SCR&B OMAR CLROMEN \CHR(5)=0
743  1    1--0 1  0 0--17  7--0 4 0 0   CHR5A1 DAC=SCR&B OMAR CLROMEN       \CHR(5)=1
744  1  175--1 1  0 3--13 17--0 7 1 0   NULL   JSCHARN QB11                 \NULL CHARACTER
745  1    3--1 1  0 3--13 17--0 2 1 0   CR     JSCHARX DAC=SCR*0 QB11       \CARRIAGE RETURN
746  1    2--1 1  4 3--13 17--0 0 1 1   SPACE  JSCHARX DAC=X+16 QB11        \SPACE
747  1    1--1 1  4 3--13 17--0 1 1 1   BS     JSCHARX DAC=X-16 QB11        \BACKSPACE
750  1    1--0 1  0 3--17  1--0 5 0 1   SCHARX DX=AC OLGX                   \X POSN TO LG
751  1    3--1 1 16 0--17 17--0 4 0 0   SCHARD J+3 DAC=SCR&B CDOTEN         \DOT OFF
752  1    1--1 1 16 0--17 17--0 7 1 0          CDOTEN                           \DOT OFF
753  1    2--1 1 17 3--17 17--0 0 1 5          J+2 DAC=MA+1
754  1    1--1 1 17 3--12 17--0 0 1 5          DAC=MA+1 QB10
```

```
594     755     1    1--1 1   0 2--17  1--0 5 1 7          IMEM DCHR=B SLROMEN              \GET NXT 1ST STRK
595     756     1    2--1 1   3 3--17 17--0 2 1 7          J+2 DAC=CHR#15
596     757     1    3--1 1   5 0--17 17--0 5 0 5          JFROMCH DMA=AC CLLGBLANK         \GO TO CORT
597     760     1    1--1 1  17 3--14 17--0 0 1 5          DAC=MA+1 QZERO
598     761     1  124--1 1   5 0--17  2--0 5 0 5          JCHLINK IRTN DMA=AC CLLGBLANK    \END OF SP CHAR
599     762     1   54--1 1   0 3--17  2--0 4 1 6   FROMCH JGOCORT  DAC=SAVEA  IRTN     \GO TO CORT
600                                                         END
```

NO ERRORS ???

| | | | | | | | |
|---|---|---|---|---|---|---|---|
| 0 | 0 | 1 | 17 | 100 | 3 | 1023 | 10 |
| 1024 | 11 | 1032 | 1 | 1365 | 6 | 15 | 3 |
| 16 | 4 | 2 | 1 | 2047 | 12 | 2048 | 13 |
| 2148 | 4 | 255 | 7 | 2730 | 5 | 3072 | 14 |
| 32 | 7 | 4 | 2 | 4032 | 15 | 4095 | 16 |
| 500 | 15 | 8 | 2 | 97 | 6 | A0 | 0 |
| A1 | 1 | A2 | 2 | A3 | 3 | A4 | 4 |
| A5 | 5 | A6 | 6 | A7 | 7 | AA | 3 |
| AB | 2 | AC | 0 | AD | 5 | ADC | 0 |
| AE | 7 | AF | 17 | AG | 37 | AH | 100 |
| AI | 177 | AJ | 276 | AK | 176 | AL | 77 |
| AM | 36 | AN | 16 | AO | 10 | AP | 12 |
| AQ | 11 | AR | 35 | AS | 13 | AT | 34 |
| AU | 27 | AV | 22 | AW | 14 | AX | 33 |
| AY | 15 | AZ | 20 | B0 | 0 | B1 | 1 |
| B10 | 12 | B11 | 13 | B2 | 2 | B3 | 3 |
| B4 | 4 | B5 | 5 | B6 | 6 | B7 | 7 |
| B8 | 10 | B9 | 11 | BA | 6 | BB | 32 |
| BC | 40 | BD | 41 | BE | 42 | BF | 43 |
| BG | 44 | BH | 4 | BI | 45 | BJ | 46 |
| BK | 47 | BL | 50 | BLINK | 2 | BM | 51 |
| BN | 52 | BO | 53 | BP | 54 | BPCAD | 6 |
| BPCD | 7 | BPCO | 6 | BQ | 55 | BR | 56 |
| BRIGHT | 4 | BS | 747 | BS1 | 57 | BT | 60 |
| BU | 61 | BV | 62 | BW | 63 | BX | 64 |
| BY | 65 | BZ | 66 | CA | 73 | CB | 74 |
| CC | 141 | CD | 142 | CE | 14 | CF | 144 |
| CG | 145 | CH | 146 | CHAR | 1 | CHARAC | 640 |
| CHLINK | 705 | CHR | 7 | CHR5A0 | 742 | CHR5A1 | 743 |
| CHR6A0 | 730 | CHREND | 670 | CI | 147 | CJ | 150 |
| CK | 151 | CL | 152 | CLLINK | 561 | CLNEXT | 556 |
| CLRSA | 14 | CM | 153 | CN | 154 | CO | 155 |
| CORT | 524 | CP | 156 | CQ | 160 | CR | 745 |
| CR1 | 157 | CRSEN | 17 | CS | 161 | D0 | 115 |
| DA | 71 | DB | 101 | DC | 4 | DC1 | 102 |
| DCMODE | 564 | DD | 103 | DE | 104 | DELTAY | 7 |
| DF | 105 | DG | 106 | DH | 107 | DI | 110 |
| DIM | 6 | DJ | 111 | DK | 112 | DL | 113 |
| DM | 114 | DN | 116 | DOTEN | 16 | DP | 117 |
| DQ | 120 | DR | 123 | DRTIMER | 15 | DS | 127 |
| DT | 130 | DU | 131 | DV | 132 | DW | 133 |
| DX | 134 | DY | 135 | DZ | 136 | FA | 1 |
| FLGA | 10 | FLGB | 11 | FLGC | 12 | FLGTA | 3 |
| FLGTB | 4 | FLGTC | 6 | FMFD | 726 | FROMCH | 762 |
| FROMSC | 605 | FS | 3 | FSTPT | 7 | FSTSCH | 451 |
| GOCHAR | 706 | GOCORT | 436 | GRAPH | 461 | GRLINK | 560 |
| HOLD | 17 | HSRS | 13 | IFS | 457 | INCRSA | 12 |
| LB1 | 315 | LB10 | 330 | LB11 | 335 | LB12 | 345 |
| LB13 | 367 | LB14 | 372 | LB15 | 375 | LB2 | 162 |
| LB3 | 163 | LB4 | 170 | LB5 | 214 | LB6 | 216 |
| LB7 | 222 | LB8 | 316 | LB9 | 326 | LGCHAR | 0 |
| LGEXP | 5 | LGX | 1 | LGY | 2 | LLGBLANK | 5 |
| LN0 | 355 | LN1 | 356 | LNFD | 735 | LNK0 | 237 |
| LNK1 | 240 | LNK2 | 251 | LNK3 | 243 | LNK4 | 263 |
| LNK5 | 262 | LNK6 | 255 | LNK7 | 256 | LROMEN | 0 |
| MA | 5 | MA1 | 400 | MAR | 7 | MB | 402 |
| MC | 433 | MD | 403 | MDR | 3 | ME | 401 |
| MEM | 1 | MF | 404 | NA | 434 | NB | 407 |
| NBLINK | 737 | NEWTH | 545 | NU | 432 | NULL | 744 |
| NV | 406 | NW | 405 | OLDDY | 505 | POS | 16 |
| PRTN1 | 303 | PRTN2 | 304 | PRTN3 | 305 | PRTN4 | 306 |
| R0 | 0 | R1 | 1 | R2 | 2 | R3 | 3 |
| R4 | 4 | R5 | 5 | R6 | 6 | R7 | 7 |
| RA | 7 | RAMP | 4 | RCLINK | 522 | REFCTL | 437 |
| RST0 | 11 | RT0 | 376 | RT1 | 377 | RT3 | 374 |
| RTN | 2 | RTN0 | 274 | RTN1 | 275 | RTN2 | 307 |
| RTN3 | 310 | RTN4 | 311 | RTN5 | 312 | RTN6 | 313 |
| RTN7 | 314 | SAVEA | 6 | SCHARD | 751 | SCHARN | 741 |
| SCHARX | 750 | SCHARY | 736 | SCR | 0 | SELA | 13 |
| SELB | 15 | SKIP | 720 | SPACE | 746 | SPCHAR | 707 |
| SKSEN | 16 | STT | 10 | SUB1 | 264 | SUB2 | 357 |
| TA | 435 | TEST | 15 | THRESH | 3 | TOCHR1 | 636 |
| TOCHR2 | 637 | TOCHR3 | 704 | TOGRPH | 521 | TSTA | 4 |
| TSTB | 3 | VECTOR | 606 | VLINK | 604 | VTAB | 734 |
| X | 1 | XA | 126 | XB | 137 | XD | 75 |
| X1 | 140 | XJ | 72 | Y | 2 | YA | 67 |
| YB | 70 | YC | 76 | Z1 | 200 | Z2 | 247 |
| Z3 | 277 | Z4 | 254 | ZA | 23 | ZB | 26 |
| ZC | 21 | ZD | 24 | ZE | 25 | ZERO | 14 |
| ZF | 31 | ZG | 30 | | | | |

KSPMAX=0 MSPMAX=47 NSPMAX=44 SSPMAX=1559 ASPMAX=0 BSPMAX=0
DSPMAX=318

RUN 1

| | | | | | | | | | | | | | | | |
|---|---|---|---|---|---|---|---|---|---|---|---|---|---|---|---|
| 5 | 313 | 176 | 177 | 41 | 2 | 24 | 10 | 2 | 24 | 177 | 21 | 17 | 3 | 172 | 20 |
| 3 | 3 | 172 | 3 | 1 | 4 | 173 | 173 | 152 | 377 | 6 | 162 | 173 | 156 | 160 | 41 |
| 1 | 1 | 1 | 1 | 27 | 1 | 1 | 1 | 1 | 1 | 1 | 200 | 0 | 1 | 1 | 4 |
| 1 | 1 | 1 | 13 | 1 | 1 | 1 | 1 | 113 | 10 | 114 | 111 | 45 | 107 | 166 | 137 |
| 77 | 2 | 1 | 1 | 1 | 1 | 1 | 1 | 1 | 1 | 1 | 1 | 1 | 172 | 1 | 1 |
| 1 | 2 | 153 | 1 | 1 | 2 | 11 | 1 | 1 | 1 | 1 | 1 | 1 | 1 | 170 | 1 |
| 132 | 1 | 2 | 1 | 2 | 1 | 2 | 1 | 2 | 1 | 2 | 1 | 2 | 3 | 200 | 114 |
| 200 | 112 | 206 | 1 | 1 | 1 | 201 | 373 | 201 | 201 | 201 | 201 | 201 | 203 | 101 | 77 |

| | | | | | | | | | | | | | | | |
|---|---|---|---|---|---|---|---|---|---|---|---|---|---|---|---|
| 201 | 201 | 201 | 201 | 201 | 201 | 201 | 201 | 201 | 201 | 201 | 1 | 2 | 205 | 1 | 1 |
| 201 | 173 | 201 | 201 | 201 | 201 | 201 | 201 | 1 | 1 | 1 | 1 | 1 | 1 | 226 | 225 |
| 201 | 201 | 222 | 201 | 201 | 201 | 216 | 201 | 214 | 201 | 201 | 211 | 307 | 207 | 201 | 201 |
| 36 | 203 | 202 | 364 | 1 | 1 | 1 | 201 | 201 | 1 | 1 | 4 | 343 | 343 | 100 | 1 |
| 1 | 202 | 203 | 371 | 203 | 204 | 205 | 342 | 133 | 352 | 350 | 342 | 342 | 337 | 1 | 1 |
| 201 | 201 | 201 | 201 | 201 | 201 | 2 | 6 | 1 | 1 | 1 | 1 | 372 | 1 | 1 | 1 |
| 201 | 1 | 1 | 1 | 1 | 1 | 201 | 201 | 201 | 201 | 201 | 1 | 3 | 2 | 1 | 1 |
| 1 | 201 | 1 | 1 | 1 | 1 | 1 | 201 | 2 | 176 | 201 | 202 | 151 | 1 | 157 | 157 |
| 2 | 3 | 31 | 176 | 30 | 27 | 177 | 1 | 1 | 1 | 1 | 1 | 1 | 1 | 1 | 1 |
| 1 | 1 | 1 | 1 | 1 | 1 | 1 | 1 | 1 | 1 | 154 | 147 | 153 | 201 | 66 | 201 |
| 201 | 201 | 201 | 203 | 202 | 212 | 201 | 55 | 167 | 201 | 201 | 202 | 202 | 377 | 46 | 172 |
| 157 | 201 | 202 | 201 | 201 | 201 | 201 | 202 | 201 | 201 | 201 | 202 | 201 | 201 | 202 | 202 |
| 215 | 202 | 201 | 204 | 203 | 203 | 201 | 203 | 201 | 203 | 202 | 201 | 201 | 201 | 201 | 201 |
| 201 | 237 | 115 | 114 | 201 | 201 | 201 | 201 | 202 | 214 | 202 | 377 | 201 | 201 | 202 | 201 |
| 201 | 201 | 202 | 201 | 220 | 202 | 201 | 201 | 201 | 202 | 201 | 201 | 201 | 207 | 203 | 203 |
| 101 | 143 | 142 | 23 | 202 | 201 | 201 | 202 | 201 | 202 | 330 | 202 | 362 | 204 | 201 | 7 |
| 6 | 202 | 234 | 316 | 2 | 117 | 201 | 201 | 201 | 201 | 201 | 201 | 203 | 201 | 201 | 201 |
| 201 | 203 | 201 | 202 | 201 | 202 | 201 | 201 | 202 | 354 | 201 | 201 | 201 | 347 | 201 | 245 |
| 201 | 201 | 201 | 201 | 201 | 202 | 201 | 201 | 201 | 201 | 201 | 201 | 214 | 201 | 201 | 201 |
| 226 | 201 | 201 | 201 | 201 | 201 | 201 | 151 | 201 | 201 | 201 | 203 | 201 | 203 | 202 | 263 |
| 201 | 201 | 201 | 201 | 201 | 2 | 132 | 201 | 201 | 201 | 201 | 201 | 201 | 213 | 201 | 207 |
| 201 | 201 | 201 | 201 | 201 | 216 | 201 | 221 | 212 | 201 | 205 | 201 | 202 | 201 | 213 | 202 |
| 201 | 210 | 204 | 201 | 375 | 203 | 202 | 201 | 201 | 203 | 201 | 202 | 201 | 201 | 202 | 203 |
| 201 | 324 | 254 | 377 | 377 | 377 | 377 | 377 | 377 | 377 | 377 | 377 | 377 | 377 | 377 | 377 |

ROM 2

| | | | | | | | | | | | | | | | |
|---|---|---|---|---|---|---|---|---|---|---|---|---|---|---|---|
| 303 | 103 | 342 | 377 | 307 | 342 | 110 | 377 | 327 | 327 | 310 | 303 | 333 | 303 | 326 | 360 |
| 312 | 333 | 370 | 303 | 302 | 353 | 320 | 307 | 327 | 340 | 316 | 324 | 303 | 372 | 343 | 327 |
| 302 | 377 | 324 | 303 | 322 | 102 | 113 | 162 | 43 | 34 | 260 | 303 | 157 | 306 | 147 | 304 |
| 330 | 312 | 377 | 314 | 353 | 320 | 377 | 303 | 342 | 162 | 374 | 340 | 314 | 342 | 303 | 322 |
| 303 | 350 | 344 | 332 | 313 | 360 | 103 | 100 | 103 | 354 | 366 | 303 | 303 | 103 | 302 | 103 |
| 303 | 303 | 103 | 130 | 336 | 176 | 103 | 152 | 346 | 303 | 103 | 303 | 303 | 303 | 340 | 303 |
| 103 | 377 | 364 | 366 | 354 | 356 | 103 | 103 | 353 | 340 | 342 | 353 | 376 | 376 | 312 | 303 |
| 320 | 374 | 347 | 303 | 62 | 277 | 203 | 260 | 340 | 377 | 344 | 350 | 307 | 354 | 303 | 333 |
| 313 | 364 | 377 | 374 | 303 | 337 | 103 | 337 | 310 | 377 | 303 | 103 | 62 | 303 | 203 | 277 |
| 260 | 3 | 303 | 303 | 307 | 303 | 337 | 303 | 103 | 62 | 203 | 277 | 242 | 257 | 260 | 342 |
| 346 | 303 | 303 | 352 | 340 | 323 | 350 | 357 | 303 | 303 | 344 | 303 | 102 | 303 | 344 | 357 |
| 103 | 303 | 340 | 346 | 103 | 62 | 277 | 203 | 260 | 3 | 62 | 277 | 323 | 357 | 314 | 203 |
| 260 | 303 | 303 | 303 | 303 | 303 | 303 | 357 | 313 | 317 | 303 | 342 | 317 | 160 | 62 | 277 |
| 203 | 237 | 260 | 337 | 303 | 303 | 103 | 353 | 62 | 277 | 203 | 277 | 260 | 103 | 62 | 277 |
| 254 | 160 | 62 | 203 | 203 | 267 | 260 | 337 | 366 | 337 | 340 | 103 | 44 | 42 | 46 | 262 |
| 252 | 277 | 260 | 103 | 362 | 303 | 303 | 376 | 360 | 360 | 374 | 303 | 154 | 303 | 164 | 156 |
| 303 | 303 | 303 | 340 | 303 | 326 | 357 | 367 | 162 | 353 | 372 | 343 | 360 | 303 | 170 | 137 |
| 162 | 133 | 324 | 337 | 360 | 323 | 362 | 317 | 304 | 377 | 360 | 333 | 372 | 303 | 303 | 360 |
| 303 | 324 | 302 | 370 | 370 | 310 | 314 | 110 | 310 | 303 | 303 | 333 | 303 | 303 | 114 | 316 |
| 303 | 304 | 353 | 303 | 303 | 377 | 103 | 303 | 303 | 303 | 357 | 103 | 103 | 362 | 343 | 343 |
| 326 | 324 | 324 | 303 | 303 | 303 | 303 | 377 | 377 | 172 | 170 | 172 | 303 | 360 | 334 | 303 |
| 303 | 303 | 303 | 303 | 304 | 324 | 314 | 303 | 343 | 303 | 320 | 303 | 377 | 162 | 330 | 332 |
| 370 | 103 | 336 | 136 | 360 | 303 | 303 | 377 | 162 | 353 | 303 | 370 | 303 | 360 | 303 | 303 |
| 303 | 303 | 303 | 303 | 103 | 122 | 100 | 303 | 303 | 303 | 302 | 303 | 302 | 303 | 302 | 303 |
| 303 | 377 | 302 | 302 | 303 | 303 | 304 | 377 | 162 | 303 | 377 | 103 | 303 | 303 | 303 | 103 |
| 360 | 362 | 362 | 303 | 303 | 126 | 124 | 370 | 360 | 360 | 303 | 303 | 303 | 303 | 317 | 303 |
| 103 | 100 | 303 | 304 | 377 | 326 | 324 | 302 | 162 | 337 | 103 | 106 | 170 | 377 | 360 | 370 |
| 303 | 103 | 160 | 303 | 303 | 303 | 303 | 302 | 360 | 100 | 377 | 303 | 303 | 303 | 303 | 302 |
| 303 | 302 | 317 | 323 | 303 | 303 | 303 | 304 | 377 | 162 | 303 | 103 | 362 | 303 | 303 | 360 |
| 360 | 162 | 377 | 303 | 303 | 360 | 103 | 100 | 360 | 360 | 100 | 100 | 337 | 337 | 103 | 310 |
| 312 | 303 | 100 | 100 | 303 | 303 | 323 | 323 | 103 | 370 | 370 | 377 | 377 | 302 | 317 | 324 |
| 377 | 324 | 303 | 377 | 377 | 377 | 377 | 377 | 377 | 377 | 377 | 377 | 377 | 377 | 377 | 377 |

ROM 3

| | | | | | | | | | | | | | | | |
|---|---|---|---|---|---|---|---|---|---|---|---|---|---|---|---|
| 377 | 366 | 317 | 337 | 377 | 317 | 365 | 217 | 277 | 257 | 137 | 37 | 77 | 337 | 377 | 357 |
| 137 | 57 | 277 | 237 | 17 | 17 | 157 | 117 | 37 | 57 | 377 | 157 | 77 | 117 | 237 | 177 |
| 377 | 377 | 377 | 337 | 377 | 363 | 364 | 367 | 363 | 366 | 377 | 277 | 365 | 377 | 360 | 377 |
| 377 | 377 | 377 | 377 | 377 | 377 | 337 | 357 | 377 | 367 | 363 | 377 | 77 | 367 | 377 | 217 |
| 257 | 377 | 377 | 277 | 377 | 361 | 374 | 367 | 377 | 377 | 377 | 277 | 361 | 372 | 366 | 306 |
| 377 | 363 | 366 | 375 | 364 | 370 | 372 | 364 | 377 | 360 | 373 | 367 | 377 | 317 | 377 | 364 |
| 371 | 57 | 37 | 37 | 117 | 117 | 316 | 317 | 337 | 337 | 377 | 377 | 377 | 377 | 277 | 377 |
| 277 | 377 | 377 | 377 | 367 | 377 | 317 | 377 | 377 | 377 | 377 | 377 | 377 | 377 | 177 | 137 |
| 377 | 377 | 377 | 377 | 377 | 377 | 376 | 377 | 377 | 377 | 377 | 363 | 367 | 377 | 377 | 377 |
| 257 | 363 | 377 | 377 | 377 | 377 | 377 | 377 | 363 | 367 | 377 | 377 | 377 | 377 | 377 | 377 |
| 377 | 377 | 377 | 377 | 357 | 377 | 377 | 377 | 377 | 377 | 377 | 377 | 363 | 377 | 357 | 377 |
| 363 | 377 | 377 | 377 | 363 | 367 | 377 | 377 | 377 | 363 | 367 | 364 | 377 | 377 | 357 | 144 |
| 104 | 77 | 77 | 377 | 377 | 377 | 377 | 377 | 377 | 377 | 377 | 377 | 377 | 373 | 367 | 377 |
| 377 | 377 | 377 | 377 | 377 | 377 | 363 | 377 | 367 | 377 | 377 | 177 | 377 | 363 | 367 | 377 |
| 377 | 363 | 367 | 377 | 377 | 377 | 377 | 377 | 377 | 377 | 377 | 363 | 367 | 367 | 367 | 377 |
| 377 | 377 | 377 | 367 | 377 | 364 | 157 | 364 | 100 | 57 | 364 | 77 | 363 | 377 | 363 | 363 |
| 377 | 322 | 302 | 377 | 377 | 377 | 362 | 377 | 367 | 377 | 377 | 377 | 377 | 377 | 361 | 363 |
| 367 | 362 | 377 | 377 | 377 | 377 | 377 | 377 | 377 | 377 | 377 | 337 | 377 | 377 | 377 | 377 |
| 363 | 57 | 363 | 17 | 17 | 362 | 362 | 375 | 377 | 377 | 363 | 57 | 362 | 317 | 375 | 377 |
| 377 | 377 | 377 | 377 | 377 | 357 | 367 | 377 | 377 | 257 | 363 | 102 | 102 | 277 | 257 | 377 |
| 377 | 377 | 377 | 377 | 377 | 357 | 357 | 377 | 377 | 361 | 361 | 361 | 377 | 361 | 277 | 377 |
| 257 | 362 | 377 | 377 | 377 | 377 | 237 | 137 | 377 | 377 | 377 | 377 | 77 | 367 | 377 | 377 |
| 117 | 365 | 177 | 161 | 361 | 377 | 377 | 257 | 367 | 377 | 377 | 377 | 377 | 361 | 362 | 362 |
| 257 | 377 | 377 | 77 | 274 | 274 | 47 | 257 | 377 | 37 | 362 | 17 | 17 | 377 | 362 | 377 |
| 77 | 377 | 361 | 377 | 377 | 377 | 377 | 377 | 367 | 377 | 277 | 367 | 377 | 377 | 377 | 261 |
| 361 | 277 | 277 | 377 | 377 | 242 | 362 | 377 | 361 | 362 | 277 | 377 | 257 | 362 | 377 | 317 |
| 372 | 367 | 377 | 177 | 377 | 377 | 377 | 361 | 367 | 377 | 301 | 360 | 374 | 363 | 277 | 377 |
| 362 | 367 | 374 | 377 | 377 | 377 | 362 | 361 | 361 | 267 | 257 | 377 | 377 | 377 | 377 | 377 |
| 377 | 361 | 377 | 317 | 362 | 377 | 377 | 377 | 377 | 367 | 377 | 174 | 157 | 137 | 377 | 361 |
| 377 | 367 | 377 | 377 | 377 | 361 | 367 | 262 | 101 | 101 | 367 | 367 | 277 | 277 | 362 | 277 |
| 277 | 377 | 367 | 367 | 277 | 277 | 277 | 277 | 361 | 377 | 377 | 377 | 257 | 361 | 377 | 377 |
| 317 | 362 | 362 | 377 | 377 | 377 | 377 | 377 | 377 | 377 | 377 | 377 | 377 | 377 | 377 | 377 |

ROM 4

| | | | | | | | | | | | | | | | |
|---|---|---|---|---|---|---|---|---|---|---|---|---|---|---|---|
| 44 | 51 | 124 | 60 | 0 | 120 | 122 | 20 | 62 | 45 | 125 | 100 | 63 | 140 | 122 | 124 |
| 120 | 20 | 122 | 100 | 124 | 44 | 160 | 5 | 42 | 160 | 142 | 121 | 127 | 123 | 46 | 24 |
| 122 | 22 | 160 | 44 | 120 | 122 | 20 | 121 | 27 | 126 | 100 | 160 | 6 | 125 | 23 | 124 |
| 145 | 100 | 1 | 123 | 73 | 160 | 0 | 120 | 104 | 103 | 110 | 160 | 263 | 110 | 142 | 120 |
| 121 | 203 | 223 | 160 | 42 | 252 | 124 | 105 | 104 | 204 | 124 | 142 | 110 | 106 | 110 | 106 |
| 102 | 152 | 106 | 102 | 112 | 102 | 102 | 124 | 102 | 112 | 102 | 112 | 104 | 204 | 124 | 110 |

| | | | | | | | | | | | | | | | |
|---|---|---|---|---|---|---|---|---|---|---|---|---|---|---|---|
| 102 | 3 | 123 | 123 | 103 | 103 | 102 | 102 | 43 | 102 | 160 | 43 | 160 | 160 | 160 | 143 |
| 160 | 103 | 11 | 120 | 100 | 20 | 170 | 170 | 126 | 10 | 216 | 122 | 11 | 124 | 141 | 0 |
| 14 | 124 | 10 | 212 | 123 | 16 | 125 | 15 | 126 | 16 | 126 | 104 | 101 | 50 | 170 | 1 |
| 121 | 101 | 121 | 124 | 14 | 120 | 30 | 120 | 102 | 100 | 122 | 10 | 120 | 14 | 125 | 125 |
| 125 | 112 | 124 | 235 | 170 | 15 | 125 | 15 | 125 | 125 | 111 | 124 | 101 | 125 | 124 | 11 |
| 106 | 125 | 125 | 124 | 104 | 100 | 10 | 120 | 170 | 105 | 100 | 10 | 15 | 35 | 126 | 170 |
| 170 | 120 | 120 | 170 | 170 | 170 | 170 | 35 | 32 | 34 | 112 | 111 | 34 | 121 | 100 | 10 |
| 120 | 11 | 124 | 14 | 126 | 125 | 105 | 11 | 100 | 15 | 125 | 10 | 120 | 160 | 100 | 10 |
| 120 | 103 | 100 | 111 | 120 | 11 | 125 | 35 | 124 | 15 | 126 | 100 | 106 | 104 | 105 | 170 |
| 170 | 17 | 127 | 107 | 170 | 170 | 170 | 170 | 130 | 170 | 170 | 170 | 100 | 170 | 100 | 100 |
| 40 | 121 | 120 | 120 | 127 | 160 | 60 | 0 | 121 | 21 | 122 | 2 | 123 | 23 | 125 | 5 |
| 124 | 4 | 126 | 6 | 127 | 67 | 160 | 26 | 125 | 25 | 124 | 60 | 120 | 170 | 170 | 126 |
| 50 | 120 | 150 | 125 | 125 | 170 | 170 | 116 | 116 | 126 | 137 | 57 | 170 | 57 | 116 | 116 |
| 116 | 126 | 50 | 110 | 233 | 15 | 125 | 100 | 103 | 120 | 50 | 100 | 120 | 107 | 52 | 52 |
| 230 | 230 | 230 | 127 | 127 | 127 | 127 | 11 | 11 | 121 | 121 | 121 | 110 | 130 | 122 | 100 |
| 170 | 100 | 116 | 116 | 126 | 100 | 200 | 210 | 75 | 210 | 100 | 125 | 15 | 125 | 100 | 100 |
| 124 | 44 | 170 | 121 | 130 | 123 | 123 | 15 | 125 | 53 | 113 | 123 | 170 | 130 | 170 | 104 |
| 116 | 116 | 116 | 116 | 104 | 104 | 100 | 104 | 104 | 44 | 170 | 170 | 170 | 127 | 104 | 116 |
| 116 | 31 | 137 | 121 | 116 | 116 | 126 | 15 | 125 | 100 | 15 | 125 | 100 | 111 | 200 | 121 |
| 130 | 170 | 112 | 200 | 100 | 122 | 122 | 35 | 130 | 125 | 170 | 100 | 170 | 170 | 57 | 111 |
| 126 | 100 | 107 | 170 | 15 | 170 | 170 | 134 | 125 | 54 | 101 | 107 | 170 | 35 | 125 | 114 |
| 127 | 120 | 170 | 170 | 170 | 170 | 116 | 137 | 130 | 100 | 14 | 124 | 124 | 170 | 170 | 170 |
| 170 | 137 | 57 | 11 | 121 | 116 | 116 | 126 | 15 | 160 | 107 | 107 | 67 | 107 | 275 | 130 |
| 235 | 125 | 35 | 125 | 170 | 130 | 40 | 122 | 130 | 130 | 100 | 100 | 12 | 32 | 122 | 170 |
| 170 | 170 | 100 | 100 | 170 | 50 | 11 | 31 | 121 | 100 | 170 | 15 | 15 | 137 | 57 | 125 |
| 15 | 125 | 116 | 377 | 377 | 377 | 377 | 377 | 377 | 377 | 377 | 377 | 377 | 377 | 377 | 377 |

APPENDIX C-3

MICRO-INSTRUCTION SET DESCRIPTION

FORMAT: Optional label followed by a free field combination of any instructions.

Comments begin at the back slash character " ".

Comment lines begin with *.

All instruction fields are delimited by spaces.

LABELS: A label may be any character string starting in Column 1. The first character must be alphabetic and must not begin with the combination "END".

OPERAND NAMES: A name may be any alpha numeric string. Examples are MAR, B7, 255.

All names must appear in a DECLARE statement.

DECLARATIONS: Declarations equate operand names to machine hardware locations. The format is:

```
DECLARE NAME1=m, NAME2=n, . . .
m,n . . . are integers
```

Example: DECLARE MAR=7, 255=13

PROGRAM LOCATION: The program is located in program memory by use of an ADRS statement.

The format is:

```
ADRS n
n is an integer such as 0≤n≤511
```

The program lines following the ADRS statement will be located starting at program memory address n.

ASSEMBLER CONTROL: The beginning of a program file must begin with a MICRA statement.

The format is:

```
MICRA comment
```

The end of a program file must end with an END statement.

The format is:

```
END comment
```

<u>INSTRUCTIONS</u>: Instructions may occur in any free field combination. All instruction types are listed below by mnemonic.

J "Jump instruction" format is:

J label or J+n or J-m
where 0<n<63   1<m<64

After execution of the present program line, execution will continue at line specified by label or at present address +n-m. If no "J" instruction appears within a line, the default will be J + 1.

Special Cases: Let p = present address,
If p<256 then p±i implies {(p±i) mod 256}
If p<256 then p±i implies {(p±i) mod 256} + 256

S or C "Set or clear instruction" format is:

S name or C name

Flipflop called "name" will be set or cleared.

I or O "Input or output instruction" format is:

I name or O name (1) A control signal will be generated causing "name" to be input or to output from the digital storage bus.

or (2) A control signal will be generated causing implementation of the function designated by "name". An example is OINCRSA which implements an increment stroke address.

Q "Qualifier select instruction" format is:

Q name

After execution of both the present and next program line, execution will continue normally if "name" is a 0. If "name" is a 1, execution will continue at the specified line + 1.

W "Write instruction" format is:

W

Digital storage memory will be set to the write state. The default is the read state.

H "Hold-off instruction" format is:

H

An interrupt will not be allowed immediately following the next program line. The default allows interrupts.

D "Data manipulator instruction" has several formats:

(1) DB = AC

The contents of the accumulator are output to the digital storage bus.

(2) D name = AC or D name = B

The contents of the accumulator or the digital storage bus are transferred to the register "name."

(3) DAC = name {&B} or DAC = % name {&B}
{&B} indicates &B is optional

The contents of the register "name" are transferred to the accumulator. If "name" is preceded by %, the accumulator will receive the complement of the contents of "name". If followed by &B, "name" will be output to the digital storage bus.

(4) DAC = name1 op name2 {&B}
or DAC = name1 op AC {&B}
op is any operand from the set: +, -, * (logical and), / (logical or).

The operation indicated will be made on "name 1" and "name 2" or "name 1" and accumulator. The result will be transferred to the accumulator. If followed by &B, "name 1" will be output to the digital storage bus.

NOTES AND EXCEPTIONS:

(1) Only one I/O instruction per line is allowed.
Example: J + 1 I MEM OLGX
This is not allowed.

(2) A " constant" is a data manipulator instruction operand. It may only appear as the second operand of the instruction.
Example: DAC=MA + 1024 is allowed.
DAC=1024 is not allowed.

(3) A constant may not appear in the same line with a set or clear instruction.
Example: DAC=MA + 1 SCE
This is not allowed.

(4) In order to clarify the effect of a qualifier select instruction, the following example is provided.

```
       JAA       QB4
        .
        .
        .
AA     JBB
        .
        .
        .
BB     JDD
CC     JEE
        .
        .
        .
DD    DAC = X
        .
        .
        .
EE    DAC = Y
        .
        .
        .
```

If qualifier B4 = 0 the sequence of execution will be AA, BB, DD.

If qualifier B4 = 1 the sequence of execution will be AA, CC, EE.

We claim:

1. Apparatus for use in the spectrum analysis of a signal, said apparatus comprising:

input means having inputs for receiving an input signal and a sampling signal for providing an intermediate frequency signal in response to said input signal and said sampling signal;

signal processing means coupled to said input means for providing a first digital signal in response to said intermediate frequency signal;

memory means coupled to said signal processing means for storing electrical representations of said digital signal in response to a memory control signal;

memory control means coupled to said memory means for providing said memory control signal;

display means coupled to said memory means for providing a waveform display in response to display control signals and said electrical representations;

display control means coupled to said display means for providing said display control signals in response to operator control signals;

operator controls coupled to said display control means for providing said operator control signals and including means for providing a first marker control signal in response to first operator manifestations indicating it is desired to include a first visual indication with said waveform display; and said display control means including means for causing said display means to include a first visual indication at a first predetermined position on said waveform display in response to said first marker control signal.

2. The apparatus as in claim 1, wherein said display control means includes means for causing said display means to display visual representations of amplitude and frequency values corresponding to the current position of said first visual indication.

3. The apparatus as in claim 1, wherein said operator controls further includes means for providing a second marker control signal in response to operator manifestations indicating that a second visual indication is to be placed at a second predetermined position on said waveform display; and said display control means includes means for causing said display means to include a second visual indication at a second predetermined position on said waveform display in response to said second marker control signal.

4. The apparatus as in claim 3, wherein said second predetermined position is the current position of said first visual indication.

5. The apparatus in claim 3, wherein said display control means further includes means for determining the difference in frequency and amplitude values represented between the respective positions of said first visual indication and and second visual indication.

6. The apparatus as in claim 5, wherein said display control means includes means for causing said display means to display visual representations of the difference in frequency and amplitude values represented between the respective positions of said first and second visual indications on said display.

7. The apparatus in claim 6, wherein said display control means includes means for causing said first visual indication to remain stationary and to not respond to further operator manifestations to move same along the display waveform subsequent to the causing of said display means to include said second visual indication on said waveform display.

8. The apparatus as in claim 1, wherein said display control means causes said first visual indication to move its position along said waveform display in response to a first operator control signal and said operator controls include a rotary control means for providing said first operator control signal in response to operator manifestations.

9. The apparatus as in claim 8, wherein said operator controls further include means for providing a second marker control signal in response to operator manifestations indicating that a second visual indication is to be placed at a second predetermined position on said waveform display; and said display control means includes means for causing said display means to include a second visual indication at a second predetermined position on said waveform display in response to said second marker control signal.

10. Apparatus for use in a spectrum analysis of a signal, said apparatus comprising;

input means having inputs for receiving an input signal and a sampling signal for providing an intermediate frequency signal in response to said input signal and said sampling signal;

signal processing means coupled to said input means for providing a first digital signal in response to said intermediate frequency signal and operator control signals;

memory means coupled to said signal processing means for storing electrical representations of said digital signal in response to a memory control signal; memory control means coupled to said memory means for providing said memory control signal;

display means coupled to said memory means for providing a waveform display in response to display control signals and said electrical representations; display control means coupled to said display means for providing said display control signals in response to said operator control signals;

operator controls coupled to said display control means and said signal processing means for providing said operator control signals; and means for causing said operator controls to alter the waveform display in the same proportion as the magnitude of the activation of said controls has to a first preselected parameter of said display without regard to the absolute values currently represented by said display waveform.

11. The apparatus as in claim 10, wherein said operator controls comprises a rotary tuning control means for causing said operator control signals to alter the display waveform in the same proportion as the rotation of said rotary control has to the first preselected parameter of said display means.

12. The apparatus as in claim 11, wherein said operator controls comprises step means for changing the values of selected functional settings in response to the operator activation of said step means, said step means causing the alteration of the values of said selected functional settings to occur in a preselected proportional manner with respect to the relationship of the current value of said functional settings.

13. Apparatus for use in the spectrum analysis of a signal, said apparatus comprising:

input means having inputs for receiving an input signal and a sampling signal and for providing an intermediate frequency signal in response to said input signal and said sampling signal;

signal processing means coupled to said input means for providing a first digital signal in response to said intermediate frequency signal;

memory means coupled to said signal processing means for storing electrical representations of said digital signal in response to a memory control signal;

memory control means coupled to said memory means for providing said memory control signal;

display means coupled to said memory means for providing a waveform display in response to display control signals and said electrical representations, said waveform display having span parameters comprising a start frequency, a center frequency and a stop frequency for each displayed waveform, said display control means causing said display means to sequentially provide waveform displays corresponding to said input signal and said sampling signal; and center frequency selection means coupled to said display control means and said display means for causing the greatest frequency value of each said waveform display to be the center frequency.

* * * * *